US005191555A

United States Patent [19]

Tabacco et al.

[11] Patent Number: 5,191,555

[45] Date of Patent: Mar. 2, 1993

[54] CMOS SINGLE INPUT BUFFER FOR MULTIPLEXED INPUTS

[75] Inventors: Paolo Tabacco, Dallas; Carol A. Price; Hugh P. McAdams, both of Houston, all of Tex.

[73] Assignee: Texas Instruments, Incorporated, Dallas, Tex.

[21] Appl. No.: 560,541

[22] Filed: Jul. 31, 1990

[51] Int. Cl.[5] .................... G11C 7/00

[52] U.S. Cl. .................... 365/230.08; 365/230.02

[58] Field of Search .................... 365/230.08, 189.05, 365/230.02

[56] References Cited

U.S. PATENT DOCUMENTS 4,541,078 9/1985 Dumbri et al. .................... 365/230.08

4,636,986 1/1987 Pinkham .................... 365/230.08

*Primary Examiner*—Joseph A. Popek

*Attorney, Agent, or Firm*—Lawrence J. Bassuk; Robby T. Holland; Richard L. Donaldson

[57] ABSTRACT

An input buffer circuit is disclosed. The circuit has a single stage circuit portion for receiving a multiplexed row address bit and a multiplexed column address bit. Circuitry is connected to the single stage circuit portion for separately holding the received multiplexed row address bit and the received multiplexed column address bit. The single stage circuit portion may include a tri-state inverter having a tri-state control input coupled to an input buffer control signal and a latch to hold the output of the tri-state inverter when it is tri-stated by the input buffer control signal. The first circuit portion may be of the CMOS type. Such a circuit is useful in the memory support circuitry of an integrated circuit of the dynamic random access memory type.

6 Claims, 191 Drawing Sheets

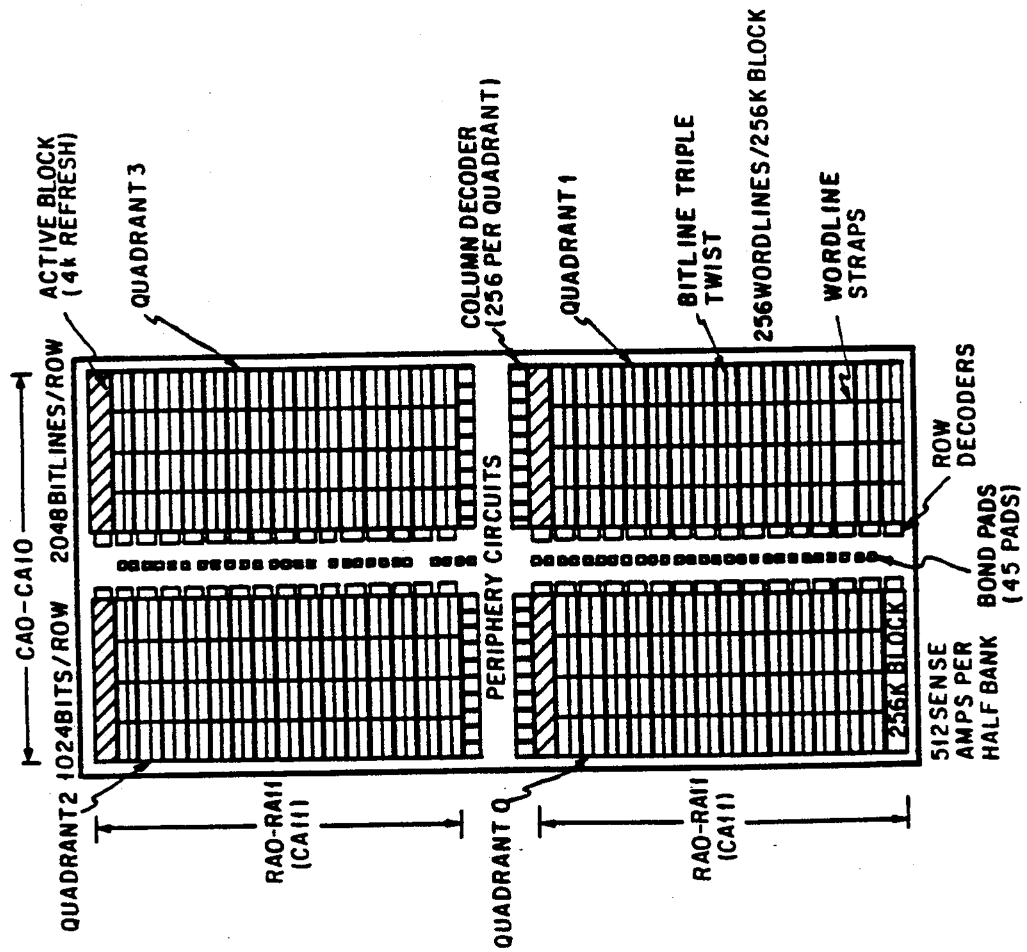
*Fig. 0.1*

16 MEG GRAPH ORIENTATION

| | | | | | | |
|---|---|---|---|---|---|---|
| 0.11A5 | 0.11B5 | 0.11C5 | 0.11D5 | 0.11E5 | 0.11F5 | 0.11G5 |
| 0.11A4 | 0.11B4 | 0.11C4 | 0.11D4 | 0.11E4 | 0.11F4 | 0.11G4 |
| 0.11A3 | 0.11B3 | 0.11C3 | 0.11D3 | 0.11E3 | 0.11F3 | 0.11G3 |
| 0.11A2 | 0.11B2 | 0.11C2 | 0.11D2 | 0.11E2 | 0.11F2 | 0.11G2 |
| 0.11A1 | 0.11B1 | 0.11C1 | 0.11D1 | 0.11E1 | 0.11F1 | 0.11G1 |

*Fig. 0.11*

Fig. 0.1 1A1
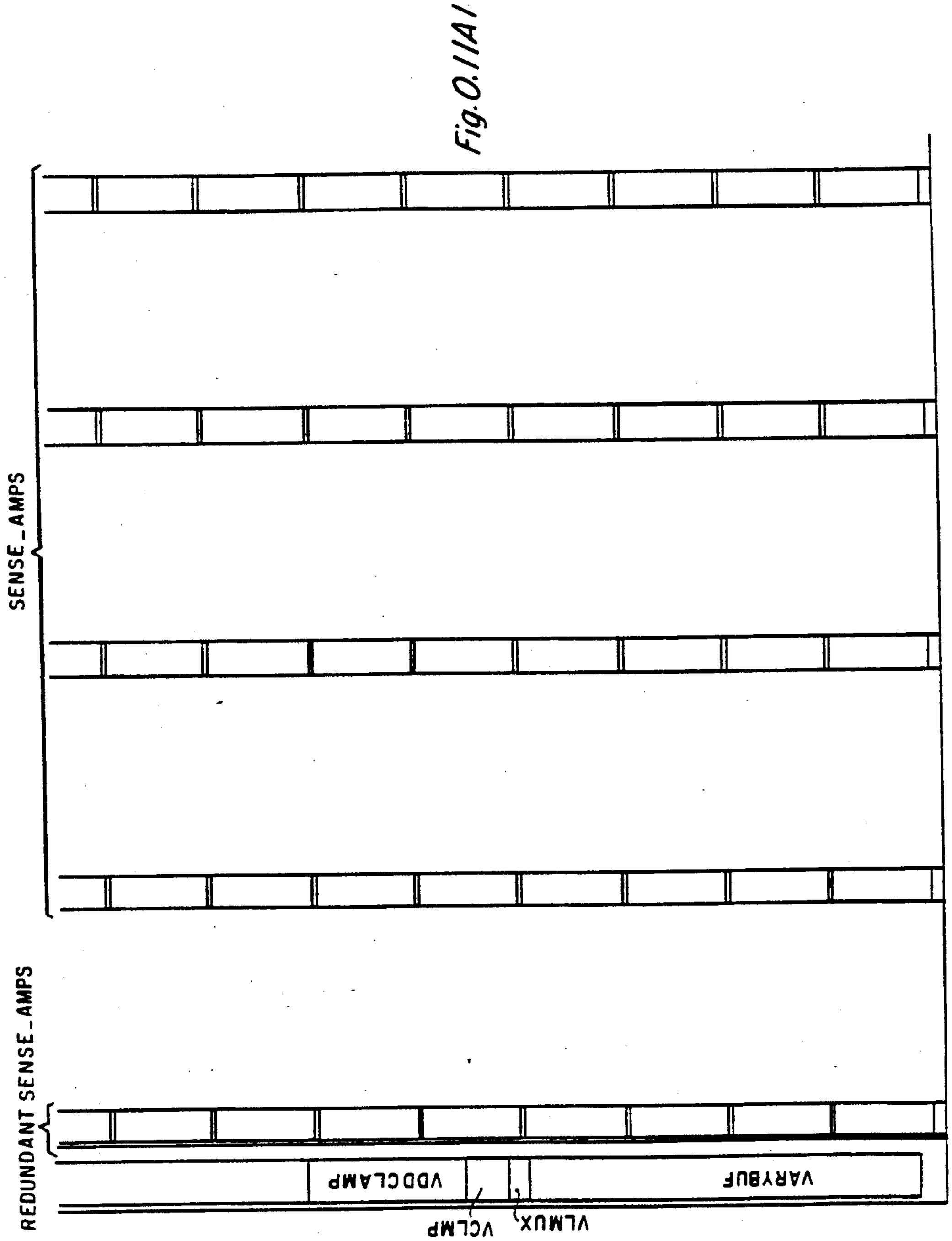

Fig.0.11A2
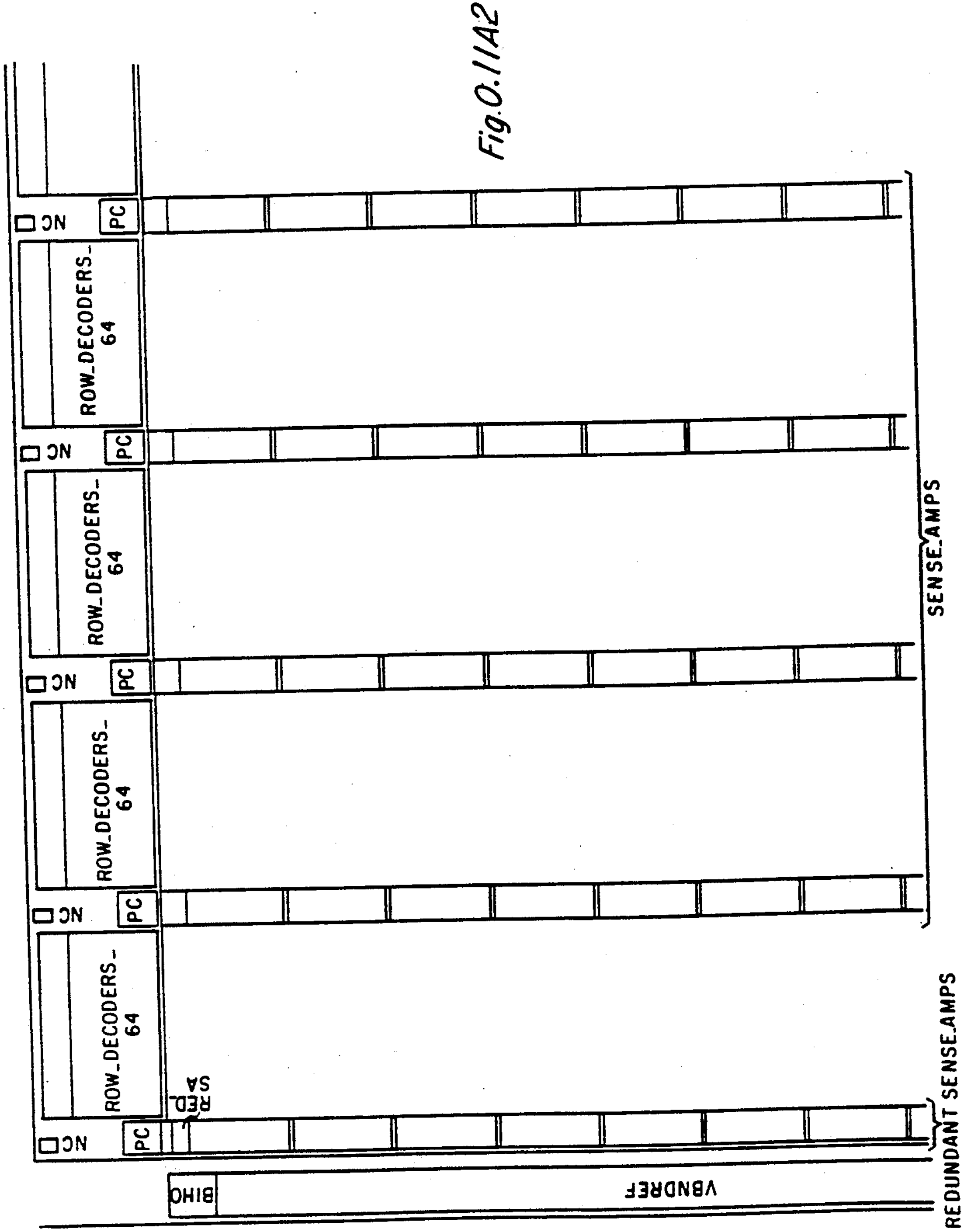

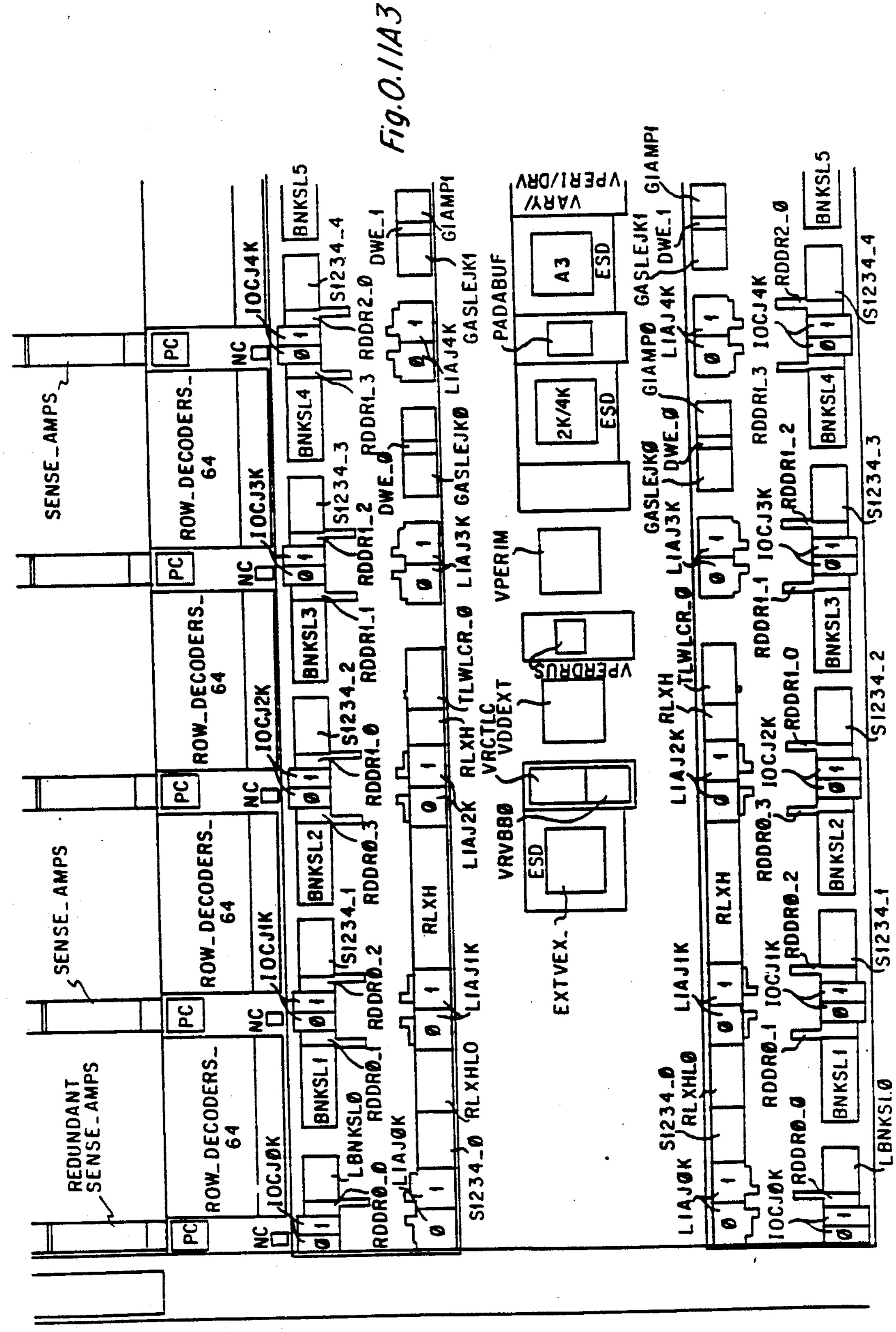
Fig.0.1IA3

Fig.0.1IA4
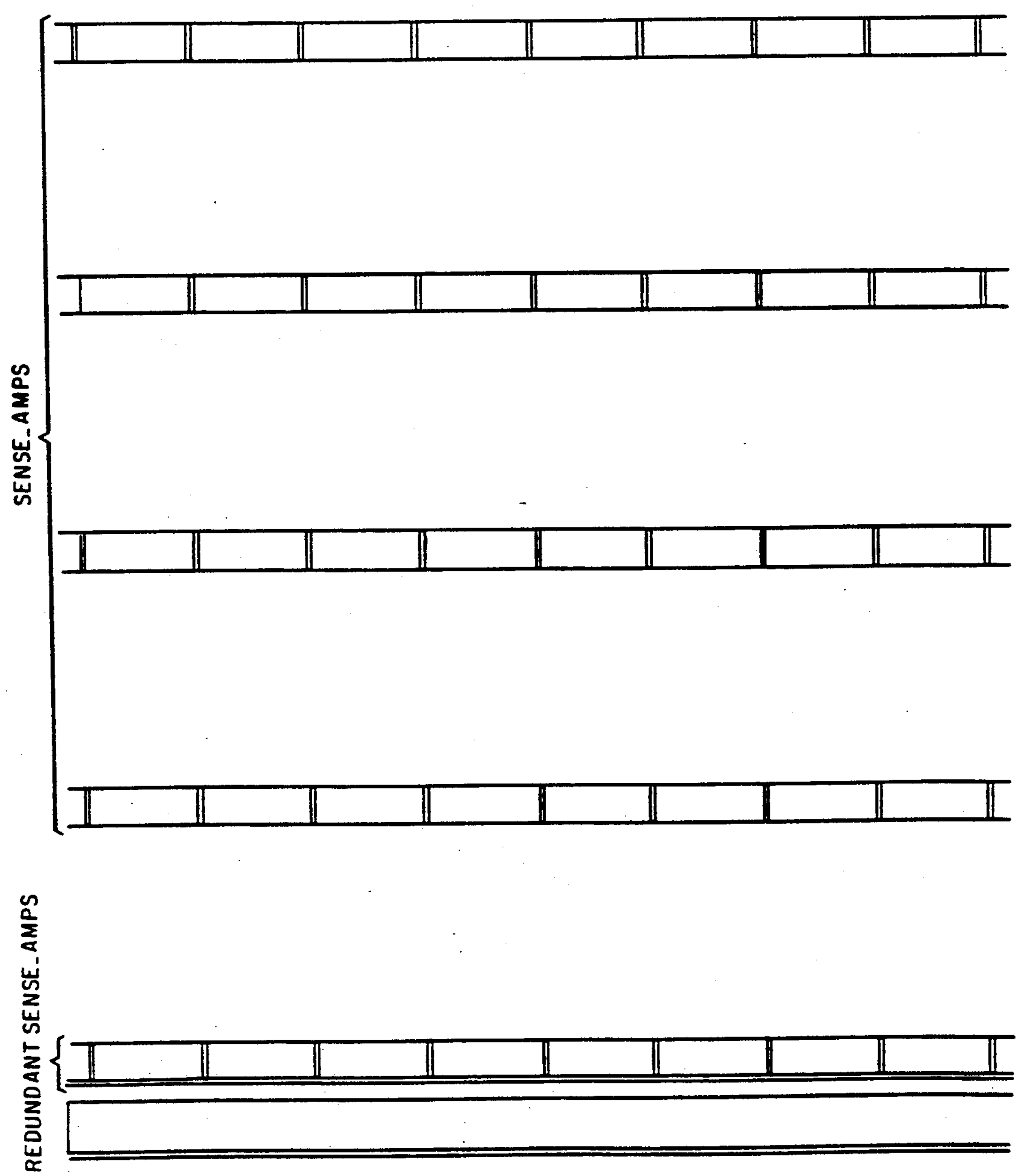

Fig. 0.1IA5
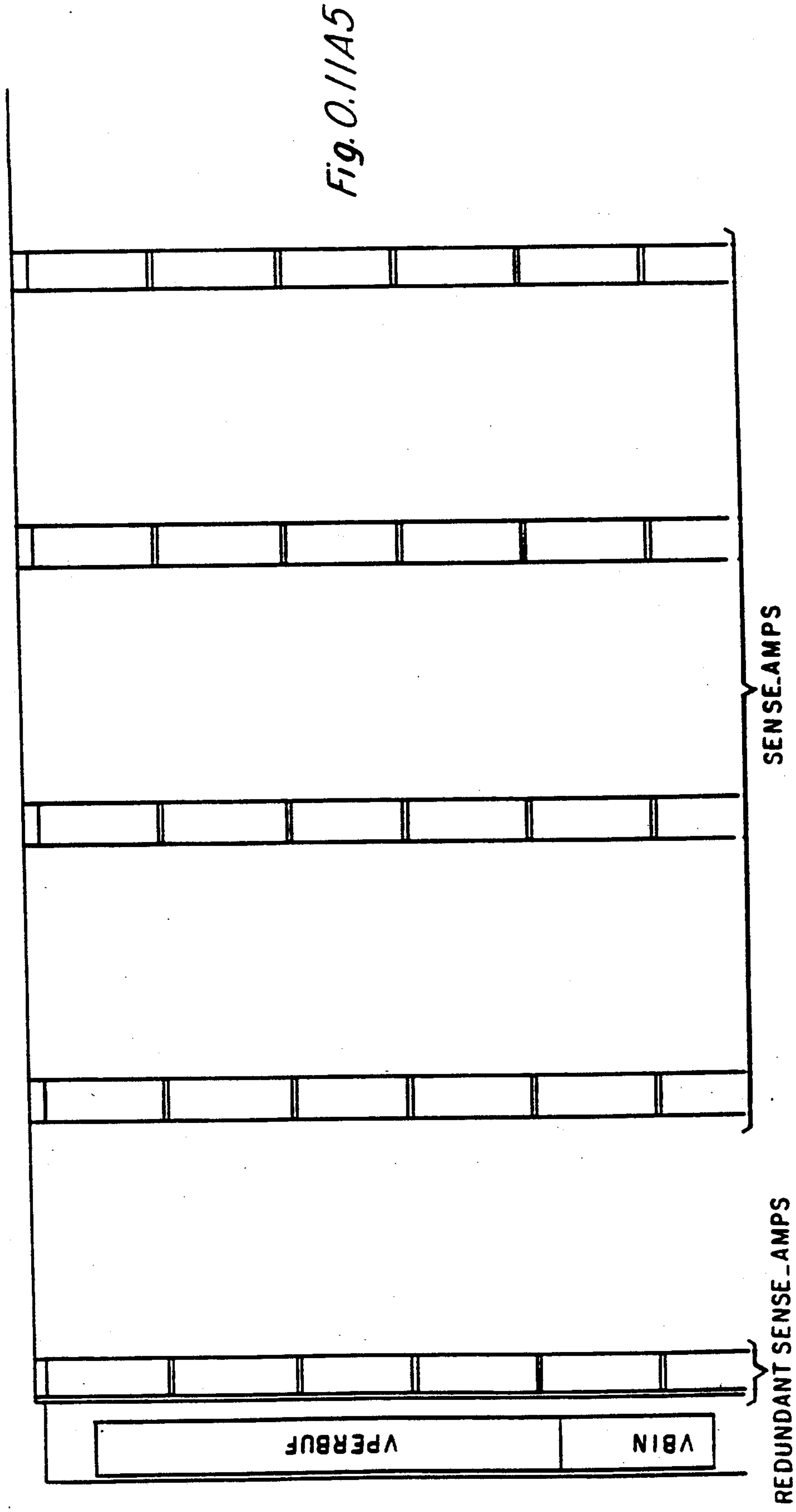

Fig.O.11B1
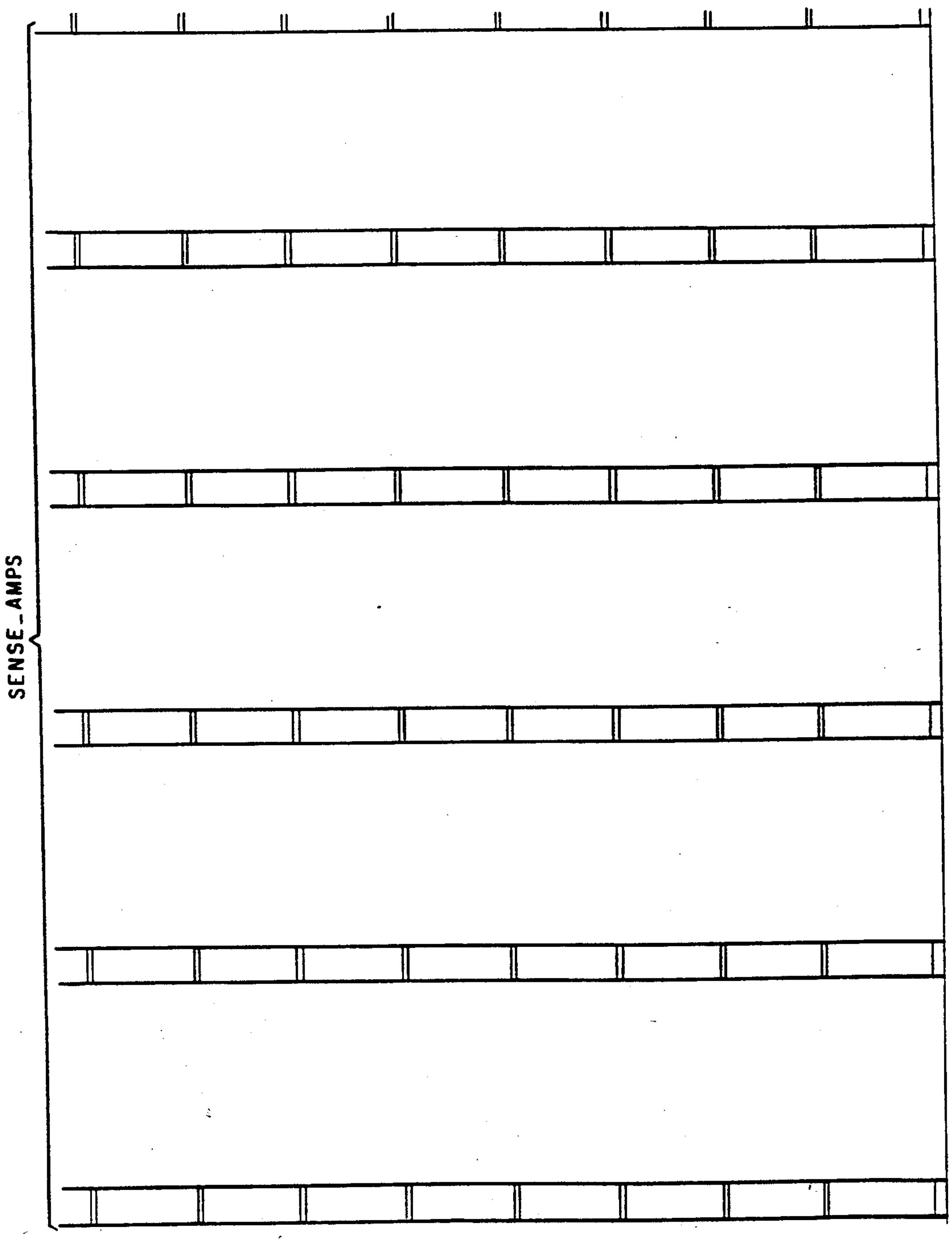

Fig.0.11B2
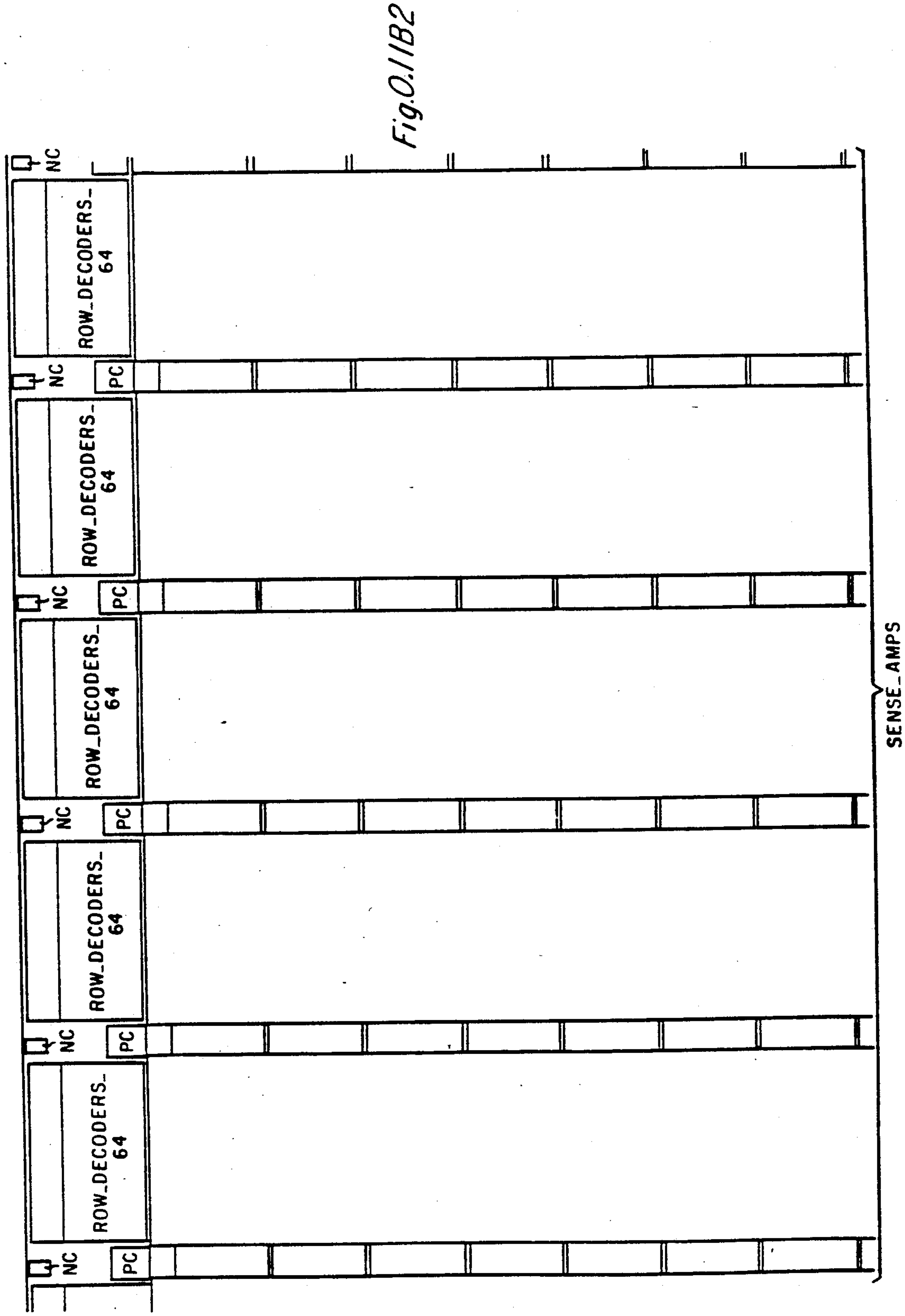

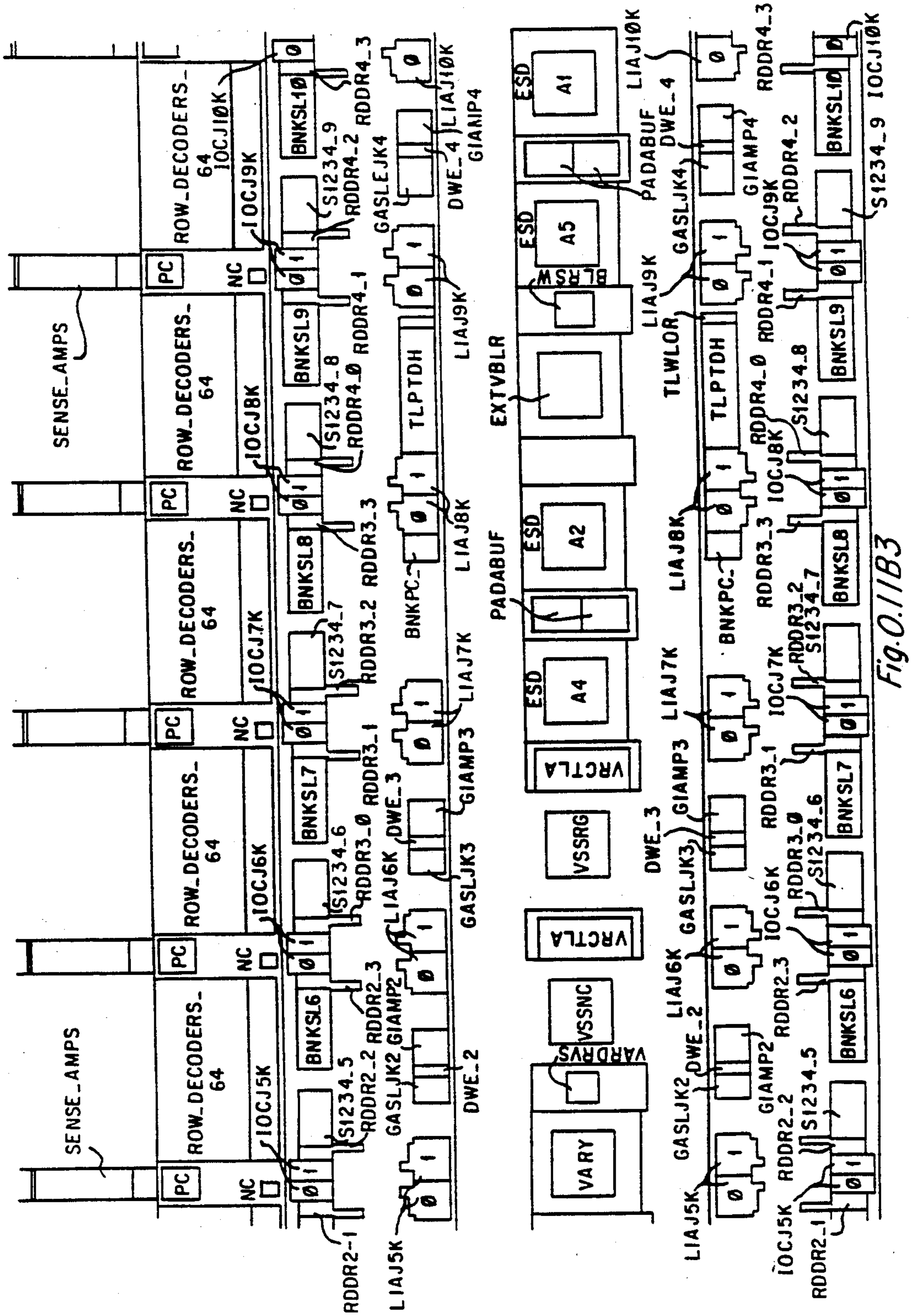
Fig.0.11B3

Fig.0.11B4
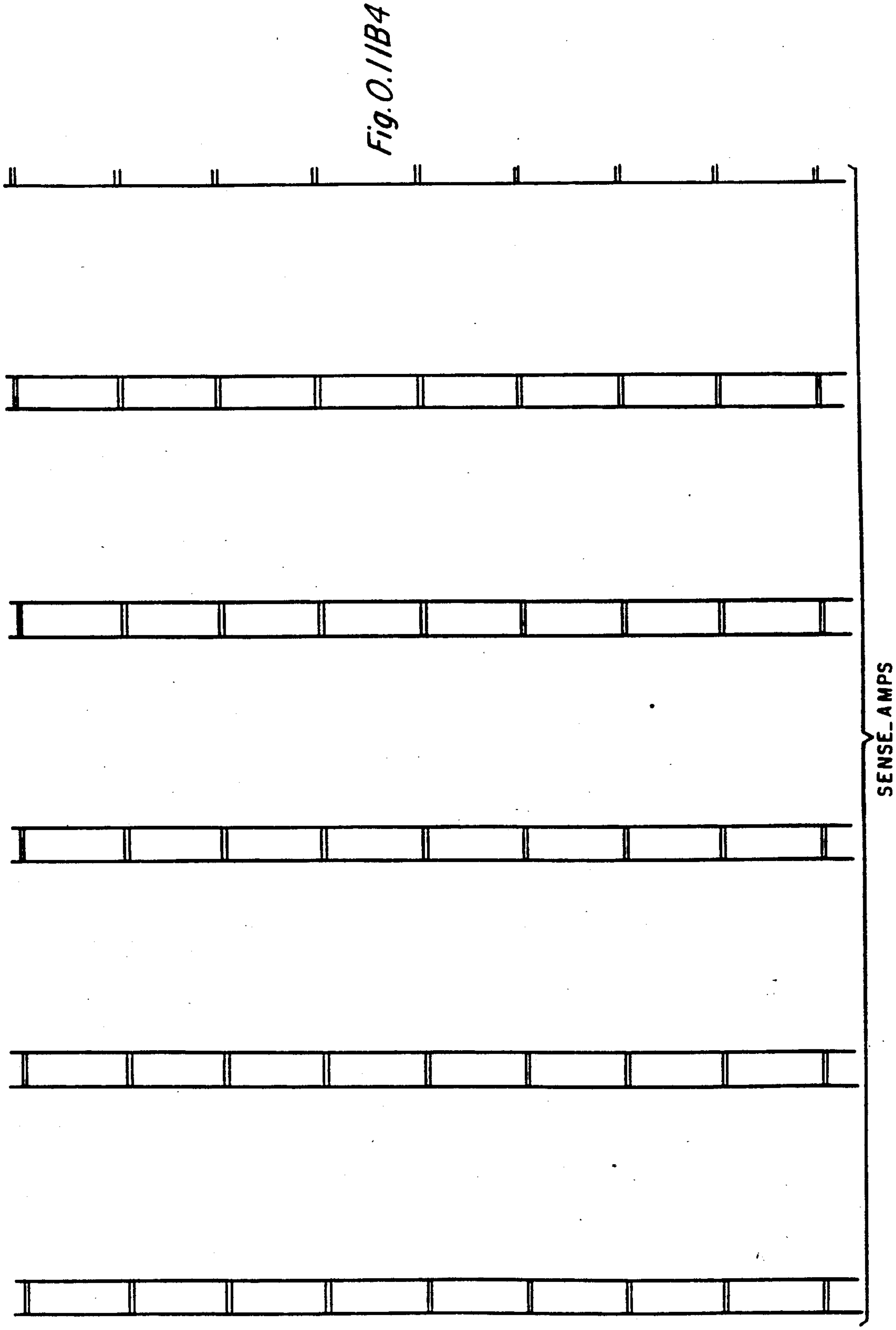

Fig.0.11B5
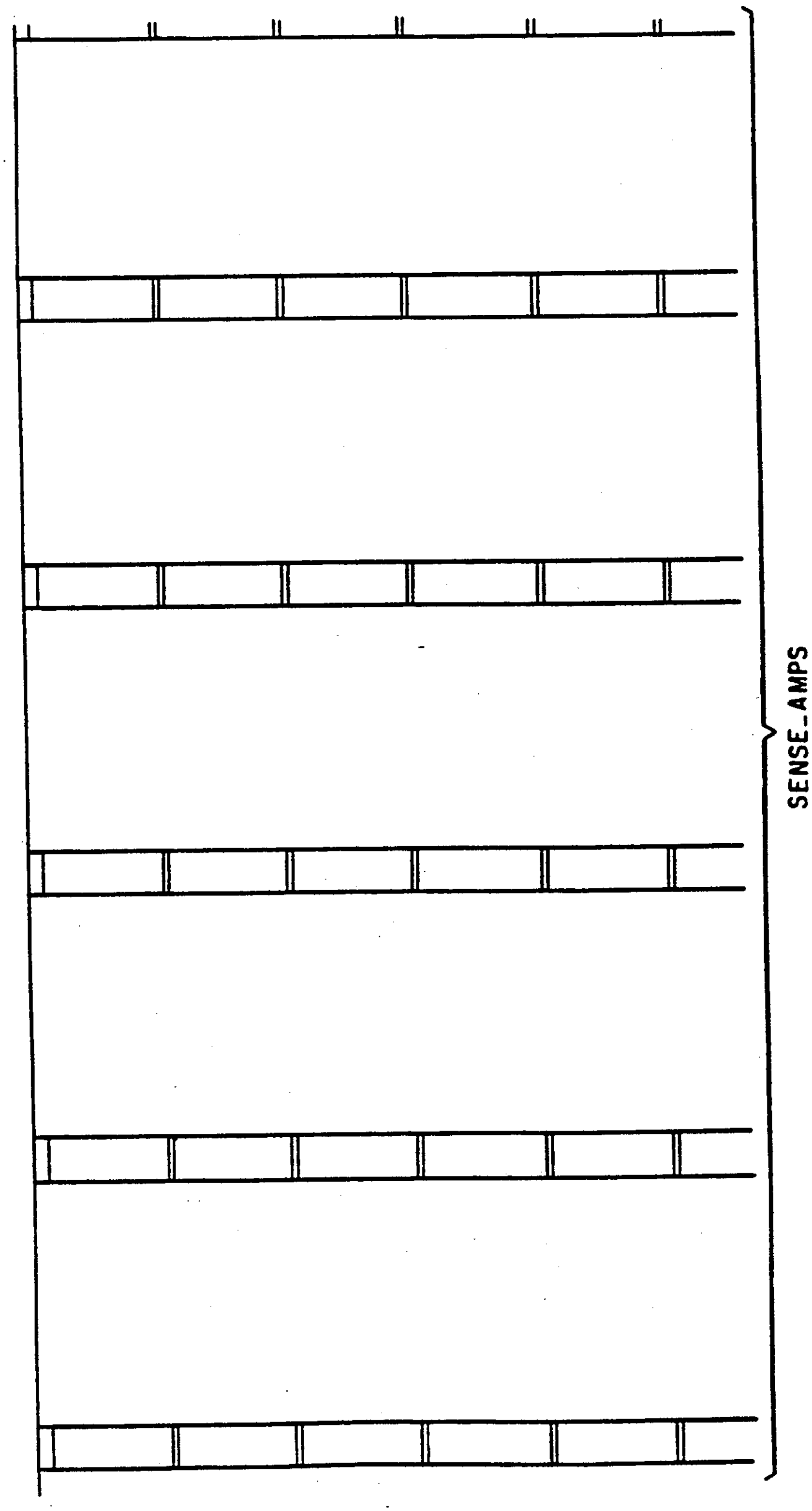

Fig.0.11C1
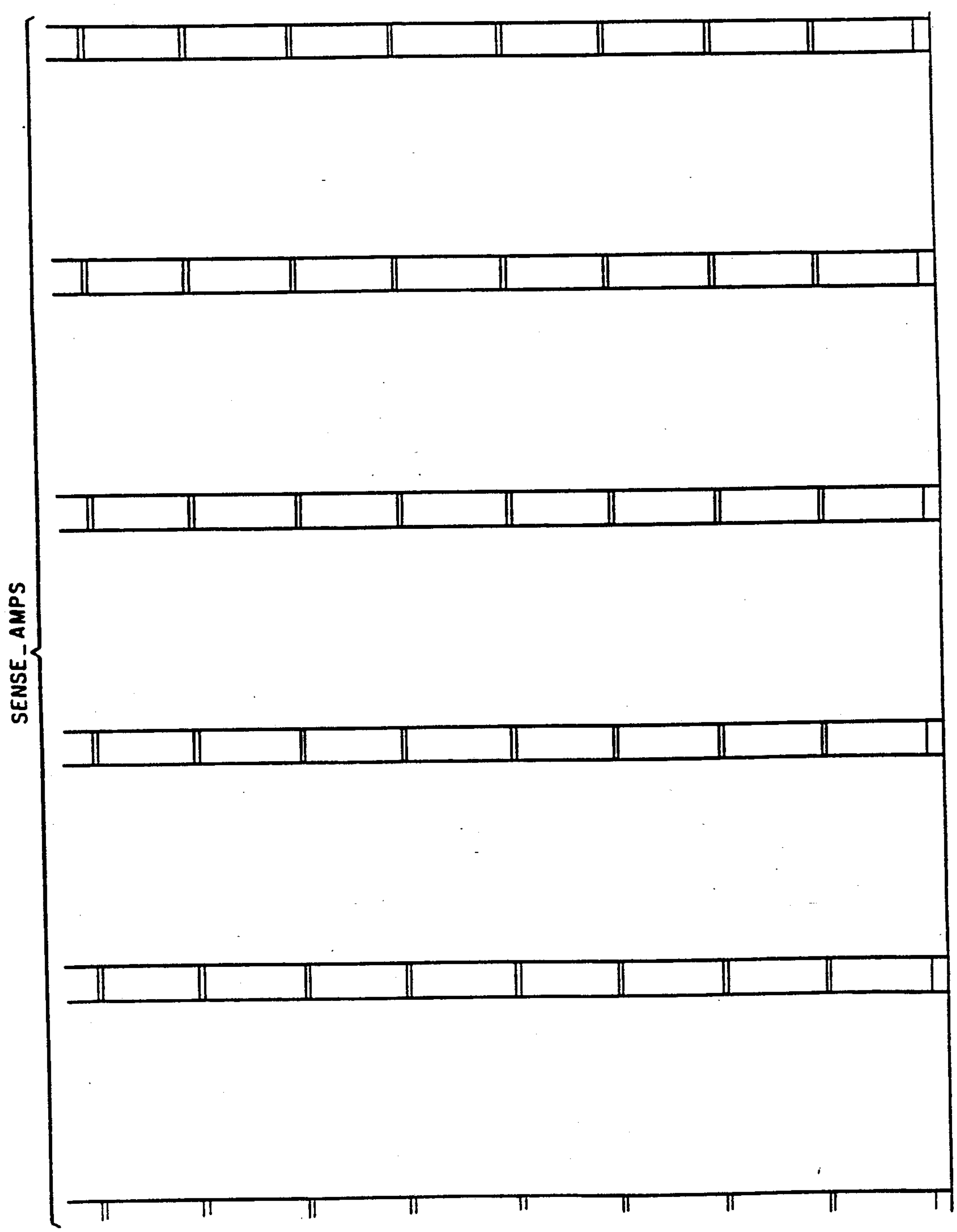

Fig. 0.11C2
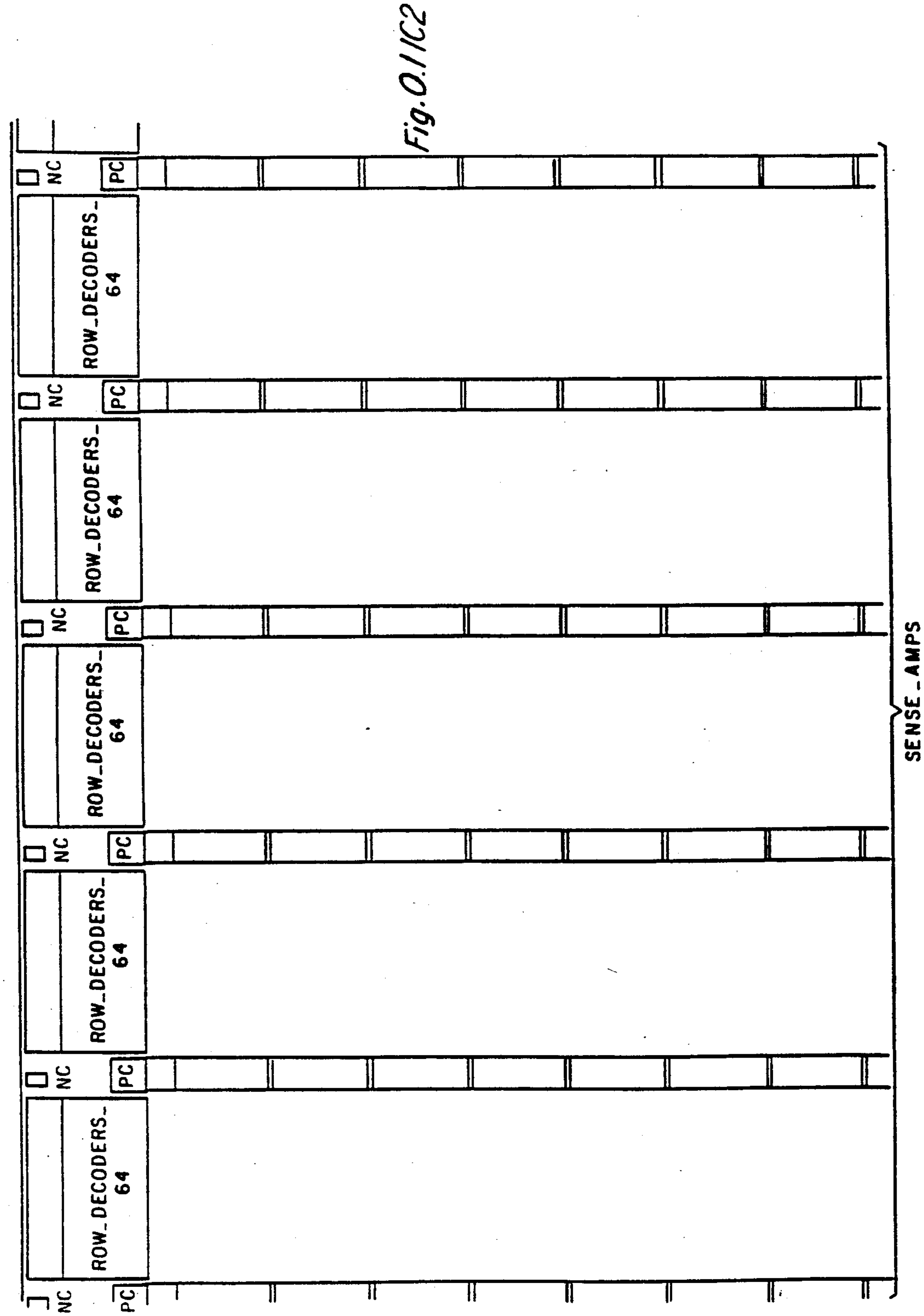

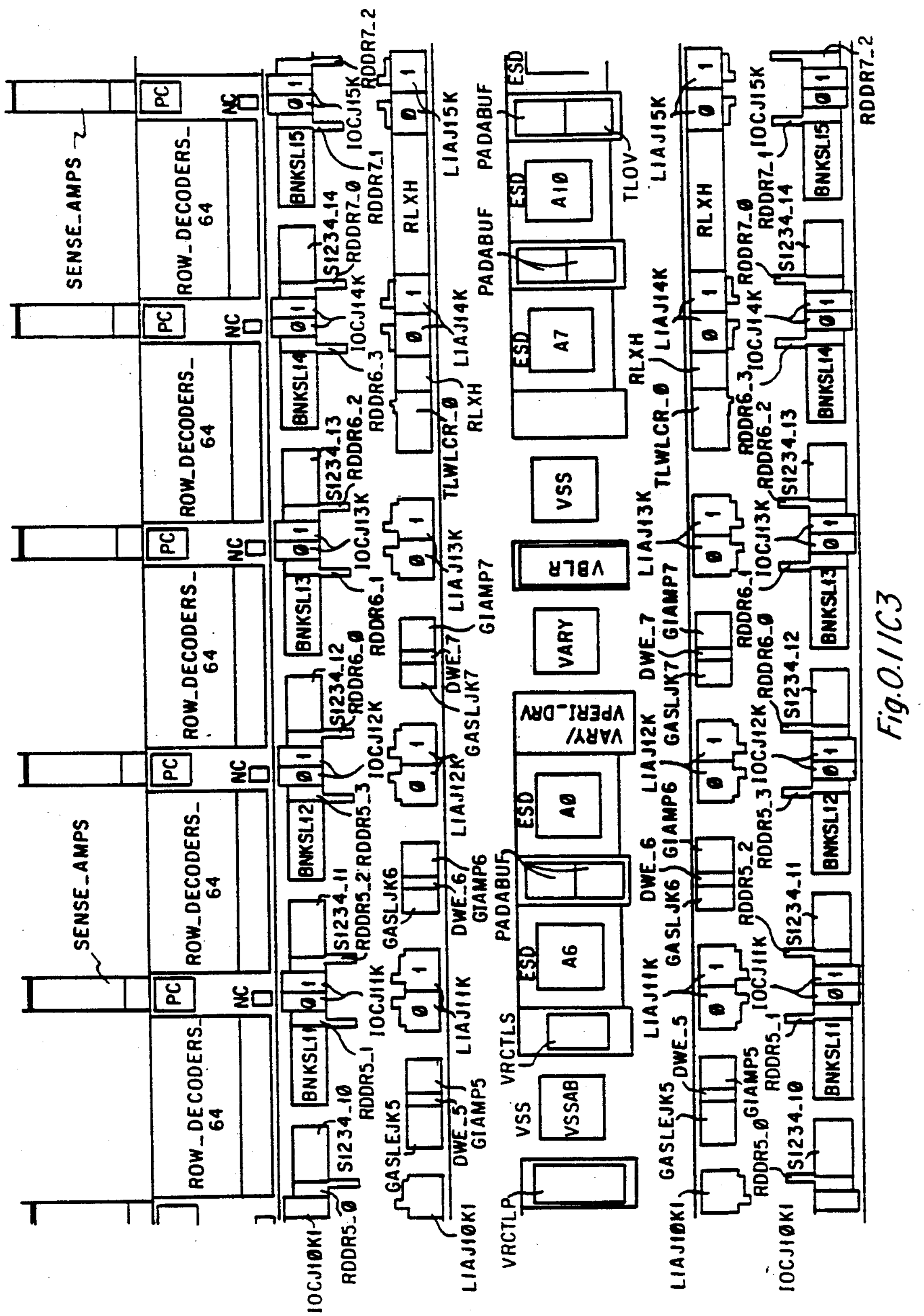
Fig.0.11C3

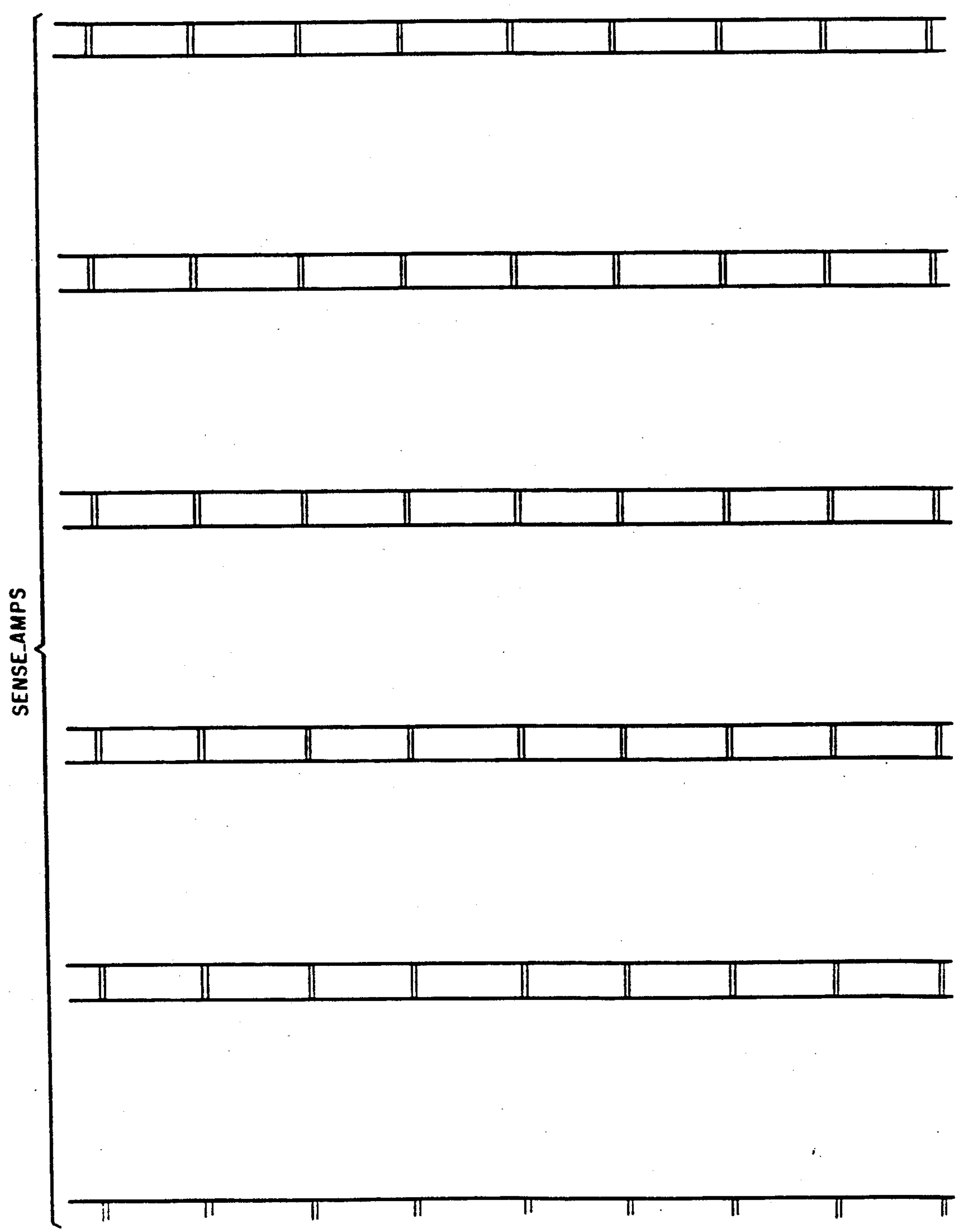
Fig. 0.11C4

Fig. 0.11C5
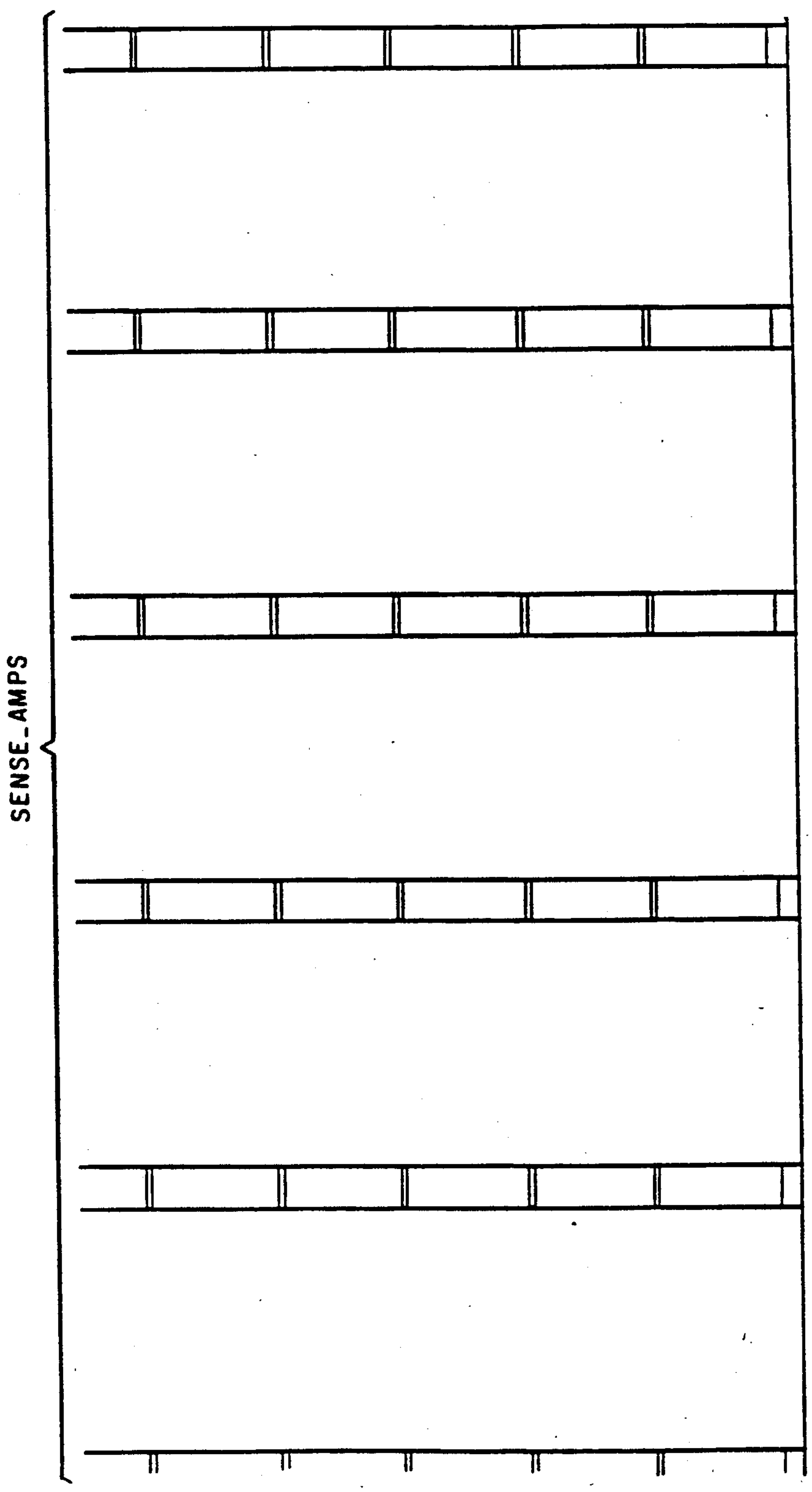

Fig.0.11D1
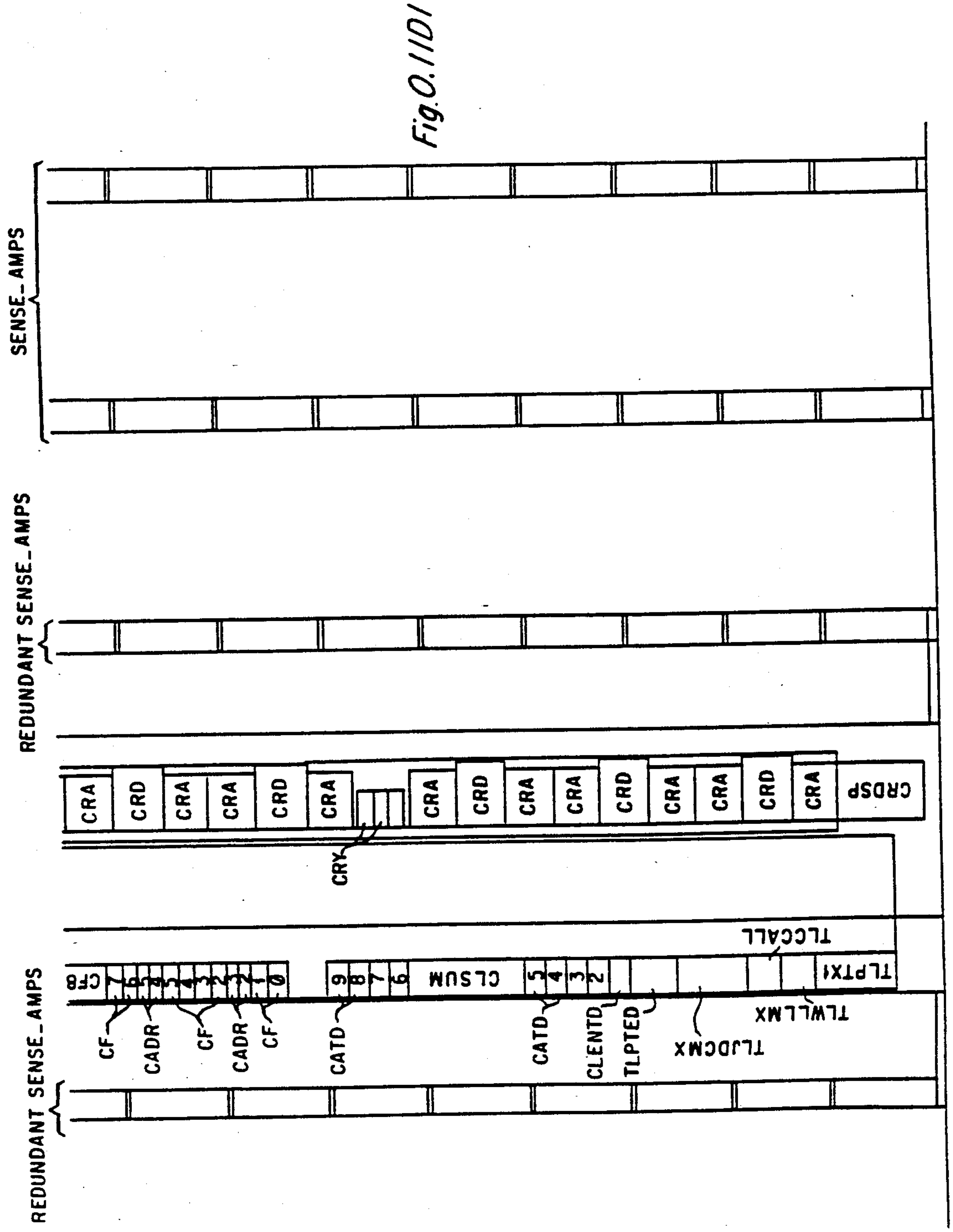

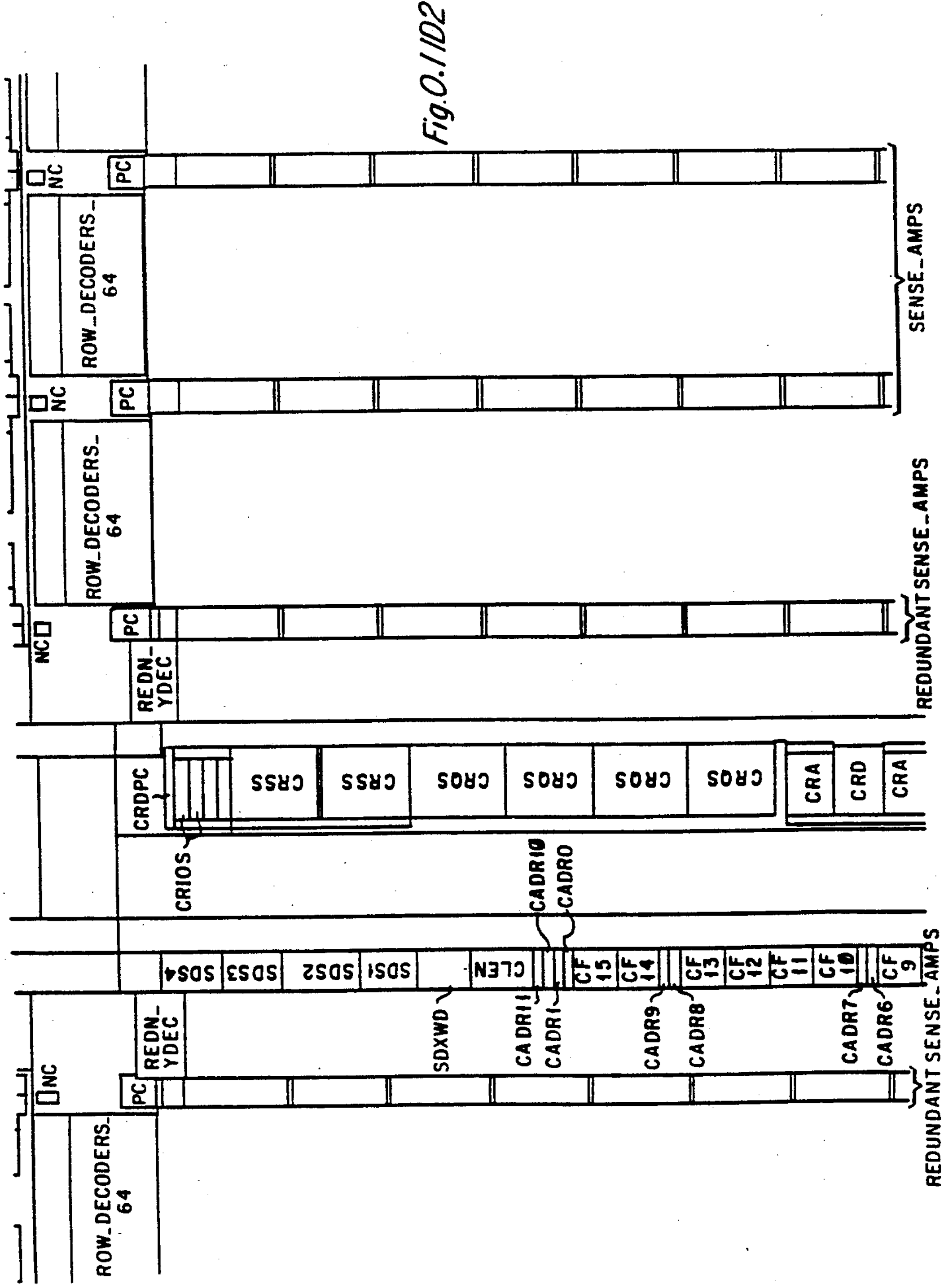
Fig.0.1ID2

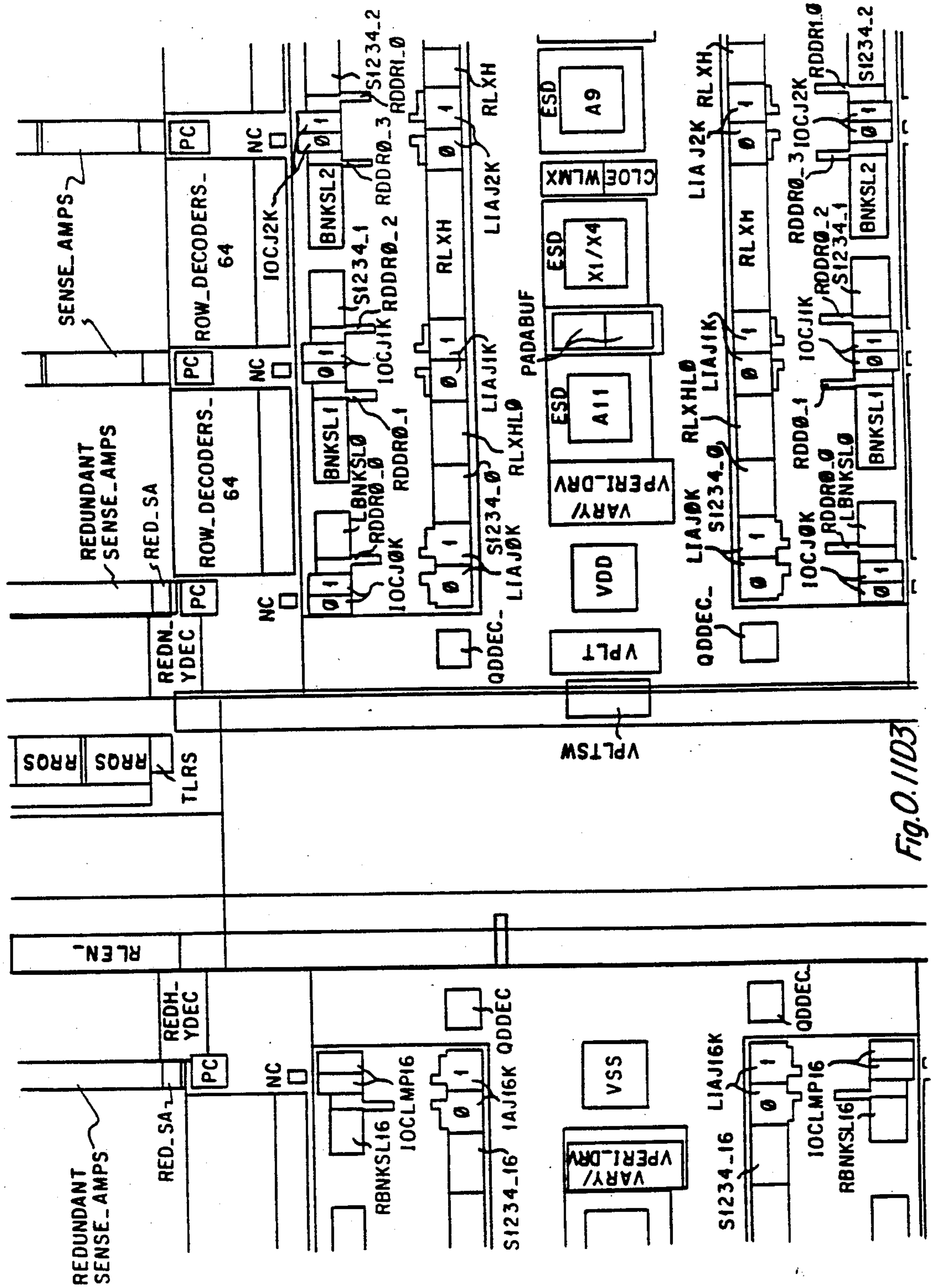
Fig. 0.11D3

Fig. 0.1ID4
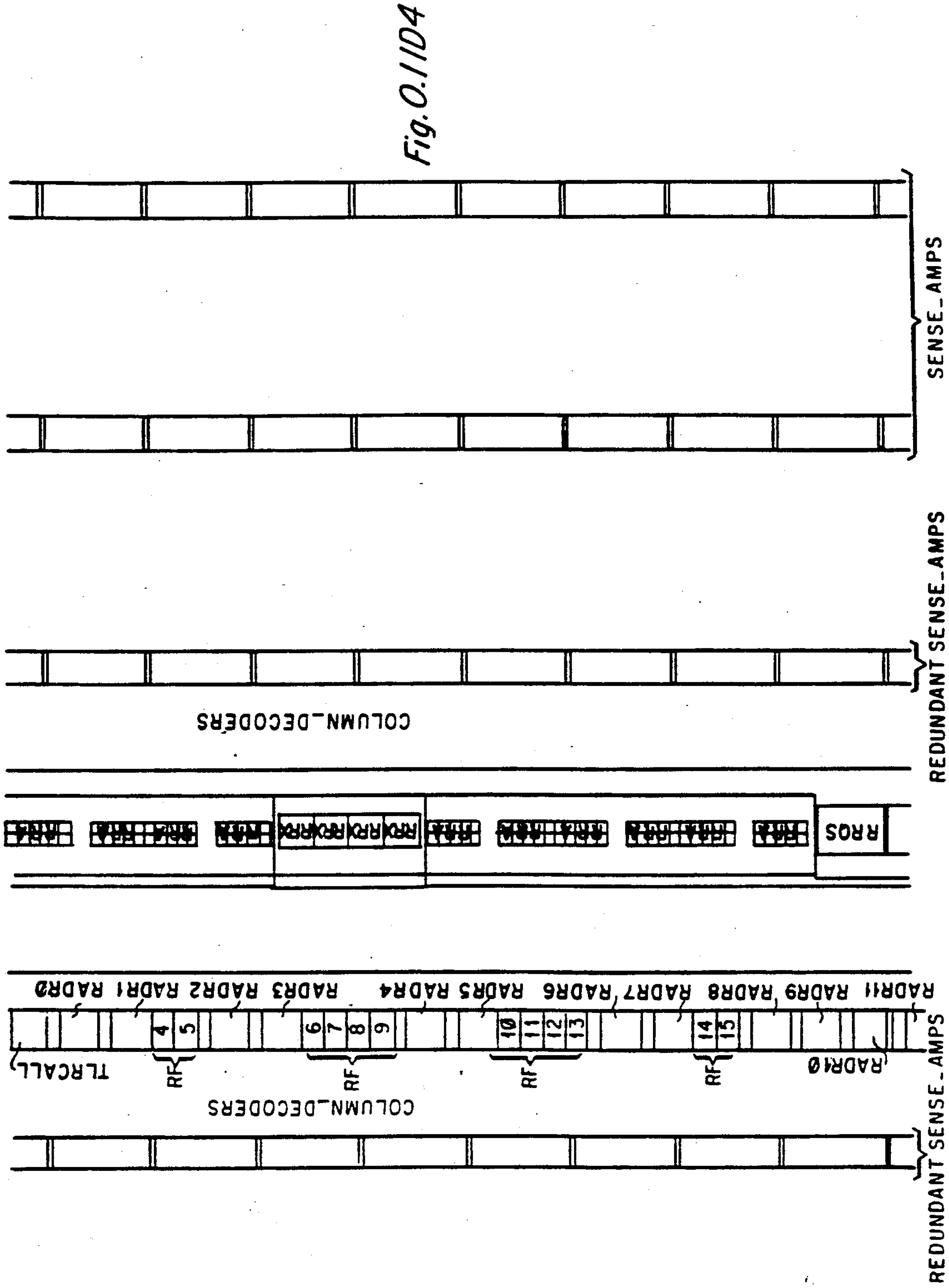

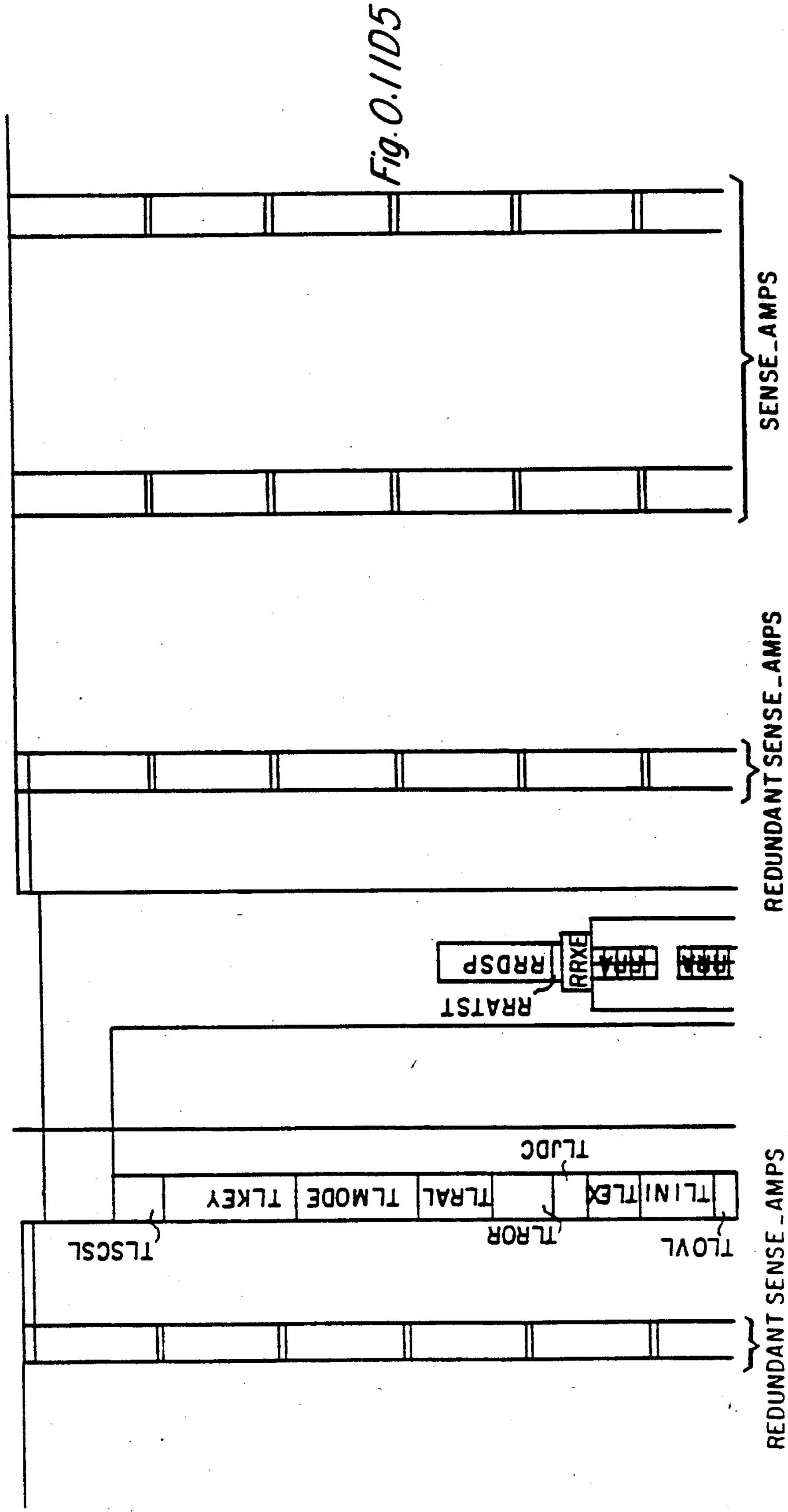
Fig. 0.11D5

Fig. 0.11E1
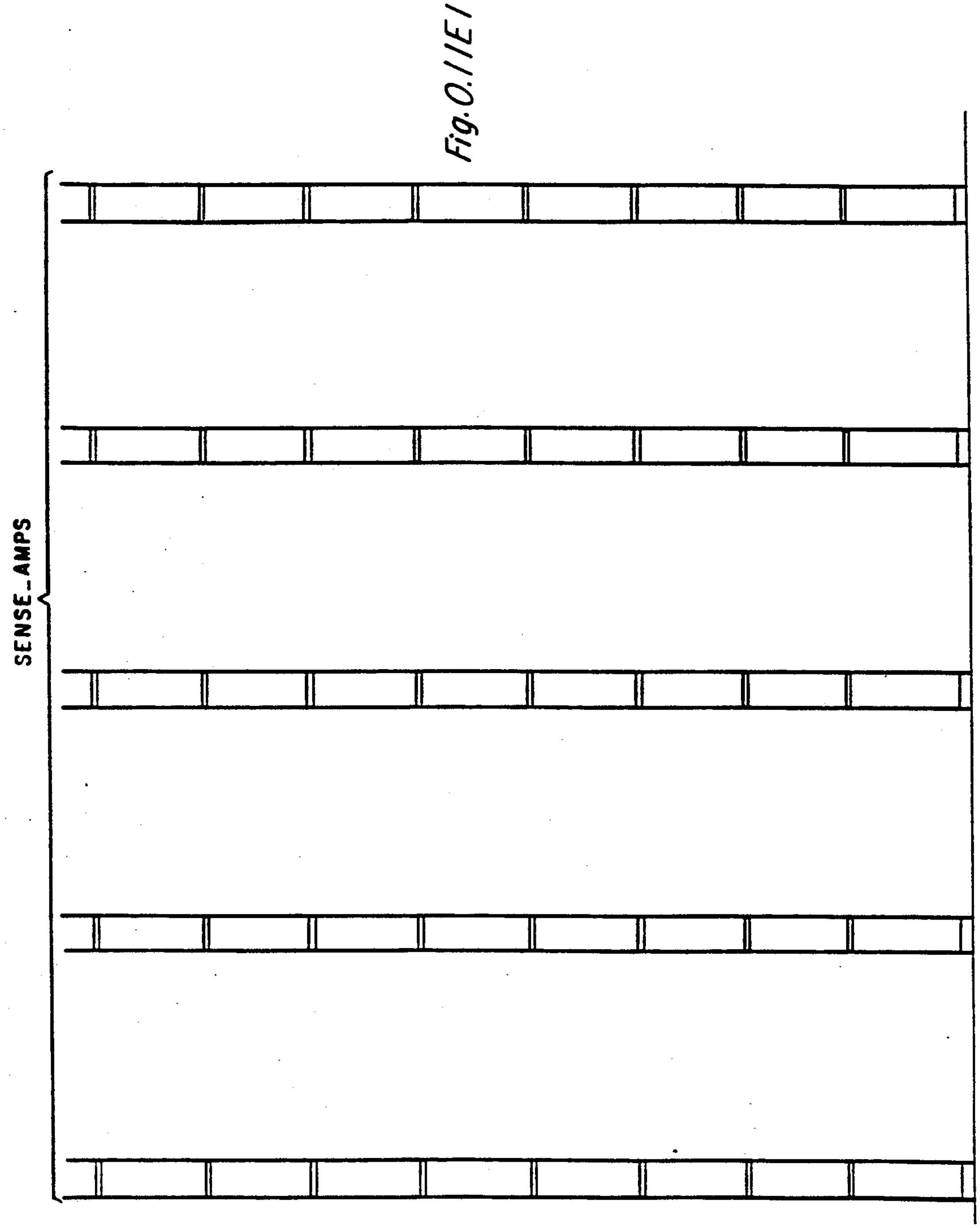

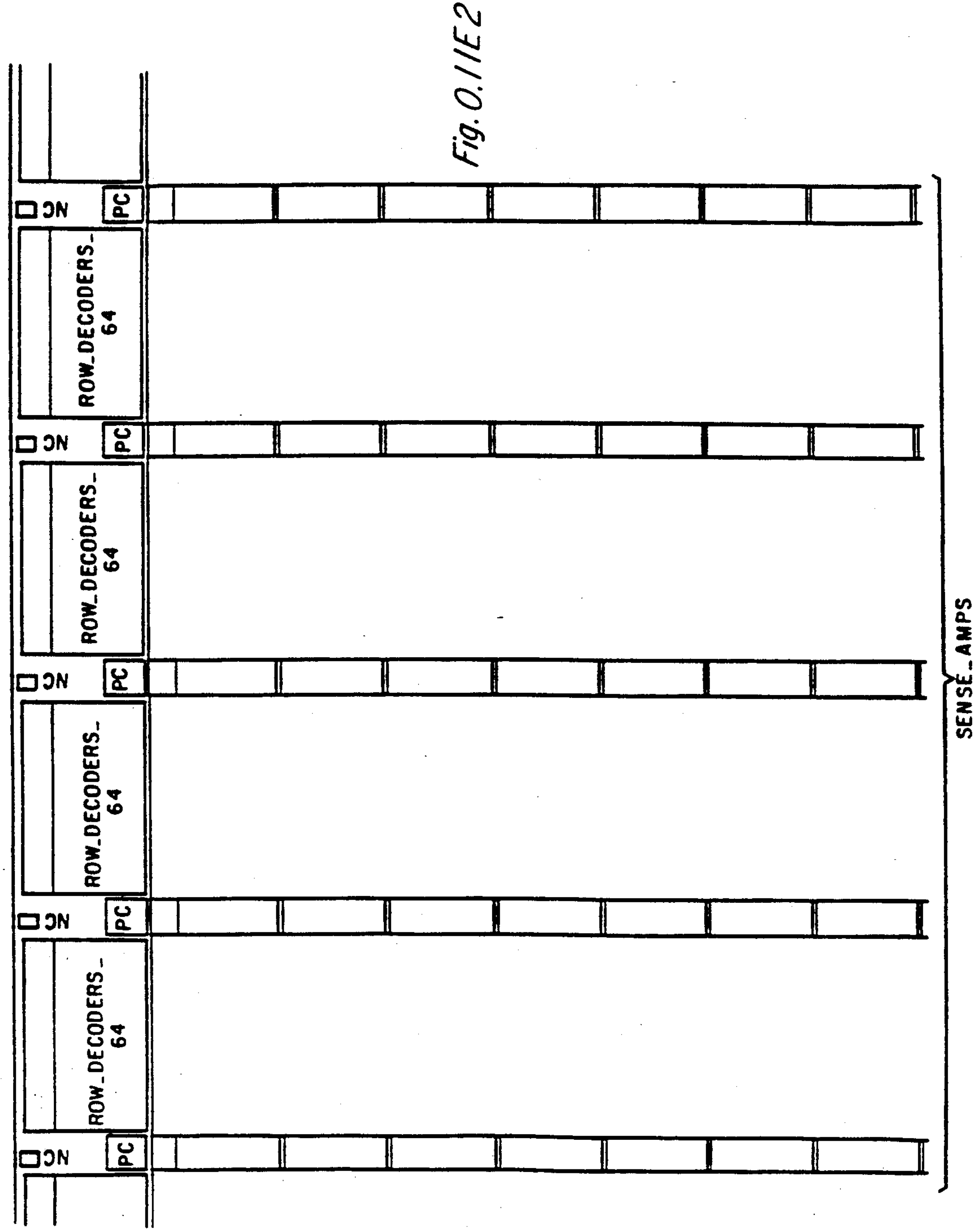
Fig. 0.11E2

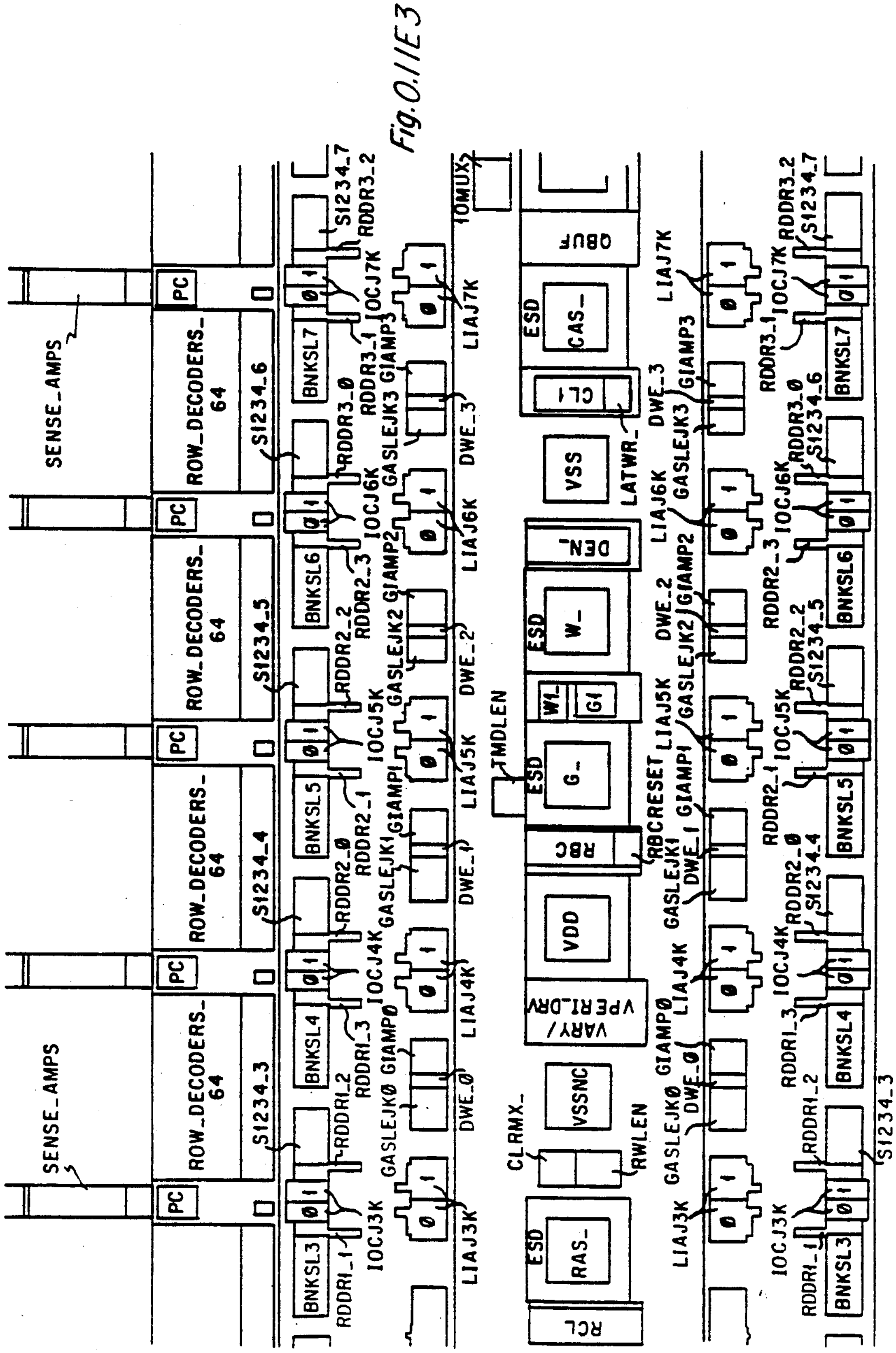
Fig.0.11E3

Fig. 0.11E4
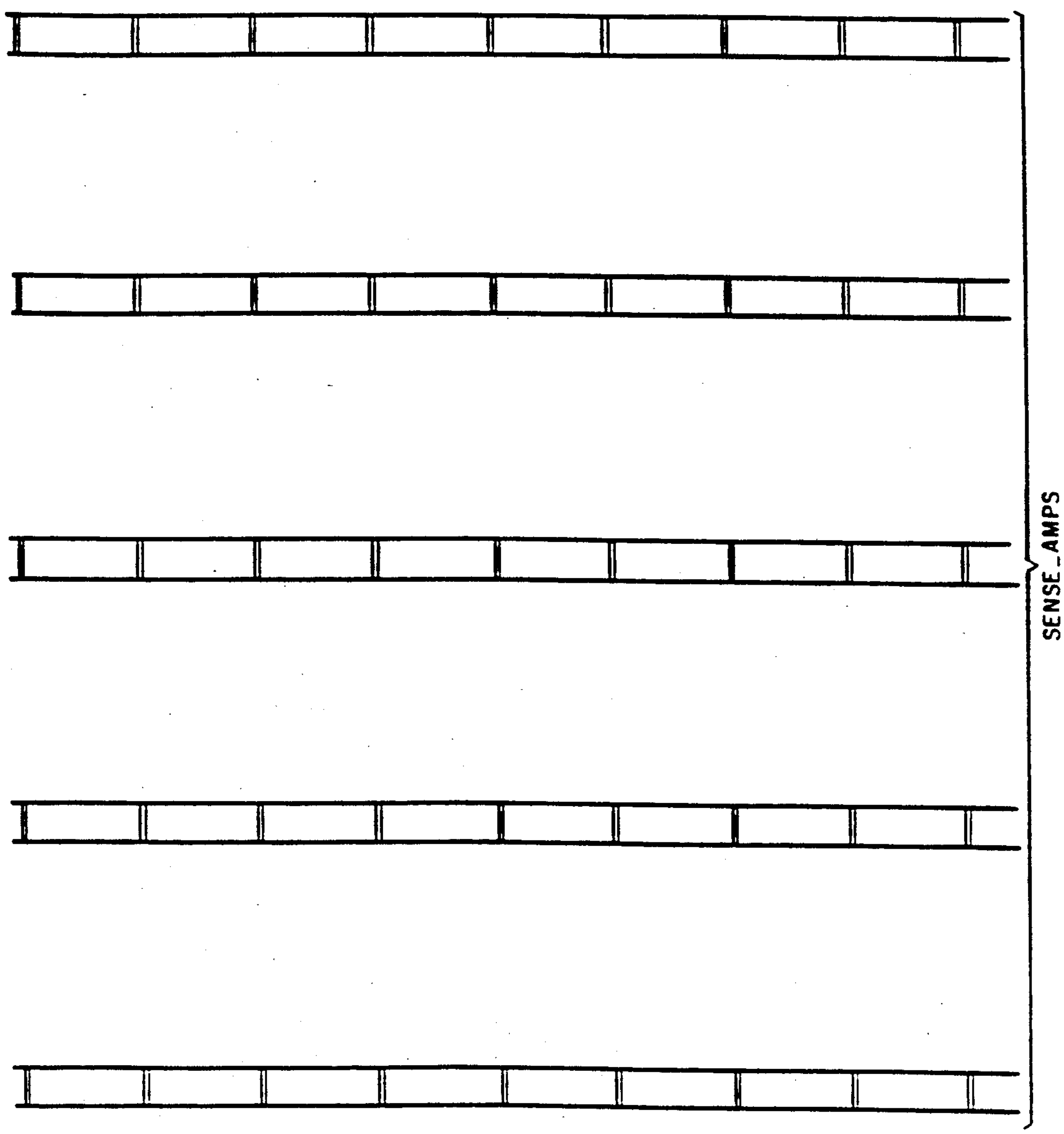

Fig. 0.11E5
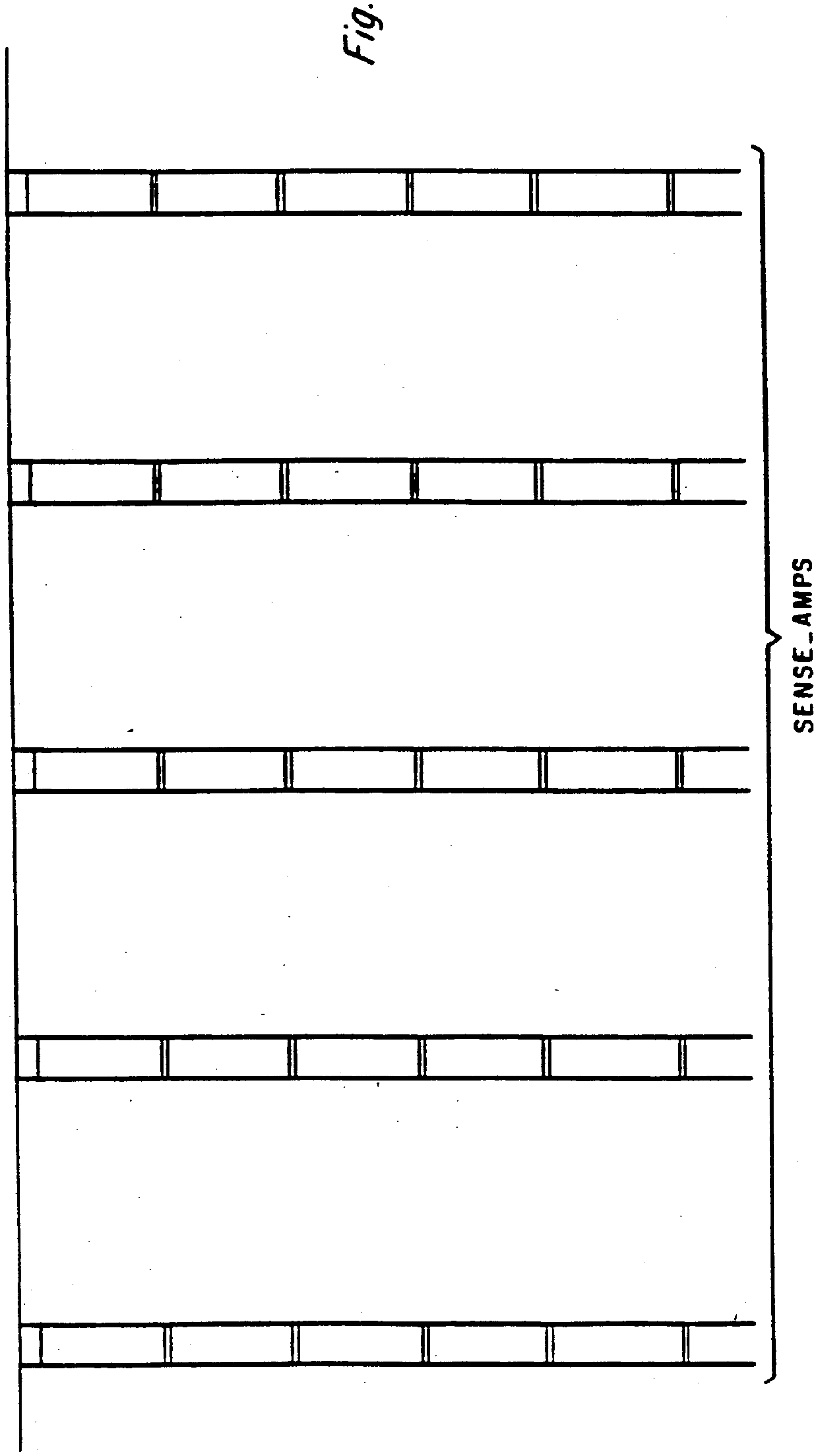

Fig. 0.11F1
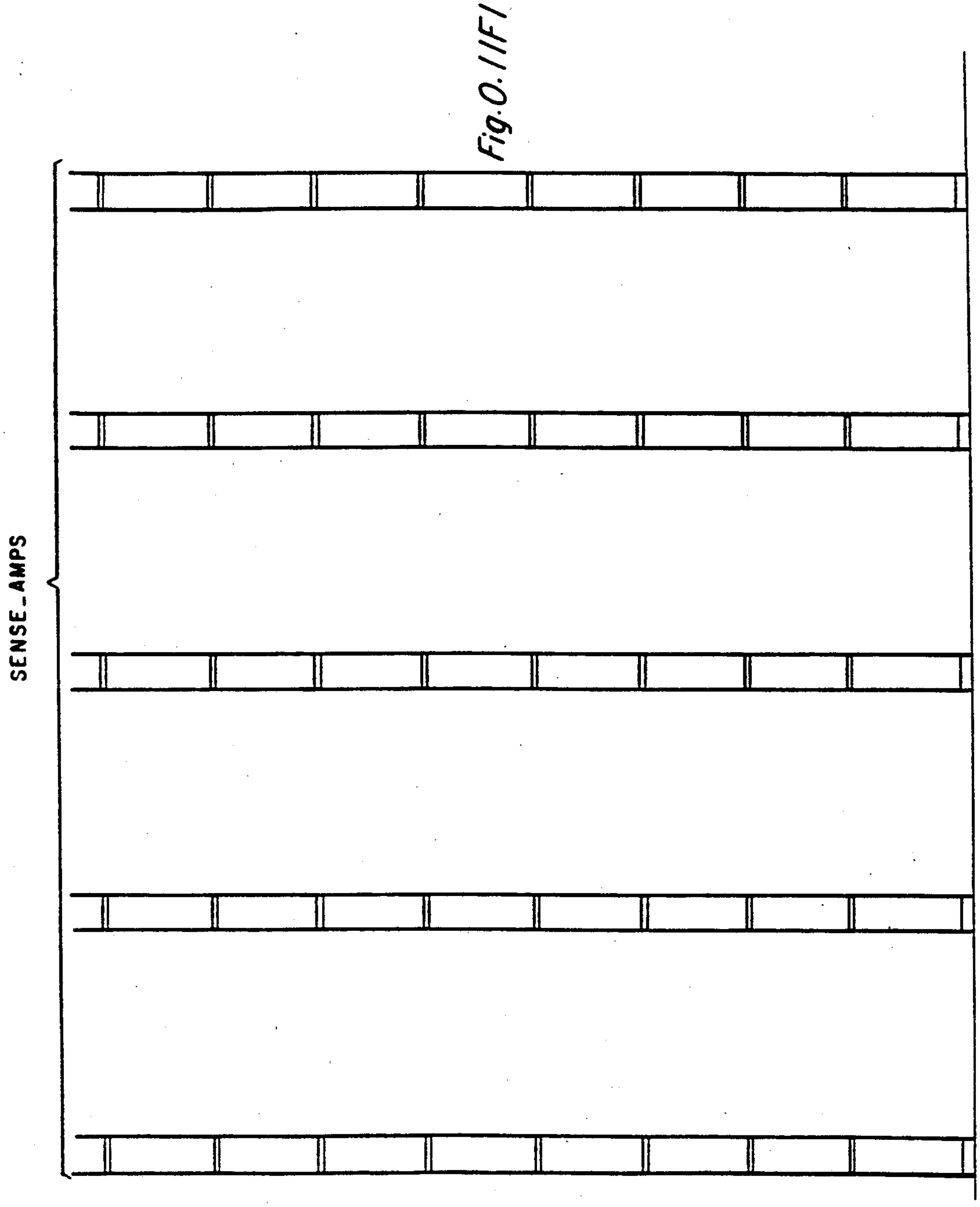

Fig.0.11F2
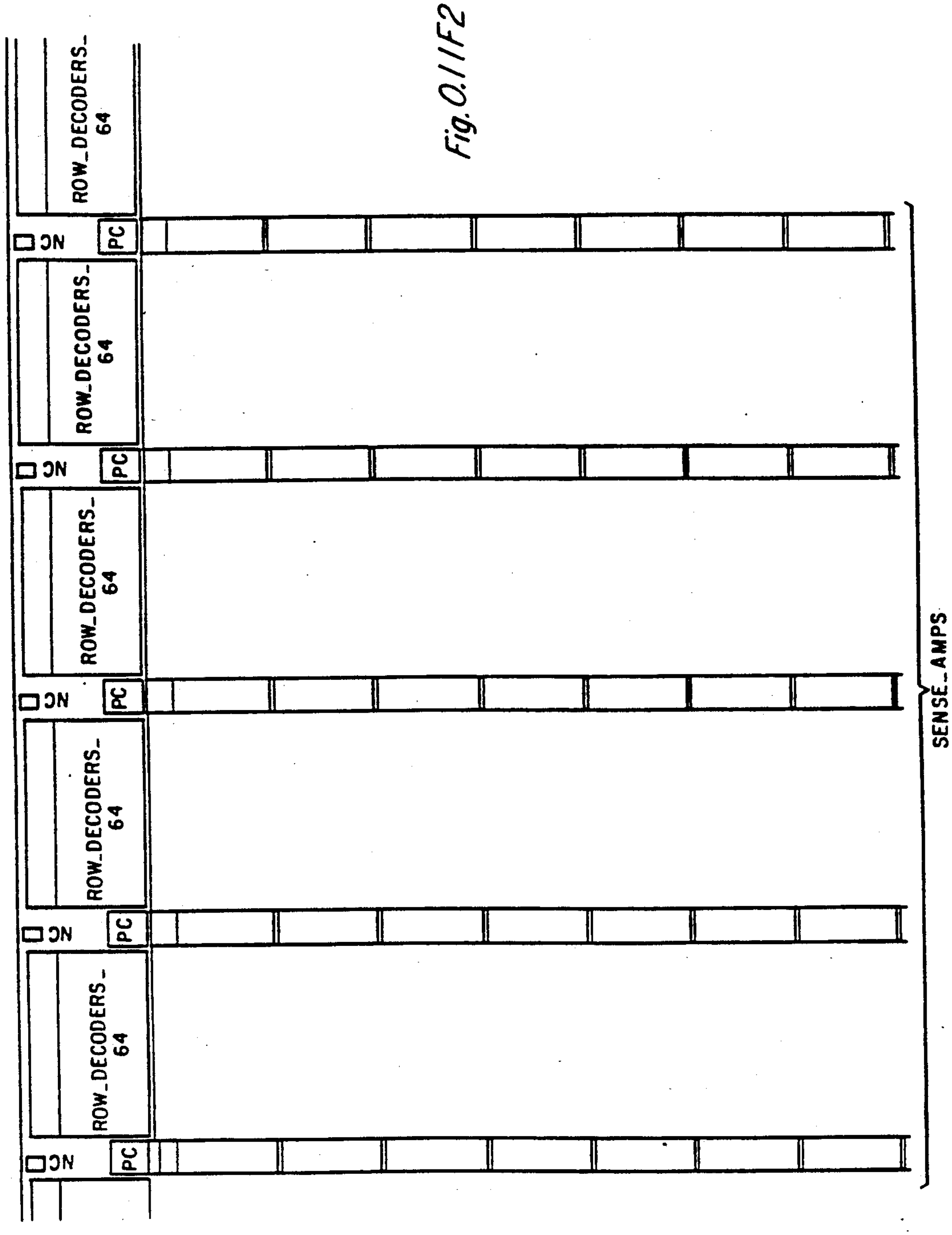

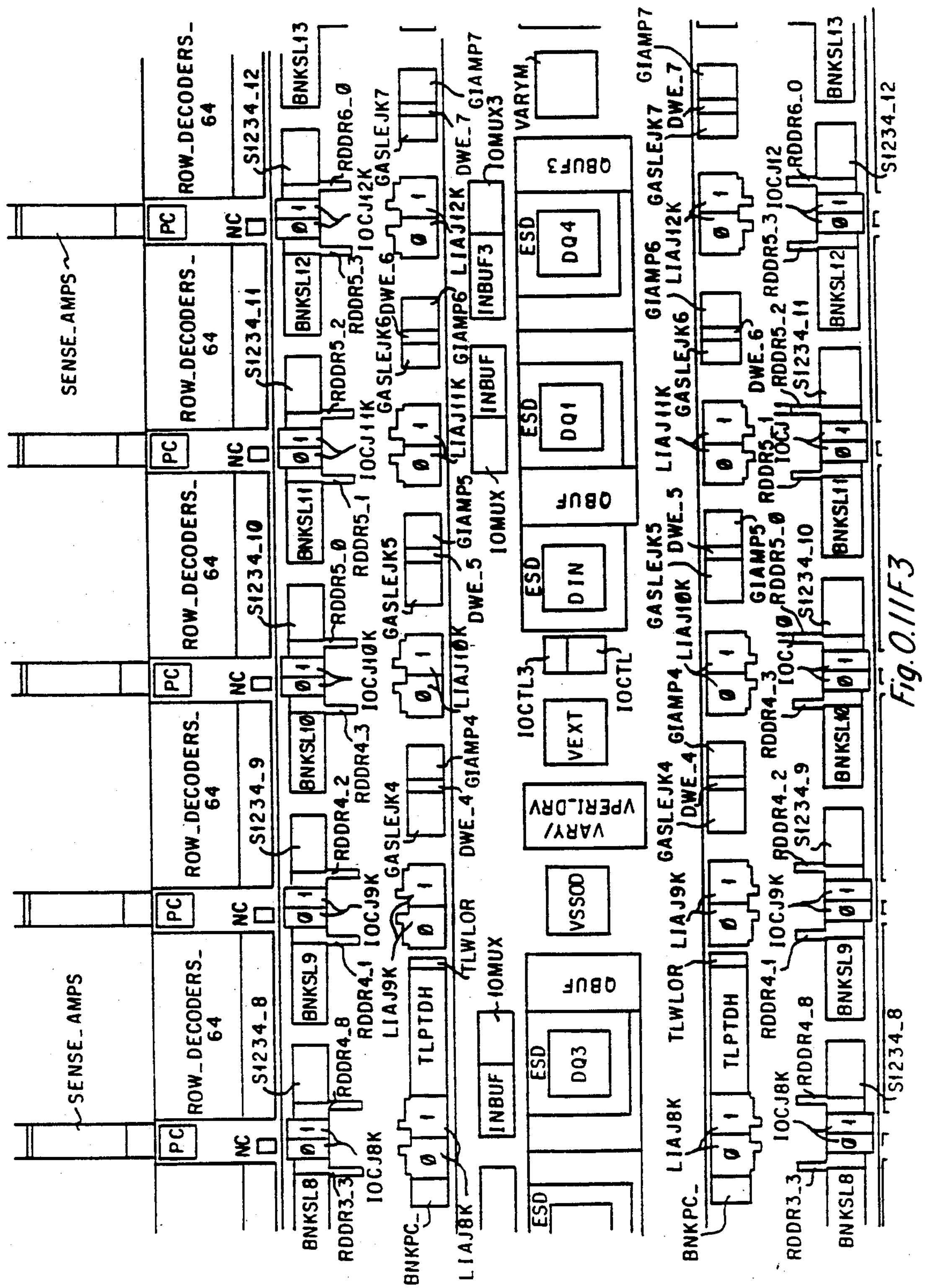
Fig.0.11F3

Fig.0.11F4
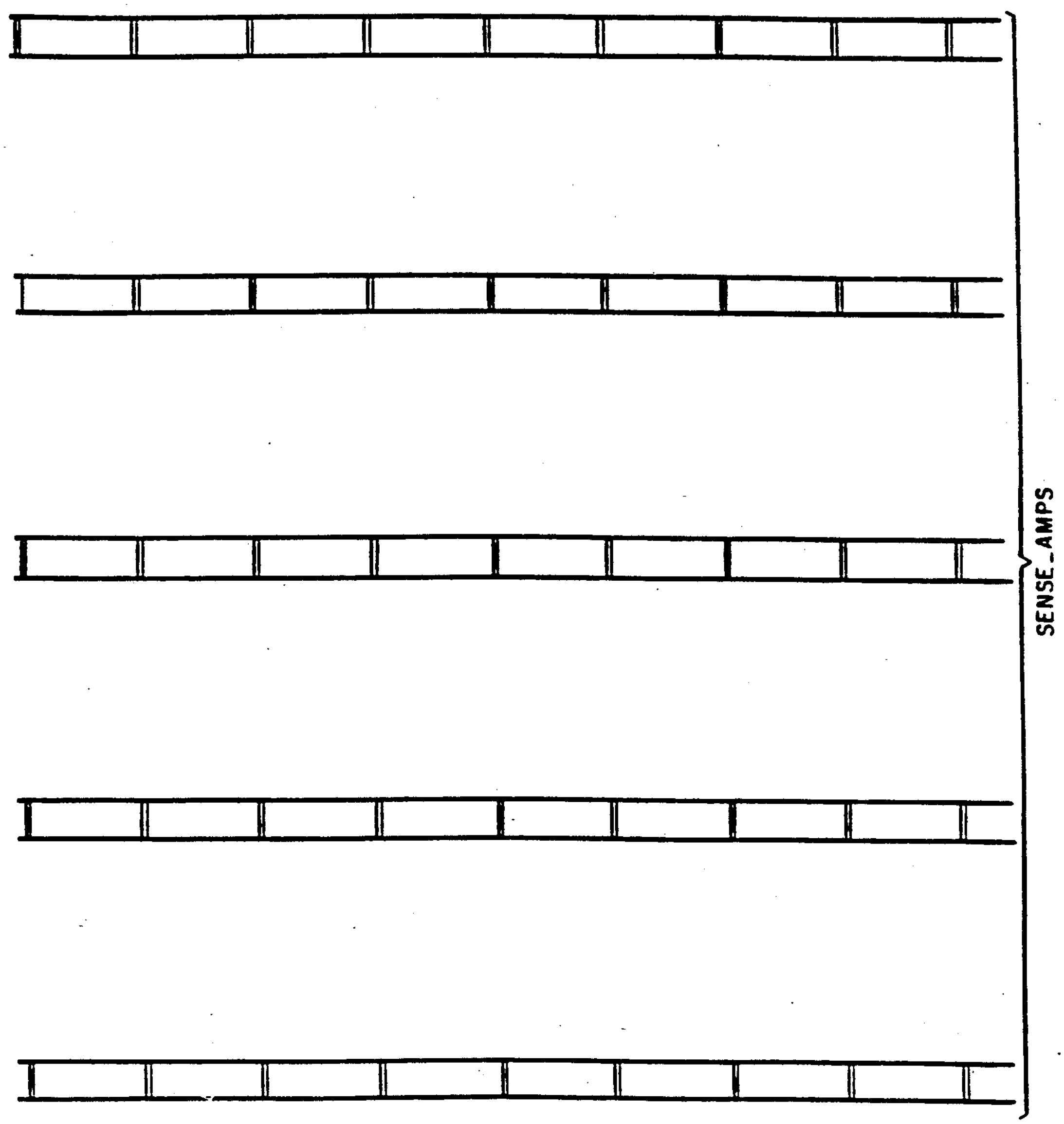

Fig. 0.11F5
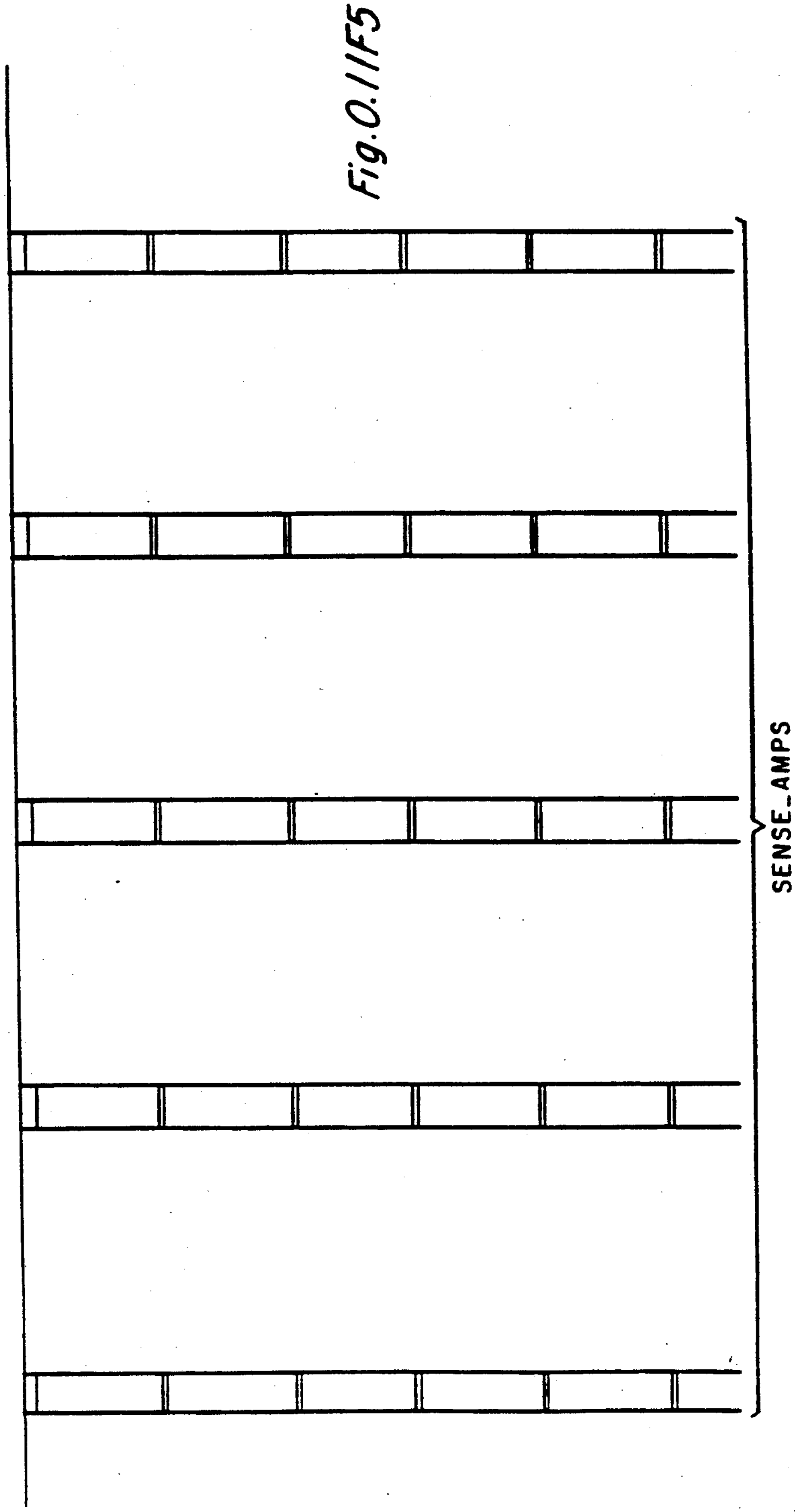

Fig. 0.11G1
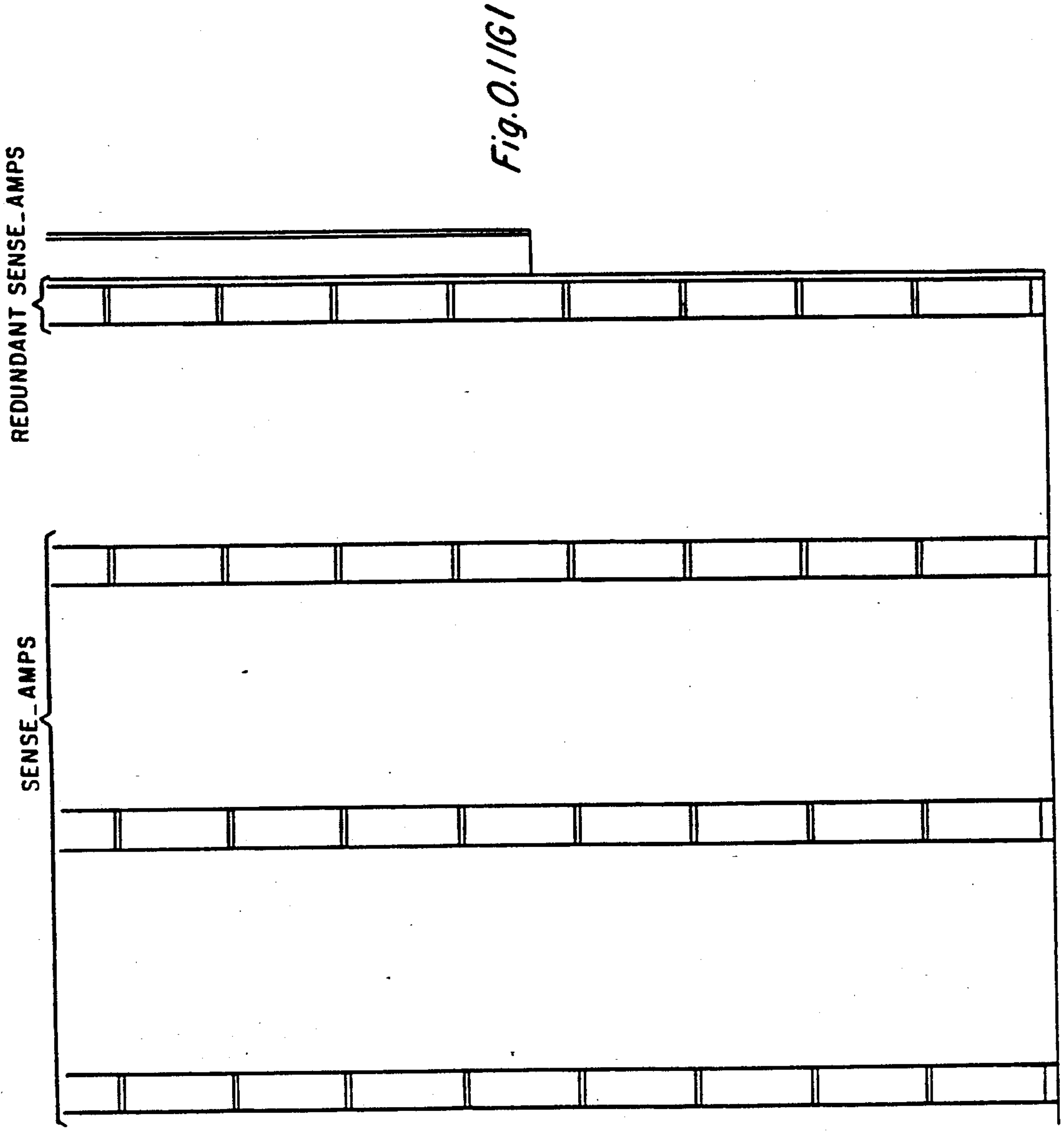

Fig. 0.1IG2
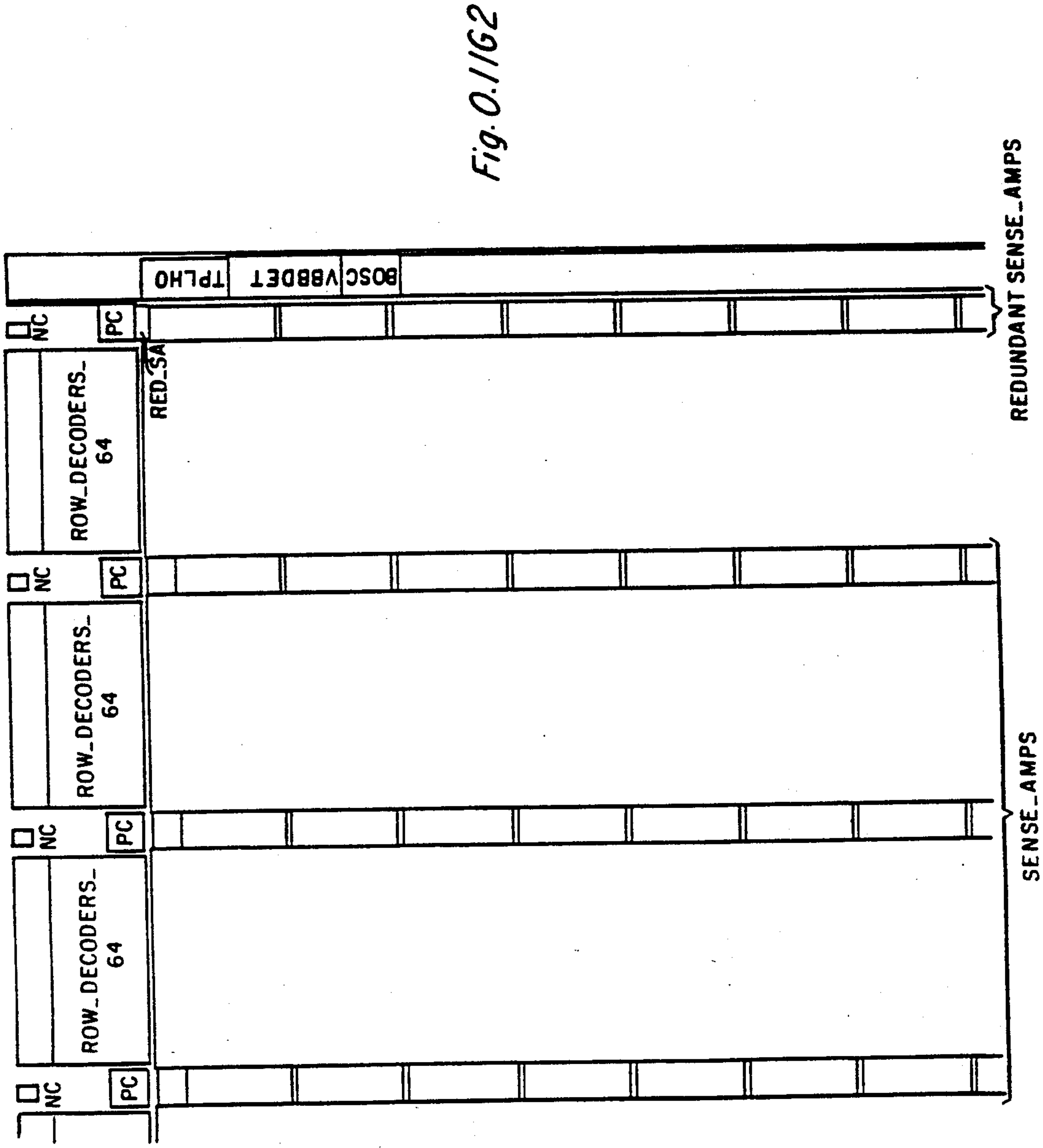

Fig. 0.1IG3
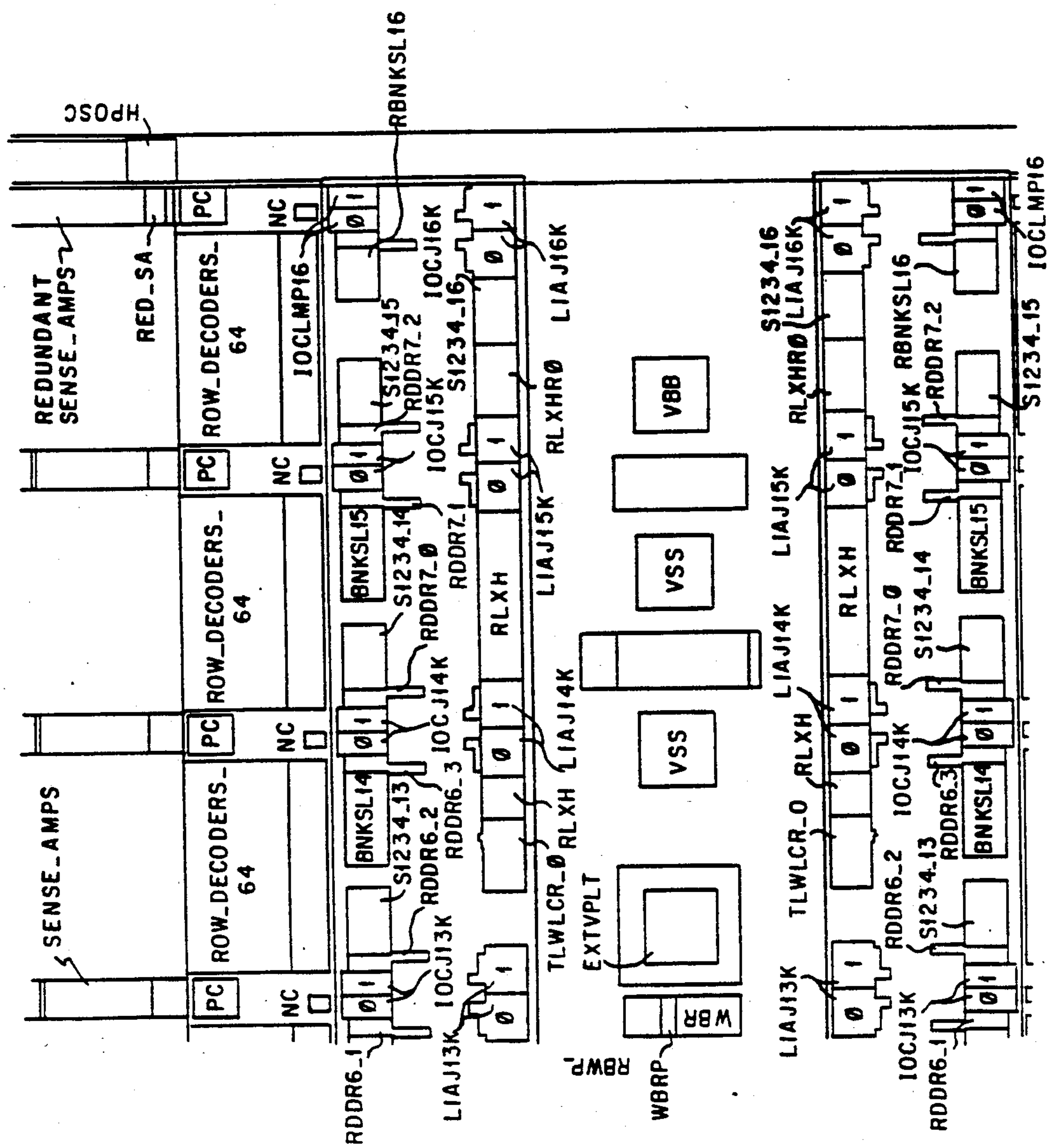

Fig. 0.11G4
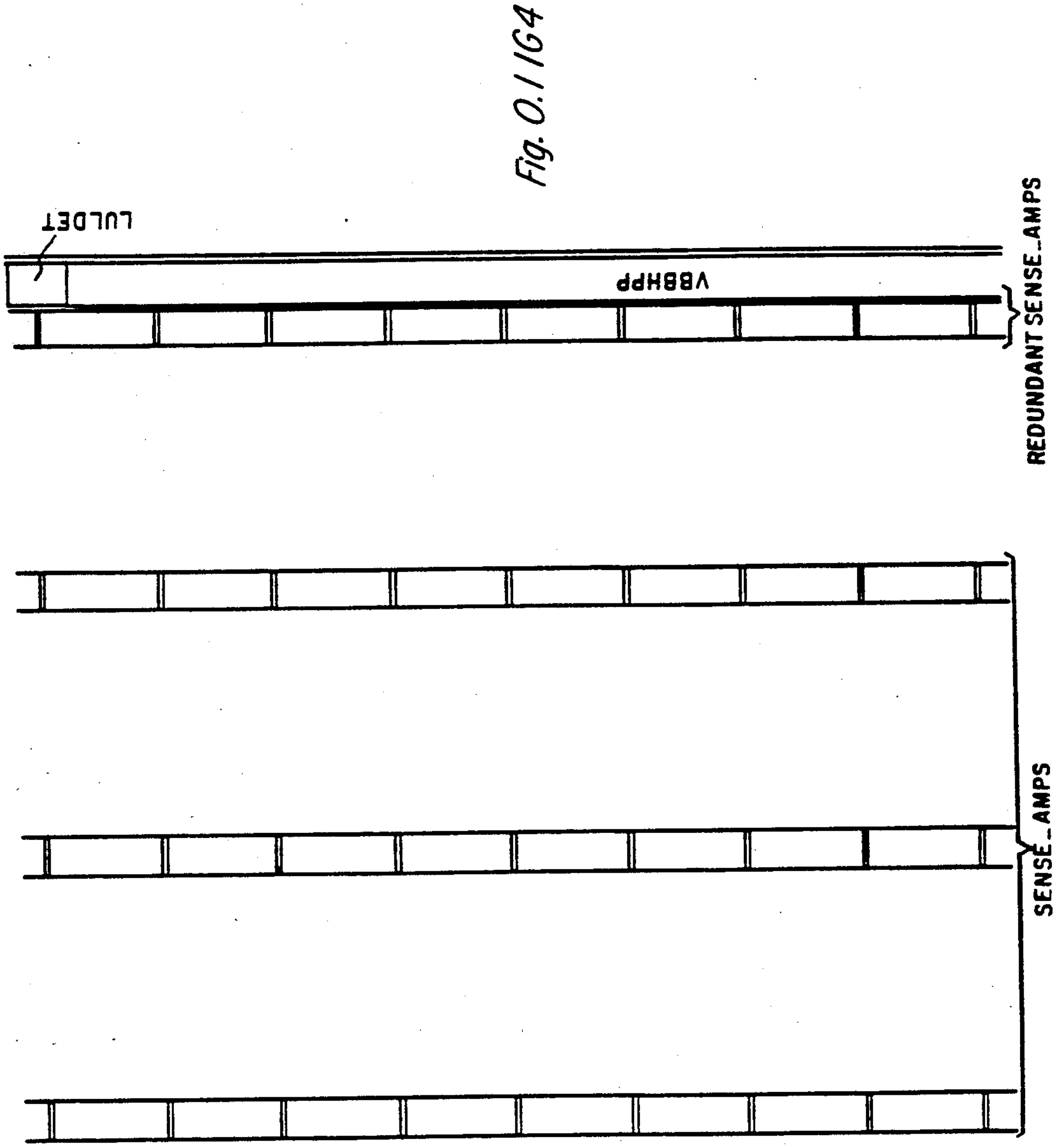

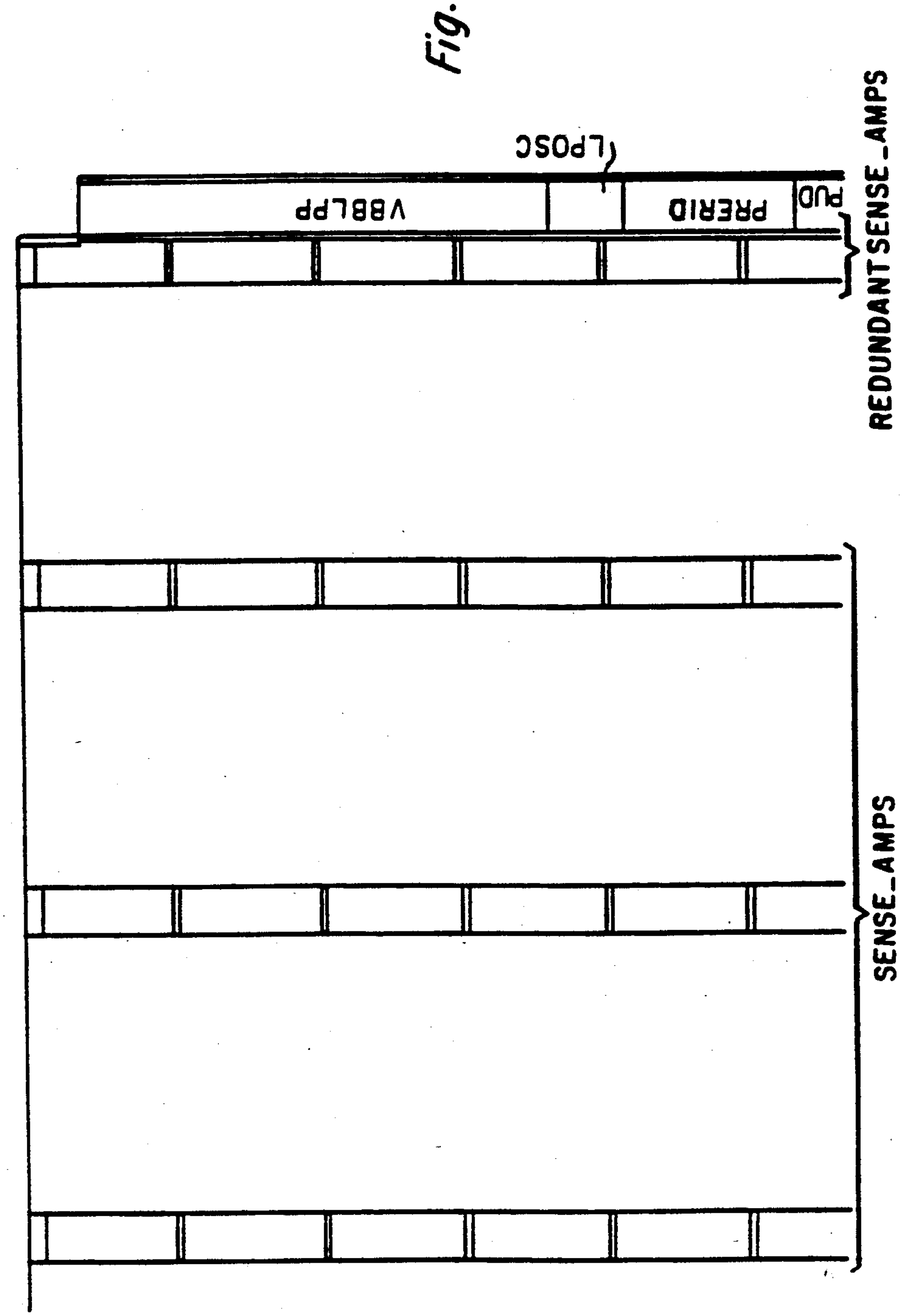
Fig. 0.1G5

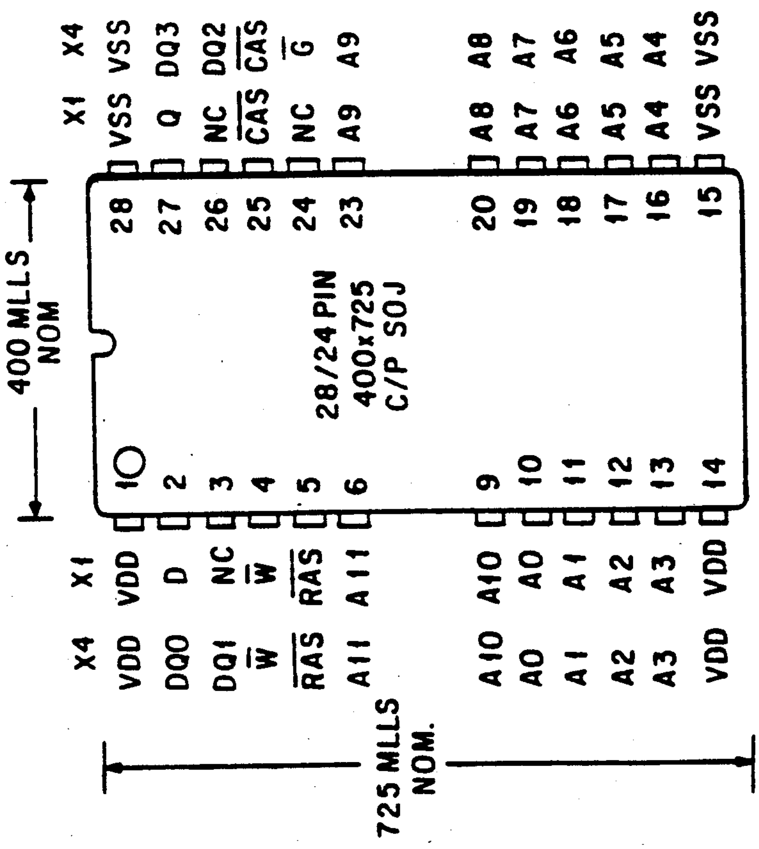
Fig.0.2

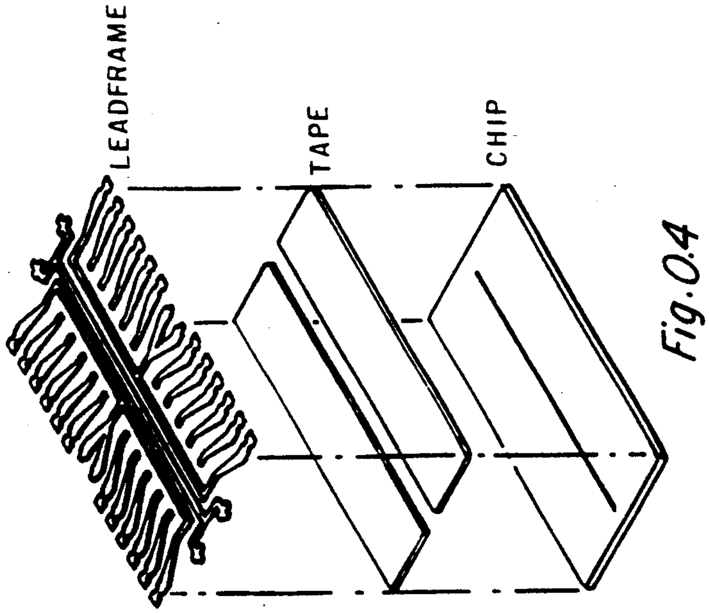
Fig.0.4
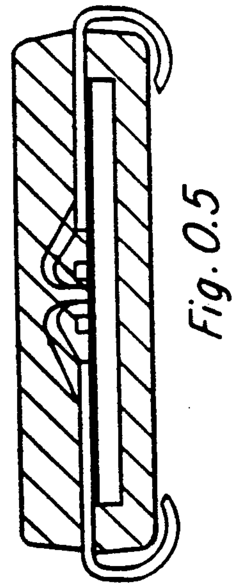
Fig.0.5
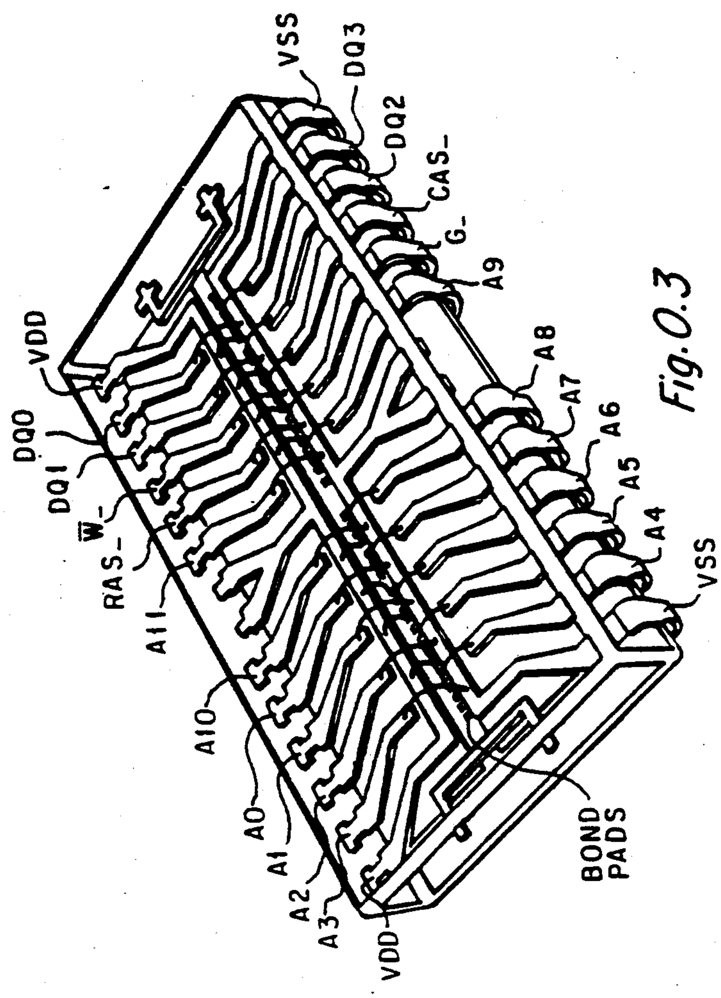
Fig.0.3

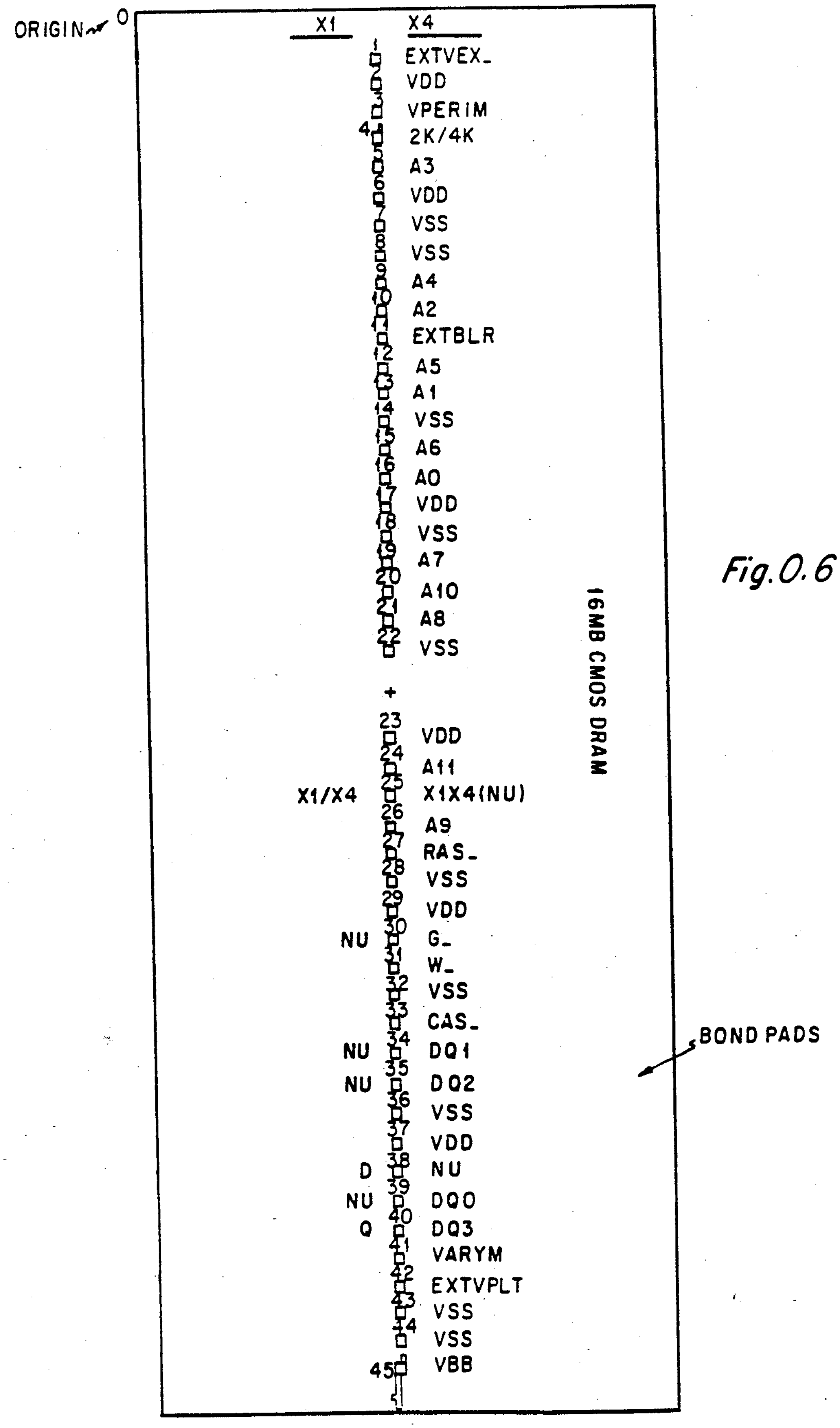
Fig.0.6

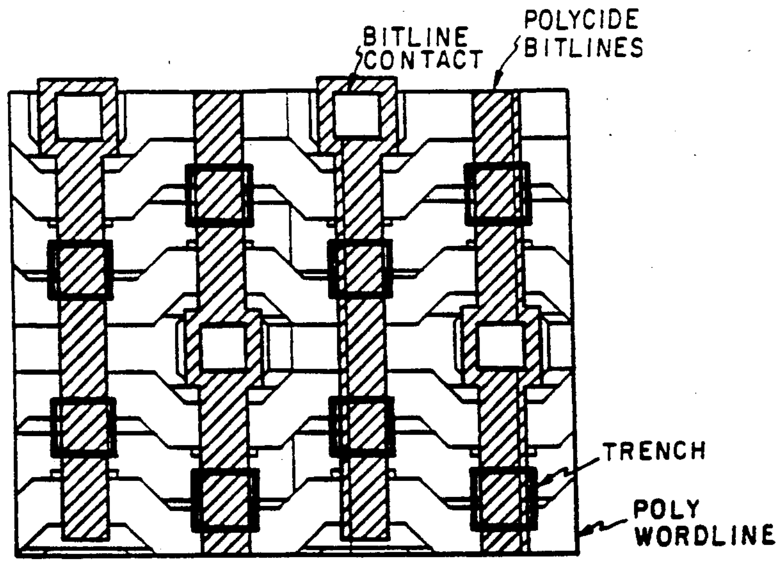
Fig. 0.7
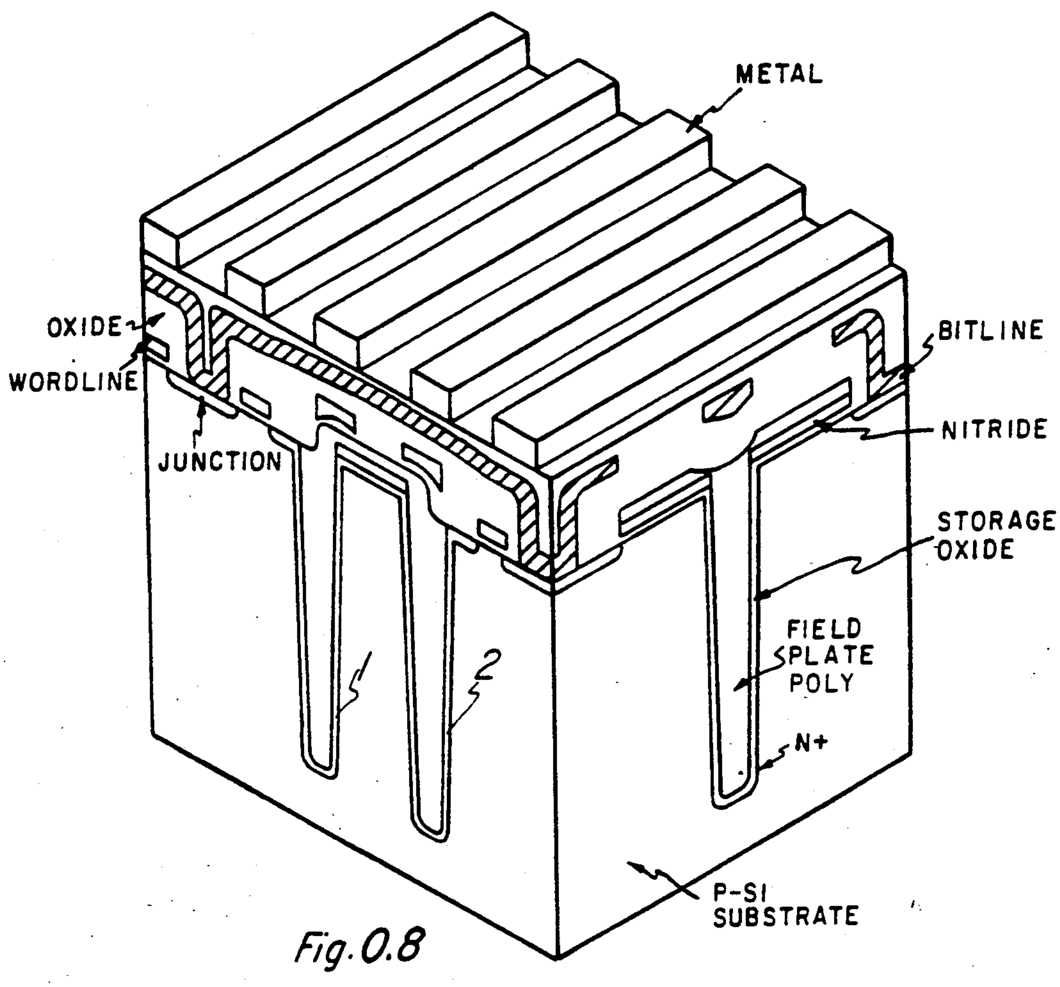
Fig. 0.8

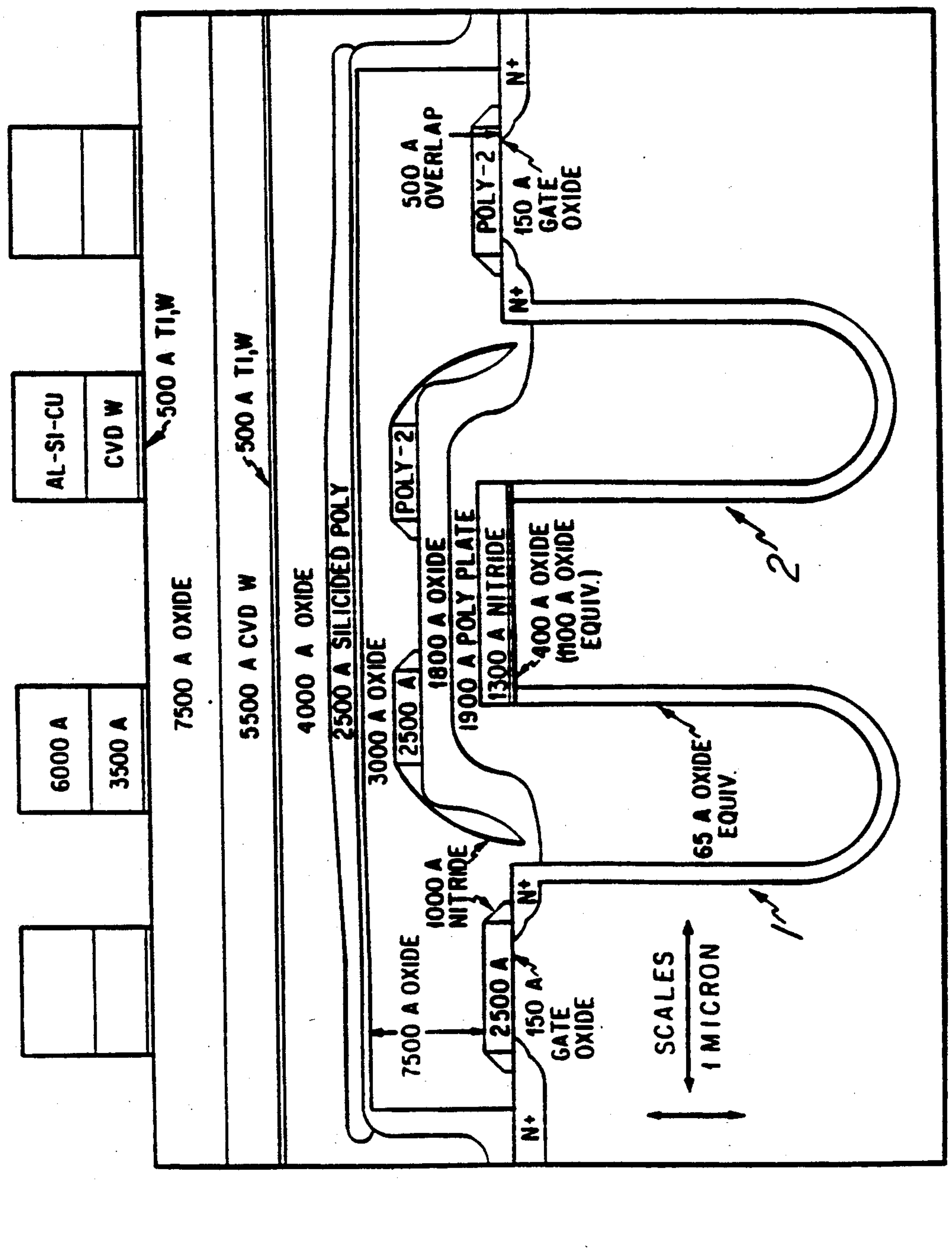
*Fig. 0.9*

RBC_RESET
4/CHIP

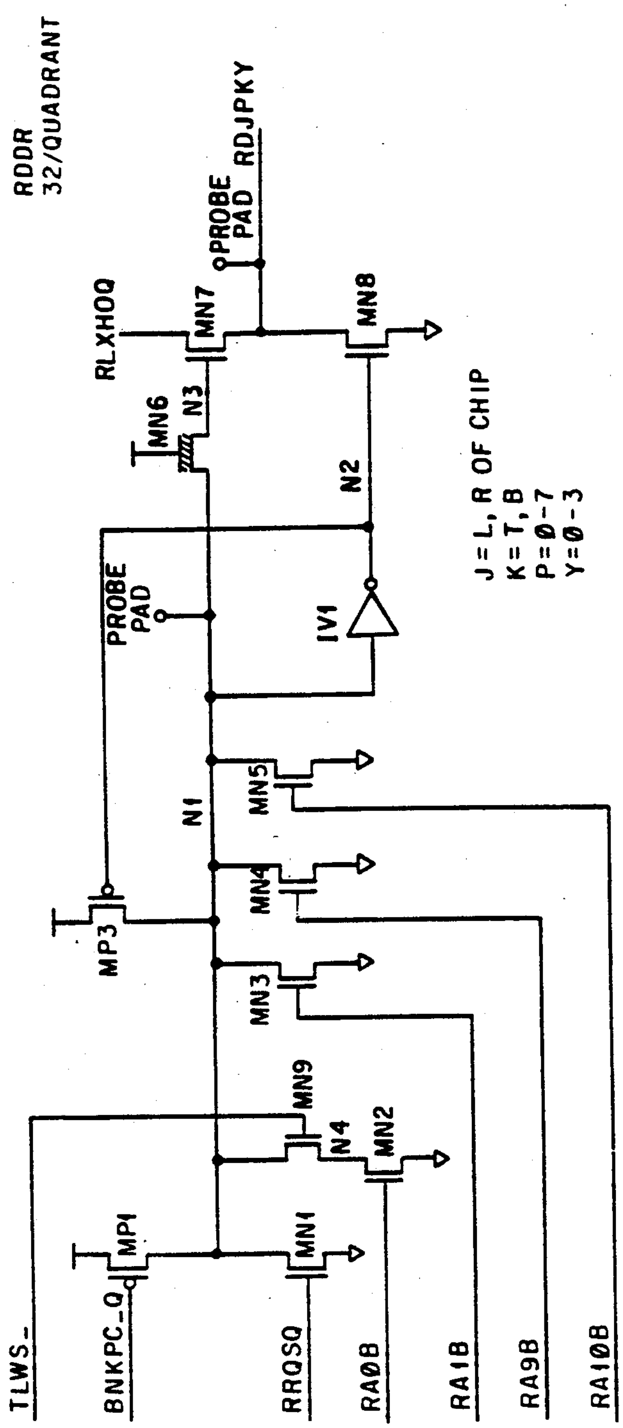
Fig. 12
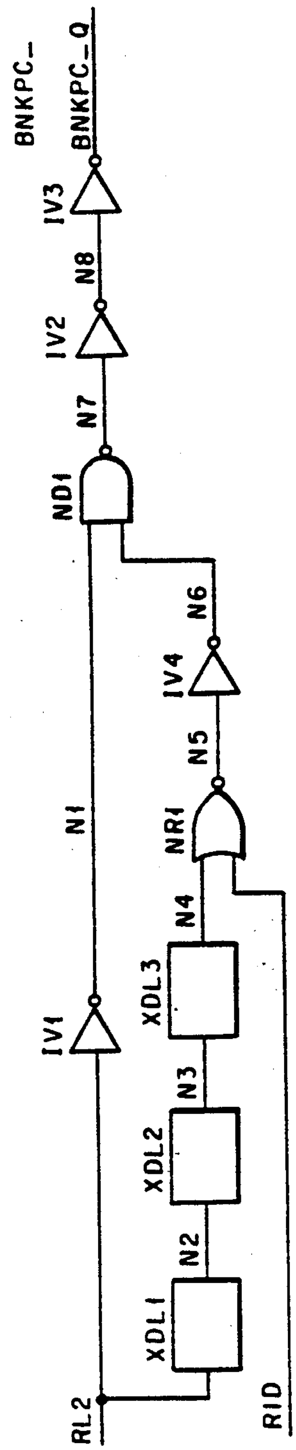
Fig. 12.2

BSS_DR
16/QUADRANT

LENDBNKSL
1/QUADRANT

J = L, R
K = T, B
M = Ø, 15

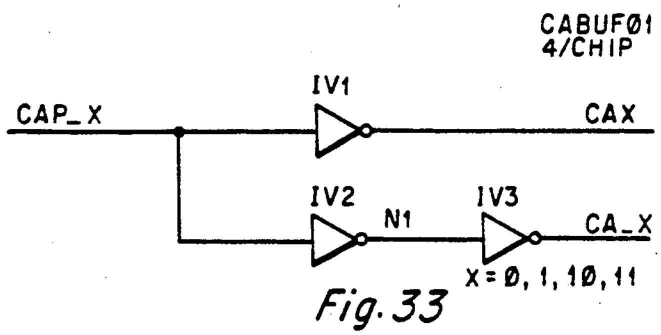
Fig. 33
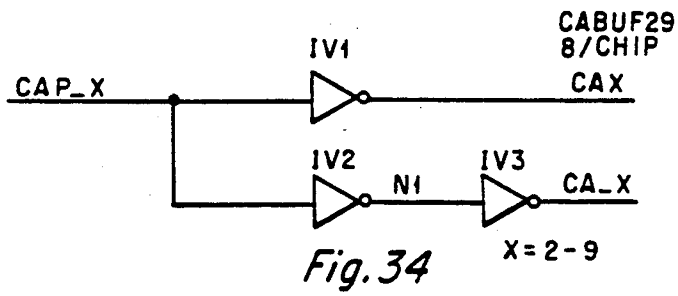
Fig. 34
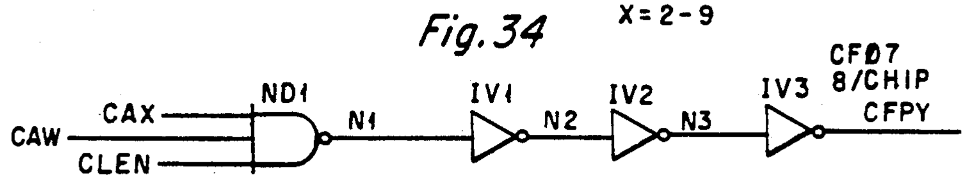
Fig. 36
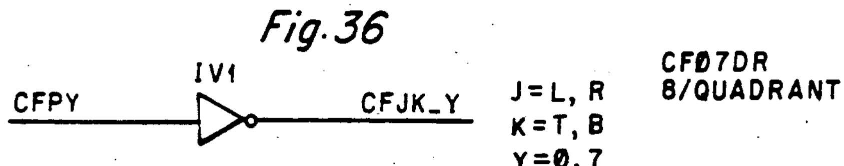
Fig. 36.1
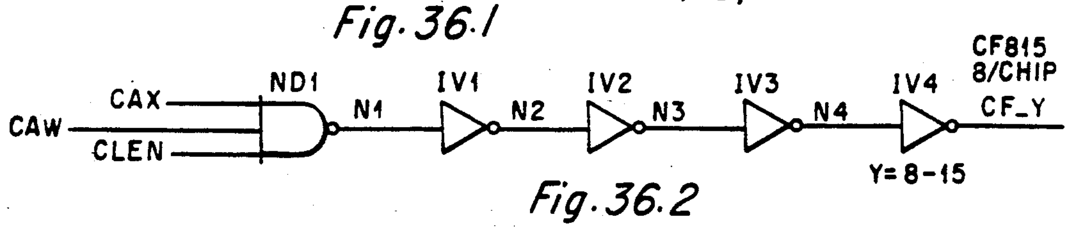
Fig. 36.2

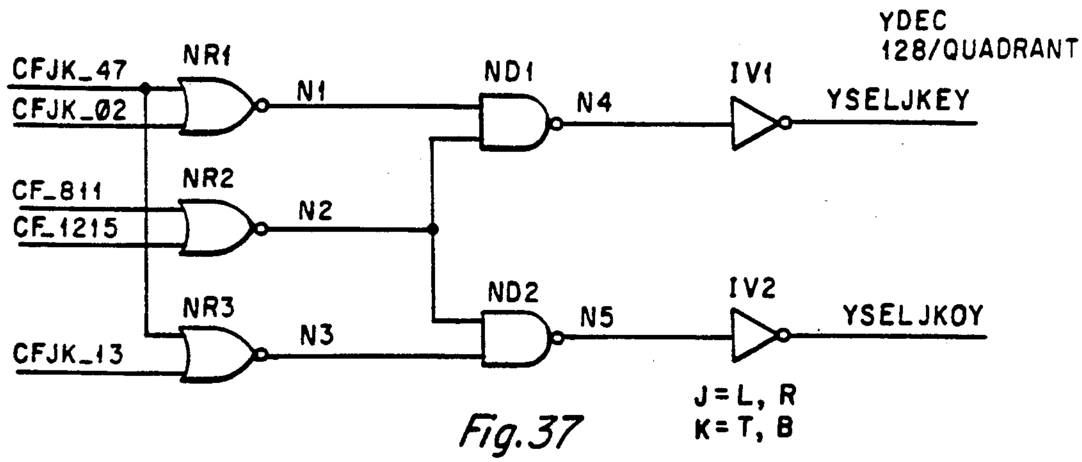
Fig. 37
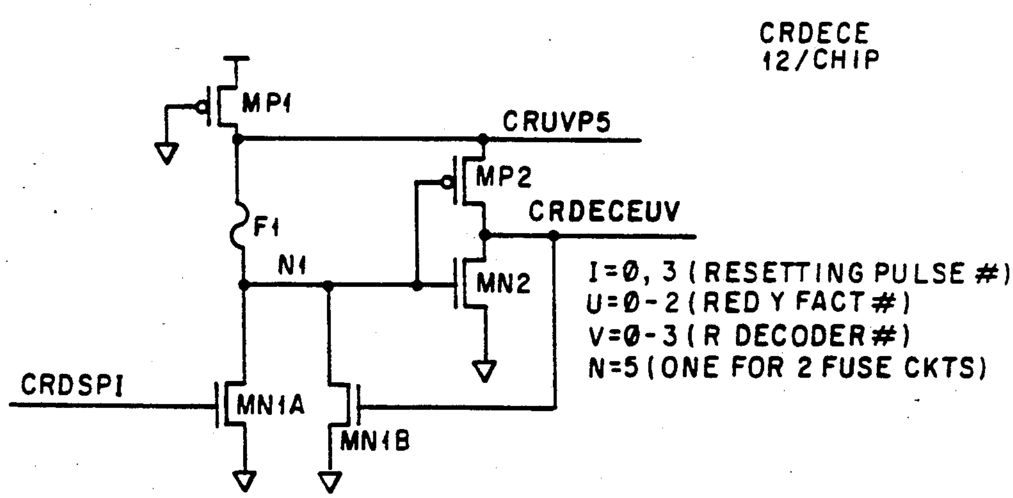
Fig. 37.1

| U | 0 | | | | 1 | | | | 2 | | | |
|---|---|---|---|---|---|---|---|---|---|---|---|---|
| V | Ø | 1 | 2 | 3 | Ø | 1 | 2 | 3 | Ø | 1 | 2 | 3 |

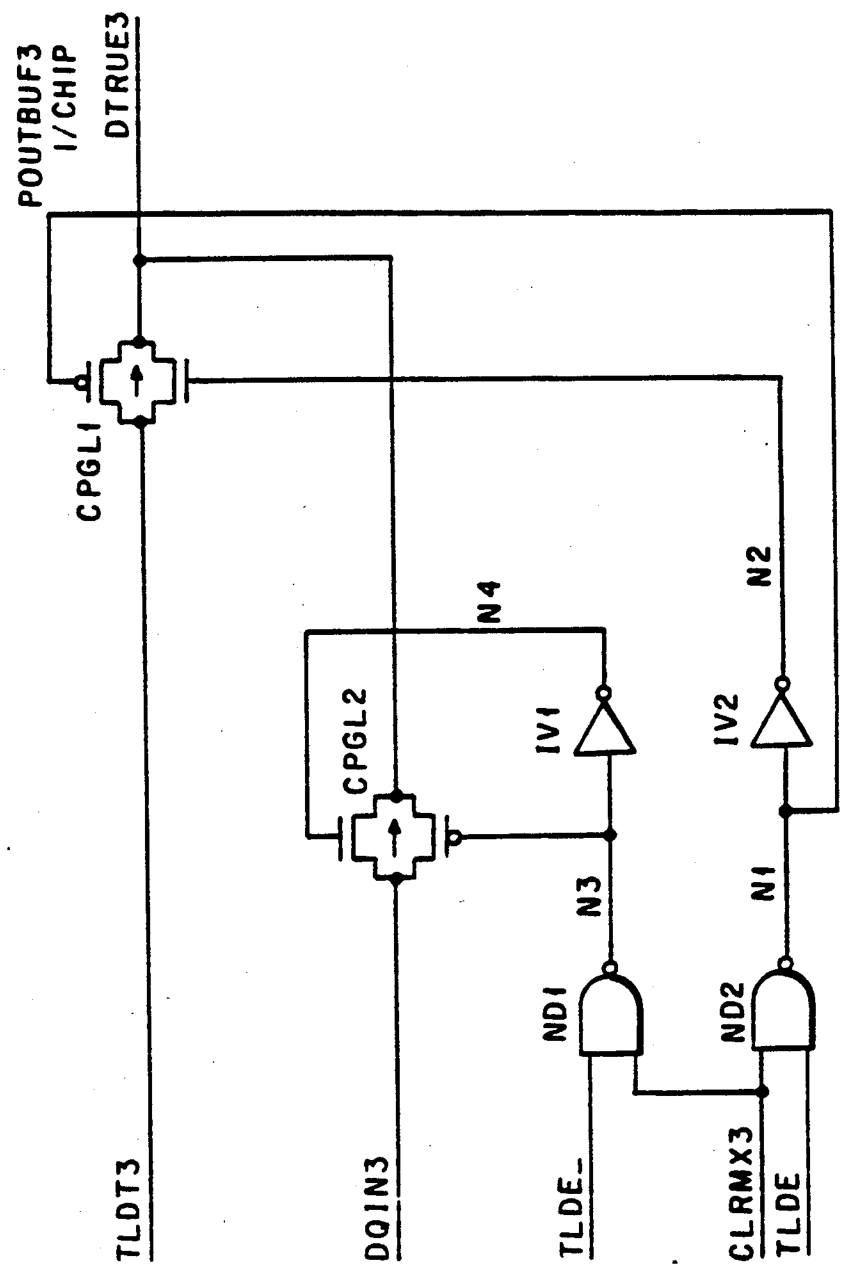
Fig. 59.1

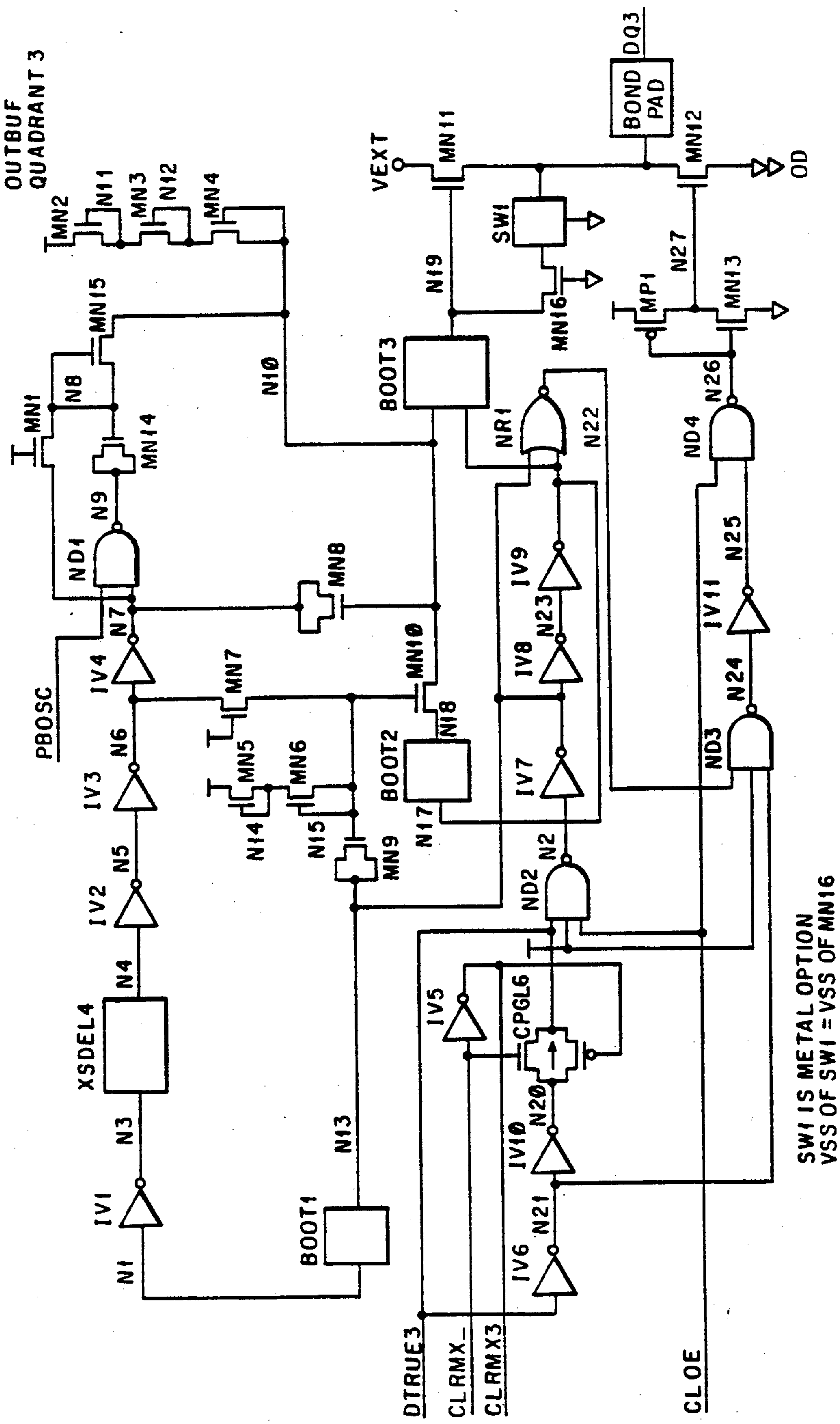
Fig. 60.2

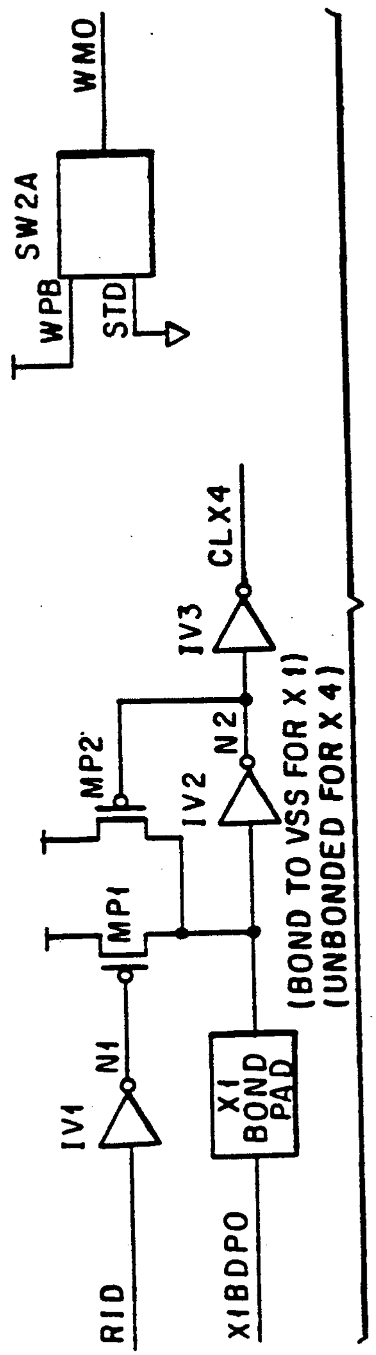
Fig. 60.3

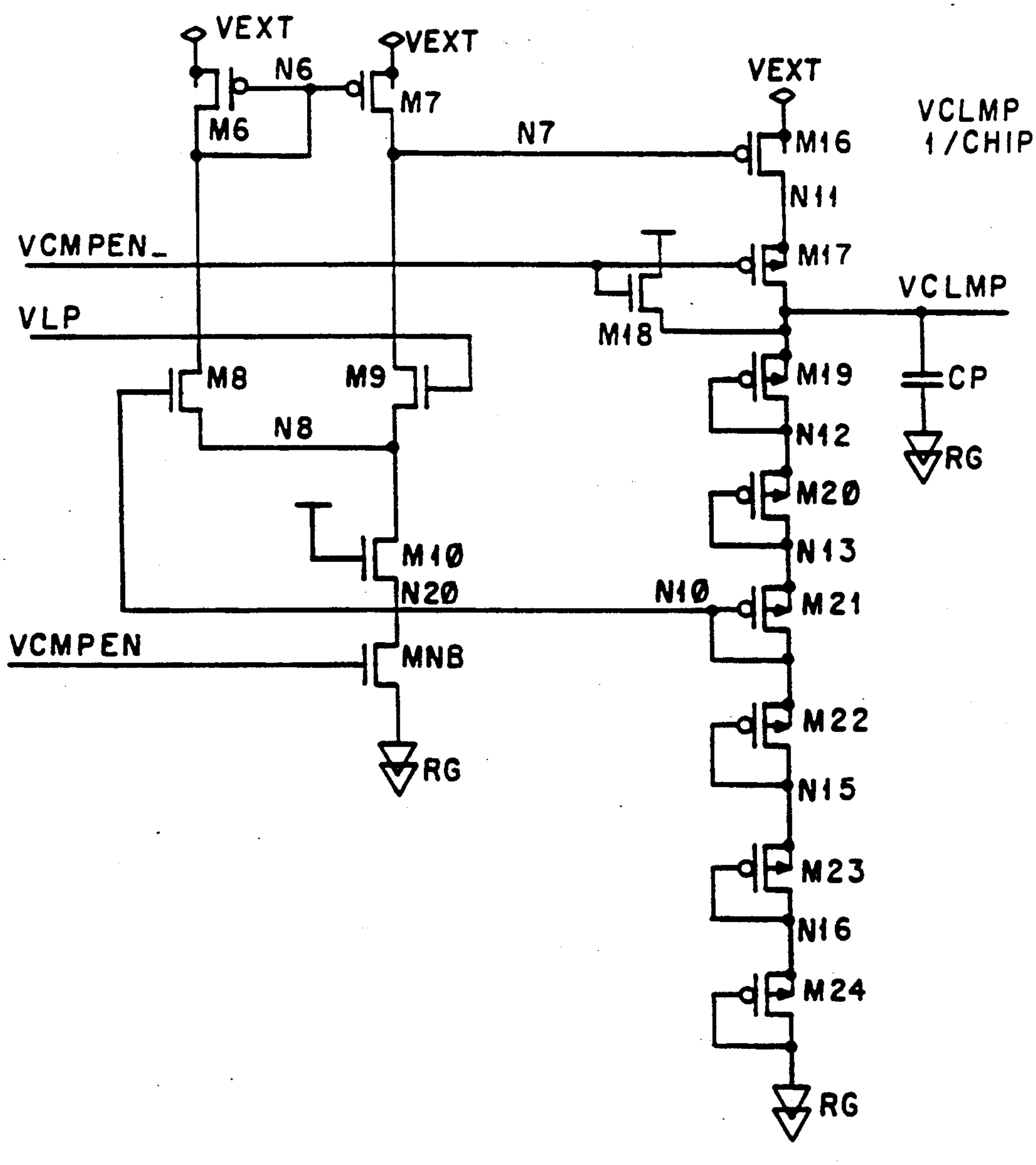
Fig. 80.1

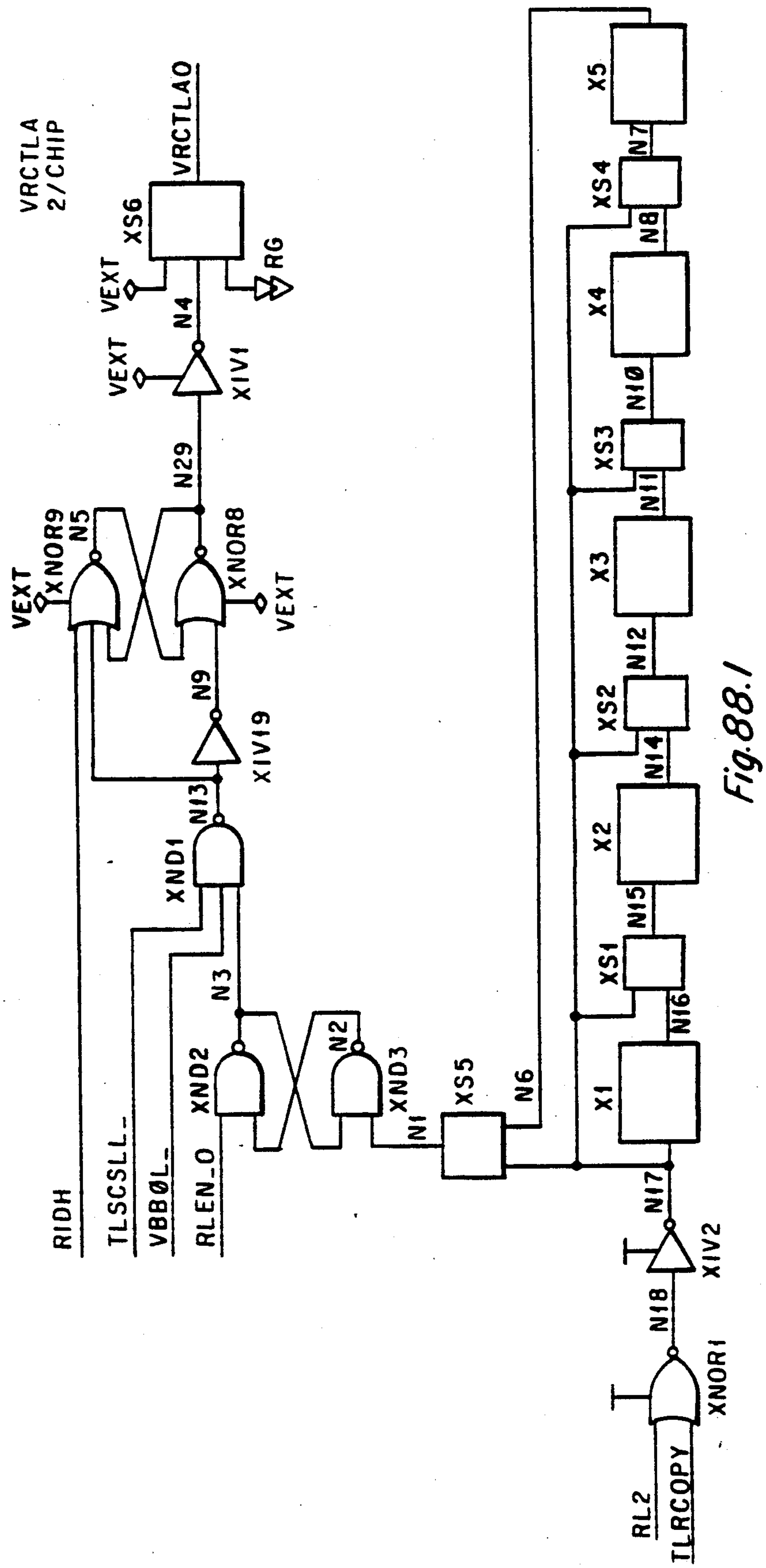
Fig.88.1

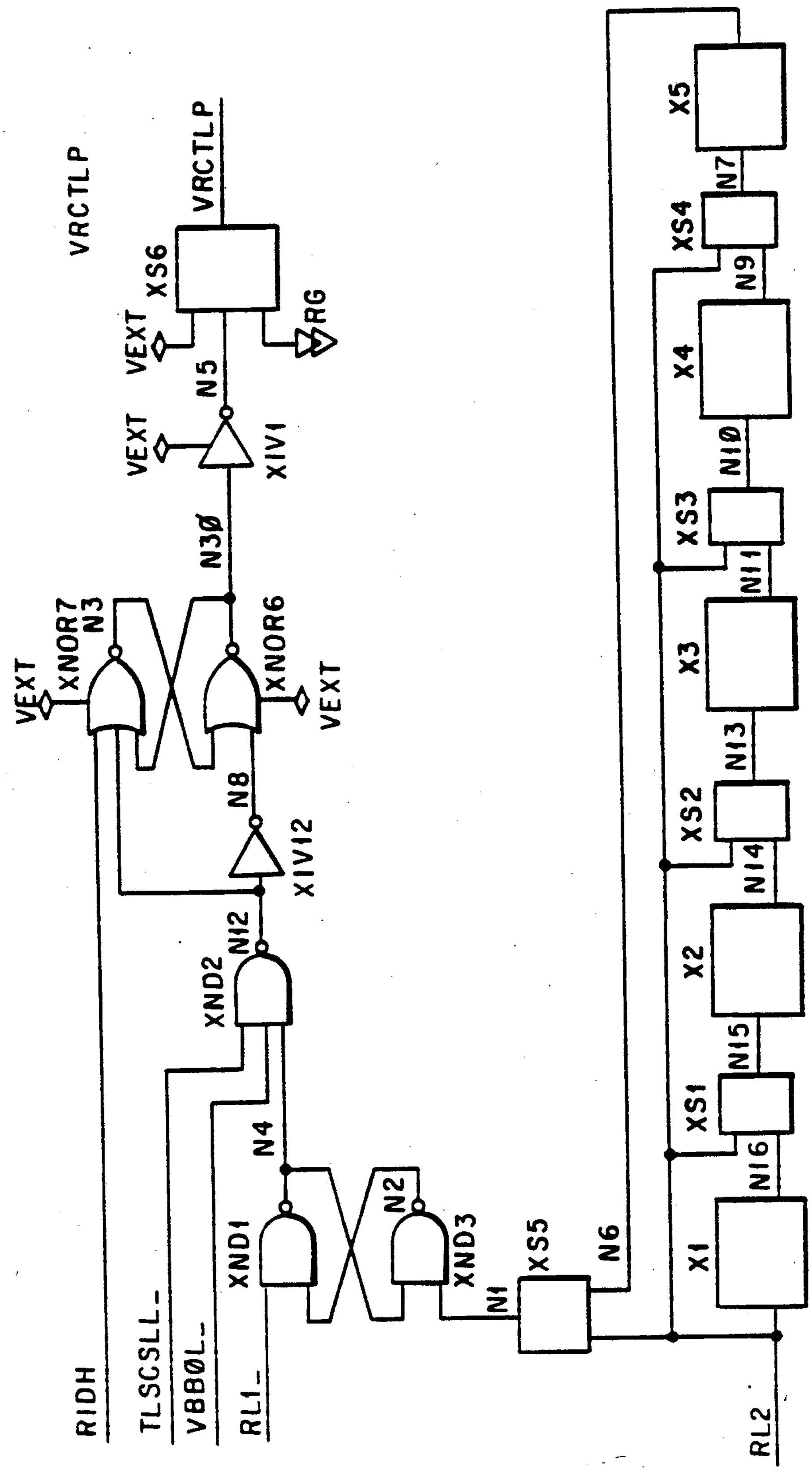
Fig. 88.2

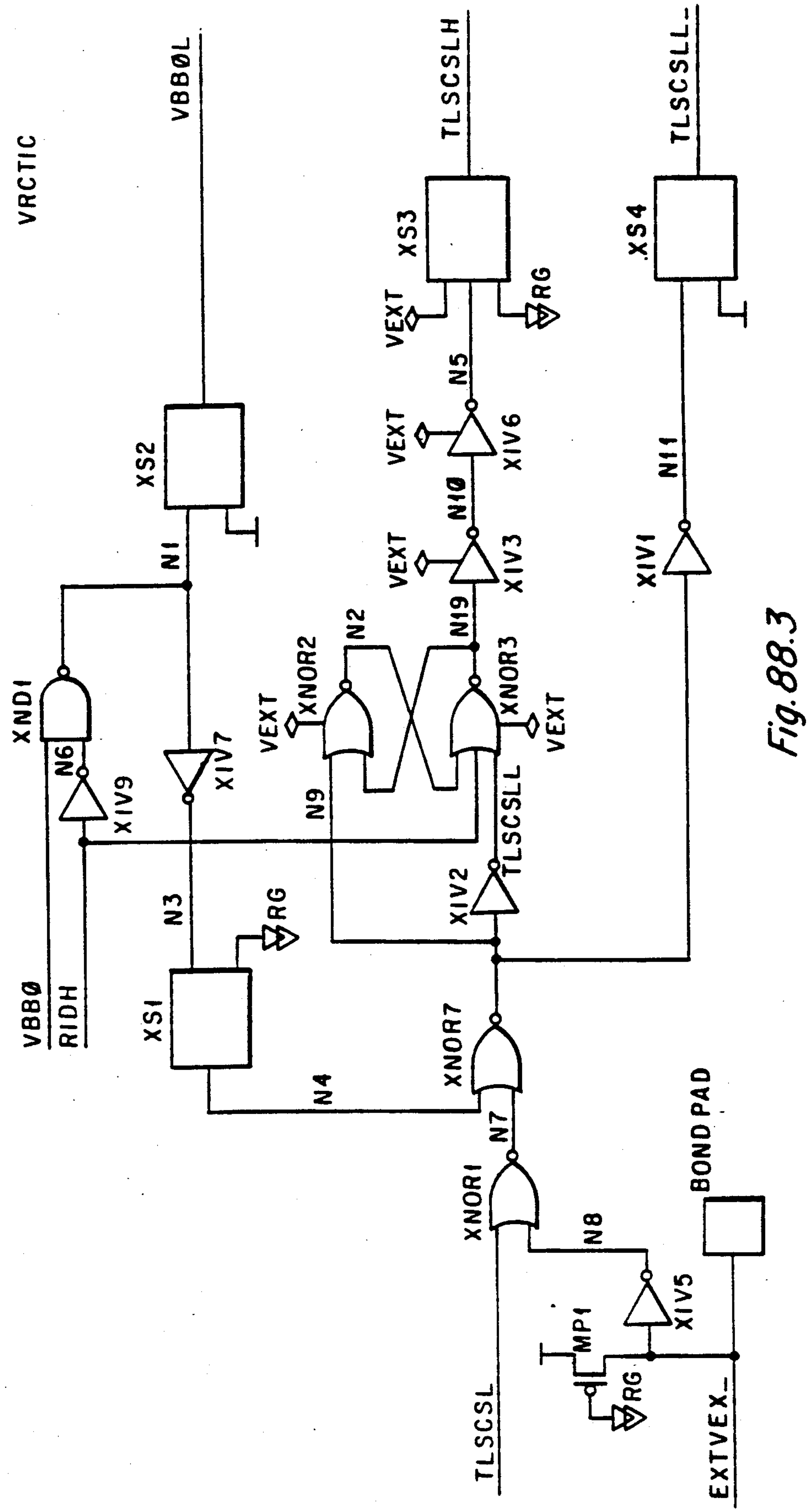
Fig. 88.3

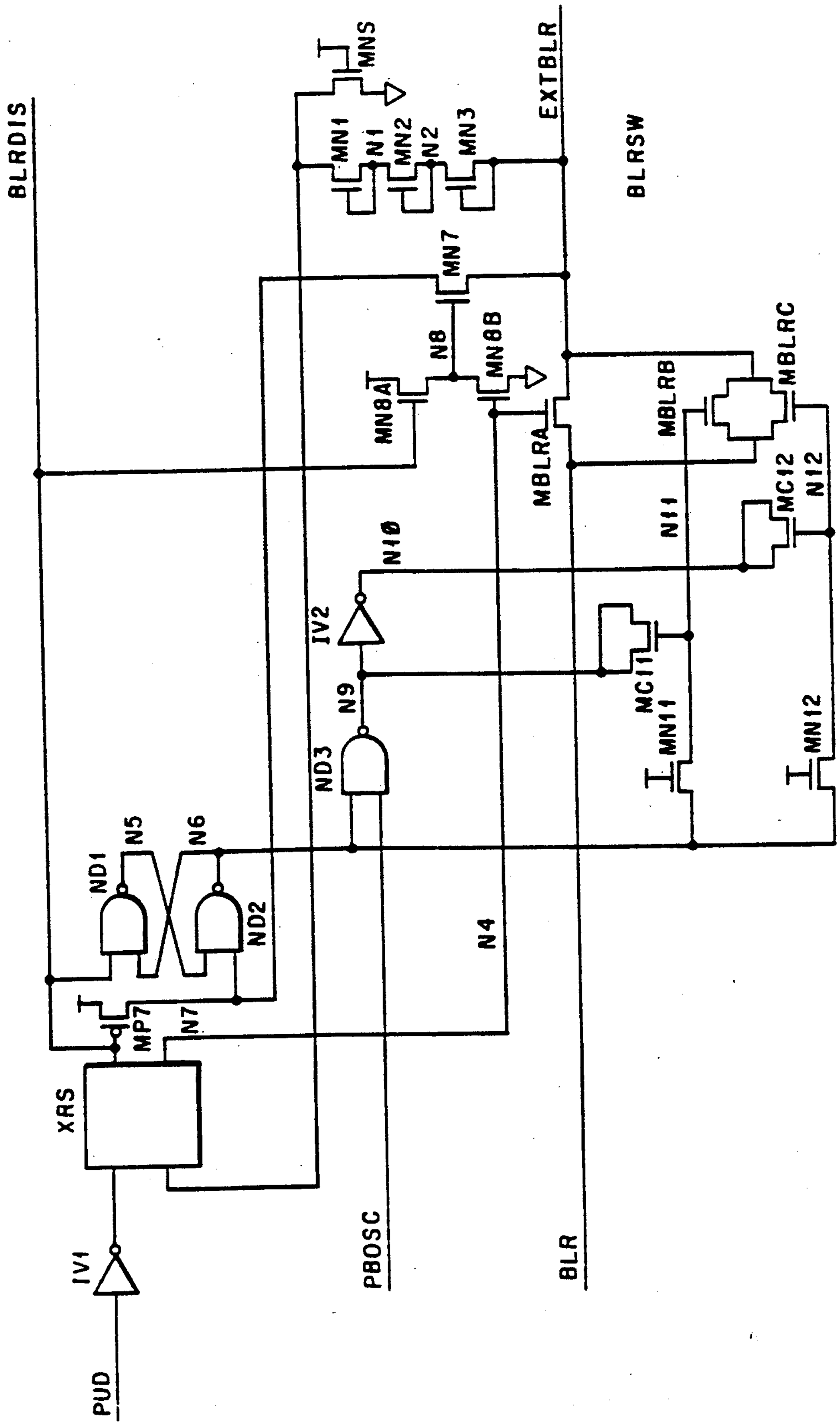
Fig. 90.1

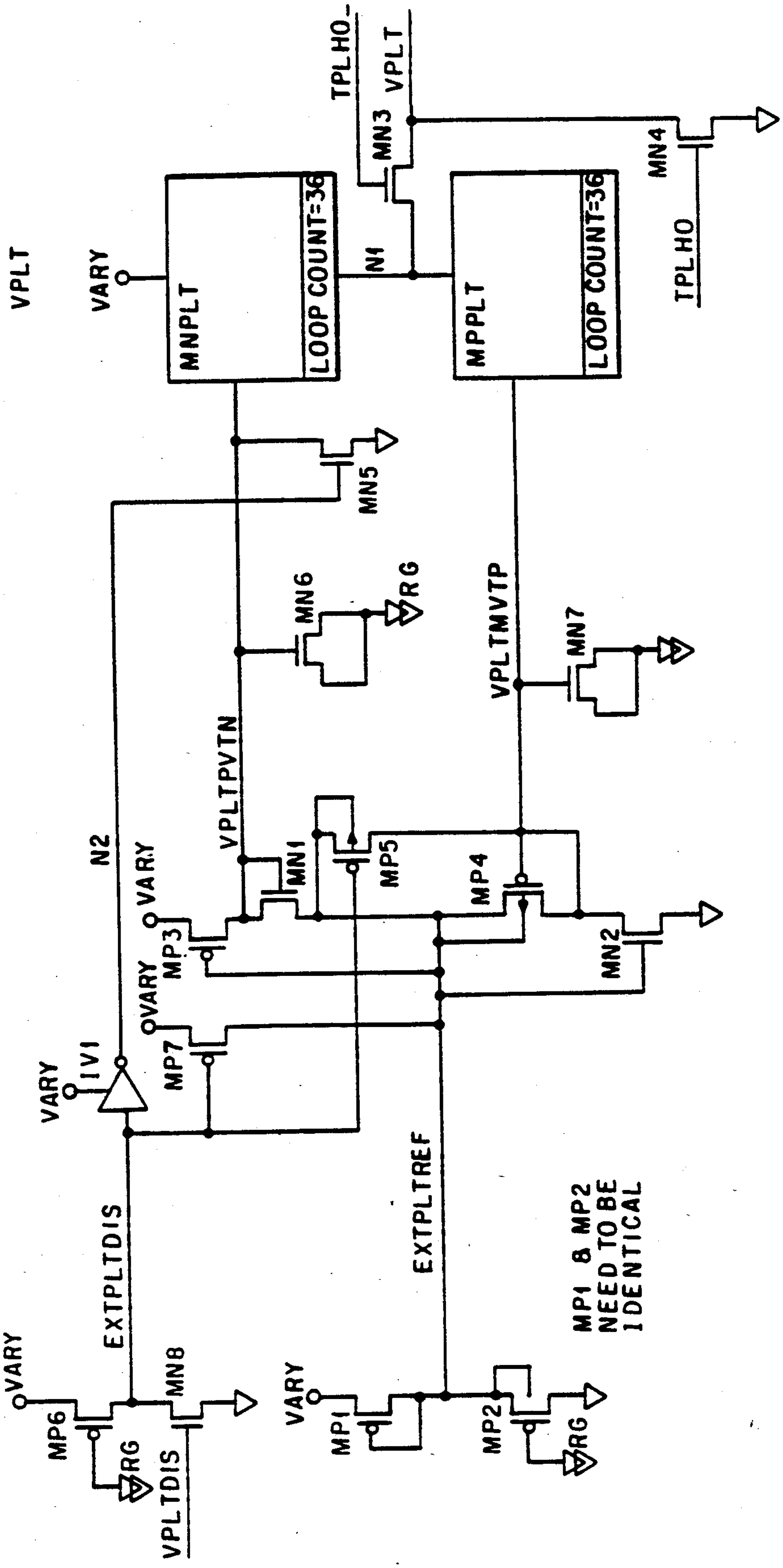
Fig. 90.2

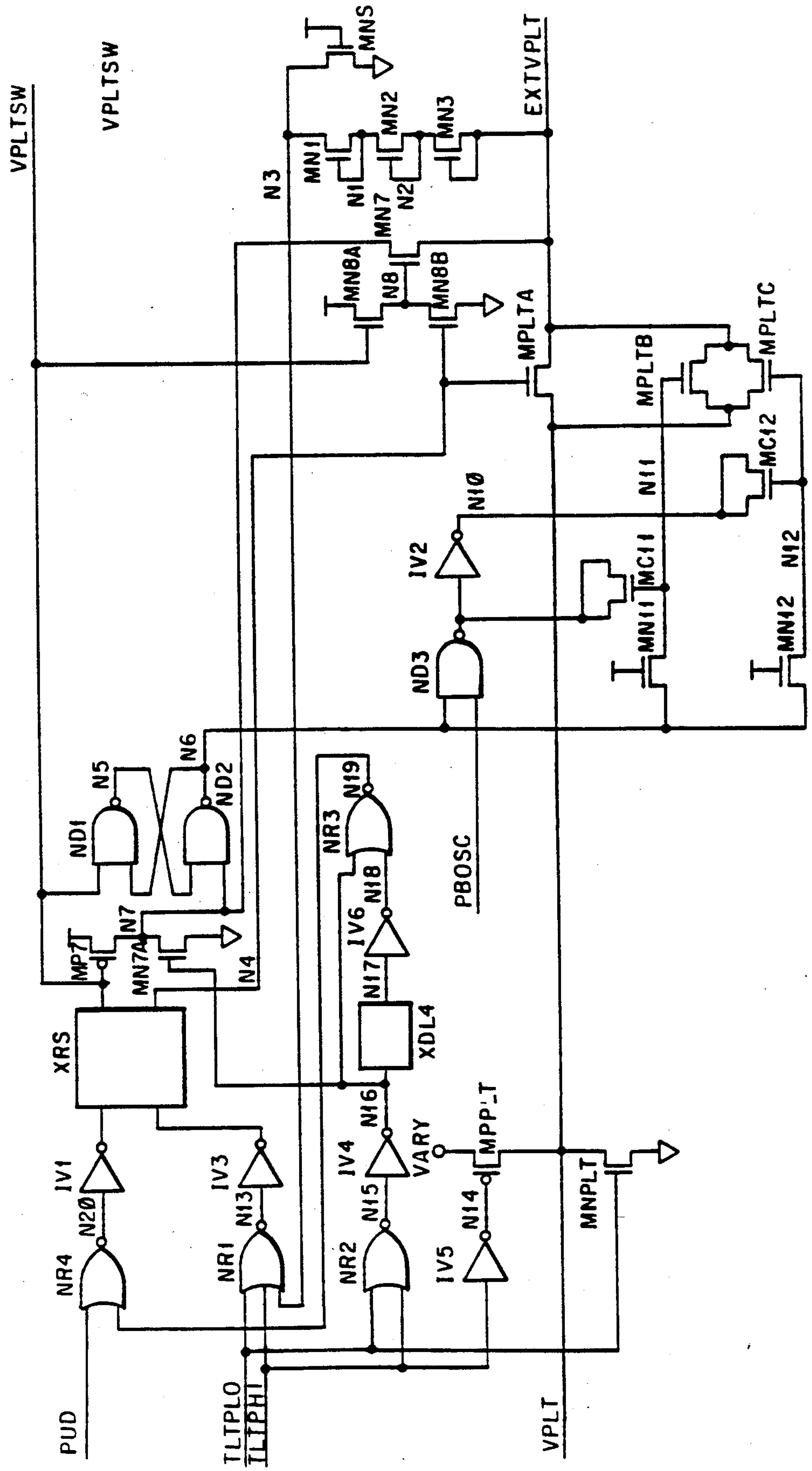
Fig. 90.3

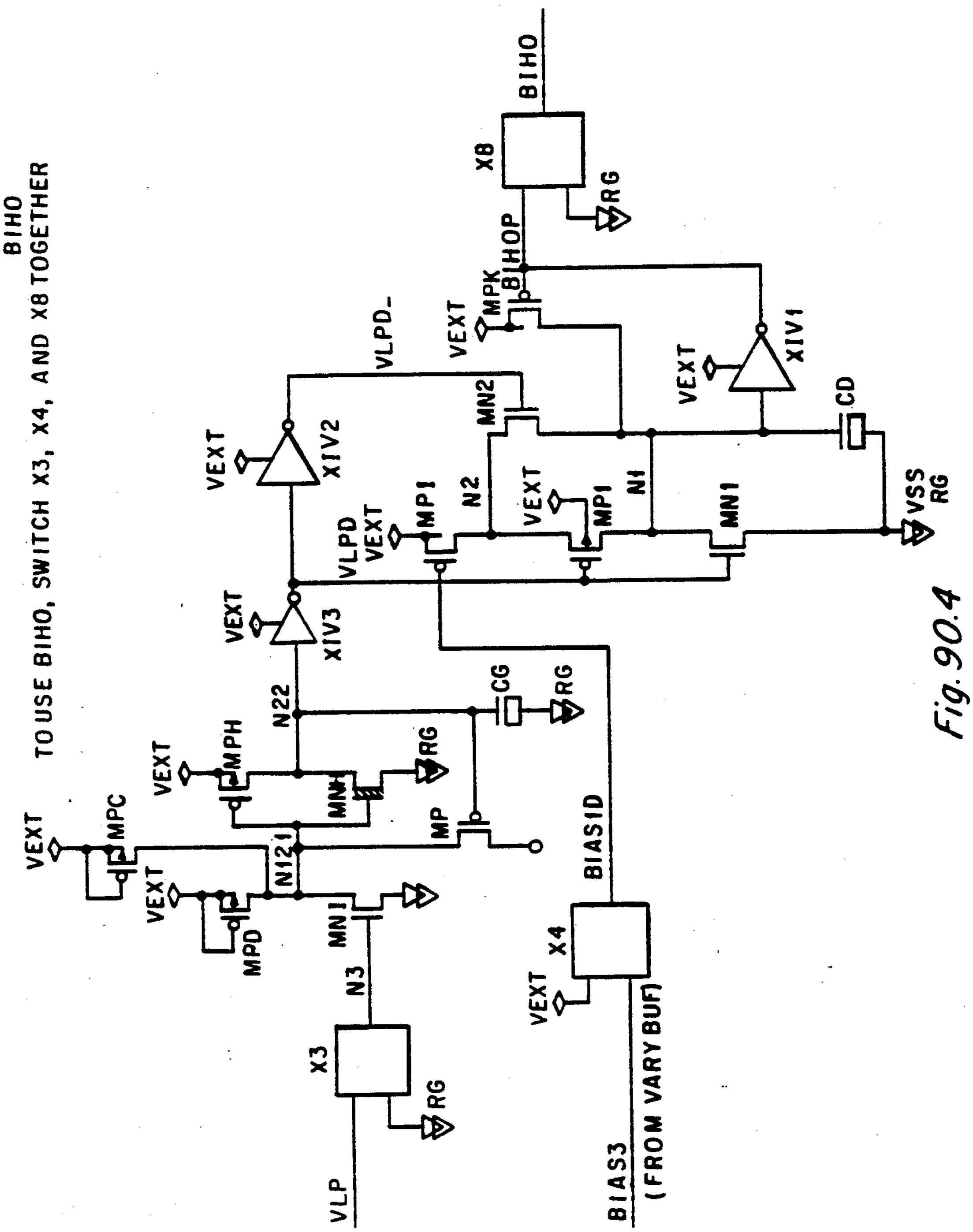
Fig. 90.4

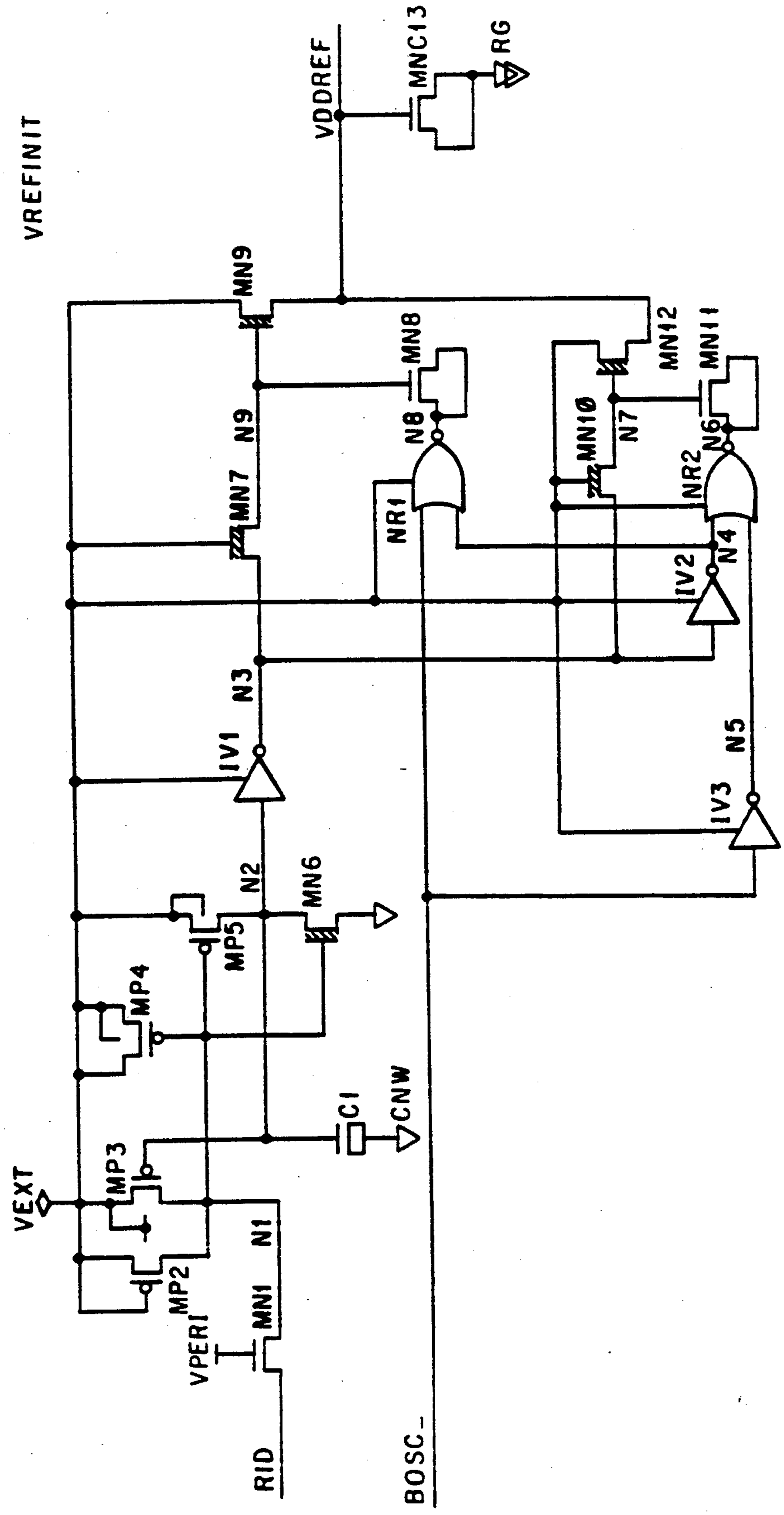
Fig. 90.5

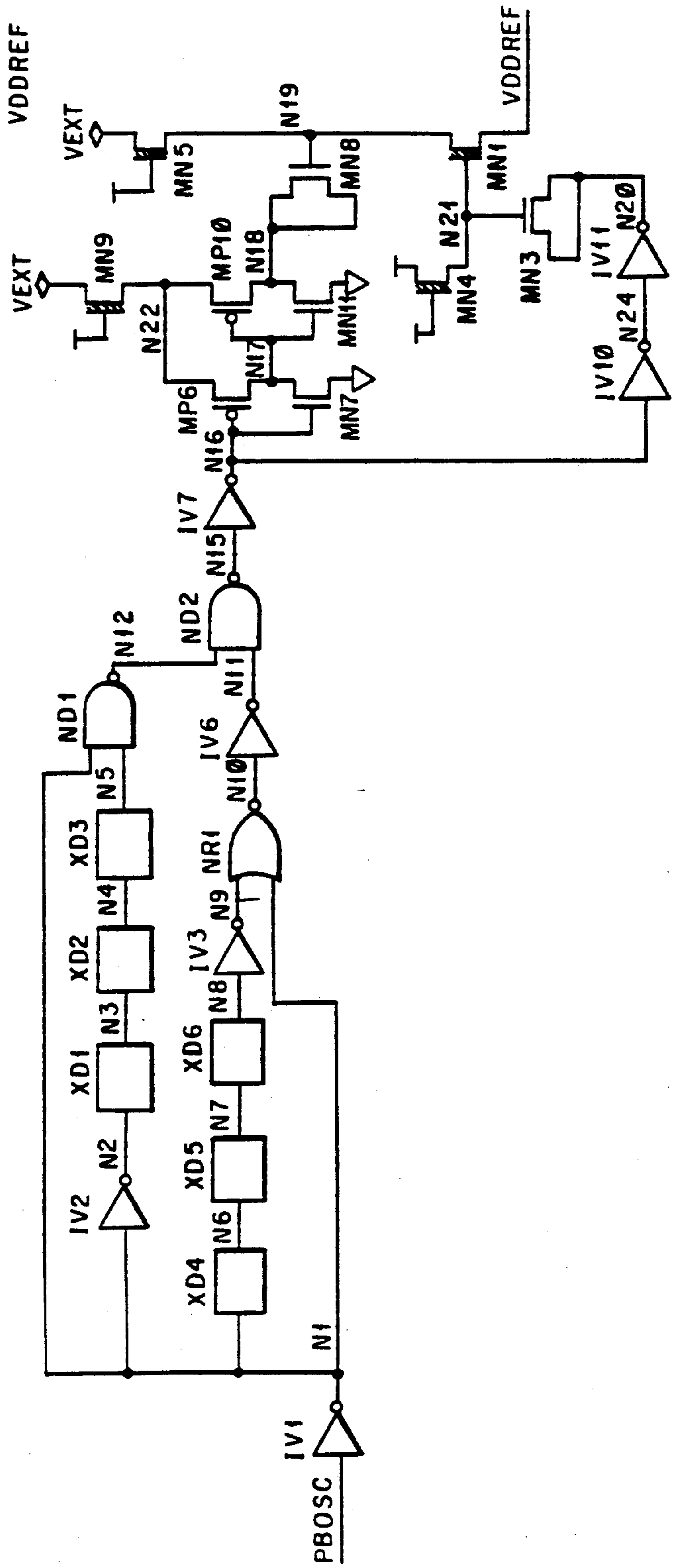
Fig. 90.6

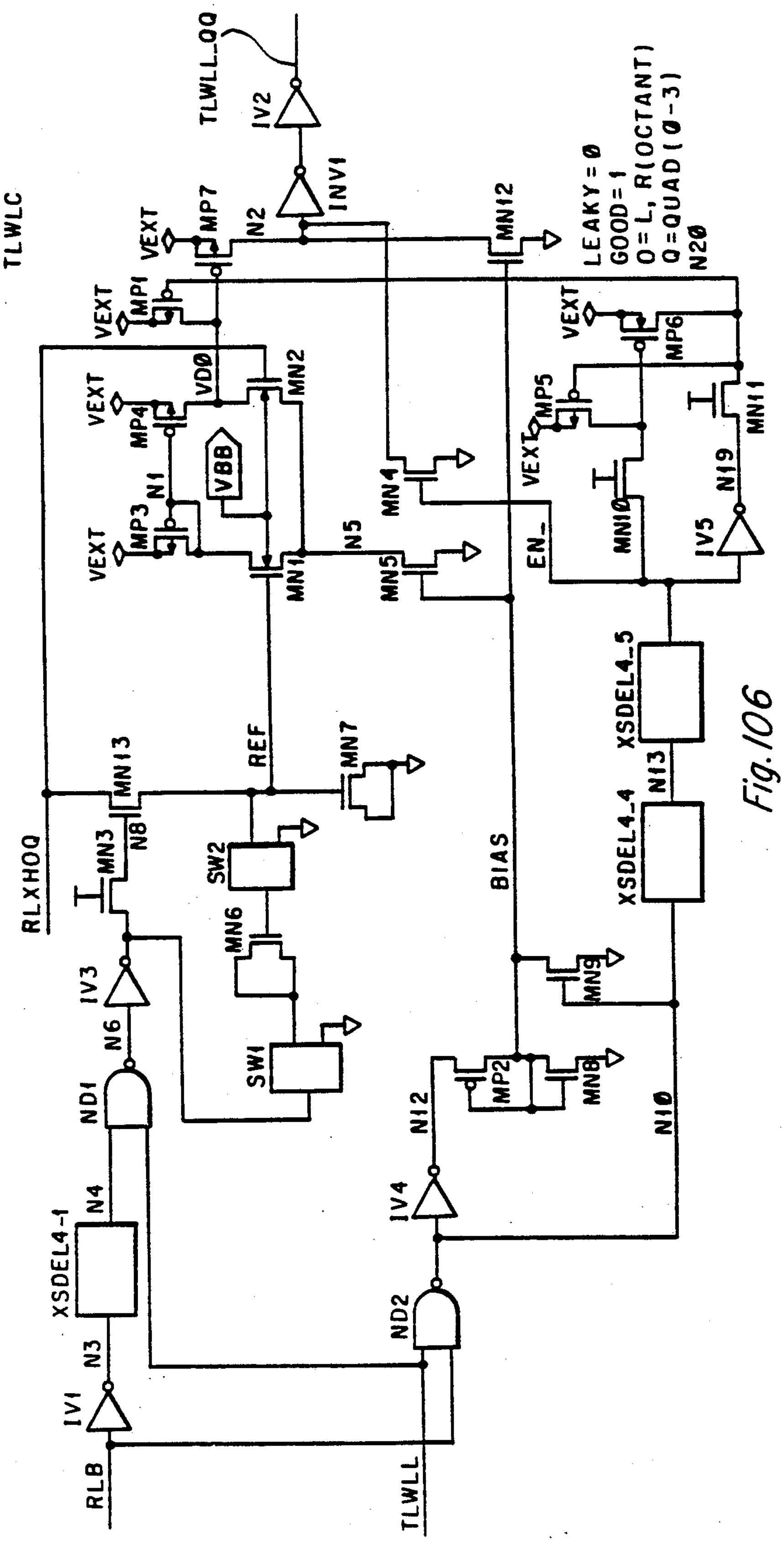
Fig. 106
Fig. 106.1

TLCCALL

NOTE 12: OUTPUT MAY GO FROM THREE-STATE TO AN INVALID DATA STATE PRIOR TO THE SPECIFIED ACCESS TIME.

NOTE 12: OUTPUT MAY GO FROM THREE-STATE TO INVALID DATA STATE PRIOR TO THE SPECIFIED ACCESS TIME.

NOTES: 12. OUTPUT MAY GO FROM THREE-STATE TO A INVALID DATA STATE PRIOR TO THE SPECIFIED ACCESS TIME.
13. ACCESS TIME IS $T_{CPA}$ OR $T_{AA}$ DEPENDENT.

NOTES: 14. REFERENCED TO CAS OR W, WHICHEVER OCCURS LAST.
15. A READ CYCLE OR A READ-WRITE CYCLE CAN BE INTERMIXED WITH WRITE CYCLE AS LONG AS READ AND READ-WRITE TIMING SPECIFICATIONS ARE NOT VIOLATED.

NOTES: 12. OUTPUT MAY GO FROM THREE-STATE TO AN INVALID STATE PRIOR TO THE SPECIFIED ACCESS TIME

16. A READ OR WRITE CYCLE CAN BE INTERMIXED WITH READ-WRITE CYCLES AS LONG AS THE READ AND WRITE TIMING SPECIFICATIONS ARE NOT VIOLATED.

CMOS SINGLE INPUT BUFFER FOR MULTIPLEXED INPUTS

CROSS-REFERENCE TO RELATED APPLICATIONS

This application cross references and incorporates by reference the following simultaneously filed, co-pending and co-assigned applications of Texas Instruments Incorporated:

| Serial No. | TI-Docket | Title |
|---|---|---|
| 07/560,983 | TI-15378 | A Counter Circuit |
| 07/560,961 | TI-15379 | A Configuration Selection Circuit for a Semiconductor Device |
| 07/560,962 | TI-15380 | A Pulse Generation Circuit |
| 07/560,982 | TI-15382 | A Test Validation Method for a Semi-Conductor Memory Device |
| 07/560,523 | TI-15383 | A Voltage Reference Initialization Circuit |
| 07/560,934 | TI-15384 | A Power up Detection Circuit |
| 07/561,536 | TI-15012 | A Power Up Reset Circuit |
| 07/560,662 | TI-15385 | A Substrate Bias Generator System |
| 07/560,542 | TI-15386 | A Voltage Level Detection Circuit |
| 07/560,720 | TI-14642 | A Circuit and Method for Two Stage Redundancy Decoding |
| 07/560,935 | TI-15389 | A Method for Initializing Redundant Circuitry |
| 07/560,646 | TI-14756 | A Voltage Driver Circuit |

FIELD OF THE INVENTION

This invention is in the field of integrated circuits, and is more specifically related to circuitry for receiving signals into a semiconductor device from external sources known as input buffer circuits.

BACKGROUND OF THE INVENTION

The development of VLSI semi-conductor devices of the Dynamic Random Access Memory (DRAM) type is well known. Over the years, the industry has steadily progressed from DRAMS of the 16K type (as shown in the U.S. Pat. No. 4,081,701 issued to White, McAdams and Redwine), to DRAMS of the 64K type (as shown in U.S. Pat. No. 4,055,444 issued to Rao) to DRAMS of the IMB type (as shown in U.S. Pat. No. 4,658,377 issued McElroy), and progressed to DRAMS of the 4 MB type. The 16 MB DRAM, wherein more than 16 million memory cells are contained on a single semiconductor chip is the next generation of DRAMs scheduled for production.

In designing VLSI semiconductor memory devices of the 16 MB DRAM type, designers are faced with numerous challenges. One area of concern is power consumption. The device must be able to power the increased memory cells and the supporting circuits. However, for commercial viability, the device must not use excessive power. The power supplies used and the burn in voltage for the part must also be compatible with the thin gate oxides in the device.

Another area of concern is the elimination of defects. The development of larger DRAMS has been fostered by the reduction in memory cell geometries, as illustrated in U.S. Pat. No. 4,240,092 to KUO (a planar capacitor cell) and as illustrated in U.S. Pat. No. 4,721,987 to Baglee et. al. (a trench capacitor cell). The extremely small geometries of the 16 MB DRAM will be manufactured using sub-micron technology. The reduction in feature size has meant that particles that previously did not cause problems in the fabrication process, now can cause circuit defects and device failures.

In order to ameliorate defects, redundancy schemes have been introduced. The redundancy schemes normally consist of a few extra rows and columns of memory cells that are placed within the memory array to replace defective rows and columns of memory cells. Designers need new and improved redundancy schemes in order to effectively and efficiently repair defects and thereby increase yields of 16 MB DRAM chips.

Another area of concern is testing. The device must have circuits to allow for the industry standards 16X parallel tests. In addition, other circuits and test schemes are needed for internal production use to verify operability and reliability.

The options that the device should have is another cause for concern. For instance, some customers require a X1 device, while others require a X4 device. Some require an enhanced page mode of operation. Additionally, it is yet undecided whether the DRAM industry will maintain 4096-cycle refresh, or move towards a lower number of refresh cycles.

Another cause for concern is the physical layout of the chip. The memory cells and supporting circuits must fit on a semiconductor chip of reasonable size. The size of the packaged device must be acceptable to buyers.

New design strategies and circuits are required to meet the above concerns, and other concerns, relating to the development of the next generation, and to future generations, of Dynamic Random Access Memory devices.

It is an object of this invention therefore, to provide an improved input buffer for use on a semiconductor device.

Other objects and advantages of this invention will become apparent to those of ordinary skill in the art, having reference to the following specification, together with the drawings.

SUMMARY OF THE INVENTION

An input buffer circuit is disclosed. The circuit has a single stage circuit portion for receiving a multiplexed row address bit and a multiplexed column address bit. Circuitry is connected to the single stage circuit portion for separately holding the received multiplexed row address bit and the received multiplexed column address bit. The single stage circuit portion may include a tri-state inverter having an tri-state control input coupled to a input buffer control signal and a latch to hold the output of the tri-state inverter when it is tri-stated by the input buffer control signal. The first circuit portion may be of the CMOS type. Such a circuit is useful in the memory support circuitry of an integrated circuit of the dynamic random access memory type.

BRIEF DESCRIPTION OF THE DRAWINGS

FIG. 0.1 is a block system level drawing illustrating a 16 MB Dynamic Random Access Memory chip incorporating the preferred embodiment of the invention.

FIG. 0.11 is a graph orientation drawing illustrating how to connect FIGS. 0.11A1–0.11A5, FIGS. 0.11B1–, 0.11B5, FIGS. 0.11C1–0.11C5, FIGS. 0.11D1–0.11D5, FIGS. 0.11E1–0.11E5, FIGS. 0.11F1–0.11F5, and FIGS. 0.11G1–0.11G5. The figures are oriented by lyinq the figures such that the A1–G5 reference characters of each figure is on the bottom left hand corner of the figure.

FIGS. 0.11A1–0.11A5, FIGS. 0.11B1–0.11B5, FIGS. 0.11C1–0.11C5, FIGS. 0.11D1–0.11D5, FIGS. 0.11E1–0.11E5, FIGS. 0.11F1–0.11F5, and FIGS. 0.11G1–0.11G5, when connected together, form a block diagram drawing more particularly illustrating the DRAM of FIG. 0.1.

FIG. 0.2 is a top view drawing illustrating the pin designations of the packaged memory chip.

FIG. 0.3 is a three dimensional view of the packaged memory chip wherein the encapsulating material is rendered transparent.

FIG. 0.4 is an assembly view of FIG. 0.3.

FIG. 0.5 is a cross sectional view of FIG. 0.3.

FIG. 0.6 is a top view drawing illustrating the bond pad designations of the memory chip.

FIG. 0.7 is a top view drawing illustrating a portion of the memory array.

FIG. 0.8 is a cross sectional view of a portion of the memory array.

FIG. 0.9 is a side view of the cross sectional view of FIG. 0.8.

Note.

FIG. 1 illustrates the RCL, or Row Clock Logic Circuit.

Note: there is no FIG. 5.

Figure 6:
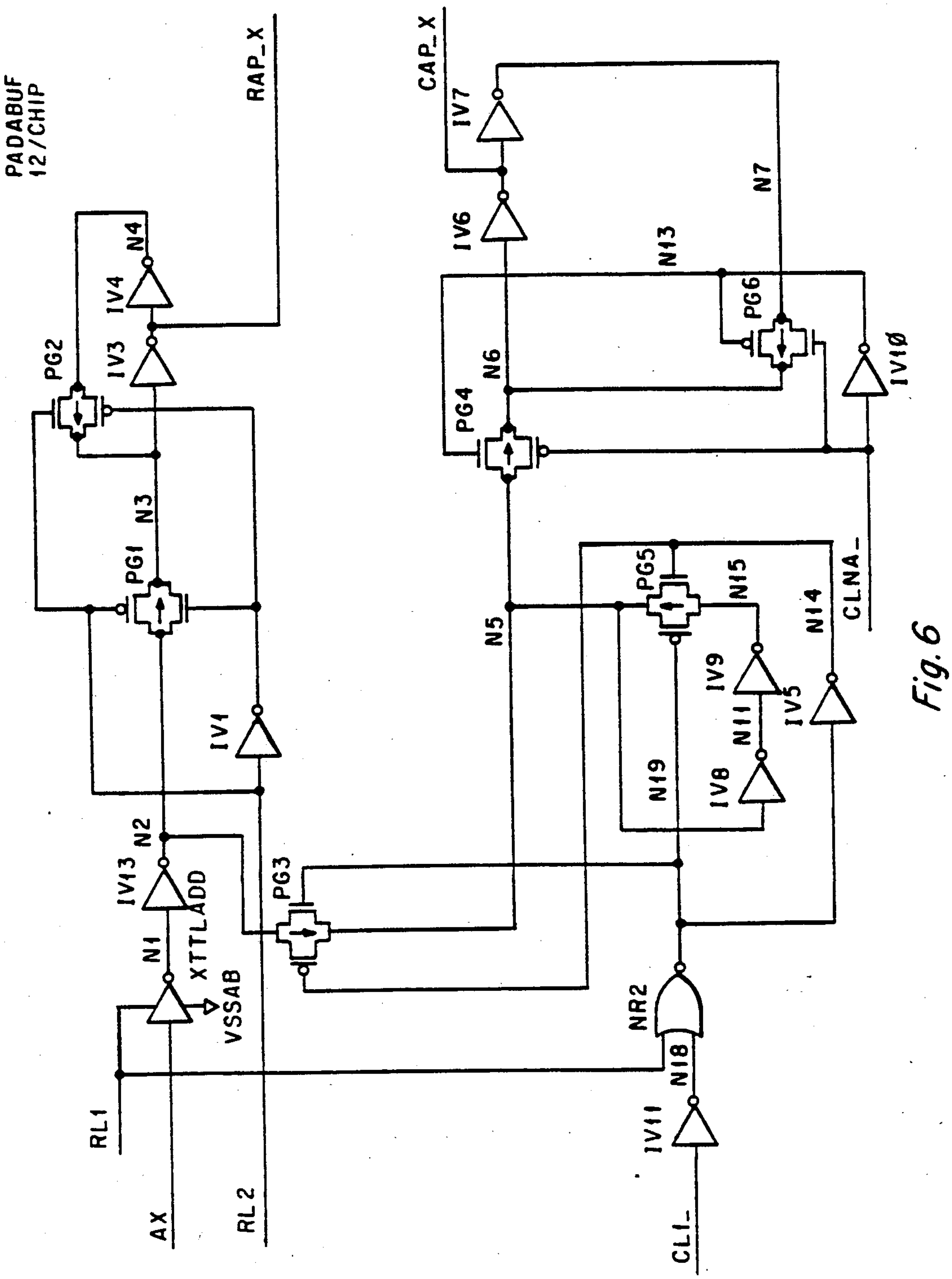

FIG. 6. illustrates the PADABUF Circuit, or the Pad Address Buffer Circuit.

Figure 7:
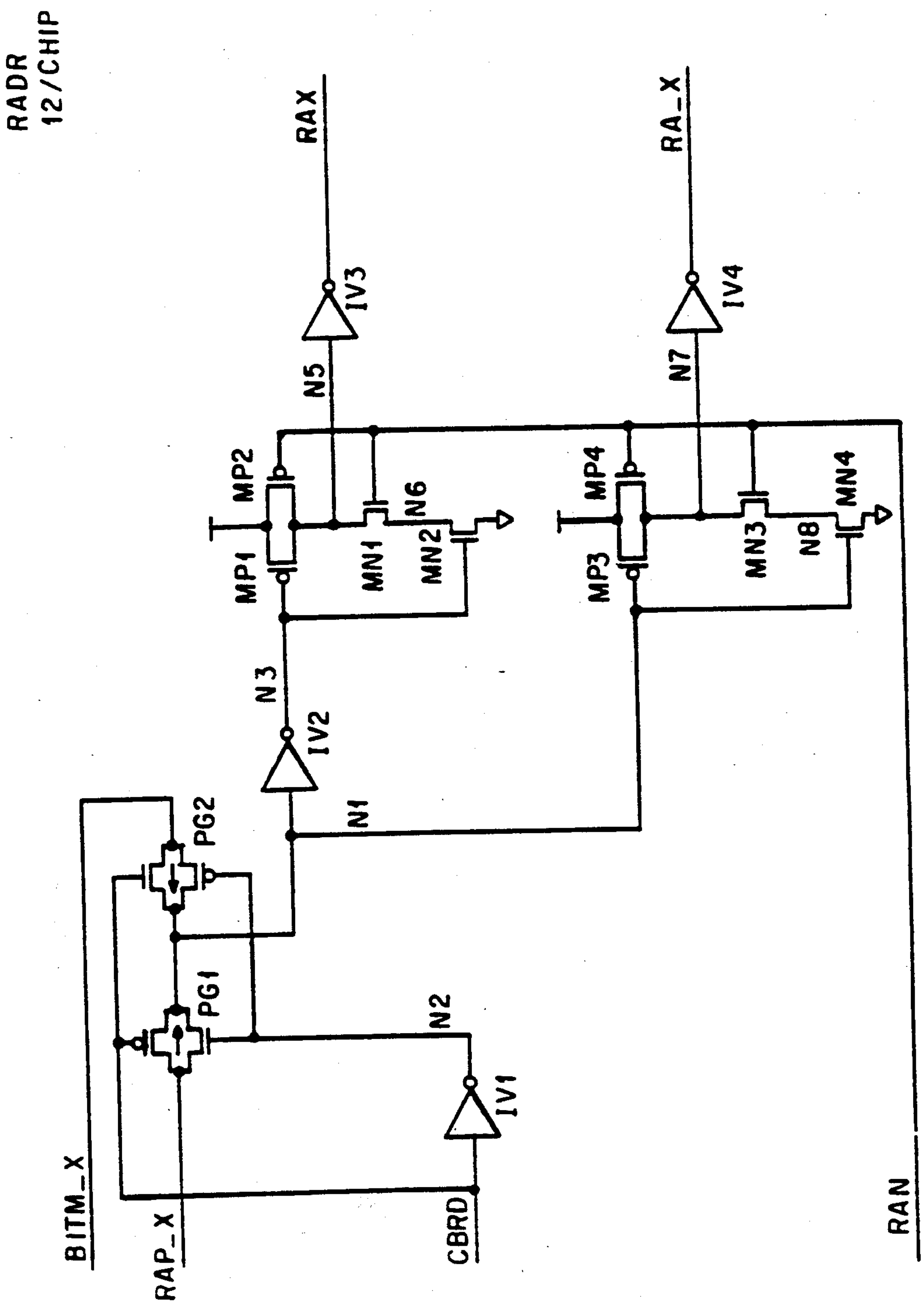

FIG. 7 illustrates the RADR, or Row Address Driver Circuit.

Figure 8:
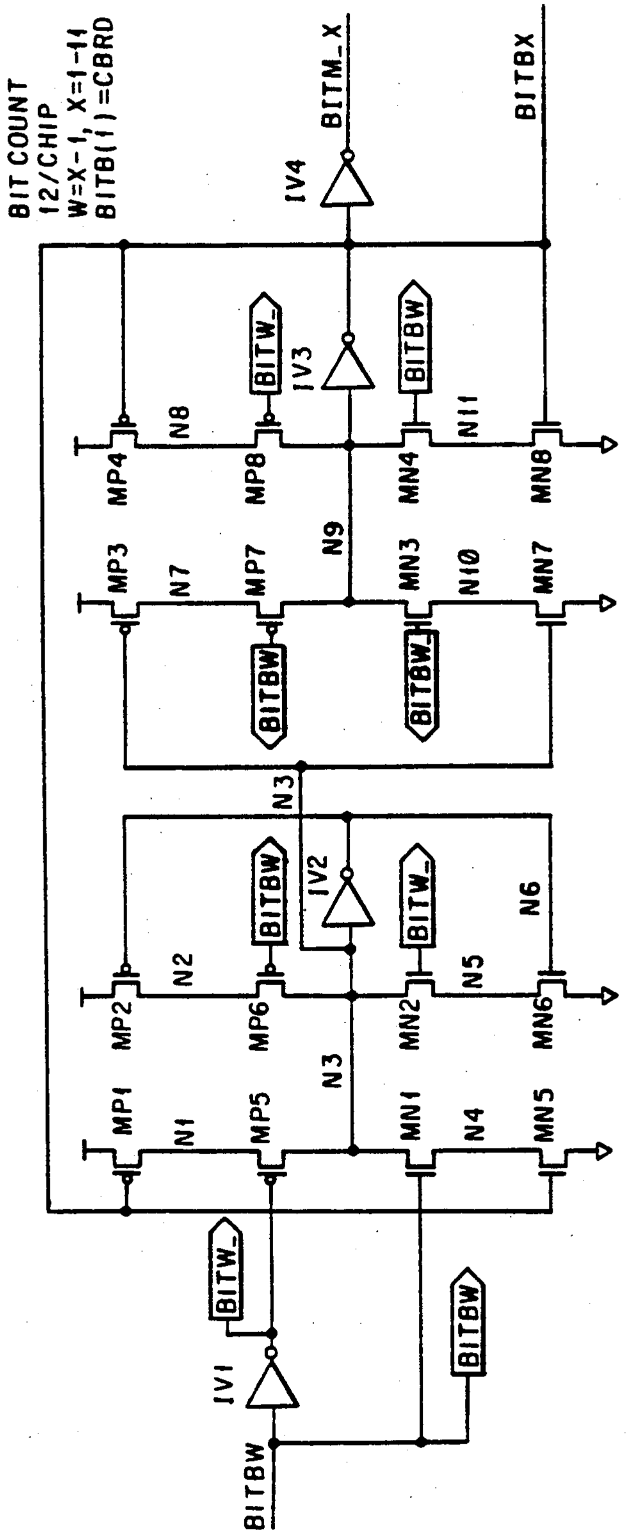

FIG. 8 illustrates the BITCOUNT, or Bit Count Circuit.

Figure 9:
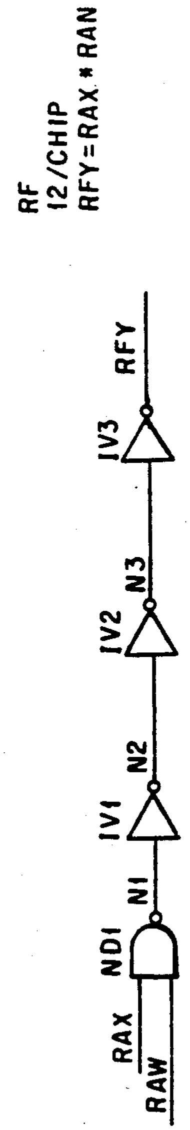

FIG. 9 illustrates the RF, or Row Factor Circuit.

Figure 10:
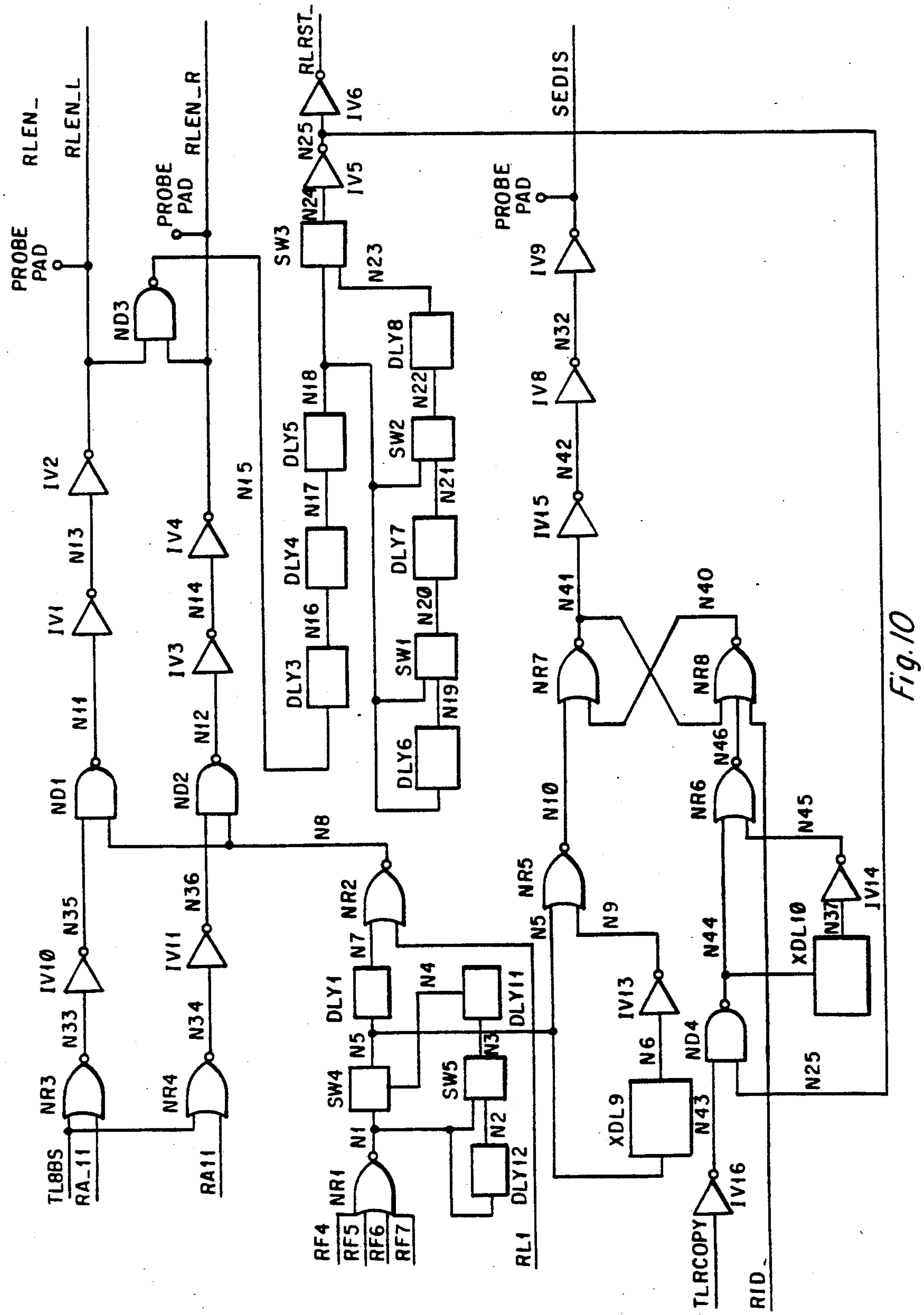

FIG. 10 illustrates the RLEN_, or Row Logic Enable Circuit.

Figure 11:
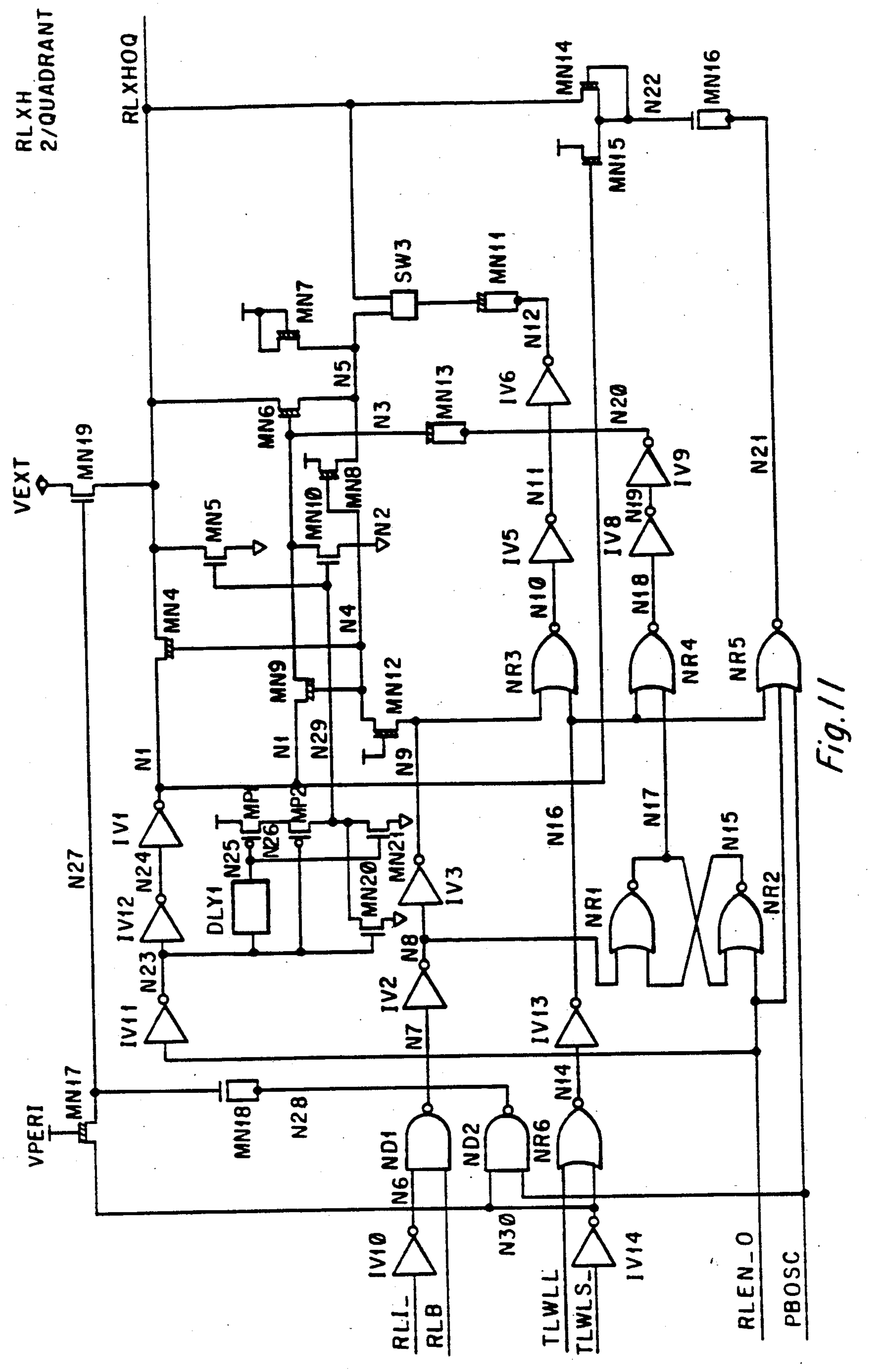

FIG. 11 illustrates the RLXH, or Row Logic X (Word) High Circuit.

FIG. 12 illustrates the RDDR, or Row Decoder Driver Circuit.

FIG. 12.2 illustrates the BNKPC_, or Bank Select Pre-charge Circuit.

Figure 13:
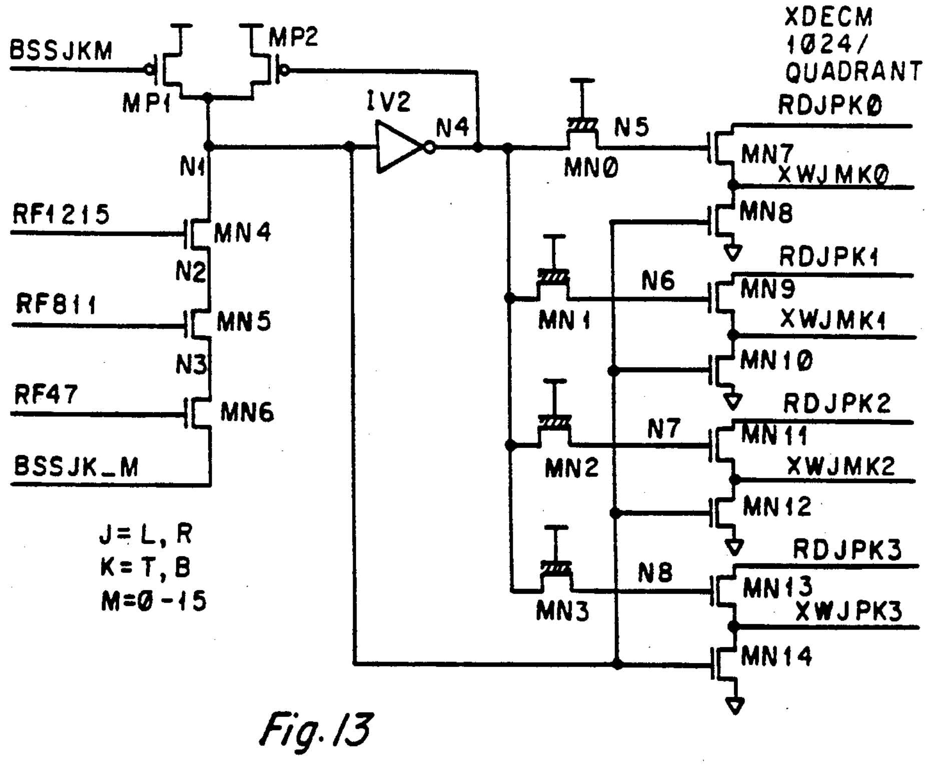

FIG. 13 illustrates the XDECM, or Row Decoder Circuit.

Figure 14:
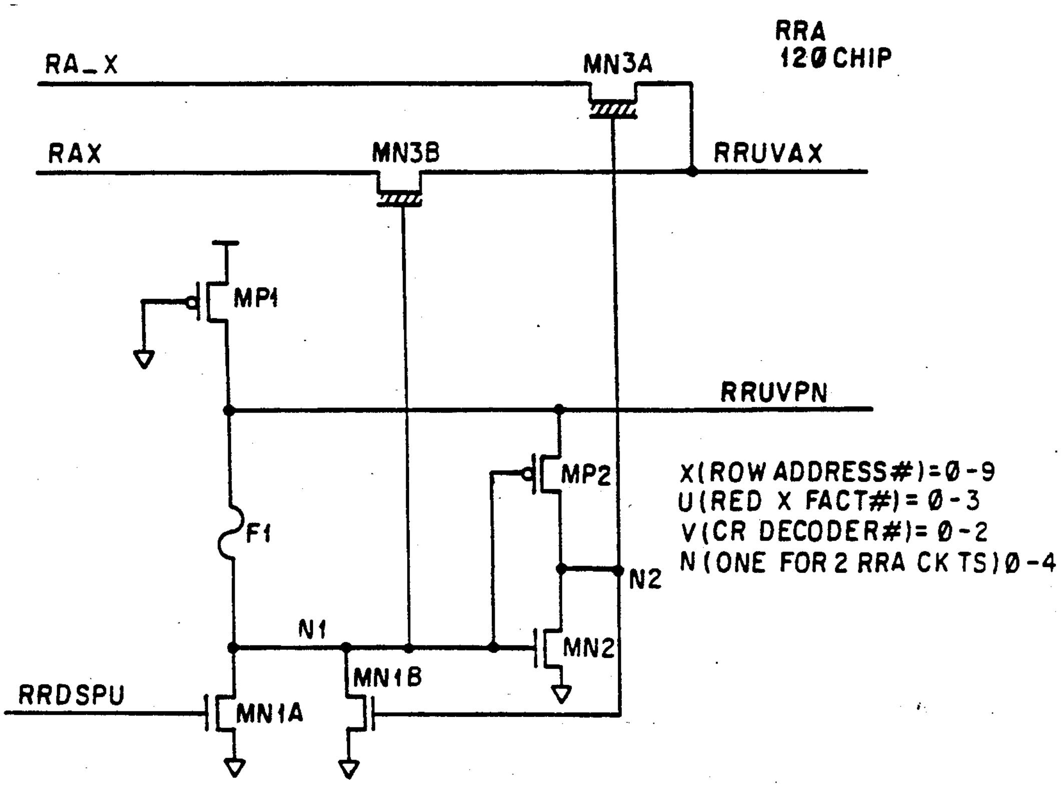

FIG. 14 illustrates the RRA, or Row Redundancy Address Circuit.

Figure 15:
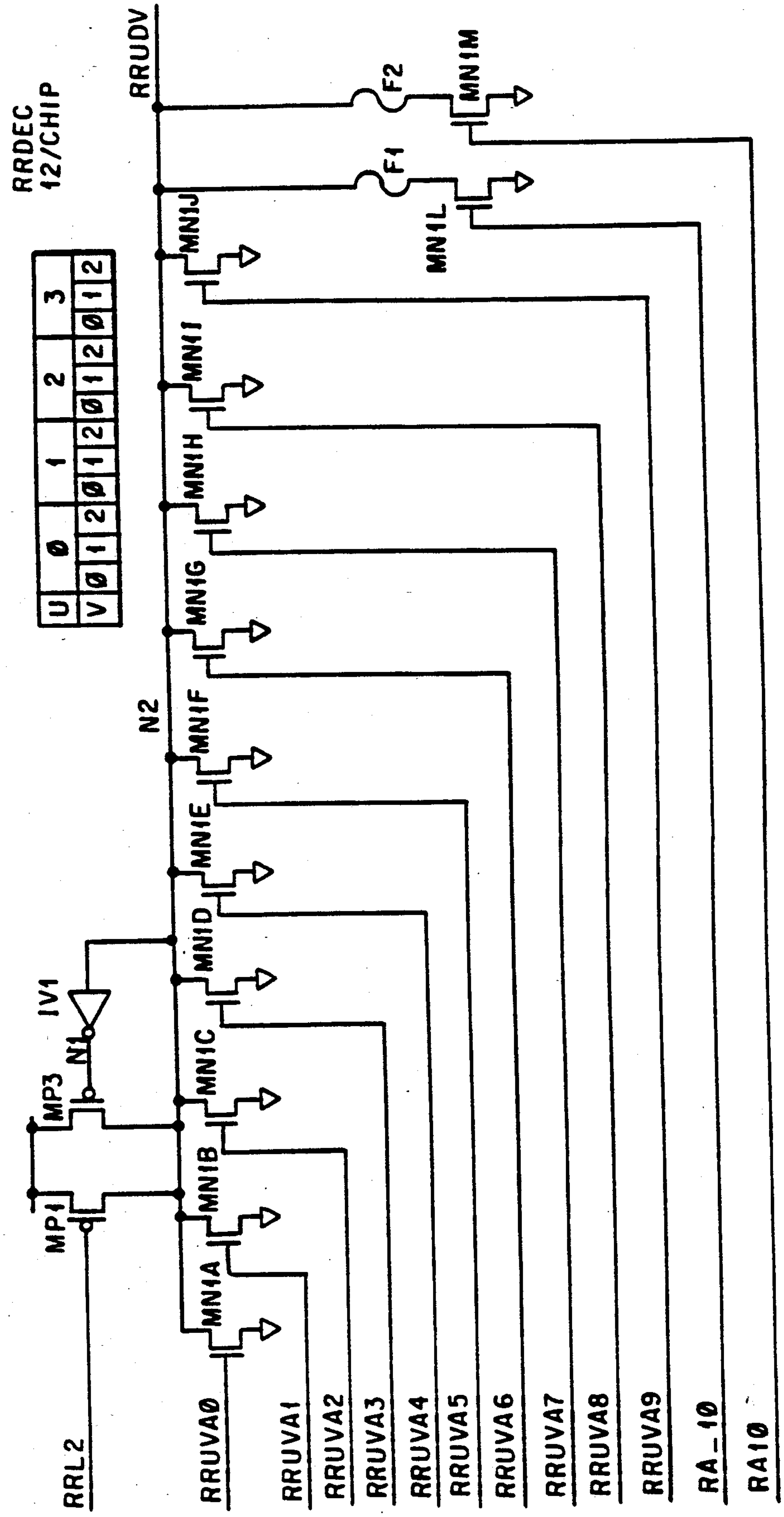

FIG. 15 illustrates the RRDEC, or Row Redundancy Decoder Circuit.

Figure 16:
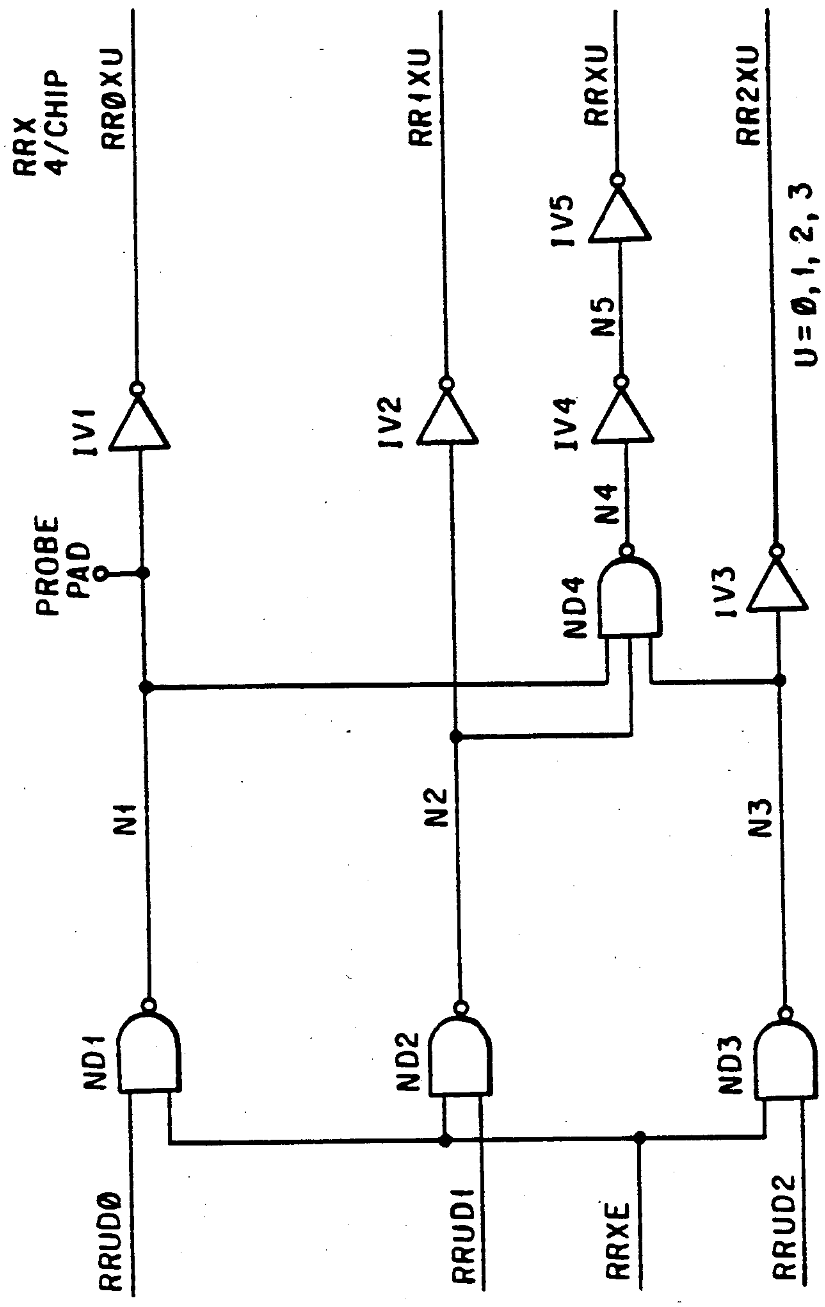

FIG. 16 illustrates the RRX, or Row Redundancy X Factor Circuit.

Figure 17:
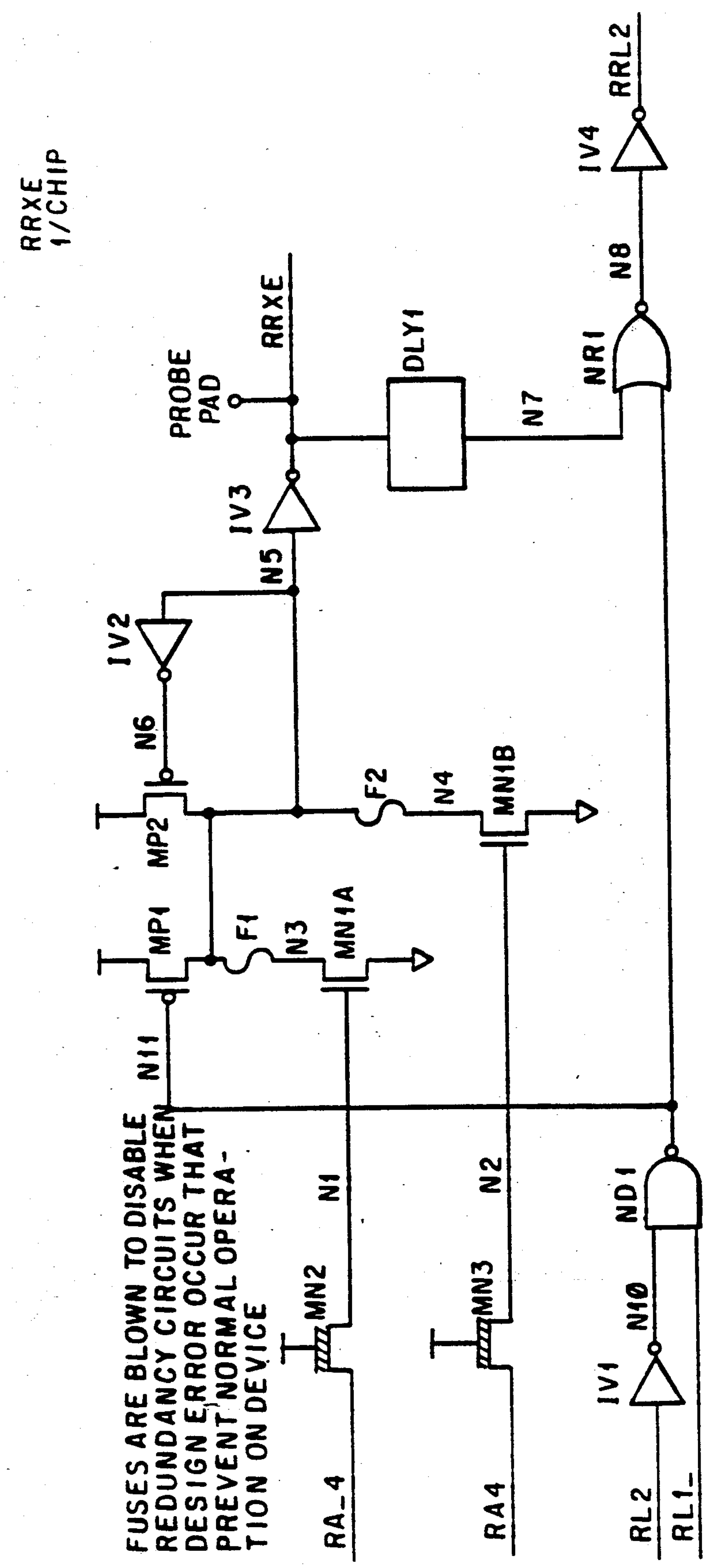

FIG. 17 illustrates the RRXE, Row Redundancy X Factor Emulator Circuit.

Figure 18:
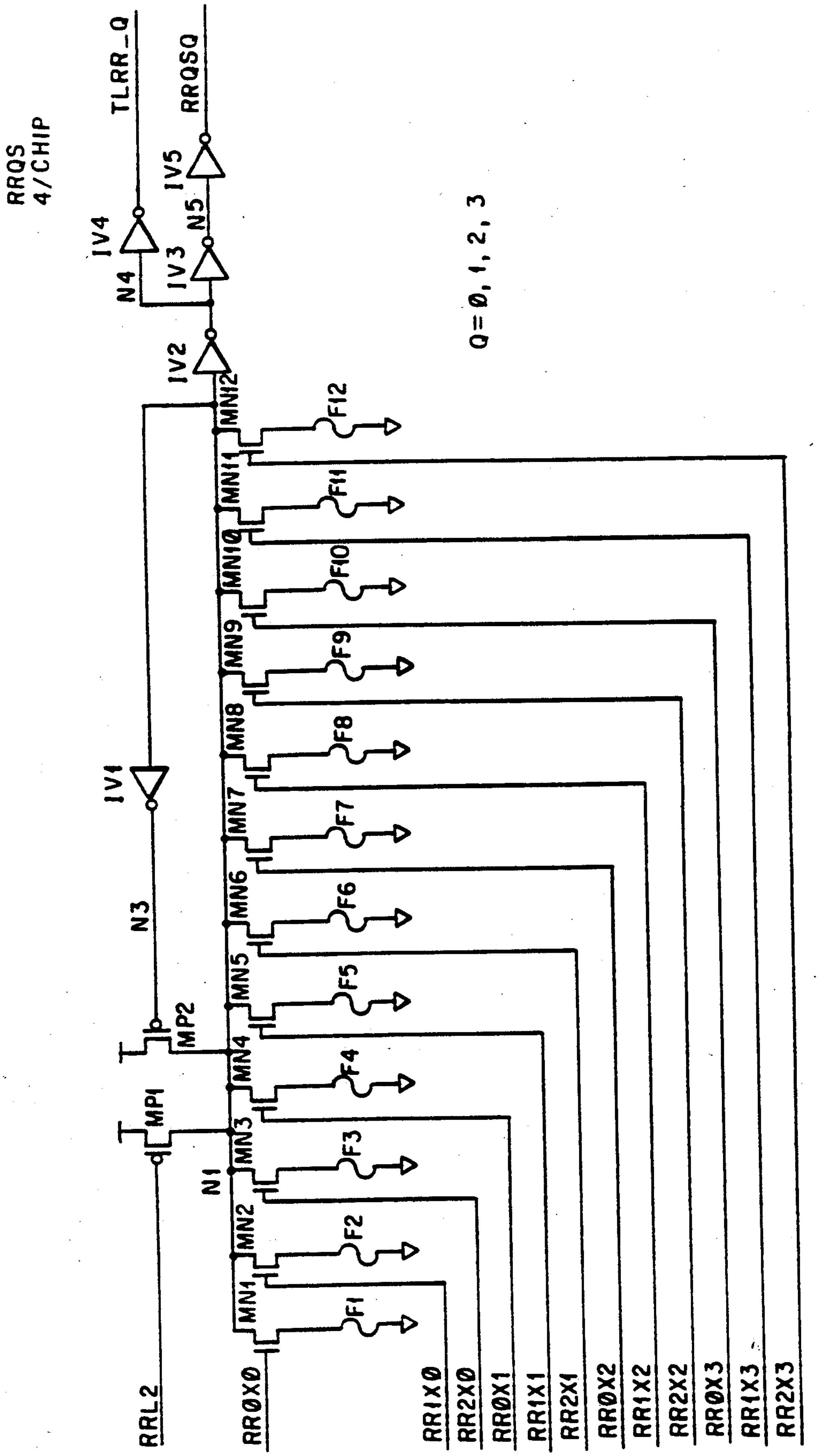

FIG. 18 illustrates the RRQS, or Row Redundancy Quadrant Select Circuit.

Figure 19:
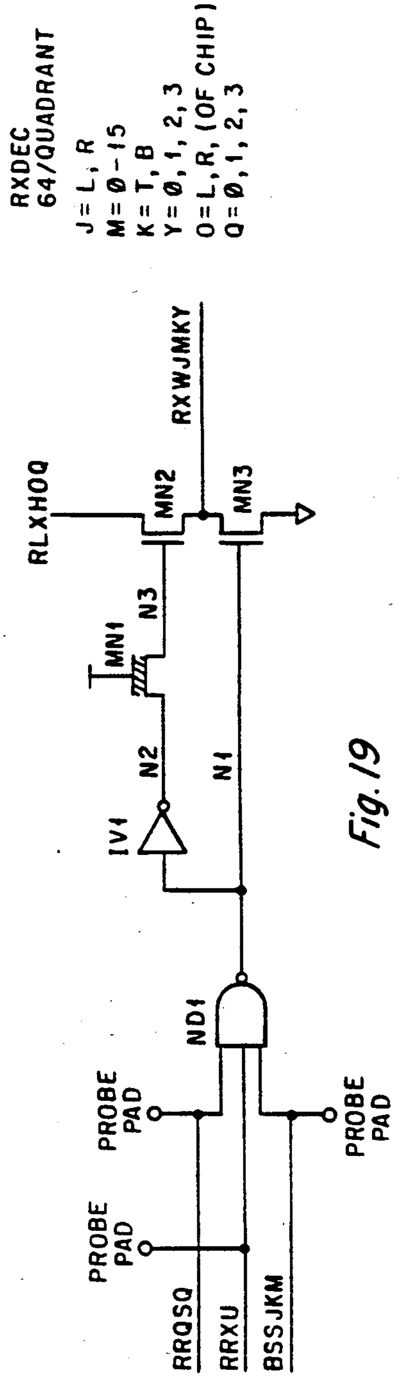

FIG. 19 illustrates the RXDEC, or Redundancy X (word) Decoder Circuit.

Figure 20:
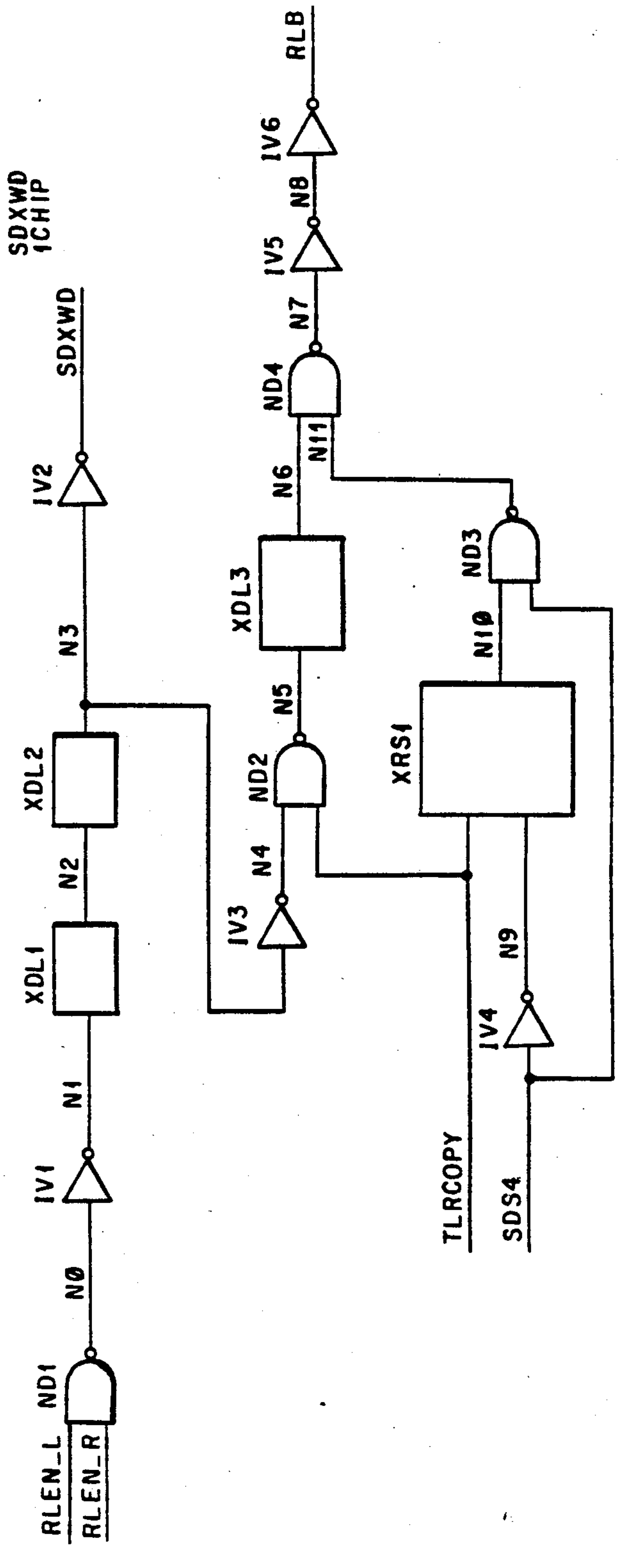

FIG. 20 illustrates the SDXWD, or Sense Clock X-Word Detect Circuit.

Figure 21:
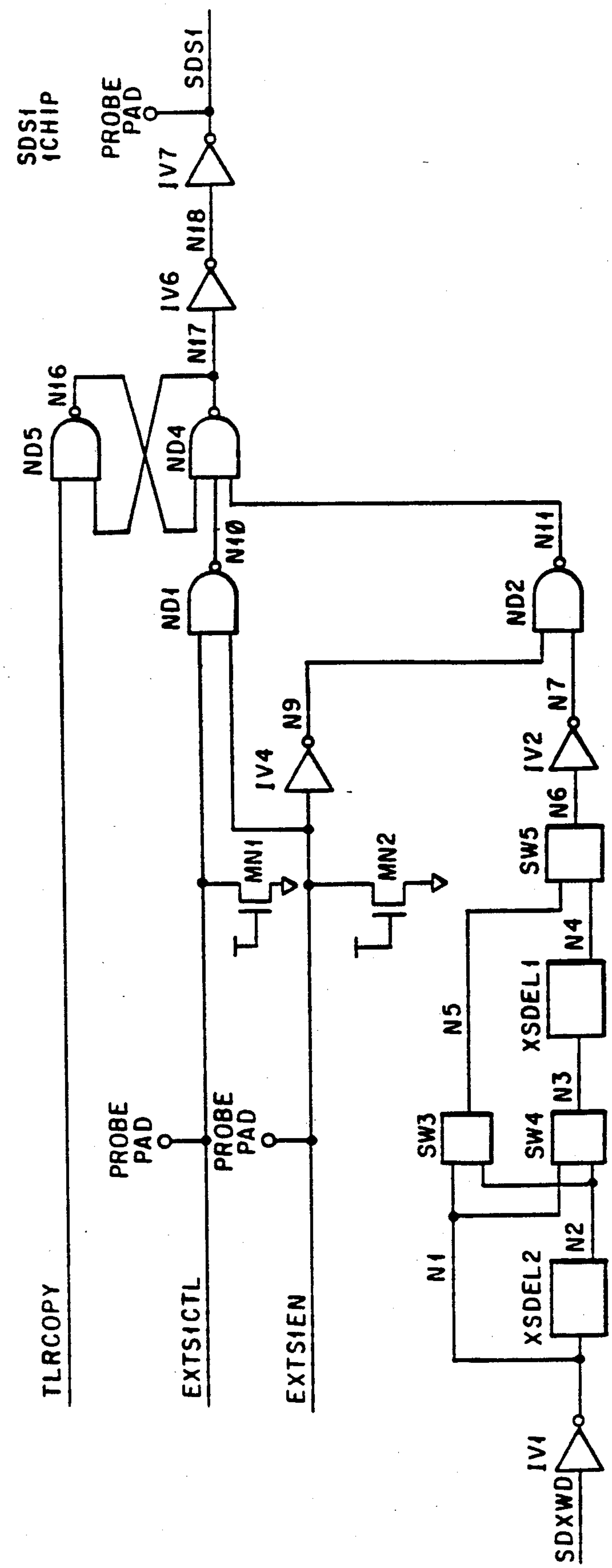

FIG. 21 illustrates the SDS1, or Master Sense Clock Circuit.

Figure 22:
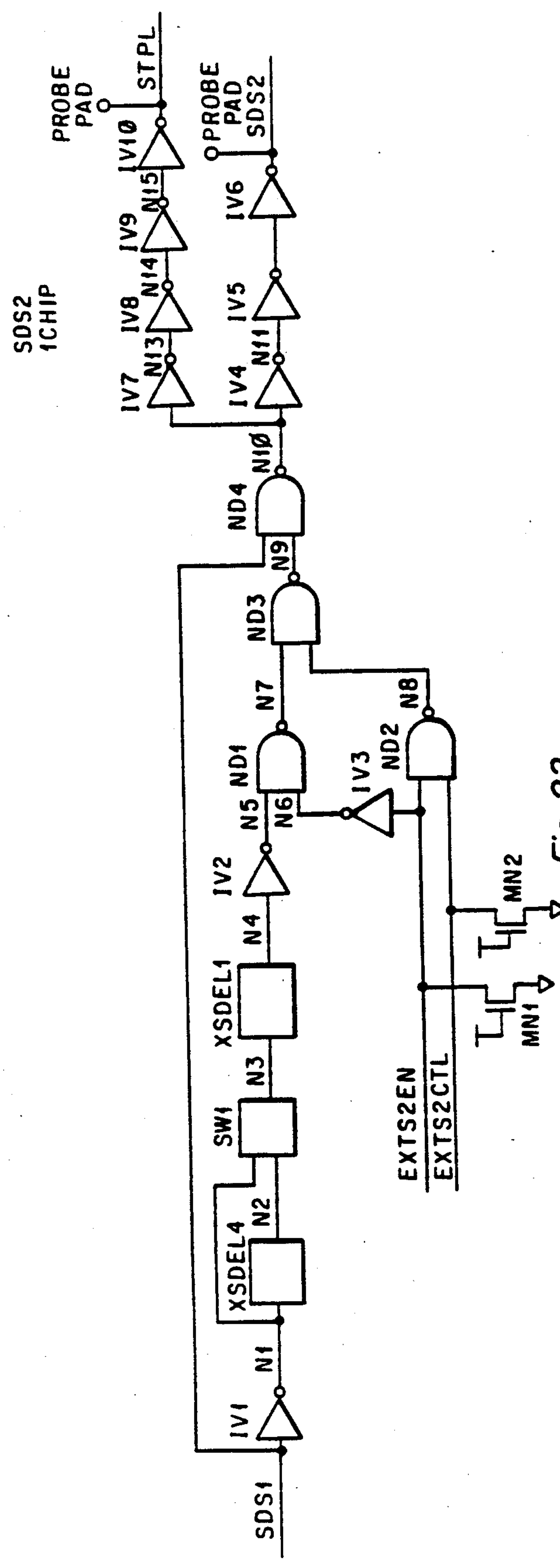

FIG. 22 illustrates the SDS2, or Sense Clock-2 Circuit.

Figure 23:
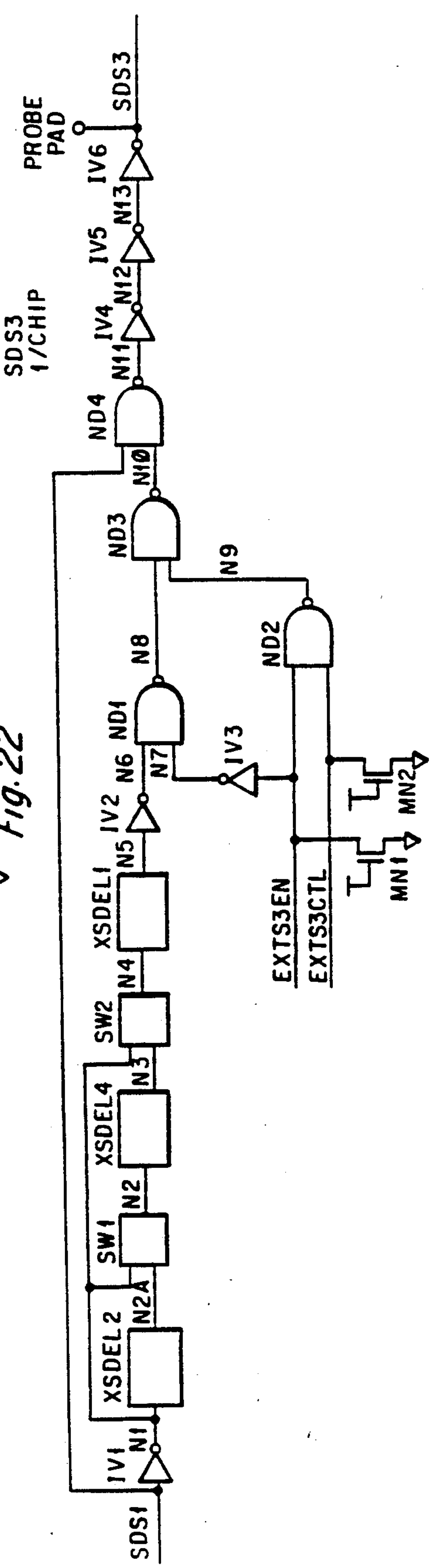

FIG. 23 illustrates the SDS3 or Sense Clock-3 Circuit.

Figure 24:
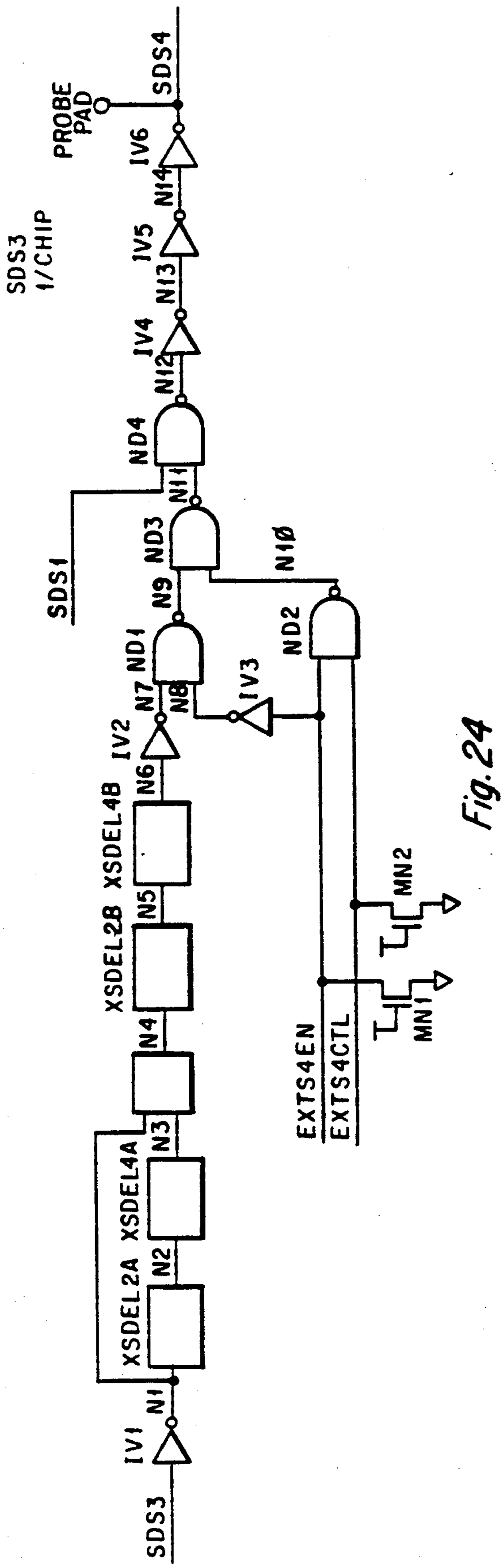

FIG. 24 illustrates the SDS4, or Sense Clock-4 Circuit.

Figure 25:
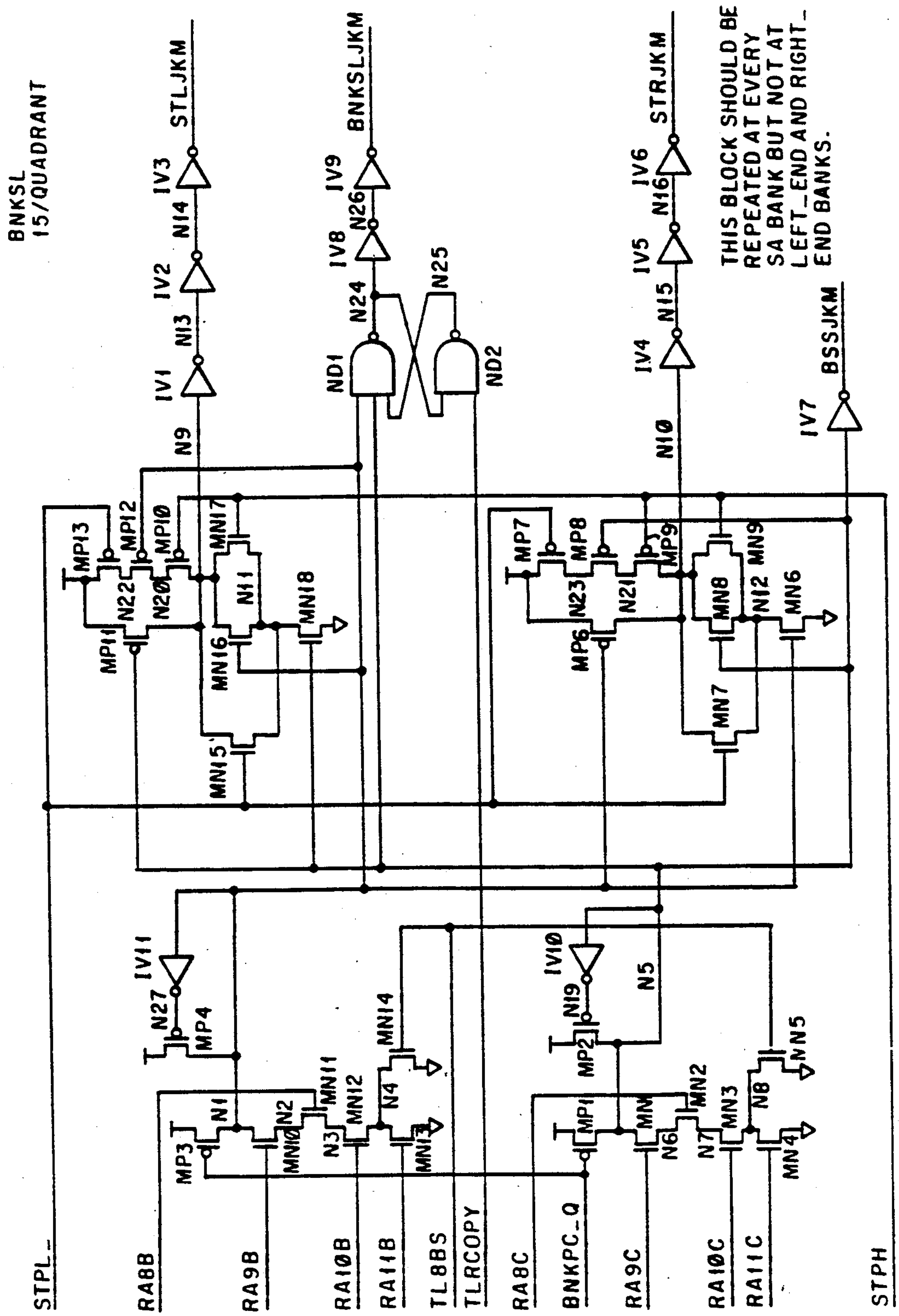

FIG. 25 illustrates the BNKSL, or Bank Select Circuit.

Figure 26:

FIG. 26 illustrates the BSS_DR, or Bank Select Driver Circuit.

Figure 27:
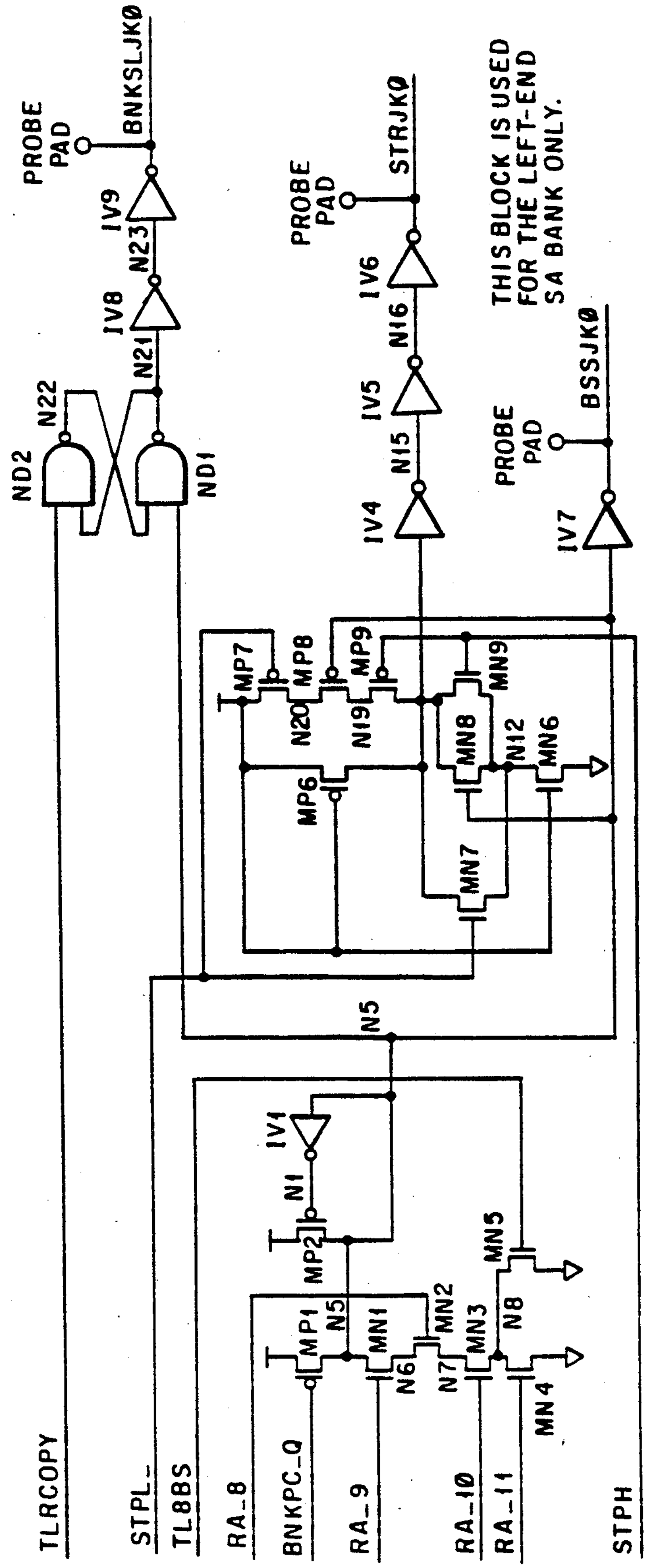

FIG. 27 illustrates the LENDBNKSL, or Left End Bank Select Circuit.

Figure 28:
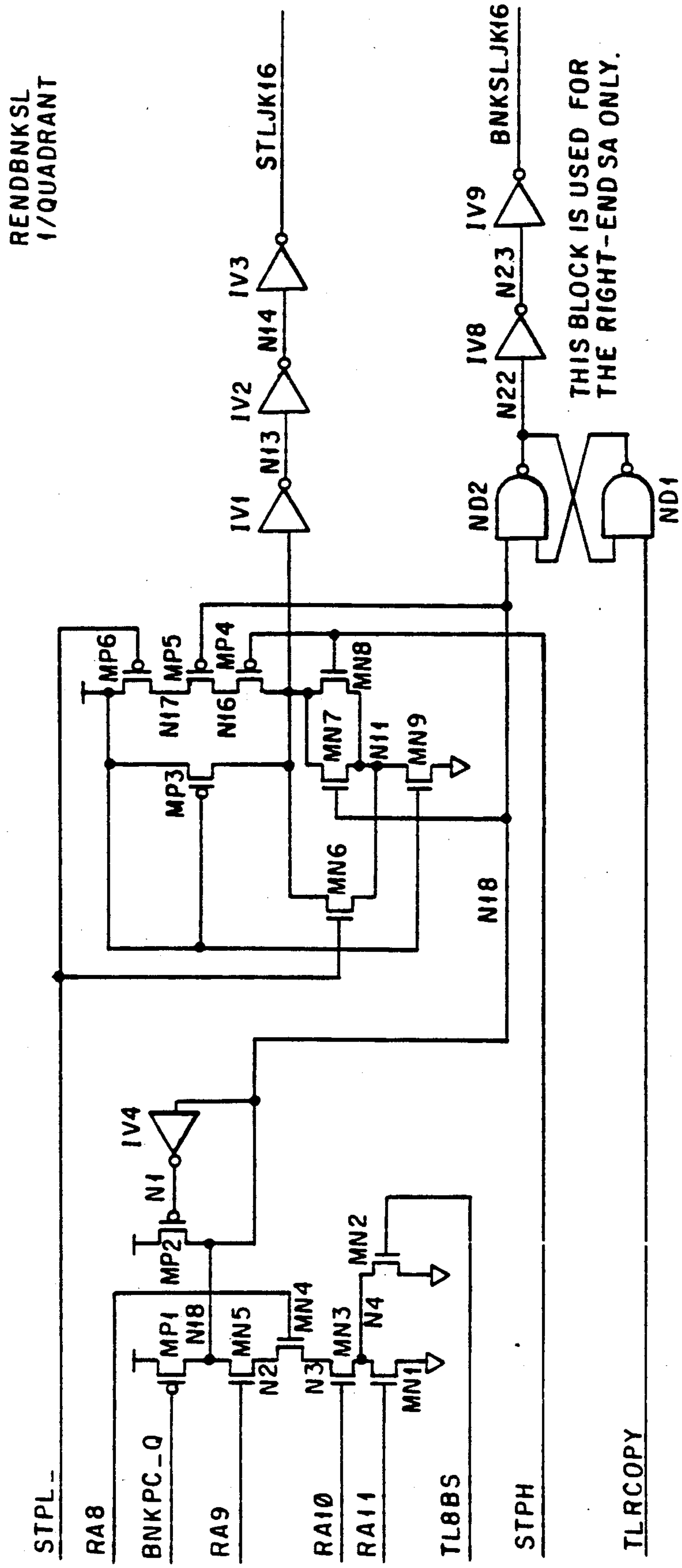

FIG. 28 illustrates the RENDBNKSL, or Right End Bank Select Circuit.

Figure 29:
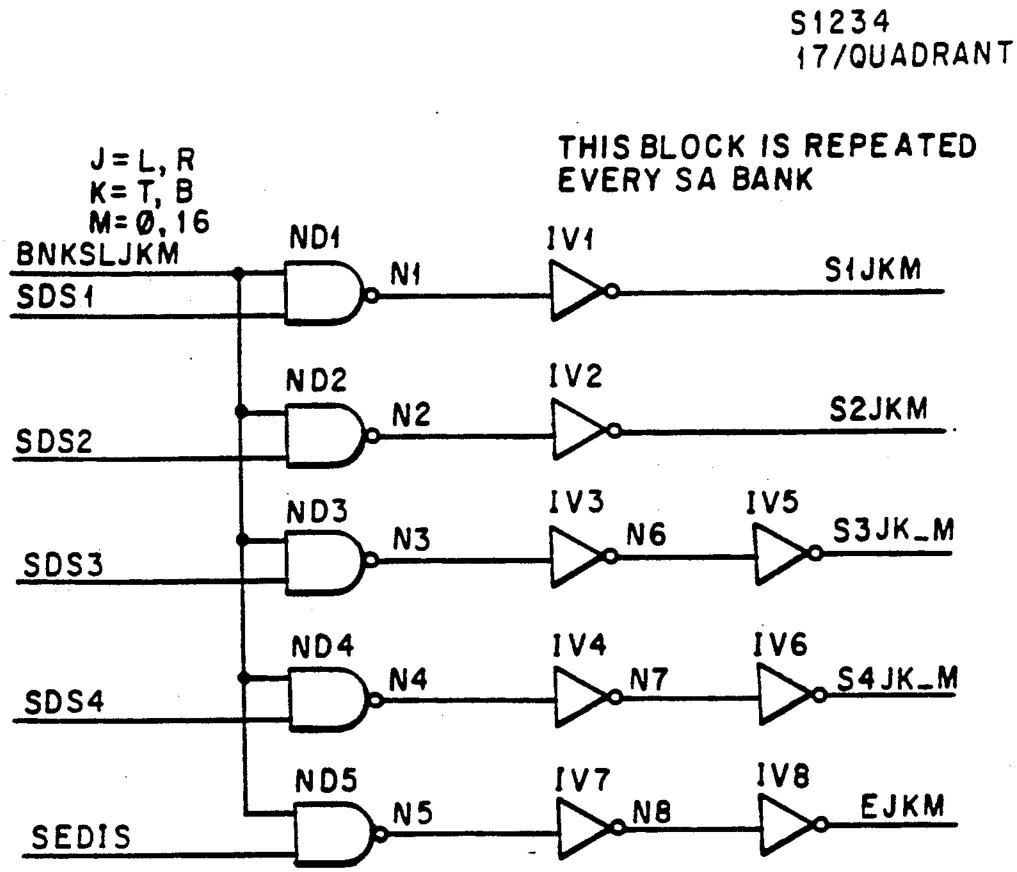

FIG. 29 illustrates the 11234, or Sense Clock 1234 Circuit.

Figure 30:
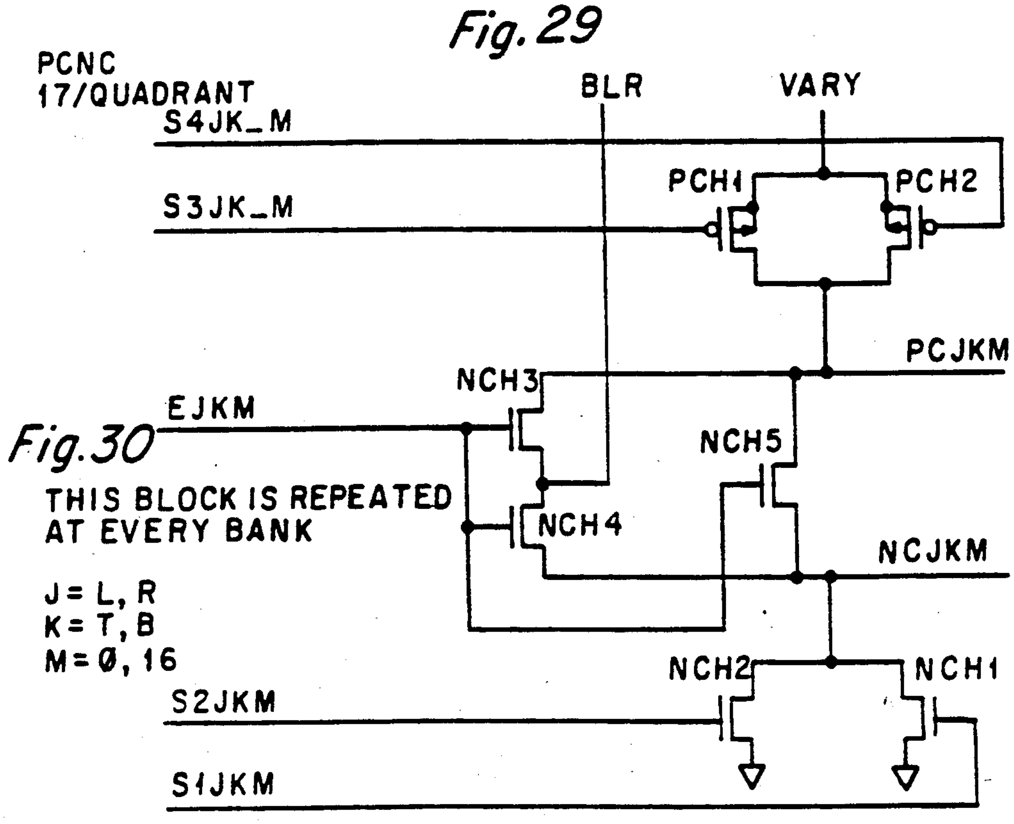

FIG. 30 illustrates the PCNC, or P charge and N charge Circuit.

Figure 31:
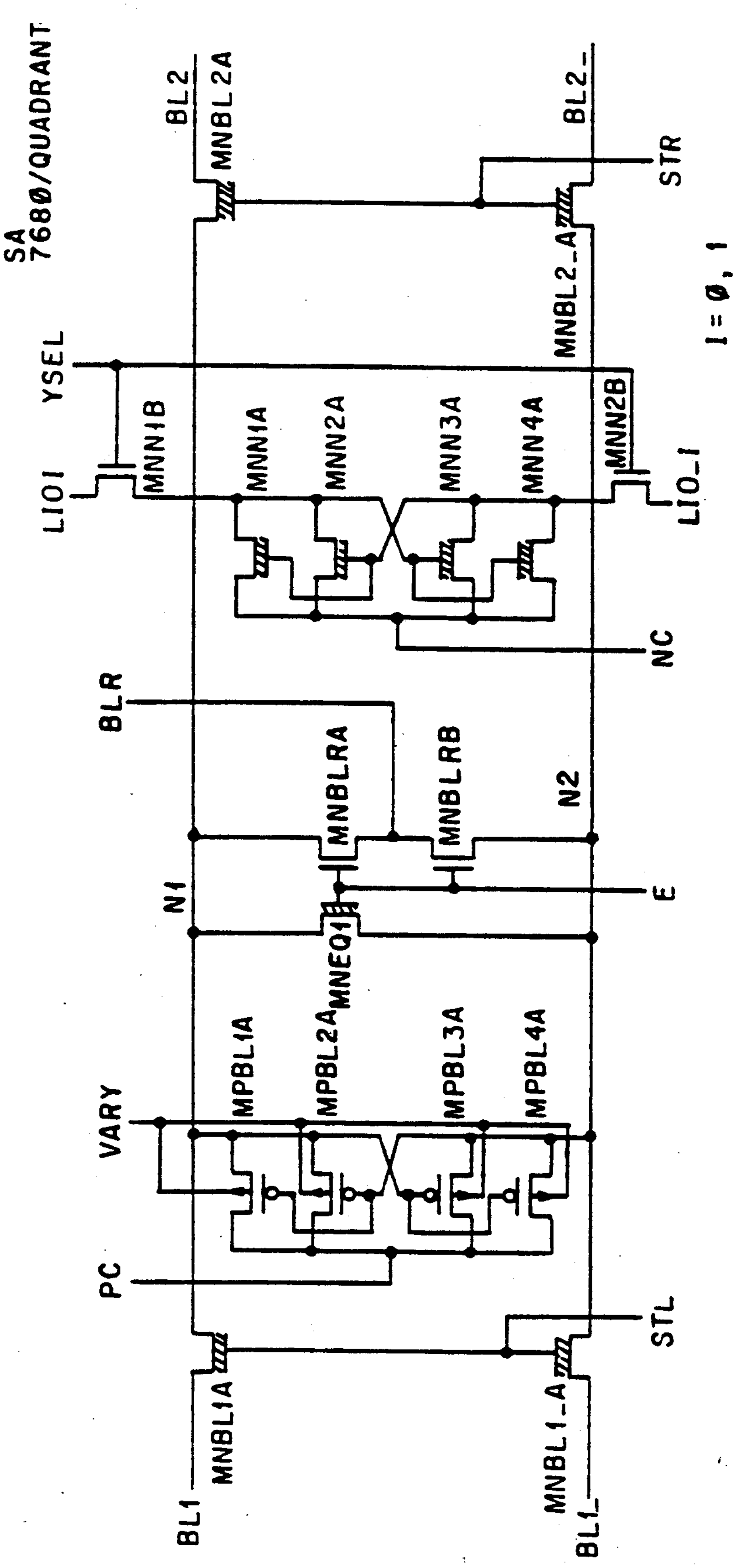

FIG. 31 illustrates the SA, or Sense Amplifier Circuit.

Figure 32:
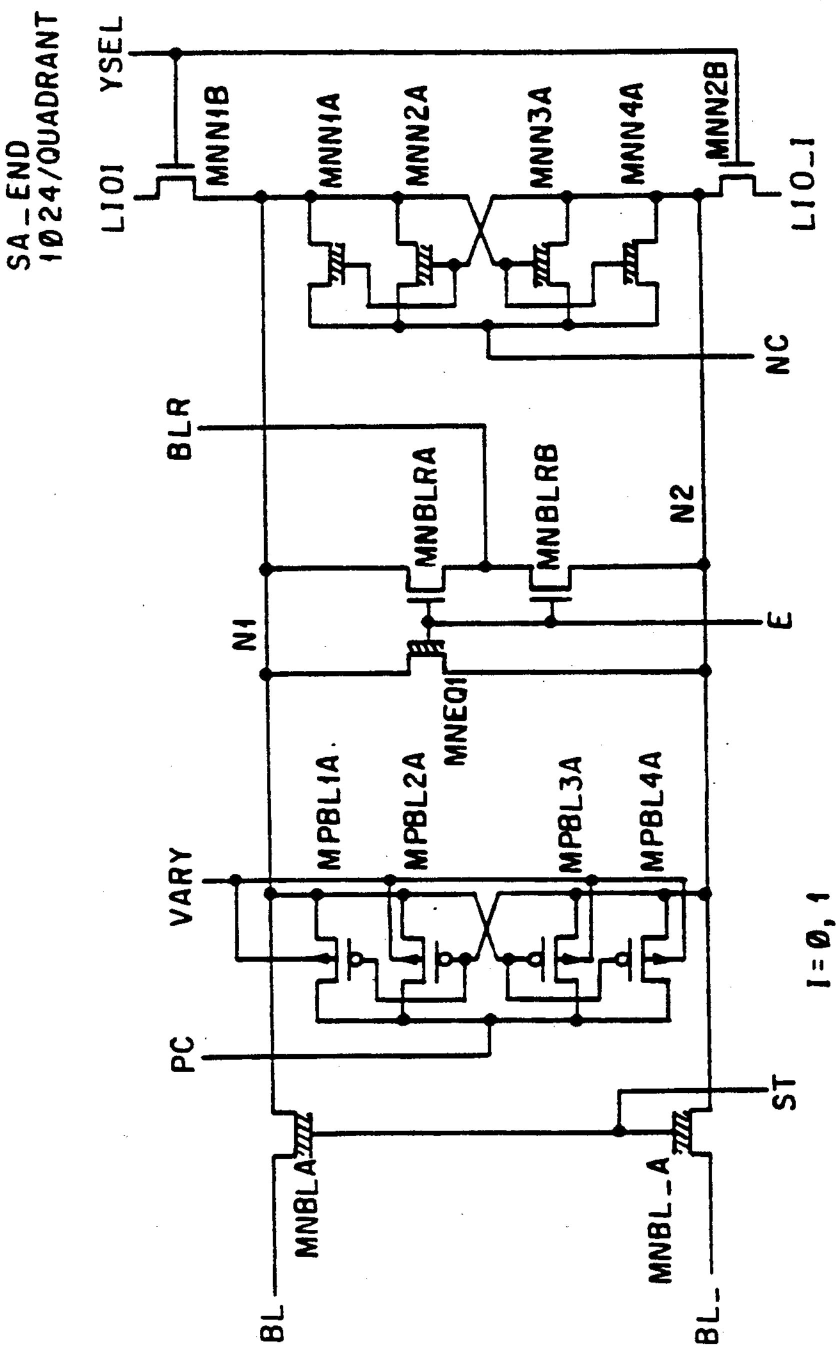

FIG. 32 illustrates the SA_END, or Sense Amplifier End Circuit.

FIG. 33 illustrates the CABUF01, or Column Address Buffer 01 Circuit.

FIG. 34 illustrates the CABUF29, or Column Address Buffer 29 Circuit.

Figure 35:
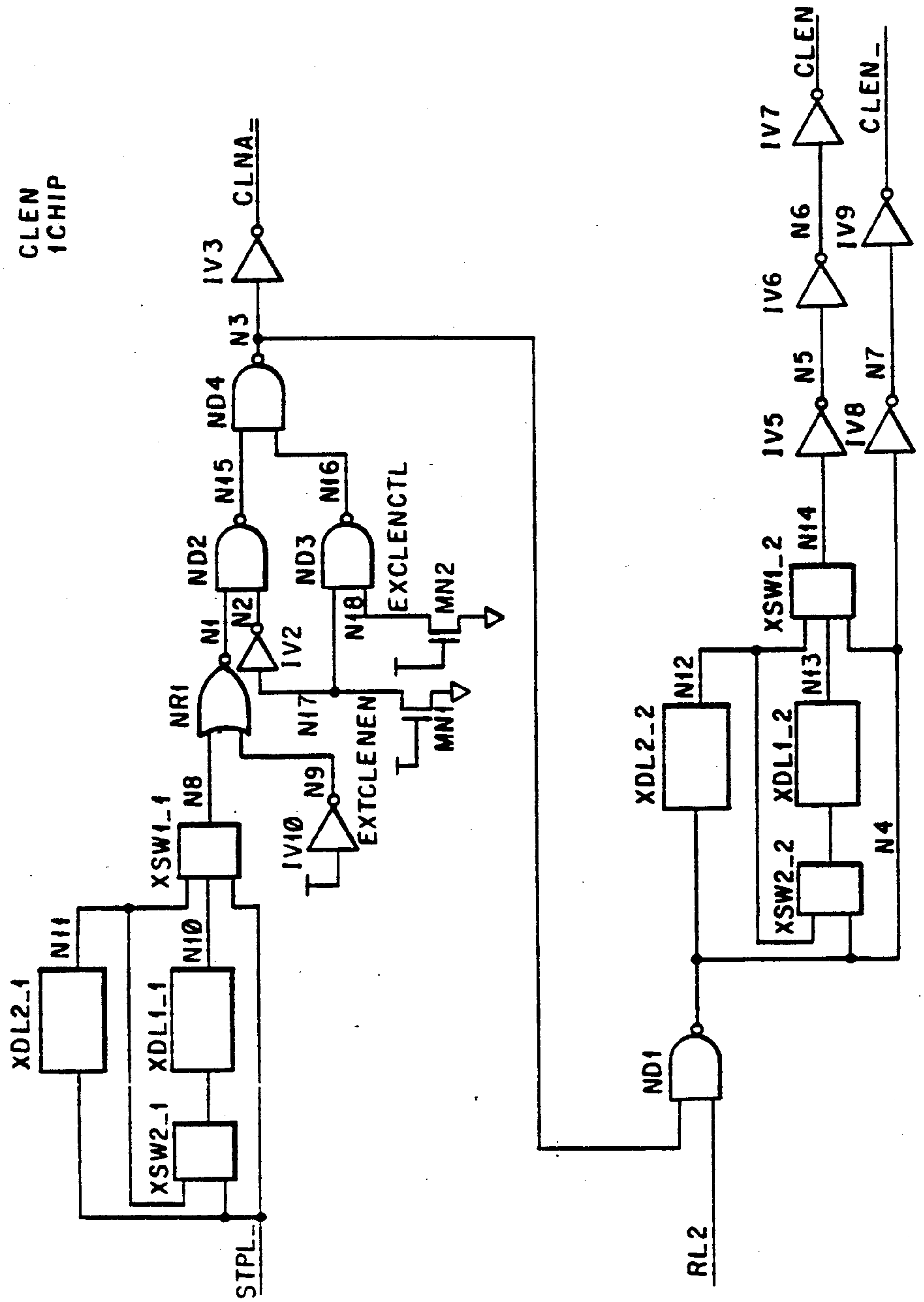

FIG. 35 illustrates the CLEN, or Column Logic Enable Circuit.

FIG. 36 illustrates the CF07, or Column Factor 0, 7 Circuit.

FIG. 36.1 illustrates the CF07DR, or Column Factor 0, 7 Driver Circuit.

FIG. 36.2 illustrates the CF815, or Column Factor 8 thru 15 Circuit.

FIG. 37 illustrates the YDEC, or Y Decoder Circuit.

FIG. 37.1 illustrates the CRDEC, or Column Redundancy Coder Enable Circuit.

Figure 38:
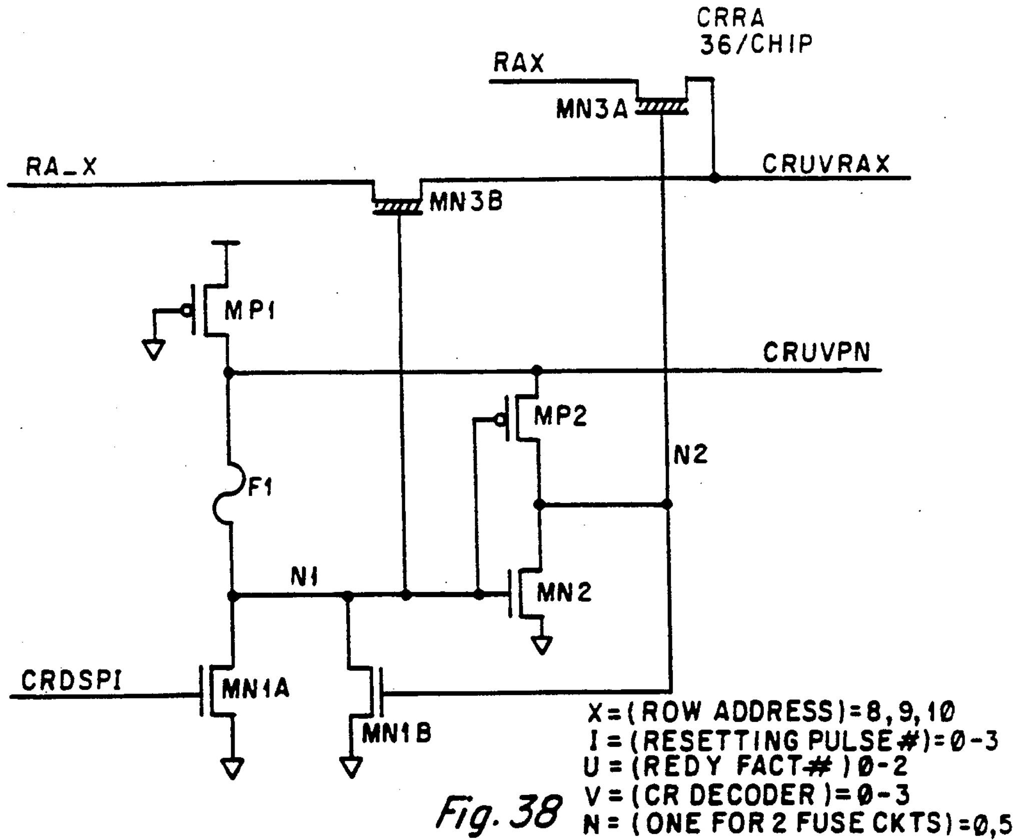

FIG. 38 illustrates the CRRA, or Column Redundancy Row Address Circuit.

Figure 39:
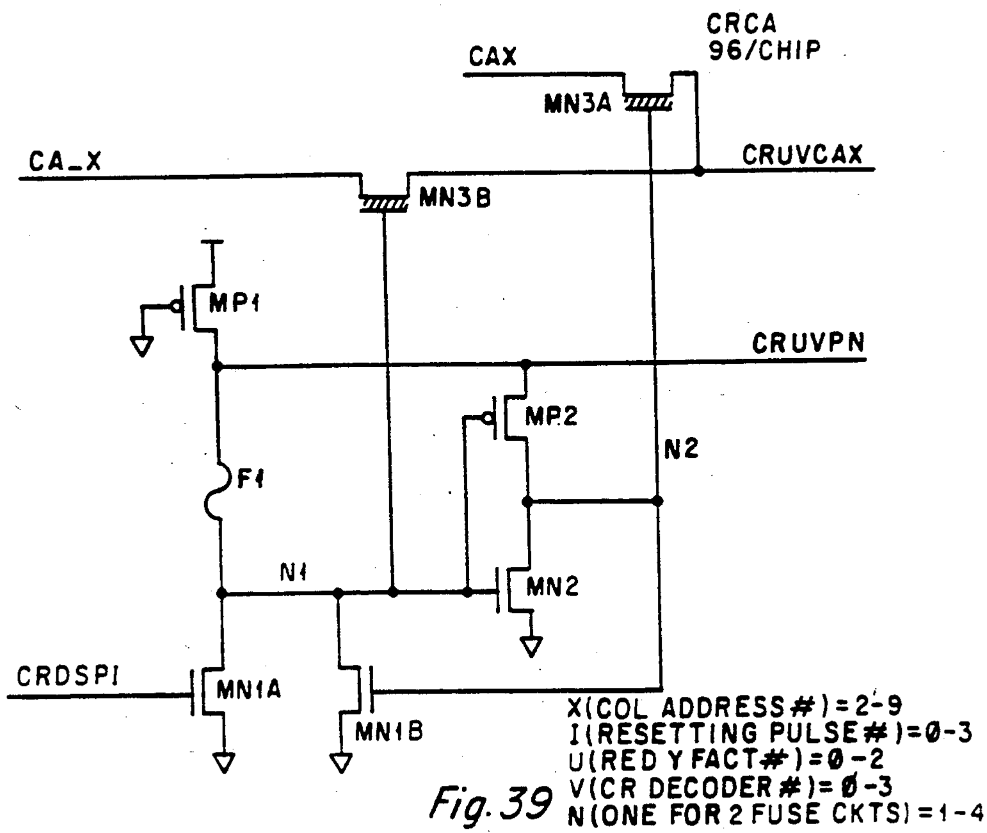

FIG. 39 illustrates the CRCA, or Column Redundancy Address Circuit.

Figure 40:
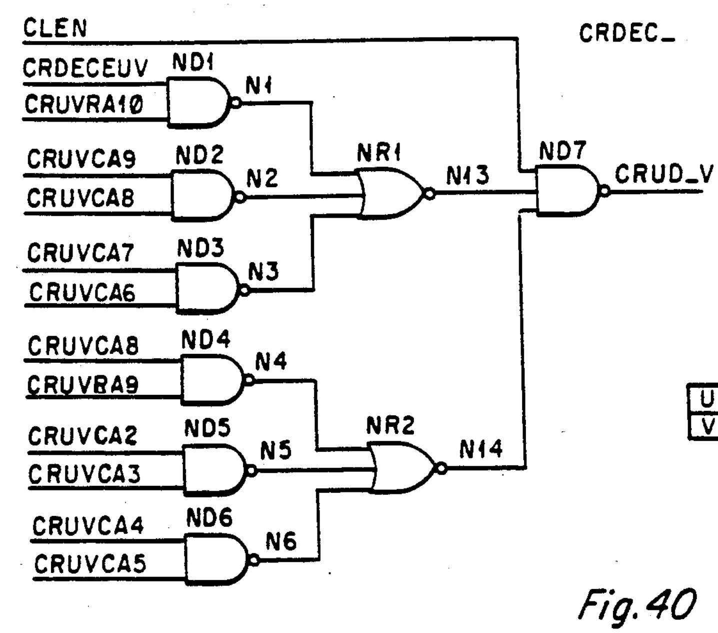

FIG. 40 illustrates the CRDEC_, or Column Redundancy Decoder Circuit.

Figure 41:
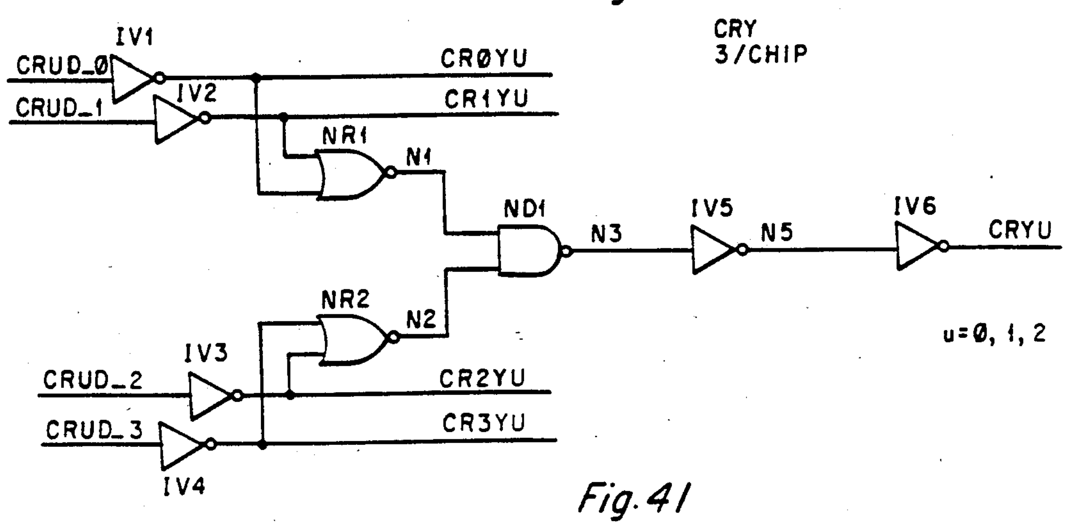

FIG. 41 illustrates the CRY, or Column Redundancy Y Factor Circuit.

Figure 42:
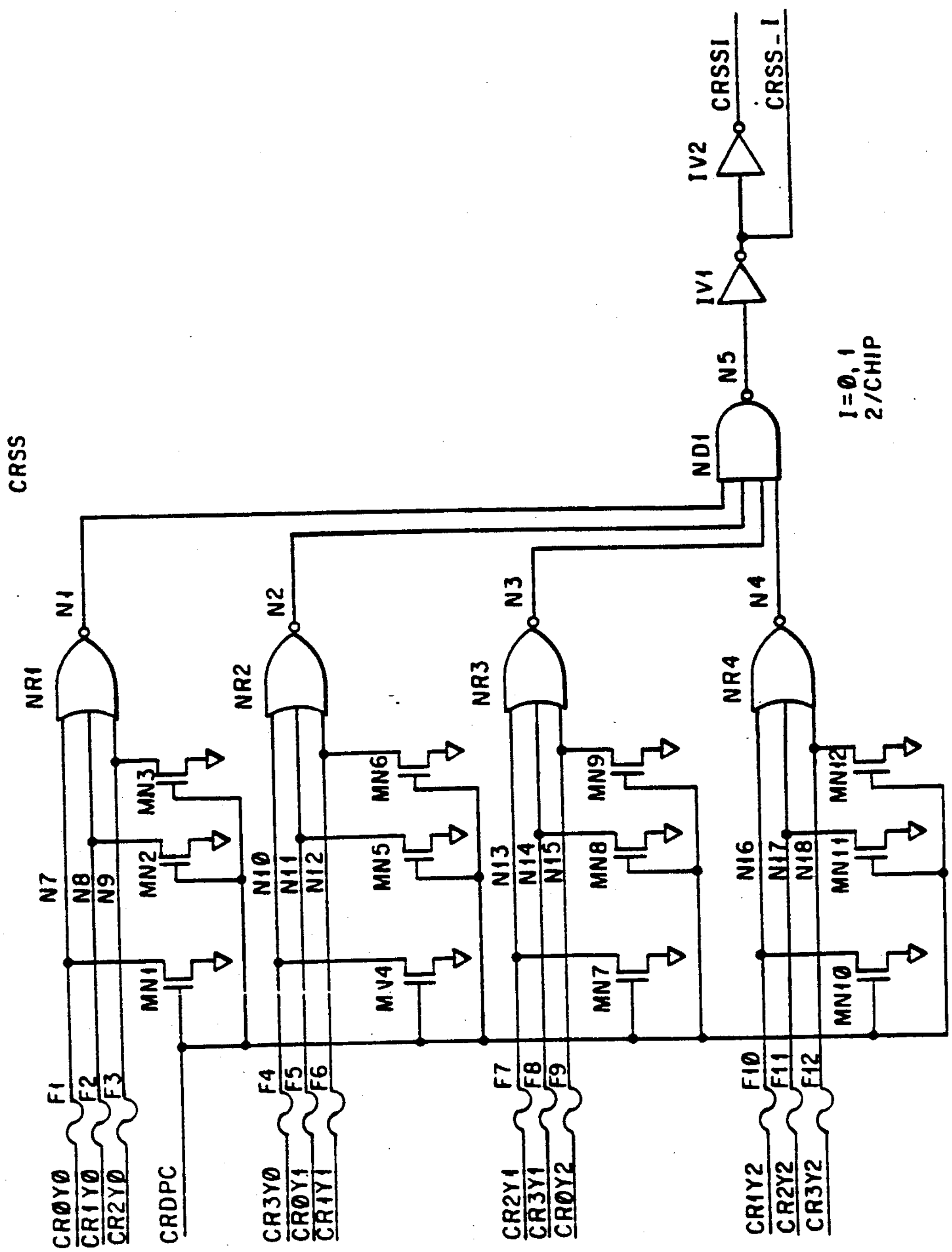

FIG. 42 illustrates the CRSS, or Column Redundancy Segment Select Circuit.

Figure 43:
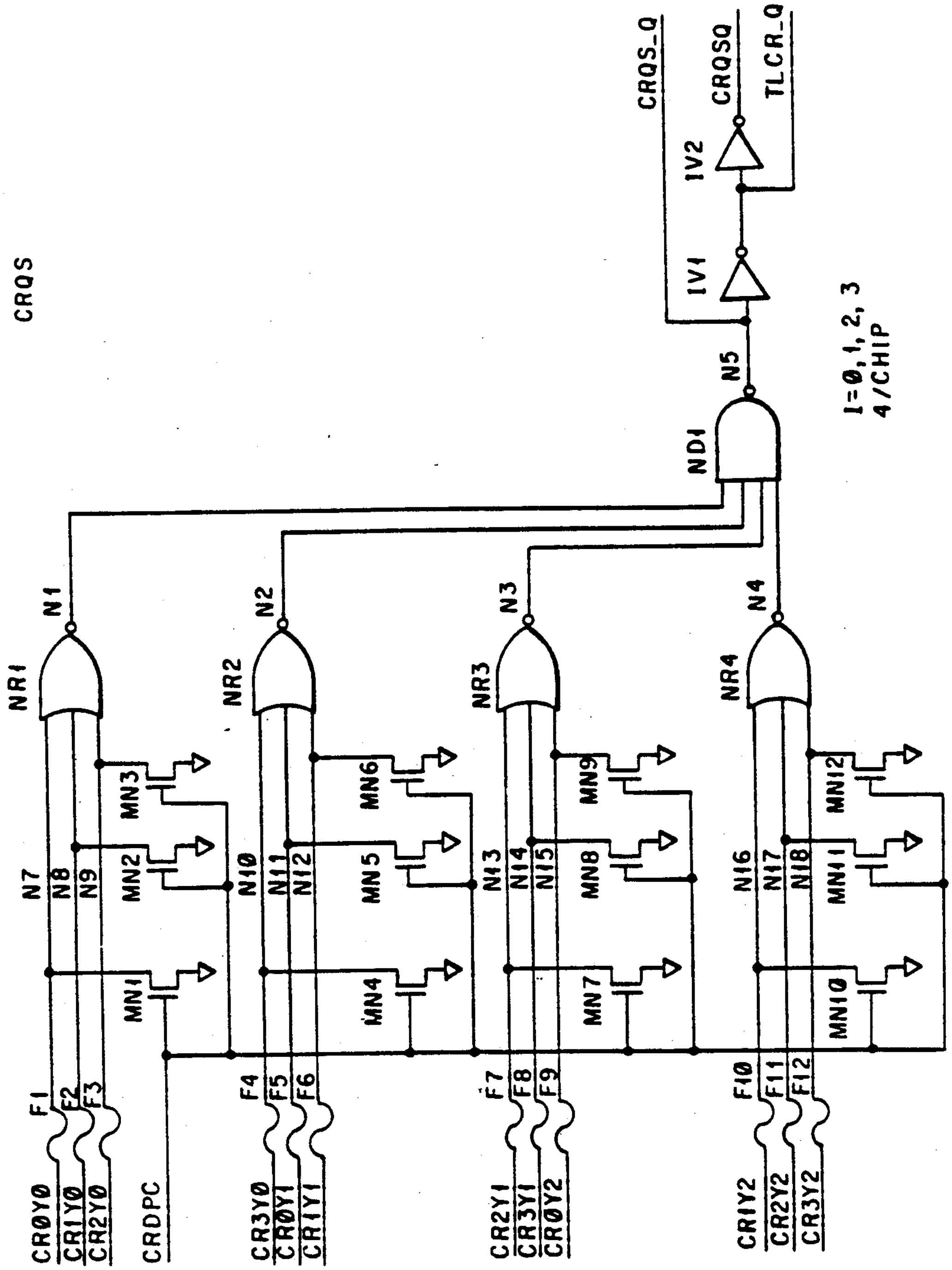

FIG. 43 illustrates the CRQS, or Column Redundancy Quadrant Circuit.

Figure 44:
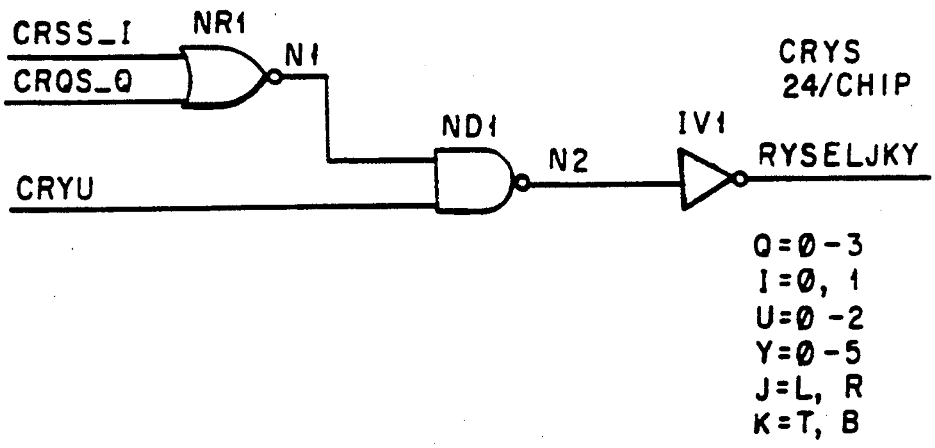

FIG. 44 illustrates the CRYS, or Column Redundancy Y Select Circuit.

Figure 45:
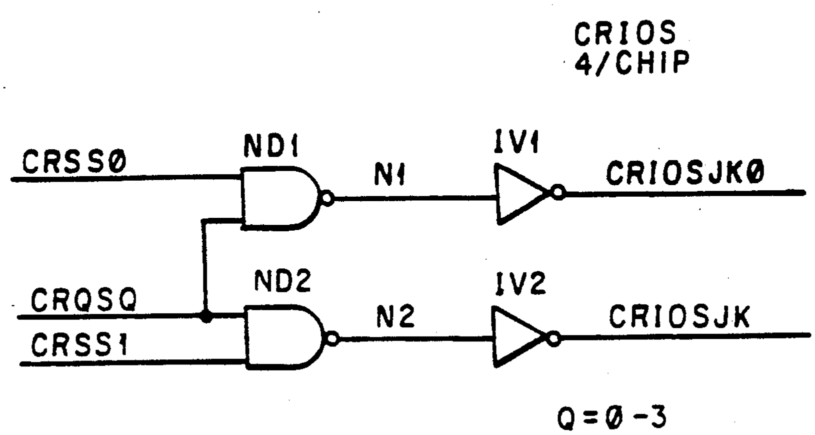

FIG. 45 illustrates the CRIOS, or Column Redundancy I/O Select Circuit.

Figure 46:
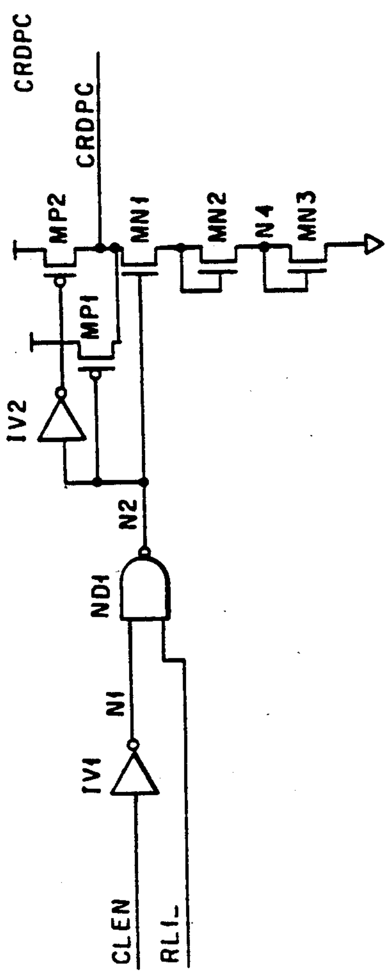

FIG. 46 illustrates the CRDPC, or Column Delay Redundancy Pre-Charge Circuit.

Figure 47:
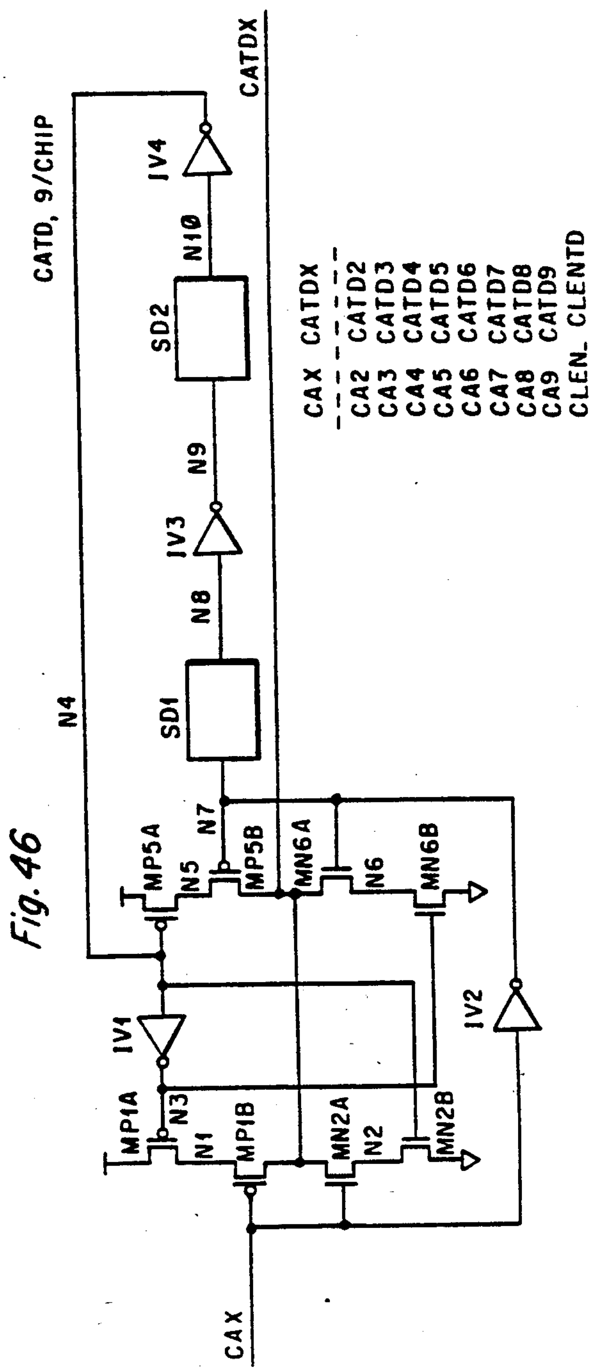

FIG. 47 illustrates the Column Address Transition Detector Circuit, CATD.

Figure 48:
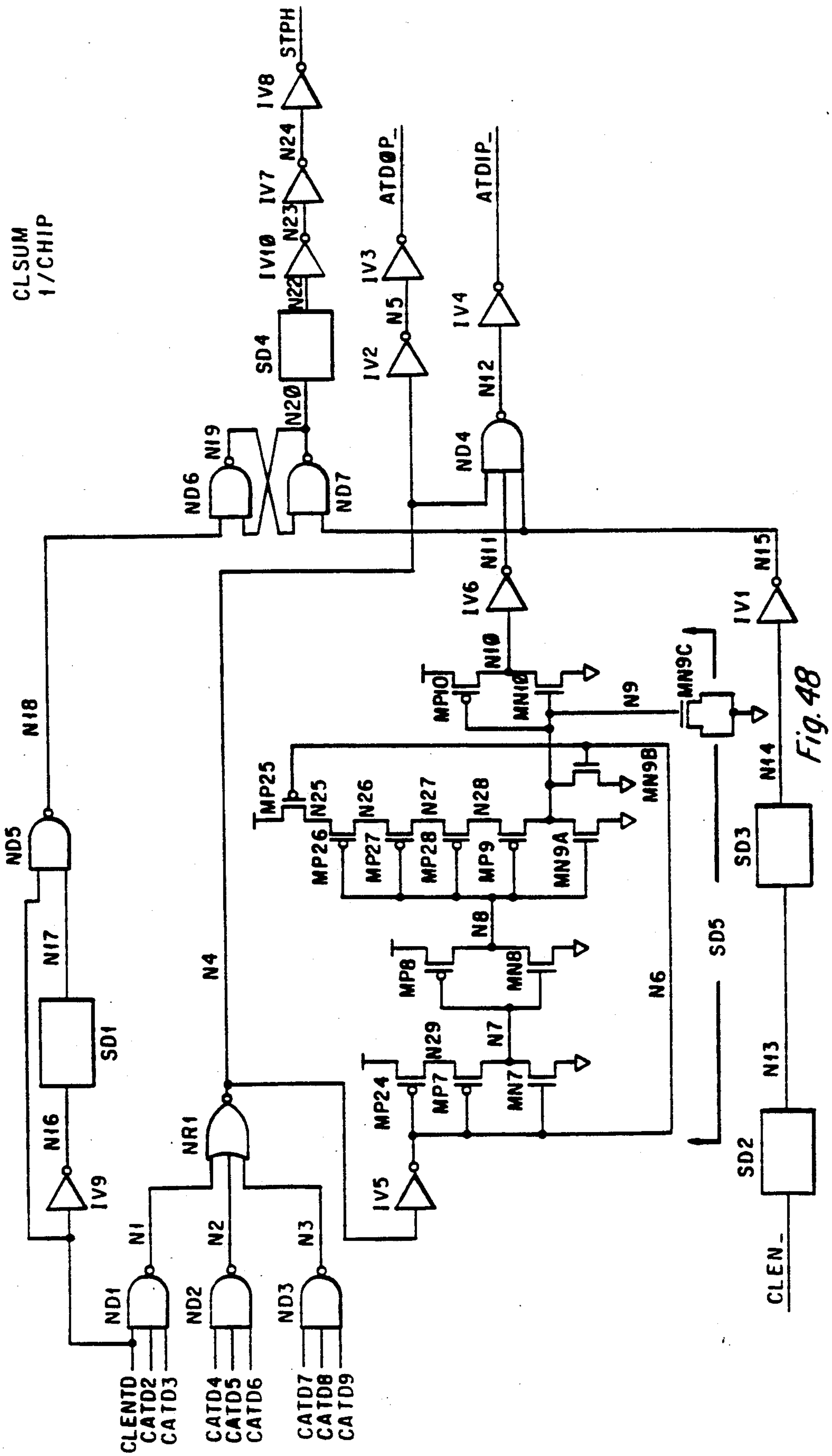

FIG. 48 illustrates the Column Logic Summation Circuit, CLSUM.

Figure 49:
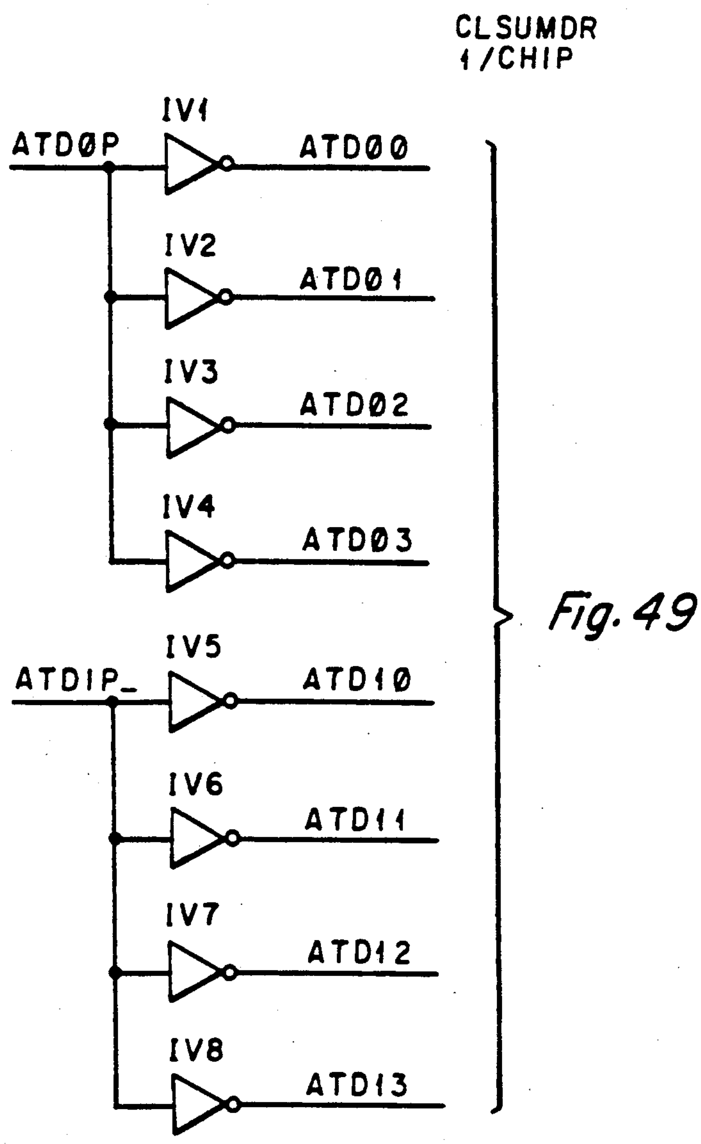

FIG. 49 illustrates the Column Sum Logic Driver Circuit, CLSUMDR.

Figure 50:
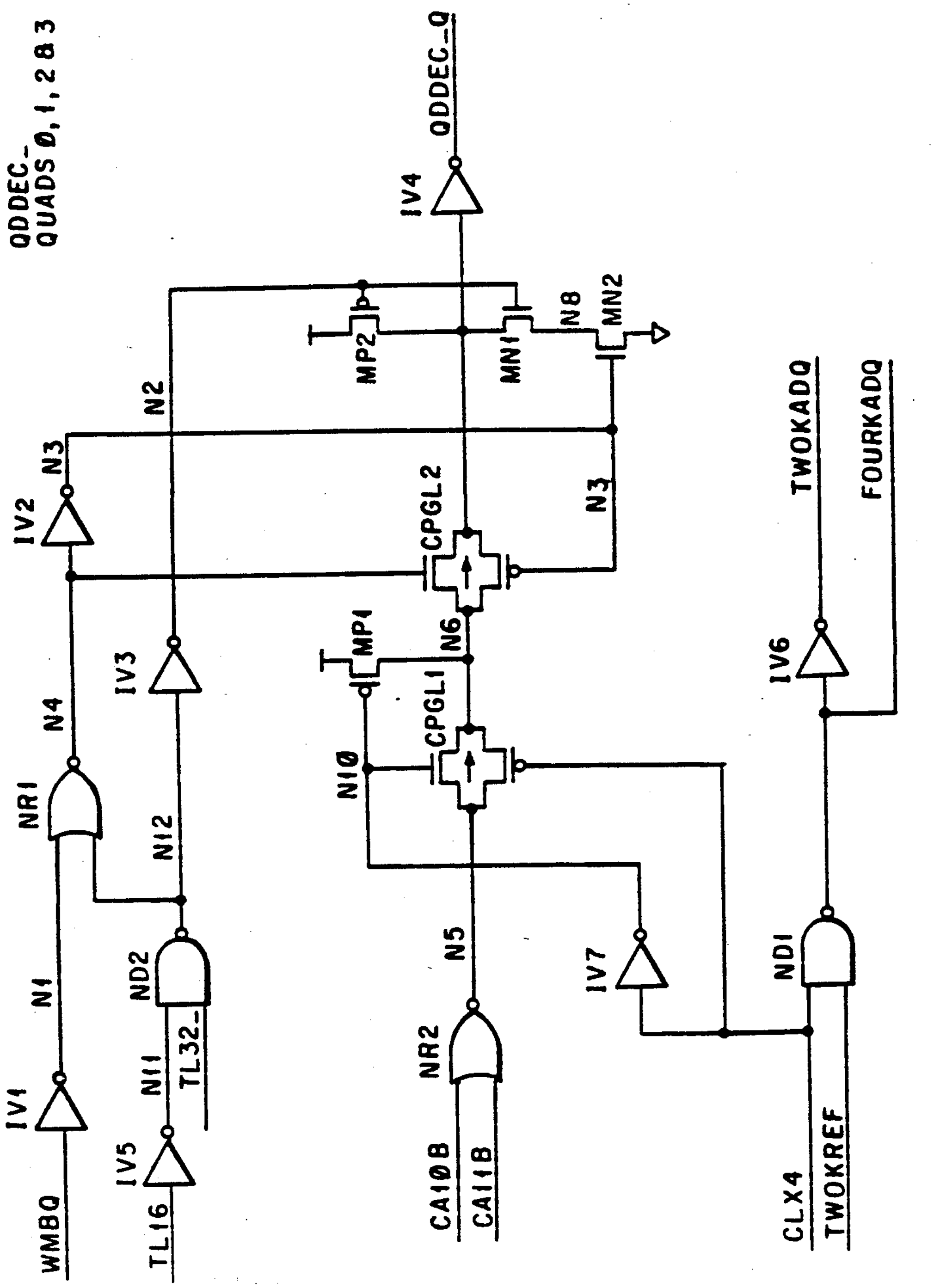

FIG. 50 illustrates the Quadrant Select Circuit, QDDEC.

Figure 51:
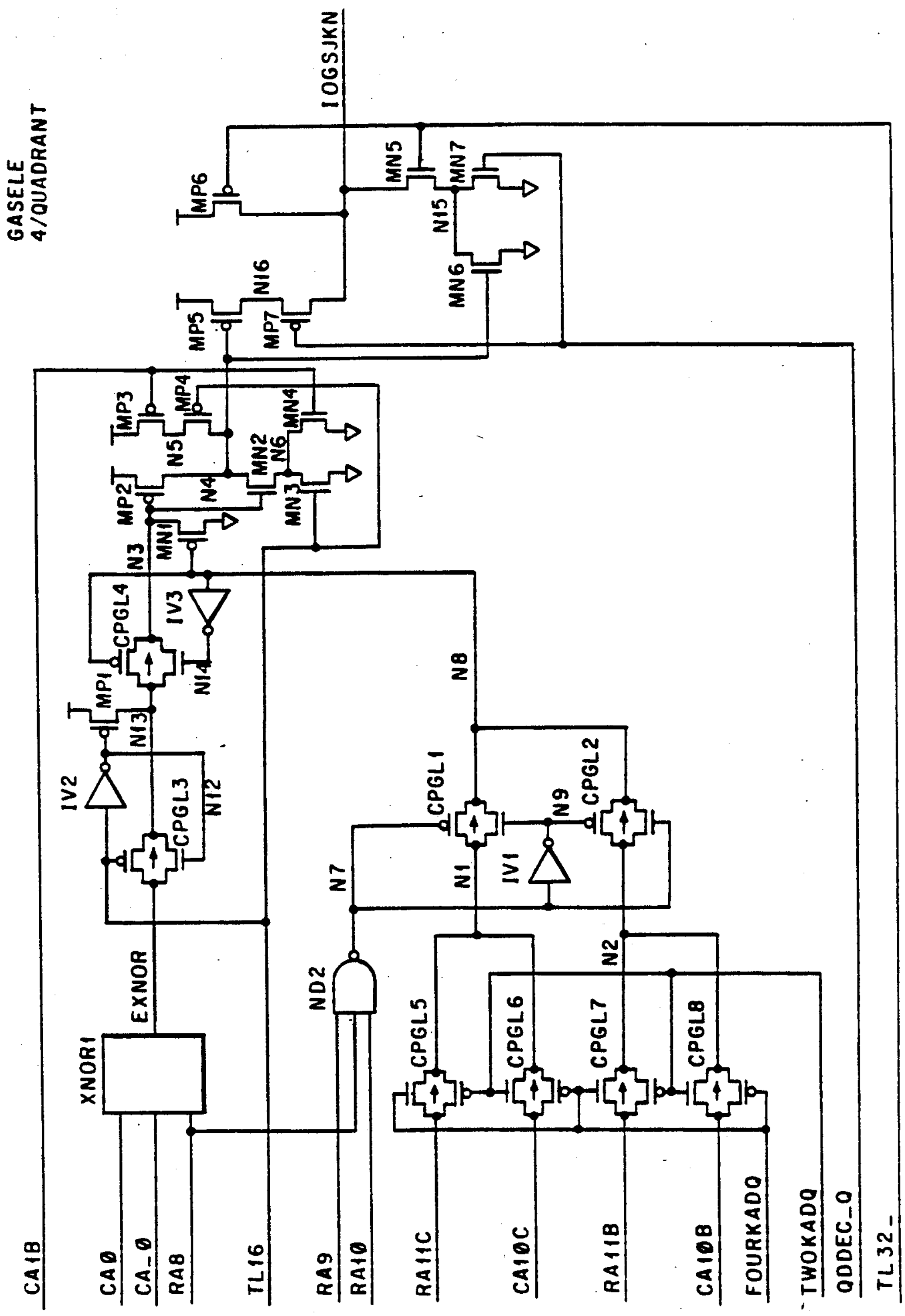

FIG. 51 illustrates the Global Amplifier Select End Circuit GASELE.

Figure 52:
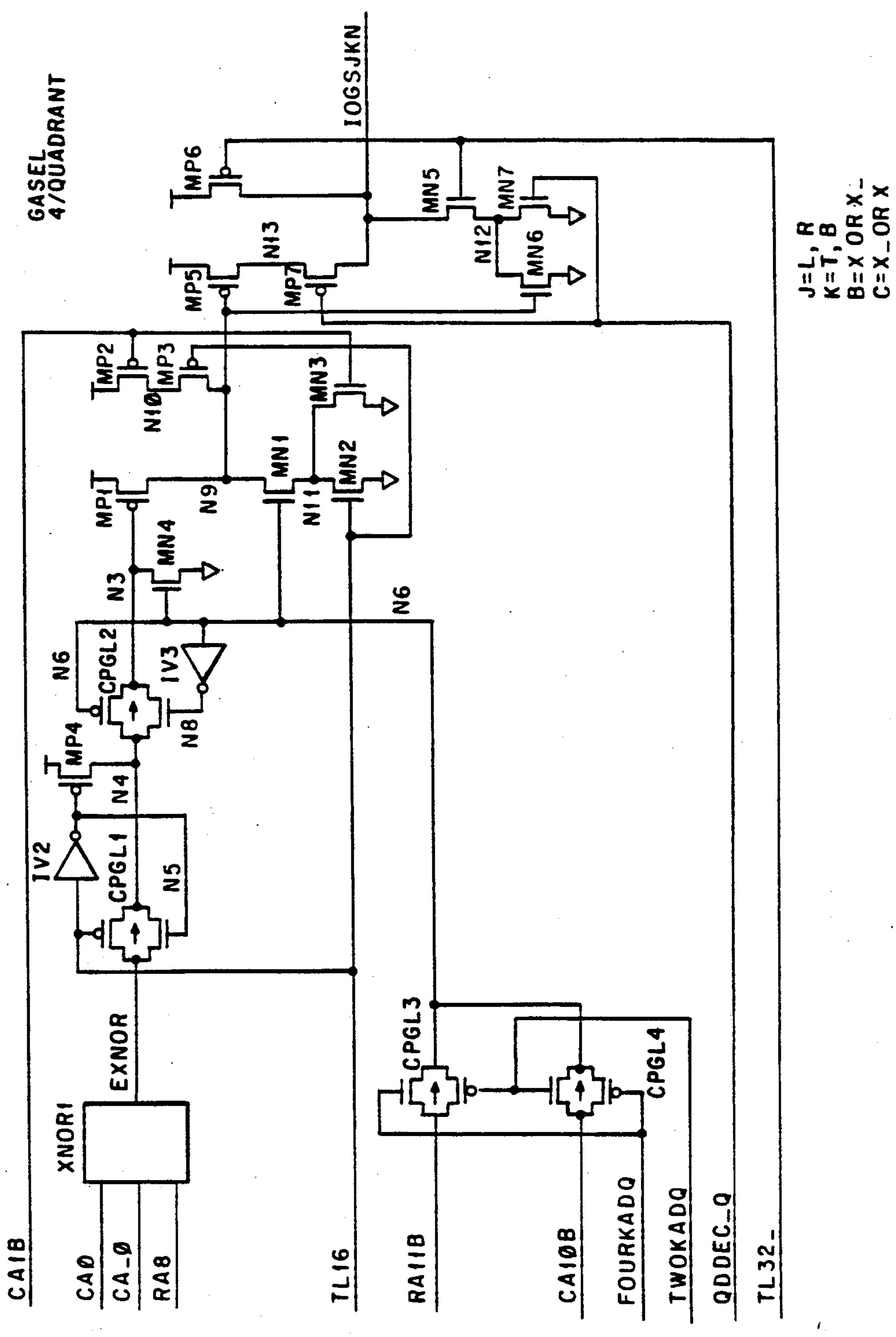

FIG. 52 illustrates the Global Amplifier Select Circuit, GASEL.

Figure 53:
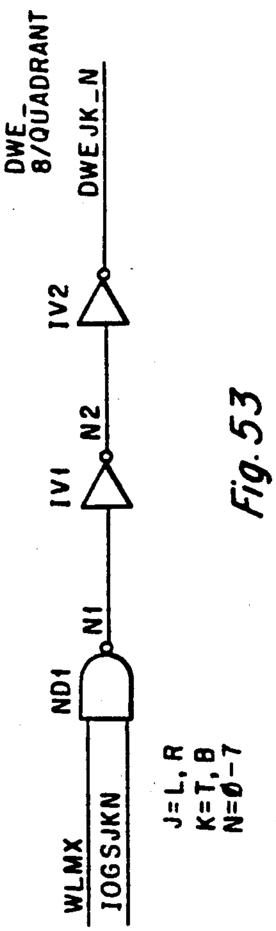

FIG. 53 illustrates the Data Write Enable Signal Circuit, DWE_.

Figure 54:
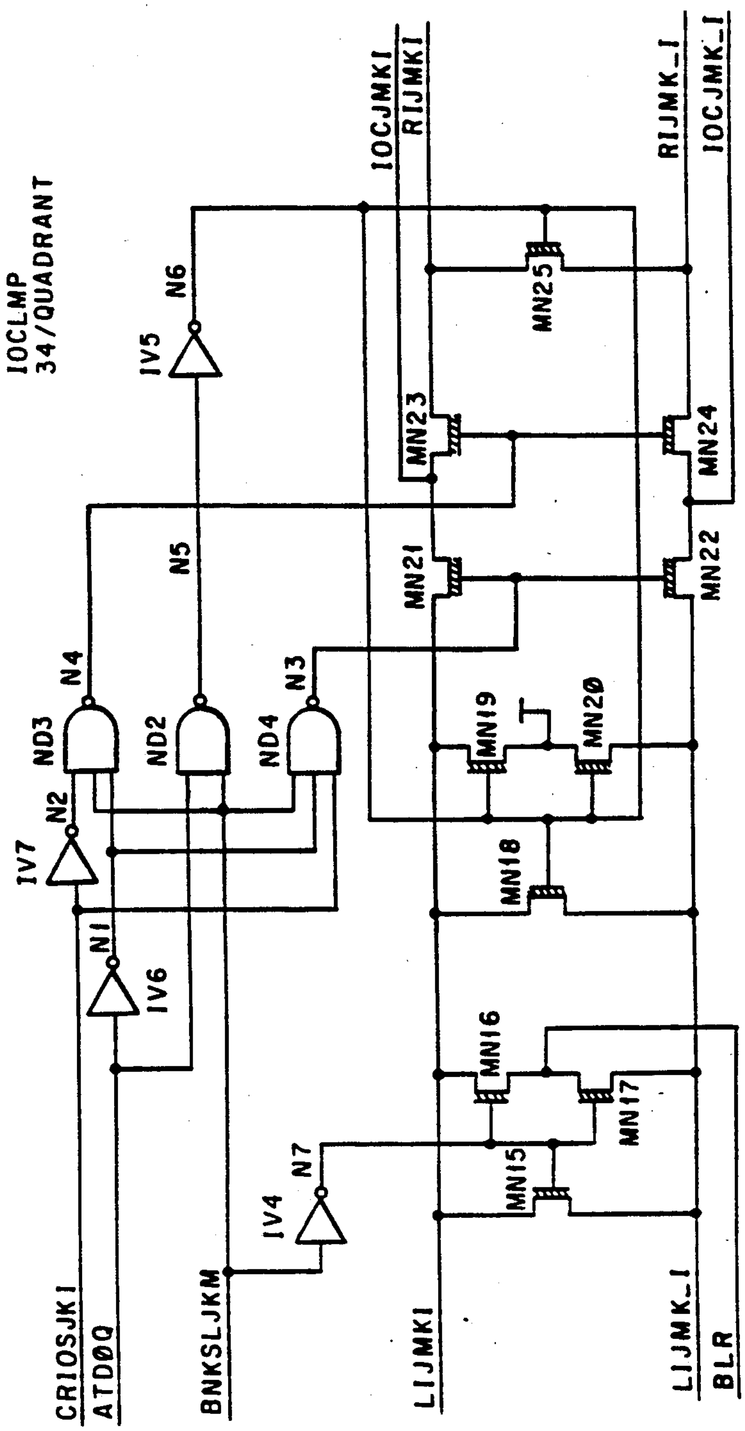

FIG. 54 illustrates the IOCLMP, or I/O Clamp Circuit. Code in Appendix A23.

Figure 55:
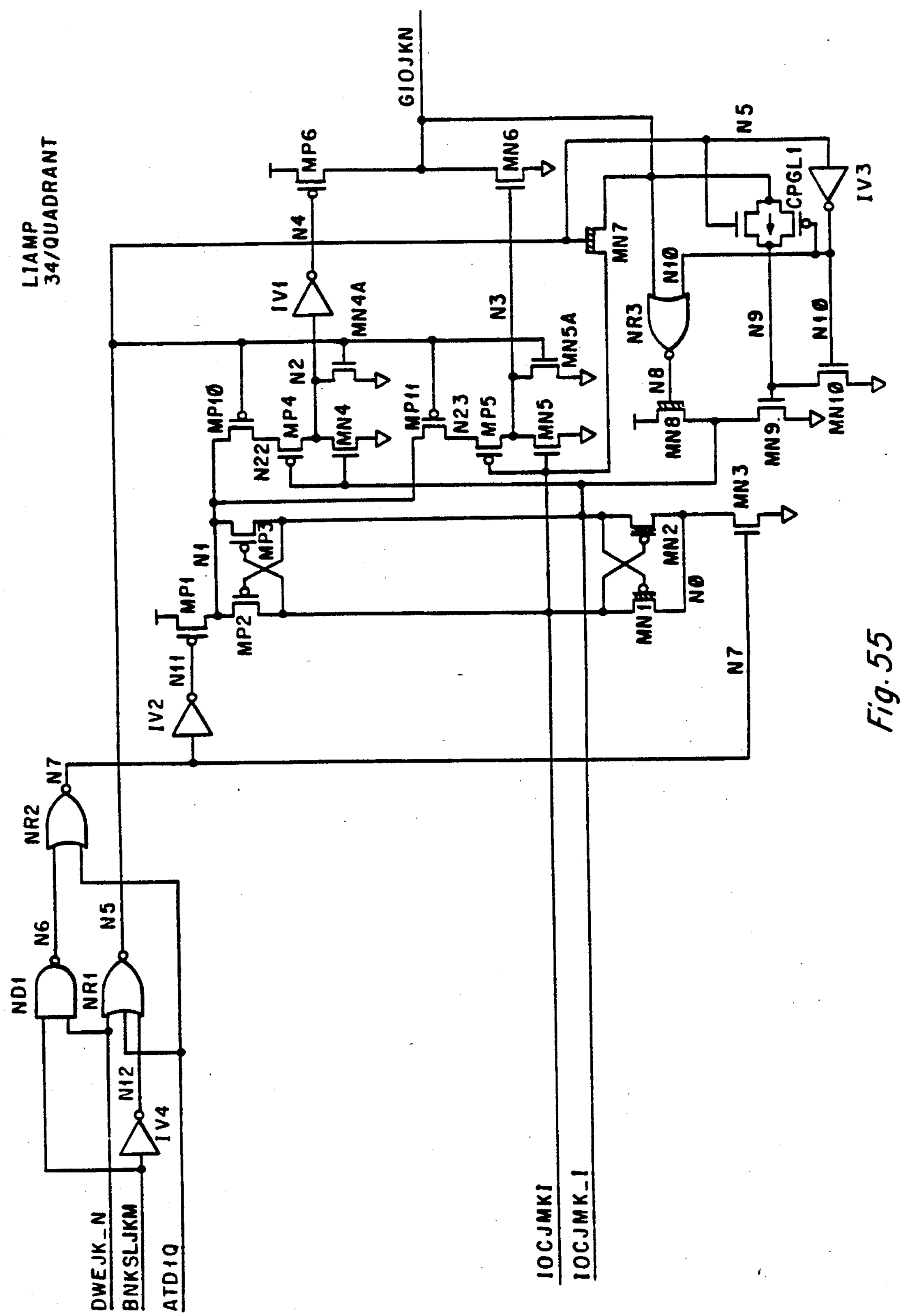

FIG. 55 illustrates the Local I/O Amplifier Circuit, LIAMP.

Figure 56:
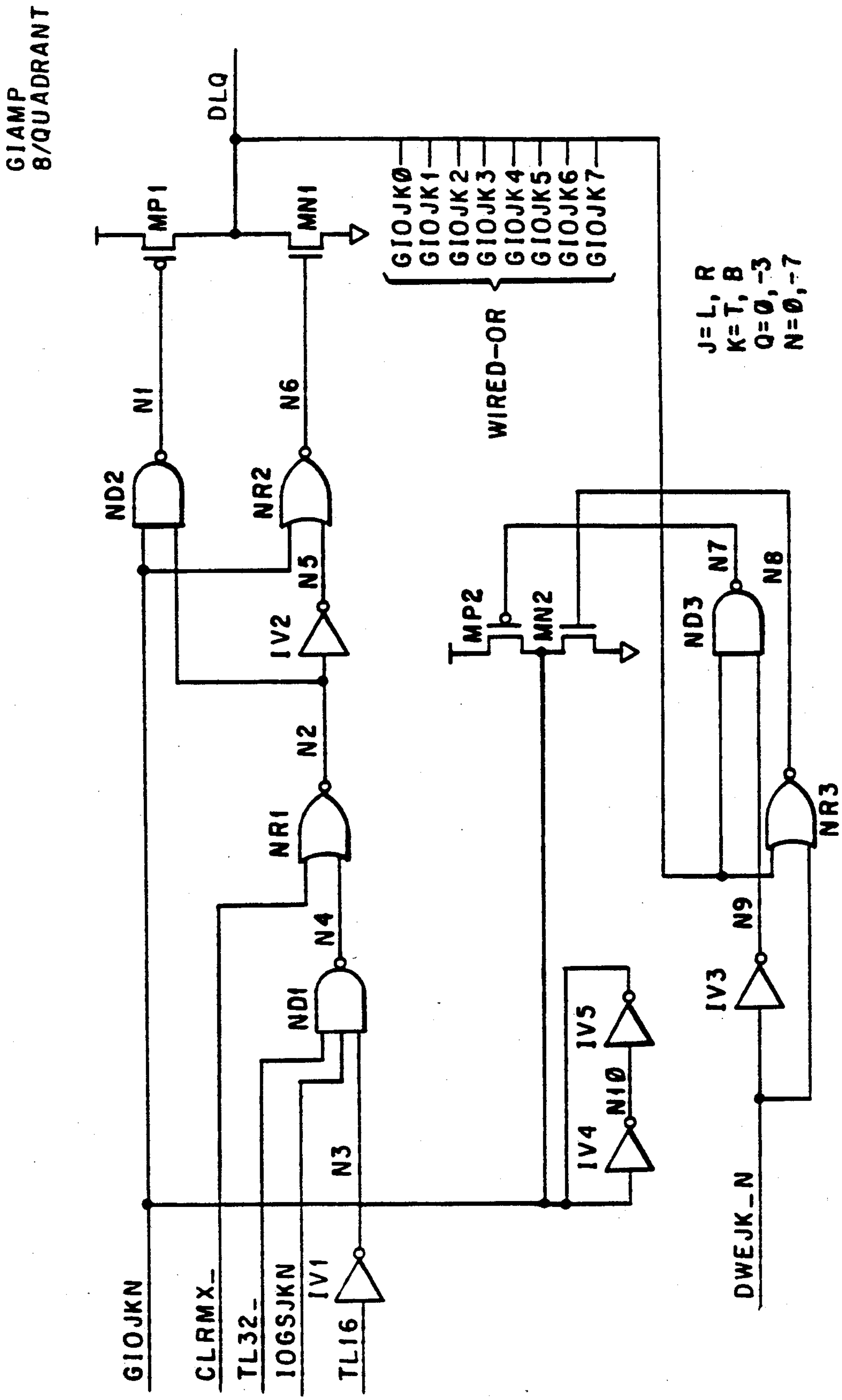

FIG. 56 illustrates the Global I/O Amplifier Circuit, GIAMP.

Figure 57:
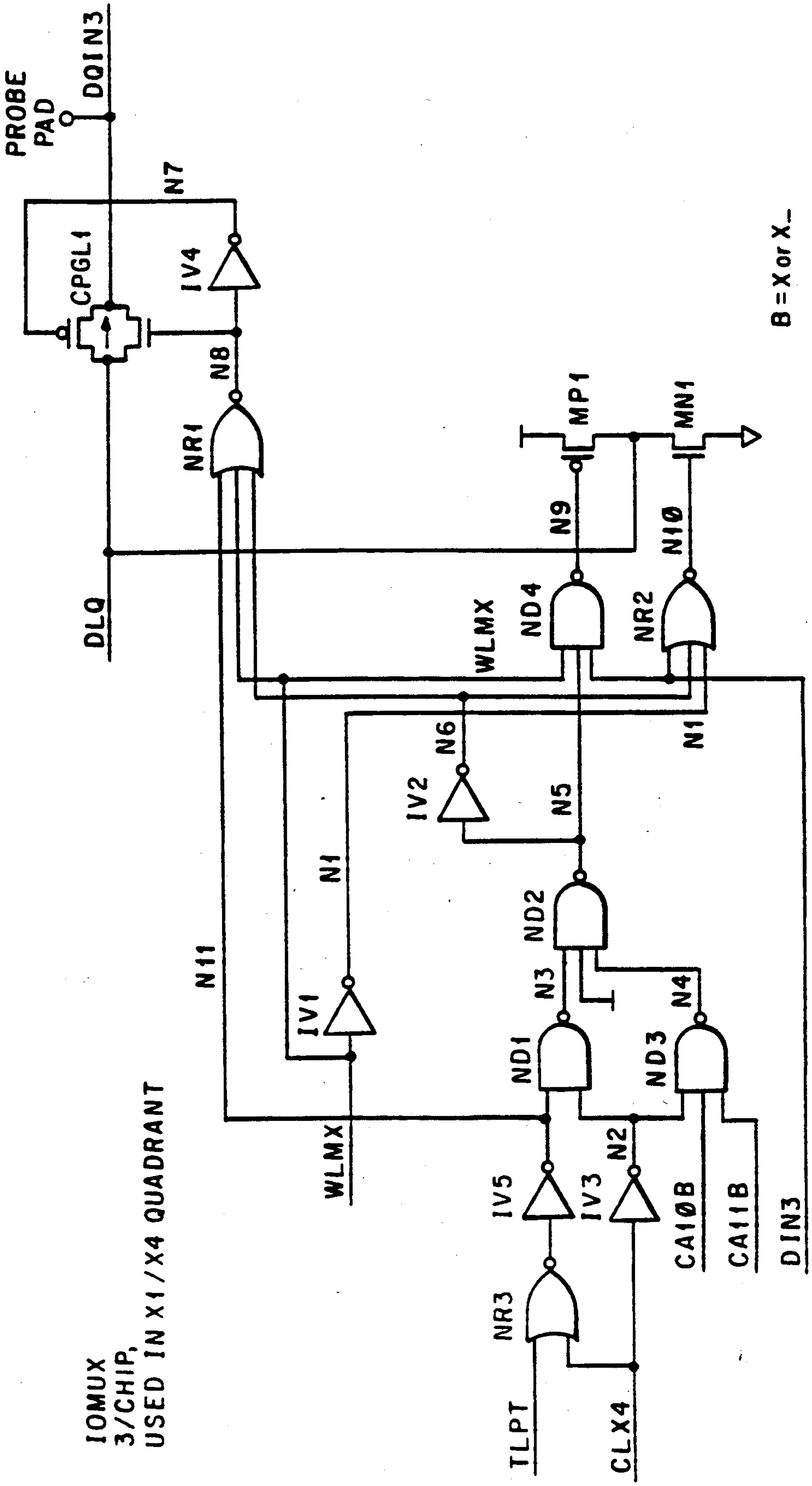

FIG. 57 illustrates the I/O Multiplexor Circuit, IOMUX.

Figure 58:
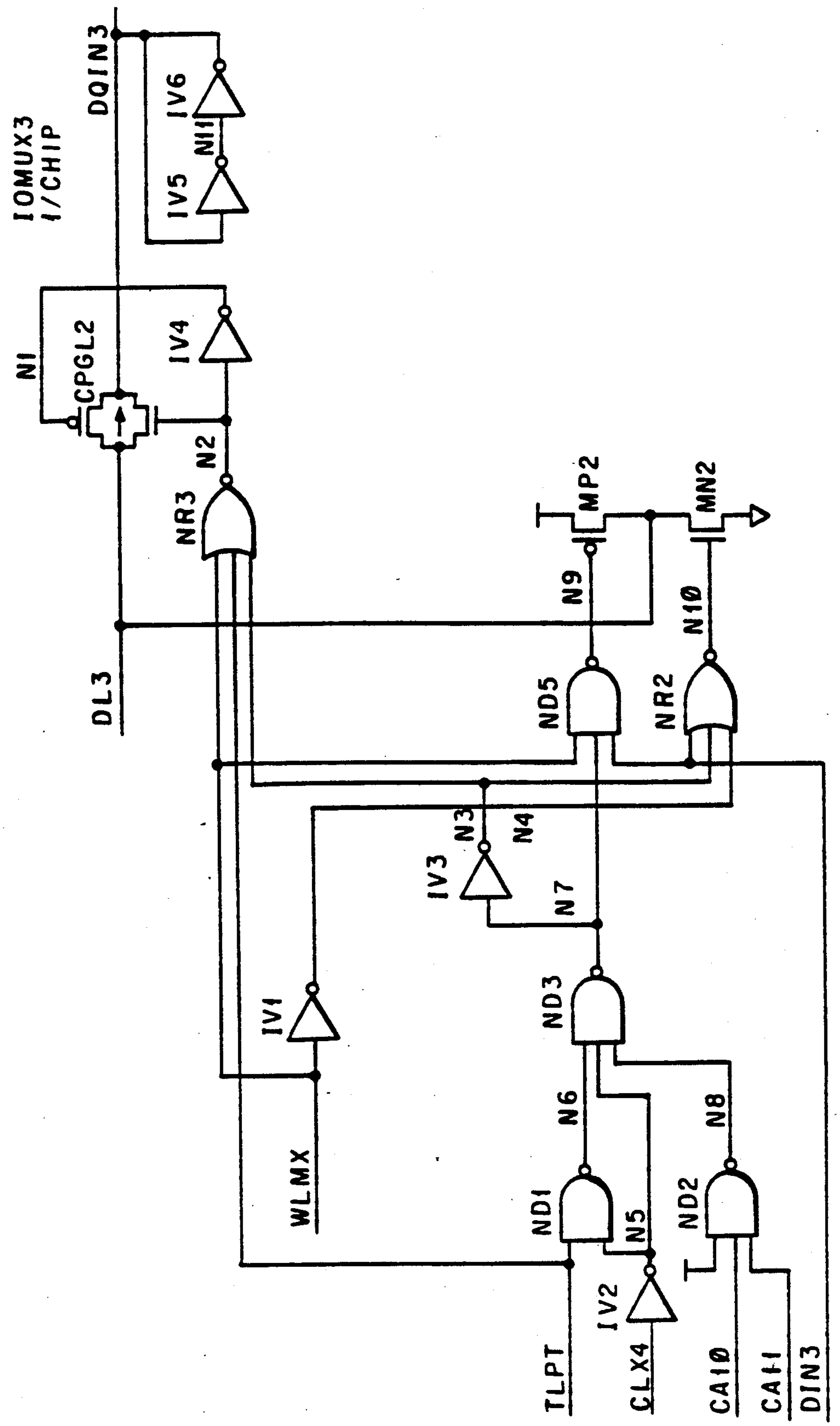

FIG. 58 illustrates the I/O Multiplexor 3 Circuit, IOMUX3.

Figure 59:
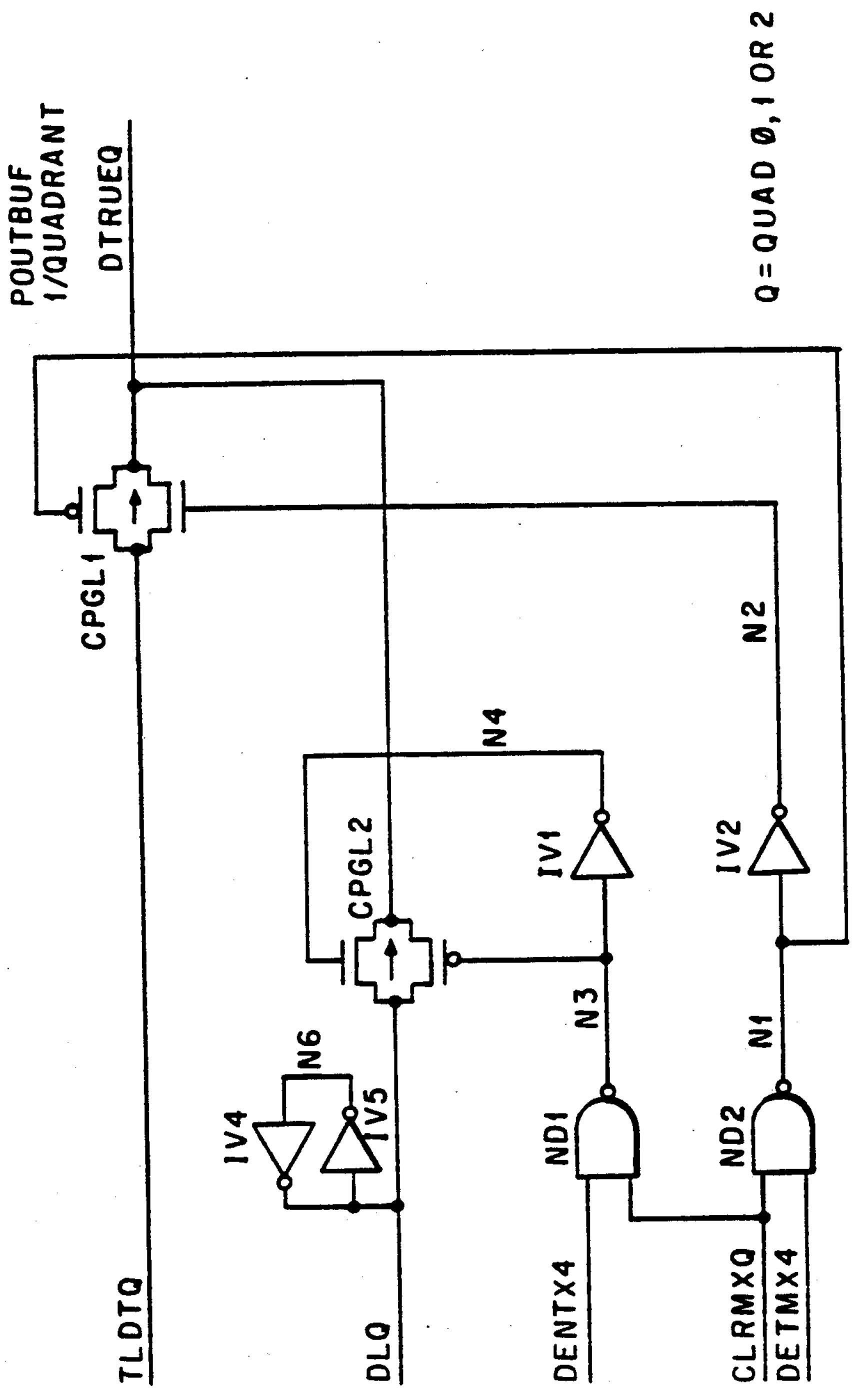

FIG. 59 illustrates the Pre-Output Buffer Circuit, POUTBUF.

FIG. 59.1 illustrates the Pre-Output Buffer 3, POUTBUF3.

Figure 60:
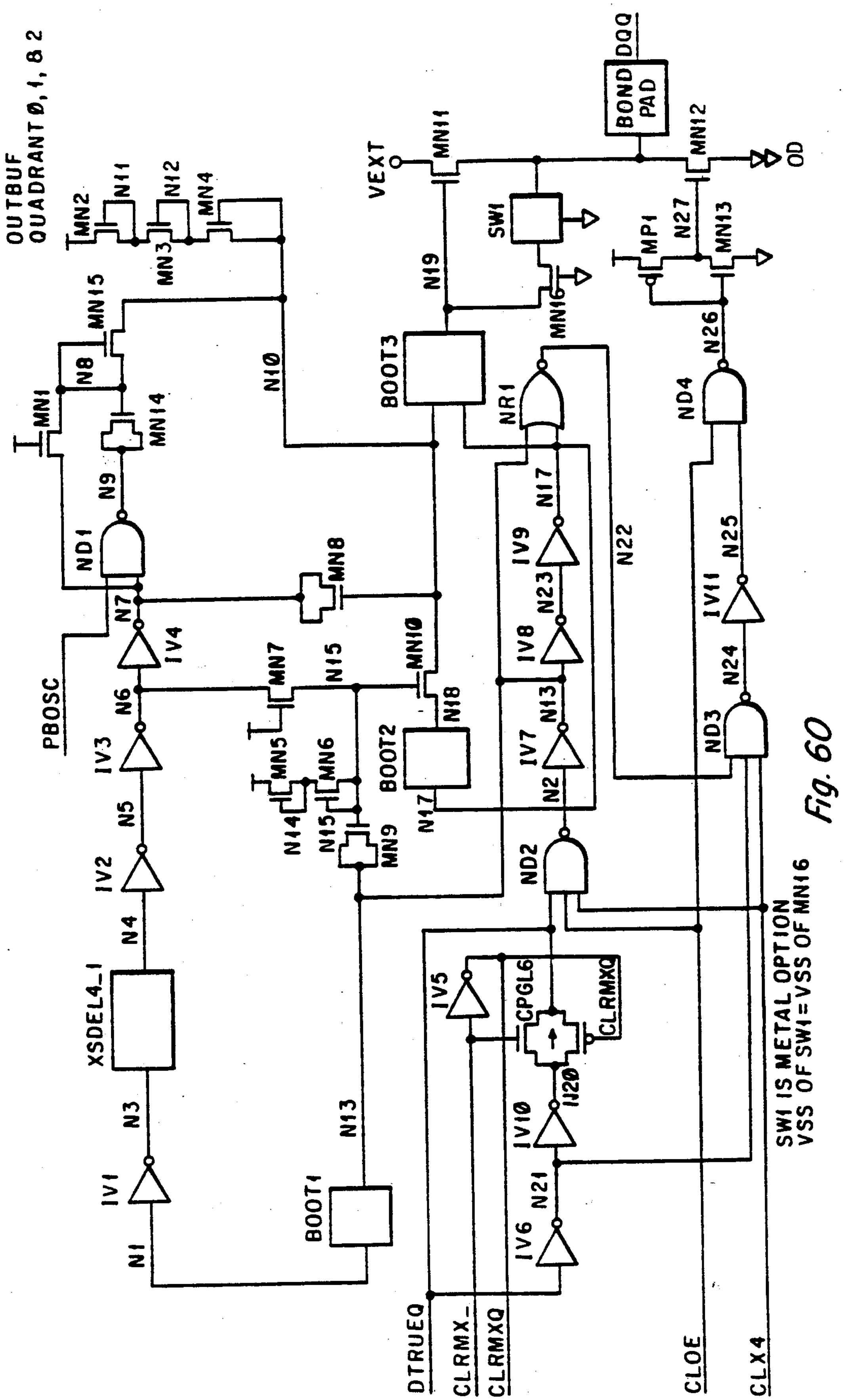

FIG. 60 illustrates the Output Buffer Circuit, OUTBUF.

FIG. 60.2 illustrates the Output Buffer 3 Circuit, OUTBUF3.

FIG. 60.3 illustrates WMO and CLX4 Generation.

Figure 61:
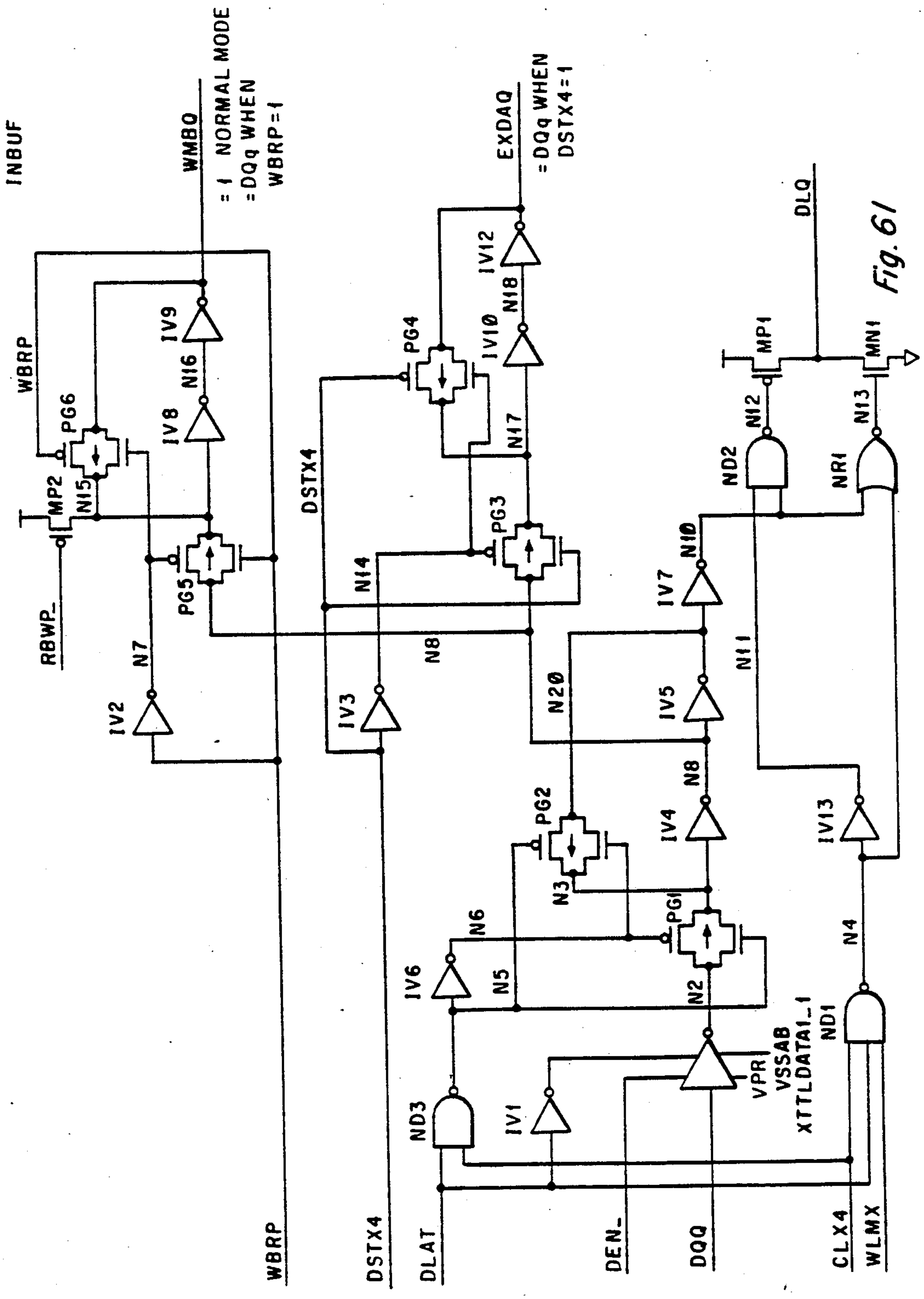

FIG. 61 illustrates the Input Buffer Circuit, INBUF.

Figure 62:
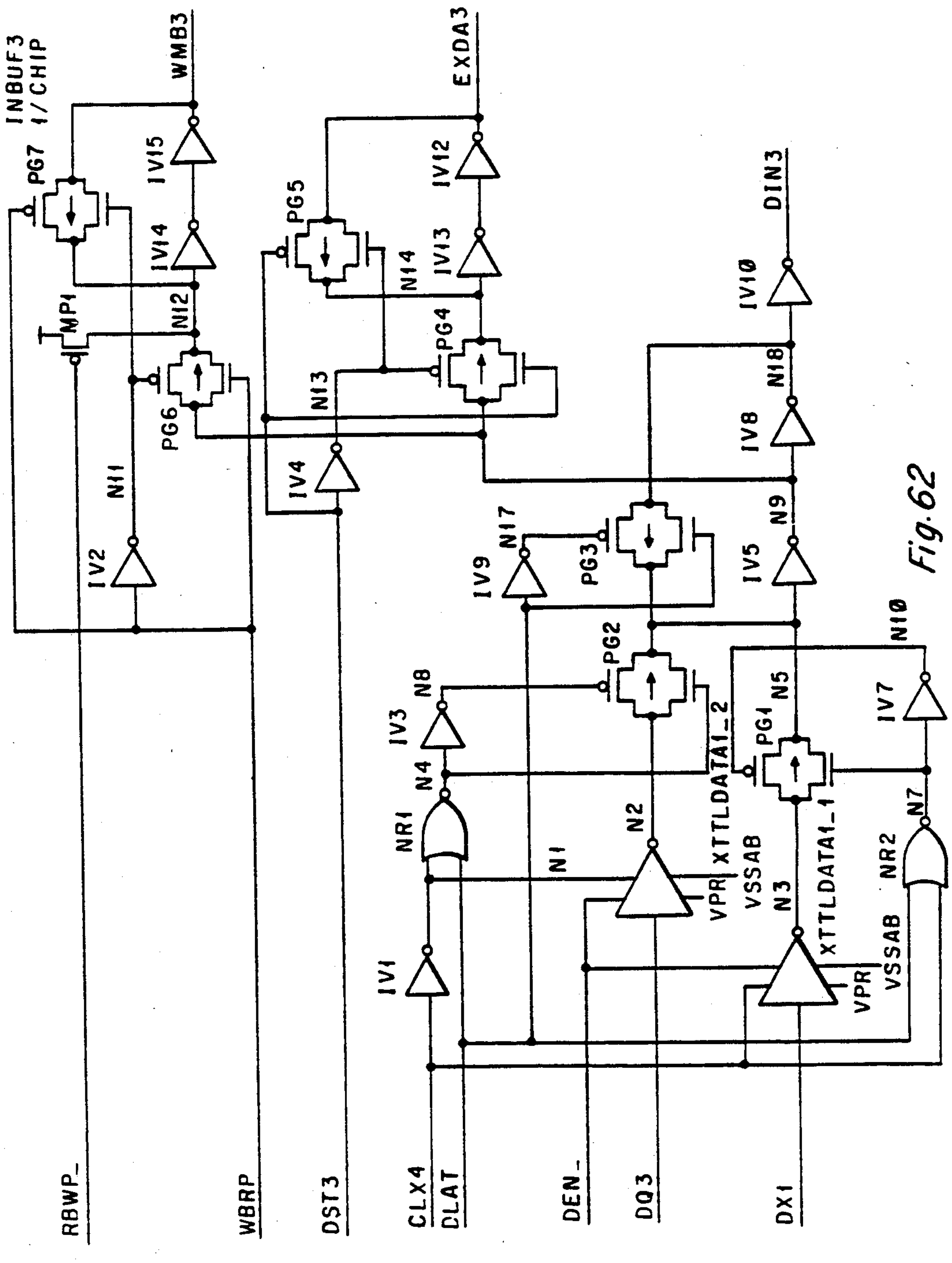

FIG. 62 illustrates the Input Buffer 3 Circuit, INBUf3.

Figure 63:
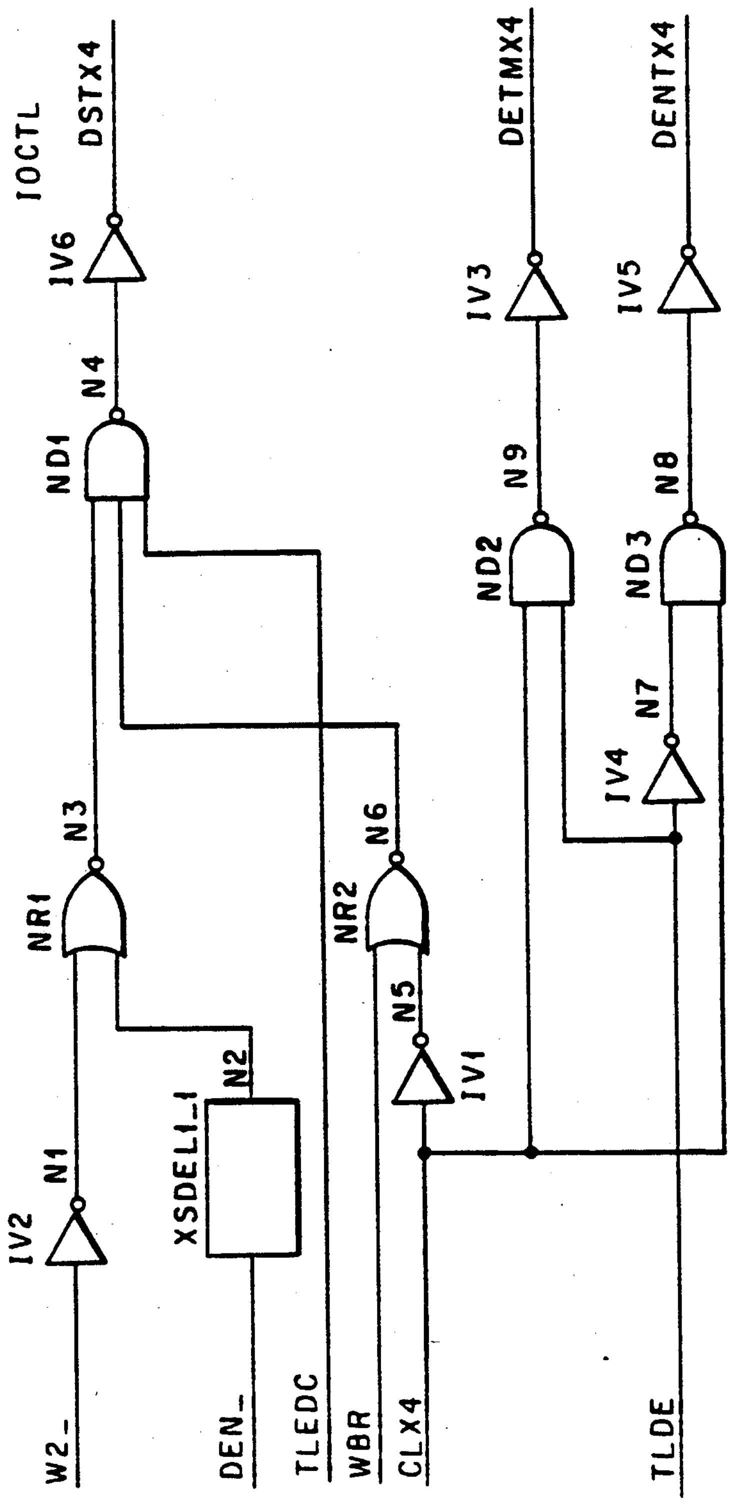

FIG. 63 illustrates the I/O Control Logic Circuit, IOCTL.

Figure 64:
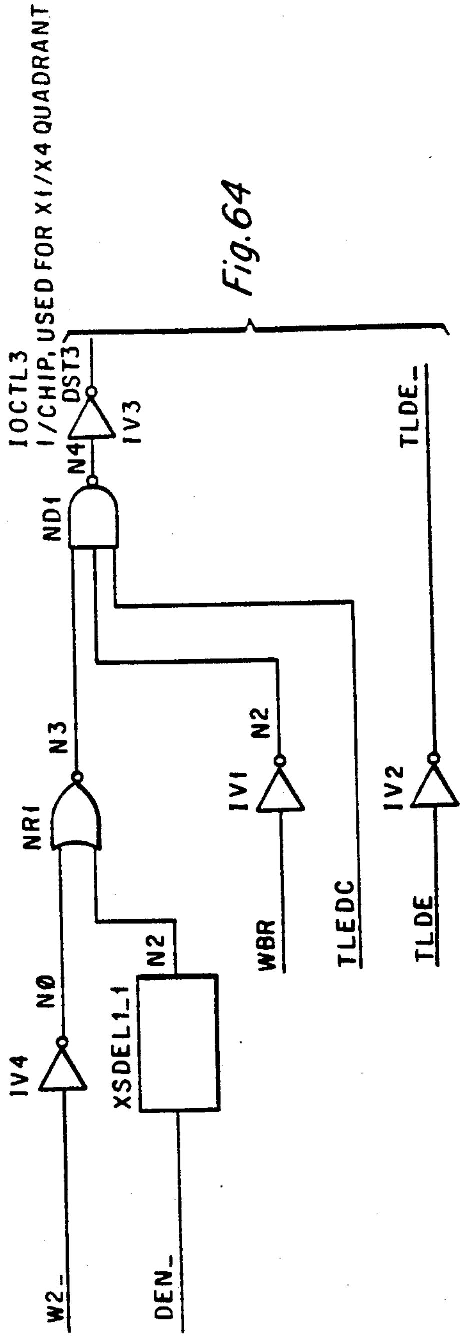

FIG. 64 illustrates the I/O Control Logic Circuit, IOCTL3.

Figure 65:
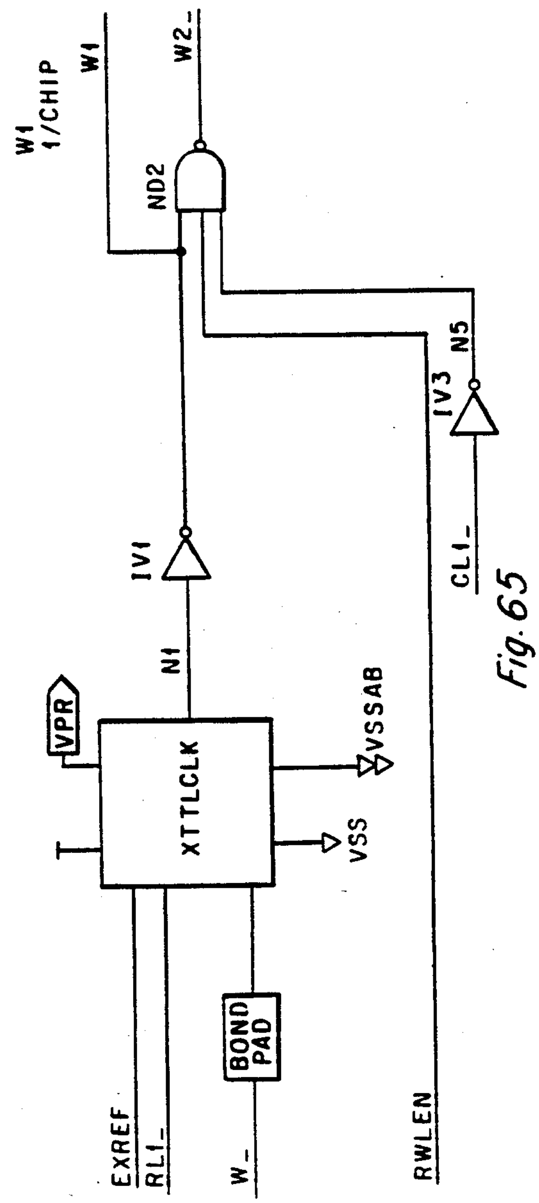

FIG. 65 illustrates the W1 or Write Clock 1 Circuit.

Figure 66:
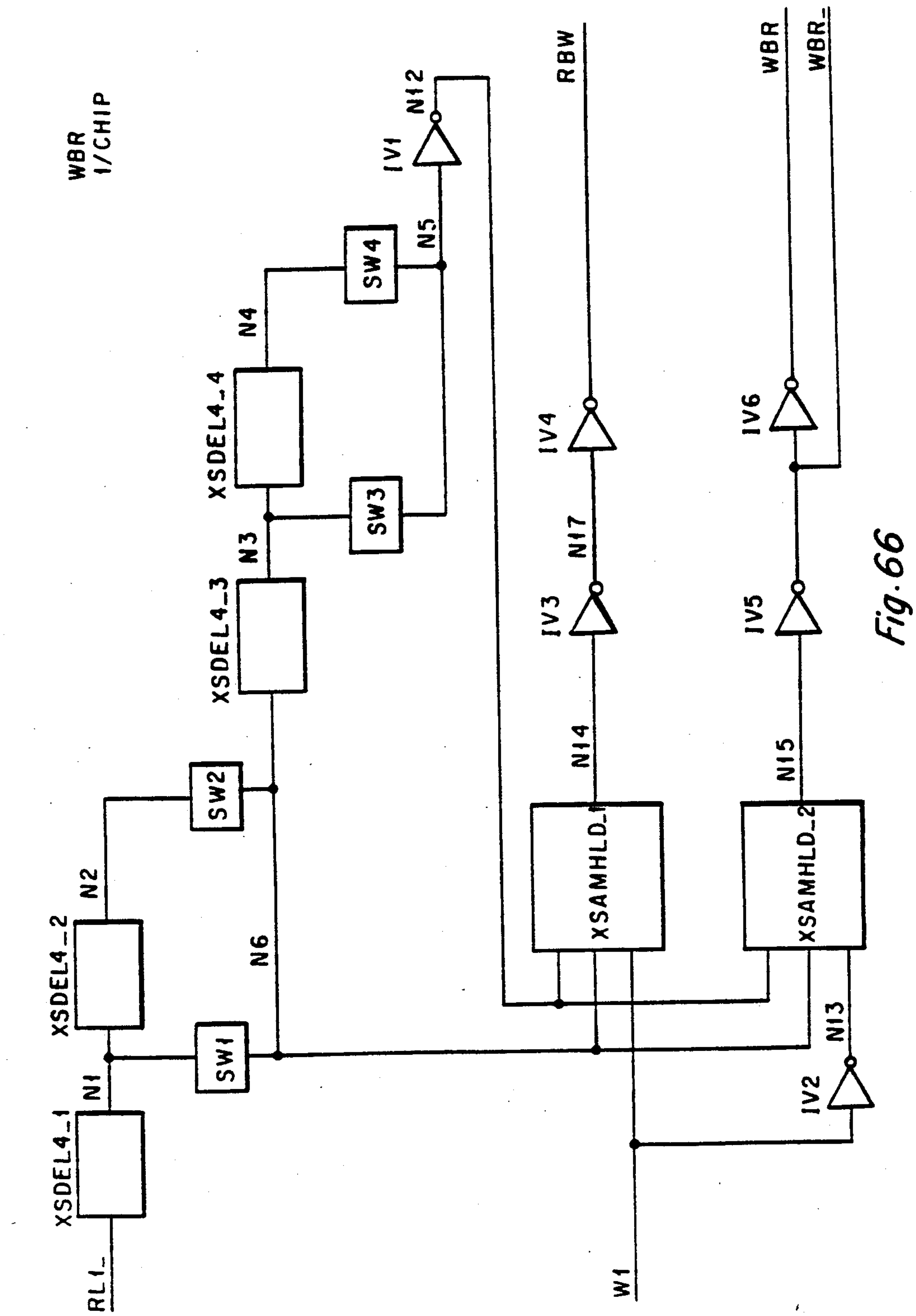

FIG. 66 illustrates the WBR or Write Before RAS Circuit.

Figure 67:
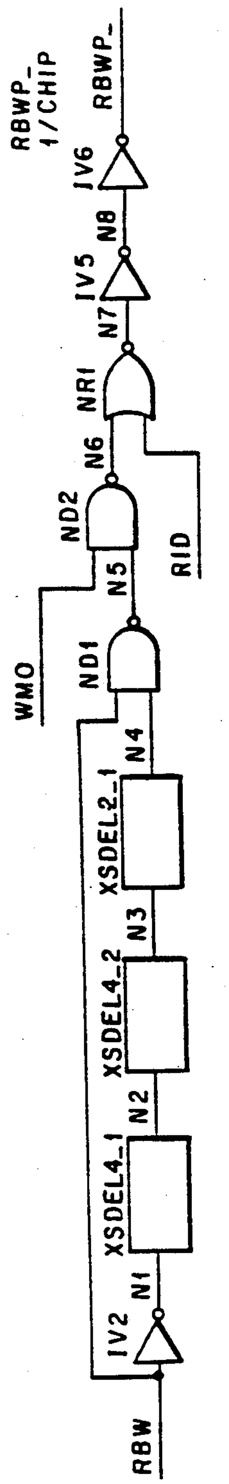

FIG. 67 illustrates the Read Before Write Pulse Circuit RBWP_.

Figure 68:
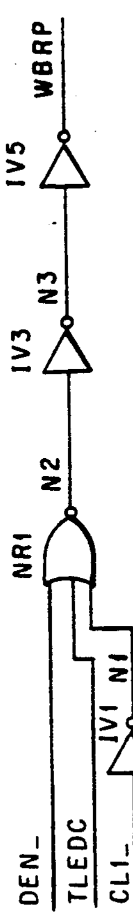

FIG. 68 illustrates the Write Before RAS Pulse Circuit WBRP.

Figure 69:
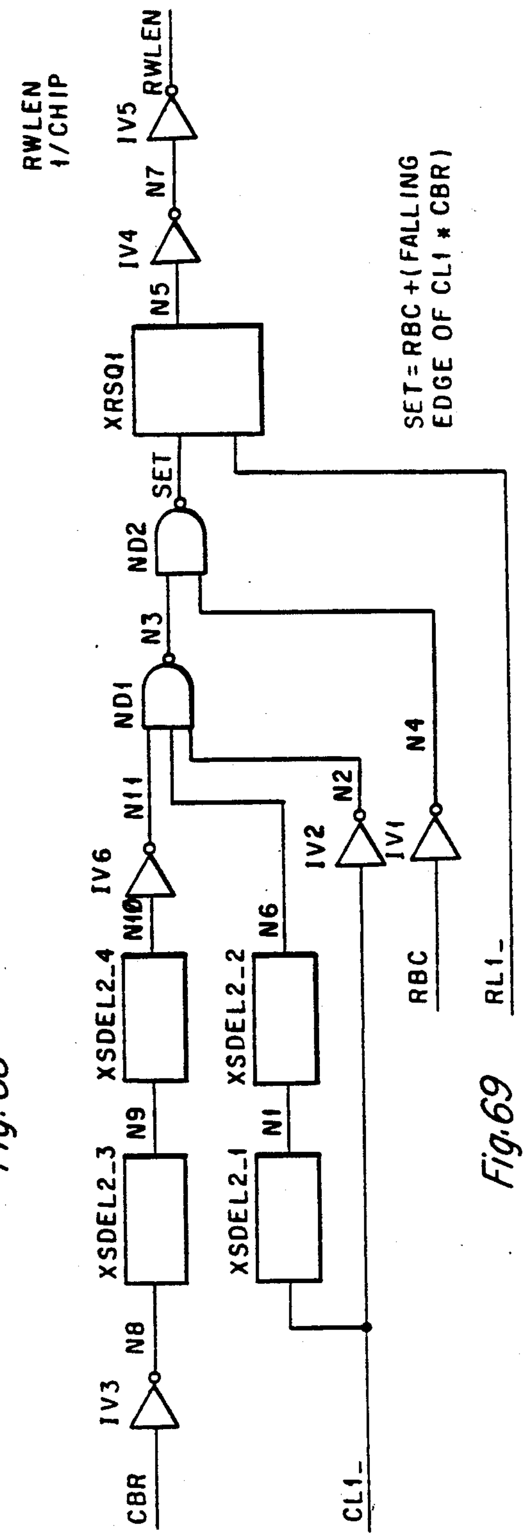
Figure 70:
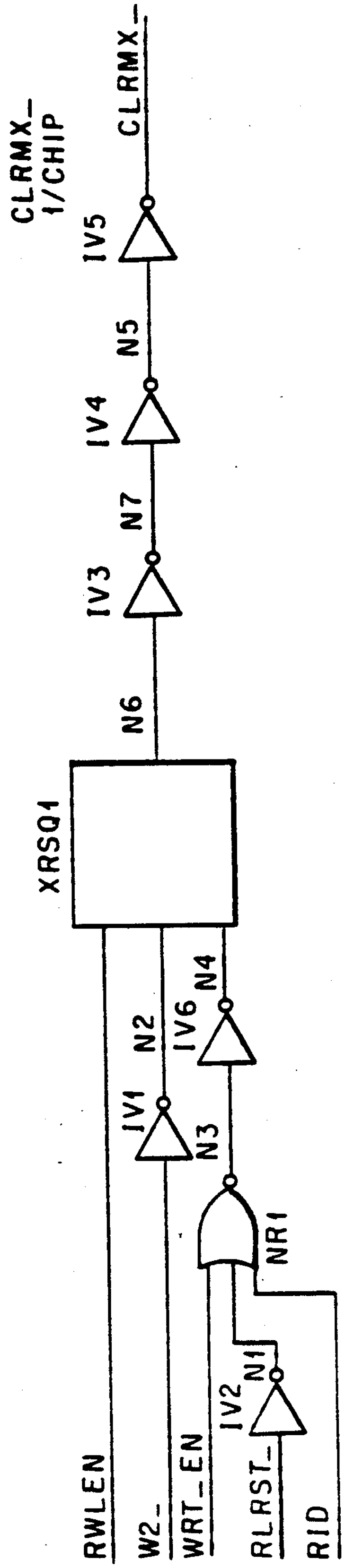

FIG. 69 illustrates the Read Write Logic Enable Circuit RWLEN. FIG. 70 illustrates the Control Logic Read Master Circuit CLRMX_.

Figure 71:
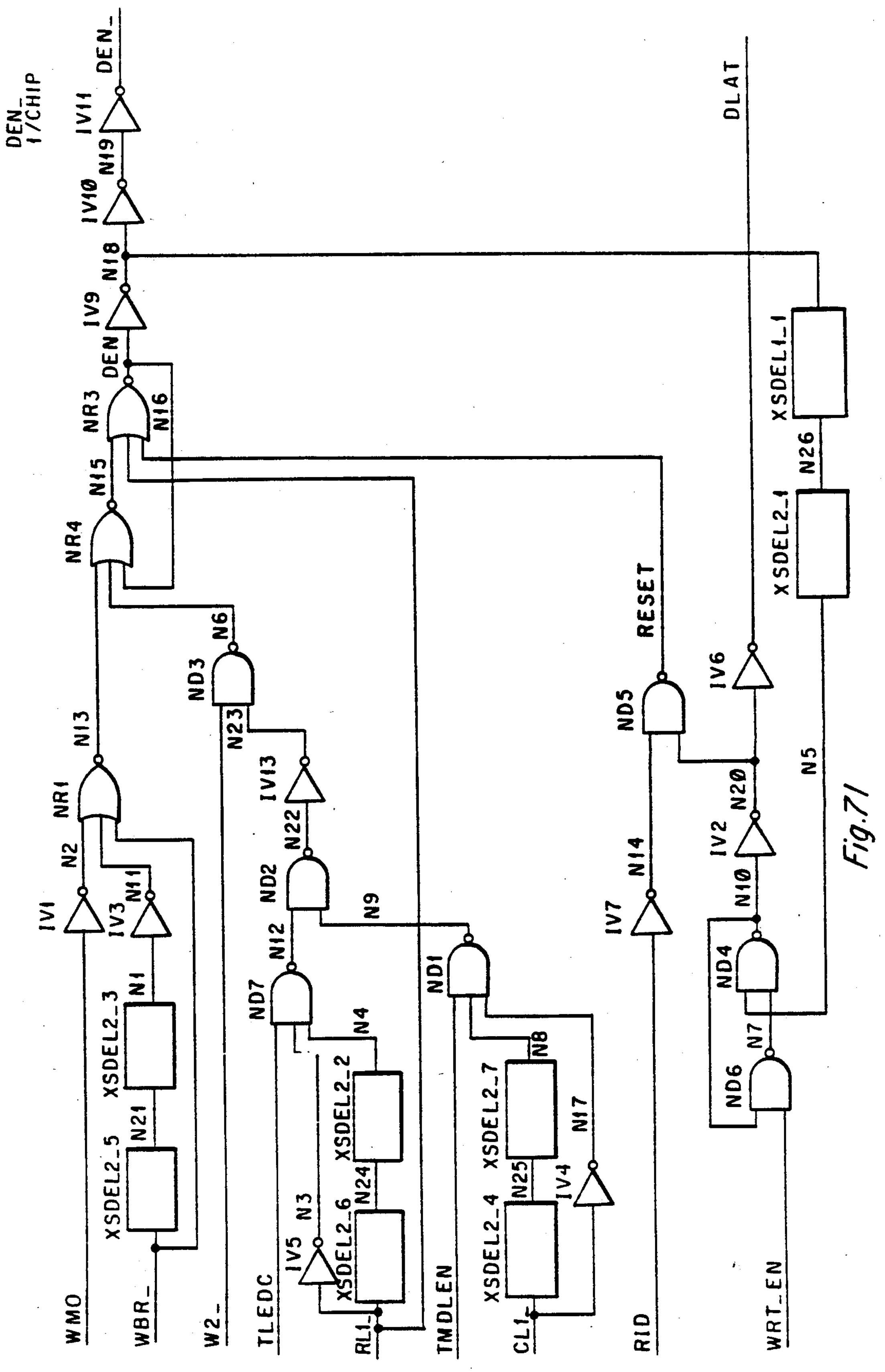

FIG. 71 illustrates the Data Enable Circuit DEN_.

Figure 72:
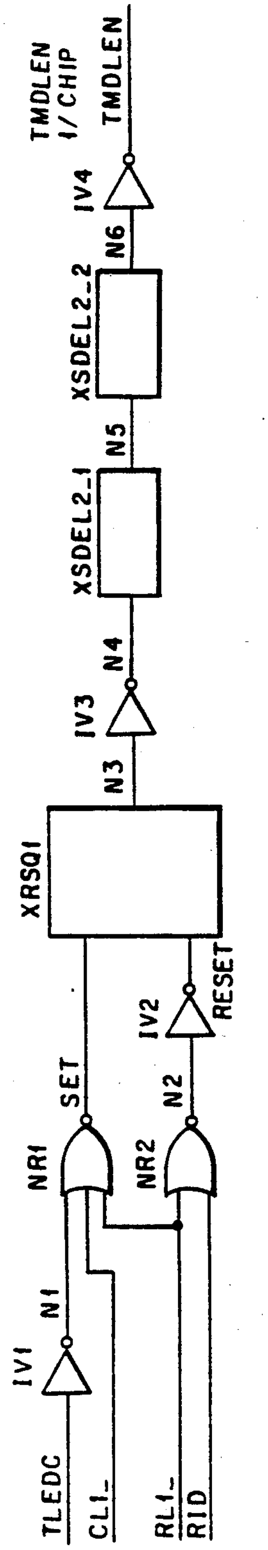

FIG. 72 illustrates the TMDLEN Circuit, or the Test Mode Data Enable Circuit.

Figure 73:
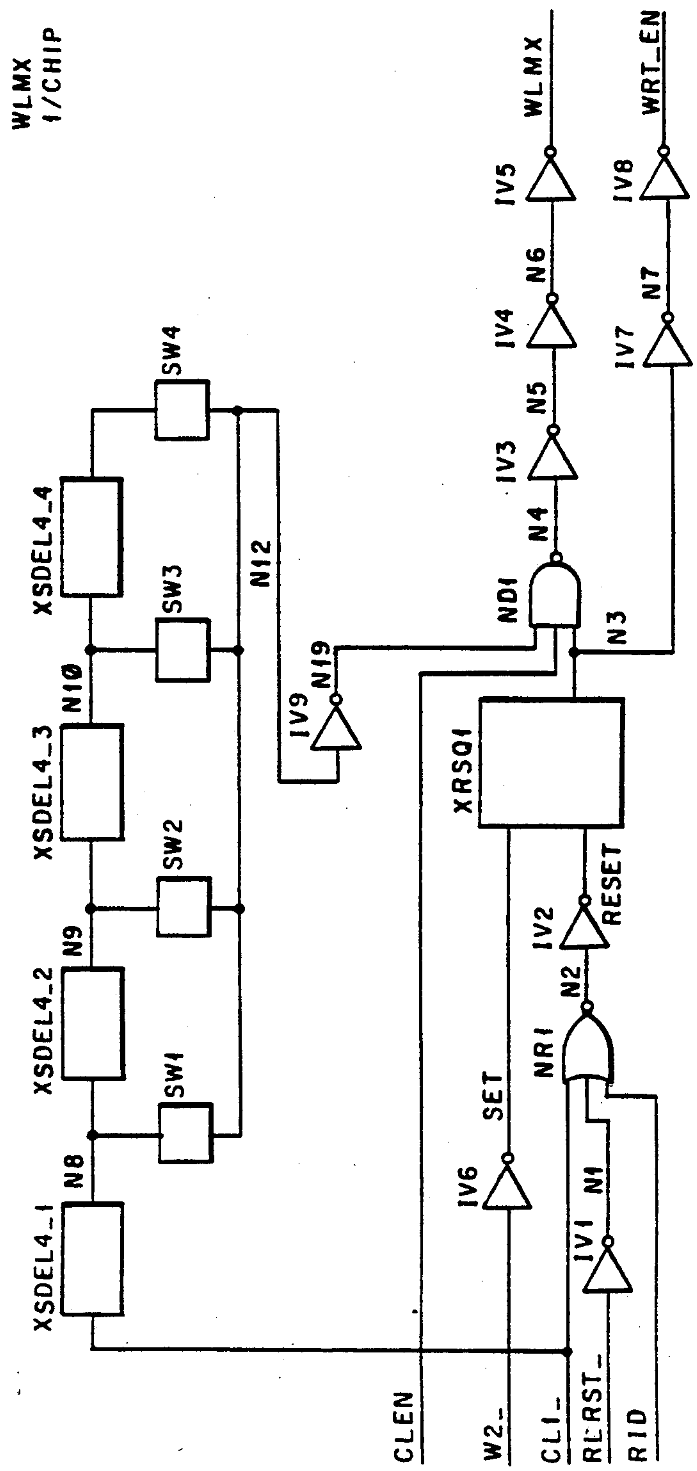

FIG. 73 illustrates the Write Logic Master Circuit WLMX.

Figure 74:
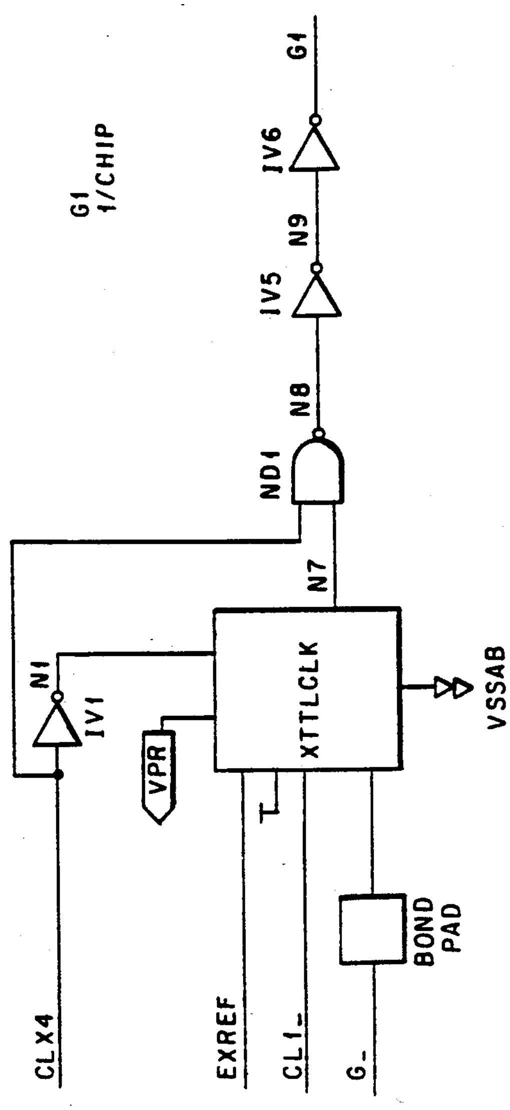

FIG. 74 illustrates the Internal Output Enable Clock 1 Circuit G1.

Figure 75:
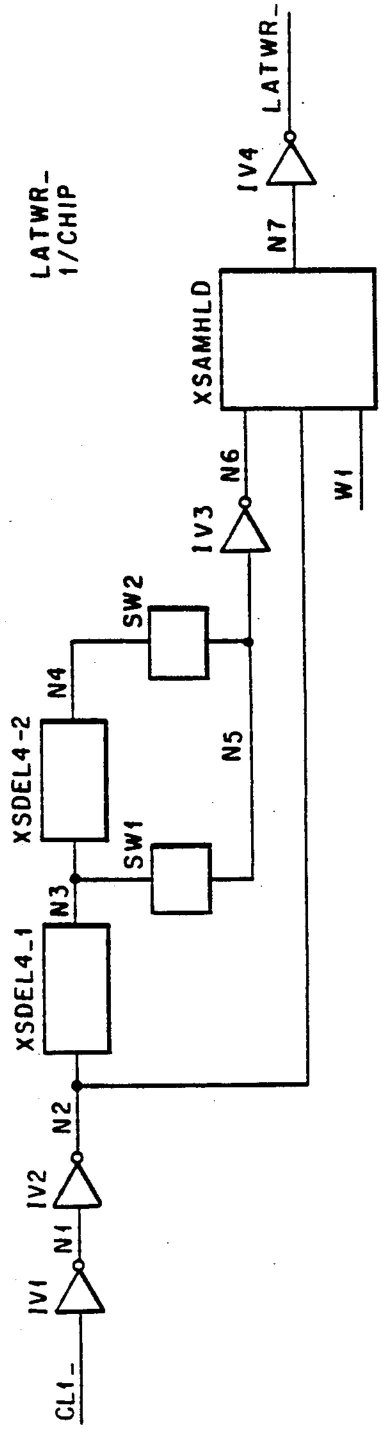

FIG. 75 illustrates the Early Write Circuit LATWR_.

Figure 76:
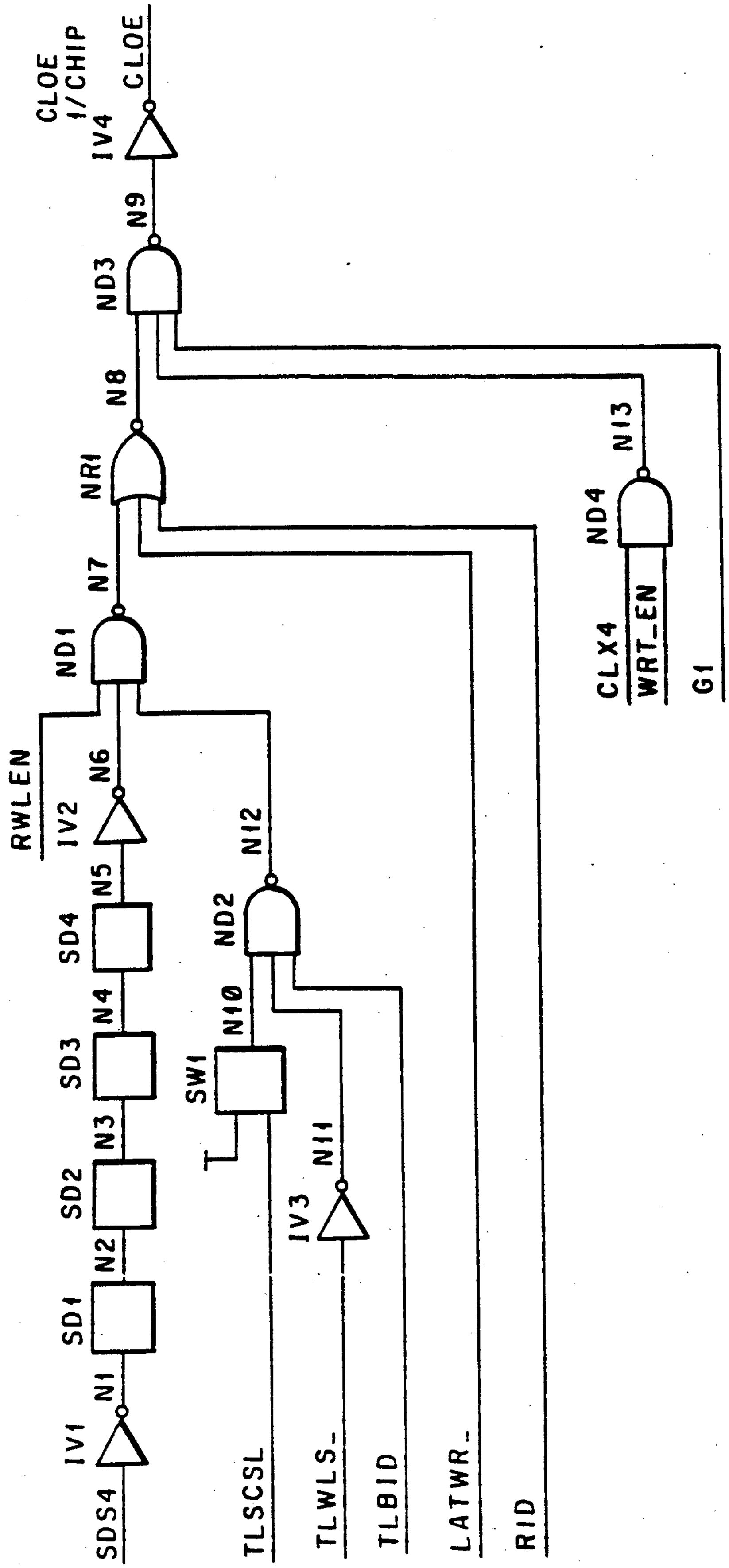

FIG. 76 illustrates the Control Logic Output Enables Circuit CLOE.

Figure 77:
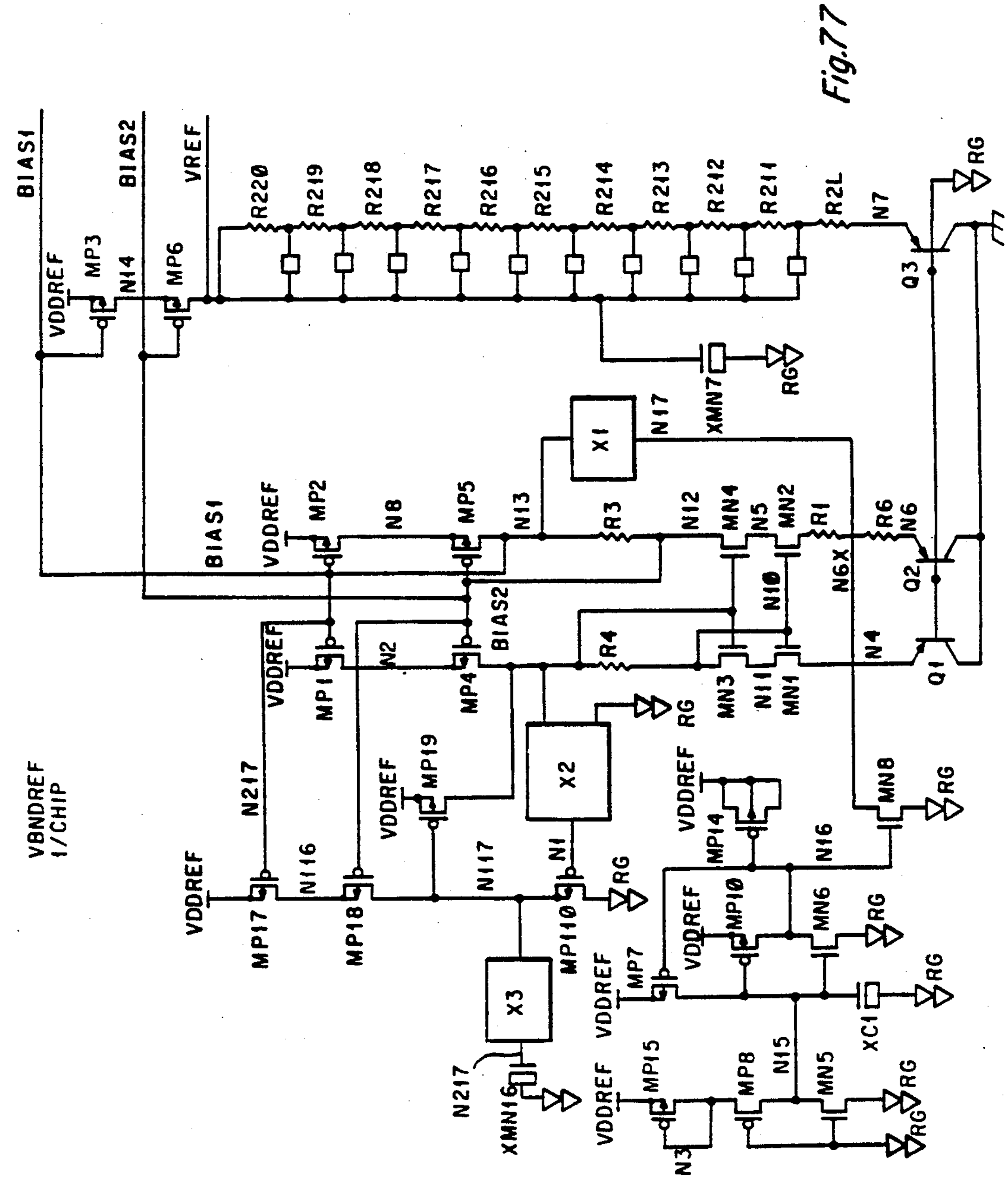

FIG. 77 illustrates the Voltage Bandgap Reference Generator Circuit VBNDREF.

Figure 78:
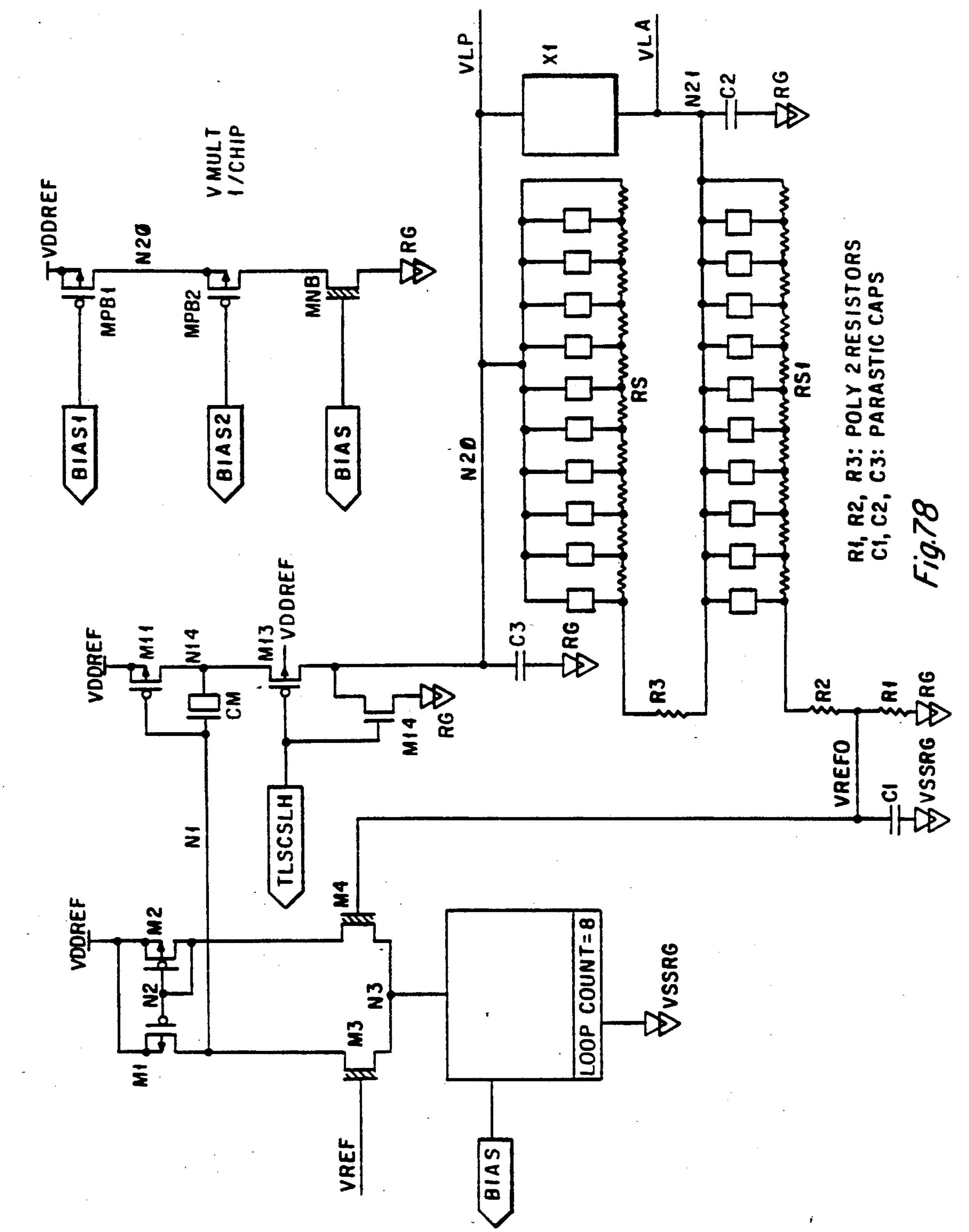

FIG. 78 illustrates the Voltage Multiplier Circuit VMULT.

Figure 79:
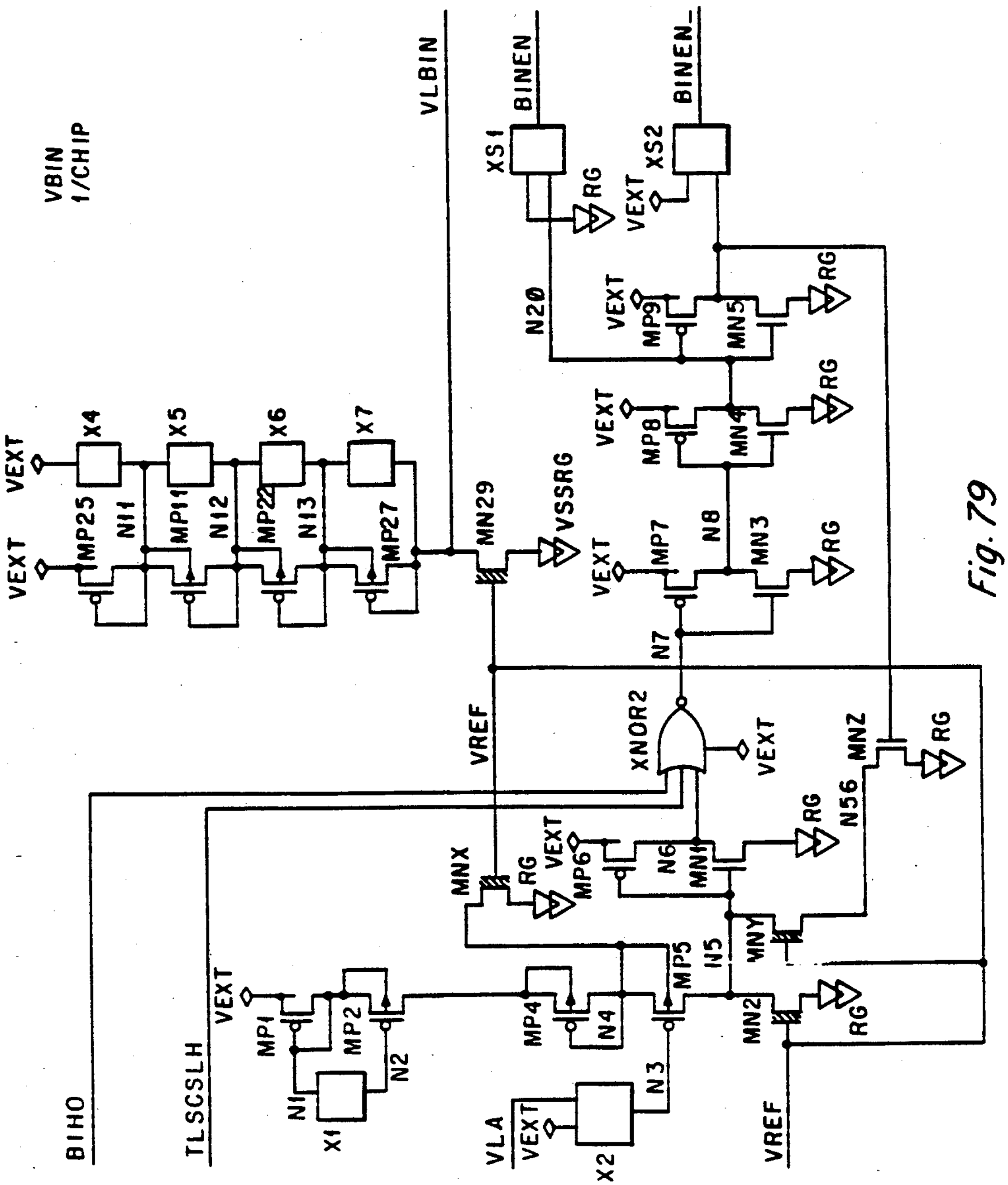

FIG. 79 illustrates the Voltage Burn In Circuit VBIN.

Figure 80:
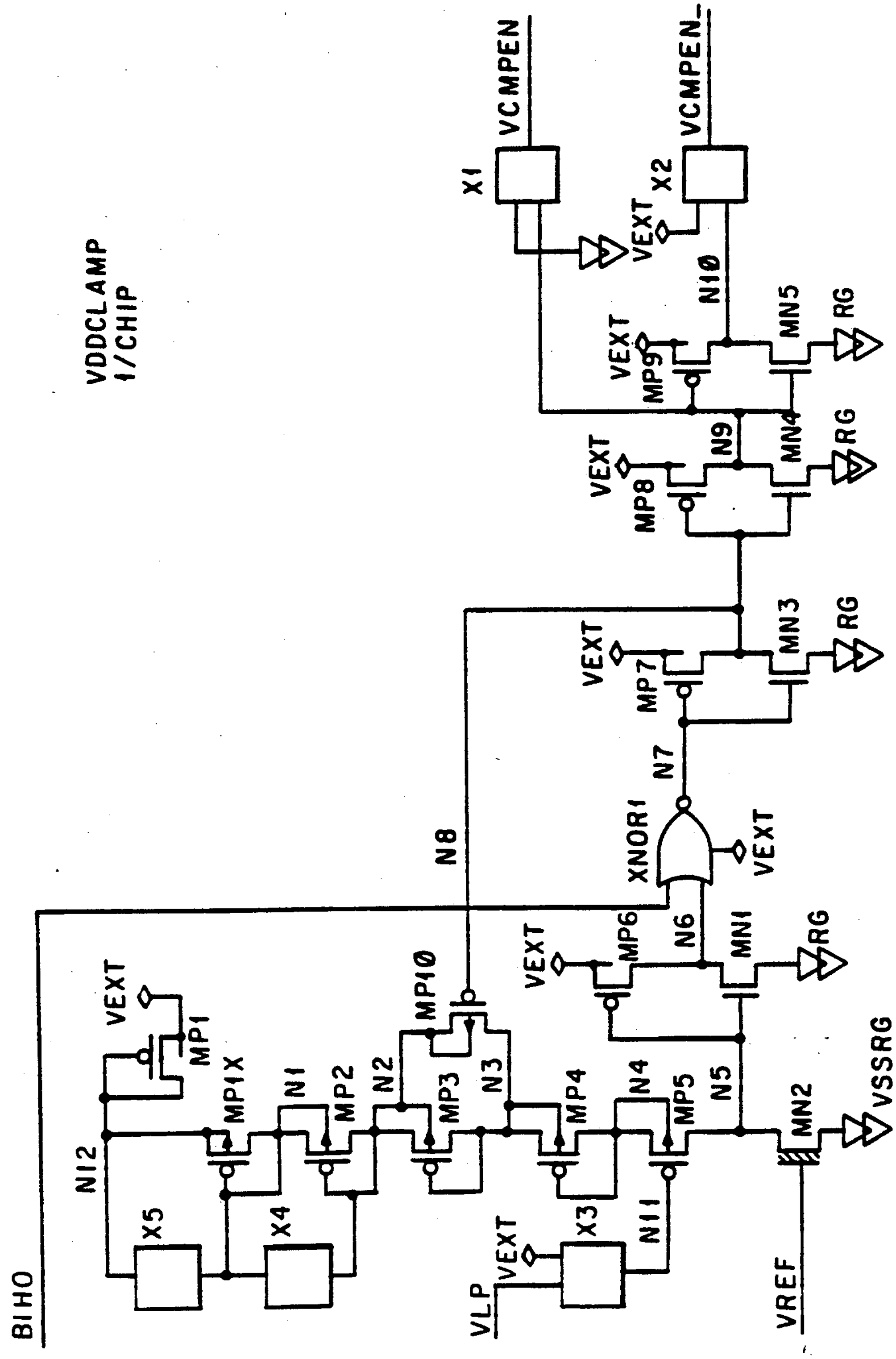

FIG. 80 illustrates the VDD Clamp Circuit VDDCLAMP.

FIG. 80.1 illustrates the Voltage Clamp Circuit VCLMP.

Figure 81:
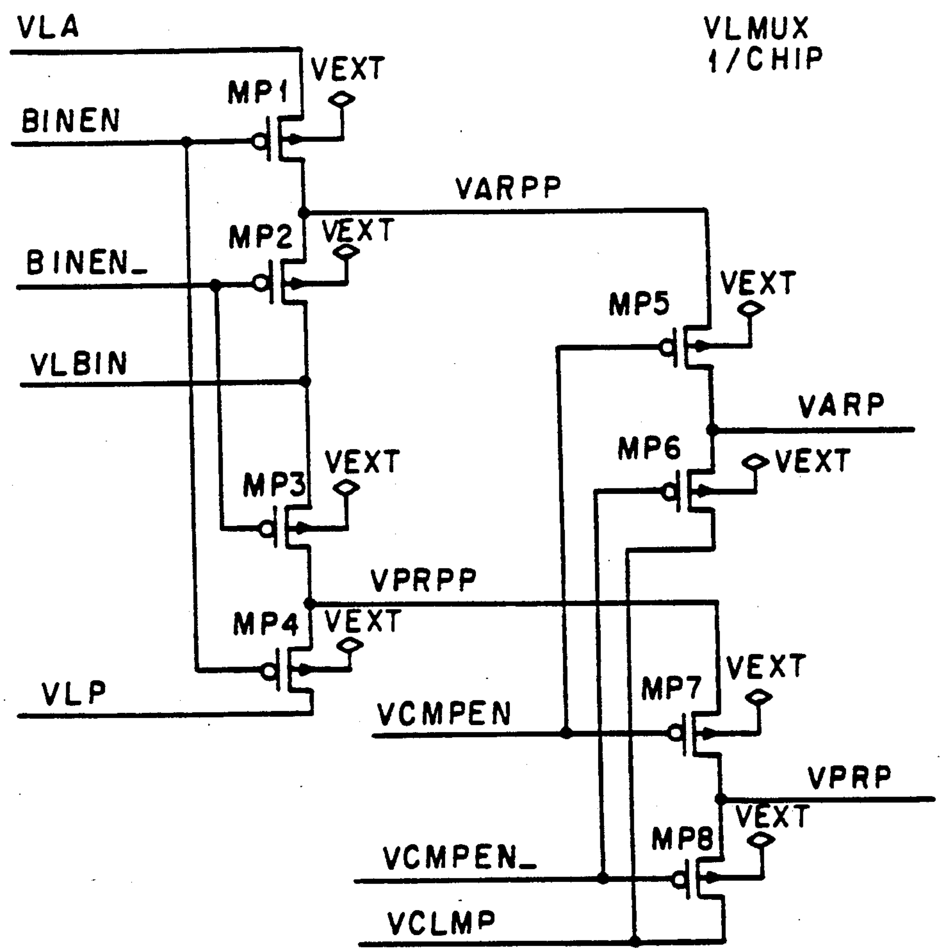

FIG. 81 illustrates the Voltage Level Multiplier VLMUX.

Figure 82:
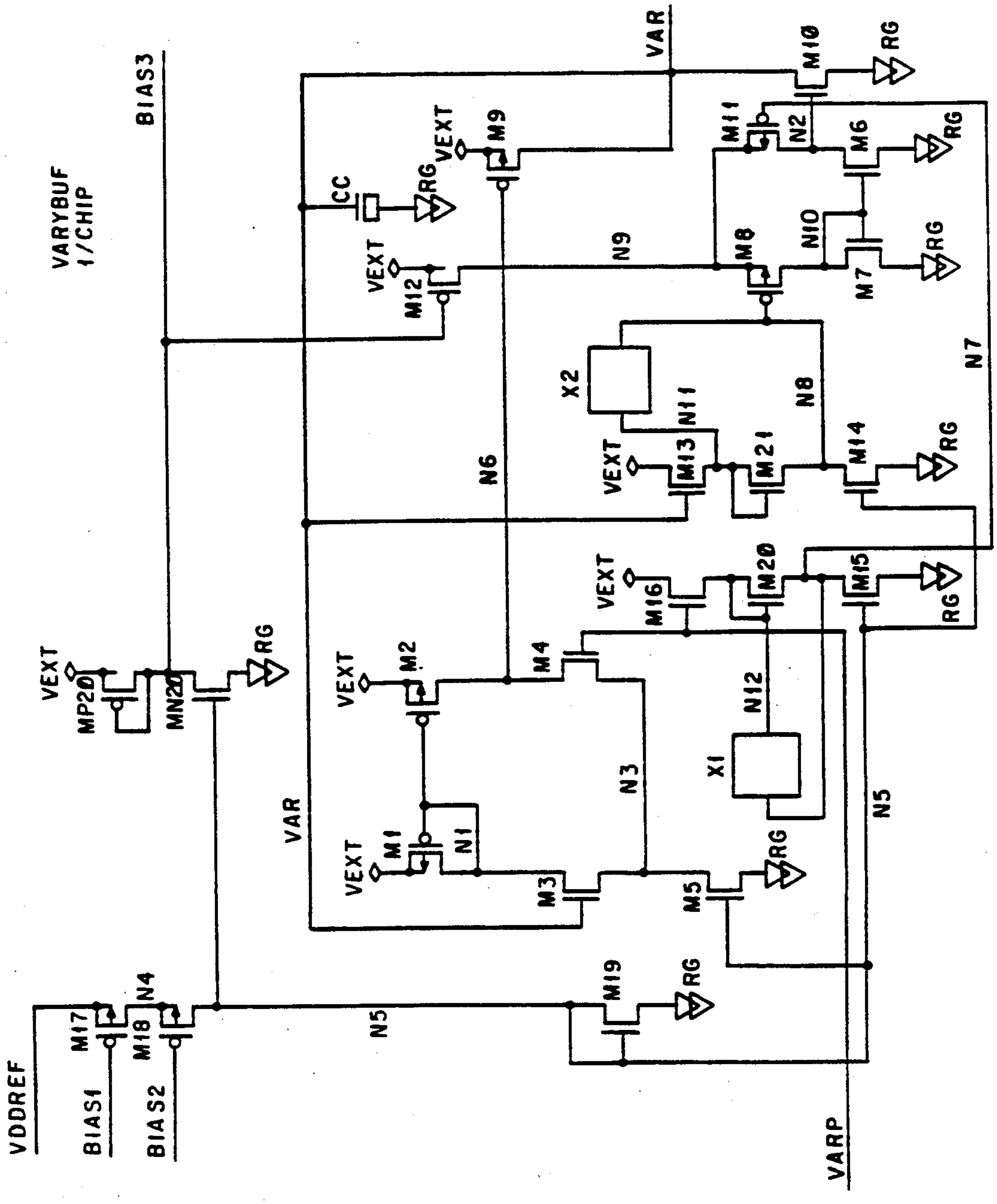

FIG. 82 illustrates the Voltage Array Buffer Circuit VARYBUF.

Figure 83:
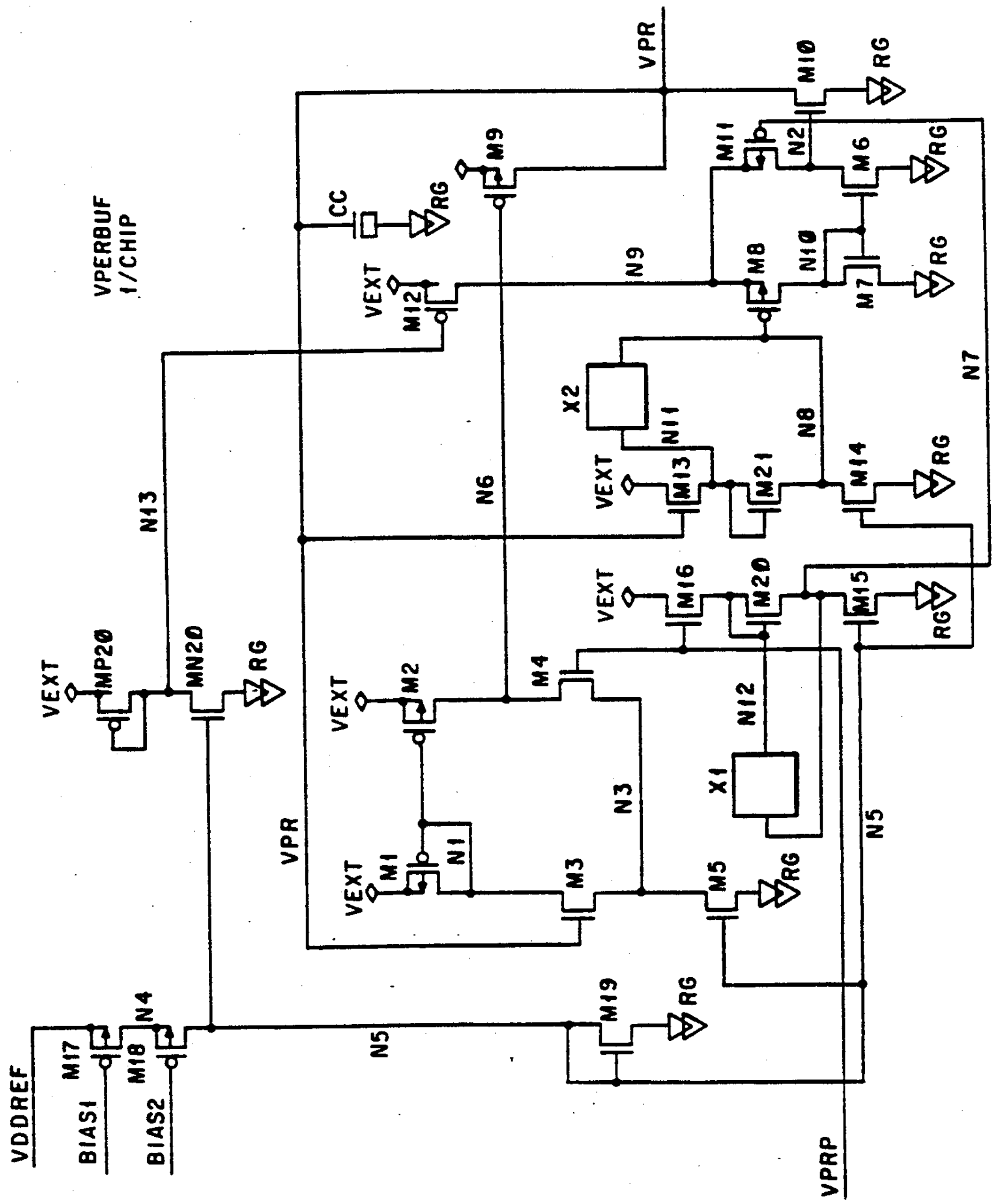

FIG. 83 illustrates the Voltage Periphery Buffer Circuit VPERBUF.

Figure 84:
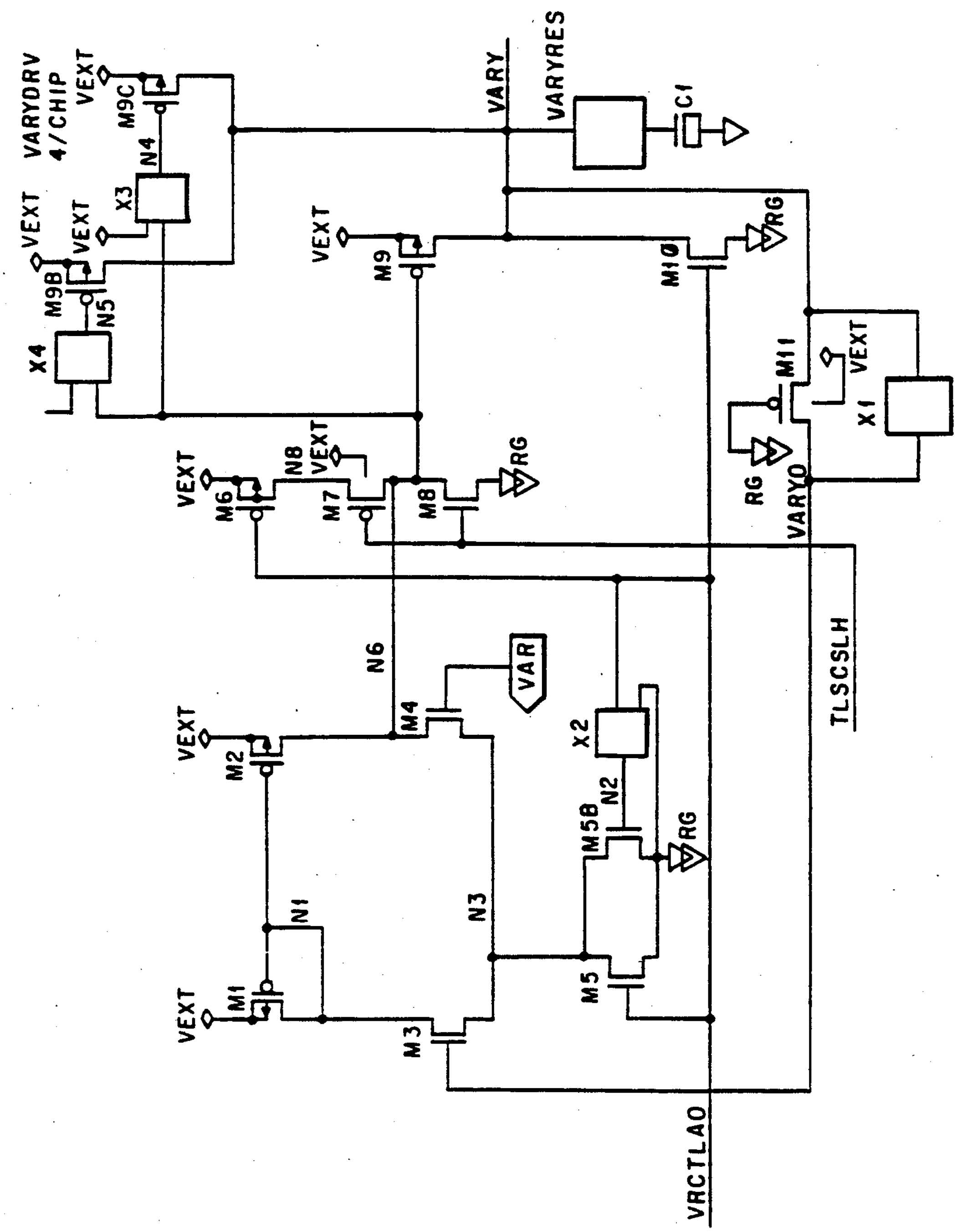

FIG. 84 illustrates the Voltage Array Driver Circuit VARYDRV.

Figure 85:
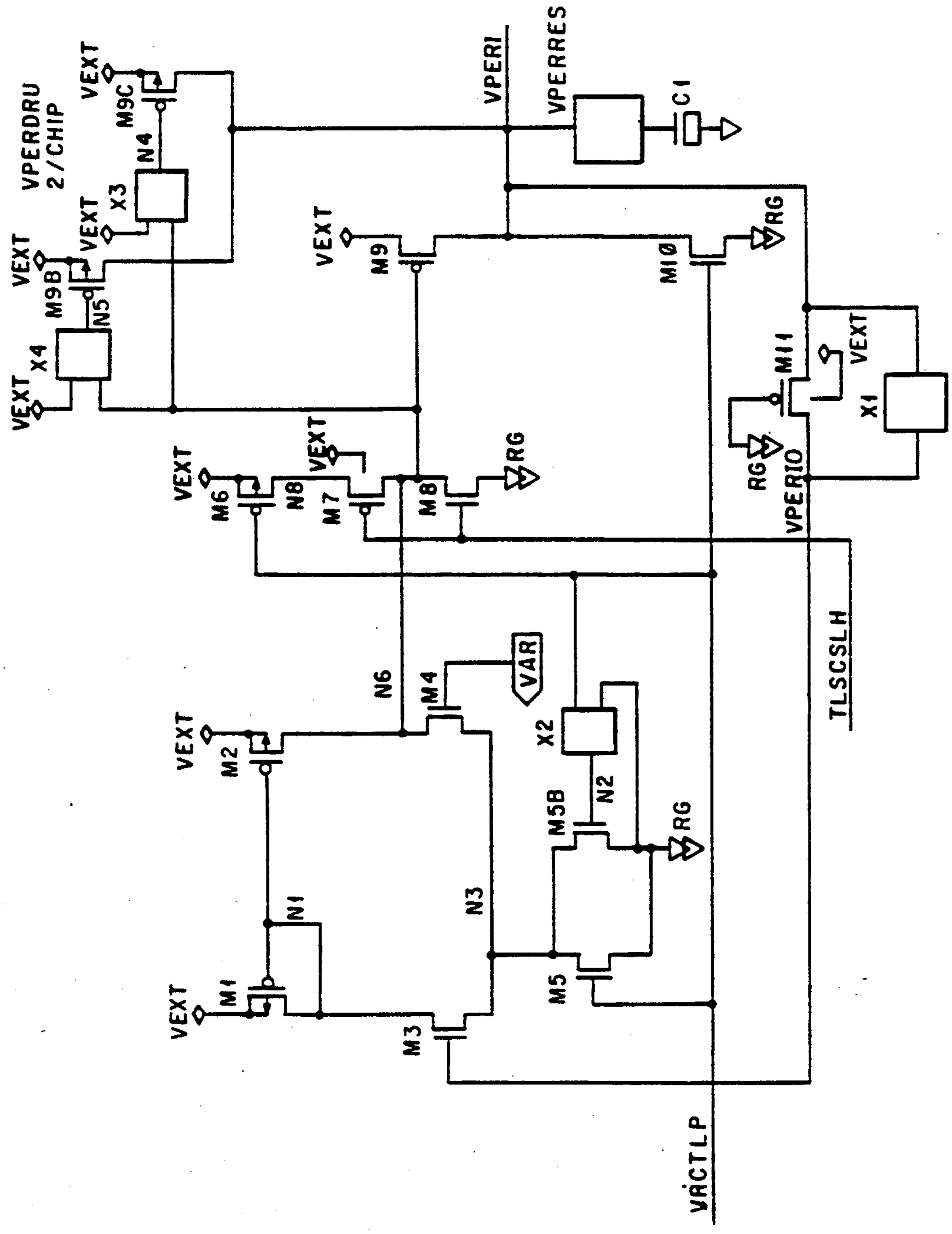

FIG. 85 illustrates the Voltage Periphery Driver Circuit VPERDRV.

Figure 86:
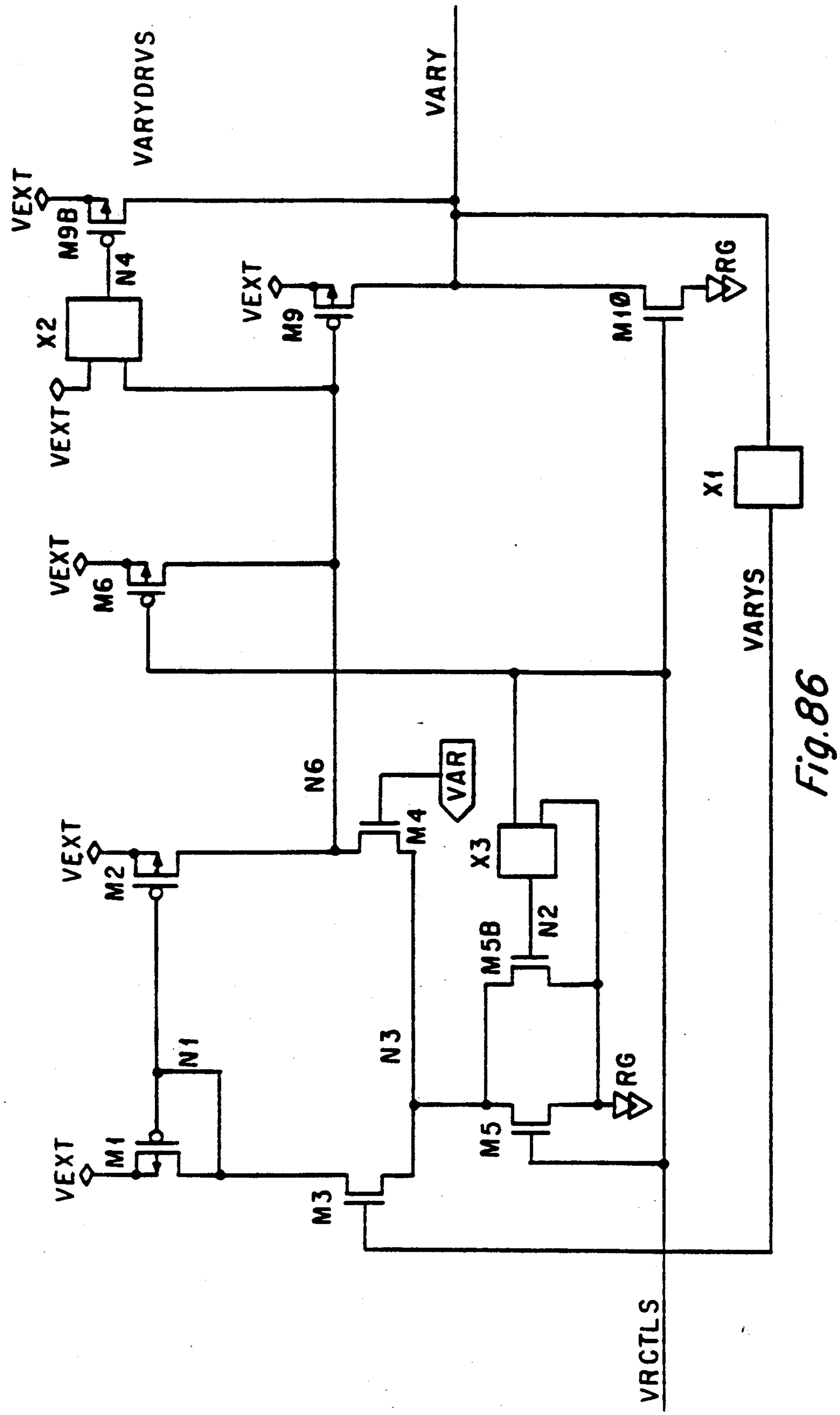

FIG. 86 illustrates the Voltage Array Driver Standby Circuit VARYDRVS.

Figure 87:
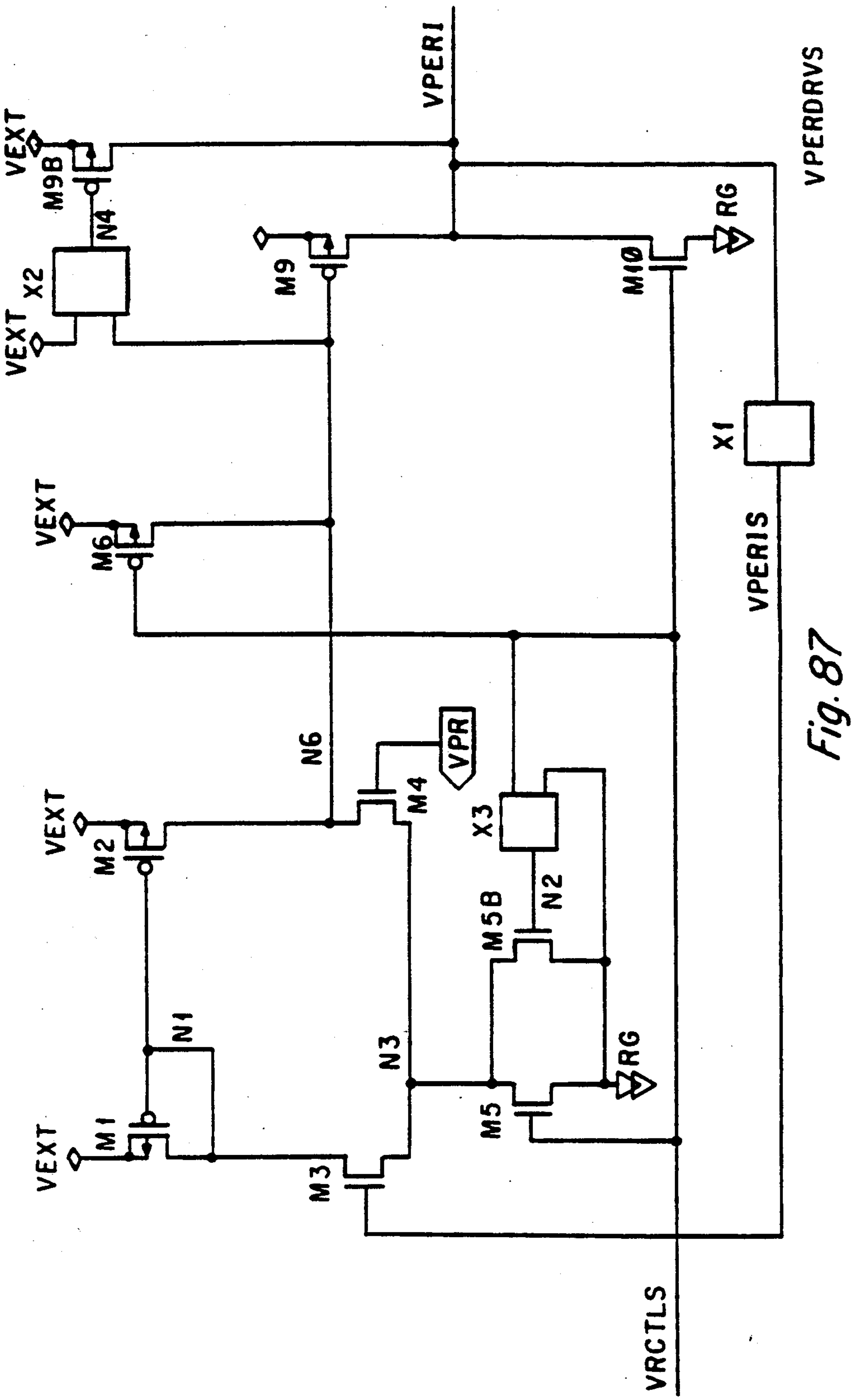

FIG. 87 illustrates the Voltage Periphery Driver Standby Circuit VPERDRVS.

Figure 88:
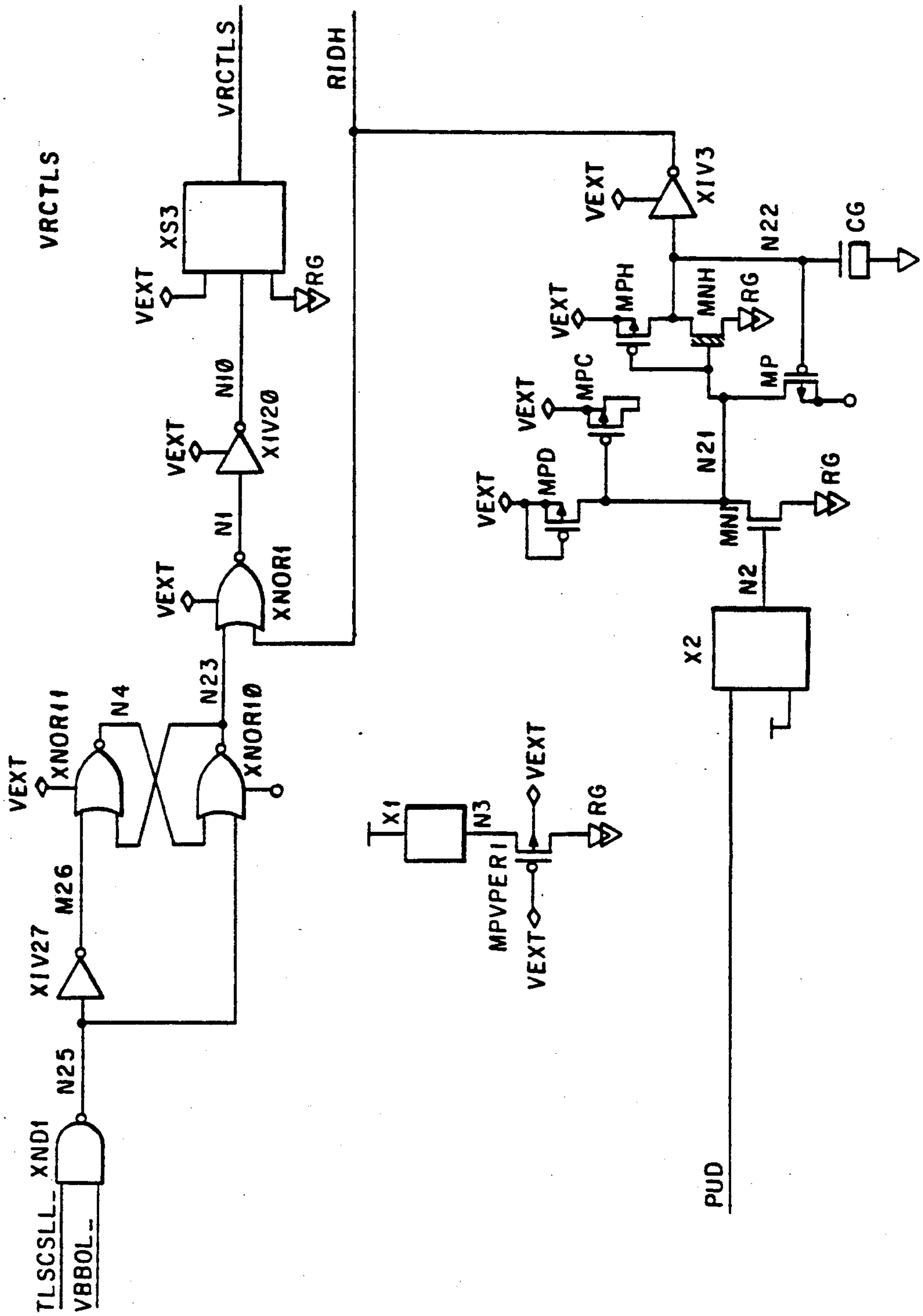

FIG. 88 illustrates the Voltage Regulator Control Logic for Standby Circuit VRCTLS.

FIG. 88.1 illustrates the Voltage Regulator Control Logic for Array Circuit VRCTLA.

FIG. 88.2 illustrates the Voltage Regulator Control Logic for Periphery Circuit VRCTLP.

FIG. 88.3 illustrates the Voltage Regulator Control Logic for Control Circuit VRCTLC.

Figure 89:
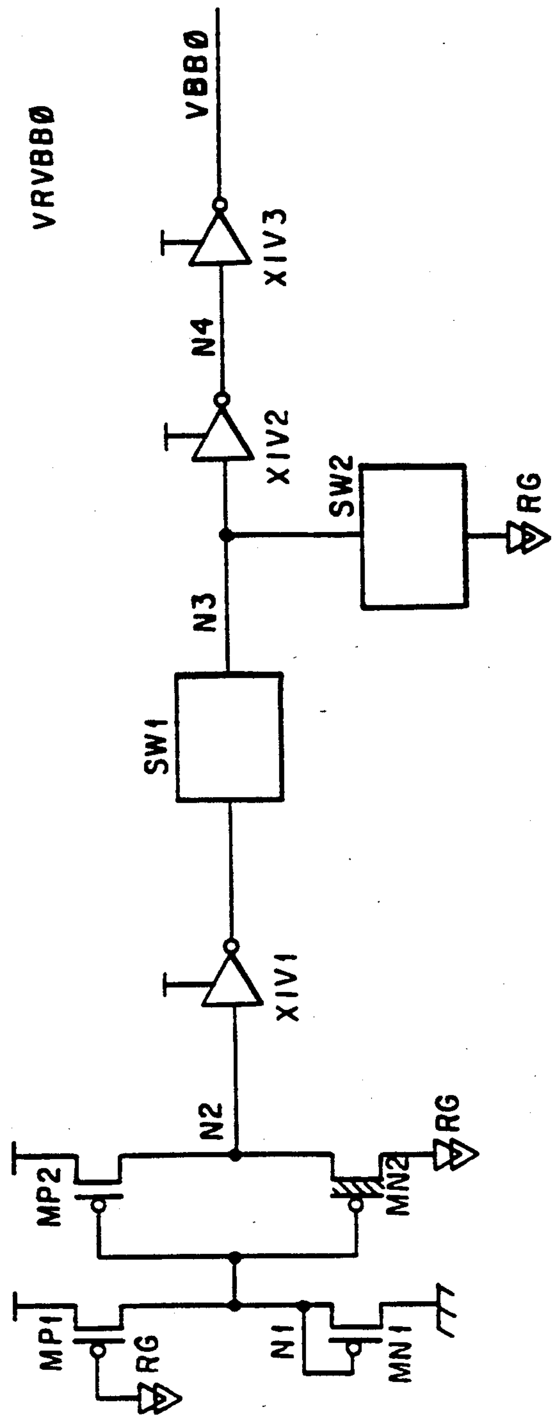

FIG. 89 illustrates the Voltage Regulator VBBO Level Detector Circuit Zero Level Detector Circuit VRVBBO.

Figure 90:
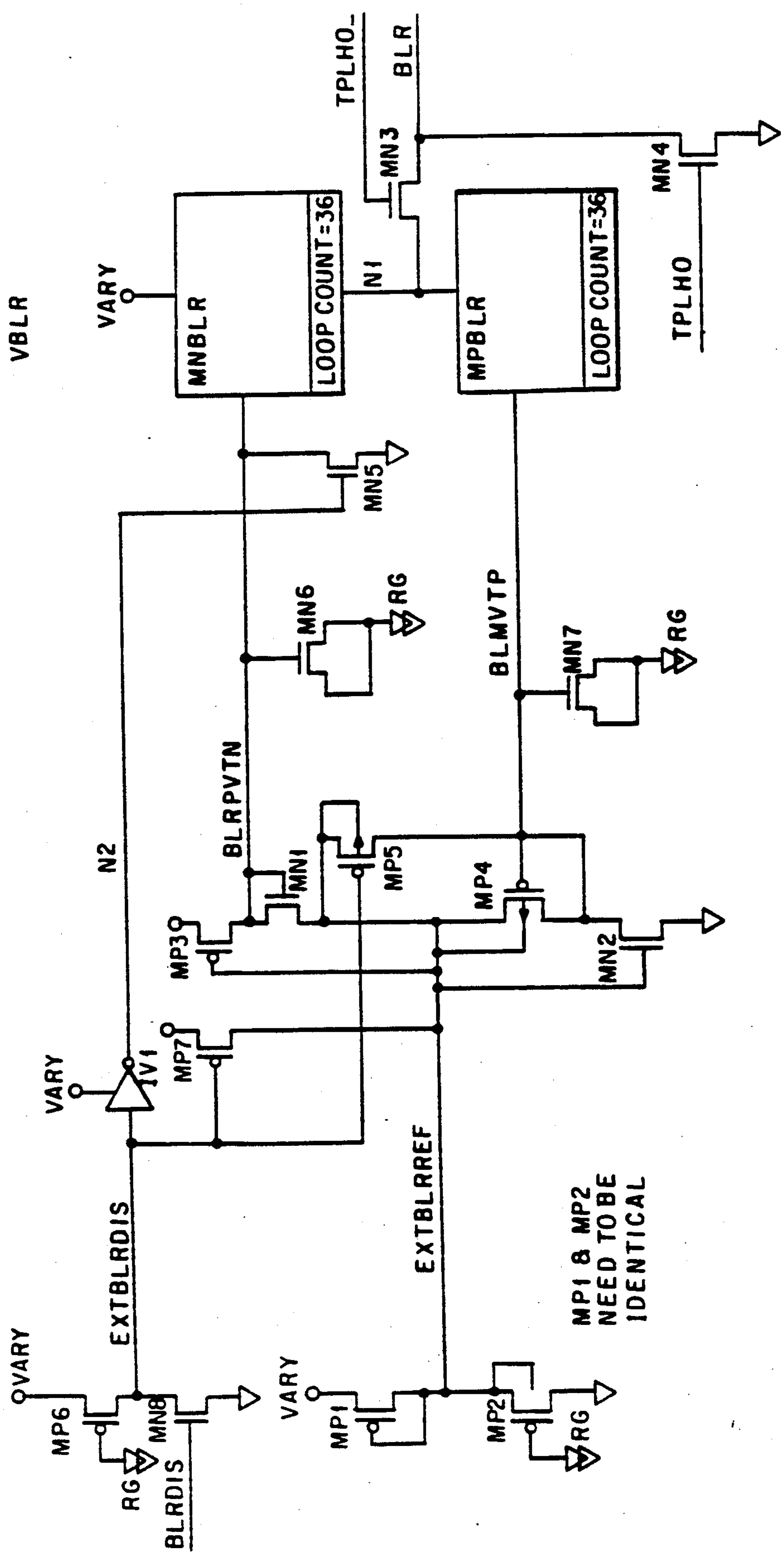

FIG. 90 illustrates the Voltage Bit Line Reference Circuit VBLR.

FIG. 90.1 illustrates the Bit Line Reference Switch Circuit, BLRSW.

FIG. 90.2 illustrates the Voltage Top Plate Generator, VPLT.

FIG. 90.3 illustrates the Voltage Top Plate Switch, VPLTSW.

FIG. 90.4 illustrates the BIHO Circuit.

FIG. 90.5 illustrates the VREFINIT circuit.

FIG. 90.6 illustrates the VDDREF, or VDD Reference Circuit.

Figure 91:
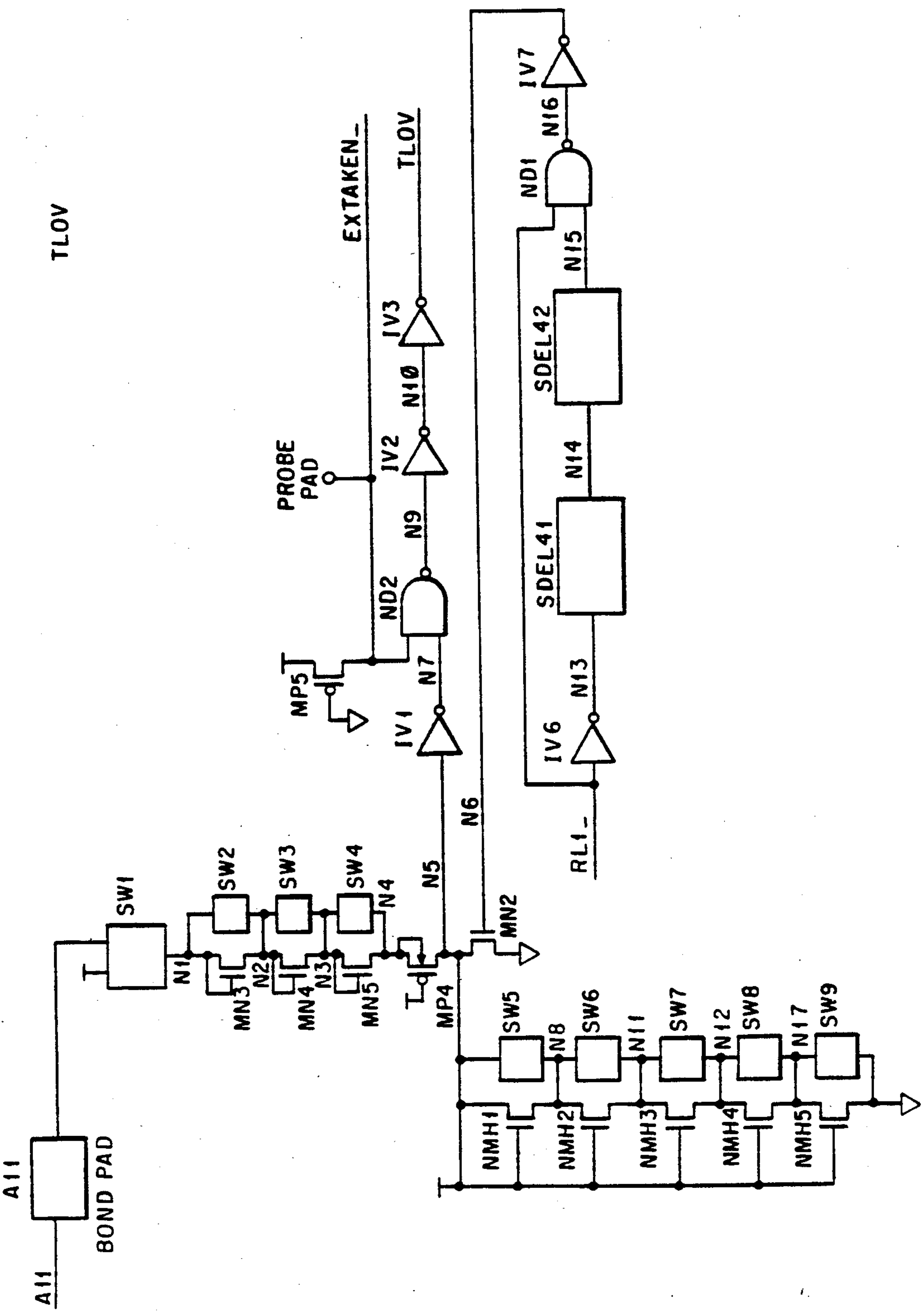

FIG. 91 illustrates the DFT Over Voltage Circuit, TLOV.

Figure 92:
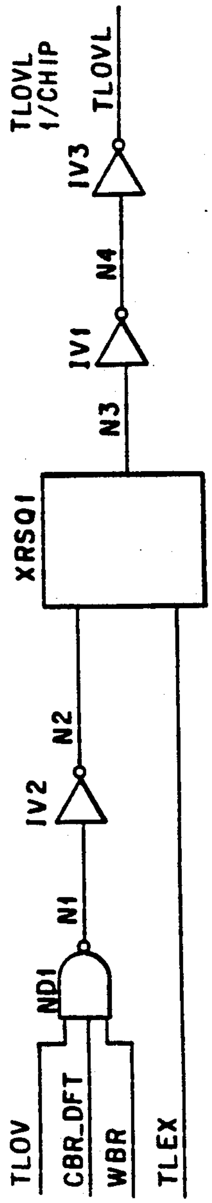

FIG. 92 illustrates the DFT Over Voltage Latch Circuit, TVOVL.

Figure 93:
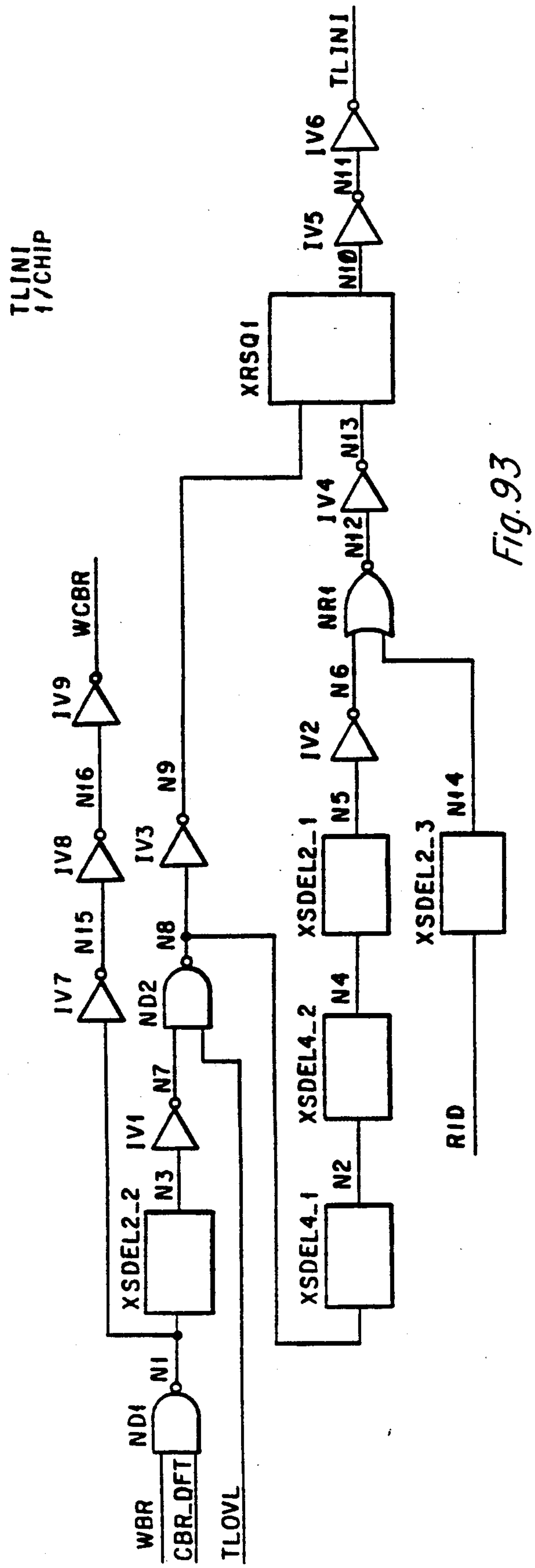

FIG. 93 illustrates the DFT initialized Circuit, TLINI.

Figure 94:
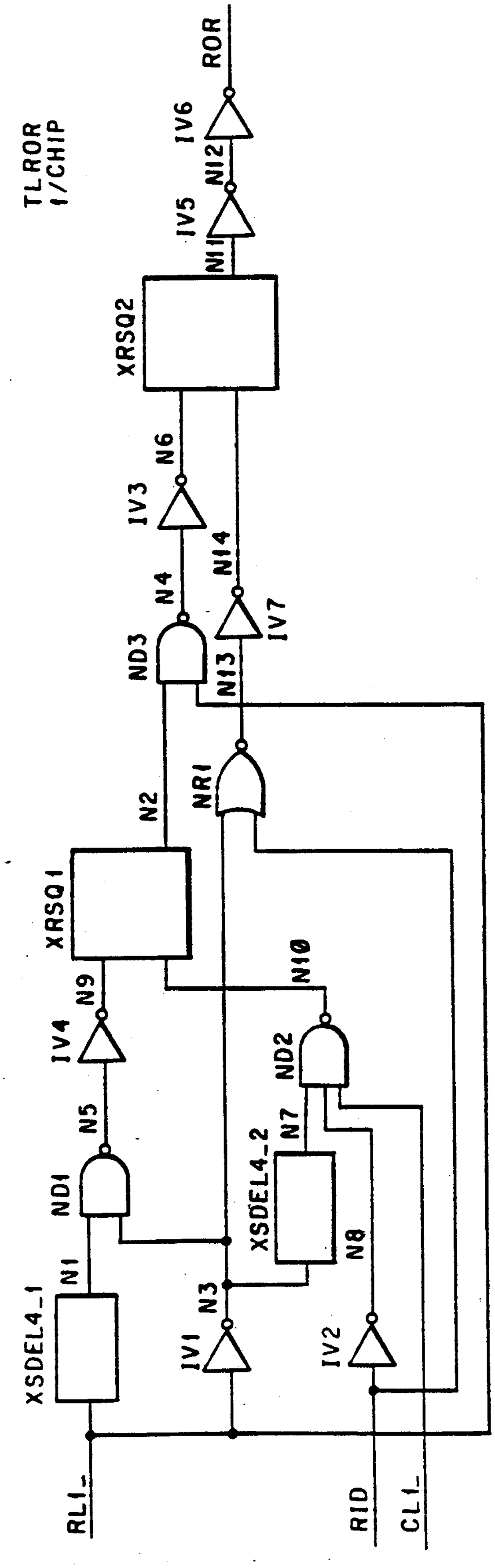

FIG. 94 illustrates the DFT Ras_Only Refresh Circuit, TLROR.

Figure 95:
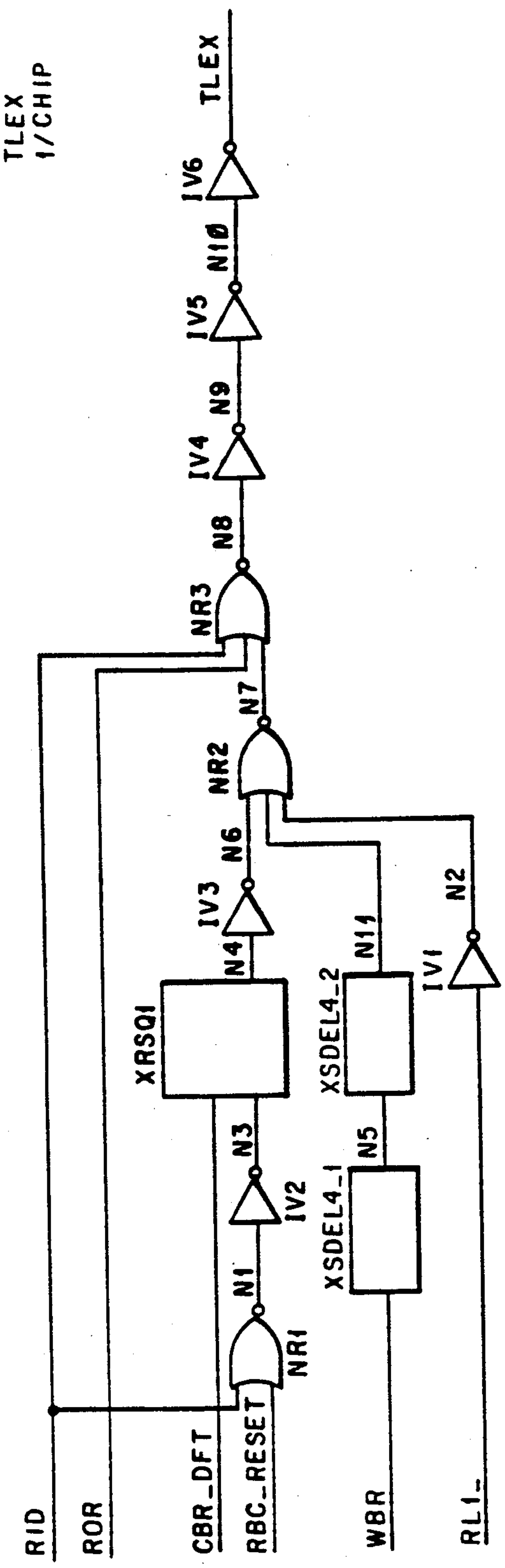

FIG. 95 illustrates the DFT Exit Circuit, TLEX.

Figure 96:
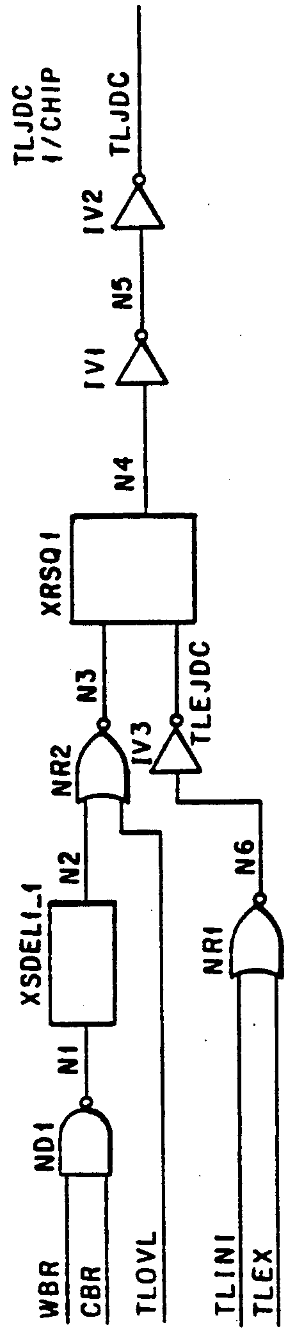

FIG. 96 illustrates the DFT Jedec Mode Circuit, TLJDC.

Figure 97:
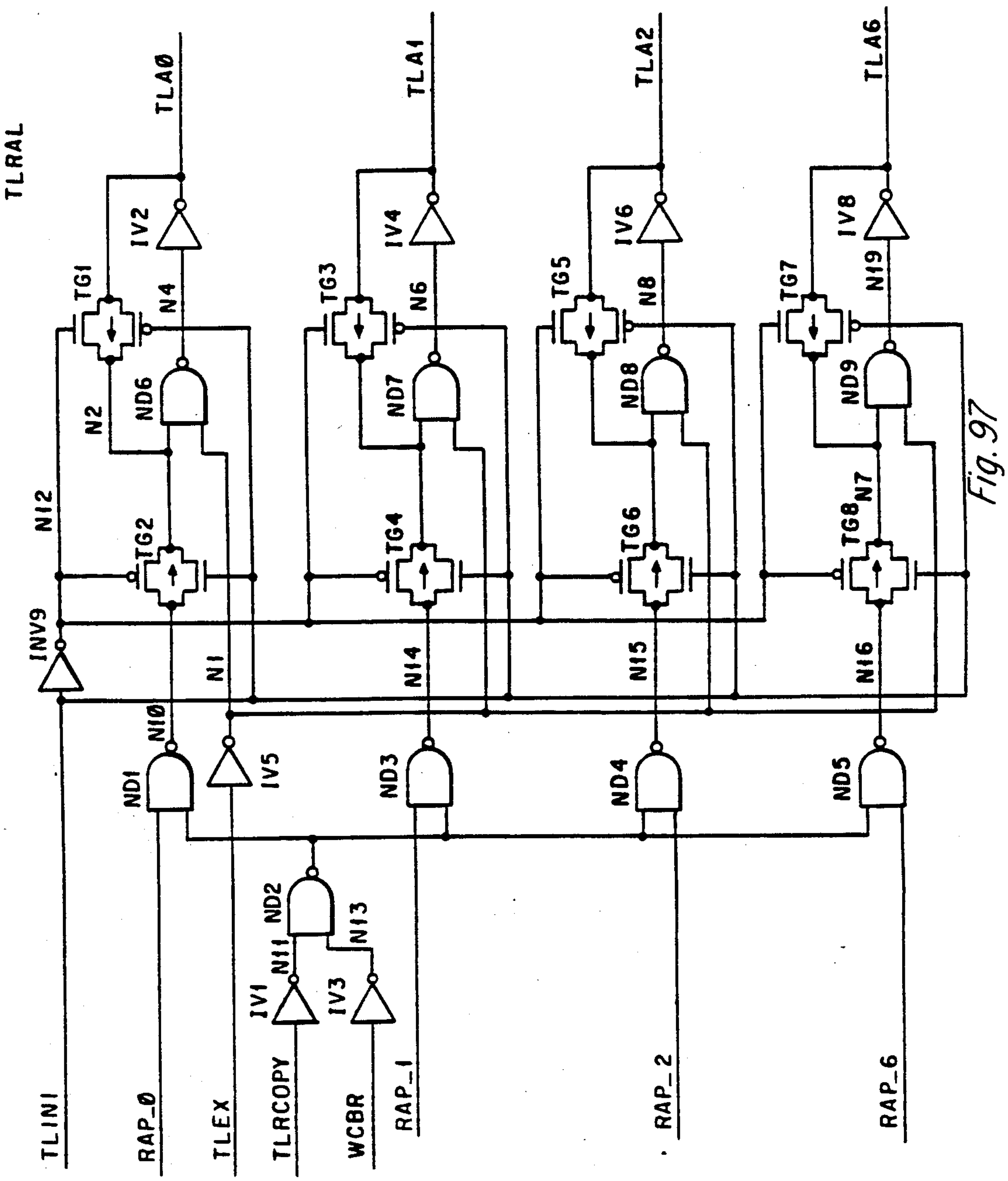

FIG. 97 illustrates the DFT Row Address Latch Circuit, TLRAL.

Figure 98:
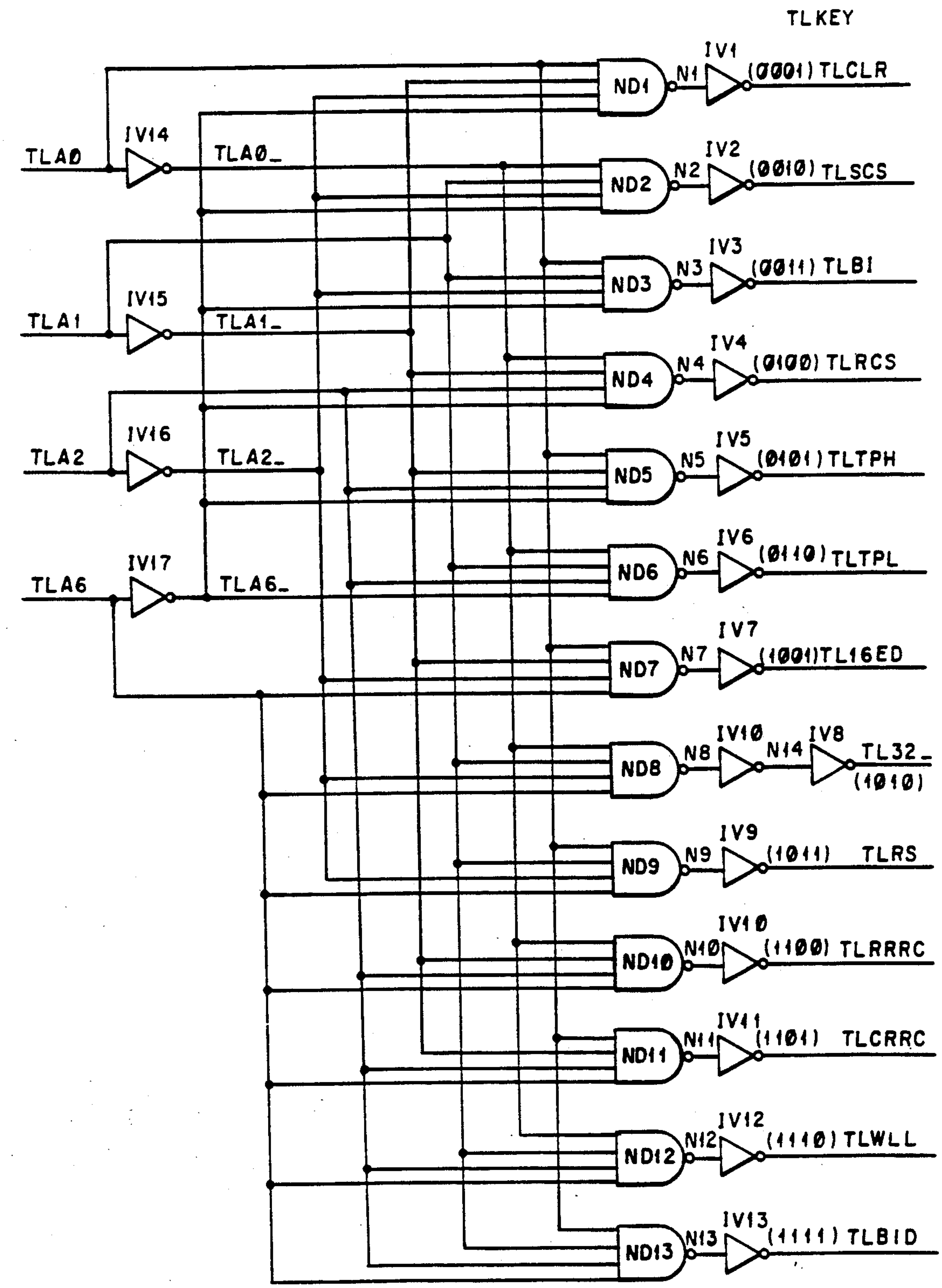

FIG. 98 illustrates the DFT Address Key Decoder Circuit, TLKEY.

Figure 99:
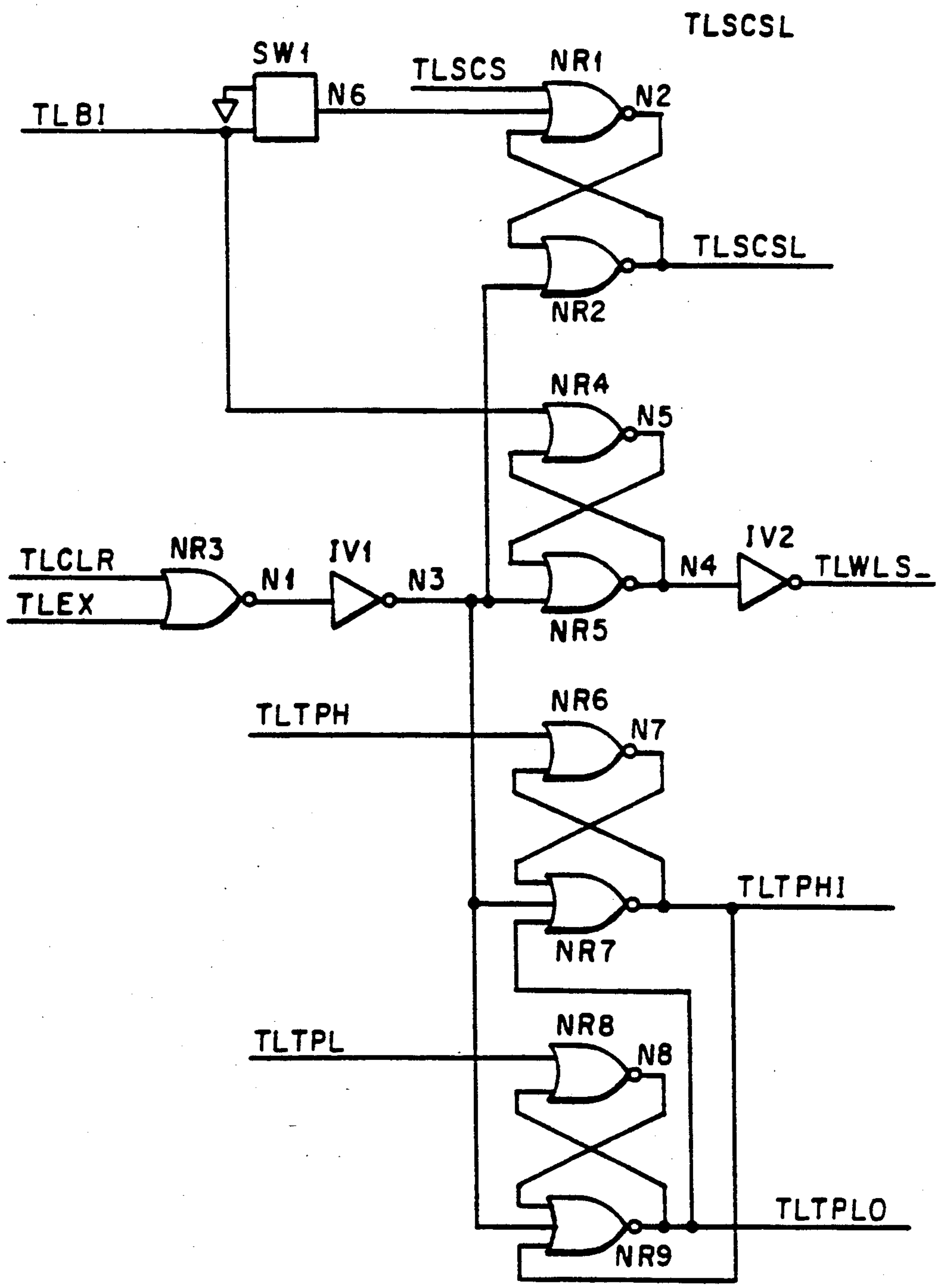

FIG. 99 illustrates the DFT Storage Cell Stress Latch Circuit, TLSCSL.

Note: There is no FIG. 100.

Figure 101:
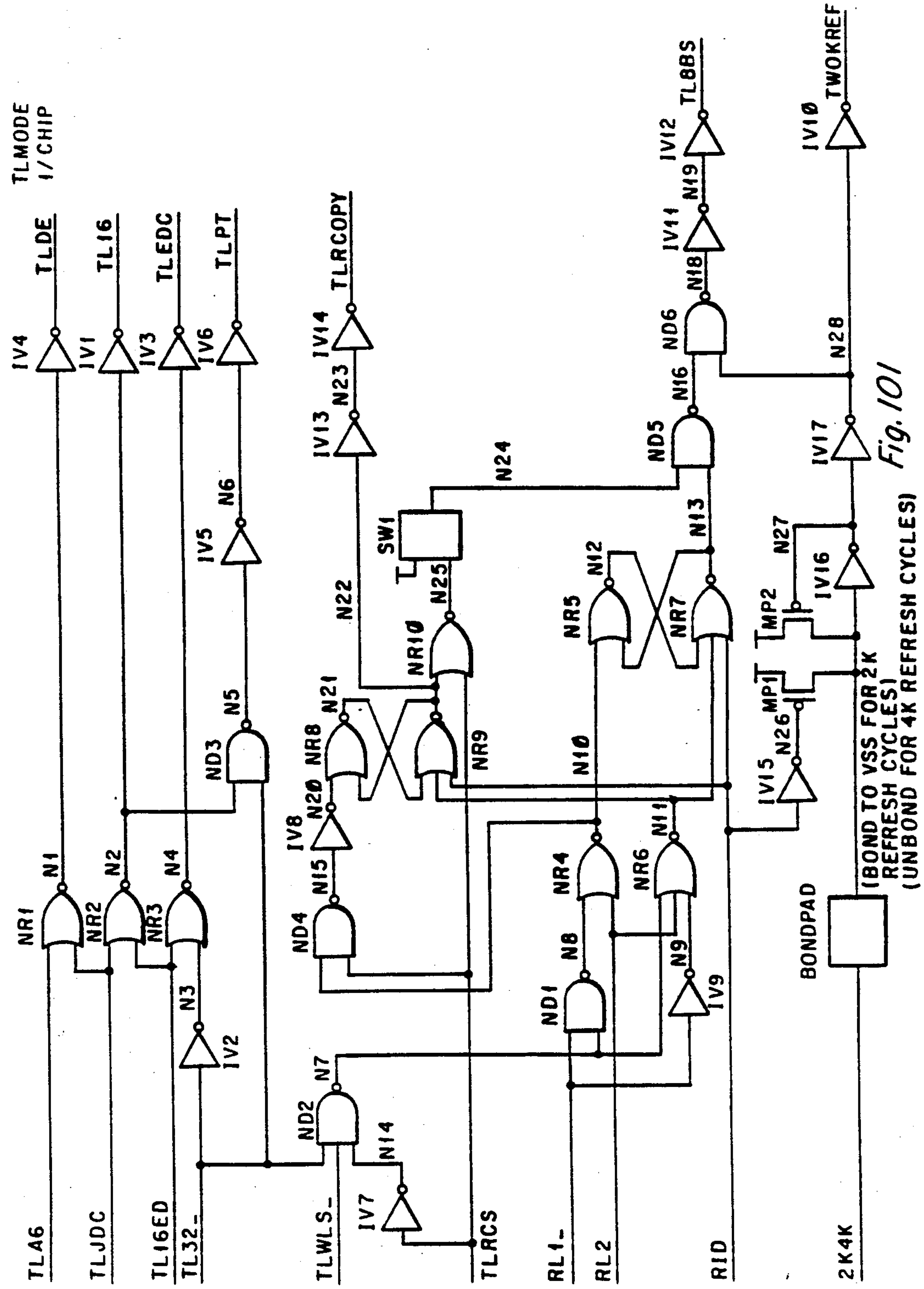

FIG. 101 illustrates the DFT Mode Circuit, TLMODE.

Figure 102:
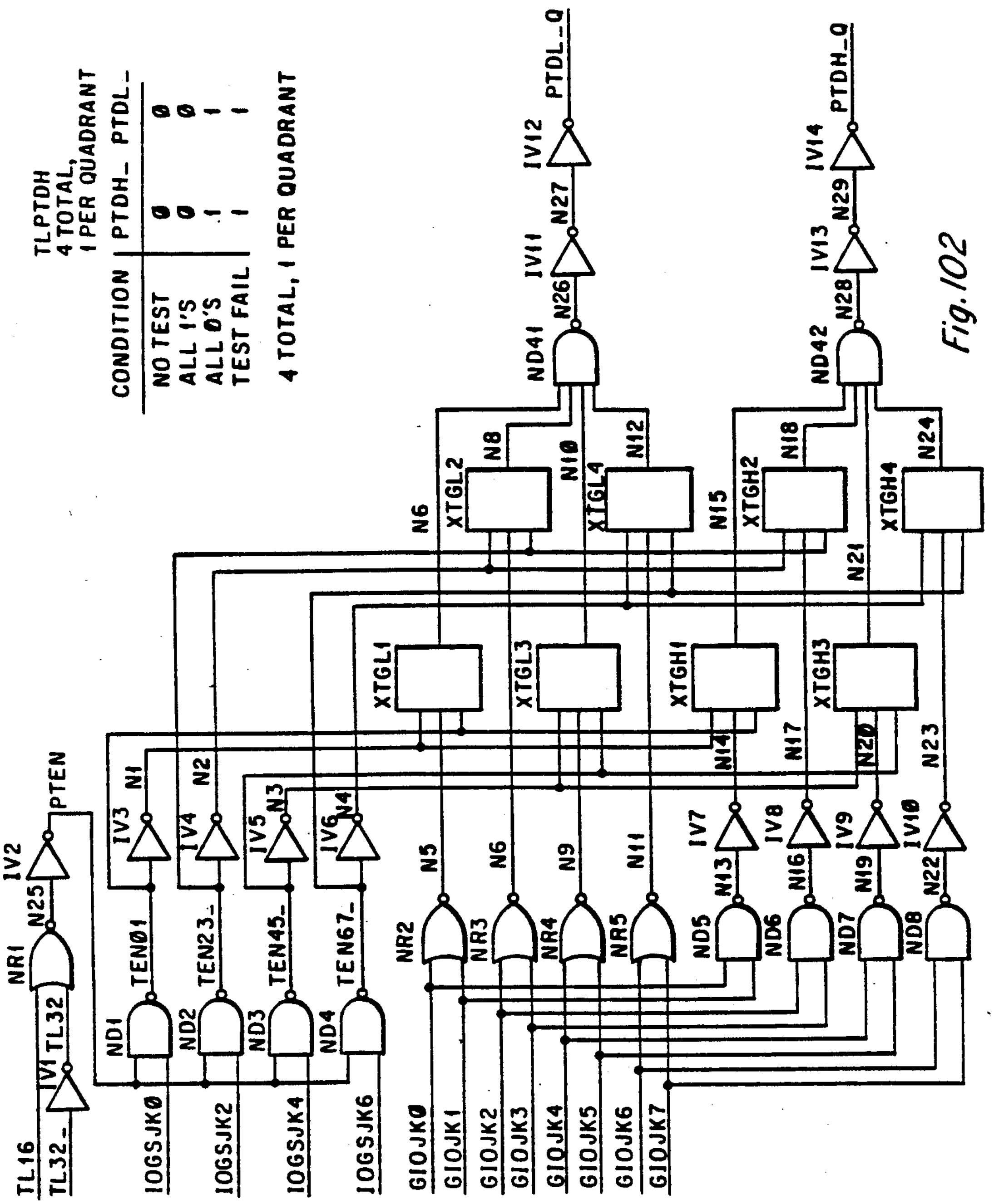

FIG. 102 illustrates the DFT Parallel Test Data High Circuit, TLPTDH.

Figure 103:
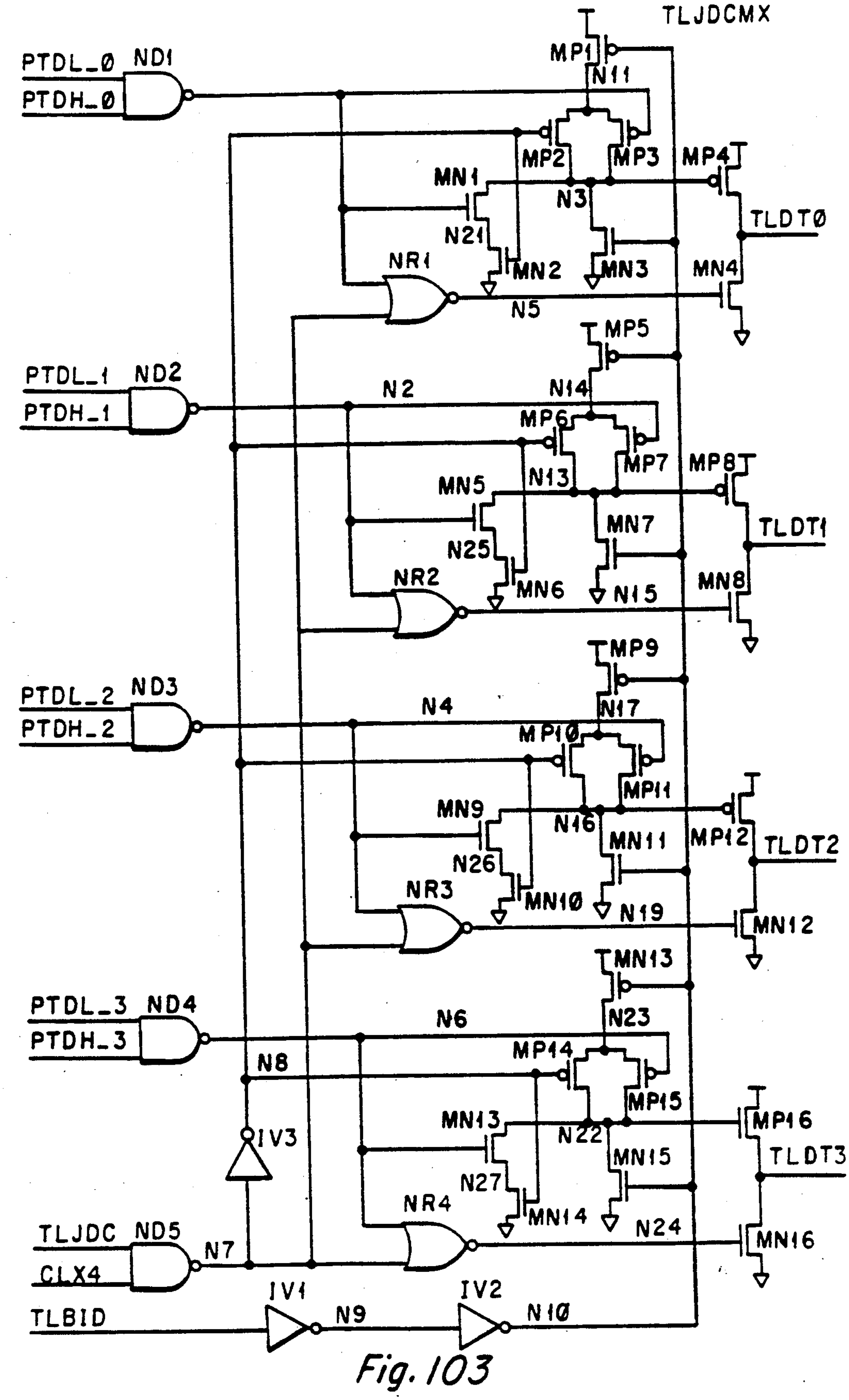

FIG. 103 illustrates the DFT Jedec Multiplex Circuit, TLJDCMX.

Figure 104:
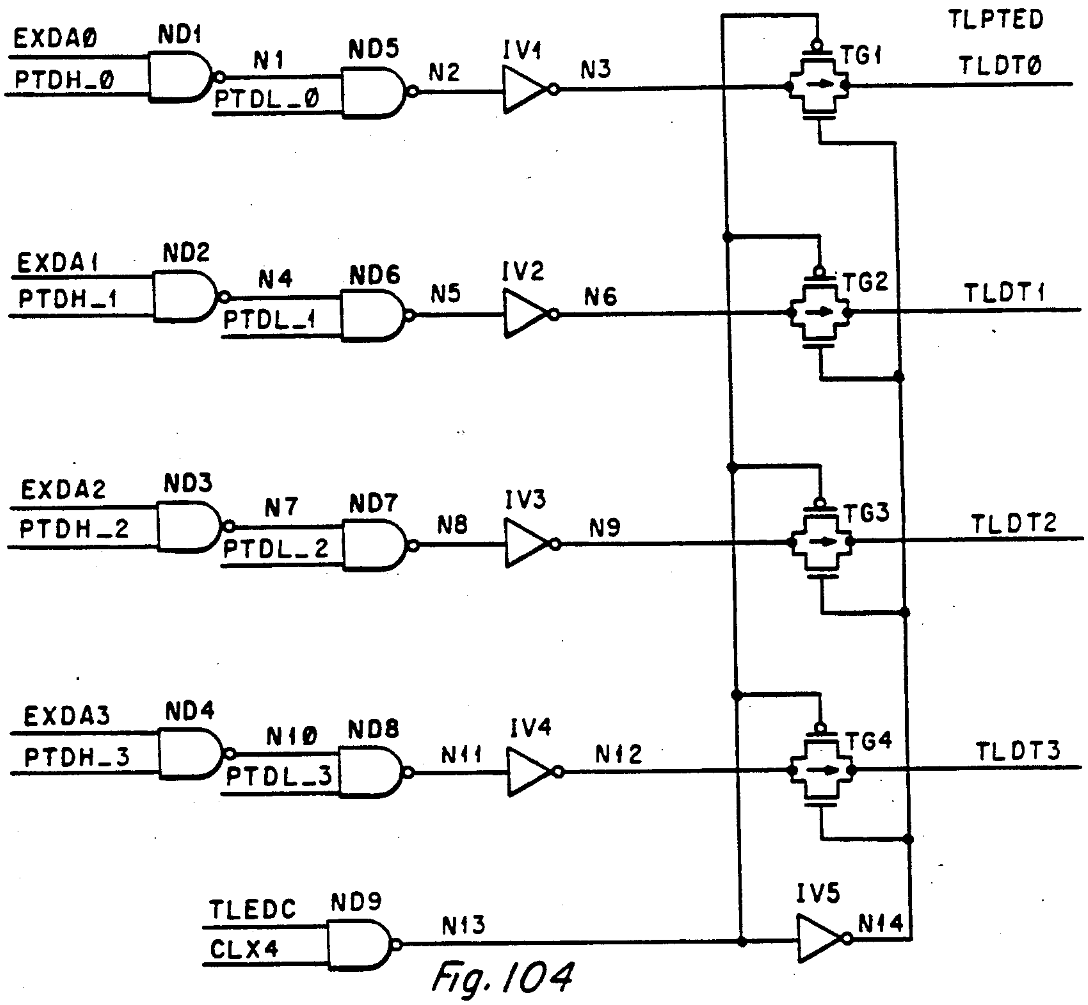

FIG. 104 illustrates the DFT Parallel Test Expected Data Circuit, TLPTED.

Figure 105:
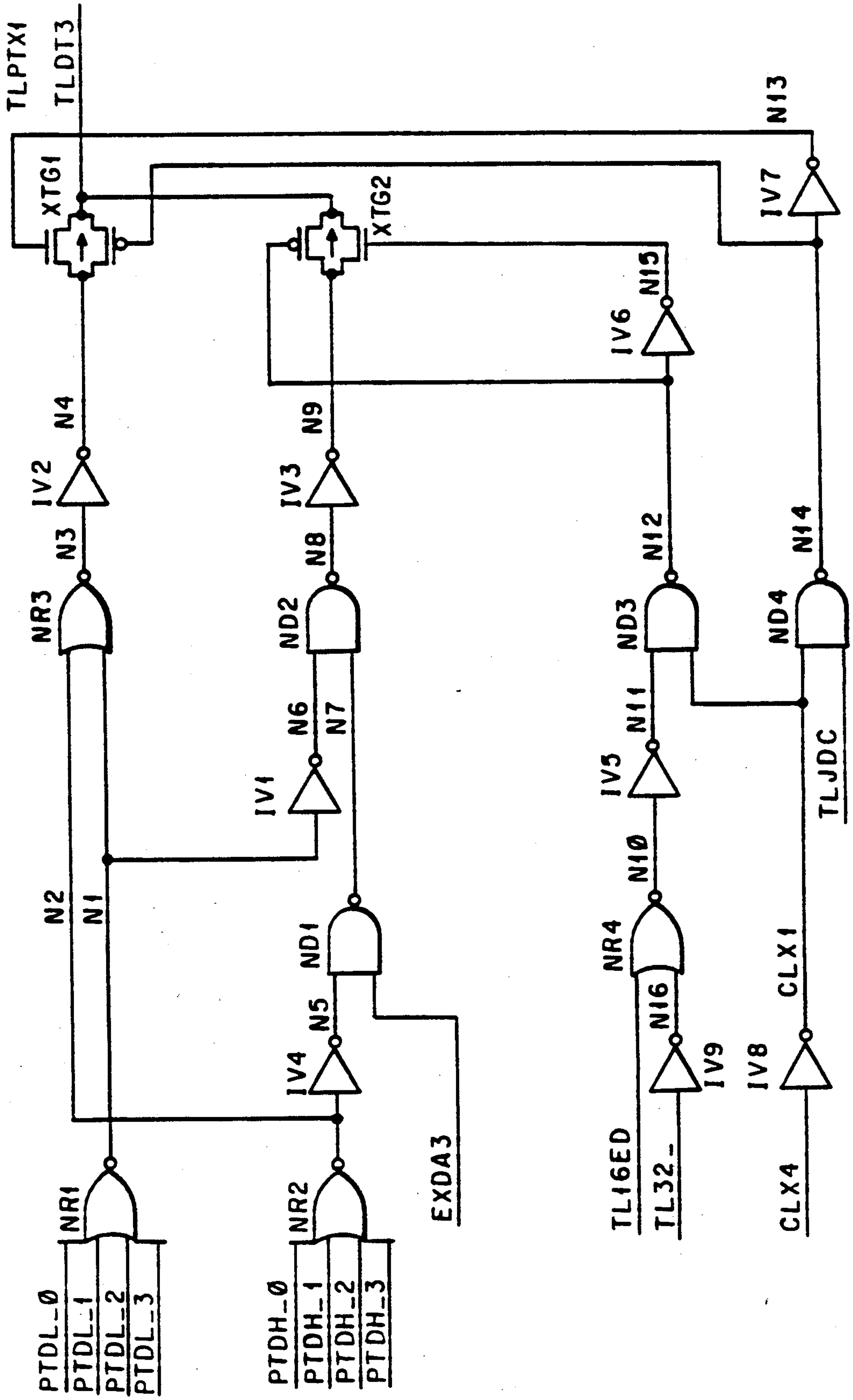

FIG. 105 illustrates the DFT Parallel Test X1 Circuit, TLPTX1.

FIG. 106 illustrates the DFT Word Line Comparator Circuit, TLWLC.

FIG. 106.1 illustrates the DFT Word Line Leakage OR Gate Circuit, TLWLOR.

Figure 107:
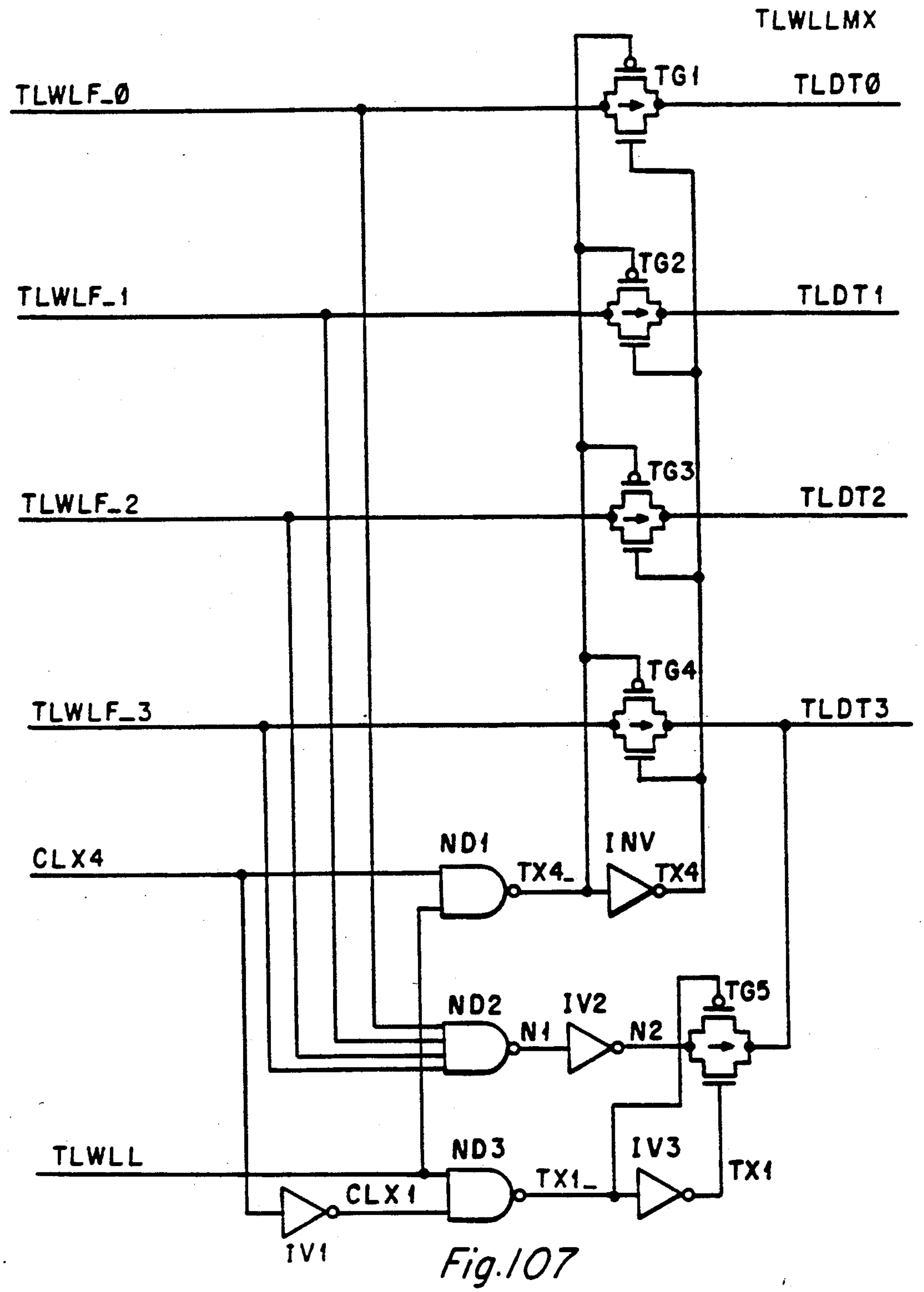

FIG. 107 illustrates the DFT Word Line Leakage Multiplexor Circuit, TLWLLMX.

Figure 108:
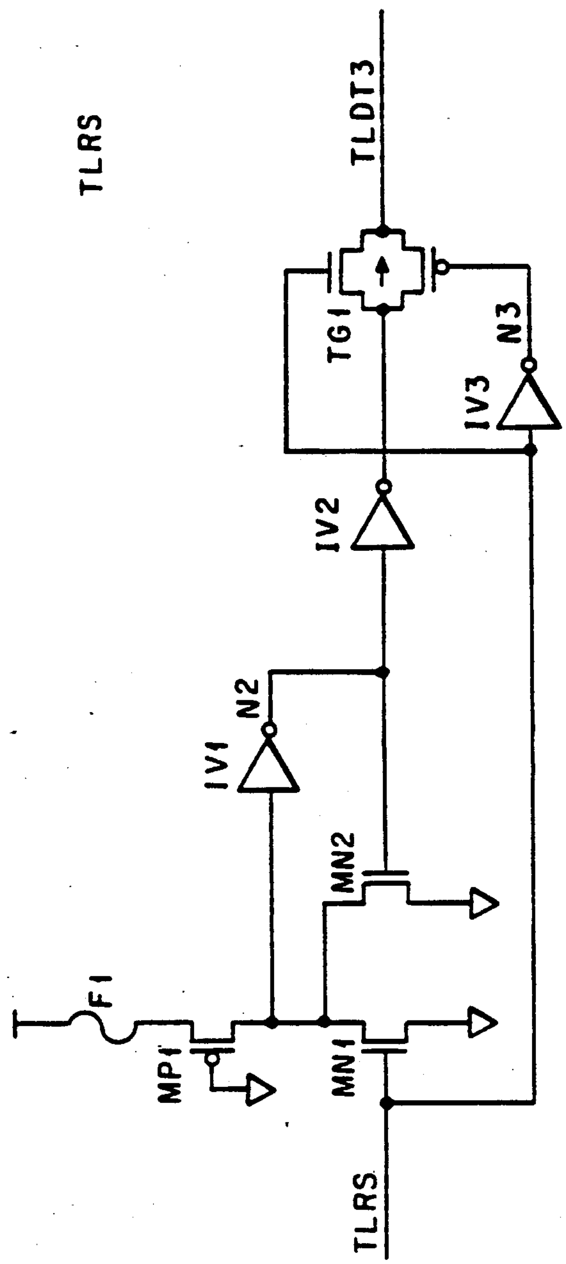
Figure 109:
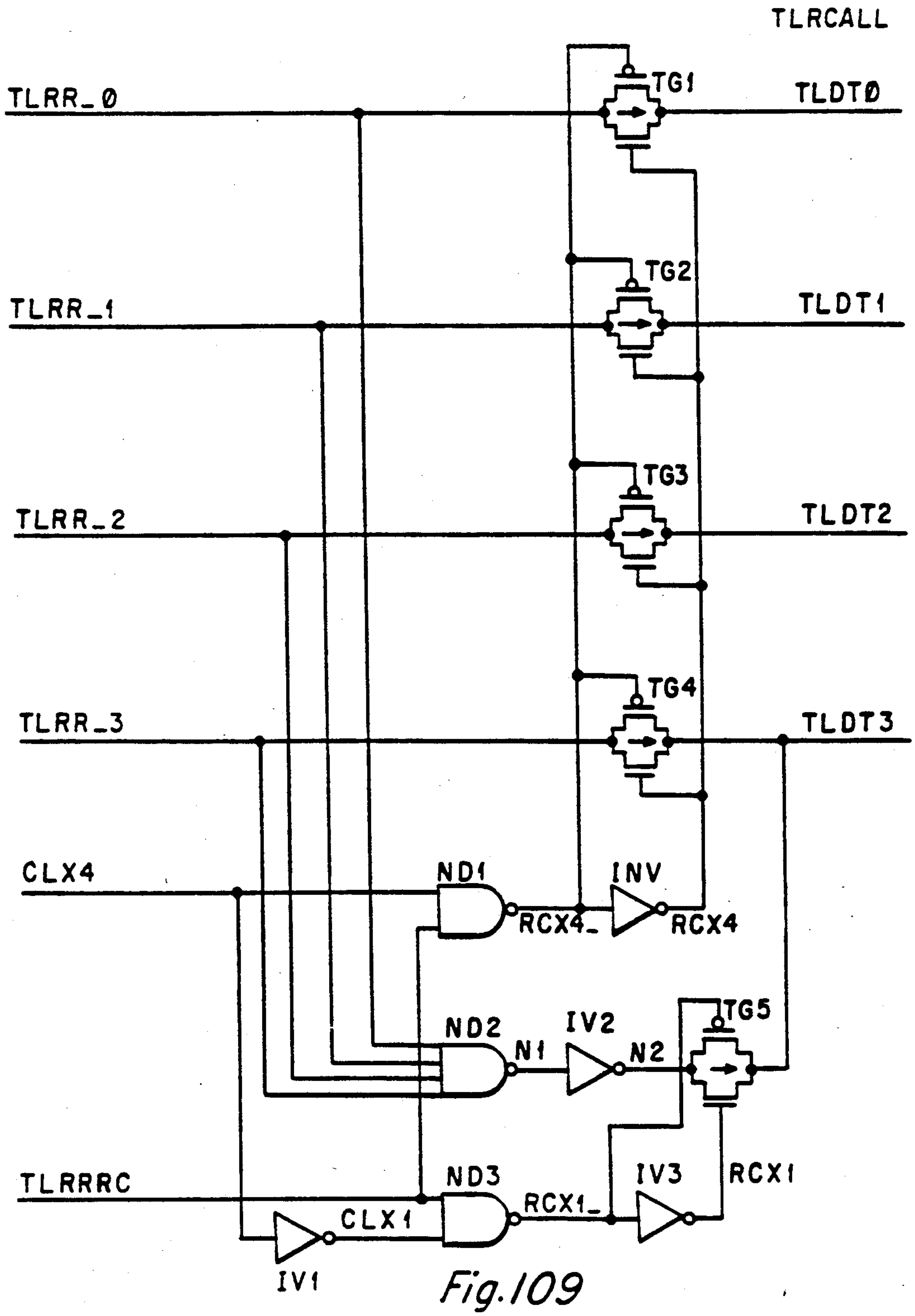

FIG. 108 illustrates the DFT Redundancy Signature Circuit, TLRS. FIG. 109 illustrates the DFT Row Redundancy Roll Call Circuit, TLRCALL.

Figure 110:
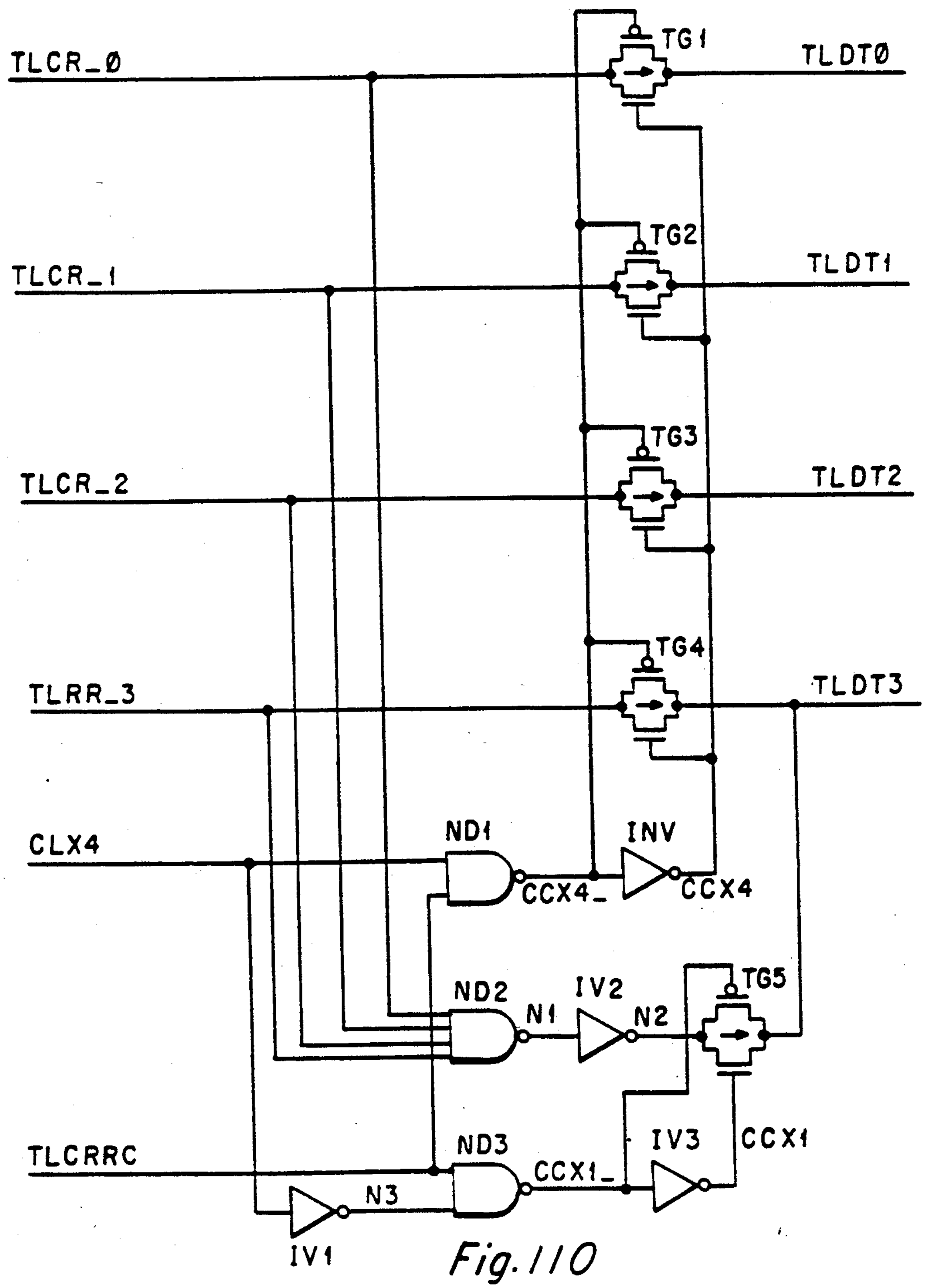

FIG. 110 illustrates the DFT Column Redundancy Row Call Circuit, TLCCALL.

Figure 111:
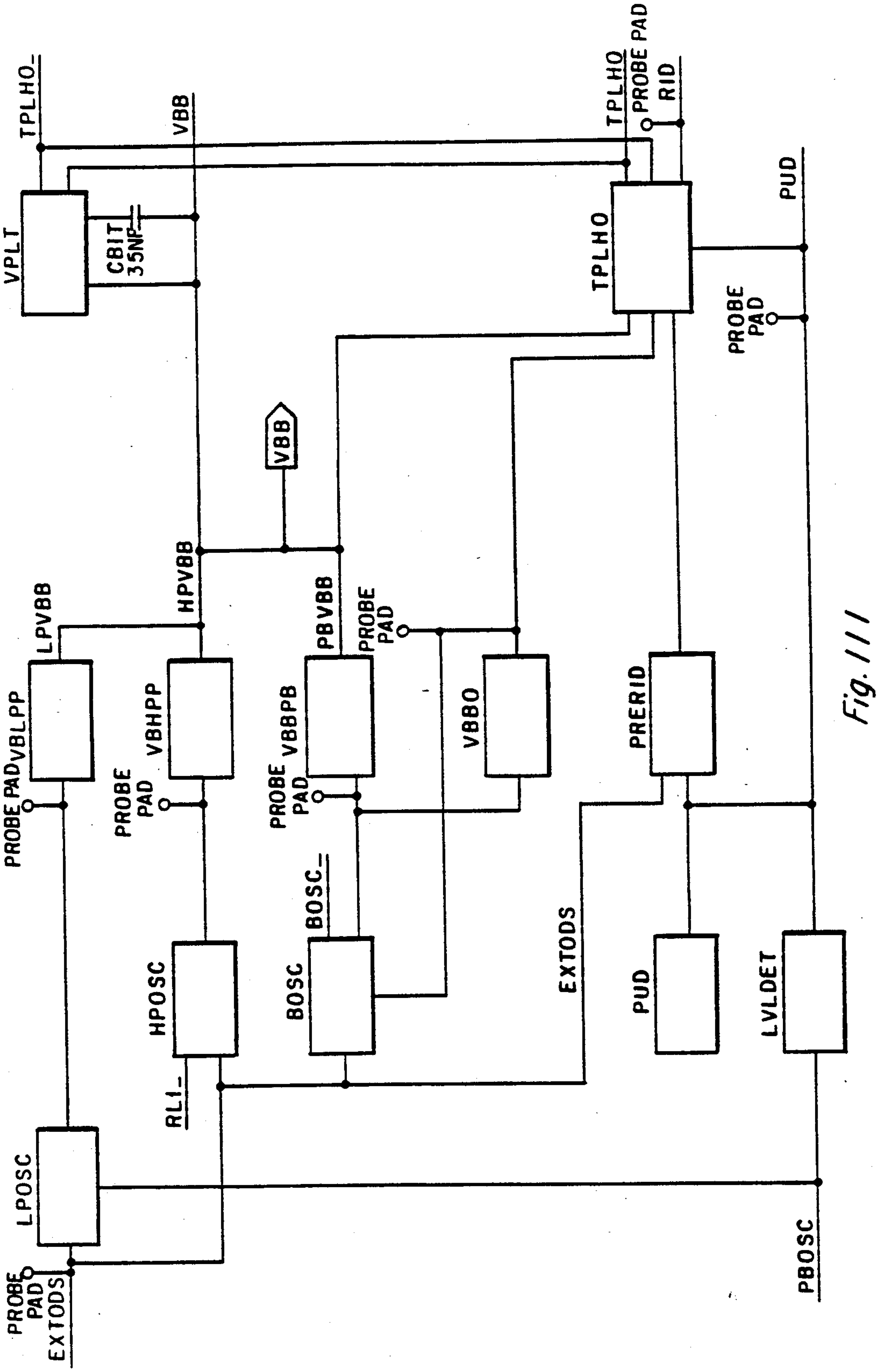

FIG. 111 is a Block Diagram illustrating the VBB Circuits.

Figure 112:
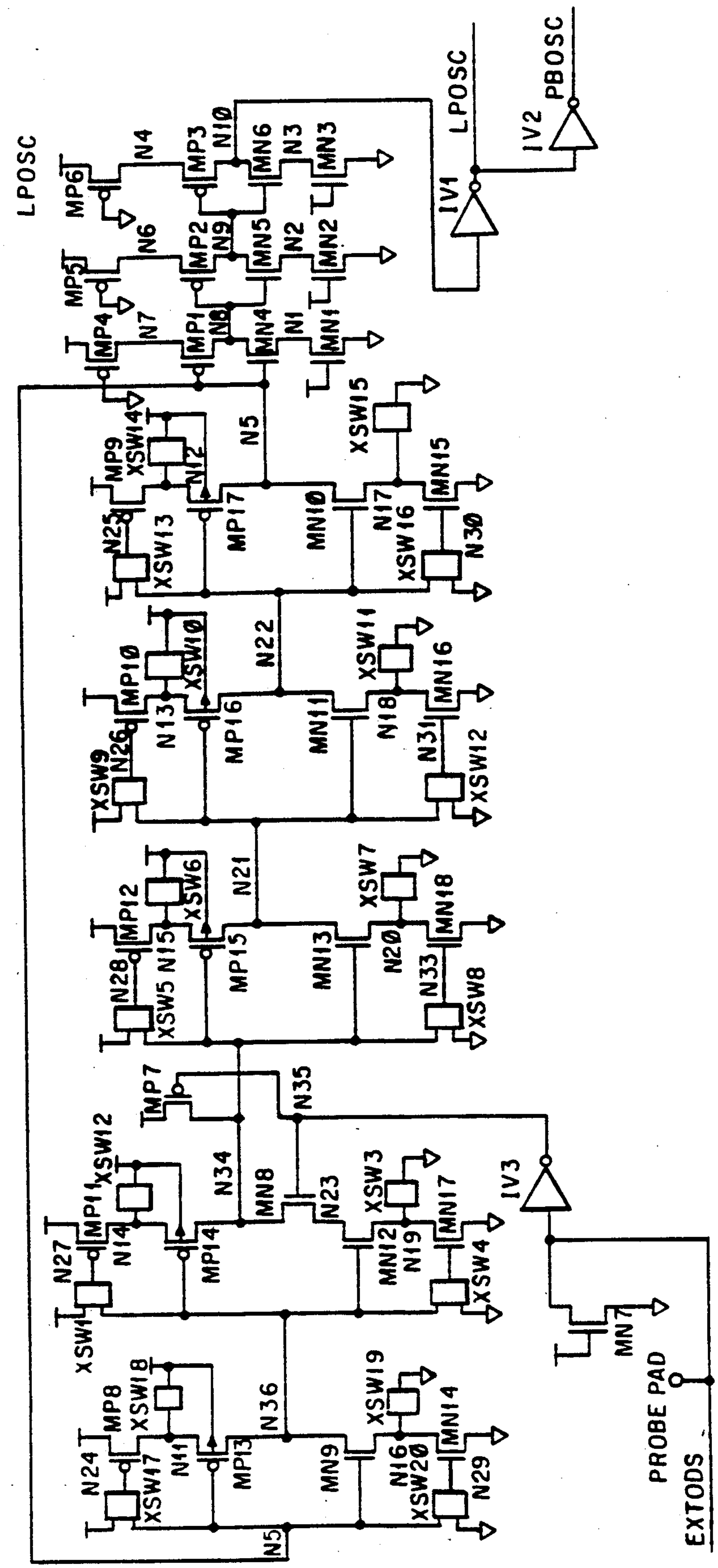

FIG. 112 illustrates the Low Power Oscillator Circuit, LPOSC.

Figure 113:
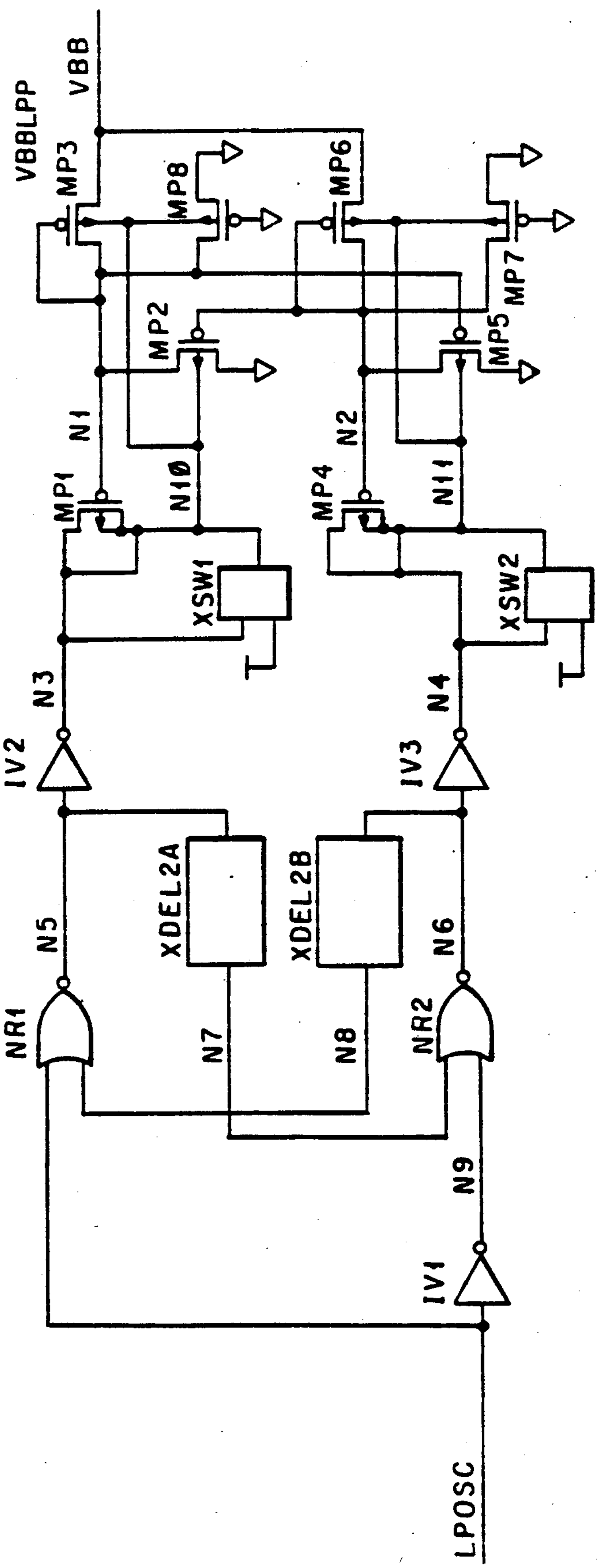

FIG. 113 illustrates the VBB Low Power Pump Circuit, VBBLPP.

Figure 114:
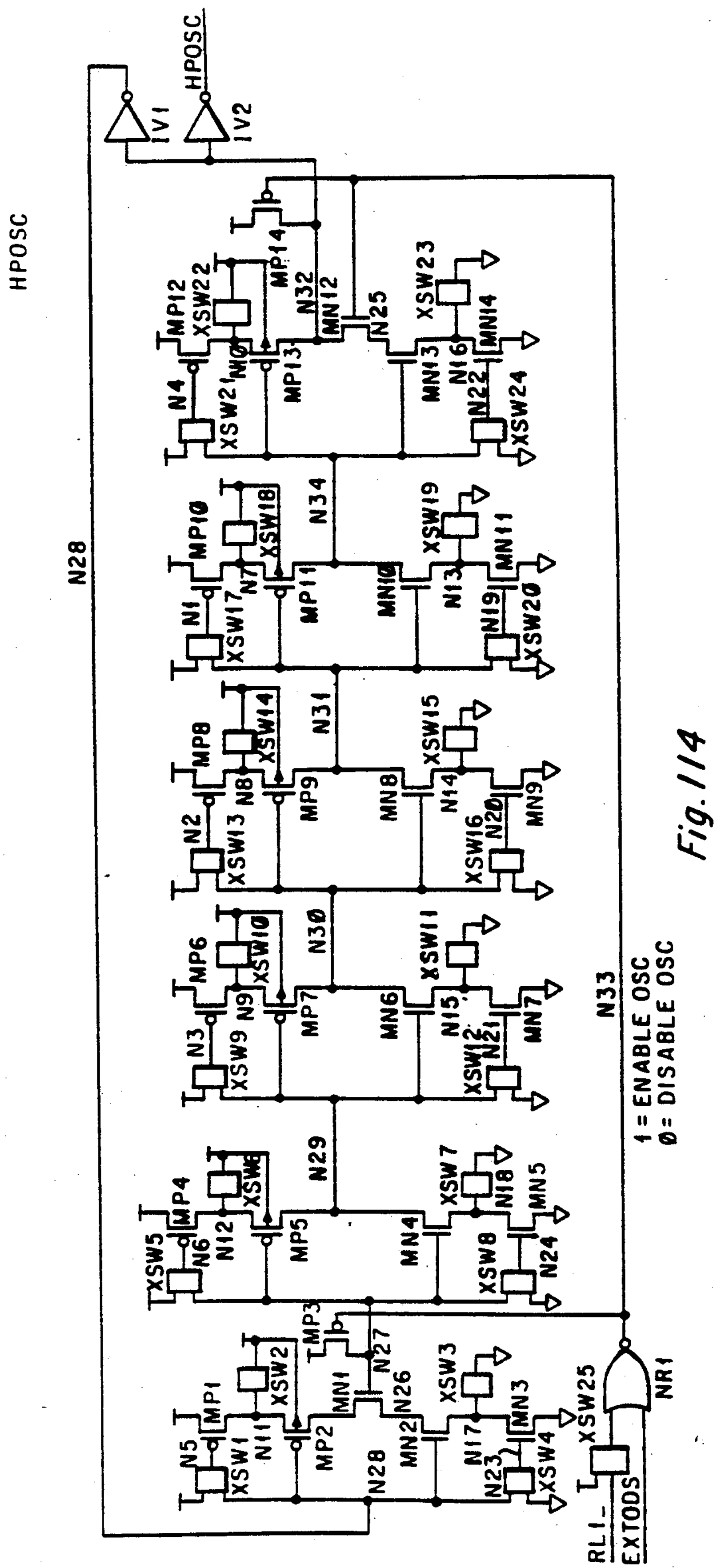

FIG. 114 illustrates the High Power Oscillator Circuit HPOSC.

Figure 115:
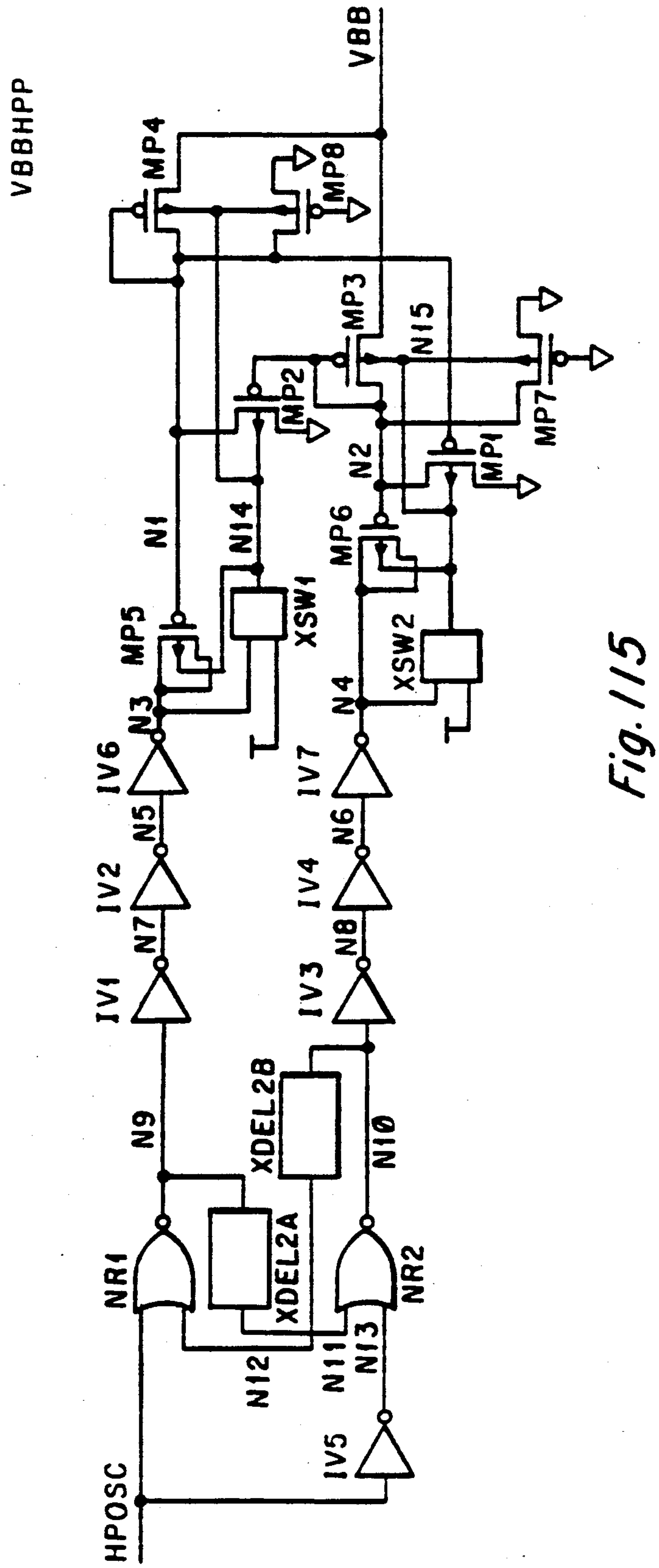

FIG. 115 illustrates the VBB High Power Pump Circuit, VBBHPP.

Figure 116:
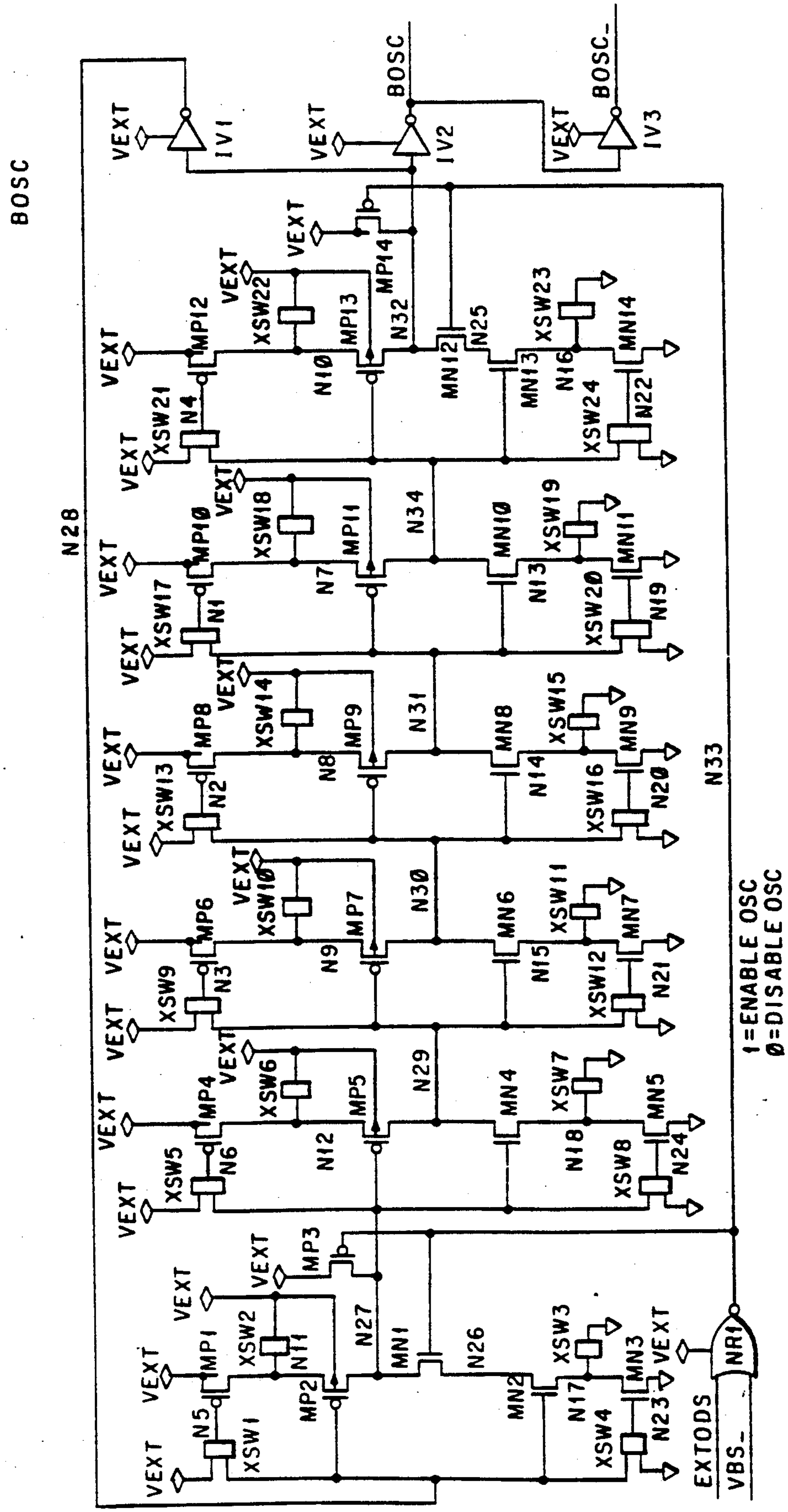

FIG. 116 illustrates the Power up Boost Oscillator Circuit, BOSC.

Figure 117:
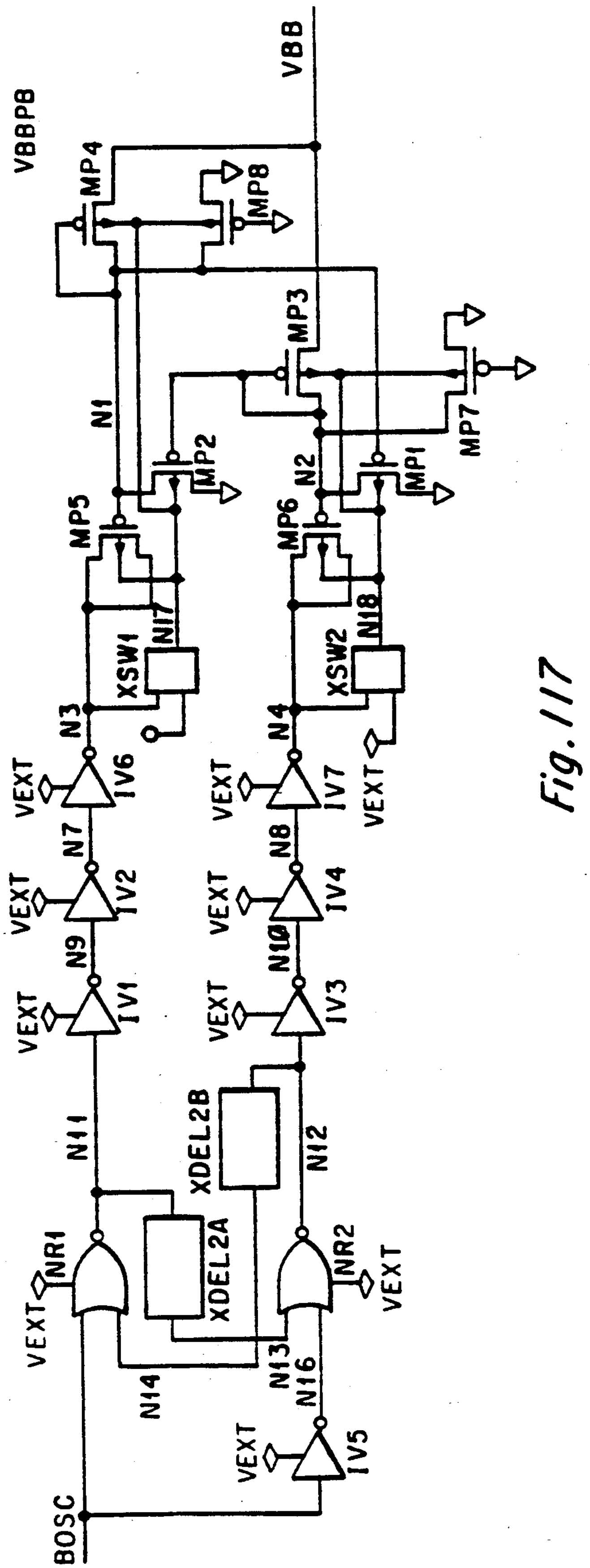

FIG. 117 illustrates the VBB Booster Pump Circuit VBBPB.

Figure 118:
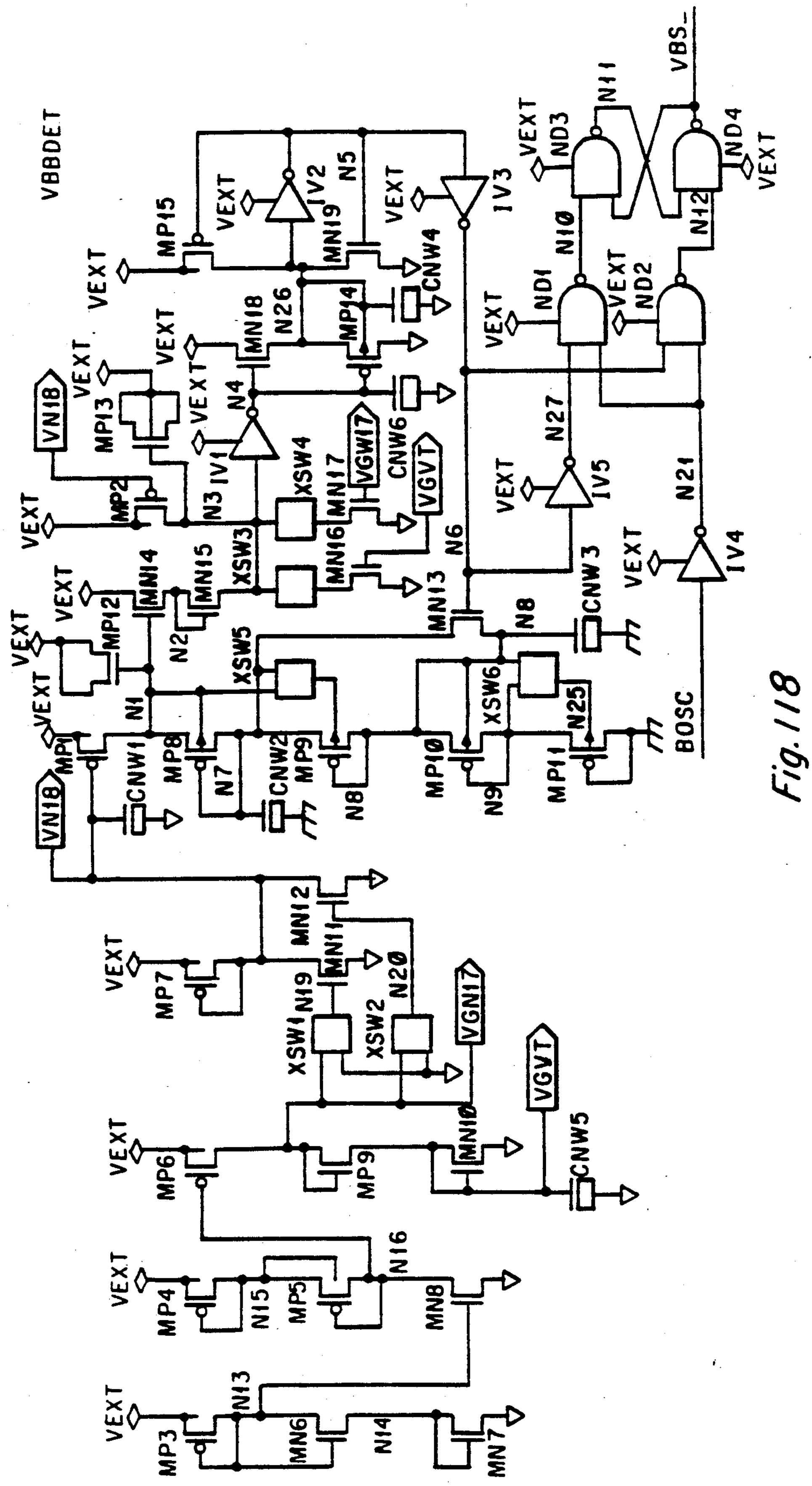

FIG. 118 illustrates the VBB Detector Circuit, VBBDET.

Figure 119:
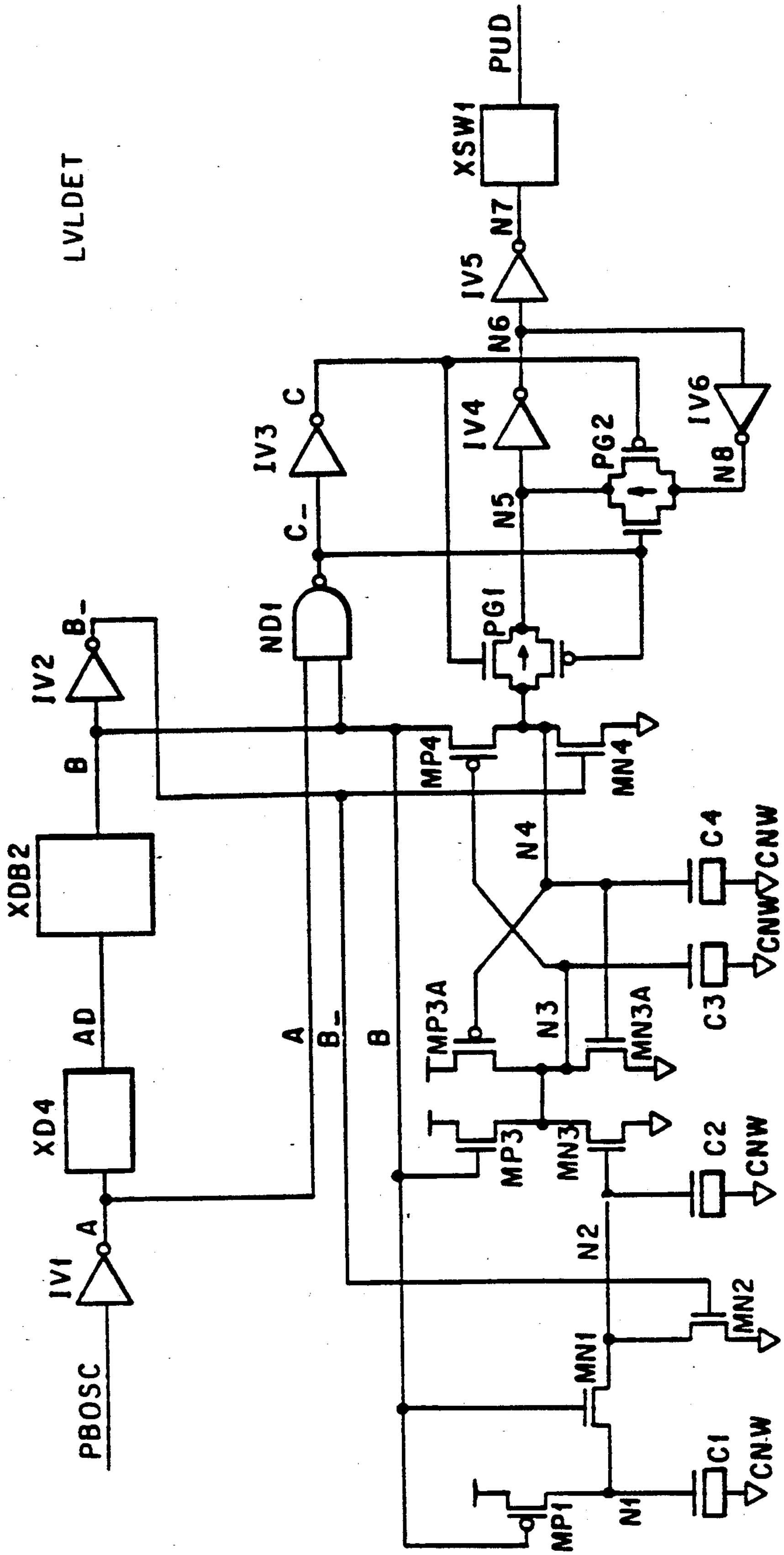

FIG. 119 illustrates the Level Detector Circuit, LVLDET.

Figure 120:
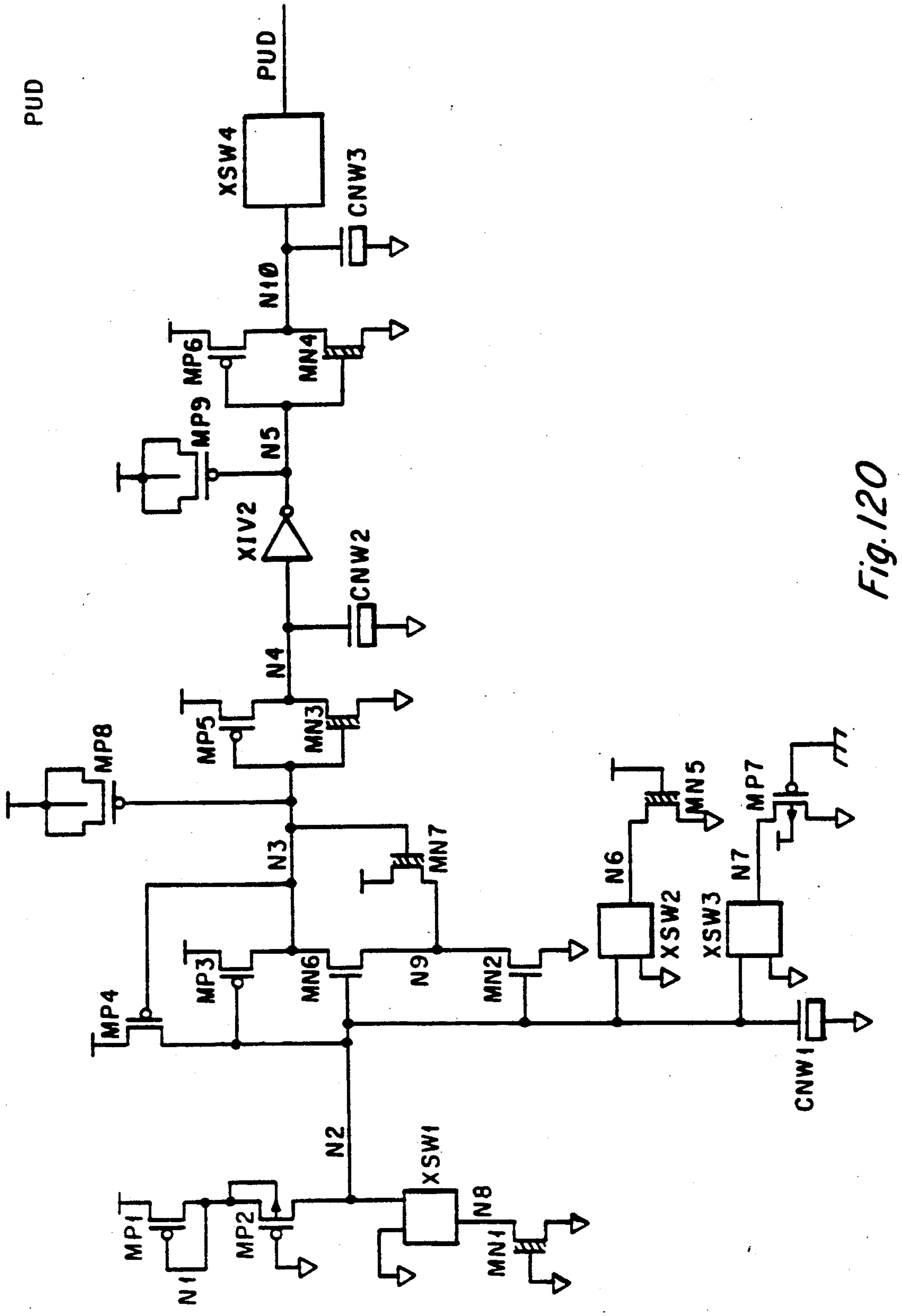

FIG. 120 illustrates the Power Up Detector Circuit, PUD.

Figure 121:
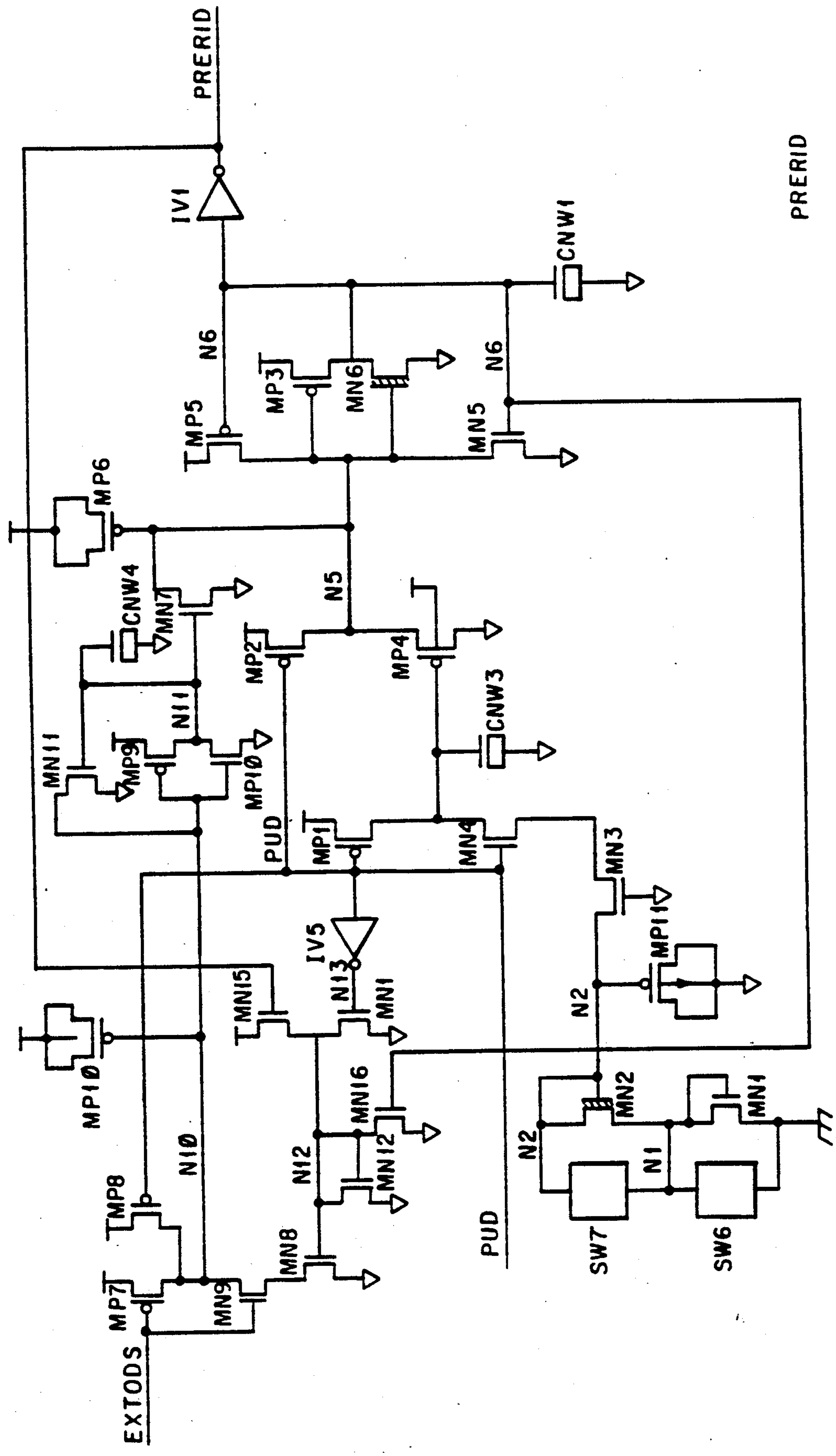

FIG. 121 illustrates the Pre Reset and Initialization Detector Circuit, PRERID.

Figure 122:
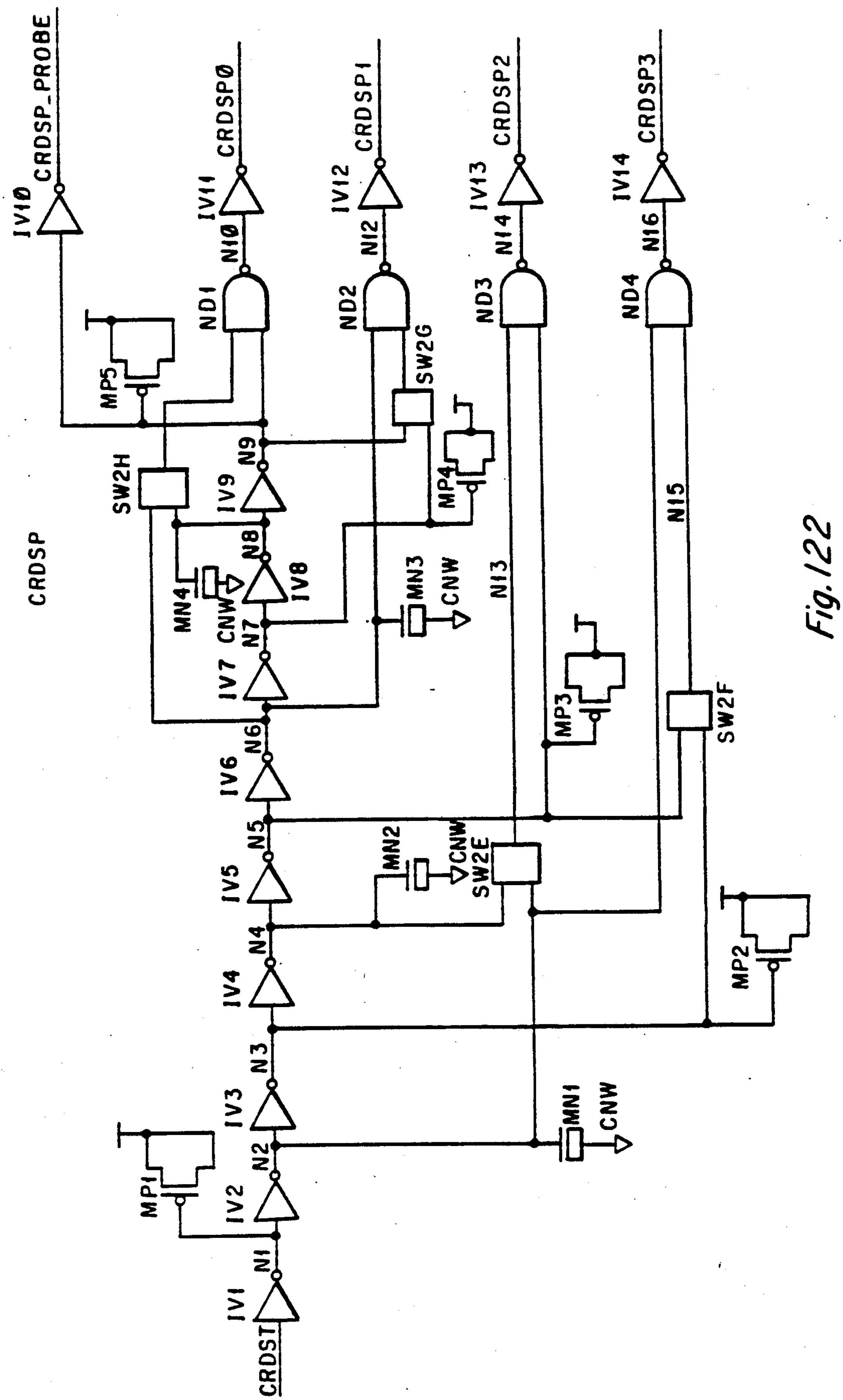

FIG. 122 illustrates the CREDSP Circuit.

Figure 123:
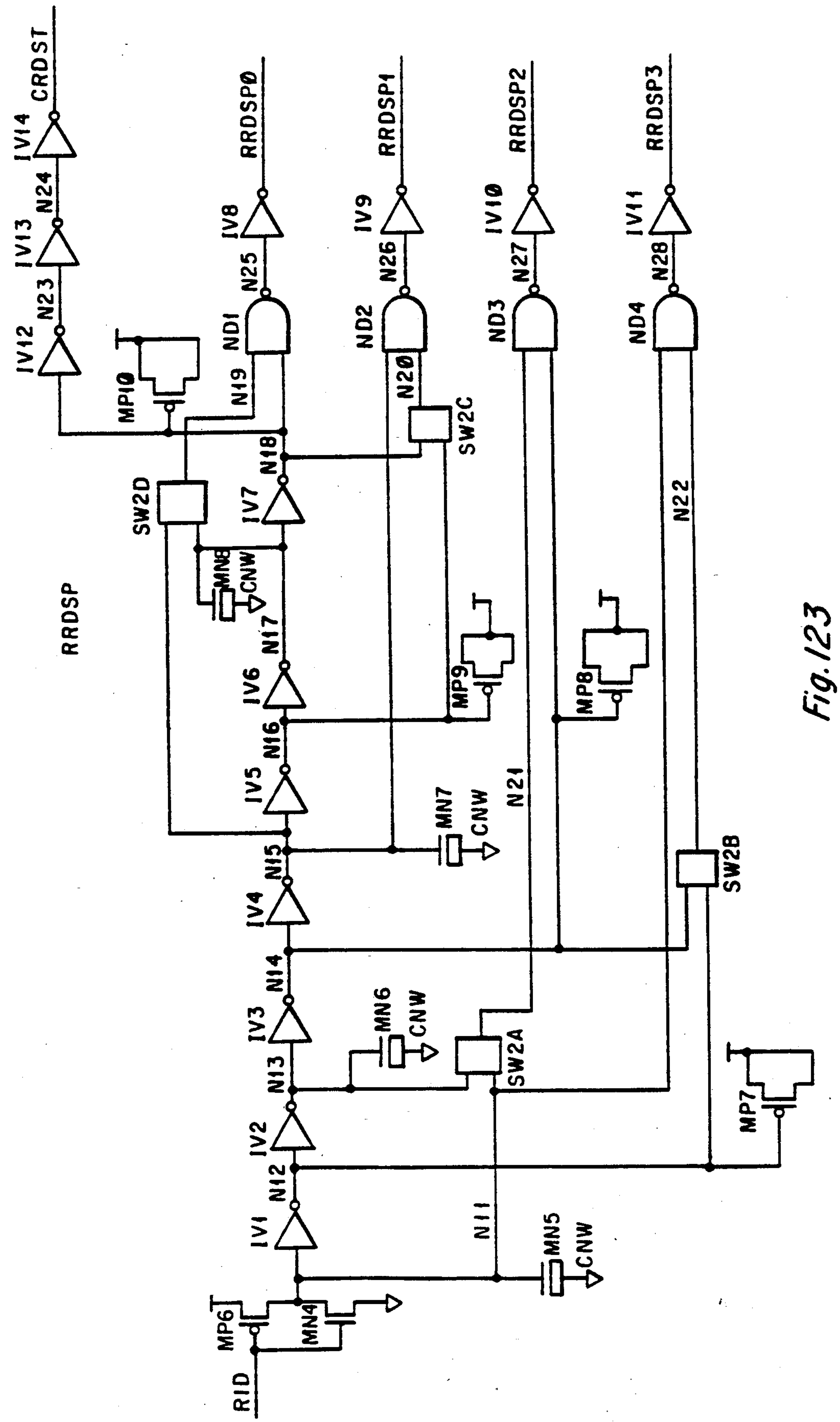

FIG. 123 illustrates the RRDSP Circuit.

Figure 124:
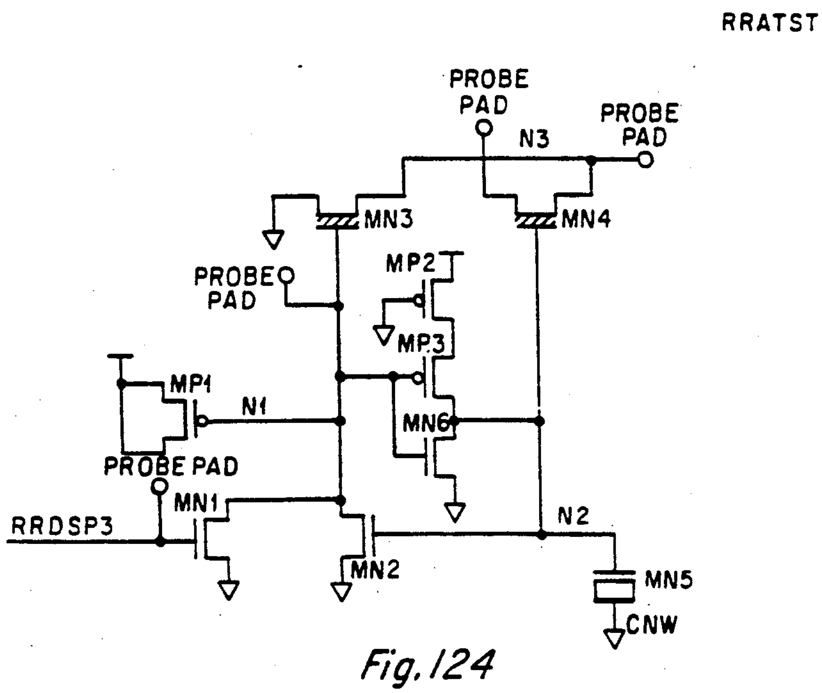

FIG. 124 illustrates the Row Redundancy Address Test Circuit, RRATST.

Figure 125:
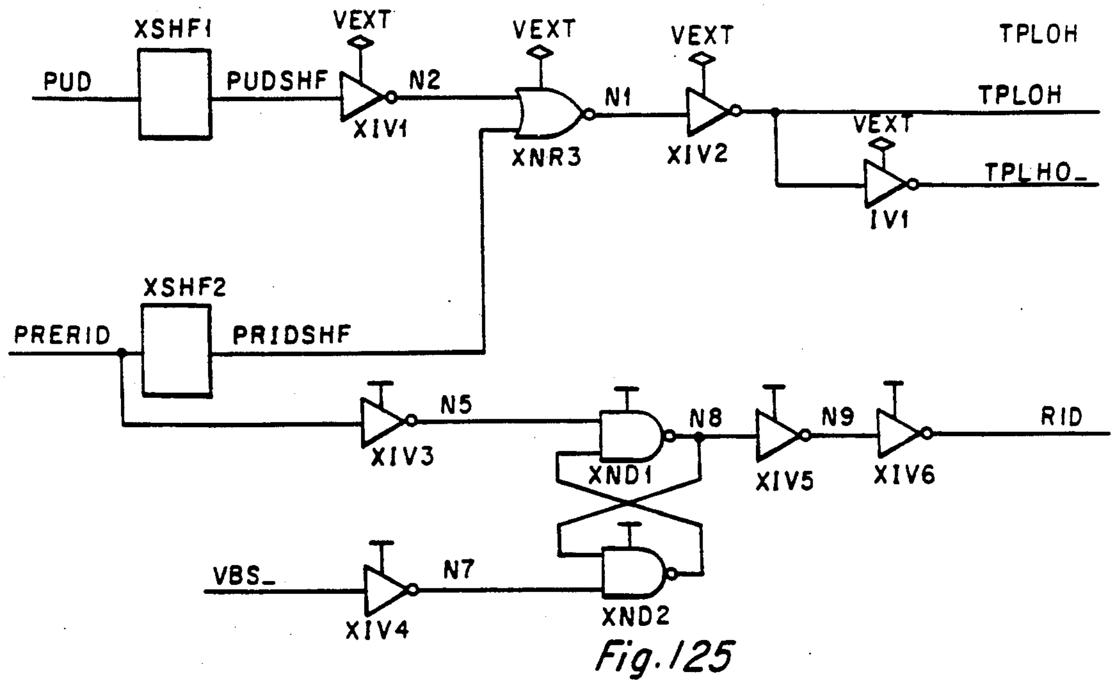

FIG. 125 illustrates the TPLHO Circuit, or the Top Plate Holdoff Circuit.

Figure 126:
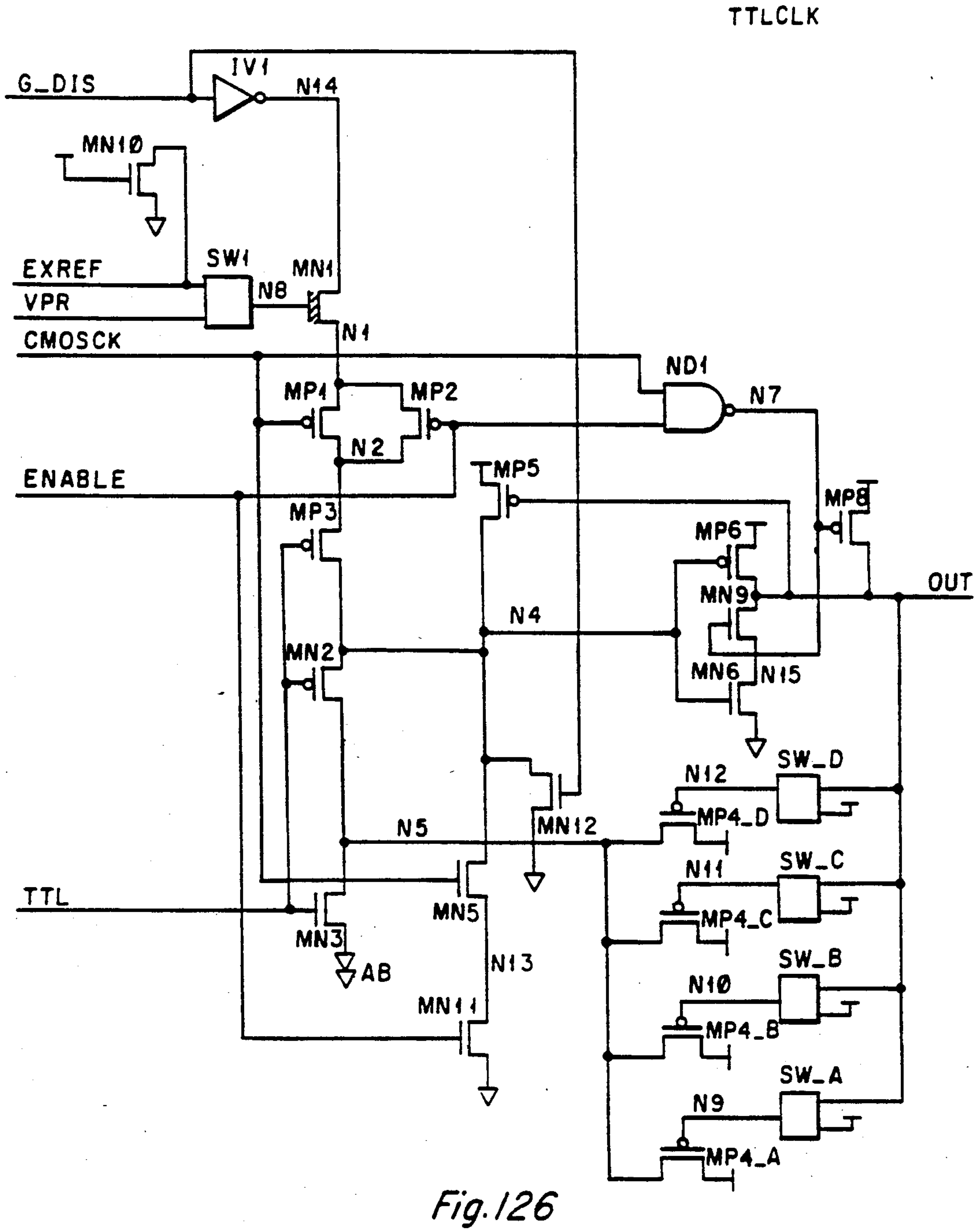

FIG. 126 illustrates the TTLCLK Circuit, or the TTL Clock Circuit.

Figure 127:
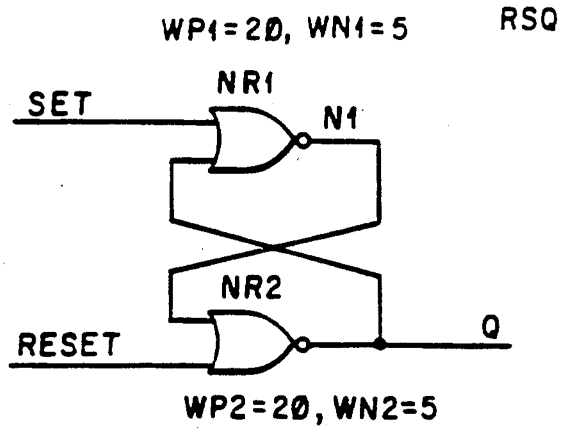

FIG. 127 illustrates the RS Latch, RSQ.

Figure 128:
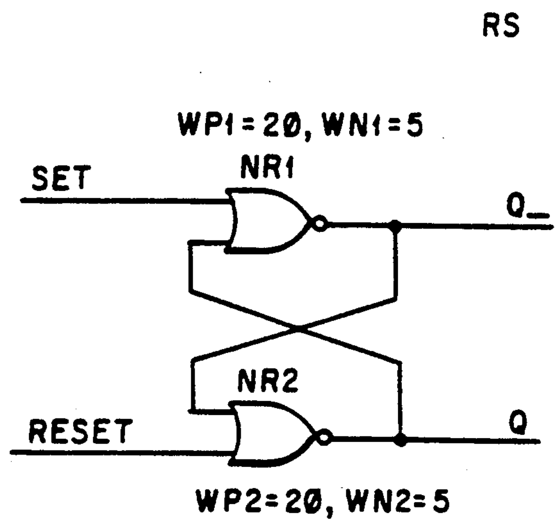

FIG. 128 illustrates the RS Latch, RS.

Figure 129:
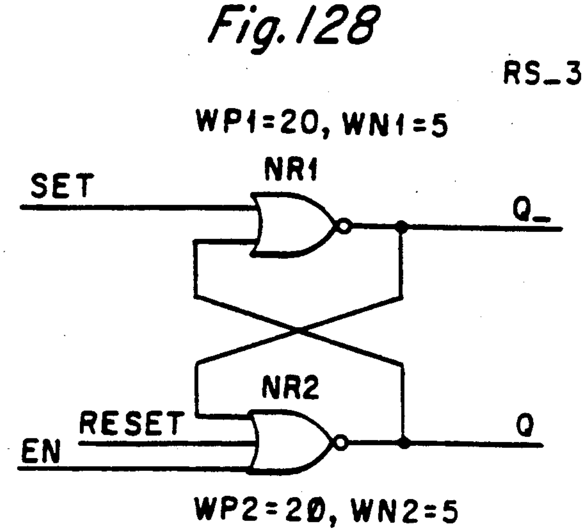

FIG. 129 illustrates the RS Latch, RS_3.

Figure 130:
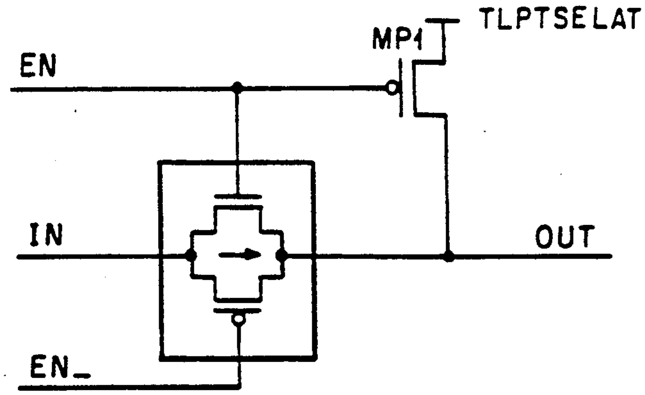

FIG. 130 illustrates the TLPTSELA Circuit.

Figure 131:
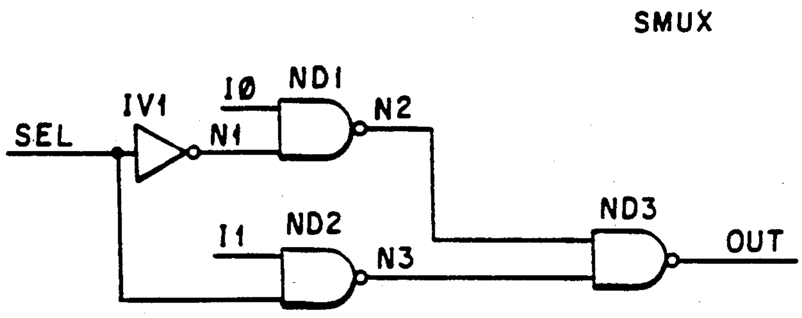

FIG. 131 illustrates the Multiplexor Circuit, SMUX.

Figure 132:
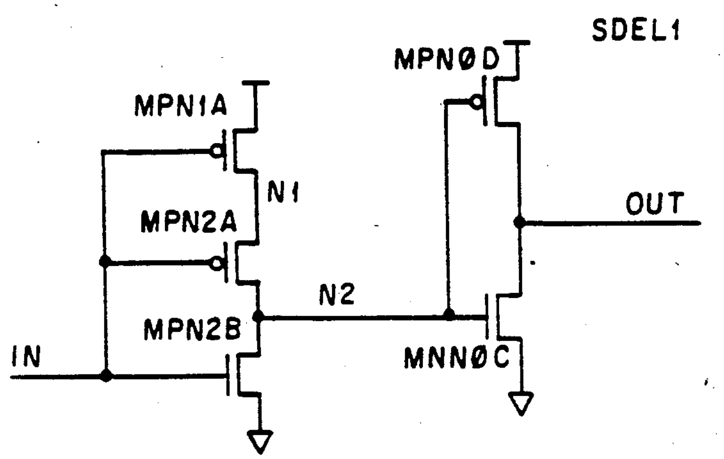

FIG. 132 illustrates the Delay Element, SDEL1.

Figure 133:
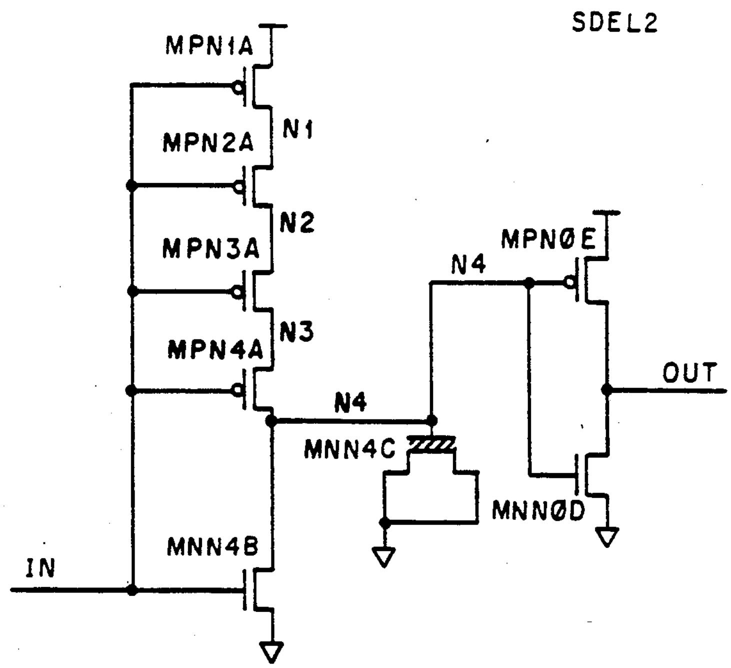

FIG. 133 illustrates the Delay Element SDEL2.

Figure 134:
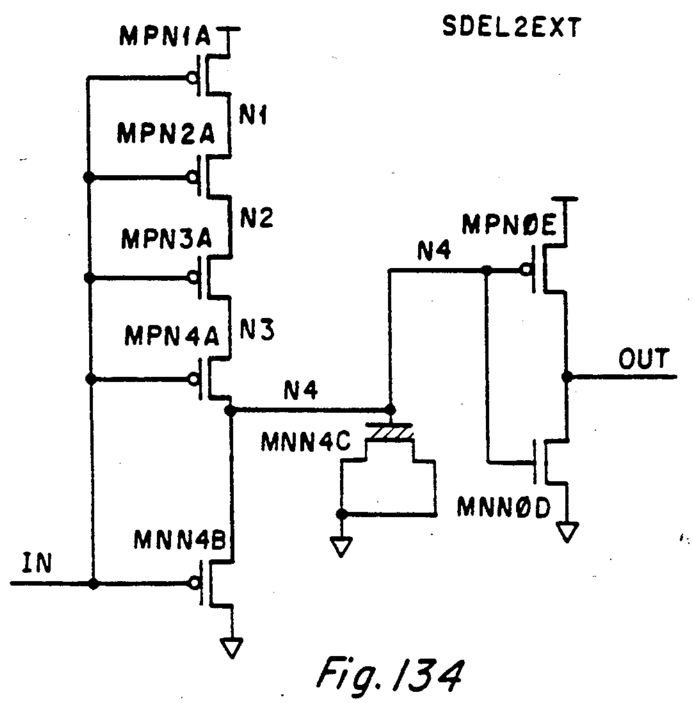

FIG. 134 illustrates the Delay Element SDEL2EXT.

Figure 135:
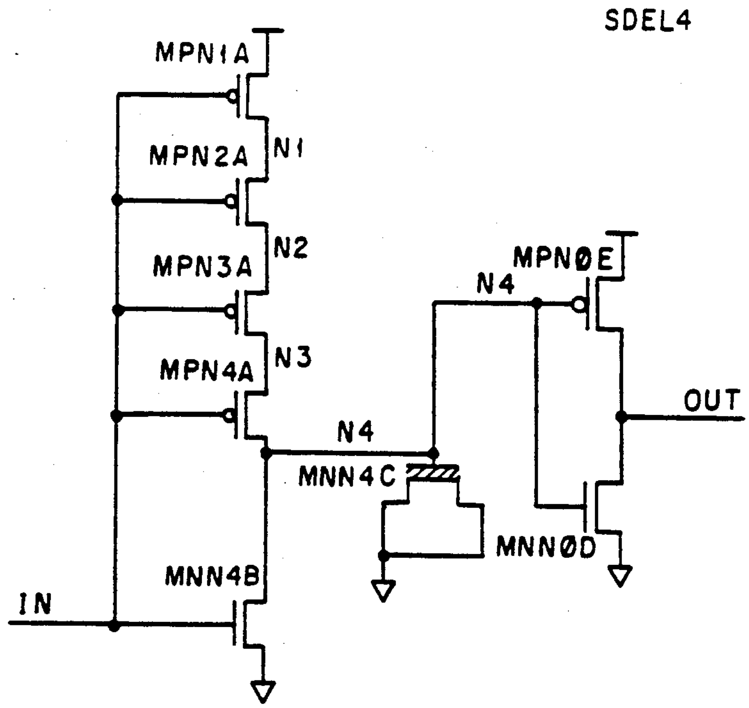

FIG. 135 illustrates the Delay Element SDEL4.

Figure 136:
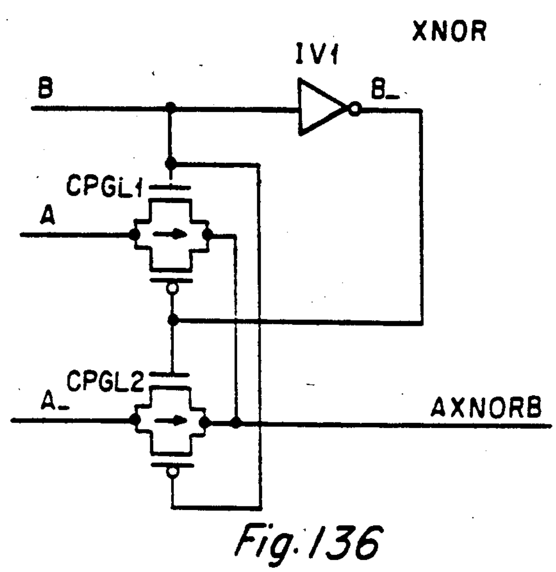

FIG. 136 illustrates the logic Circuit XNOR.

Figure 137:
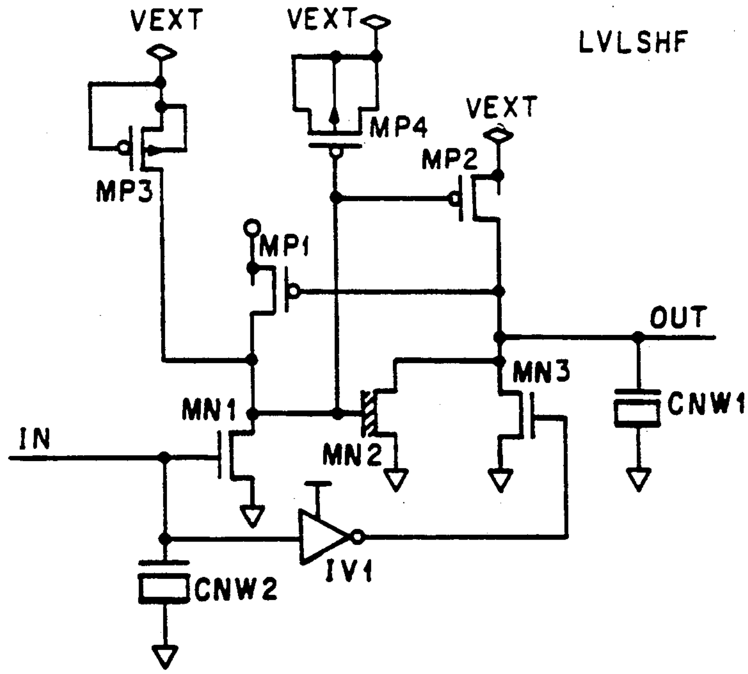

FIG. 137 illustrates the Level Shift Circuit, LVLSHF.

Figure 138:
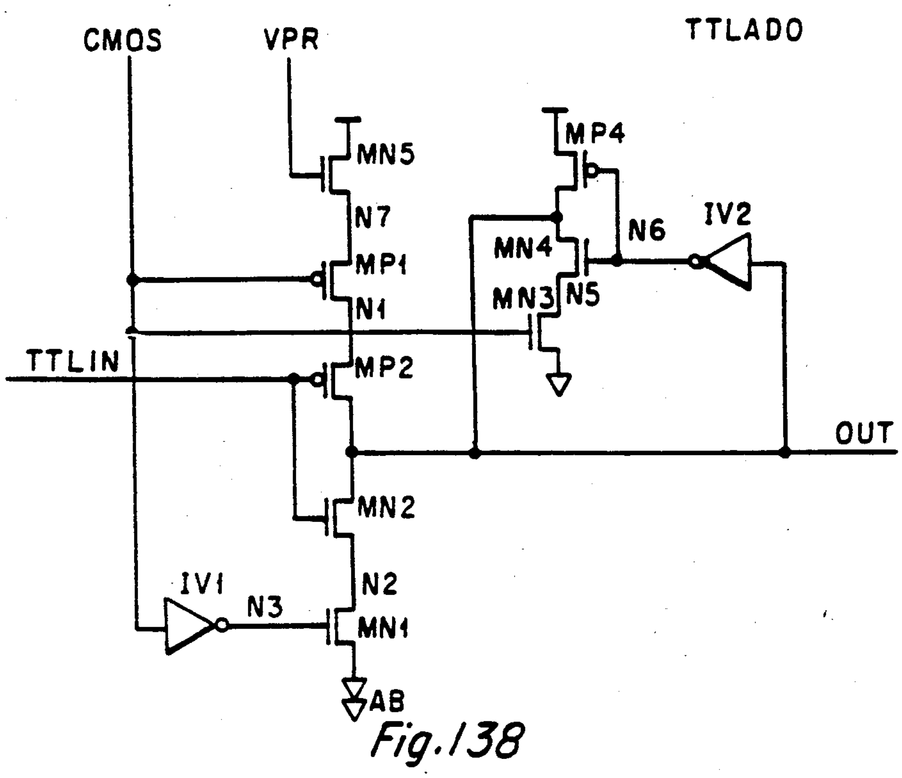

FIG. 138 illustrates the Buffer Circuit, TTLADD.

Figure 139:
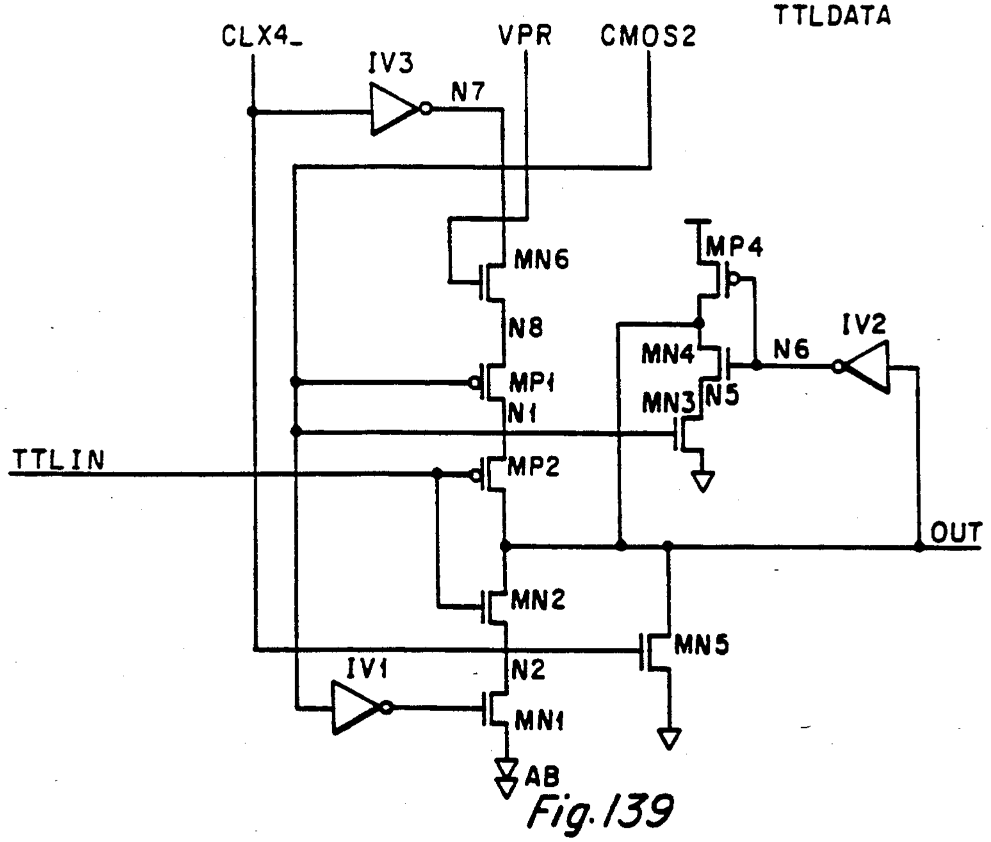

FIG. 139 illustrates the Buffer Circuit, TTLDATA.

Figure 140:
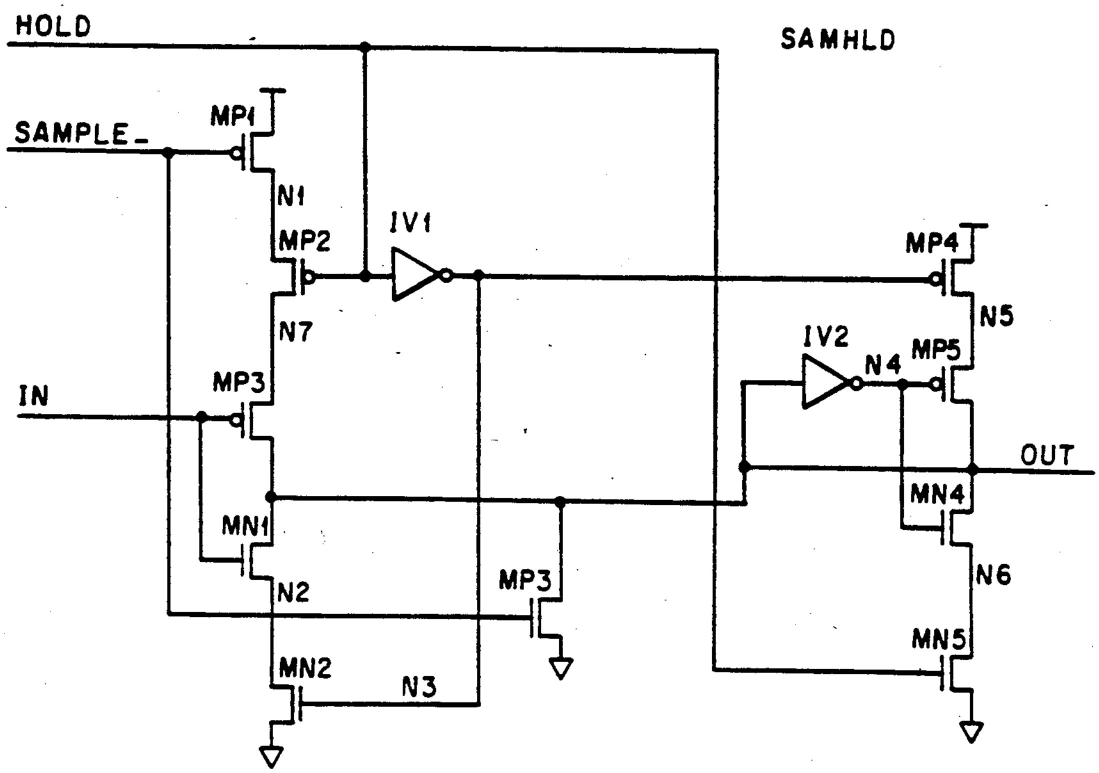

FIG. 140 illustrates the Sample and Hold Circuit, SAMHLD.

Figure 141:
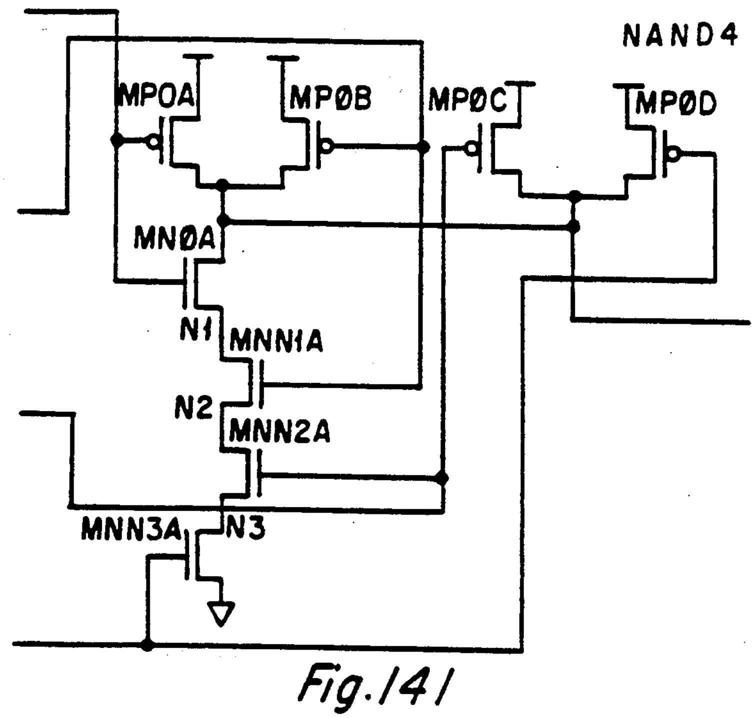

FIG. 141 illustrates the NAND Gate, NAND4.

Figure 142:
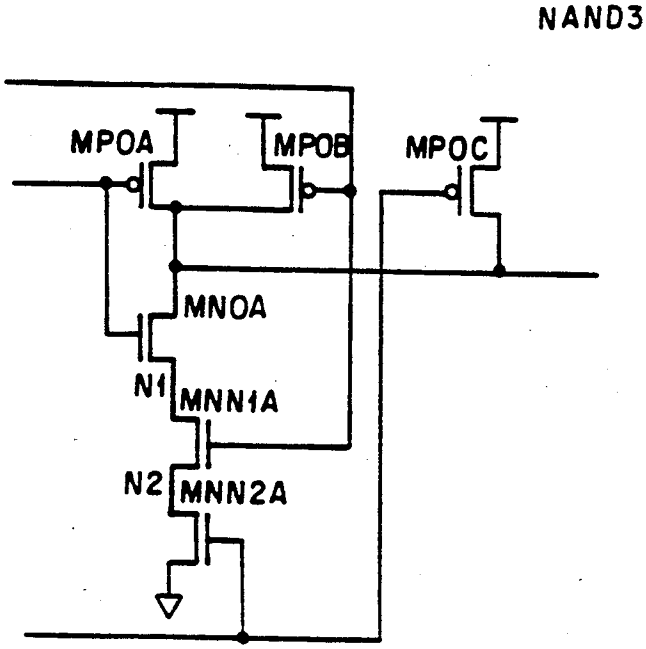

FIG. 142 illustrates the NAND gate NAND3.

Figure 143:
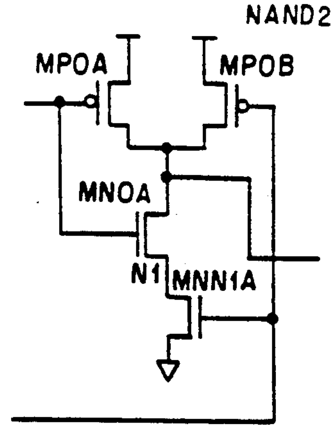

FIG. 143 illustrates the NAND gate NAND2.

Figure 144:
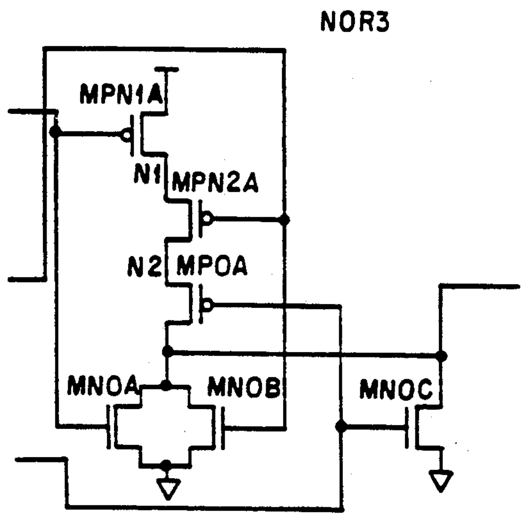

FIG. 144 illustrates the NOR Gate NOR3.

Figure 145:
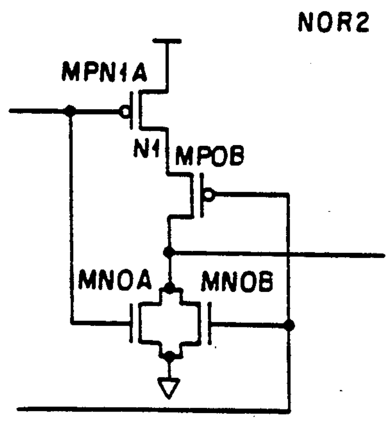

FIG. 145 illustrates the NOR Gate NOR2.

Figure 146:
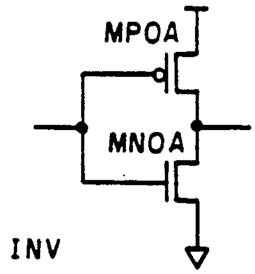

FIG. 146 illustrates the Inverter INV.

Figure 147:
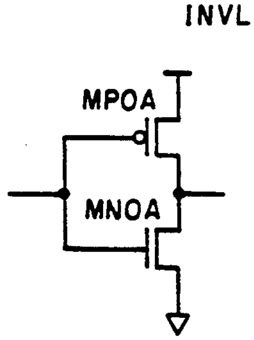

FIG. 147 illustrates the Inverter INVL.

Figure 148:
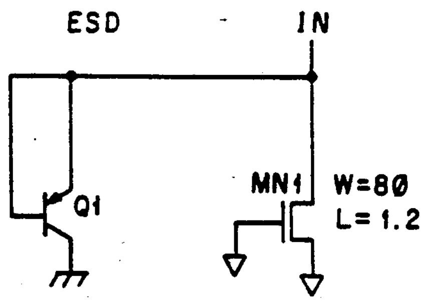

FIG. 148 illustrates the Circuit ESD.

Figure 149:
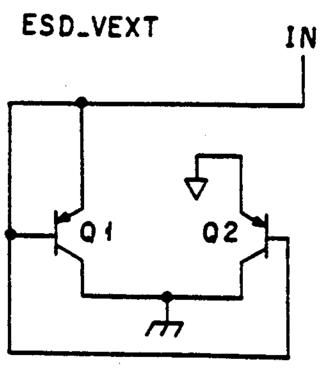

FIG. 149 illustrates the Circuit ESD_VEXT.

Figure 150:
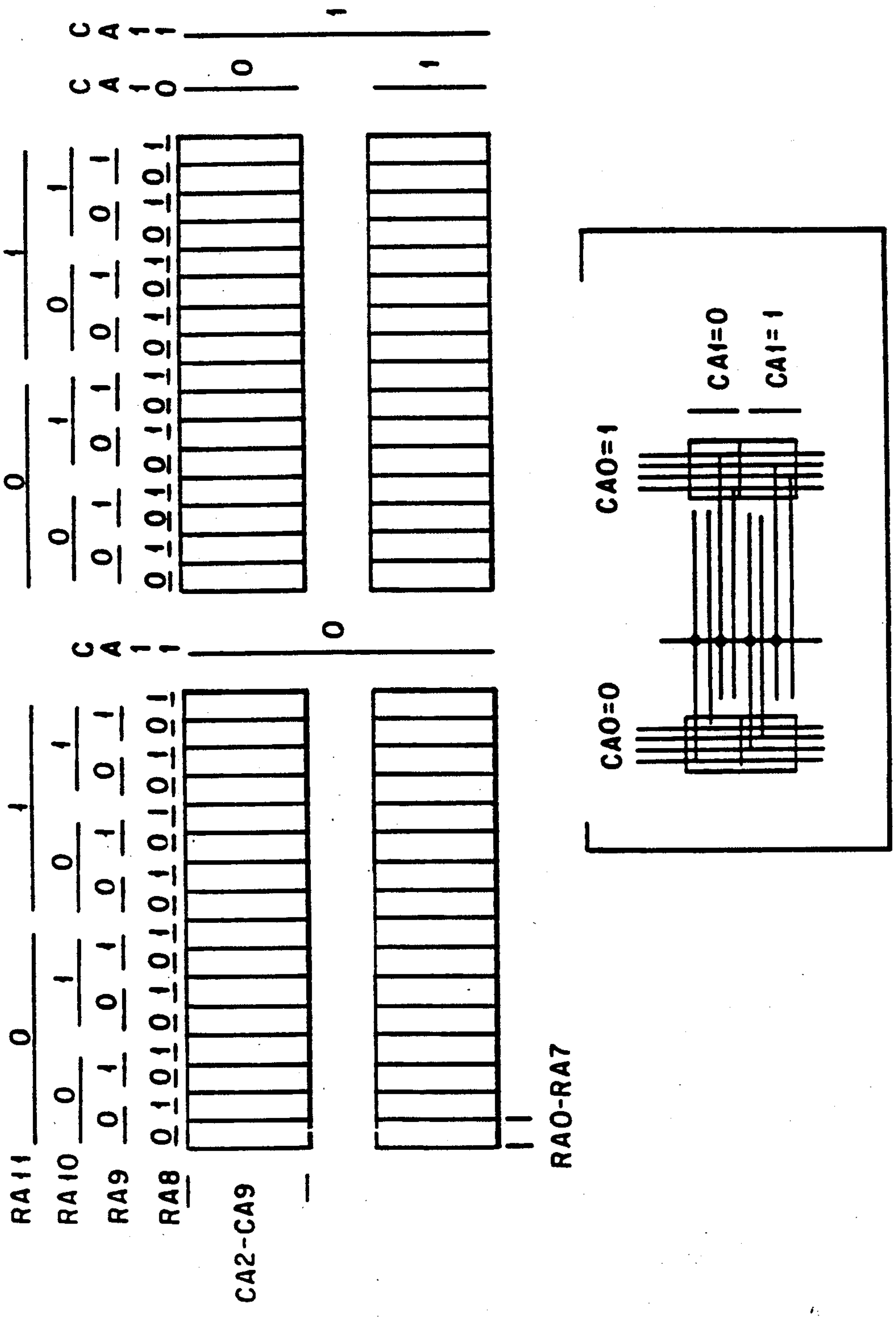

FIG. 150 is a block diagram illustrating the memory cell addressing sequence.

Figure 151:
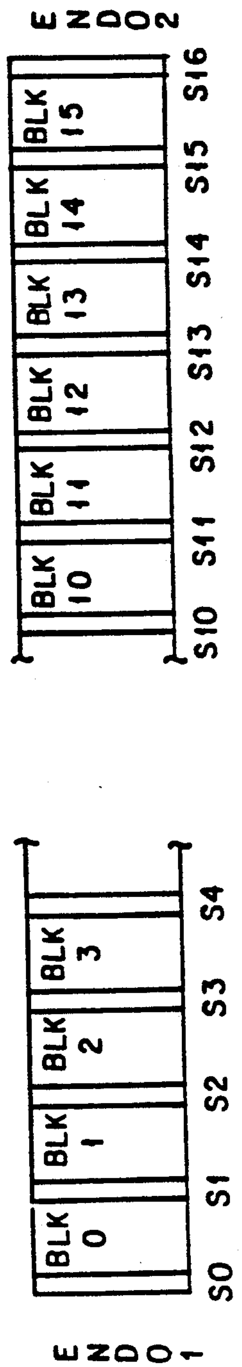

FIG. 151 is a block diagram illustrating the sense amp configuration for a memory quadrant.

Figure 152:
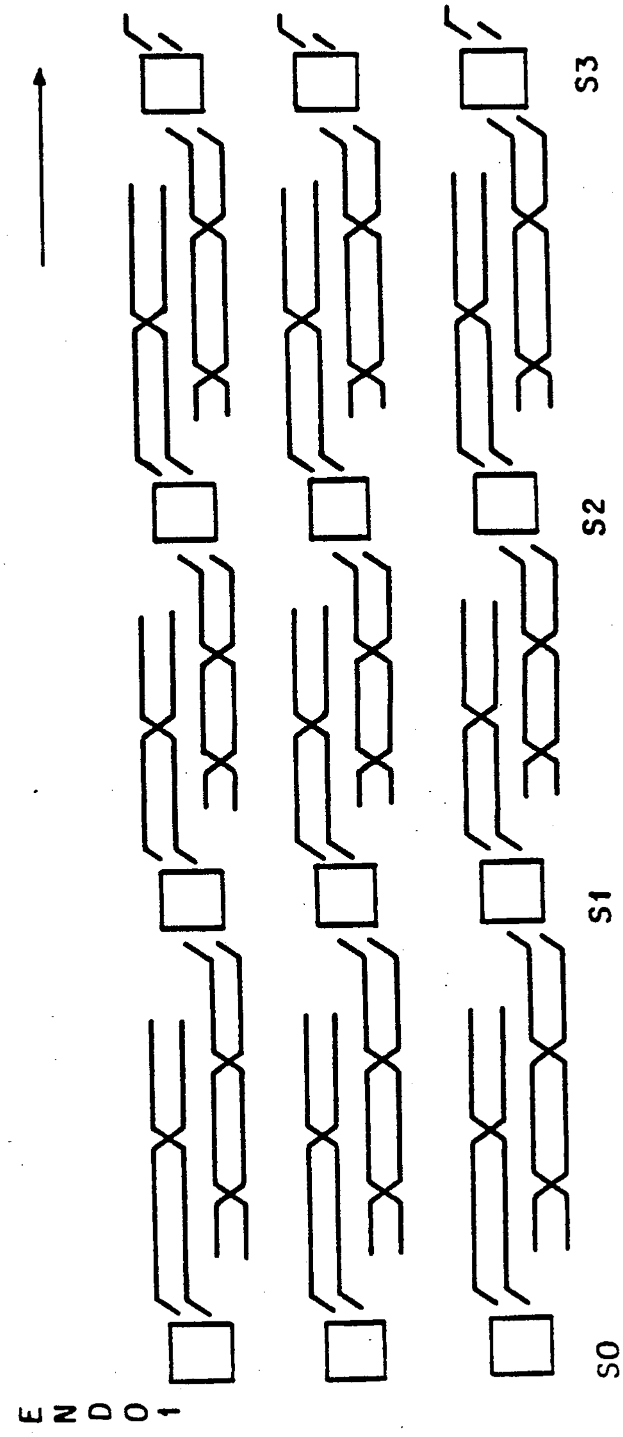

FIG. 152 is a block diagram further illustrating a portion of the sense amp configuration for a memory quadrant.

Figure 153:
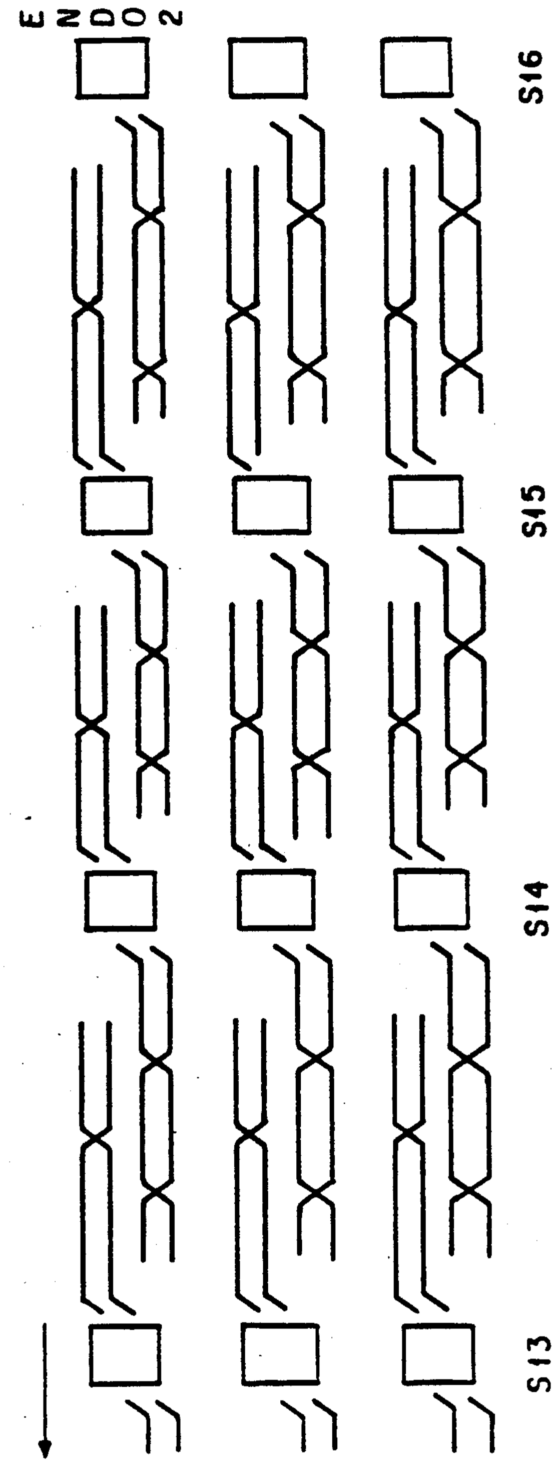

FIG. 153 is a block diagram further illustrating a portion of the sense amp configuration for a memory quadrant.

Figure 154:
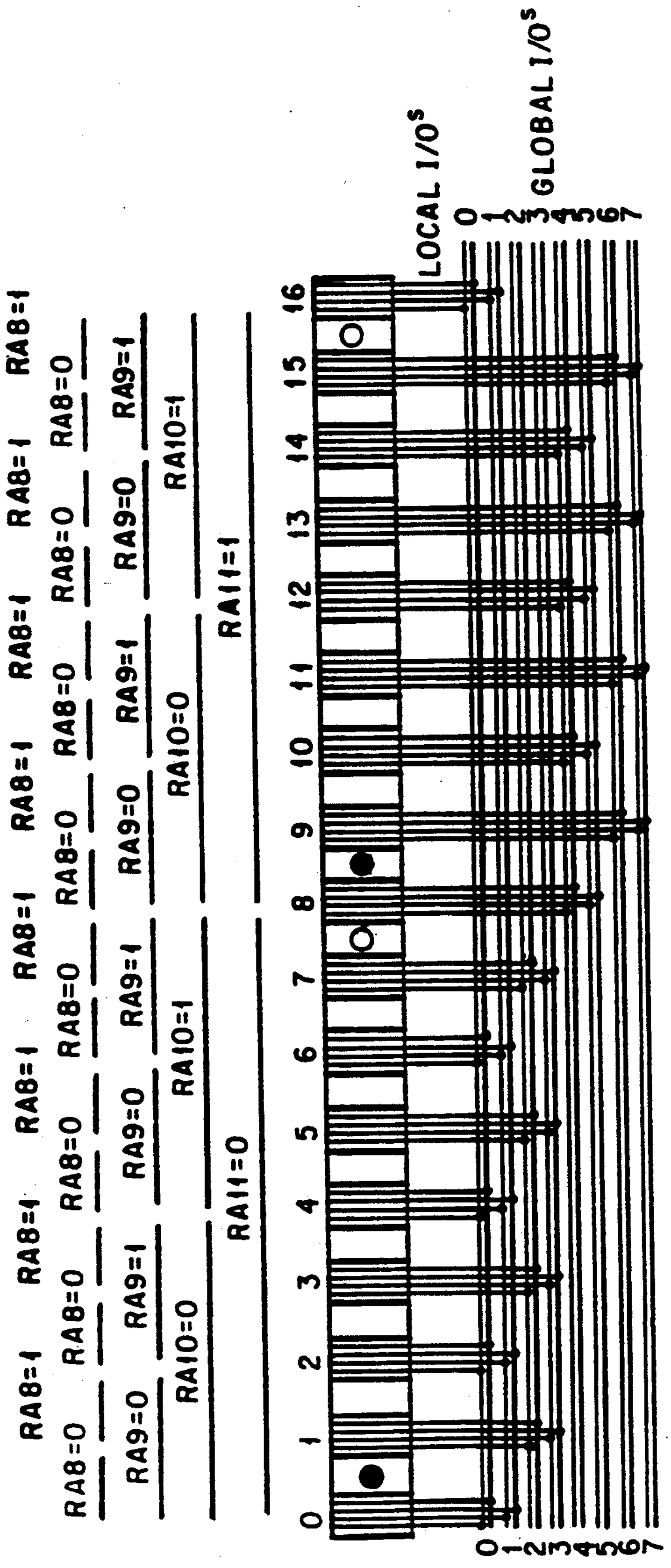

FIG. 154 is a system level diagram illustrating the Local I/O to Global I/O decoding for one quadrant of memory.

Figure 155:
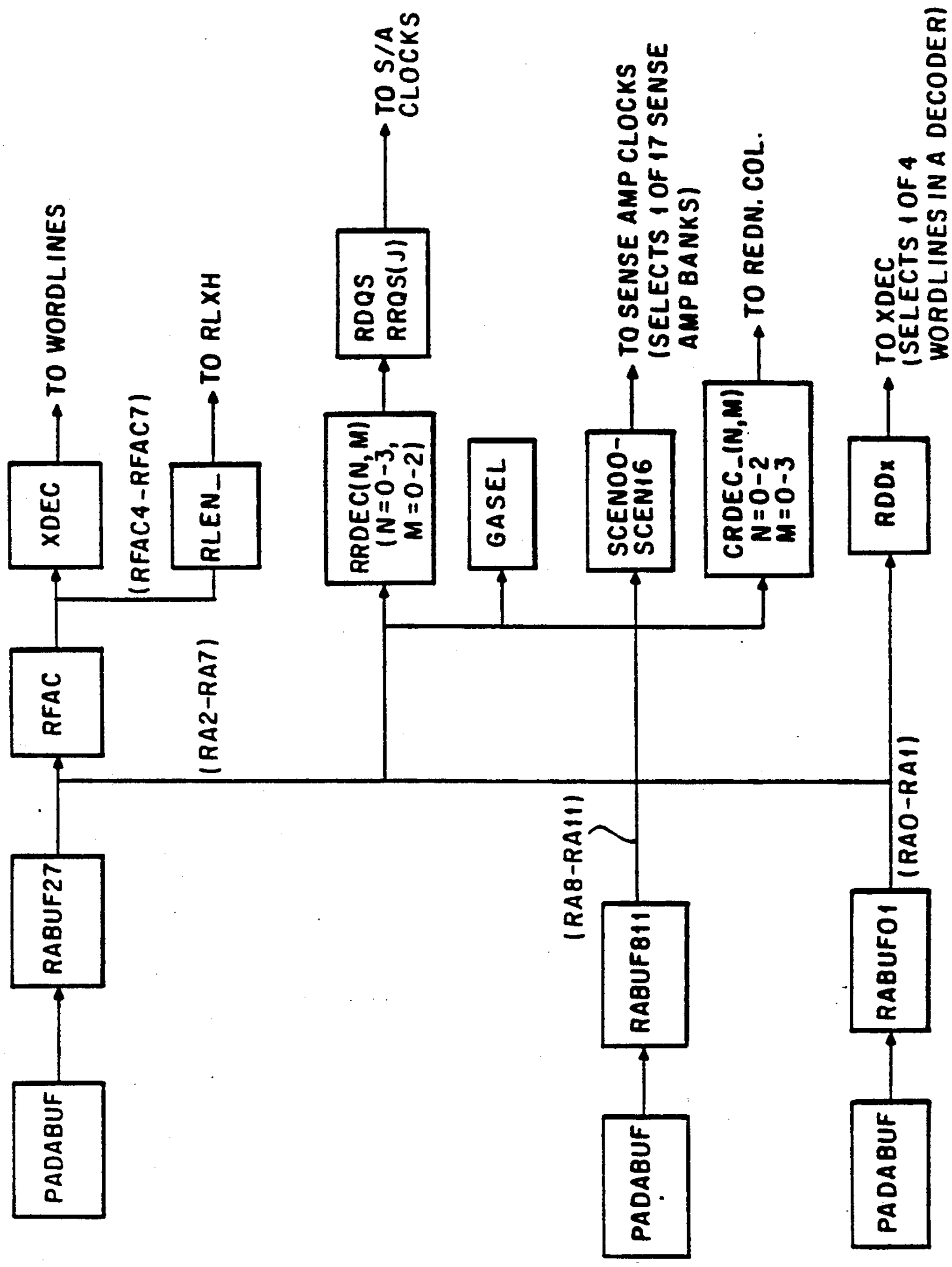

FIG. 155 is a partial block diagram of the row addressing scheme.

Figure 156:
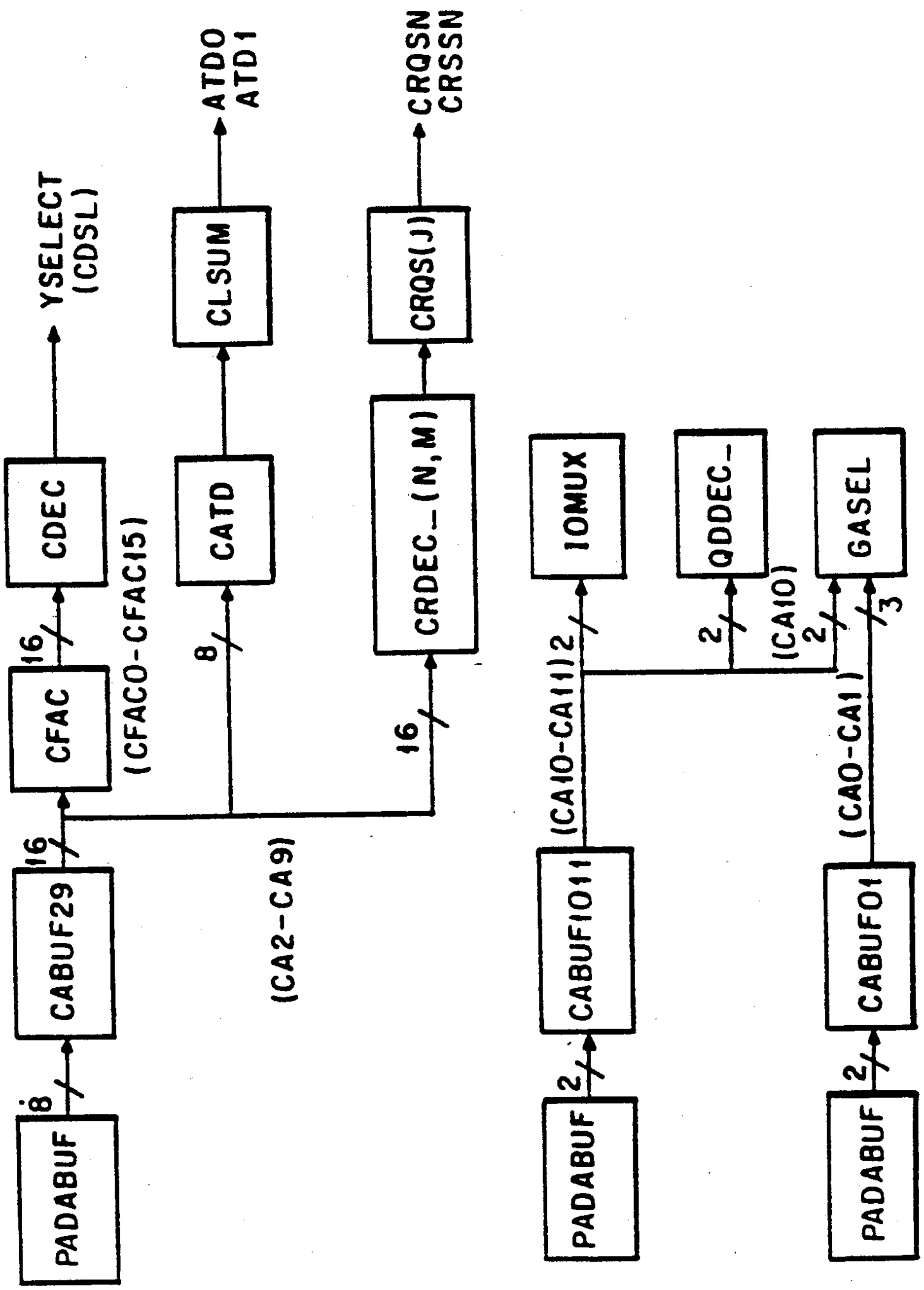

FIG. 156 is a partial block diagram of the column addressing scheme.

Note: there are no FIGS. 157 through 165.

Figure 166:
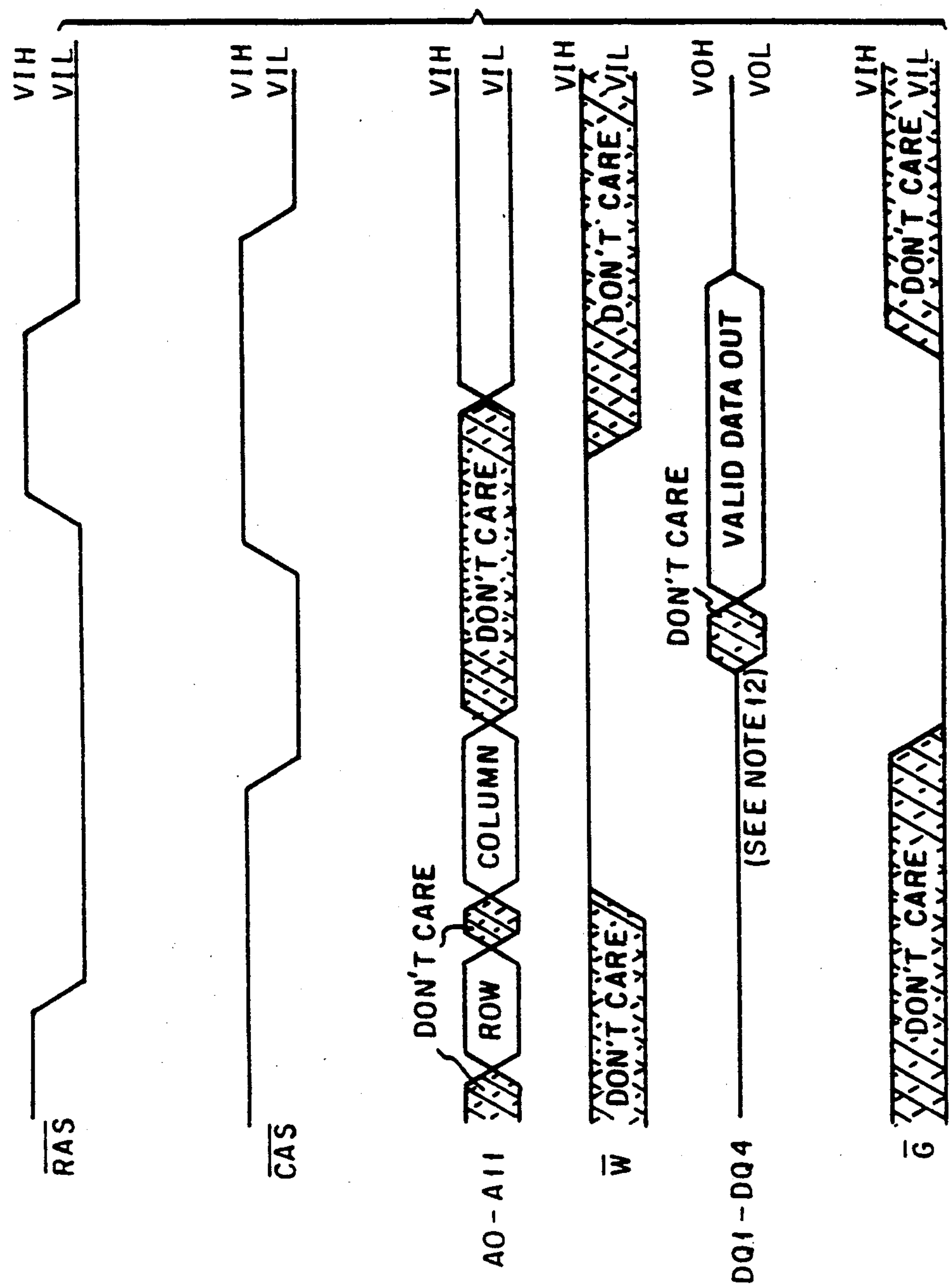

FIG. 166 is read cycle timing diagram.

Figure 167:
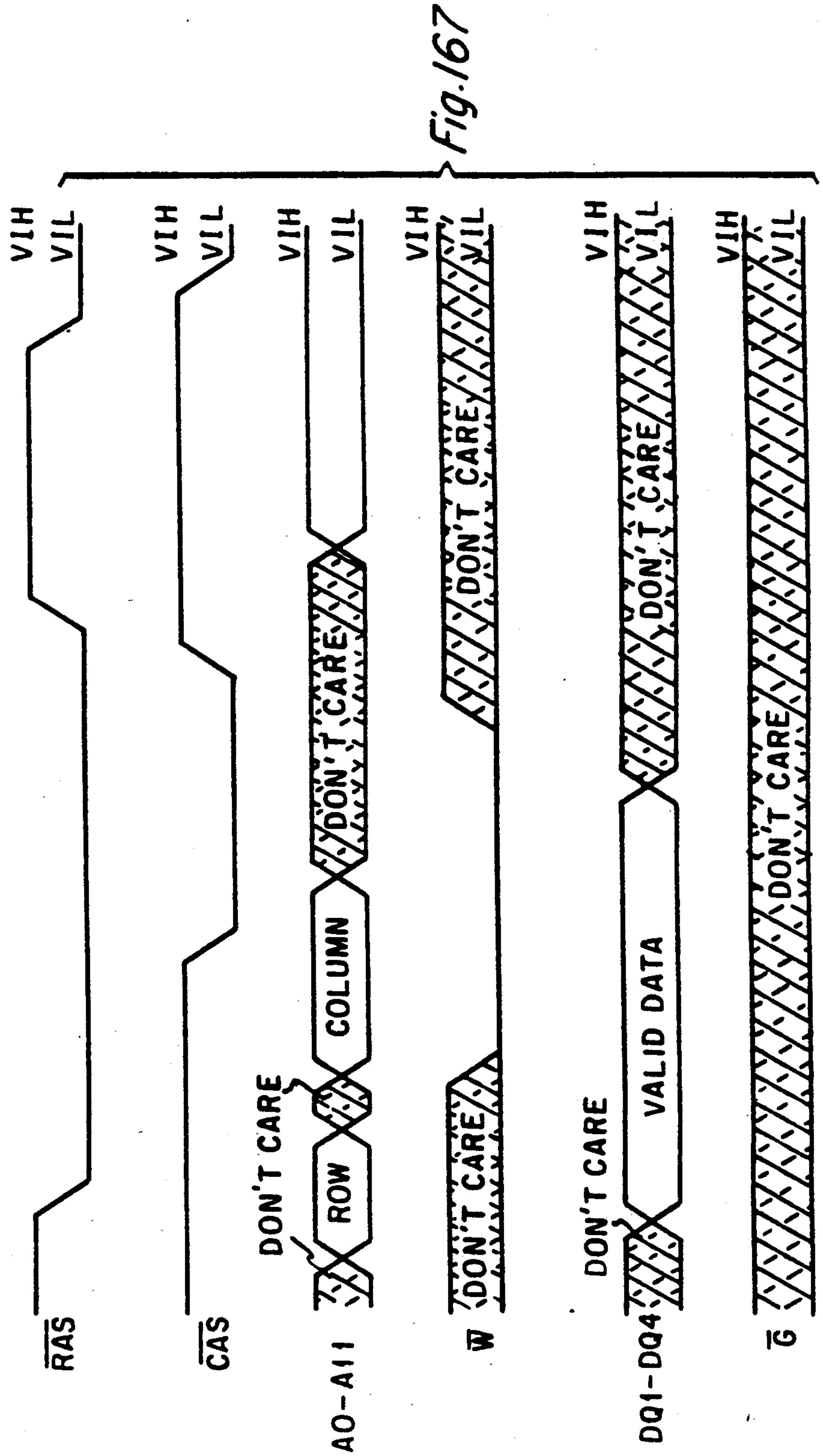

FIG. 167 is an early write cycle timing diagram.

Figure 168:
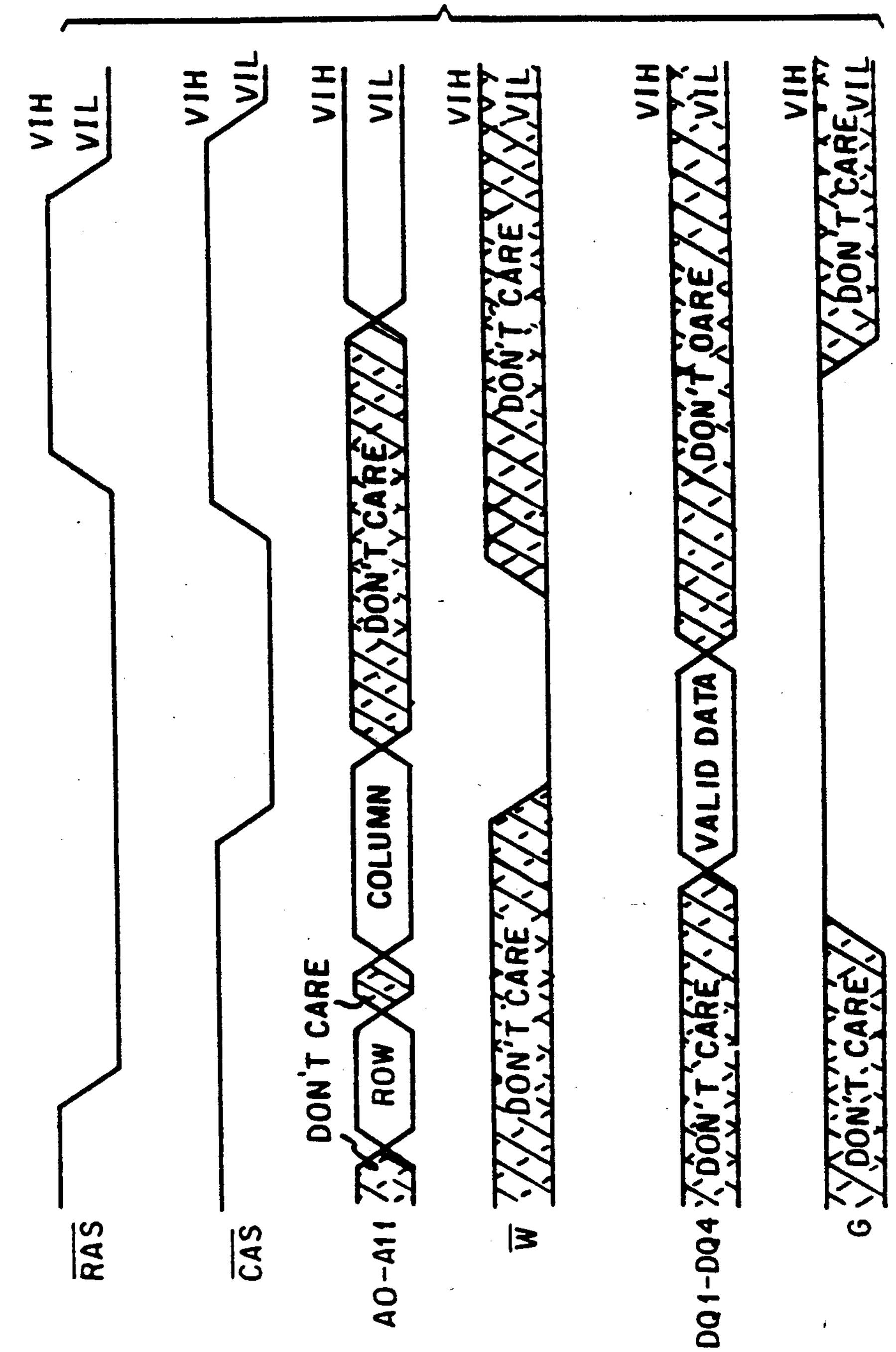

FIG. 168 is a write cycle timing diagram.

Figure 169:
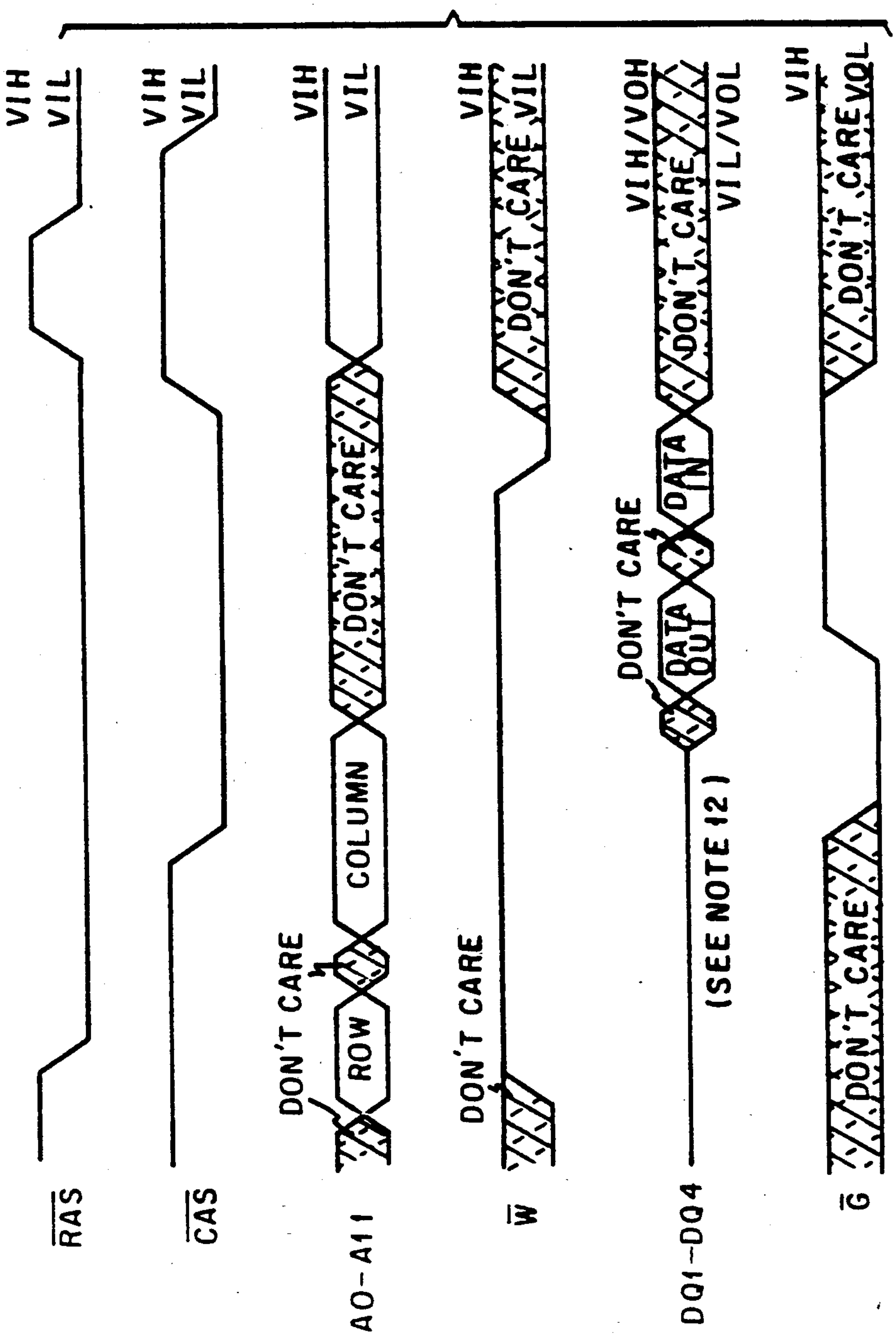

FIG. 169 is a read-write cycle timing diagram.

Figure 170:
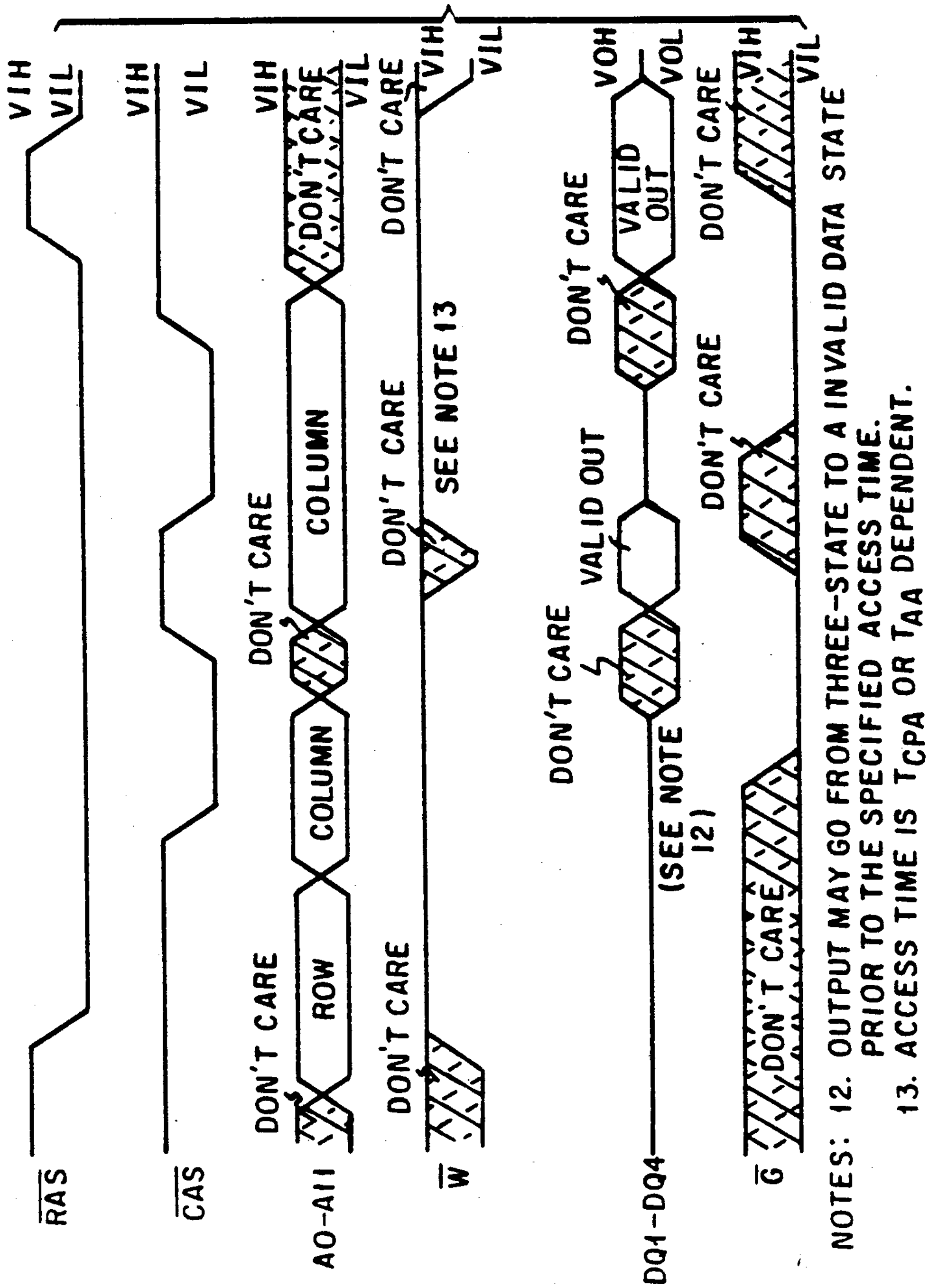

FIG. 170 is an enhanced page-mode read cycle timing diagram.

Figure 171:
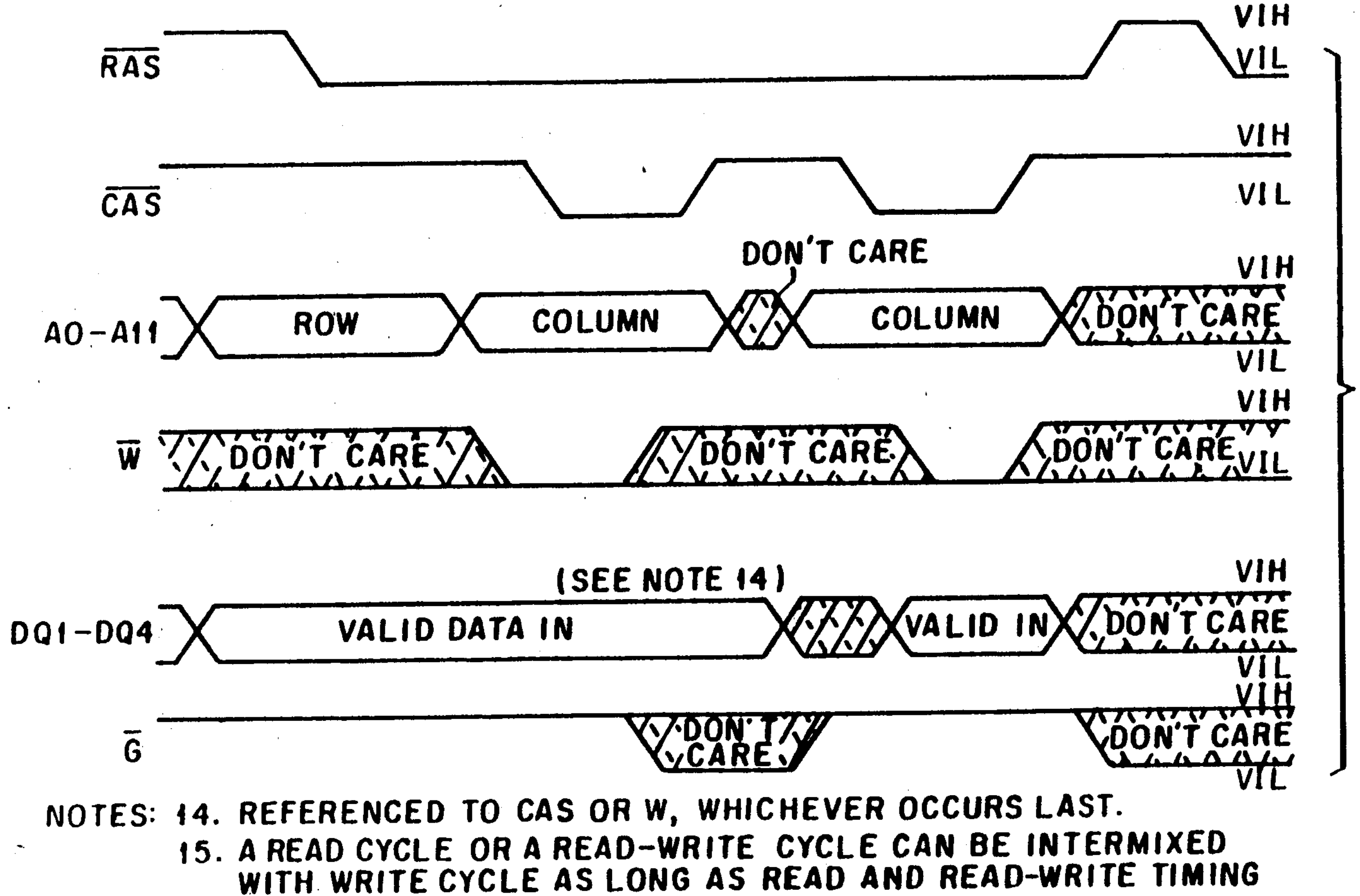

FIG. 171 is an enhanced page-mode write cycle timing diagram.

Figure 172:
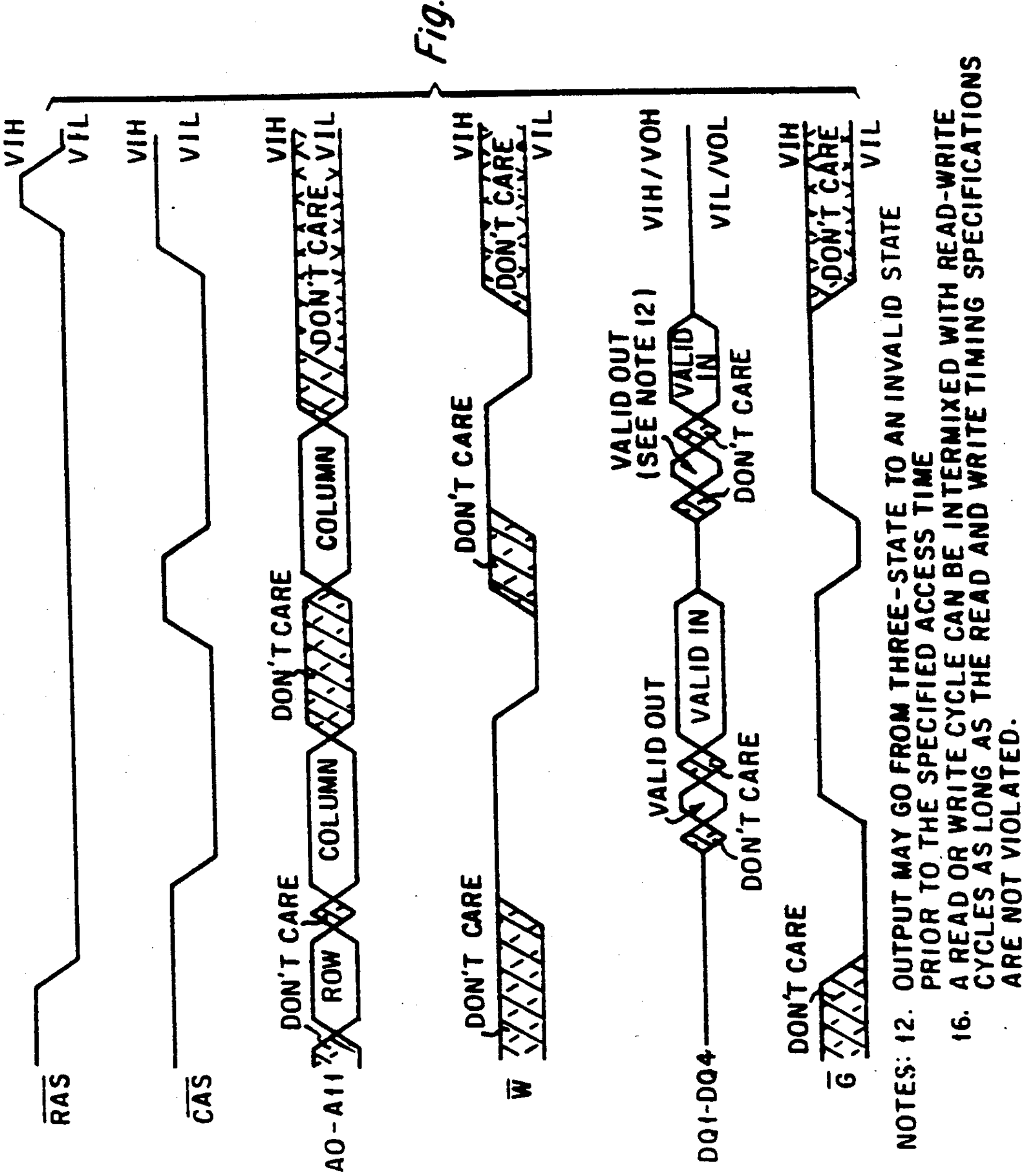

FIG. 172 is an enhanced page-mode read-write cycle timing diagram.

Figure 173:
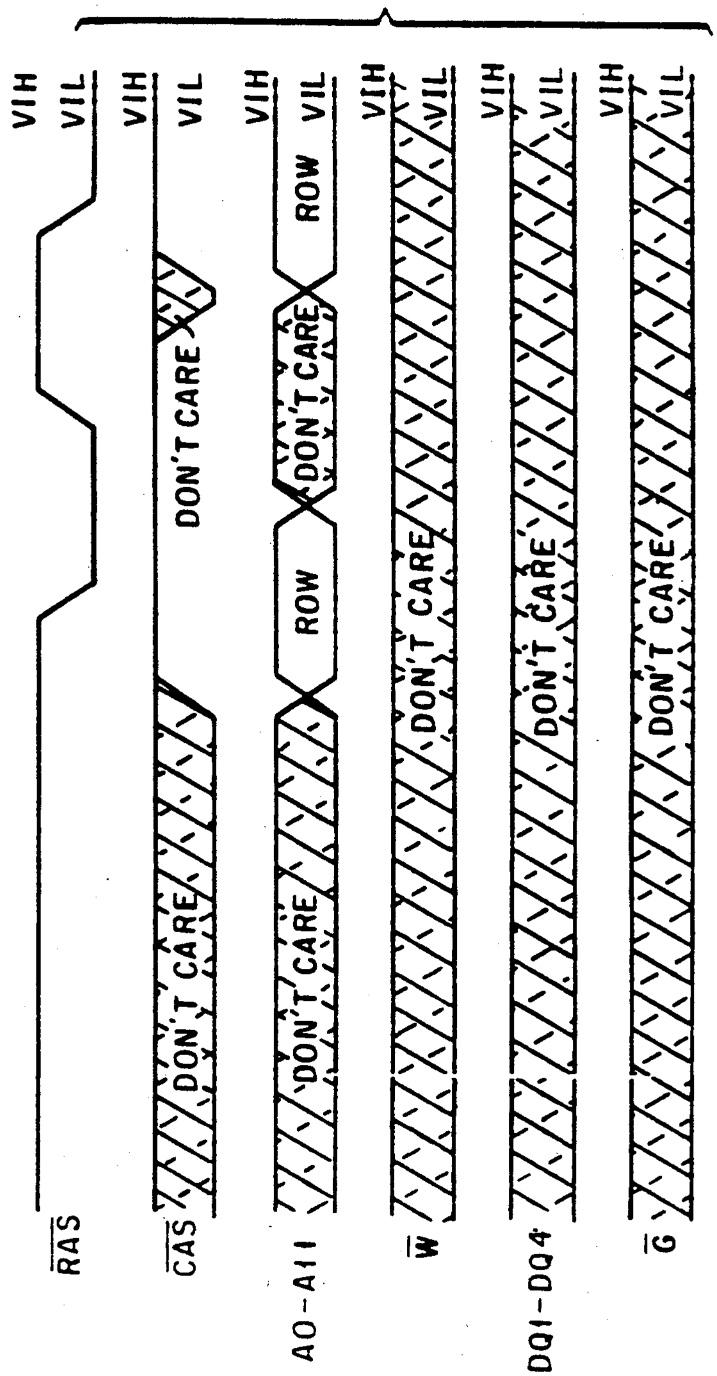

FIG. 173 is a RAS_only refresh cycle timing diagram.

Figure 174:
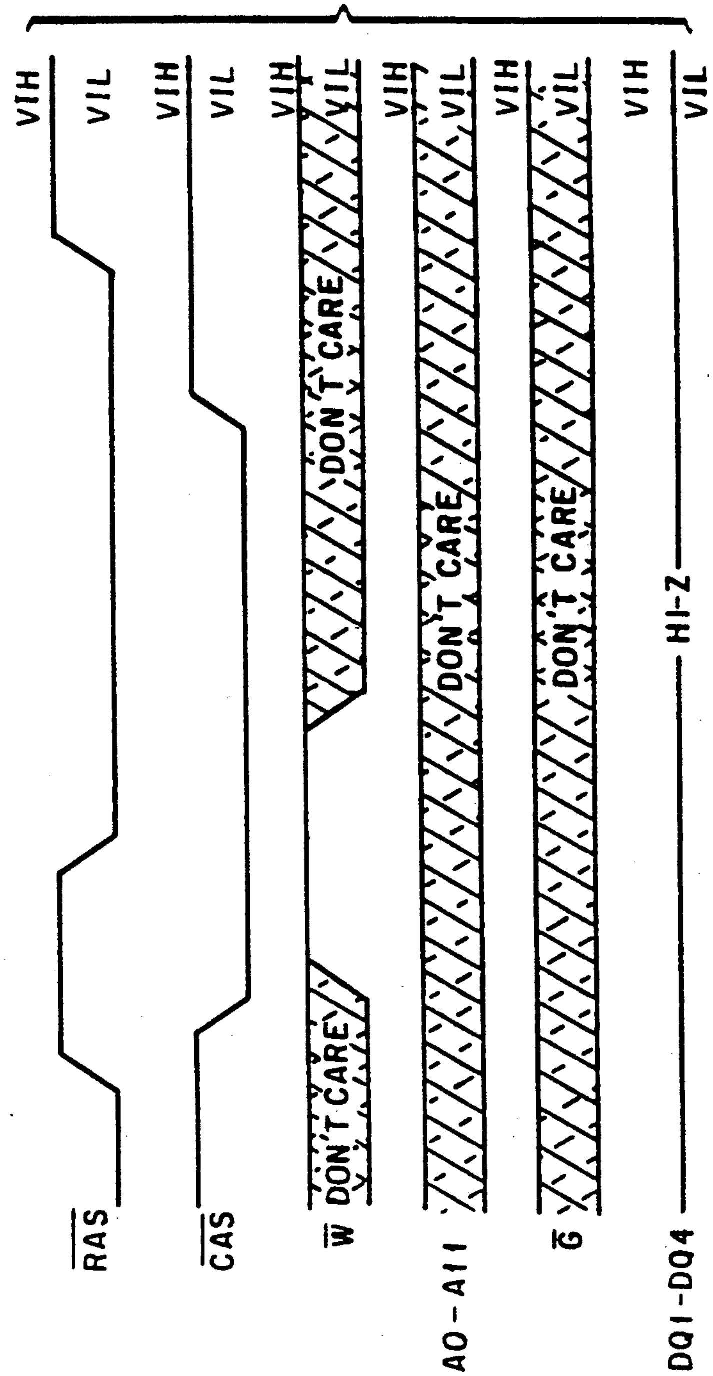

FIG. 174 is an automatic CAS_before RAS_refresh cycle timing diagram.

Figure 175:
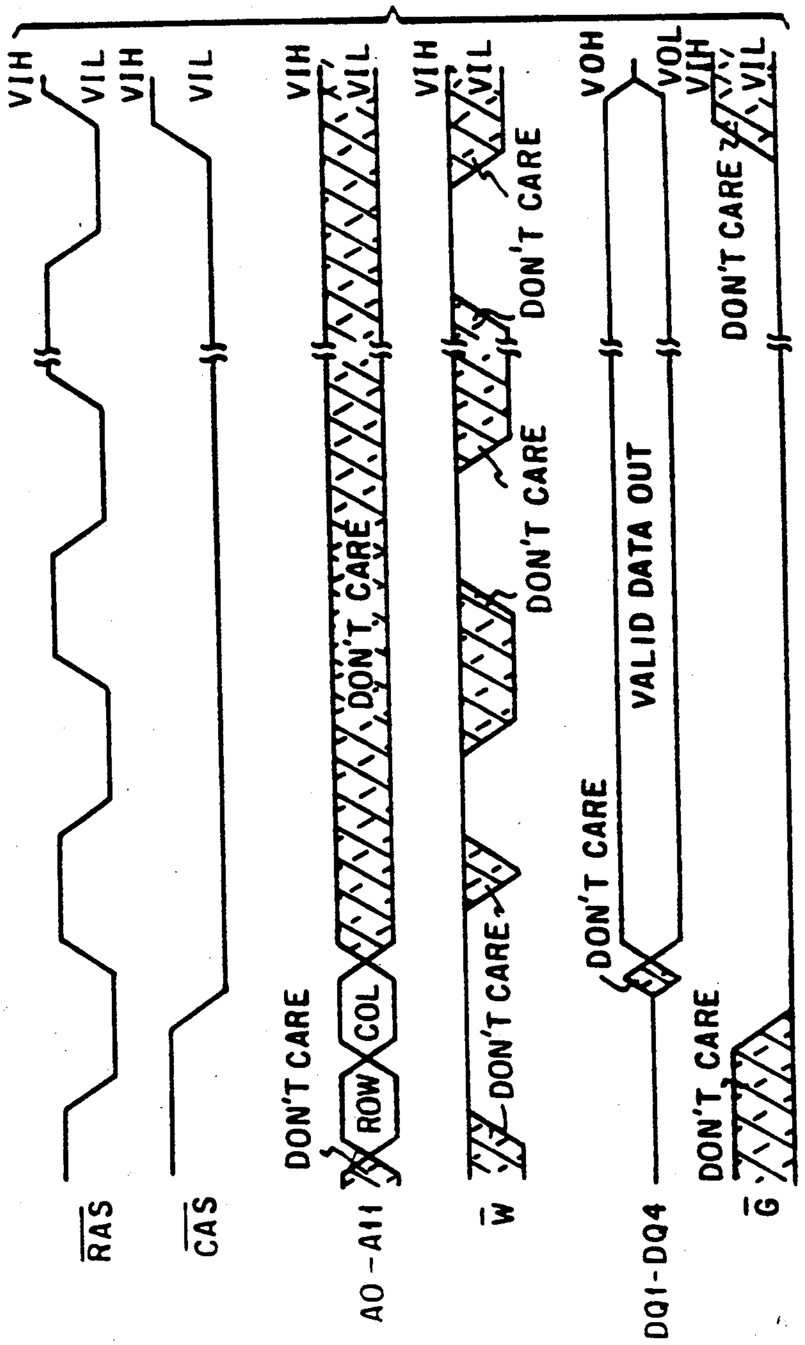

FIG. 175 is a hidden refresh cycle (READ) cycle timing diagram.

Figure 176:
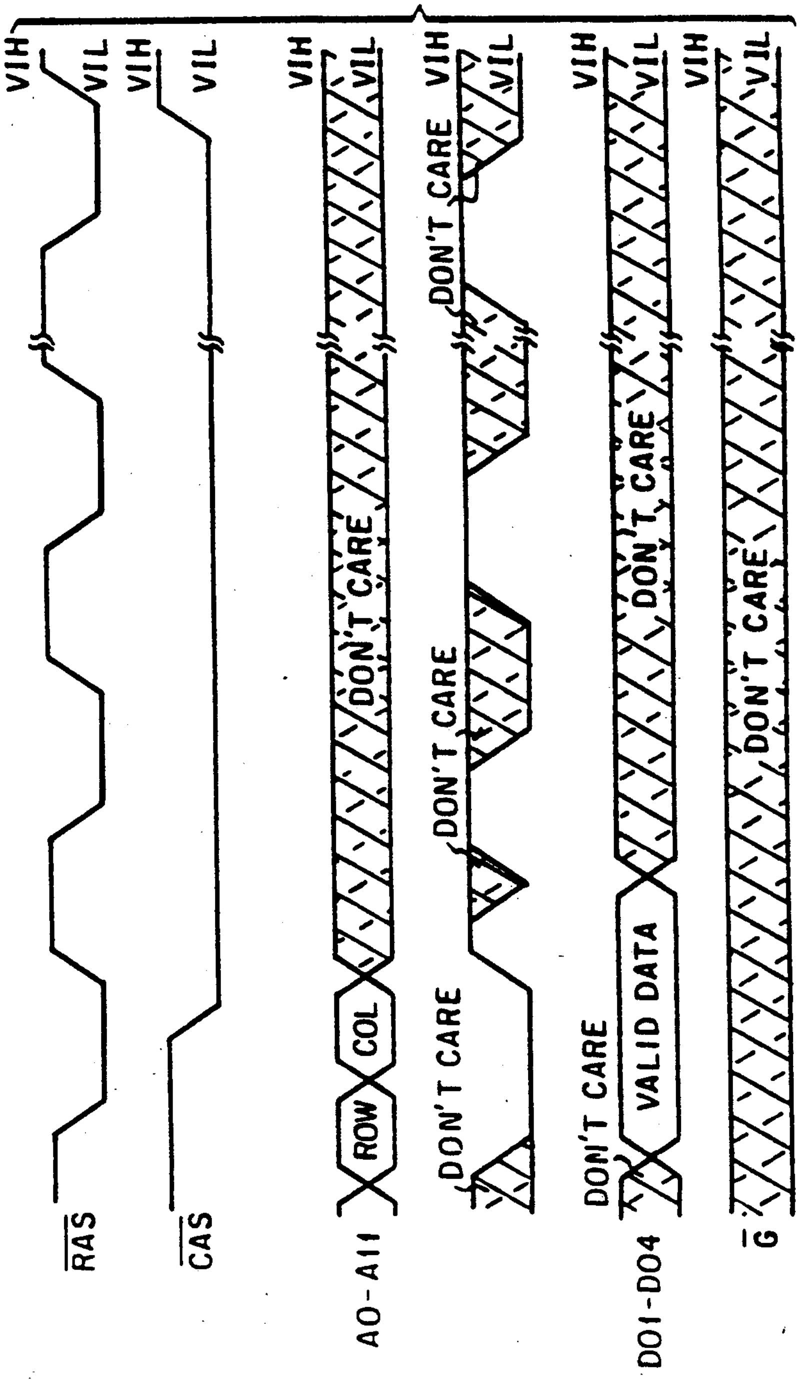

FIG. 176 is a hidden refresh cycle (WRITE) cycle timing diagram.

Figure 177:
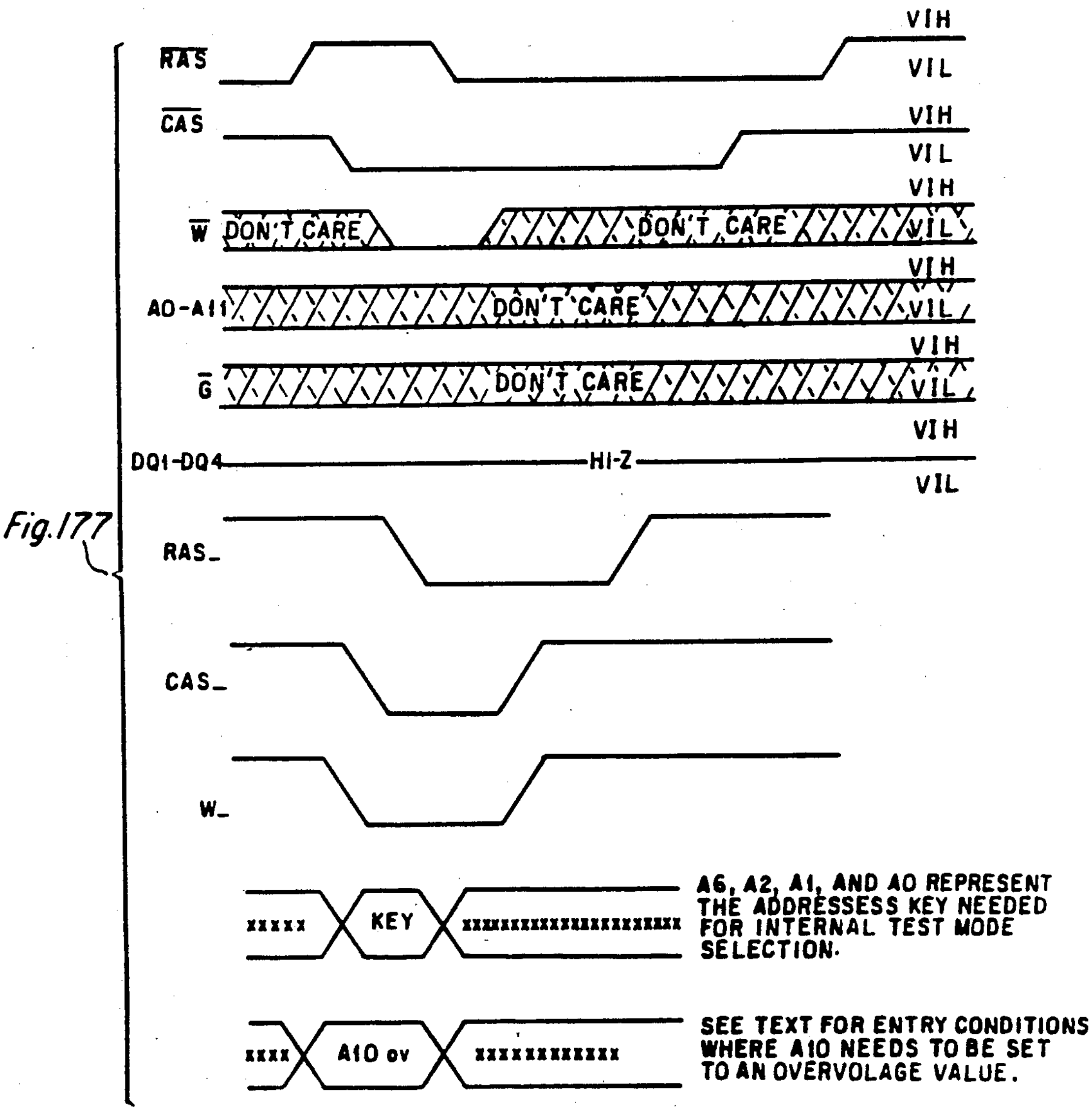

FIG. 177 is a test mode entry (WCBR) cycle timing diagram.

Figure 178:
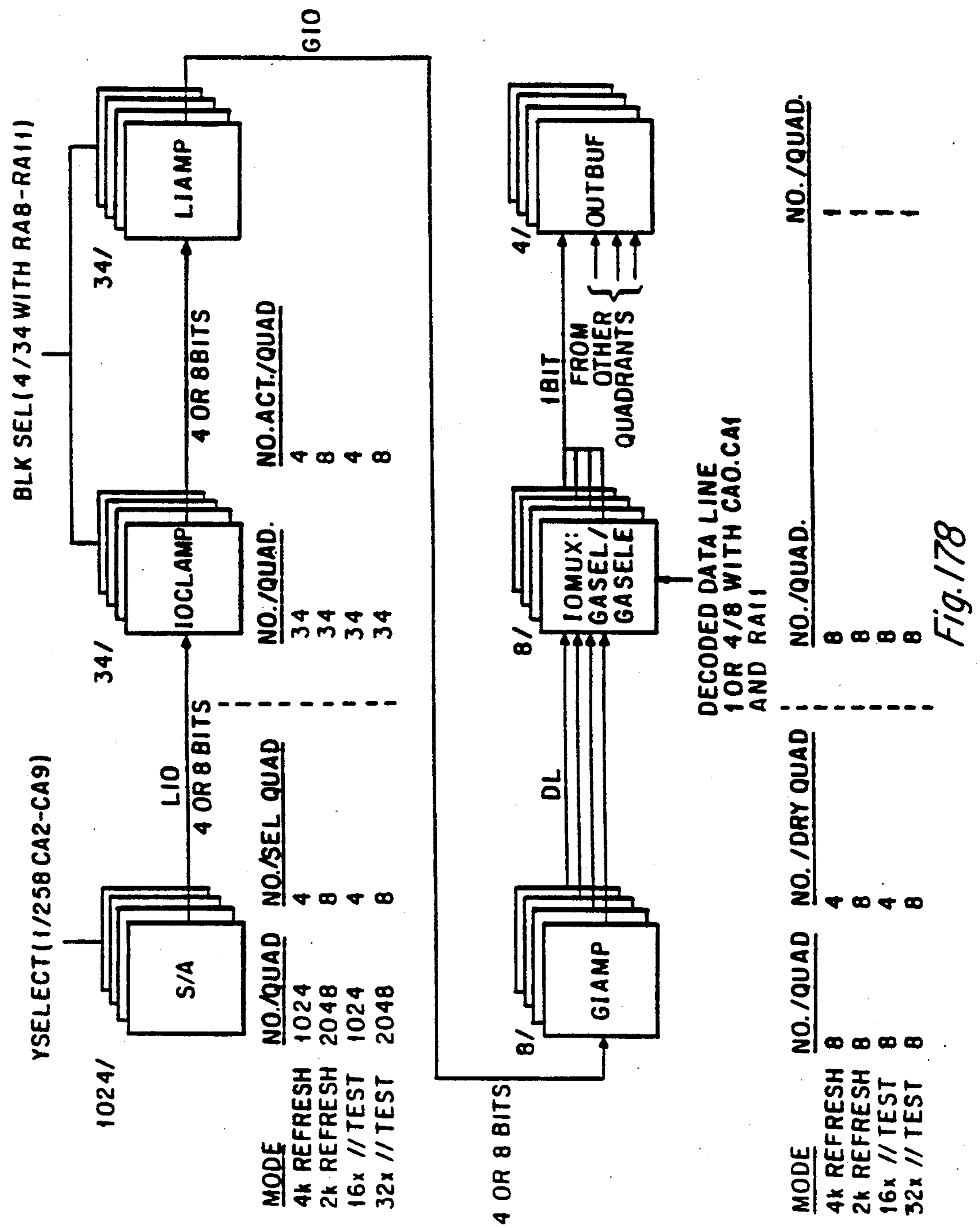

FIG. 178 is a partial block diagram illustating the data path during a read operation.

Figure 179:
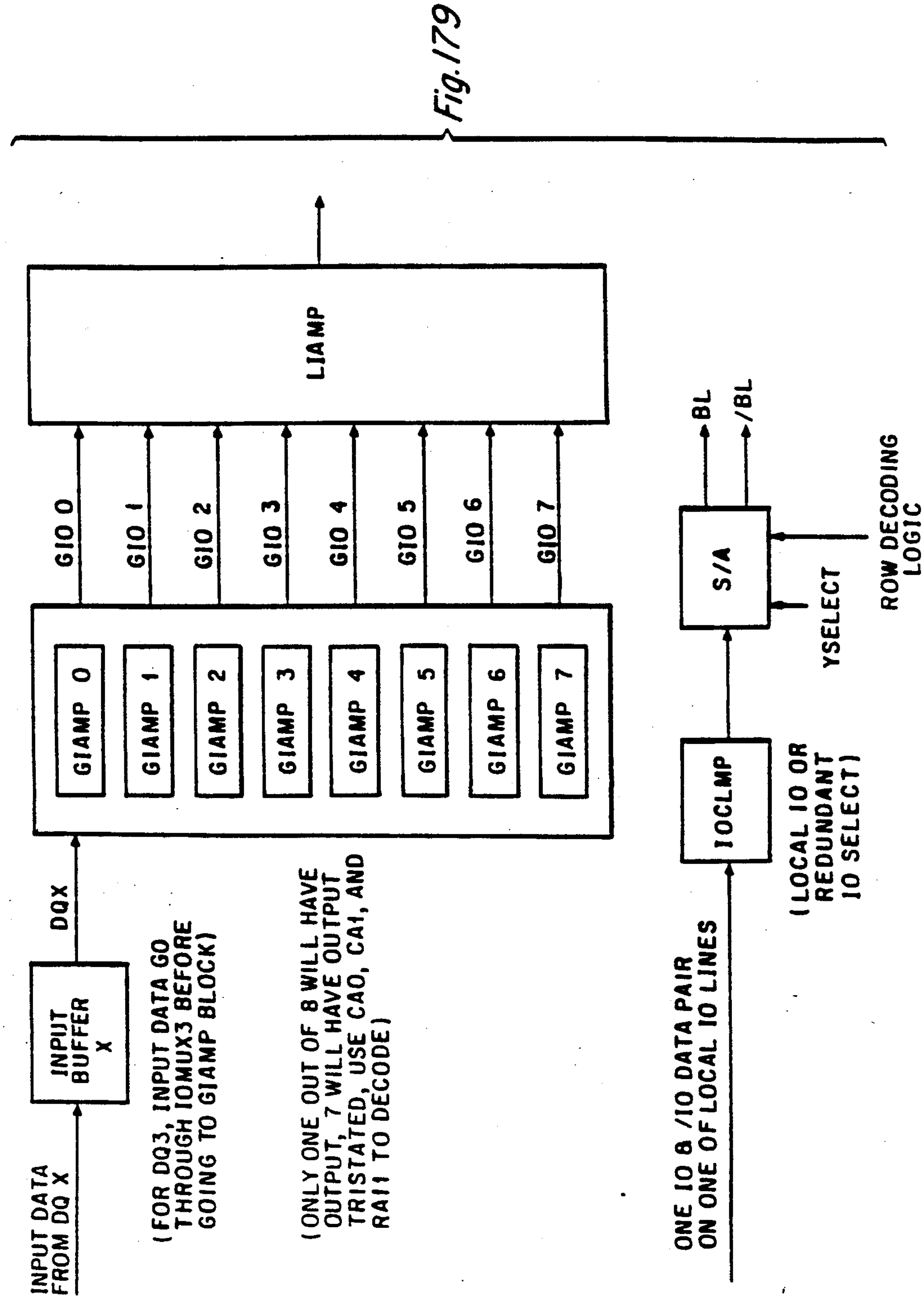

FIG. 179 is a partial block diagram illustrating the data path during a write operation.

Figure 180:
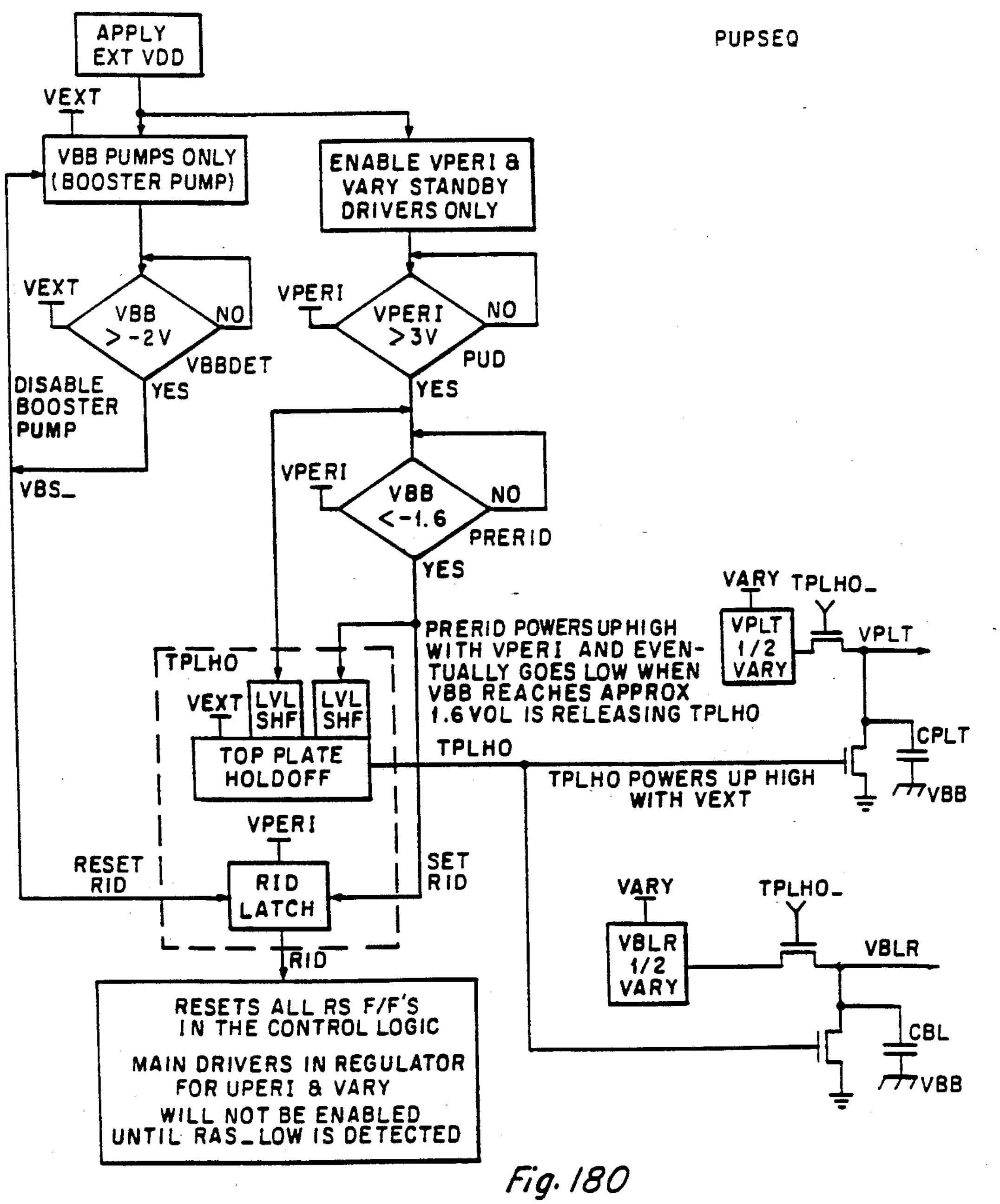

FIG. 180 is a flow chart of the inital power up sequence of the memory chip.

Figure 181:
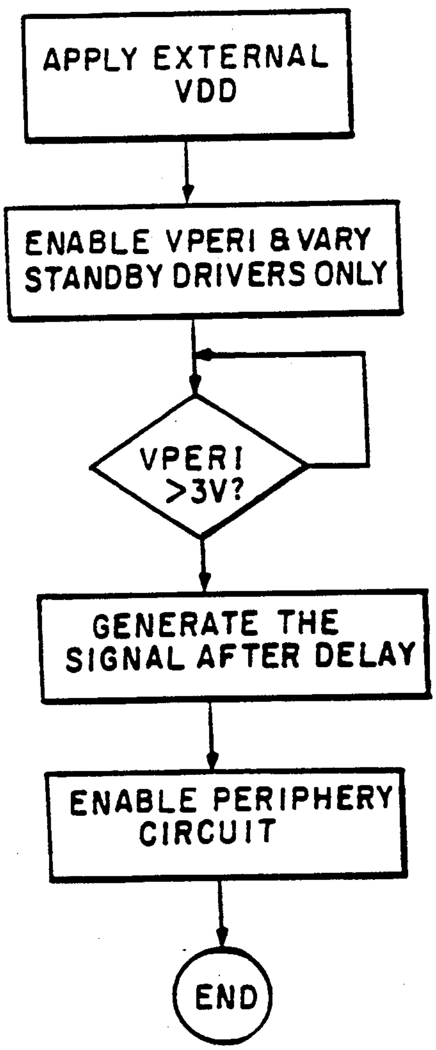

FIG. 181 is a flow chart of the inital power up sequence of the memory chip with an established substrate bias voltage Vbb.

Figure 182A:
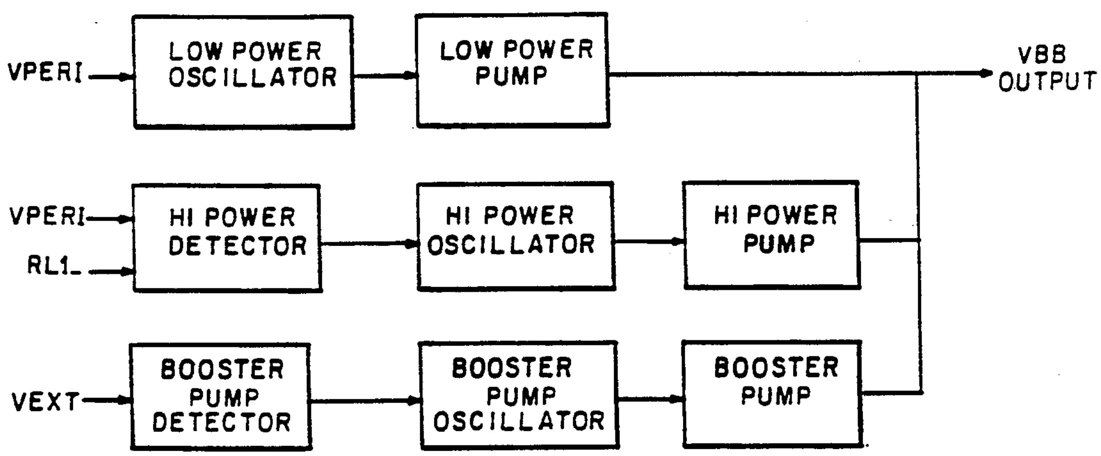
Figure 182B:
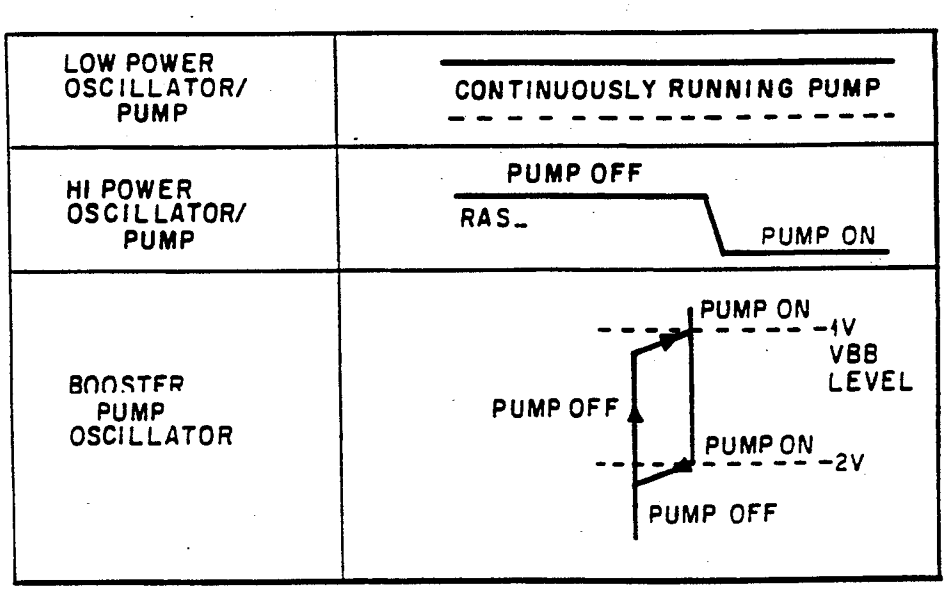

FIGS. 182*a* and 182*b* are a general flow diagram and a timing diagram of the substrate bias voltage Vbb.

Figure 183:
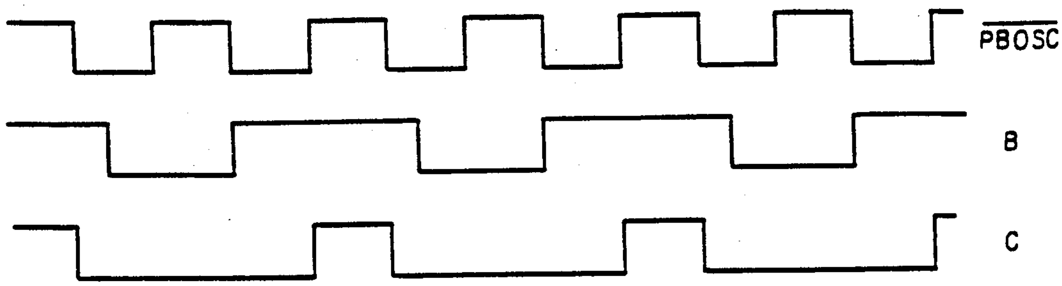

FIG. 183 is a signal diagram of the LVLDET circuit 119.

Figure 184:
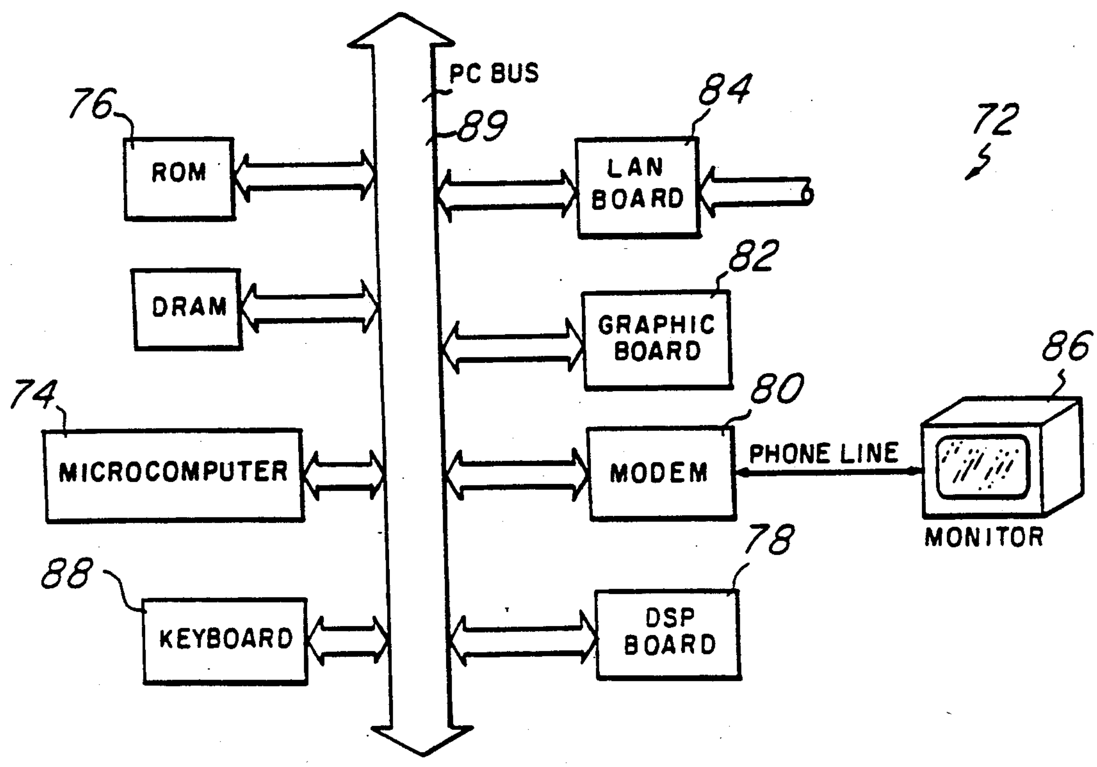

FIG. 184 is a system level block diagram illustrating the DRAM of FIG. 0.1 incorporated into a computer system.

Table 1 contains the signal from-to list for the DRAM. The first column contains the signal name. The second and third columns contain the circuit name and corresponding FIG. number that the signal is output from. The fourth and fifth columns contain the circuit name and the corresponding FIG. number that the signal is input to.

Table 2 contains a name decoding scheme for the electrical schematics described in the figures. Those electrical schematics that are used multiple times are shown only once in the figures. Table 2 depicts how to determine the names of signals connected to a particular instance of a replicated circuit.

TABLE 1

| SIG NAM | OUTP FROM | FIG # | INP TO | FIG # |
|---|---|---|---|---|
| 2K4K | — | — | TLMODE | 101.0 |
| Ax | — | — | PADABUF | 6.0 |
| A10 | — | — | TLOV | 91.0 |
| ATD0q | CLSUMDR | 49.0 | IOCLMP | 54.0 |
| ATD0P. | CLSUM | 48.0 | CLSUMDR | 49.0 |
| ATD1q | CLSUMDR | 49.0 | LIAMP | 55.0 |
| ATD1P. | CLSUM | 48.0 | CLSUMDR | 49.0 |
| ATD00 | CLSUMDR | 49.0 | — | — |
| ATD01 | CLSUMDR | 49.0 | — | — |
| ATD02 | CLSUMDR | 49.0 | — | — |
| ATDO3 | CLSUMDR | 49.0 | — | — |
| ATD10 | CLSUMDR | 49.0 | — | — |
| ATD11 | CLSUMDR | 49.0 | — | — |
| ATD12 | CLSUMDR | 49.0 | — | — |
| ATD13 | CLSUMDR | 49.0 | — | — |
| BIAS1 | VBNDREF | 77.0 | VMULT | 78.0 |
| | — | — | VARYBUF | 82.0 |
| | — | — | VPERBUF | 83.0 |
| BIAS2 | VBNDREF | 77.0 | VMULT | 78.0 |
| | — | — | VARYBUF | 82.0 |
| | — | — | VPERBUF | 83.0 |
| BIAS3 | VARYBUF | 82.0 | BIHO | 90.4 |
| BIHO | BIHO | 90.4 | VBIN | 79.0 |
| BINEN | VBIN | 79.0 | VLMUX | 81.0 |
| BINEN. | VBIN | 79.0 | VLMUX | 81.0 |
| BIT1 | BITLINE | 32.2 | — | — |
| BIT2 | BITLINE | 32.2 | — | — |
| BITBw | — | — | BITCOUNT | 8.0 |
| BITBx | BITCOUNT | 8.0 | — | — |
| BITM.x | BITCOUNT | 8.0 | RADR | 7.0 |
| BL | SA.END | 32.0 | SA.END | 32.0 |
| BL. | SA.END | 32.0 | SA.END | 32.0 |
| BL1 | SA | 31.0 | SA | 31.0 |
| BL1. | SA | 31.0 | SA | 31.0 |
| BL1L | BITLINE | 32.2 | BITLINE | 32.2 |
| BL1L. | BITLINE | 32.2 | BITLINE | 32.2 |
| BL1L.3 | BITLINE | 32.2 | — | — |
| BL1L3 | BITLINE | 32.2 | — | — |
| BL2 | SA | 31.0 | SA | 31.0 |
| BL2. | SA | 31.0 | SA | 31.0 |
| BL2R | BITLINE | 32.2 | BITLINE | 32.2 |
| BL2R. | BITLINE | 32.2 | BITLINE | 32.2 |
| BL2R.3 | BITLINE | 32.2 | — | — |
| BL2R3 | BITLINE | 32.2 | — | — |
| BLR | VBLR | 90.0 | PCNC | 30.0 |
| | — | — | SA | 31.0 |
| | — | — | SA.END | 32.0 |
| | — | — | IOCLMP | 54.0 |
| | — | — | BLRSW | 90.1 |
| BLRDIS | BLRSW | 90.1 | VBLR | 90.0 |
| BNKPC.q | BNKPC. | 12.2 | RDDR | 12.0 |
| | — | — | BNKSL | 25.0 |
| | — | — | LENDBNKSL | 27.0 |
| | — | — | RENDBNKSL | 28.0 |
| BNKSLjkm | BNKSL | 25.0 | S1234 | 29.0 |
| | — | — | IOCLMP | 54.0 |
| | — | — | LIAMP | 55.0 |
| BNKSLjk0 | LENDBNKSL | 27.0 | — | — |
| BNKSLjk16 | RENDBNKSL | 28.0 | — | — |
| BOSC | BOSC | 116 | VBBPV | 117 |
| | — | — | VBBDET | 118 |
| BOSC. | BOSC | 116 | VREFINIT | 90.5 |
| BSSjk.m | BSSDR | 26.0 | XDECM | 13.0 |
| BSSjkm | BNKSL | 25.0 | XDECM | 13.0 |
| | — | — | RXDEC | 19.0 |
| | — | — | BSS.DR | 26.0 |
| BSSjk0 | LENDBNKSL | 27.0 | — | — |
| CA.x | CABUF01 | 33 | CRCA | 39.0 |
| | CABUF29 | 34.0 | — | — |
| CA.0 | — | — | GASELE | 51.0 |
| | — | — | GASEL | 52.0 |
| CAw | — | — | CF07 | 36.0 |
| | — | — | CF815 | 36.2 |
| CAx | CABUF01 | 33 | CF07 | 36.0 |
| | CABUF29 | 34.0 | CF815 | 36.2 |
| | — | — | CRCA | 39.0 |
| | — | — | CATD | 47.0 |
| CA0 | — | — | GASELE | 51.0 |
| | — | — | GASEL | 52.0 |
| CA1b | — | — | GASELE | 51.0 |
| | — | — | GASEL | 52.0 |

TABLE 1-continued

| SIG NAM | OUTP FROM | FIG # | INP TO | FIG # |
|---|---|---|---|---|
| CA10 | — | — | IOMUX3 | 58.0 |
| CA10b | — | — | QDDEC. | 50.0 |
| | — | — | GASELE | 51.0 |
| | — | — | GASEL | 52.0 |
| | — | — | IOMUX | 57.0 |
| CA10c | — | — | GASELE | 51.0 |
| CA11 | — | — | IOMUX3 | 58.0 |
| CA11b | — | — | QDDEC. | 50.0 |
| | — | — | IOMUX | 57.0 |
| CAP.x | PADABUF | 6.0 | CABUF01 | 33 |
| | — | — | CABUF29 | 34.0 |
| CAS. | — | — | CL1 | 2 |
| CATDx | CATD | 47.0 | CLSUM | 48.0 |
| CATD2 | — | — | CLSUM | 48.0 |
| CATD3 | — | — | CLSUM | 48.0 |
| CATD4 | — | — | CLSUM | 48.0 |
| CATD5 | — | — | CLSUM | 48.0 |
| CATD6 | — | — | CLSUM | 48.0 |
| CATD7 | — | — | CLSUM | 48.0 |
| CATD8 | — | — | CLSUM | 48.0 |
| CATD9 | — | — | CLSUM | 48.0 |
| CBR | RBC | 3.00 | RWLEN | 69.0 |
| | — | — | TLJDC | 96.0 |
| CBR.DFT | RBC | 3.00 | TLOVL | 92.0 |
| | — | — | TLINI | 93.0 |
| | — | — | TLEX | 95.0 |
| CBR.EN. | CL1 | | RBC | 3.00 |
| CBRD | RBC | 3.00 | RADR | 7.0 |
| | — | — | BITCOUNT | 8.0 |
| CF.y | CF815 | 36.2 | YDEC | 37.0 |
| CF.811 | — | — | YDEC | 37.0 |
| CF.1215 | — | — | YDEC | 37.0 |
| CFjk.y | CF07DR | 36.1 | YDEC | 37.0 |
| CFjk.02 | — | — | YDEC | 37.0 |
| CFjk.13 | — | — | YDEC | 37.0 |
| CFjk.47 | — | — | YDEC | 37.0 |
| CFPy | CF07 | 36.0 | CF07DR | 36.1 |
| CL1. | CL1 | | PADABUF | 6.0 |
| | — | — | W1 | 65.0 |
| | — | — | WBRP | 68.0 |
| | — | — | RWLEN | 69.0 |
| | — | — | DEN. | 71.0 |
| | — | — | TMDLEN | 72.0 |
| | — | — | WLMX | 73.0 |
| | — | — | G1 | 74.0 |
| | — | — | LATWR. | 75.0 |
| | — | — | TLROR | 94.0 |
| CLEN | CLEN | 35.0 | CF07 | 36.0 |
| | — | — | CF815 | 36.2 |
| | — | — | CRDEC. | 40.0 |
| | — | — | CRDPC | 46.0 |
| | — | — | WLMX | 73.0 |
| CLEN. | CLEN | 35.0 | CATD | 47.0 |
| | — | — | CLSUM | 48.0 |
| CLENTD | CATD | 47.0 | CLSUM | 48.0 |
| $CLNA_0$ | CLEN | 35.0 | PADABUF | 6.0 |
| CLOE | CLOE | 76.0 | OUTBUT | 60.0 |
| | — | — | OUTBUF3 | 60.2 |
| CLRMX. | CLRMX. | 70.0 | GIAMP | 56.0 |
| | — | — | OUTBUF | 60.0 |
| | — | — | OUTBUF3 | 60.2 |
| CLRMXq | OUTBUF | 60.0 | POUTBUF | 59.0 |
| CLRMX3 | OUTBUF3 | 60.2 | POUTBUF3 | 59.1 |
| CLX4 | PGSIG | 60.3 | QDDEC. | 50.0 |
| | — | — | IOMUX | 57.0 |
| | — | — | IOMUX3 | 58.0 |
| | — | — | OUTBUF | 60.0 |
| | — | — | INBUF | 61.0 |
| | — | — | INBUF3 | 62.0 |
| | — | — | IOCTL | 63.0 |
| | — | — | G1 | 74.0 |
| | — | — | CLOE | 76.0 |
| | — | — | TLJDCMX | 103.0 |
| | — | — | TLPTED | 104.0 |
| | — | — | TLPTX1 | 105.0 |
| | — | — | TLWLLMX | 107.0 |
| | — | — | TLRCALL | 109.0 |
| | — | — | TLCCALL | 110.0 |
| CRuvCAx | CRCA | 39.0 | CRDEC. | 40.0 |
| CRuvCA2 | — | — | CRDEC. | 40.0 |
| CRuvCA3 | — | — | CRDEC. | 40.0 |

TABLE 1-continued

| SIG NAM | OUTP FROM | FIG # | INP TO | FIG # |
|---|---|---|---|---|
| CRuvCA4 | — | — | CRDEC. | 40.0 |
| CRuvCA5 | — | — | CRDEC. | 40.0 |
| CRuvCA6 | — | — | CRDEC. | 40.0 |
| CRuvCA7 | — | — | CRDEC. | 40.0 |
| CRuvCA8 | — | — | CRDEC. | 40.0 |
| CRuvCA9 | — | — | CRDEC. | 40.0 |
| CRvuPn | CRDECE | 37.1 | CRRA | 38.0 |
| | CRRA | 38.0 | CRCA | 39.0 |
| | CRCA | 39.0 | — | — |
| CRuvRAx | CRRA | 38.0 | CRDEC. | 40.0 |
| CRuvRA8 | — | — | CRDEC. | 40.0 |
| CRuvRA9 | — | — | CRDEC. | 40.0 |
| CRuvRA10 | — | — | CRDEC. | 40.0 |
| CRuD.v | CRDEC. | 40.0 | CRY | 41.0 |
| CRuD.0 | — | — | CRY | 41.0 |
| CRuD.1 | — | — | CRY | 41.0 |
| CRuD.2 | — | — | CRY | 41.0 |
| CRuD.3 | — | — | CRY | 41.0 |
| CR0Yu | CRY | 41.0 | CRSS | 42.0 |
| | — | — | CRQS | 43.0 |
| CR0Y0 | — | — | CRSS | 42.0 |
| | — | — | CRQS | 43.0 |
| CR0Y1 | — | — | CRSS | 42.0 |
| | — | — | CRQS | 43.0 |
| CR0Y2 | — | — | CRSS | 42.0 |
| | — | — | CRQS | 43.0 |
| CR1Yu | CRY | 41.0 | CRSS | 42.0 |
| | — | — | CRQS | 43.0 |
| CR1Y0 | — | — | CRSS | 42.0 |
| | — | — | CRQS | 43.0 |
| CR1Y1 | — | — | CRSS | 42.0 |
| | — | — | CRQS | 43.0 |
| CR1Y2 | — | — | CRSS | 42.0 |
| | — | — | CRQS | 43.0 |
| CR2Yu | CRY | 41.0 | CRSS | 42.0 |
| | — | — | CRQS | 43.0 |
| CR2Y0 | — | — | CRSS | 42.0 |
| | — | — | CRQS | 43.0 |
| CR2Y1 | — | — | CRSS | 42.0 |
| | — | — | CRQS | 43.0 |
| CR2Y2 | — | — | CRSS | 42.0 |
| | — | — | CRQS | 43.0 |
| CR3Yu | CRY | 41.0 | CRSS | 42.0 |
| | — | — | CRQS | 43.0 |
| CR3Y0 | — | — | CRSS | 42.0 |
| | — | — | CRQS | 43.0 |
| CR3Y1 | — | — | CRSS | 42.0 |
| | — | — | CRQS | 43.0 |
| CR3Y2 | — | — | CRSS | 42.0 |
| | — | — | CRQS | 43.0 |
| CRDECEuv | CRDECE | 37.1 | CRDEC. | 40.0 |
| CRDPC | CRDPC | 46.0 | CRSS | 42.0 |
| | — | — | CRQS | 43.0 |
| CRDSPi | CRDSP | 122 | CRDECE | 37.1 |
| | — | — | CRRA | 38.0 |
| | — | — | CRCA | 39.0 |
| CRDSP0 | CRDSP | 122 | — | — |
| CRDSP1 | CRDSP | 122 | — | — |
| CRDSP2 | CRDSP | 122 | — | — |
| CRDSP3 | CRDSP | 122 | — | — |
| CRDST | RRDSP | 123 | CRDSP | 122 |
| CRIOSjki | CRIOS | 45.0 | IOCLMP | 54.0 |
| CRIOSjk0 | CRIOS | 45.0 | — | — |
| CRIOSjkl | CRIOS | 45.0 | — | — |
| CRQS.q | CRQS | 43.0 | CRYS | 44.0 |
| CRQSq | CRQS | 43.0 | CRIOS | 45.0 |
| CRSS.i | CRSS | 42.0 | CRYS | 44.0 |
| CRSSi | CRSS | 42.0 | CRIOS | 45.0 |
| CRSS0 | — | — | CRIOS | 45.0 |
| CRSS1 | — | — | CRIOS | 45.0 |
| CRYu | CRY | 41.0 | CRYS | 44.0 |
| DEN. | DEN. | 71.0 | IBUF | 61.0 |
| | — | — | INBUF3 | 62.0 |
| | — | — | IOCTL | 63.0 |
| | — | — | IOCTL3 | 64.0 |
| | — | — | WBRP | 68.0 |
| DENTX4 | IOCTL | 63.0 | POUTBUF | 59.0 |
| DETMX4 | IOCTL | 63.0 | POUTBUF | 59.0 |
| DIN3 | INBUF3 | 62.0 | IOMUX | 57.0 |
| | — | — | IOMUX3 | 58.0 |
| DLq | GIOMP | 56.0 | GIAMP | 56.0 |

TABLE 1-continued

| SIG NAM | OUTP FROM | FIG # | INP TO | FIG # |
|---|---|---|---|---|
| | IOMUX | 57.0 | IOMUX | 57.0 |
| | INBUF | 61.0 | POUTBUF | 59.0 |
| DL3 | IOMUX3 | 58.0 | IOMUX3 | 58.0 |
| DLAT | DEN. | 71.0 | INBUF | 61.0 |
| | — | — | INBUF3 | 62.0 |
| DQq | OUTBUF | 60.0 | INBUF | 61.0 |
| DQ3 | OUTBUF3 | 60.2 | INBUF3 | 62.0 |
| DQIN3 | IOMUX | 57.0 | IOMUX | 57.0 |
| | IOMUX3 | 58.0 | IOMUX3 | 58.0 |
| | — | — | POUTBUF3 | 59.1 |
| DST3 | IOCTL3 | 64.0 | INBUF3 | 62.0 |
| DSTX4 | IOCTL | 63.0 | INBUF | 61.0 |
| DTRUEq | POUTBUF | 59.0 | OUTBUF | 60.0 |
| DTRUE3 | POUTBUF3 | 59.1 | OUTBUF3 | 60.2 |
| DWEjk.N | DWE. | 53.0 | LIAMP | 55.0 |
| | — | — | GIAMP | 56.0 |
| DX1 | — | — | INBUF3 | 62.0 |
| E | — | — | SA | 31.0 |
| | — | — | SA.END | 32.0 |
| Ejkm | S1234 | 29.0 | PCNC | 30.0 |
| EXDAq | INBUF | 61.0 | TLPTED | 104.0 |
| EXDA0 | — | — | TLPTED | 104.0 |
| EXDA1 | — | — | TLPTED | 104.0 |
| EXDA2 | — | — | TLPTED | 104.0 |
| EXDA3 | INBUF3 | 62.0 | TLPTED | 104.0 |
| | — | — | TLPTX1 | 105.0 |
| EXREF | — | — | RCL | 1 |
| | — | — | CL1 | 2 |
| | — | — | W1 | 65.0 |
| | — | — | G1 | 74.0 |
| EXTAKEN. | — | — | TLOV | 91.0 |
| EXTBLR | BLRSW | 90.1 | — | — |
| EXTBLRDIS | — | — | VBLR | 90.0 |
| EXTBLRREF | — | — | VBLR | 90.0 |
| EXTCLENCTL | — | — | CLEN | 35.0 |
| EXTCLENEN | — | — | CLEN | 35.0 |
| EXTODS | — | — | VBB.SMX | 111 |
| | — | — | LPOSC | 112 |
| | — | — | HPOSC | 114 |
| | — | — | BOSC | 116 |
| | — | — | PRERID | 121 |
| EXTPLTDIS | — | — | VPLT | 90.2 |
| EXTPLTREF | — | — | VPLT | 90.2 |
| EXTS1CTL. | — | — | SDS1 | 21.0 |
| EXTS1EN | — | — | SDS1 | 21.0 |
| EXTS2CTL | — | — | SDS2 | 22.0 |
| EXTS2EN | — | — | SDS2 | 22.0 |
| EXTS3CTL | — | — | SDS3 | 23.0 |
| EXTS3EN | — | — | SDS3 | 23.0 |
| EXTS4CTL | — | — | SDS4 | 24.0 |
| EXTS4EN | — | — | SDS4 | 24.0 |
| EXTVEX. | — | — | VRCTLC | 88.3 |
| EXTVPLT | VPLTSW | 90.3 | — | — |
| FOURKADq | QDDEC. | 50.0 | GASELE | 51.0 |
| | — | — | GASEL | 52.0 |
| G. | — | — | G1 | 74.0 |
| G1 | G1 | 74.0 | CLOE | 76.0 |
| GIOjkn | LIAMP | 55.0 | LIAMP | 55.0 |
| | GIAMP | 56.0 | GIAMP | 56.0 |
| | — | — | TLPTDH | 102.0 |
| GIOjk0 | — | — | TLPTDH | 102.0 |
| GIOjk1 | — | — | TLPTDH | 102.0 |
| GIOjk2 | — | — | TLPTDH | 102.0 |
| GIOjk3 | — | — | TLPTDH | 102.0 |
| GIOjk4 | — | — | TLPTDH | 102.0 |
| GIOjk5 | — | — | TLPTDH | 102.0 |
| GIOjk6 | — | — | TLPTDH | 102.0 |
| GIOjk7 | — | — | TLPTDH | 102.0 |
| HPOSC | HOPSC | 114 | VBBHPP | 115 |
| IOCjmk.i | IOCLMP | 54.0 | IOCLMP | 54.0 |
| | LIAMP | 55.0 | LIAMP | 55.0 |
| IOCjmki | IOCLMP | 54.0 | IOCLMP | 54.0 |
| | LIAMP | 55.0 | LIAMP | 55.0 |
| IOGSjkn | GASELE | 51.0 | DWE. | 53.0 |
| | GASEL | 52.0 | GIAMP | 56.0 |
| | — | — | TLPTDH | 102.0 |
| IOGSjk0 | — | — | TLPTDH | 102.0 |
| IOGSjk2 | — | — | TLPTDH | 102.0 |
| IOGSjk4 | — | — | TLPTDH | 102.0 |
| IOGSjk6 | — | — | TLPTDH | 102.0 |
| LATWR. | LATWR. | 75.0 | CLOE | 76.0 |

TABLE 1-continued

| SIG NAM | OUTP FROM | FIG # | INP TO | FIG # |
|---|---|---|---|---|
| LI.I | IOCLMP | 54.0 | SA | 31.0 |
| | — | -- | SAEND | 32.0 |
| | — | — | IOCLMP | 54.0 |
| LIi | IOCLMP | 54.0 | SA | 31.0 |
| | — | — | SA.END | 32.0 |
| | — | — | IOCLMP | 54.0 |
| LIjmk.i | — | — | IOCLMP | 54.0 |
| LIjmki | — | — | IOCLMP | 54.0 |
| LPOSC | LPOSC | 112 | VBBLPP | 113 |
| NC | — | — | SA | 31.0 |
| | — | — | SA.END | 32.0 |
| NCjkm | PCNC | 30.0 | SA | 31.0 |
| | — | — | SA.*END* | 32.0 |
| PBOSC | LPOSC | 112 | RLXH | 11.0 |
| | — | — | OUTBUF | 60.0 |
| | — | — | OUTBUF3 | 60.2 |
| | — | — | BLRSW | 90.1 |
| | — | — | VPLTSW | 90.3 |
| | — | — | VDDREF | 90.6 |
| | — | — | LVLDET | 119 |
| PC | — | — | SA | 31.0 |
| | — | — | SA.END | 32.0 |
| PCjkm | PCNC | 30.0 | SA | 31.0 |
| | — | — | SA.END | 32.0 |
| PRERID | PRERID | 121 | TPLHO | 125 |
| PTDH.q | TLPTDH | 102.0 | TLJDCMX | 103.0 |
| | — | — | TLPTED | 104.0 |
| | — | — | TLPTX1 | 105.0 |
| PTDH.0 | — | — | TLJDCMX | 103.0 |
| | — | — | TLPTED | 104.0 |
| | — | — | TLPTX1 | 105.0 |
| PTDH.1 | — | — | TLJDCMX | 103.0 |
| | — | — | TLPTED | 104.0 |
| | — | — | TLPTX1 | 105.0 |
| PTDH.2 | — | — | TLJDCMX | 103.0 |
| | — | — | TLPTED | 104.0 |
| | — | — | TLPTX1 | 105.0 |
| PTDH.3 | — | — | TLJDCMX | 103.0 |
| | — | — | TLPTED | 104.0 |
| | — | — | TLPTX1 | 105.0 |
| PTDL.q | TLPTDH | 102.0 | TLJDCMX | 103.0 |
| | — | — | TLPTED | 104.0 |
| | — | — | TLPTX1 | 105.0 |
| PTDL.0 | — | — | TLJDCMX | 103.0 |
| | — | — | TLPTED | 104.0 |
| | — | — | TLPTX1 | 105.0 |
| PTDL.1 | — | — | TLJDCMX | 103.0 |
| | — | — | TLPTED | 104.0 |
| | — | — | TLPTX1 | 105.0 |
| PTDL.2 | — | — | TLJDCMX | 103.0 |
| | — | — | TLPTED | 104.0 |
| | — | — | TLPTX1 | 105.0 |
| PTDL.3 | — | — | TLJDCMX | 103.0 |
| | — | — | TLPTED | 104.0 |
| | — | — | TLPTX1 | 105.0 |
| PUD | VBB.SMX | 111 | VRCTLS | 88.0 |
| | LVLDET | 119 | BLRSW | 90.1 |
| | PUD | 120 | VPLTSW | 90.3 |
| | — | — | PRERID | 121 |
| | — | — | TLPHO | 125 |
| QDDEC.q | QDDEC. | 50.0 | GASELE | 51.0 |
| | — | — | GASEL | 52.0 |
| RA.x | RADR | 7.0 | RRA | 14.0 |
| | — | — | CRRA | 38.0 |
| RA. | — | — | RRXE | 17.0 |
| RA.8 | — | — | LENDBNKSL | 27.0 |
| RA.9 | — | — | LENDBNKSL | 27.0 |
| RA.10 | — | — | RRDEC | 15.0 |
| | — | — | LENDBNKSL | 27.0 |
| RA.11 | — | — | RLEN. | 10.0 |
| | — | — | LENDBNKSL | 27.0 |
| RAw | — | — | RF | 9.0 |
| RAx | RADR | 7.0 | RF | 9.0 |
| | — | — | RRA | 14.0 |
| | — | — | CRRA | 38.0 |
| RA0 | — | — | RRXE | 17.0 |
| RA0b | — | — | RDDR | 12.0 |
| RA1b | — | — | RDDR | 12.0 |
| RA8 | — | — | RENDBNKSL | 28.0 |
| | — | — | GASELE | 51.0 |
| | — | — | GASEL | 52.0 |

TABLE 1-continued

| SIG NAM | OUTP FROM | FIG # | INP TO | FIG # |
|---|---|---|---|---|
| RA8b | — | — | BNKSL | 25.0 |
| RA8c | — | — | BNKSL | 25.0 |
| RA9 | — | — | RANDBNKSL | 28.0 |
| | — | — | GASELE | 51.0 |
| RA9b | — | — | RDDR | 12.0 |
| | — | — | BNKSL | 25.0 |
| RA9c | — | — | BNKSL | 25.0 |
| RA10 | — | — | RRDEC | 15.0 |
| | — | — | RENDBNKSL | 28.0 |
| | — | — | GASELE | 51.0 |
| RA10b | — | — | RDDR | 12.0 |
| | — | — | BNKSL | 25.0 |
| RA10c | — | — | BNKSL | 25.0 |
| RA11 | — | — | RLEN. | 10.0 |
| | — | — | RENDBNKSL | 28.0 |
| RA11b | — | — | BNKSL | 25.0 |
| | — | — | GASELE | 51.0 |
| | — | — | GASEL | 52.0 |
| RA11c | — | — | BNKSL | 25.0 |
| | — | — | GASELE | 51.0 |
| RAN | RBC | 3.00 | RCL | 2A |
| | — | — | RADR | 7.0 |
| RAN. | RBC | 3.00 | RBC.RESET | 4 |
| RAP.x | PADABUF | 6.0 | RADR | 7.0 |
| | — | — | TLRAL | 97.0 |
| RAP.0 | — | — | TLRAL | 97.0 |
| RAP.1 | — | — | TLRAL | 97.0 |
| RAP.2 | — | — | TLRAL | 97.0 |
| RAP.6 | — | — | TLRAL | 97.0 |
| RAS. | — | — | RCL | 2A |
| RBC | RBC | 3.00 | RWLEN | 69.0 |
| RBC.EN. | CL1 | 2 | RBC | 3.00 |
| RBC.RESET | RBC.RESET | 4 | RBC | 3.00 |
| | — | — | TLEX | 95.0 |
| RBW | WBR | 66.0 | RBWP. | 67.0 |
| RBWP. | RBWP. | 67.0 | INBUF | 61.0 |
| | — | — | INBUF3 | 62.0 |
| RDjpky | RDDR | 12.0 | XDECM | 13.0 |
| RDjpk0 | — | — | XDECM | 13.0 |
| RDjpk1 | — | — | XDECM | 13.0 |
| RDjpk2 | — | — | XDECM | 13.0 |
| RDjpk3 | — | — | XDECM | 13.0 |
| RFy | RF | 9.0 | RLEN. | 10.0 |
| | — | — | XDECM | 13.0 |
| RF4 | — | — | RLEN. | 10.0 |
| RF5 | — | — | RLEN. | 10.0 |
| RF6 | — | — | RLEN. | 10.0 |
| RF7 | — | — | RLEN. | 10.0 |
| RF47 | — | — | XDECM | 13.0 |
| RF811 | — | — | XDECM | 13.0 |
| RF1216 | — | — | XDECM | 13.0 |
| RI.i | IOCLMP | 54.0 | IOCLMP | 54.0 |
| RIi | IOCLMP | 54.0 | IOCLMP | 54.0 |
| RIjmk.i | — | — | IOCLMP | 54.0 |
| RIjmki | — | — | IOCLMP | 54.0 |
| RID | VBB.SMX | 111 | RCL | 1 |
| | TPLHO | 125 | CL1 | 2 |
| | — | — | RBC | 3.00 |
| | — | — | RBC.RESET | 4 |
| | — | — | RLEN. | 10.0 |
| | — | — | BNKPC. | 12.2 |
| | — | — | PGSIG | 60.3 |
| | — | — | RBWP. | 67.0 |
| | — | — | CLRMX. | 70.0 |
| | — | — | DEN. | 71.0 |
| | — | — | TMDLEN | 72.0 |
| | — | — | WLMX | 73.0 |
| | — | — | CLOE | 76.0 |
| | — | — | VREFINIT | 90.5 |
| | — | — | TLINI | 93.0 |
| | — | — | TLROR | 94.0 |
| | — | — | TLEX | 95.0 |
| | — | — | TLMODE | 101.0 |
| | — | — | RRDSP | 123 |
| RIDH | VRCTLS | 88.0 | VRCTLA | 88.1 |
| | — | — | VRCTLP | 88.2 |
| | — | — | VRCTLC | 88.3 |
| RL1 | RCL | 1 | CL1 | 2 |
| RL1. | RCL | 1 | PADABUF | 6.0 |
| | — | — | RLEN. | 10.0 |
| | — | — | RLXH | 11.0 |

TABLE 1-continued

| SIG NAM | OUTP FROM | FIG # | INP TO | FIG # |
|---|---|---|---|---|
| | — | — | RRXE | 17.0 |
| | — | — | CRDPC | 46.0 |
| | — | — | W1 | 65.0 |
| | — | — | WBR | 66.0 |
| | — | — | RWLEN | 69.0 |
| | — | — | DEN. | 71.0 |
| | — | — | TMDLEN | 72.0 |
| | — | — | VRCTLP | 88.2 |
| | — | — | TLOV | 91.0 |
| | — | — | TLROR | 94.0 |
| | — | — | TLEX | 95.0 |
| | — | — | TLMODE | 101.0 |
| | — | — | VBB.SMX | 111 |
| | — | — | HPOSC | 114 |
| RL2 | RCL | 1 | PADABUF | 6.0 |
| | — | — | BNKPC. | 12.2 |
| | — | — | RRXE | 17.0 |
| | — | — | CLEN | 35.0 |
| | — | — | VRCTLA | 88.1 |
| | — | — | VRCTLP | 88.2 |
| | — | — | TLMODE | 101.0 |
| RLB | SDXWD | 20.0 | RLXH | 11.0 |
| | — | — | TLWLC | 106.0 |
| RLEN.o | RLEN. | 10.0 | RLXH | 11.0 |
| | — | — | SDXWD | 20.0 |
| | — | — | VRCTLA | 88.1 |
| RLEN.L | RLEN. | 10.0 | SDXWD | 20.0 |
| RLEN.R | RLEN. | 10.0 | SDXWD | 20.0 |
| RLRST. | RLEN. | 10.0 | RBC.RESET | 4 |
| | — | — | CLRMX. | 70.0 |
| | — | — | WLMX | 73.0 |
| RLXHoq | RLXH | 11.0 | RDDR | 12.0 |
| | — | — | RXDEC | 19.0 |
| | — | — | TLWLC | 106.0 |
| ROR | TLROR | 94.0 | TLEX | 95.0 |
| RRuvAx | RRA | 14.0 | RRDEC | 15.0 |
| RRuvA0 | — | — | RRDEC | 15.0 |
| RRuvA1 | — | — | RRDEC | 15.0 |
| RRuvA2 | — | — | RRDEC | 15.0 |
| RRuvA3 | — | — | RRDEC | 15.0 |
| RRuvA4 | — | — | RRDEC | 15.0 |
| RRuvA5 | — | — | RRDEC | 15.0 |
| RRuvA6 | — | — | RRDEC | 15.0 |
| RRuvA7 | — | — | RRDEC | 15.0 |
| RRuvA8 | — | — | RRDEC | 15.0 |
| RRuvA9 | — | — | RRDEC | 15.0 |
| RRuDv | RRDEC | 15.0 | RRX | 16.0 |
| RRuD0 | — | — | RRX | 16.0 |
| RRuD1 | — | — | RRX | 16.0 |
| RRuD2 | — | — | RRX | 16.0 |
| RR0Xu | RRX | 16.0 | RRS | 18.0 |
| RR0X0 | — | — | RRQS | 18.0 |
| RR0X1 | — | — | RRQS | 18.0 |
| RR0X2 | — | — | RRQS | 18.0 |
| RR0X3 | — | — | RRQS | 18.0 |
| RR1Xu | RRX | 16.0 | RRQS | 18.0 |
| RR1X0 | — | — | RRQS | 18.0 |
| RR1X1 | — | — | RRQS | 18.0 |
| RR1X2 | — | — | RRQS | 18.0 |
| RR1X3 | — | — | RRQS | 18.0 |
| RR2Xu | RRX | 16.0 | RRQS | 18.0 |
| RR2X0 | — | — | RRQS | 18.0 |
| RR2X1 | — | — | RRQS | 18.0 |
| RR2X2 | — | — | RRQS | 18.0 |
| RR2X3 | — | — | RRQS | 18.0 |
| RRDSPu | RRDSP | 123 | RRA | 14.0 |
| RRDSP0 | RRDSP | 123 | — | — |
| RRDSP1 | RRDSP | 123 | — | — |
| RRDSP2 | RRDSP | 123 | — | — |
| RRDSP3 | RRDSP | 123 | RRATST | 124 |
| RRL2 | RRXE | 17.0 | RRDEC | 15.0 |
| | — | — | RRQS | 18.0 |
| RRQSq | RRQS | 18.0 | RDDR | 12.0 |
| | — | — | RXDEC | 19.0 |
| RRXu | RRX | 16.0 | RXDEC | 19.0 |
| RRXE | RRXE | 17.0 | RRX | 16.0 |
| RWLEN | RWLEN | 69.0 | W1 | 65.0 |
| | — | — | CLRMX. | 70.0 |
| | — | — | CLOE | 76.0 |
| RXWjmky | RXDEC | 19.0 | — | — |
| RYSELjky | CRYS | 44.0 | — | — |

TABLE 1-continued

| SIG NAM | OUTP FROM | FIG # | INP TO | FIG # |
|---|---|---|---|---|
| S1jkm | S1234 | 29.0 | PCNC | 30.0 |
| S2jkm | S1234 | 29.0 | PCNC | 30.0 |
| S3jk.m | S1234 | 29.0 | PCNC | 30.0 |
| S2jk.m | S1234 | 29.0 | PCNC | 30.0 |
| SDS1 | SDS1 | .21.0 | SDS2 | 22.0 |
| | — | — | SDS3 | 23.0 |
| | — | — | SDS4 | 24.0 |
| | — | — | S1234 | 29.0 |
| SDS2 | SDS2 | 22.0 | S1234 | 29.0 |
| SDS3 | SDS3 | 23.0 | SDS4 | 24.0 |
| | — | — | S1234 | 29.0 |
| SDS4 | SDS4 | 24.0 | SDXWD | 20.0 |
| | — | — | S1234 | 29.0 |
| | — | — | CLOE | 76.0 |
| SDXWD | SDXWD | 20.0 | SDS1 | 21.0 |
| SEDIS | RLEN. | 10.0 | S1234 | 29.0 |
| ST | — | — | SA.END | 32.0 |
| STL | — | — | SA | 31.0 |
| STLjkm | BNKSL | 25.0 | SA | 31.0 |
| | — | — | SA.END | 32.0 |
| STLjkl6 | RENDBNKSL | 28.0 | — | — |
| STPH | CLSUM | 48.0 | BNKSL | 25.0 |
| | — | — | LENDBNKSL | 27.0 |
| | — | — | RENDBNKSL | 28.0 |
| STPL. | SDS2 | 22.0 | BNKSL | 25.0 |
| | — | — | LENDBNKSL | 27.0 |
| | — | — | RENDBNKSL | 28.0 |
| | — | — | CLEN | 35.0 |
| STR | — | — | SA | 31.0 |
| STRjkm | BNKSL | 25.0 | SA | 31.0 |
| | — | — | SA.END | 32.0 |
| STRjk0 | LENDBNKSL | 27.0 | — | — |
| TL8BS | TLMODE | 101.0 | RLEN. | 10.0 |
| | — | — | BNKSL | 25.0 |
| | — | — | LENDBNKSL | 27.0 |
| | — | — | RENDBNKSL | 28.0 |
| TL16 | TLMODE | 101.0 | QDDEC. | 50.0 |
| | — | — | GASELE | 51.0 |
| | — | — | GASEL | 52.0 |
| | — | — | GIAMP | 56.0 |
| | — | — | TLPTDH | 102.0 |
| TL16ED | TLKEY | 98.0 | TLMODE | 101.0 |
| | — | — | TLPX1 | 105.0 |
| TL32. | TLKEY | 98.0 | QDDEC. | 50.0 |
| | — | — | GASELE | 51.0 |
| | — | — | GASEL | 52.0 |
| | — | — | GIAMP | 56.0 |
| | — | — | TLMODE | 101.0 |
| | — | — | TLPTDH | 102.0 |
| | — | — | TLPTX1 | 105.0 |
| TLA0 | TLRAL | 97.0 | TLKEY | 98.0 |
| TLA1 | TLRAL | 97.0 | TLKEY | 98.0 |
| TLA2 | TLRAL | 97.0 | TLKEY | 98.0 |
| TLA6 | TLRAL | 97.0 | TLKEY | 98.0 |
| | — | — | TLMODE | 101.0 |
| TLBI | TLKEY | 98.0 | TLSCSL | 99 |
| TLBID | TLKEY | 98.0 | CLOE | 76.0 |
| | — | — | TLJDCMX | 103.0 |
| TLCLR | TLKEY | 98.0 | TLSCSL | 99 |
| TLCR.q | CRQS | 43.0 | TLCCALL | 110.0 |
| TLCR.0 | — | — | TLCCALL | 110.0 |
| TLCR.1 | — | — | TLCCALL | 110.0 |
| TLCR.2 | — | — | TLCCALL | 110.0 |
| TLCR.3 | — | — | TLCCALL | 110.0 |
| TLCRRC | TLKEY | 98.0 | TLCCALL | 110.0 |
| TLDE | TLMODE | 101.0 | POUTBUF3 | 59.1 |
| | — | — | IOCTL | 63.0 |
| | — | — | IOCTL3 | 64.0 |
| TLDE. | IOCTL3 | 64.0 | POUTBUF3 | 59.1 |
| TLDTq | TLJDCMX | 103.0 | POUTBUF | 59.0 |
| | TLPTED | 104.0 | — | — |
| | TLWLLMX | 107.0 | — | — |
| | TLRCALL | 109.0 | — | — |
| | TLCCALL | 110.0 | — | — |
| TLDT0 | TLJDCMX | 103.0 | — | — |
| | TLPTED | 104.0 | — | — |
| | TLWLLMX | 107.0 | — | — |
| | TLRCALL | 109.0 | — | — |
| | TLCCALL | 110.0 | — | — |
| TLDT1 | TLJDCMX | 103.0 | — | — |
| | TLPTED | 104.0 | — | — |

TABLE 1-continued

| SIG NAM | OUTP FROM | FIG # | INP TO | FIG # |
|---|---|---|---|---|
| | TLWLLMX | 107.0 | — | — |
| | TLRCALL | 109.0 | — | — |
| | TLCCALL | 110.0 | — | — |
| TLDT2 | TLJDCMX | 103.0 | — | — |
| | TLPTED | 104.0 | — | — |
| | TLWLLMX | 107.0 | — | — |
| | TLRCALL | 109.0 | — | — |
| | TLCCALL | 110.0 | — | — |
| TLDT3 | TLJDCMX | 103.0 | POUTBUF3 | 59.1 |
| | TLPTED | 104.0 | — | — |
| | TLPTX1 | 105.0 | — | — |
| | TLWLLMX | 107.0 | — | — |
| | TLRS | 108.0 | — | — |
| | TLRCALL | 109.0 | — | — |
| | TLCCALL | 110.0 | — | — |
| TLEDC | TLMODE | 101.0 | IOCTL | 63.0 |
| | — | — | IOCTL3 | 64.0 |
| | — | — | WBRP | 68.0 |
| | — | — | DEN. | 71.0 |
| | — | — | TMDLEN | 72.0 |
| | — | — | TLPTED | 104.0 |
| TLEX | TLEX | 95.0 | TLOVL | 92.0 |
| | — | — | TLJDC | 96.0 |
| | — | — | TLRAL | 97.0 |
| | — | — | TLSCSL | 99 |
| TLINI | TLINI | 93.0 | TLJDC | 96.0 |
| | — | — | TLRAL | 97.0 |
| TLJDC | TLJDC | 96.0 | TLMODE | 101.0 |
| | — | — | TLJDCMX | 103.0 |
| | — | — | TLPTX1 | 105.0 |
| TLOV | TLOV | 91.0 | TLOVL | 92.0 |
| TLOVL | TLOVL | 92.0 | TLINI | 93.0 |
| | — | — | TLJDC | 96.0 |
| TLPT | TLMODE | 101.0 | IOMUX | 57.0 |
| | — | — | IOMUX3 | 58.0 |
| TLRCOPY | TLMODE | 101.0 | RBC | 3.00 |
| | — | — | RLEN. | 10.0 |
| | — | — | SDXWD | 20.0 |
| | — | — | SDS1 | 21.0 |
| | — | — | BNKSL | 25.0 |
| | — | — | LENDBNKSL | 27.0 |
| | — | — | RENDBNKSL | 28.0 |
| | — | — | VRCTLA | 88.1 |
| | — | — | TLRAL | 97.0 |
| TLRCS | TLKEY | 98.0 | TLMODE | 101.0 |
| TLRR.q | RRQS | 18.0 | TLRCALL | 109.0 |
| TLRR.0 | — | — | TLRCALL | 109.0 |
| TLRR.1 | — | — | TLRCALL | 109.0 |
| TLRR.2 | — | — | TLRCALL | 109.0 |
| TLRR.3 | — | — | TLRCALL | 109.0 |
| TLRRRC | TLKEY | 98.0 | TLRCALL | 109.0 |
| TLRS | TLKEY | 98.0 | TLRS | 108.0 |
| TLSCS | TLKEY | 98.0 | TLSCSL | 99 |
| TLSCSL | TLSCSL | 99 | CLOE | 76.0 |
| | — | — | VRCTLC | 88.3 |
| TLSCSLH | VRCTLC | 88.3 | VMULT | 78.0 |
| | — | — | VBIN | 79.0 |
| | — | — | VARYDRV | 84.0 |
| | — | — | VPERDRV | 85.0 |
| TLSCSLL. | VRCTLC | 88.3 | VRCTLS | 88.0 |
| | — | — | VRCTLA | 88.1 |
| | — | — | VRCTLP | 88.2 |
| TLTPH | TLKEY | 98.0 | TLSCSL | 99 |
| TLTPHI | TLSCSL | 99 | VPLTSW | 90.3 |
| TLTPL | TLKEY | 98.0 | TLSCSL | 99 |
| TLTPL0 | TLSCSL | 99 | VPLTSW | 90.3 |
| TLWLF.q | TLWLOR | 106.1 | TLWLLMX | 107.0 |
| TLWLF.0 | — | — | TLWLLMX | 107.0 |
| TLWLF.1 | — | — | TLWLLMX | 107.0 |
| TLWLF.2 | — | — | TLWLLMX | 107.0 |
| TLWLF.3 | — | — | TLWLLMX | 107.0 |
| TLWLL | TLKEY | 98.0 | RLXH | 11.0 |
| | — | — | TLWLC | 106.0 |
| | — | — | TLWLLMX | 107.0 |
| TLWLL.oq | TLWLC | 106.0 | TLWLOR | 106.1 |
| TLWLL.Lq | — | — | TLWLOR | 106.1 |
| TLWLL.Rq | — | — | TLWLOR | 106.1 |
| TLWLS. | TLSCSL | 99.1 | RLXH | 11.0 |
| | — | — | RDDR | 12.0 |
| | — | — | CLOE | 76.0 |
| | — | — | TLMODE | 101.0 |

TABLE 1-continued

| SIG NAM | OUTP FROM | FIG # | INP TO | FIG # |
|---|---|---|---|---|
| TMDLEN | TMDLEN | 72.0 | DEN. | 71.0 |
| TP | — | — | BITLINE | 32.2 |
| TPLHO | TPLHO | 125 | VBLR | 90.0 |
| | — | — | VPLT | 90.2 |
| TPLHO. | TPLHO | 125 | VBLR | 90.0 |
| | — | — | VPLT | 90.2 |
| TWOKADq | QDDEC. | 50.0 | GASELE | 51.0 |
| | — | — | GASEL | 52.0 |
| TWOKREF | TLMODE | 101.0 | QDDEC. | 50.0 |
| VAR | VARYBUF | 82.0 | VARYDRV | 84.0 |
| | — | — | VARYDRVS | 86.0 |
| | — | — | VBB.SMX | 111 |
| VARP | VLMUX | 81.0 | VARYBUF | 82.0 |
| VARY | VARYDRV | 84.0 | PCNC | 30.0 |
| | VARYDRVS | 86.0 | SA | 31.0 |
| | — | — | SA.END | 32.0 |
| | — | — | VBLR | 90.0 |
| | — | — | VPLT | 90.2 |
| | — | — | VPLTSW | 90.3 |
| VBB | VBB.SMX | 111 | — | — |
| | VBBLPP | 113 | — | — |
| | VBBHPP | 115 | — | — |
| | VBBPB | 117 | — | — |
| VBBO | VRVBBO | 89.0 | VRCTLC | 88.3 |
| VBBOL. | VRCTLC | 88.3 | VRCTLS | 88.0 |
| | — | — | VRCTLA | 88.1 |
| | — | — | VRCTLP | 88.2 |
| VBS | VBBDET | 118 | BOSC | 116 |
| | — | — | TPLHO | 125 |
| VCLMP | VCLMP | 80.1 | VLMUX | 81.0 |
| VCMPEN | VDDCLAMP | 80.0 | VCLMP | 80.1 |
| | — | — | VLMUX | 81.0 |
| VCMPEN. | VDDCLAMP | 80.0 | VCLMP | 80.1 |
| | — | — | VLMUX | 81.0 |
| VDDREF | VREFINIT | 90.5 | VBNDREF | 77.0 |
| | VDDREF | 90.6 | VMULT | 78.0 |
| | — | — | VARYBUF | 82.0 |
| | — | — | VPERBUF | 83.0 |
| VEXT | — | — | RLXH | 11.0 |
| | — | — | OUTBUF | 60.0 |
| | — | — | OUTBUF3 | 60.2 |
| | — | — | VBIN | 79.0 |
| | — | — | VDDCLAMP | 80.0 |
| | — | — | VCLMP | 80.1 |
| | — | — | VLMUX | 81.0 |
| | — | — | VARYBUF | 82.0 |
| | — | — | VPERBUF | 83.0 |
| | — | — | VARYDRV | 84.0 |
| | — | — | VPERDRV | 85.0 |
| | — | — | VARYDRVS | 86.0 |
| | — | — | VPERDRVS | 87.0 |
| | — | — | VRCTLS | 88.0 |
| | — | — | VRCTLA | 88.1 |
| | — | — | VRCTLP | 88.2 |
| | — | — | VRCTLC | 88.3 |
| | — | — | BIHO | 90.4 |
| | — | — | VREFINIT | 90.5 |
| | — | — | VDDREF | 90.6 |
| | — | — | VBB.SMX | 111 |
| | — | — | BOSC | 116 |
| | — | — | VBBPB | 117 |
| | — | — | VBBDET | 118 |
| | — | — | TPLHO | 125 |
| VLA | VMULT | 78.0 | VBIN | 79.0 |
| | — | — | VLMUX | 81.0 |
| VLBIN | VBIN | 79.0 | VLMUX | 81.0 |
| VLP | VMULT | 78.0 | VDDCLAMP | 80.0 |
| | — | — | VCLMP | 80.1 |
| | — | — | VLMUX | 81.0 |
| | — | — | BIHO | 90.4 |
| VPERI | VPERDRV | 85.0 | — | — |
| | VPERDRVS | 87.0 | — | — |
| VPLT | VPLT | 90.2 | VPLTSW | 90.3 |
| VPLTDIS | VPLTSW | 90.3 | VPLT | 90.2 |
| VPR | VPERBUF | 83.0 | RCL | 1.00 |
| | — | — | CL1 | 2.00 |
| | — | — | PADABUF | 6.0 |
| | — | — | INBUF | 61.0 |
| | — | — | INBUF3 | 62.0 |
| | — | — | W1 | 65.0 |
| | — | — | G1 | 74.0 |

TABLE 1-continued

| SIG NAM | OUTP FROM | FIG # | INP TO | FIG # |
|---|---|---|---|---|
| | — | — | VPERDRV | 85.0 |
| | — | — | VPERDRVS | 87.0 |
| VPRP | VLMUX | 81.0 | VPERBUF | 83.0 |
| VRCTLAo | VRCTLA | 88.1 | VARYDRV | 84.0 |
| VRCTLP | VRCTLP | 88.2 | VPERDRV | 85.0 |
| VRCTLS | VRCTLS | 88.0 | VARYDRVS | 86.0 |
| | — | — | VPERDRVS | 87.0 |
| VREF | VBNDREF | 77.0 | VMULT | 78.0 |
| | — | — | VBIN | 79.0 |
| | — | — | VDDCLAMP | 80.0 |
| VSSAB | — | — | RCL | 1.00 |
| | — | — | CL1 | 2.00 |
| | — | — | PADABUF | 6.0 |
| | — | — | INBUF | 61.0 |
| | — | — | INBUF3 | 62.0 |
| | — | — | W1 | 65.0 |
| | — | — | G1 | 74.0 |
| VSSOD | — | — | OUTBUF | 60.0 |
| | — | — | OUTBUF3 | 60.2 |
| VSSRG | — | — | VBNDREF | 77.0 |
| | — | — | VMULT | 78.0 |
| | — | — | VBIN | 79.0 |
| | — | — | VDDCLAMP | 80.0 |
| | — | — | VCLMP | 80.1 |
| | — | — | VARYBUF | 82.0 |
| | — | — | VPERBUF | 83.0 |
| | — | — | VARYDRV | 84.0 |
| | — | — | VPERDRV | 85.0 |
| | — | — | VARYDRVS | 86.0 |
| | — | — | VPERDRVS | 87.0 |
| | — | — | VRCTLS | 88.0 |
| | — | — | VRCTLA | 88.1 |
| | — | — | VRCTLP | 88.2 |
| | — | — | VRCTLC | 88.3 |
| | — | — | VRVBBO | 89.0 |
| | — | — | VBLR | 90.0 |
| | — | — | VPLT | 90.2 |
| | — | — | BIHO | 90.4 |
| | — | — | VREFINIT | 90.5 |
| W. | — | — | W1 | 65.0 |
| W1 | W1 | 65.0 | WBR | 66.0 |
| | — | — | LATWR. | 75.0 |
| W2. | W1 | 65.0 | IOCTL | 63.0 |
| | — | — | IOCTL3 | 64.0 |
| | — | — | CLRMX. | 70.0 |
| | — | — | DEN. | 71.0 |
| | — | — | WLMX | 73.0 |
| WBR | WBR | 66.0 | IOCTL | 63.0 |
| | — | — | IOCTL3 | 64.0 |
| | — | — | TLOVL | 92.0 |
| | — | — | TLINI | 93.0 |
| | — | — | TLEX | 95.0 |
| | — | — | TLJDC | 96.0 |
| WBR. | WBR | 66.0 | DEN. | 71.0 |
| WBRP | WBRP | 68.0 | INBUF | 61.0 |
| | — | — | INBUF3 | 62.0 |
| WCBR | TLINI | 93.0 | TLRAL | 97.0 |
| WLMX | WLMX | 73.0 | DWE. | 53.0 |
| | — | — | IOMUX | 57.0 |
| | — | — | IOMUX3 | 58.0 |
| | — | — | INBUF | 61.0 |
| WMBq | INBUF | 61.0 | QDDEC. | 50.0 |
| WMB3 | INBUF3 | 62.0 | — | — |
| WMO | PGSIG | 60.3 | RBWP. | 67.0 |
| | — | — | DEN. | 71.0 |
| WRT.EN | WLMX | 73.0 | CLRMX. | 70.0 |
| | — | — | DEN. | 71.0 |
| | — | — | CLOE | 76.0 |
| X1BDPD | — | — | PGSIG | 60.3 |
| XWjmk0 | XDECM | 13.0 | — | — |
| XWjmk1 | XDECM | 13.0 | — | — |
| XWjmk2 | XDECM | 13.0 | — | — |
| XWjmk3 | XDECM | 13.0 | — | — |
| XW0 | — | — | BITLINE | 32.2 |
| XW1 | — | — | BITLINE | 32.2 |
| YSEL | — | — | SA | 31.0 |
| | — | — | SA.END | 32.0 |
| YSELjkey | YDEC | 37.0 | SA | 31.0 |
| | — | — | SA.END | 32.0 |
| YSELjkoy | YDEC | 37.0 | SA | 31.0 |

TABLE 1-continued

| SIG NAM | OUTP FROM | FIG # | INP TO | FIG # |
|---|---|---|---|---|
| | — | — | SA.END | 32.0 |

TABLE 2

| | |
|---|---|
| B = X or _X | : ADDRESS DECODING |
| C = X OR _X/ _X OR X | : ADDRESS DECODING |
| I = 0, 1 | : I/O PAIR |
| J = L, R | : CHIP LEFT OR RIGHT |
| K = T, B | : CHIP TOP OR BOTTOM |
| M = 0–16 | : BLOCK OR BANK |
| N = 0–7 | : GLOBAL I/O |
| O = L, R | : OCTANT (QUADRANT LEFT OR RIGHT) |
| P = 0–7 | : GROUPS OF TWO BLOCKS |
| Q = 0–3 | : QUADRANT |
| U = 0–4 | : ROW REDUNDANT LINE # |
| 0–3 | : COL REDUNDANT LINE # |
| V = 0–3 | : ROW REDUNDANT DECODER # |
| 0–2 | : COL REDUNDANT DECODER # |
| W = X-1 | : ADDRESS DECODING |
| X = 0–11 | : ADDRESSES |
| Y = MULTIPLE RANGES | : DECODING OUTPUT |

DETAILED DESCRIPTION OF THE PREFERRED EMBODIMENT

FIG. 0.1 illustrates a 16 Megabit Dynamic Random Access Memory Chip referred to as a 16 MB DRAM. The chip size is about 325×660 mm. The chip is partitioned into four memory array quadrants. Each memory array quadrant contains 4 Megabits. A 4 MB memory array quadrant contains 16 memory blocks. Each memory block contains 256 Kilobits. The Column Decoders lie along the vertical axis of the chip adjacent to their respective memory array quadrants. The ROW decoders lie along the horizontal axis of the chip, adjacent to their respective memory array quadrants. The periphery circuits containing such devices as the input and output buffers and the timing and control circuits are centrally located along both horizontal the vertical axis of the chip. The bond pads are centrally located along the horizontal axis of the chip.

FIG. 0.11 is a graph orientation drawing illustrating how to connect FIGS. 0.11A1–0.11A5, FIGS. 0.11B1–0.11B5, FIGS. 0.11C1–0.11C5, FIGS. 0.11D1–0.11D5, FIGS. 0.11E1–0.11E5, 0.11F1–0.11F5, and FIGS. 0.11G1–0.11G5. These figures are connected by placing them flat so that the A1–G5 reference characters of each figure are on the bottom left hand corner. The connected figures form a top view block diagram of the 16 MB DRAM of FIG. 0.1.

FIG. 0.2 is a top view drawing illustrating the package/pin out of the device. The chip is center bonded and encapsulated in a thin plastic, small outline J-type package. Among other features, the DRAM is bond programmable as either a X1 or a X4 device. The pin designations for both the X1 and X4 modes of operation are illustrated.

FIG. 0.3 is a three-dimensional view of the encapsulated chip wherein the encapsulating plastic is rendered transparent. The pin designations shown correspond to the X4 option. The TSOJ package is of the lead over chip with center bond (LOCCB) type. Basically, the chip lies underneath the lead fingers. A polyimide tape attaches the chip to the lead fingers. Gold wires are wire-bonded from the lead fingers to the center bonding pads of the chip.

FIG. 0.4 is an assembly view of the packaging concept and FIG. 0.5 is a cross-section view of the packaged device.

FIG. 0.6 is a diagram illustrating the names and sequence of the bond pads. The sequence for both the X1 and the X4 options are illustrated. EXT BLR is a pad that is for in-house only. The brackets, such as those for bond pad 4 and 25 indicate that this is a bond pad option.

General characteristics of the 16 MB DRAM device of FIG. 0.1 follow. The device receives external VDD of typically 5 volts. On chip internal voltage regulation powers the memory arrays at 3.3 volts and the periphery circuits at 4.0 volts to reduce power consumption and channel hot carrier effects. The substrate is biased at −2 volts. The organization is bond programmable X1/X4. The enhanced page mode is the main option, with a metal mask programmable option for a write per bit (data mask) operation. The main option for the refresh scheme is 4096 cycles at 64 ms. However, the DRAM is bond programmable for 2048 cycle refresh.

The DRAM has numerous design-for-test features. Test mode entry 1 is through WCBR with no address key for 16X internal parallel test with mode data compare. Test mode entry 2 is WCBR with over-voltage and address key only thereafter (8 volts on A11), Exit from test mode occurs from any refresh cycle (CBR or RAS only). Test mode entry 1 is the industry standard 16X parallel test. This test is similar to those use on the 1 MB and 4 MB DRAMS, except that 16 bits are compared simultaneously instead of 8 bits. The valid address keys are A0, A1, A2, and A6. Test mode entry 2 contains numerous tests. There is a 32X parallel test with data compare and a 16X parallel test with data compare. Different hexadecimal addresses are keyed for the different parallel tests. A storage cell stress test and a VDD margin test allows connection of the external VDD to internal VARY and VPERI through the P-channel devices. Other tests include a redundancy signature test, a row redundancy roll call test, a column redundancy roll call test, a row transfer test, a word-line leakage detection test, clear concurrent test modes, and a reset to normal mode. The DRAM also contains a test validation method that indicates if it has remained in a test mode.

Although not illustrated in FIG. 0.1, for clarity, the DRAM contains redundancy features for defect elimination. It has four redundant rows per 256K memory block. All four may be used at one time. There are 3 decoders per redundant row and 11 row addresses per redundant row decoder. It uses fuses for row redundancy with, on-average, 10 fuses blown for a single repair. The row redundancy uses a two stage programmable concept to more efficiently enable repair. There are 12 redundant columns per quadrant and four decoders per redundant column. There are 8 column addresses and 3 row addresses per decoder. The total fuse count for column repair is about, on average, 10 fuses blown for a single repair. Column redundancy also has a two-stage programmable feature to more efficiently enable repair.

FIG. 0.7 is a top view of the capacitor cell layout. The bit lines are poly-3 ($TiSi_2$) polyside. No bitline reference is used and the bitlines are triple twisted for noise immunity. The bit line voltage is about 3.3 volts. The word lines are segmented poly-2. They are strapped every 64 bits with metal2. The memory cells are of the modified trench capacitor type and may be formed by a process such as disclosed in the following co-pending and co-assigned applications, all filed, Jul. 25, 1989:

Ser. No. 385,441 TI-14042;

Ser. No. 385,601 TI-14415;

Ser. No. 385,328 TI-14416;

Ser. No. 385,344 TI-14418; and

Ser. No. 385,340 TI-14419.

Alternative suitable memory cells of the stacked trench-type are disclosed in co-pending and co-assigned application Ser. No. 385,327 TI-14417 also filed Jul. 25, 1989.

In FIG. 0.7, the dimensions include a 1.6 um bit-line pitch by 3.0 um double word line pitch, with a cell size about 4.8 $um^2$ obtained through 0.6 micron technology. The trench opening is about 0.8 um×0.8 um. The trench-to-trench space is about 1.1 um and the trench depth is about 6.0 um. The dielectric is of nitride/oxide, having a thickness of about 65A. Field plate isolation is utilized. The transistors have thin gate oxide. FIG. 0.8 is a cross-sectional view of the modified trench capacitor cell and FIG. 0.9 is a side view of the trench capicator cell.

The structural description for the various circuits contained in the DRAM of FIG. 0.1 and the FIGS. 0.11A1 through 0.11G5 is given next. It is to be noted and understood that the prefix "X:" precedes the device reference characters in the circuits next described, wherein "X" corresponds to the FIG. number of the circuit. For clarity, "X:" is not physically written on these drawings. The codes the circuits having are contained in Table 1. Table 4 contains a signal from-to list for the electrical schematics. Table 2 is a signal description key for the signals used in the electrical schematics.

Figure 1:
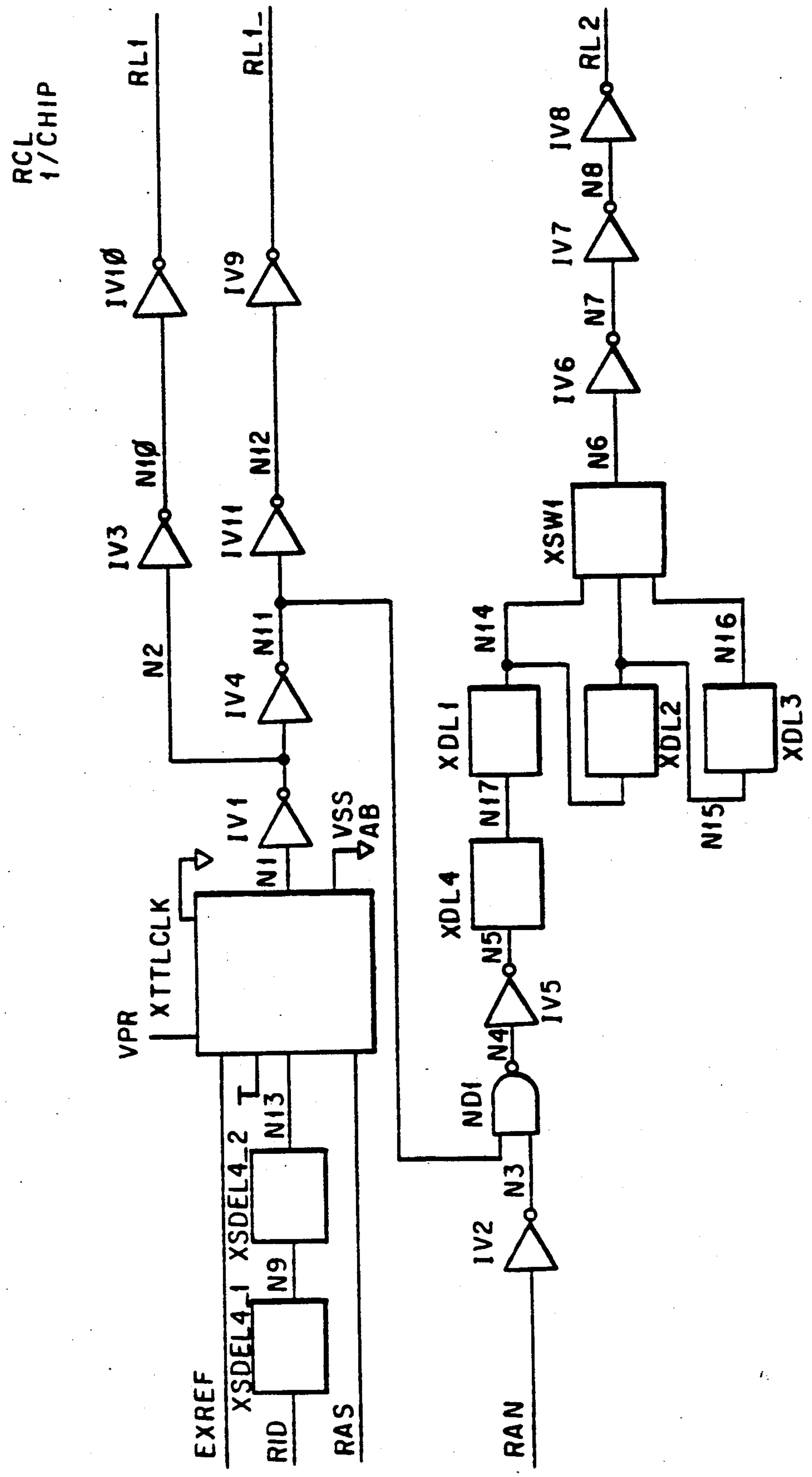
FIGS. 1 through 149 are electrical schematic drawings of various circuits of the 16 mb DRAM of FIG. 0.1 and FIG. 0.11. It is to be noted and understood that the prefix "X:" precedes the device reference characters illustrated in these FIGS. even though "X:" is not physically written on these drawings. "X:" corresponds to the FIG. number of the schematic. Table 1 contains a signal from-to list for the electrical schematics. Unless the figures and the structural description indicates otherwise, it is to be presumed that the circuits are biased by the voltage Vperi.

FIG. 1 is an illustration of the Row Clock Logic circuit, RCL. The Row Clock Logic circuit has four input signals and three output signals. The first input signal , EXREF, is coupled to the first input of the XTTLCLK block, which is labeled 1:XTTLCLK. The second input signal, RID, is coupled to the second input, not counting the VPERI supply connection of XTTLCLK, of the TTLCLK circuit through two serially connected delay elements; 1:XSDEL4, 1:XSDEL-4_1 and 1:XSDEL4_2. The third input signal, RAS_, is coupled to the third input of the TTLCLK block. The fourth input signal, RAN, is coupled to the second input of the NAND gate 1:ND1 through the inverter 1:IV2.

The Row Clock Logic circuit has 3 output signals. Node 1:N1, the output signal of the TTTLCLK circuit, is coupled to the first output signal RL1 through three serially connected inverters; 1:IV1, 1:IV3, and 1:IV10. Node 1:N1, the output of the TTLCLK circuit, is further coupled to the output signal RL1_ through four serially connected inverters; 1:IV1, 1:IV4, 1:IV11, and 1:IV9. Node 1:N11, the output of the inverter 1:IV4, is coupled to the first input of NAND gate 1:ND1. The output of NAND gate 1:ND1 is coupled to the input of delay element 1:XDL4 through the inverter 1:IV5. The output of delay element 1:XDL4 is coupled to the first input of the switch 1:XSW1 through the delay element 1:XDL1. The output of delay element 1:XDL1 is further coupled to the second input of the SWITCH 1:SW1 through the delay element 1:XDL2. The output of the delay element 1:XDL2 is further coupled to the third input of the SWITCH 1:XSW1 through delay element 1:XDL3. The output of the SWITCH 1:SW1 is coupled to the output signal RL2 through three serially connected inverters; 1:IV6, 1:IV7, and 1:IV8.

Figure 2:
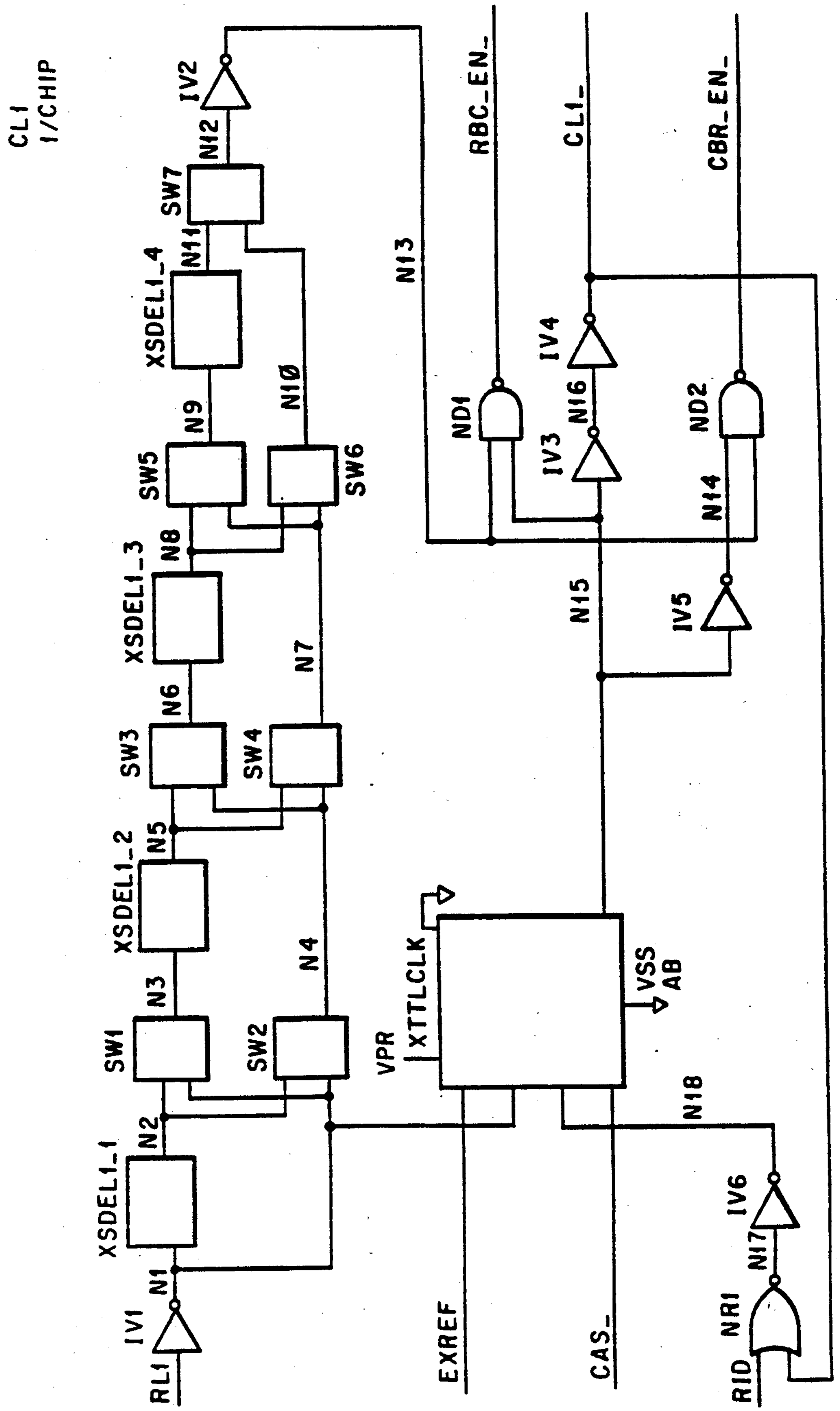
FIG. 2 illustrates the CL1, or Column Logic Circuit.

FIG. 2 is an illustration of the Column Logic circuit, CL1. The Column Logic circuit has four input signals and three output signals. The first input signal, RL1, is coupled to the input of the inverter 2:IV1. The second input signal, EXREF, is coupled to the first input of the XTTLCLK circuit, which is labeled 2:XTTLCLK. The third input signal, CAS_, is coupled to the fourth input of the TTLCLK circuit. The fourth input signal, RID, is coupled to the second input of the TTLCLK circuit, coupled through the NOR gate 2:NR1 and the inverter 2:IV6. The output node of inverter 2:IV1 is coupled to the input of the delay element 2:XSDEL-1_1, the B inputs of the SWITCHES 2:SW1 and 2:SW2, and the third input of the XTTLCLK circuit. The output of the delay element XSDEL1_1 is coupled to the A input of the switch 2:SW1 and to the A input of the SWITCH 2:SW2. The output of the SWITCH-_2:SW1, node 2:N3, is coupled to the A inputs of the SWITCHES 2:SW3 and 2:SW4 through the delay element 2:XSDEL1_2. The output of the SWITCH 2:SW2 is coupled to the B inputs of the SWITCHES 2:SW3 and 2:SW4. The output of the switch 2:SW3 is coupled to the A inputs of the SWITCHES 2:SW5 and 2:SW6 through the delay element 2:XSDEL1_3. The output of the SWITCH 2:SW4 is coupled to the B inputs of the SWITCHES 2:SW5 and 2:SW6. The output of the SWITCH 2:SW5 is coupled to the A input of the SWITCH 2:SW7 through the delay element 2:XSDEL-1_4. The output of the SWITCH 2:SW6. Node 2:N10 is coupled to the B inputs of the SWITCH 2:SW7. The output of the switch 2:SW7 is coupled to the input of the NAND gate 2:ND1 through the inverter 2:IV2. The output of the NAND gate 2:ND1 is coupled to the output signal RBC_EN_. The output of the circuit TTLCLK node 2:N15 is coupled to the output signal CL1_ through 2 serially connected inverters; 2:IV3 and 2:IV4. The output of the block TTLCLK is further coupled to the input of the NAND gate 2:ND1. The output of the block TTLCLK is also coupled to the input of the NAND gate 2:ND2 through the inverter 2:IV5. The output of the SWITCH 2:SW7, node 2:N12, is coupled to the input of the NAND gate 2:ND2 through the inverter 2:IV2. The output of the NAND gate 2:ND2 is coupled to the output signal CBR_EN_. The output signal CL1_ is further coupled to the input of the NOR gate 2:NR1.

Figure 3:
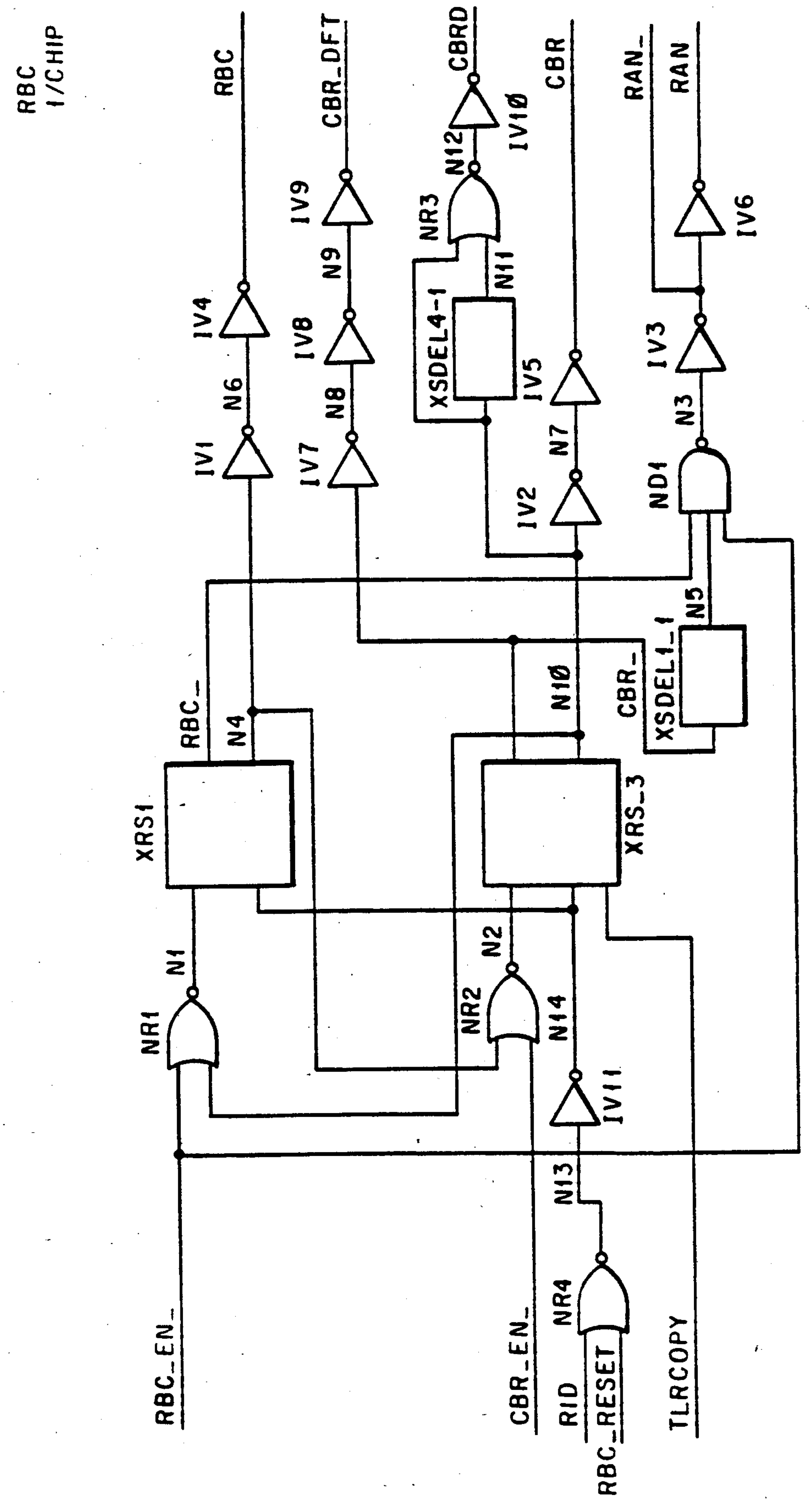
FIG. 3 illustrates the RBC, or Ras Before Cas Circuit.

FIG. 3 illustrates the RAS before CAS or RBC circuit. The RBC circuit has five input signals and six output signals. The first input signal, RBC_EN_, is coupled to the first input of the NOR gate 3:NR1 and further coupled to the third input of the NAND gate 3:ND1. The second signal, CBR_EN_, is coupled to the second input of the NOR gate 3:NR2. The third input signal, RID, is coupled to the first input of the NOR gate 2:NR4. The fourth input signal, RBC_RESET, is coupled to the second input of the NOR gate 3:NR4. The fifth input signal, TLRCOPY, is coupled to the third input of the RS latch circuit RS_3; which is labeled 3:XRS_3. The output of the NOR gate 3:NR4 is coupled through the inverter 3:IV11 to the second input of the RS latch 3:XRS_3, and further to the second input of the RS latch 3:XRS_1. The output of the NOR gate 3:NR2 is coupled to the first input of the RS latch 3:XRS_3. The output of the NOR gate 3:NR1 is coupled to the first input of the RS latch 3:XRS1. The output of RS latch 3:XRS1, labeled RBC_ in FIG. 3, is coupled to the first input of NAND gate 3:ND1. The second output of the RS latch 3:XRS1 is coupled to the output signal RBC through two serially connected inverters 3:IV1 and 3:IV4. The second output of the RS latch 3:XRS1 is further coupled to the first input of the NOR gate 3:NR2. The first output of RS latch 3:XRS_3, which is labeled 3:CBR_, is coupled to the second output signal CBR_DFT through three serially connected inverters; 3:IV7, 3:IV8, and 3:IV9. The first output of the RS latch 3:XRS_3 is further coupled to the second input of the NAND gate 3:ND1 through the delay element 3:XSDEL1_1. The second output of the RS latch 3:XRS_3 is coupled to the fourth output signal CBR through two serially connected inverters; 3:IV2 and 3:IV5. The second output of the RS latch 3:XRS_3 is further connected to the second input of the NOR gate 3:NR1. The second output of the RS latch 3:RS_3 is also coupled to the first input of the NOR gate 3:NR3, and further coupled to the second input of the NOR gate 3:NR3 through the delay element 3:XSDEL4_1. The output of the NOR gate 3:NR3 is coupled to the third output signal CBRD through the inverter 3:IV10. The output of the NAND gate 3:ND1 is coupled to the fifth output signal RAN_ through the inverter 3:IV3. The fifth output signal RAN_ is coupled to the sixth output signal RAN through the inverter 3:IV6.

Figure 4:
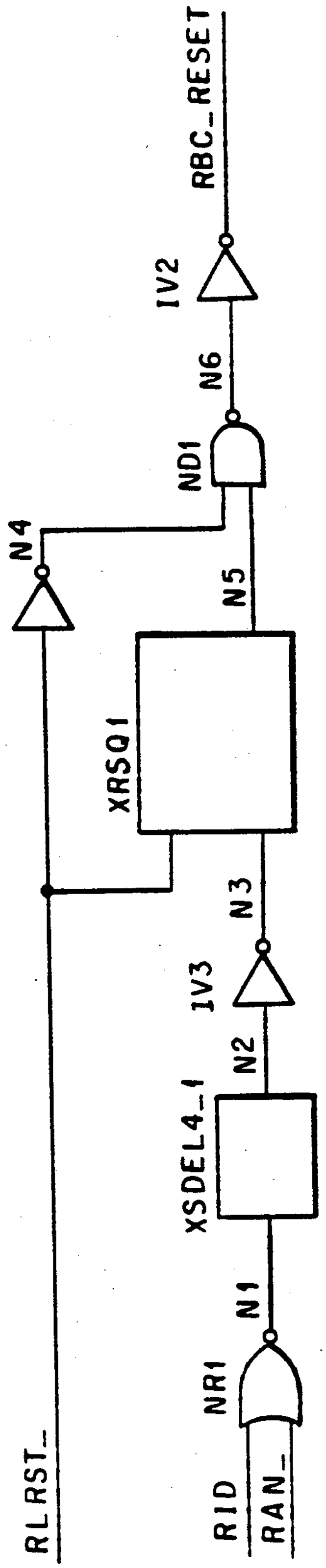
FIG. 4 illustrates the RBC_RESET Circuit, or the Ras Before Cas Reset Circuit.

FIG. 4 illustrates the RBC_RESET circuit which has three input signals and one output signal. The first input signal, RLRST_, is coupled to the first input of the RS latch 4:XRSQ1 and further coupled to the first input of the NAND gate 4:ND1 through the inverter 4:IV1. The second input, RID, is coupled through the first input of the NOR gate 4:NR1. The third input signal, RAN_, is coupled to the second input of the NOR gate 4:NR1. The output of the NOR gate 4:NR1 is coupled to the second input of the RS latch 4:XRSQ1 through the delay element 4:XSDEL4_1 and the inverter 4:IV3. The output of the RS latch 4:XRSQ1 is coupled to the second input of the NAND gate 4:ND1. The output of the NAND gate 4:ND1 is coupled to the output signal RBC_RESET through the inverter 4:IV2.

PLEASE NOTE THAT THERE IS NO FIG. 5.

FIG. 6 illustrates the PADABUF circuit. The PADABUF circuit has five input signals and two output signals. The first input signal, RL1_, is coupled to the enable input of the inverting buffer 6:XTTLADD and further coupled to the first input of the NOR gate 6:NR2. The second input, AX, is coupled to a BOND PAD and the input of the inverting buffer 6:XTTLADD. The third input signal, RL2, is coupled to the input of the inverter 6:IV1, and further coupled to the gate terminal of the PMOS device of the pass gate 6:PG1 and to the gate terminal of the NMOS device of the pass gate 6:PG2. The fourth input signal, CL1_, is coupled to the second input of the NOR gate 6:NR2 through the inverter 6:IV11. The fifth input signal, CLNA_, is coupled to the input of the inverter 6:IV10, to the gate terminal of the NMOS device of the passgate 6:PG6, and to the gate terminal of the PMOS device of the pass gate 6:PG4. The output of the inverting buffer 6:XTTLADD, node 6:N1, is coupled to node 6:N2 through the inverter 6:IV13. Node 6:N2 is coupled to the input of the pass gate 6:PG1 and further coupled to the input of the pass gate 6:PG3. The output of the pass gate 6:PG1, node 6:N3, is coupled to the input of the inverter 6:IV3 and further coupled to the output of the pass gate 6:PG2. The output of the inverter 6:IV3 is coupled to the output signal RAP_X and further coupled to the input of the inverter 6:IV4. The output of the inverter 6:IV4 is coupled to the input of the pass gate 6:PG2. The output of the inverter 6:IV1 is coupled to the gate terminal of the NMOS device of the pass gate 6:PG1 and further coupled through the gate terminal of the PMOS device of the pass gate 6:PG2. The output of the NOR gate 6:NR2 is coupled to the inverter 6:IV5, to the gate terminal of the PMOS device of the pass gate 6:PG5, and to the gate terminal of the NMOS device of the pass gate 6:PG3. The output of the inverter 6:IV5 is coupled to the gate terminal of the NMOS device of the pass gate 6:PG5 and to the gate terminal of the PMOS device of the pass gate 6:PG3. The output of the pass gate 6:PG3 is coupled to node 6:N5. Node 6:N5 is coupled to the input of the pass gate 6:PG4 and further coupled to the output of the pass gate 6:PG5 and to the input of the inverter 6:IV8. The output of the inverter 6:IV8 is coupled to the input of the inverter 6:IV9. The output of the inverter 6:IV9 is coupled to the input of the pass gate 6:PG5. The output of the inverter 6:IV10 is coupled to the gate terminal to the PMOS device of pass gate 6:PG6 and further coupled to the gate terminal of the NMOS device of pass gate 6:PG4. The output of pass gate 6:PG4 is coupled to the input of the inverter 6:IV6 and further coupled to the output of the pass gate 6:PG6. The output of the inverter 6:IV6 is coupled to the second output signal CAP_X and further coupled to the input of the pass gate device 6:PG6 through the inverter 6:IV7.

FIG. 7 illustrates the Row Address Driver Circuit or RADR circuit. The RADR circuit has four input signals and two output signals. The first input signal, BIT-M_X, is coupled to the input of pass gate 7:PG2. The second input signal, RAP_X is coupled to the input pass gate 7:PG1. The third input signal, CBRD, is coupled to the input of inverter 7:IV1 and further coupled to the gate terminal of the PMOS device of pass gate 7:PG1 and to the gate terminal of the NMOS device of pass gate 7:PG2. The fourth input signal, RAN, is coupled to the gate of the NMOS device 7:NM3, to the gate of the PMOS device 7:MP4, to the gate of the NMOS device 7:MN1, and is also coupled to the gate of the PMOS device 7:MP2. The output of the inverter 7:IV1 is coupled to the gate terminal of the NMOS device of the pass gate 7:PG1 and to the gate terminal of the PMOS device 7:PG2. The output of the pass gate 7:PG2, node 7:N1, is coupled to the output of the pass gate 7:PG1, the input of the inverter 7:IV2, the gate terminal of the PMOS device 7:MP3, and the gate terminal of the NMOS device 7:MN4. The output of the inverter 7:IV2 is coupled to the gate terminal of the PMOS device 7:MP1 and to the gate terminal of the NMOS device 7:MN2. Node 7:N5 is coupled through the PMOS devices 7:MP1 and 7:MP2, which are connected in parallel, to the voltage supply VPERI; and further coupled to the NMOS devices 7:MN1 and 7:MN2, which are connected in series to a common voltage terminal. Node 7:N7 is coupled to the PMOS devices 7:MP3 and 7:MP4, which are connected in parallel to the voltage supply VPERI; and further coupled through the NMOS devices 7:MN3 and 7:MN4, which are connected in series to a common voltage terminal. Node 7:N5 is connected to the output signal RAX through the inverter 7:IV3. Node 7:N7 is connected to the output signal RA_X through the inverter 7:IV4.

FIG. 8 illustrates the BITCOUNT circuit. The BITCOUNT circuit has a single input and two outputs. The input signal, BITBW, is coupled to the following elements; the input of the inverter 8:IV1, the gate terminal of the NMOS device 8:NM1, the gate terminal of the PMOS device 8:MP6, the gate terminal of the PMOS device 8:MP7, and the gate terminal of the NMOS device 8:NM4. The output of the inverter 8:IV1, labeled BITW_, is coupled to the following elements; the gate terminal of the PMOS device 8:MP5, the gate terminal of the NMOS device 8:MN2. The gate terminal of the NMOS device 8:NM3 and the gate terminal of the PMOS device 8:MP8. Node 8:N3 is coupled through the serially connected PMOS devices 8:MP1 and 8:MP5 to the voltage supply VPERI, through the serially connected NMOS devices 8:MN1 and 8:MN5 to a common voltage terminal, through the serially connected PMOS devices 8:MP2 and 8:MP6 to the voltage supply VPERI, through the serially connected NMOS devices 8:MN2 and 8:MN6 to a common voltage terminal, to the input of inverter 8:IV2, to the gate terminal of the PMOS device 8:MP3, and to the gate terminal of the NMOS device 8:MN7. The output of the inverter 8:IV2, labeled 8:N6 is coupled to the gate terminal of the PMOS device 8:MP2, and to the gate terminal of the NMOS device 8:MN6. Node 8:N9 is coupled to the following elements: through the serially connected PMOS devices 8:MP3 and 8:MP7 to the voltage supply VPERI, through the serially connected NMOS devices 8:MN3 and 8:MN7 to a common voltage terminal, through the serially connected PMOS devices 8:MP8 and 8:MP4 to the voltage supply VPERI, through the serially connected NMOS devices 8:MN4 and 8:MN8 to a common voltage terminal, and further connected to the input of the inverter 8:IV3. The output of the inverter 8:IV3 is coupled to the gate terminal of the NMOS device 8:MN8, the gate terminal of the PMOS device 8:MP4, the gate terminal of the NMOS device 8:MN5, the gate terminal of the PMOS device 8:MP1, to the input of the inverter 8:IV4, and to the output signal BITBX. The output of the inverter 8:IV4 is coupled to the output signal BITM_X.

FIG. 9 illustrates the RF circuit, or the Row Factor circuit. The Row Factor circuit has two input signals and a single output signal. The first input signal RAX is coupled to the first input of the NAND gate 9:ND1. The second input signal RAW is coupled to the second input of the NAND gate 9:ND1. The output of the NAND gate 9:ND1 is coupled to the output signal RFY through three serially connected inverters; 9:IV1, 9:IV2 and 9:IV3.

FIG. 10 illustrates the RLEN_ circuit, or the Row Logic Enable circuit. The Row Logic Enable circuit has ten input signals and four output signals.

The first input signal, TL8BS, is connected to the first input of the NOR gate 10:NR3 and further connected to the first input of the NOR gate 10:NR4. The second input signal RA_11 is connected to the second input of the NOR gate 10:NR3. The third input signal, RA11, is connected to the second input of the NOR gate 10:NR4. The fourth input signal RF4 is connected to the first input of the NOR gate 10:NR1. The fifth input signal, RF5, is connected to the second input of the NOR gate 10:NR1. The sixth input signal, RF6, is connected to the third input of the NOR gate 10:NR1. The seventh input signal, RF7 is connected to the fourth input of the NOR gate 10:NR1. The eighth input signal, RL1_, is connected to the second input of the NOR gate 10:NR2. The ninth input signal TLRCOPY is connected to the first input of the NAND gate 10:ND4 through the inverter 10:IV16. The tenth input signal RID is connected to the third input of the NOR gate 10:NR8. The output of the NOR gate 10:NR1, node 10:N1, is connected to the first input of the SWITCH 10:SW4, to the first input of the SWITCH 10:SW5, and to the second input SWITCH 10:SW5 through the delay element 10:DLY12. The output of the SWITCH 10:SW5 is connected to the second input of the SWITCH 10:SW4 through the delay element 10:DLY11. The output of the SWITCH 10:SW4, node 10:N5, is connected to the first input of the NOR gate 10:NR5, and to the second input of the NOR gate 10:NR5 through the delay element 10:XDL9 and the inverter 10:IV13. Node 10:N5 is further connected to the first input of the NOR gate 10:NR2 through the delay element 10:DLY1. The output of the NOR gate 10:NR2, node 10:N8, is connected to the first input of the NAND gate 10:ND2, and to the first input of the NAND gate 10:ND1. The output of the NOR gate 10:NR3 is connected to the second input to the NAND gate 10:ND1 through the inverter 10:IV10. The output of the NOR gate 10:NR4 is connected to the second input of the NAND gate 10:ND2 through the inverter 10:IV11. The output of the NAND gate 10:ND1 is coupled to the output signal RLEN_L through the serially connected inverters 10:IV1 and 10:IV2. The output signal RLEN_L is further coupled to the first input of the NAND gate 10:ND3 and to a PROBE PAD. The output of NAND gate 10:ND2 is coupled to the second output signal RLEN_R through the serially connected inverters 10:IV3 and 10:IV4. The output signal RLEN_R is further connected to the second input of the NAND gate 10:ND3 and to a PROBE PAD. The output of the NAND gate 10:ND3 is connected to the A input of the switch 10:SW3 through three serially connected delay elements; 10:DLY3, 10:DLY4, and 10:DLY5. The output of the delay element 10:DLY5, node 10:N18, is connected to the B input of the SWITCH 10:SW2, to the B input of the SWITCH 10:SW1, and further connected to the A input of the SWITCH 10:SW1 through the delay element 10:DLY6. The output of the SWITCH 10:SW1 is connected to the A input of the SWITCH 10:SW2 through the delay element 10:DLY7. The output of the SWITCH 10:SW2 is coupled to the B input of the switch 10:SW3 through the delay element 10:DLY8. The output of the SWITCH 10:SW3 is connected to the input of the inverter 10:IV5. The output of the inverter 10:IV5, node 10:N25, is connected to the input of the inverter 10:IV6 and to the second input of the NAND gate 10:ND4. The output of the inverter 10:IV6 is connected to the third output signal RLRST_, and also connected to a PROBE PAD. The output of the NAND gate 10:ND4, Node 10:N44, is connected to the first input of the NOR gate 10:NR6, and further connected to the second input of NOR gate 10:NR6 through the serially connected elements of the delay element 10:XDL10 and inverter 10:IV14. The output of the NOR gate 10:NR6 is connected to the second input of the NOR gate 10:NR8. The output of the NOR gate NR5 10:N10 is connected to the first input of the NOR gate 10:NR7. The output of the NOR gate 10:NR7, node 10:N41, is connected to the first input of the NOR gate 10:NR8 and to the input of the inverter 10:IV15. The output of the NOR gate 10:NR8 is connected to the second input of the NOR gate 10:NR7. Node 10:N41 is coupled to the output signal SEDIS through three serially connected inverters; 10:IV15, 10:IV8 and 10:IV9. The output signal SEDIS is further coupled to a PROBE PAD.

FIG. 11 is an illustration of the RLXH or Row Logic X High circuit. The Row Logic X(word) High Circuit has six input signals and one output signal.

The first input signal RL1_ is coupled to the first input of the NAND gate 11:ND1 through the inverter 11:IV10. The second input signal RLB is coupled to the second input of the NAND gate 11:ND1. The third input signal, TLWLL, is coupled to the first input of the NOR gate 11:NR6. The fourth input, TLWLS_, is coupled to node 11:N30 through inverter 11:IV14. The fifth input signal, RLEN_O, is coupled to the second input of the NOR gate 11:NR5, the second input of the NOR gate 11:NR2 and to the input of the inverter 11:IV11. The sixth input signal, PBOSC, is coupled to the third input of the NOR gate 11:NR5 and the first input of the NAND gate 11:ND2. The output of the NAND gate 11:ND2 is coupled to an N-channel device 11:MN18 which is configured as a capacitor, with the source and drain connected together and the gate terminal connected to the node 11:N27. Node 11:N30 is coupled to the input of the NOR gate 11:NR6, the input of the NAND gate 11:ND2 and to the node 11:N27 through the N-channel device 11:MN17, which is a low threshold voltage transistor. The gate terminal of the N-channel device 11:MN17 is coupled to the reference voltage VPERI. The output of the NOR gate 11:NR6 is coupled to the node 11:N16 through the inverter 11:IV13. Node 11:N16 is coupled to the first input of the NOR gate 11:NR3, the first input of the NOR gate 11:NR4, and the first input of the NOR gate 11:NR5. The output of the NAND gate 11:ND1 is coupled to the node 11:N8 through the inverter 11:IV2. Node 11:N8 is coupled to the second input of the NOR gate 11:NR1, and further coupled to node 11:N9 through the inverter 11:IV3. The output of the NOR gate 11:NR1, node 11:N17, is coupled to the second input of the NOR gate 11:NR4 and to the first input of the NOR gate 11:NR2. The output of NOR gate 11:NR2 is coupled to the first input of the NOR gate 11:NR1. Node 11:N9 is coupled to the second input of the NOR gate 11:NR3 and further coupled to node 11:N4 through the low threshold voltage N-channel device 11:MN12. The gate terminal of the N-channel device 11:MN12 is coupled to the voltage reference VPERI. The output of the NOR gate 11:NR4 is coupled to the node 11:N3 through three serially connected elements; the inverter 11:IV8, the inverter 11:IV9, and the low threshold N-channel device 11:MN13, which is connected in a capacitor configuration with the source and drain tied together. The output of the NOR gate 11:NR3 is connected to the SWITCH 11:SW3 through three serially connected elements; the inverter 11:IV5, the inverter 11:IV6, and the low threshold voltage N-channel device 11:MN11, which is connected in a capacitor configuration with the source and drain tied together. Node 11:N4 is connected to the output of the low voltage threshold N-channel device 11:MN12, the gate terminal of the low threshold voltage N-channel device 11:MN9, the gate terminal of the low threshold voltage N-channel device 11:MN4 and the gate terminal of the low threshold voltage N-channel device 11:MN8. Node 11:N5 is connected to the low threshold voltage N-channel device 11:MN8, the low threshold voltage N-channel device 11:MN6, and the low threshold voltage N-channel device 11:MN7, and further coupled to the SWITCH 11:SW3. The gate terminal of the low threshold voltage N-channel device 11:MN7 is connected to the voltage reference VPERI, the device being connected in a diode configuration with the drain and gate tied together. Node 11:N3 is tied to the gate terminal of the low threshold voltage N-channel device 11:MN13, to the gate terminal of the low threshold voltage N-channel device 11:MN6, to the drain terminal of the N-channel device 11:MN10, and to the source terminal of the N-channel device 11:MN9, which is a low threshold voltage transistor.

The output of the inverter 11:IV11, node 11:N23, is connected to node 11:N1 through two serially connected inverters; 11;IV12 and 11:IV1, node 11:N23 is further coupled to node 11:N25 through the delay element 11:DLY1, and node 11:N23 is also coupled to the gate terminal of the N-channel device 11:MN20 and to the gate terminal of the P-channel device 11:MP2. Node 11:N25 is coupled to the gate of the P-channel device 11:MP1 and further coupled to the gate of the N-channel device 11:MN21. The N-channel devices 11:MN20 and 11:MN21 are connected in parallel between node 11:N29 and a common voltage terminal.

The voltage reference VPERI is coupled to node 11:N29 through the serially connected P-channel devices 11:MP1 and 11:MP2. Node 11:N29 is further coupled to the gate terminal of 11:MN5 and to the N-channel device 11:MN10. The N-channel device 11:MN5 couples the output signal RLXHOQ to a common voltage terminal. The output of the inverter 11:IV1, node 11:N1, is coupled to the node 11:N3 through the N-channel device 11:MN9, which is a low threshold voltage transistor; to the gate terminal of the N-channel device 11:MN15, which is also a low threshold voltage N-channel transistor, and to the output signal RLXHOQ through the low threshold voltage N-channel device 11:MN4. The output signal RLXHOQ is coupled through the N-channel device 11:MN19 to an external voltage; through the low voltage threshold N-channel device 11:MN6 to node 11:N5; to the SWITCH device 11:SW3 and to the output of the diode connected low threshold voltage N-channel device 11:MN14. Node 11:N27 couples node 11:N30 to the gate terminal of the N-channel device 11:MN18 through the low threshold voltage N-channel device 11:MN17, and is further coupled to the gate terminal of the N-channel device 11:MN19. The output of the NOR gate 11:NR5 is coupled to the node 11:N22 through the N-channel device 11:MN16, which is connected in a capacitor configuration with the source and drain tied together. Node 11:N22 couples the gate terminal of the N-channel device 11:MN16 to the input of the diode connected low threshold voltage N-channel device 11:MN14 and is further coupled through the low voltage threshold N-channel device 11:MN15 to the reference voltage VPERI.

FIG. 12 illustrates the RDDR circuit or the Row Decoded Driver Circuit. The Row Decoder Driver Circuit has eight input signals. The first input signal, TLWLS_, is coupled to the gate terminal of the N- channel device 12:MN9. The second input signal, BNKPC_Q, is coupled to the gate terminal of the P-channel device 12:MP1. The third input signal RRQSQ is coupled to the gate terminal of the N-channel device 12:MN1. The fourth input signal RA0B is coupled to the gate terminal of the N-channel device 12:MN2. The fifth input signal RA1B is coupled to the gate terminal of the N-channel device 12:MN3. The sixth input signal RA9B is coupled to the gate terminal of the N-channel device 12:MN4. The seventh input signal, RA10B, is coupled to the gate terminal of the N-channel device 12:MN5. Node 12:N1 is coupled to the following elements: the N-channel device 12:MN1, the P-channel device 12:MP1, the N-channel 12:MN9, the N-channel device 12:MN3, the P-channel device 12:MP3, the N-channel device 12:MN4 the N-channel device 12:MN5, the input to the inverter 12:IV1, a PROBE PAD, and is coupled to node 12:N3 through the low threshold voltage N-channel device 12:MN6. The N-channel device 12:MN1 coupled the node 12:N1 to a common voltage terminal. The P-channel device 12:NP1 couples the node 12:N1 to the reference voltage VPERI. The N-channel device 12:MN9 couples the node 12:N1 through the N-channel device 12:MN2 to a common voltage terminal. The N-channel device 12:MN3 couples the node 12:N1 to a common voltage terminal The P-channel device 12:MP3 couples the node 12:N1 to the reference voltage VPERI. The N-channel devices 12:MN4 and 12:MN5 couple the node 12:N1 to the common voltage terminal. The output of the inverter 12:IV1, node 12:N2, is coupled to the gate terminal of the PMOS device 12:MP3 and further coupled to the gate terminal of the N-channel device 12:MN8. The output signal RDJPKY is coupled through the N-channel device 12:MN8 to a common voltage terminal and through the N-channel device 12:MN7 to the signal RLXHOQ. The gate terminal of the low threshold voltage device 12:MN6 is tied to the reference voltage VPERI. The output signal RDJPKY is further coupled to a PROBE PAD.

FIG. 12.2 illustrates the BNKPC_ circuit or the Bank Pre-charge circuit. The Bank Pre-charge circuit has two input signals and a single output signal.

The first input signal RL2 is coupled to the first input of the NAND gate 12.2:ND1 through the inverter 12.2:IV1, and is further coupled to the first input of the NOR gate 12.2:NR1 through three serially connected delay elements; 12.2:XDL1, 12.2:XDL2, and 12.2:XDL3. The second input terminal, RID, is coupled to the second input of the NOR gate 12.2:NR1.

The output of the NOR gate 12.2:NR1 is coupled to the second input of the NAND gate 12.2:ND1 through the inverter 12.2:IV4. The output of the NAND gate 12.2:ND1 is coupled to the output signal BNKPC_Q through two serially connected inverters; 12.2:IV2 and 12.2:IV3. The output signal BNKPC_Q is further coupled to a PROBE PAD.

FIG. 13 illustrates the XDECM circuit, or the Row Decoder circuit. The Row Decoder circuit has nine input signals and four output signals.

The first input signal, RF47, is coupled to the gate terminal of the N-channel device 13:MN6. The second input signal, RF811, is coupled to the gate terminal of the N-channel device 13:MN5. The third input signal, RF1215, is coupled to the gate terminal of the N-channel device 13:MN4. The fourth input signal, BSSJK_M, is coupled through three serially connected N-channel devices to the node 13:N1. The three serially connected N-channel devices coupling the fourth input signal to the node 13:N1 are: 13:MN6, 13:MN5, and 13:MN4. The fifth input signal BSSJKM is coupled to the gate terminal of the P-channel device 13:MP1. Node 13:N1 is coupled to the reference voltage VPERI through the P-channel device 13:MP1, is further coupled to the reference voltage VPERI through a second P-channel device 13 MP2, is coupled to the input of the inverter 13:IV2, and is further coupled to the gate terminal of the following N-channel devices: 13:MN14, 13:MN12, 13:MN10, and 13:MN8. The output of the inverter 13:IV2 is coupled to the gate terminal of the P-channel device 13:MP2, and is further coupled to the gate terminals of the following N-channel devices: 13:MN7, 13:MN9, 13:MN11, and 13:MN13. Each coupling of the node 13:N4 to the gate terminals of the N-channel devices is accomplished through a low threshold voltage N-channel transistor whose gate terminal is coupled to the reference voltage VPERI, the transistors being the following: 13:MN0, 13:MN1, 13:MN2, and 13:MN3.

The output signal XWJMK0 is coupled to the input signal RDJPK0 through the N-channel device 13:MN7 and is further coupled to a common voltage terminal through the N-channel device 13:MN8. The second output signal XWJMK1 is coupled to the signal RDJPK1 through the N-channel device 13:MN9 and is further coupled to the common voltage terminal through the N-channel device 13:MN10. The third output signal XWJMK2 is coupled to the signal RDJPK2 through the N-channel device 13:MN11 and further coupled to the common voltage terminal through the N-channel device 13:MN12. The fourth output signal XWJMK3 is coupled to the input signal RDJPK3 through the N-channel device 13:MN13 and to a common voltage terminal through the N-channel device 13:MN14.

FIG. 14 illustrates the RRA circuit, or the Row Redundancy Address circuit. The Row Redundancy Address Circuit has three input signals and two output signals.

The first input signal, RA_X is coupled to the first output signal, RRUVAX, through the low threshold voltage N-channel device 13:MN3A. The Second input signal, RAX, is also coupled to the first output signal, RRUVAX through the low threshold N-channel device 13:MN3B. The third input signal RRDSPU, is coupled to the gate terminal of the N-channel device 13:MN1A. The N-channel device 13:MN1A couples the node 13:N1 to the common voltage terminal. 13:N1 is further coupled to the reference voltage VPERI through the fuse 14:F1 and the P-channel device 14:MP1. It is further coupled to the common voltage terminal through the N-channel device 13:MN1B, the gate terminal of the low threshold voltage 14:MN3B, the gate terminal of the P-channel device 14:MP2 and the gate terminal of the N-channel device 14:MM2. The second output signal RRUVPN is coupled to node 14:N1 through the fuse 14:F1 and is further coupled to node 14:N2 through the P-channel device 14:MP2. Node 14:N2 is coupled to the gate terminal of the low threshold voltage N-channel device 14:MN3A, the gate terminal of the N-channel device 14:MN1B and is further coupled to the ground terminal through the N-channel device 14:MN2.

FIG. 15 illustrates the RRDEC circuit Row Redundancy Decoder. The Row Redundancy Decoder circuit has 13 input signal and a single output signal.

The first input signal RRL2 is coupled to the gate terminal of the CMOS device 15:MP1. The second input signal, RRUVA0, is coupled to the gate terminal of the N-channel device 15:MN1A. The third input signal, RRUVA1, is coupled to the gate terminal of the N-channel device 15:MN1B. The fourth input signal, RRUVA2, is coupled to the gate terminal of the N-channel device 15:MN1C. The fifth input signal, RRUVA3, is coupled to the gate terminal of the N-channel device 15:MN1D. The sixth input signal, RRUVA4, is coupled to the gate terminal of the N-channel device 15:MN1E. The seventh input signal, RRUVA5, is coupled to the gate terminal of the N-channel device 15:MN1F. The eighth input signal RRUDA6, is coupled to the gate terminal of the N-channel device 15:MN1G. The ninth input signal, RRUVA7, is coupled to the gate terminal of the N-channel device 15:MN1H. The tenth input signal, RRUVA8 is coupled to the gate terminal of the N-channel device 15:MN1I. The ninth input signal, RRUVA9 is coupled to the gate terminal of the N-channel device 15MN1J. The twelfth input signal, RA_10, is coupled to the gate terminal of the N-channel device 15:MN1L. The thirteenth input signal, RA10 is coupled to the gate terminal of the N-channel device 15:MN1M. Node 15:N2 is coupled to the reference voltage VPERI through the two P-channel devices 15:MP1 and 15:MP3, and is coupled to the VSS or ground terminal through the following N-channel devices; 15:MN1A, 15:MN1B, 15:MN1C, 15:MN1D, 15:MN1E, 15:MN1F, 15:MN1G, 15:MN1H, 15:MN11, 15:MN1J. Node 15:N2 is coupled to the ground terminal through the N-channel devices 15:MN1L and 15:MN1M, each N-channel device being connected to node 15:N2 by a respective fuse. Node 15:N2 is further connected to the output signal RRUDV. The gate of the P-channel device 15:NP3 is connected to the node 15:N2 through the inverter 15:IV1.

In FIG. 15, 15:RC1 and 15:RC2 illustrate the intrinsic resistive capacitive values of the metal at node 15:N2 and the output signal RRUDV respectively. They do not represent physical circuit elements.

FIG. 16 illustrates the RRX circuit, or the Row Redundancy X-Factor circuit. The Row Redundancy X-Factor circuit has four input signal and four output signals.

The first input signal, RRUD0 is connected to the second input to the NAND gate 16:ND1. The second input signal, RRUD1, is connected to the second input of the NAND gate 16:ND2. The third input signal RRXE, is connected to the first input of the NAND gate 16 ND1, the first input of the NAND gate 16:ND2, and the first input of the NAND gate-16:ND3. The fourth input signal RRUD2, is connected to the second input of the NAND gate 16:ND3.

The output of the NAND gate 16:ND1, node 16:N1 is connected to the first input of the NAND gate 16:ND4, the input of inverter 16:IV1, and to a probe pad. The output of the NAND gate 16:ND2, node 16:N2, is connected to the input of inverter 16:IV2 and further connected to the second input of the NAND gate 16:ND4. The ouput of the NAND gate 16:ND3, node 16:N3, is connected to the input of the inverter 16:IV3 and further connected to the third input of the NAND gate 16:ND4. The output of the NAND gate 16:ND4 is connected to the input of the inverter 16:IV4.

The output of the inverter 16:IV1 is connected to the first output signal RR0XU. The output of the inverter 16:IV2 is connected to the second output signal RR1XU. The output of the inverter 16:IV4 is connected to the third output signal RRXU through the inverter 16:IV5. The output of the inverter 16:IV3 is connected to the fourth output signal RR2XU.

FIG. 17 illustrates the RRXE circuit, or the Row Redundancy X-Factor Emulator. The Row Redundancy X-Factor Emulator circuit has four input signal and two output signals.

The first input signal, RA_4, is coupled to the node 127:N1 to the low threshold voltage transistor 17:MN2. The second input signal RA4 is coupled to the node 17:N2 to the low threshold voltage transistor 17:MN3. The third input signal, RL2, is coupled to the input of the inverter 17:IV1. The fourth input signal RL1_, is coupled to the second input of the NAND gate 17:ND1. The output of the inverter 17:IV1 is coupled to the first input of the NAND gate 17:ND1. The output of the NAND gate 17:ND1, node 17:N11, is coupled to the gate terminal of the P-channel device 17:MP1, and further coupled to the second input of the NOR gate 17:NR1. Node 17:N1 is coupled to the gate terminal of the N-channel device 17:MN1A. Node 17:N5 is coupled to the VPERI reference voltage through the P-channel device 17:MP1. It is further coupled through the serial connection of a fuse and the N-channel device 17:MN1A to the ground terminal. It is further coupled through the P-channel device 17:MP2 to the reference voltage VPERI, and also coupled to the ground terminal through the serial connection of a fuse and the N-channel device 17:MN1B. Node 17:N5 is further connected to the input of inverters 17:IV2 and to the input of the inverter 17:IV3. The output of the inverter 17:IV2 is connected to the gate terminal of the P-channel device 17:MP2. The output of the inverter 17:IV3 is connected to the first output signal RRXE, a probe pad, and to the first input of the NOR gate 17:NR1 through the delay element 17:DLY1. The output of the NOR gate 17:NR1 is connected to the second output signal RRL2 through the inverter 17:IV4.

FIG. 18 illustrates the RRQS circuit, or the Row Redundancy Quadrant Select circuit. The Row Redundancy Quadrant Select circuit has 13 input signal and two output signals.

Input signal RRL2, is connected to the gate terminal of the P-channel device 18:MP1. The second input signal, RR0X0, is connected to the gate terminal of the N-channel device 18:MN1. The third input signal, RR1X0, is connected to the gate terminal of the N-channel device 18:MN2. The fourth input signal, RR2X0, is connected to the gate terminal of the N-channel device 18:MN3. The fifth input signal, RR0X1, is connected to the gate terminal of the N-channel device 18:MN4. The sixth input signal, RR1X1, is connected to the gate terminal of the N-channel device 18:MN5. The seventh input signal, RR2X1, is connected to the gate terminal of the N-channel device 18:MN6. The eighth input signal, RR0X2, is connected to the gate terminal of the N-channel device 18:MN7. The ninth input signal, RR1X2, is connected to the gate terminal of the N-channel device 18:MN8. The tenth input signal, RR2X2, is connected to the gate terminal of the N-channel device 18:MN9. The eleventh input signal, RR0X3, is connected to the gate terminal of the N-channel device 18:MN10. The thirteenth input signal, RR2X3, is connected to the gate terminal of the N-channel device 18:MN12. Node 18:N1 is connected to the following circuit elements: The N-channel device 18:MN1, the N-channel device 18:MN2, the N-channel device 18:MN3, the N-channel device 18:MN4, the N-channel device 18:MN5, the N-channel device 18:MN6, the N-channel device 18:MN7, the N-channel device 18:MN8, the N-channel device 18:MN9 and N-channel devices 18:MN10, the N-channel device 18:MN11, and the N-channel device 18:MN12. Node 18:N1 is also connected to the input of inverter 18:IV2, and the input to the inverter 18:IV1. It is connected to the voltage reference VPERI, through the P-channel device 18:MP1, and also to the voltage reference VPERI through the P-channel device 18:MP2. Node 18:N1 is connected through the previously mentioned N-channel devices to the ground terminal VSS, with the respective source of each of the aforementioned N-channel devices serially connected to a fuse; 18:MN1 being connected to fuse 18:F1, 18:MN2 being connected to fuse 18:F2, and so forth, with N-channel device 18:MN12 being connected to fuse 18:F12.

In FIG. 18, the output of the inverter 18:IV1, node 18:N3 is connected to the gate terminal of the P-channel device 18:MP2. The output of the inverter 18:IV2, node 18:N4, is connected to the input of the inverter 18:IV4. Node 18:N4 is connected to the second output signal RRQSQ through the serially connected pair of inverters 18:IV3 and 18:IV5. The output of inverter of 18:IV4 is connected to the first output signal TLRR_Q.

FIG. 19. illustrates the RXDEC circuit, or the Redundancy X(word) Decoders. The Redundancy X Decoder circuit has four input signals and one output signal.

The first input signal RRQSQ is connected to the first input of the NAND gate 18:ND1 and further connected to a probe pad. The second input signal, RRXU, is connected to the second input of the NAND gate 19:ND1 and further connected to a probe pad. The third input signal, BSSJKM, is connected to the third input of the NAND gate 19:ND1 and further connected to a probe pad. The output of the NAND gate 19:ND1 is connected to the gate terminal of the N-channel device 19:MN3 and further connected to the gate terminal of the N-channel device 19:MN2 through the serially connected elements of the inverter 19:IV1 and the low threshold N-channel device 19:MN1. The gate terminal of the low threshold voltage N-channel device 19:MN1 is connected to the reference voltage VPERI. The fourth input signal RLXHOQ is coupled to the output signal RXWJMKY through the N-channel device 19:MN2. The N-channel device 19:MN3 couples the output signal RXWJMKY to the VSS voltage or ground.

FIG. 123 illustrates the RRDSP circuit. The RRDSP circuit has a single input signal and five output signals.

The input signal, RID, is coupled to the gate terminal of the P-channel device 123:MP6 and further coupled to the gate terminal of the N-channel device 123:MN4. The devices 123:MP6 and 123:MN4 are coupled to form A CMOS inverter whose output is node 123:N11; node 123:N11 being further coupled to the input of the inverter 123:IV1, the A input of the SWITCH 123:SW2A, the first input of the NAND gate 123:ND4, and the gate terminal of the N-channel device 123:MN5. The N-channel device 123:MN5 is an N-channel device constructed in the N-tank, whose gate terminal is connected to 123:N11 and whose other terminals are connected to ground. The output of the inverter 123:IV1, node 123:N12, is coupled to the input of the inverter 123:IV2, the B terminal of the SWITCH 123:SW2B, and the gate terminal of the P-channel device 123:MP7. The P-channel device 123:MP7 has its other terminals connected to the voltage VPERI.

The output of the inverter 123:IV2, node 123:N13, is coupled to the inverter 123:IV3, to the B terminal of the SWITCH 123:SW2A, and to the gate of the N-channel device 123:MN6. The N-channel device 123:MN6 is constructed in the N-tank with the gate terminal connected to the node 123:N13 and the other terminals connected to ground. The output of the inverter 123:IV3, 123:N14, is connected to the A terminal of the SWITCH 123:SW2B, the second input of the NAND gate 123:ND3, and the gate terminal of the P-channel device 123:MP8, which has its other terminals connected to the reference voltage VPERI. The output of the inverter 123:IV4, node 123:N15, is coupled to the A terminal of the SWITCH 123:SW2D, the input of the inverter 123:IV5, the first input of the NAND gate 123:ND2, and the gate terminal of the N-channel device 123:MN7, which is constructed in the N-tank and has its other terminals connected to ground. The output of the inverter 123:IV5, node 123:N16, is coupled to the input of the inverter 123:IV6, the B terminal of the SWITCH 123:SW2C, and the gate terminal of the P-channel device 123:MP9 which has its other terminals connected to the voltage VPERI. The output of the inverter 123:IV6, node 123:N17 is connected to the B terminal of the SWITCH 123:SW2D, the input of the inverter 123:IV7, and the gate terminal of the N-channel device 123:MN8 which is constructed in the N-tank and whose other inputs are connected to ground. The output of the inverter 123:IV7, node 123:N18, is connected to the second input of the NAND gate 123:ND1, the input of the inverter 123:IV12, the A terminal of the SWITCH 123:SW2C, and the gate terminal of the P-channel device 123:MP10 which has its other terminals to the reference voltage VPERI. The common terminal of the SWITCH 123:SW2D is connected to the first input of the NAND gate 123:ND1. The common terminal of the SWITCH 123:SW2C is connected to the second input of the NAND gate 123:ND2. The common terminal of the SWITCH 123:SW2A is connected to the first input of the NAND gate 123:ND3. The common terminal of the SWITCH 123:SW2B is connected to the second input of the NAND gate 123:ND4. The output of the inverter 123:IV12 is coupled to the first output signal CRDST through two serially connected inverters; 123:IV13 and 123:IV14. The output of the NAND gate 123:ND1 is coupled to the second output signal RRDSP0 through the inverter 123:IV8. The output of the NAND gate 123:ND2 is coupled to the third output signal RRDSP1 through the inverter 123:IV9. The output of the NAND gate 123:ND3 is coupled to the fourth output signal RRDSP2 through the inverter 123:IV10. The output of the NAND gate 123:ND4 is coupled to the fifth output signal RRDSP3 through the inverter 123:IV11.

FIG. 124 illustrates the Row Redundancy Address Test circuit, or the RRATST circuit. Thr RRATST circuit has a single input signal, and several probe pad connections for test.

The input signal, RRDSP3, is coupled to the gate terminal of an N-channel device, 124:MN1 and further coupled to a probe pad. Node 124:N1 is coupled through the N-channel devices 124:MN1 and 124:MN2 to the ground terminal, node 124:N1 is further coupled to the gate terminal of the P-channel device 124:MP1, node 124:N1 is further coupled to the gate terminal of the N-channel device 124:MN6 and the gate terminal of the P-channel device 124:MP3, and is further coupled to the gate terminal of the low threshold voltage N-channel device 124:MN3 and to a probe pad.

The other terminals of the P-channel device 124:MP1 are coupled to the voltage VPERI. Node 124:N2 is coupled to the gate terminal of the N-channel device 124:MN2. It is further coupled to the drain terminal of the N-channel device 124:MN6 and to the drain terminal of the P-channel device 124:MP3. Node 124:N2 is also coupled to the gate terminal of the low threshold voltage N-channel device 124:MN4. The source terminal of the N-channel device 124:MN6 is coupled to ground, the source terminal of the P-channel device 124:MP3 is coupled to another P-channel device 124:MP2 whose gate terminal is coupled to ground and whose source terminal is coupled to the reference voltage VPERI.

In FIG. 124, N-channel device 124:MN4 is connected between the probe pad and the node 124:N3; node 124:N3 being further connected to a probe pad and coupled through the N-channel device 124:MN3 to ground.

FIG. 20 illustrates the SDXWD circuit or the Sense Clock Cross Word detect circuit. The Sense Clock X-Word Detect circuit has four input signals and two output signals.

The first input signal, RLEN_L, is connected to the first input of the NAND gate 20:ND1. The second input signal, RLEN_R, is connected to the second input of the NAND gate 20:ND1. The third input signal, TLRCOPY, is connected to the second input of the NAND gate 20:ND2, and further connected to the second input of the RS latch 20:XRS1. The fourth input signal, SDS4, is connected to the input of the inverter 20:IV4, and further to the second input of the NAND gate 20:ND3.

The output of the inverter 20:IV4 is connected to the first input of the RS latch 20:XRS1. The output of the RS latch 20:XRS1 is connected to the first input of the NAND gate 20:ND3. The output of the NAND gate 20:ND3 is connected to the second input of the NAND gate 20:ND4. The output of the NAND gate 20:ND1 is connected to node 20:N3 through the serially connected elements of: the inverter 20:IV1, the delay element 20:XDL1, and the delay element 20:XDL2. The node 20:N3 is connected to the first output signal SDXWD through the inverter 20:IV2, and further connected to the first input of the NAND gate 20:ND2 through the inverter 20:IV3. The output of the NAND gate 20:ND2 is connected to the first input of the NAND gate 20:ND4 through the delay element 20:XDL3. The output of the NAND gate 20:ND4 is connected to the second output signal RLB through the serially connected inverter 20:IV5 and 20:IV6.

FIG. 21 illustrates the SDS1 circuit, or the Master Sense Clock circuit. The Master Sense Clock circuit has four inputs, and one output.

The first input signal, TLRCOPY, is connected to the second input of the NAND gate 21:ND5. The second input signal, EXTS1CTL, is connected to the first input of the NAND gate 21:ND1, to pull-down transistor 21:MN1, and to a PROBE PAD. The gate terminal of the N-channel pull-down transistor 21:MN1 is connected to the voltage source VPERI. The third input signal, ESTS1EN, is connected to the second input of the NAND gate 21:ND1, further connected to the first input of the NAND gate 21:ND2 through the inverter 21:IV4, and further connected to an N-channel pull-down transistor 21:MN2 and to a PROBE PAD. The gate terminal of the pull-down transistor 21:MN2 is connected to the voltage reference VPERI. The fourth input signal, SDXWD, is connected to the input of inverter 21:IV1. The output of the inverter 21:IV1, node 21:N1, is connected to the first input of the SWITCH 21:SW3, the first input of the SWITCH 21:SW4, and the delay element 21:XSDEL2. The output of the delay element 21:XSDEL2, node 21:N2, is connected to the second input of the SWITCH 21:SW3 and to the second input of the SWITCH 21:SW4. The output of the SWITCH 21:SW3 is connected to the first input of the SWITCH 21:SW5. The output of the SWITCH 21:SW4 is connected to the second input of the SWITCH 21:SW5 through the delay element 21:XSDEL1. The output of the SWITCH 21:SW5 is connected to the second input of the NAND gate 21:ND2 through the inverter 21:IV2. The output of the NAND gate 21:ND1 is connected to the first input of the NAND gate 21:ND4. The output of the NAND gate 21:ND2 is connected to the second input of the NAND gate 21:ND4. The output of the NAND gate 21:ND4, node 21:N17, is connected to the first input of the NAND gate 21:ND5, and further connected to the first output signal, SDS1, through the serially connected inverters 21:IV6 and 21:IV7. The output of the NAND gate 21:ND5 is connected to the third input of the NAND gate 21:ND4. The output signal SDS1 is further connected to a PROBE PAD.

FIG. 22, SDS2, is the Sense Clock 2 circuit. The Sense Clock 2 circuit has three input signal and two output signals.

The first input signal, SDS1, is connected to the input of inverter 22:IV1 and further connected to the input of the NAND gate 22:ND4. The second input signal, EXTS2EN, is connected to the first input of the NAND gate 22:ND2, the pull-down transistor 22:MN1, and the input of the inverter 22:IV3. The third input signal, EXTS2CTL, is connected to the second input of the NAND gate 22:ND2, and the pull-down transistor 22:MN2. The gate terminal of the pull-down transistor 22:MN1 is connected to the referenced voltage VPERI. The source terminal of the pull-down transistor 22:NCH1 is connected to ground. The gate terminal of the pull-down transistor 22:MN2 is connected to the reference voltage VPERI. The source of the pull-down transistor 22:NCH2 is connected to ground. The output of the inverter 22:IV1, node 22:N1, is connected to the first input of the SWITCH 22:SW1. Node 22:N1 is further connected to the input of the delay element 22:XSDEL4, whose output is connected to the second input of the SWITCH 22:SW1.

The output of the SWITCH 22:SW1 is connected to the first input of the NAND gate 22:ND1 through the serially connected elements of the delay element 22:XSDEL1 and the inverter 22:IV2. The output of the inverter 22:IV3 is connected to the second input of the NAND gate 22:ND1. The output of the NAND gate 22:ND1 is connected to the first input of the NAND gate 22:ND3. The output of the NAND gate 22:ND2 is connected to the second input of the NAND gate 22:ND3. The output of the NAND gate 22:ND3 is connected to the second input of the NAND gate 22:ND4. The output of the NAND gate 22:ND4, node 22:N10, is connected to the first output signal STPL_ through four serially connected inverters: 22:IV7, 22:IV8, 22:IV9, and 22:IV10. The output signal STPL_ is further connected to a PROBE pad. Node 22:N10 is connected to the second output signal SDS2 through three serially connected inverters: 22:IV4, 22:IV5, and 22:IV6. The output signal SDS2 is further connected to a PROBE PAD.

FIG. 23 illustrates the SDS3 or Sense Clock 3 circuit. The Sense Clock 3 circuit has three input terminals and a single output signal.

The first input signal, SDS1, is coupled to the input of the inverter 23:IV1 and further coupled to the input of the NAND gate 23:ND4. The second input signal, EXTS3EN, is coupled to the input of the inverter 23:IV3, the input of the NAND gate 23:ND2, and to the pull-down transistor 23:MN1. The third input signal, EXTS3CTL, is coupled to the pull-down transistor 23:MN2 and to the input of the NAND gate 23:ND2. The output of the inverter 23:IV3 is coupled to the input of the NAND gate 23 ND1. The output of the inverter 23:IV1 is coupled to the first input of the SWITCH 23:SW1, the first input of the SWITCH 23:SW2, and to the input of the delay element 23:XSDEL2. The output of the delay element 23:XSDEL2 is coupled to the second input of the SWITCH 23:SW1. The output of the SWITCH 23:SW1 is coupled to the second input of the SWITCH 23:SW2 through the delay element 23:XSDEL4. The output of the SWITCH 23:SW2 is coupled to the input of the NAND gate 23:ND1 through the serially connected elements of the delay element 23:XSDEL1 and the inverter 23:IV2. The output of the NAND gate 23:ND1 is coupled to the first input of the NAND gate 23:ND3. The output of the NAND gate 23:ND2 is coupled to the second input of the NAND gate 23:ND3.

The gate terminal of the pull-down transistor 23:MN1 is coupled to the reference voltage VPERI. The source terminal of the pull-down transistor 23:MN1 is coupled to ground. The gate terminal of the pull-down transistor, 23:MN2, is coupled to the reference voltage VPERI. The source terminal of the transistor 23:MN2 is coupled to ground. The output of the NAND gate 23:ND3 is coupled to the second input of the NAND gate 23:ND4. The output of the NAND gate 23:ND4 is coupled to the output signal SDS3 through three serially connected inverters: 23:IV4, 23:IV5, and 23:IV6. The output signal SDS3 is further connected to a PROBE PAD.

FIG. 24 illustrates the Sense Clock 4 circuit, or the SDS4 circuit. The Sense Clock 4 circuit has four input signals and a single output signal.

The first input signal SDS1 is connected to the first input of the NAND gate 24:ND4. The second input signal, SDS3, is connected to the inverter 24:IV1. The third input signal, EXTS4EN, is connected to the first input of the NAND gate 24:ND2, the input of the inverter 24:IV3, and to the drain of the pull-down transistor 24:MN1. The fourth input signal, EXTS4CTL, is connected to the second input of the NAND gate 24:ND2 and to the pull-down transistor 24:MN2. The gate terminal of the pull-down transistor 24:MN1 is connected to the reference voltage VPERI. The source terminal of the pull-down transistor 24:MN1 is connected to ground. The gate terminal of the pull-down transistor 24:MN2 is connected to the referenced voltage VPERI. The source terminal of the pull-down transistor 24:MN2 is connected to ground. The output of the inverter 24:IV3 is connected to the second input of the NAND gate 24:ND1. The output of the inverter 24:IV1 is connected to the input of the delay element 24:XSDEL2A and further connected to the input of the SWITCH 24:SW1.

The output of the delay element 24:XSDEL2A is connected to the second input of the SWITCH 24:SW1 through the delay element 24:XSDEL4A. The output of the SWITCH 24:SW1 is connected to the first input of the NAND gate 24:ND1 through serially connected elements of: the delay element 24:XSDEL2B, the delay element 24:XSDEL4B, and the inverter 24:IV2. The output of the NAND gate 24:ND1 is connected to the first input of the NAND gate 24:ND3. The output of the NAND gate 24:ND2 is connected to the second input of the NAND gate 24:ND3. The output of the NAND gate 24:ND3 is connected to the second input of the NAND gate 24:ND4. The output of the NAND gate 24:ND4 is connected to the output signal SDS4 through three serially connected inverters; 24:IV4, 24:IV5, and 24:IV6. The output signal SDS4 is further coupled to a probe pad.

FIG. 25 illustrates the BNKSL circuit, or the Bank Select Circuit. The Bank Select Circuit has thirteen input signal and four output signals.

The first input signal STPL_ is connected to the gate terminal of the P-channel device 25:MP13 and the gate terminal of the N-channel device 25:MN7. The second input signal, RA8B, is connected to the gate terminal of the N-channel device 25:MN11. The third input signal RA9B is connected to the gate terminal of the N-channel device 25:MN10. The fourth input signal, RA10B, is connected to the gate terminal of the N-channel device 25:MN12. The fifth input signal, RA11B, is connected to the gate terminal of the N-channel device 25:MN13. The sixth input signal TL8BS is connected to the gate terminal of the N-channel device 25:MN14 and further connected to the gate terminal of the N-channel device 25:MN5. The seventh input signal, TLRCOPY, is connected to the second input of the NAND gate 25:ND2. The eighth input signal, RA8C, is connected to the gate terminal of the N-channel device 25:MN2. The ninth input signal, RA9C, is connected to the gate terminal of the N-channel device 25:MN1. The tenth input signal, RA10C, is connected to the gate terminal of the N-channel device 25:MN3. The eleventh input signal, RA11C, is connected to the gate terminal of the N-channel device 25:MN4. The twelfth input signal, BNKPC_Q, is connected to the gate terminal of the P-channel device 25:MP1, and to the gate terminal of the P-channel device 25:MP3. The thirteenth input signal, STPH, is connected to the gate terminal of the N-channel device 25:MN9, the gate terminal of the P-channel device, 25:MP9, the gate terminal of the N-channel device 25:MN17 and the gate terminal of the P-channel device 25:MP10. Node 25:N1 is connected through the P-channel device 25:MP4 to the reference voltage VPERI, through the P-channel device 25:MP3 to the reference voltage VPERI, through the serially connected N-channel devices 25:MN10 and 25:MN11 to the node 25:N3, to the input of the inverter 25:IV11, to the gate terminal of the N-channel device 25:MN16, and to the gate terminal of the P-channel device 25:MP12. The node 25:N1 is further connected to the gate terminal of the P-channel device 25:MP6 and to the gate terminal of the N-channel device 25:MN6. N1 also connected to the first input of ND1.

The output of the inverter 25:IV11 is connected to the gate terminal of the p-channel device 25:MP4. Node 25:N3 is coupled to node 25:N4 through the N-channel device 25:MN12. Node 25:N4 is coupled to ground through the parallel N-channel devices 25:MN13 and 25:MN14. Node 25:N5 is coupled to the reference voltage VPERI through the P-channel device 25:MP1, and also through the P-channel device 25:MP2, node 25:N5 is further coupled to the input of the inverter 25:IV10, to the gate terminal of the P-channel device 25:MP11, to the gate terminal of the N-channel device 25:MN18, to the second input of the NAND gate 25:ND1, to the gate terminal of the N-channel device 25:MN8 to the gate terminal of the P-channel device 25:MP8, and to the input of the inverter 25:IV7.

The output of the inverter 25:IV10 is coupled to the gate terminal of the P-channel device 25:MP2. Node 25:N7 is coupled to node 25:N6 through the N-channel device 25:MN2. Node 25:N6 is coupled to node 25:N5 through the N-channel device 25:MN1. Node 25:N8 is coupled to node 25:N7 through the N-channel device 25:MN3, and is coupled to ground through the parallel N-channel devices 25:MN4 and 25:MN5. Node 25:N9 is coupled to the reference voltage VPERI through the P-channel device 25:MP11, is further coupled to the reference voltage VPERI through the serially connected P-channel devices 25:MP13, 25:MP12, and 25:MP10, and node 25:N9 is further coupled to node 25:N11 through the N-channel device 25:MN15 and through the parallel N-channel devices 25:MN16 and 25:MN17. Node 25:N9 is also coupled to the input of the inverter 25:IV1. Node 25:N11 is coupled to ground through the N-channel device 25:MN18. Node 25:N10 is coupled to the reference voltage VPERI through the P-channel device 25:MP6, is further coupled to the reference voltage VPERI through the serially connected P-channel devices 25:MP7, 25:MP8, 25:MP9; is coupled to node 25:N12 through the N-channel device 25MN7 and again coupled to the node 25:N12 through the parallel N-channel devices 25:MN8 and 25:MN9, and is also coupled to the inverter 25:IV4. Node 25:N12 is coupled to ground through the N-channel device 25:MN6. The output of the NAND gate 25:ND1 is coupled to the second output signal BNKSLJKM through the serially connected inverters 25:IV8 and 25:IV9; and is further connected to the first input of the NAND gate 25:ND2.

The output of the NAND gate 25:ND2 is coupled to the third input of the NAND gate 25:ND1. The output of the inverter 25:IV1 is coupled to the output signal STLJKM through the serially connected inverters 25:IV2 and 25:IV3. The output of the inverter 25:IV4 is coupled to the third output signal STRJKM through the serially connected inverters 25:IV5 and 25:IV6. The output of the inverter 25:IV7 is coupled to the fourth output signal BSSJKM.

FIG. 26 illustrates the BSS_DR circuit. The BSS_DR circuit is an inverting driving buffer whose input signal is BSSJKM, and whose output signal is BSSJK_M.

FIG. 27 illustrates the LENDBNKSL circuit, or the Left End Bank Select circuit. The Left End Bank Select circit has nine input signals and three output signals.

The first input signal, TLRCOPY, is coupled to the first input of the NAND gate 27:ND2. The second input signal, STPL_, is coupled to the gate terminal of the P-channel device 27:MP7, and further coupled to the gate terminal of the N-channel device 27:MN7. The third input signal, TL8BS, is coupled to the gate terminal of the N-channel device 27:MN5. The fourth input signal, RA_8, is coupled to the gate terminal of the N-channel device 27:MN2. The fifth input signal, RA_9 is coupled to the gater terminal of the N-channel device 27:MN1. The sixth input signal, RA_10, is coupled to the gate terminal of the N-channel device 27:MN3. The seventh input signal RA_11 is coupled to the gate terminal of the N-channel device 27:MN4. The eighth input signal, BNKPC_Q, is coupled to the gate terminal of the P-channel device 27:MP1. The ninth input signal, STPH, is coupled to the gate terminal of the N-channel device 27:MN9 and further coupled to the gate terminal of the P-channel device 27:MP9. Node 27:N5 is coupled to the reference voltage VPERI through the P-channel device 27:MP2 and further coupled to the reference voltage VPERI through the P-channel device 27:MP1, node 27:N5 is also coupled to node 27:N6 through the N-channel device 27:MN1, is coupled to the input of the inverter 27:IV1, is coupled to the second input of NAND gate 27:ND1, is coupled to the gate terminal of the N-channel device 27:MN8, is also coupled to the gate of the P-channel device 27:MP8, and is finally coupled to the input of the inverter 27:IV7. Node 27:N7 is coupled to node 27:N6 through the N-channel device 27:MN2 and is further coupled to node 27:N8 through the N-channel device 27:MN3. Node 27:N8 is coupled to ground through the parallel N-channel devices 27:MN4 and 27:MN5. The gate terminal of the N-channel device 27:MN6 is coupled to the gate terminal of the P-channel device 27:MP6 and is further coupled to the reference voltage VPERI. The source terminal of the N-channel device 27:MN7, node 27:N12, is coupled to ground through the N-channel device 27:MN6 and is further coupled to the drain terminal of P-channel device 27:MP9 through the parallel N-channel devices 27:MN8 and 27:MN9. The drain terminal of the P-channel device 27:MP9 is further coupled to the drain terminal of the N-channel device 27:MN7, the drain terminal of the P-channel device 27:MP6, and the input of the inverter 27:IV4. The source terminal of the P-channel device 27:MP6 is coupled to the reference voltage VPERI. The source terminal of the P-channel device 27:MP9 is coupled to the reference voltage VPERI through the serially connected P-channel devices 27:MP8 and 27:MP7.

The output of the inverter 27:IV1 is coupled to the gate terminal of the P-channel device 27:MP2. The output of the NAND gate 27:ND2 is coupled to the first input of the NAND gate 27:ND1. The output of the NAND gate 27:ND1 is coupled to the second input of the NAND gate 27:ND2, and further coupled to the first output signal BNKSLJK0 through the two serially connected inverters 27:IV8 and 27:IV9. The first output signal BNKSLJK0 is further connected to a PROBE PAD. The output of the inverter 27:IV4 is connected to the second output signal STRJK0 through the serially connected inverters 27:IV5 and 27:IV6. The second output signal STRJK0 is further connected to a PROBE PAD. The output of inverter 27:IV7 is connected to the third output signal BSSJK0 and to a PROBE PAD.

FIG. 28 is an illustration of the RENDBNKSL circit, or the Right End Bank Select circuit. The Right End Bank Select circuit has nine input signals and two output signals.

The first input signal, BNKPC_Q, is connected to the gate terminal of the P-channel device 28:MP1. The second input signal, STPL_, is connected to the gate terminal of the N-channel device 28:MN6 and to the gate terminal of the P-channel device 28:MP6. The third input signal, RA8, is connected to the gate terminal of the N-channel device 28:MN4. The fourth input signal, RA9, is connected to the gate terminal of the N-channel device 28:MN5. The fifth input signal, RA10, is connected to the gate terminal of the N-channel device 28:MN3. The sixth input signal, RA11, is connected to the gate terminal of the N-channel device 28:MN1. The seventh input signal, TL8BS is connected to the gate terminal of the N-channel device 28:MN2. The eighth input signal, STPH, is connected to the gate terminal of the N-channel device 28:MN8 and further connected to the gate terminal of the P-channel device 28:MP4. The ninth input signal, TLRCOPY, is connected to the second input of the NAND gate 28:ND1. Node 28:N18 is coupled to the reference voltage VPERI, through the P-channel device 28:MP1, and also through the P-channel device 28:MP2 to the input of the inverter 28:IV4, to node 28:N2 through the N-channel device 28:MN5, to the gate terminal of the N-channel device 28:MN7, to the gate terminal of the P-channel device 28:MP5, and to the first input of the NAND gate 28:ND2.

The output of the inverter 28:IV4 is connected to the gate terminal of the P-channel device 28:MP2. Node 28:N2 is coupled to node 28:N3 through the N-channel device 28:MN4. Node 28:N3 is coupled to node 28:N4 though the N-channel device 28:MN3. Node 28:N4 is coupled to ground through the parallel N-channel devices 28:MN1 and 28:MN2. The gate terminal of the N-channel device 28:MN9 is connected to the gate terminal of the P-channel device 28:MP3 and also to the reference voltage VPERI. Node 28:N11 is connected to ground through the N-channel device 28:MN9 and to the sources of the N-channel devices 28:MN6, 28:MN7 and 28:MN8. The drain of the P-channel device 28:MP3 is connected to the drains of the N-channel devices 28:MN6, 28:MN7, 28:MN8, and to the drain of the P-channel device 28:MP4, and further connected to the input of the inverter 28:IV1. The source of the P-channel device 28:MP3 is connected to the reference voltage VPERI. The source of the P-channel device 28:MP4, node 28:N16, is connected to the referenced voltage VPERI through the serially connected P-channel devices 28:MP5 and 28:MP6. The output of the NAND gate 28:ND1 is connected to the second input of the NAND gate 28:ND2. The output of the NAND gate 28:ND2, node 28:N22, is connected to the first input of the NAND gate 28:ND1 and connected to the second output signal BNKSLJK16 through two serially connected inverters, 28:IV8 and 28:IV9.

The output of the inverter 28:IV1 is connected to the first output signal STLJK16 through the two serially connected inverters 28:IV2 and 28:IV3.

FIG. 29 illustrates the S1234 circuit. The S1234 circuit has six input signals and five output signals.

The first input signal, BNKSLJKM, is coupled to the first input of the NAND gates 29:ND1, 29:ND2, 29:ND3, 29:ND4, and 29:ND5. The second input signal, SDS1, is coupled to the second input of the NAND gate 29:ND1. The third input signal, SDS2, is coupled to the second input of the NAND gate 29:ND2. The fourth input signal, SDS3, is coupled to the second input of the NAND gate 29:ND3. The fifth input signal, SDS4, is coupled to the second input of the NAND gate 28:ND4. The sixth input signal, SEDIS, is coupled to the second input of the NAND gate 29:ND5.

The output of the NAND gate 29:ND1 is coupled to the first output signal SIJKM through the inverter 29:IV1. The output of the NAND gate 29:ND2 is coupled to the second output signal S2JKM through the inverter 29:IV2. The output of the NAND gate 29:ND3 is coupled to the third output signal S3JK_M through two serially connected inverters, 29:IV3 and 29:IV5. The output of the NAND gate 29:ND4 is coupled to the fourth output signal S4JK_M through two serially connected inverters, 29:IV4 and 29:IV6. The output of the NAND gate 29:ND5 is coupled to the fifth output signal EJKM through two serially connected inverters, 29:IV7 and 29IV8.

FIG. 30 illustrates the PCNC circuit, or the P-Channel and N-channel circuit. The P-channel and N-channel circuit has five input signals and two output signals.

The first input signal, S4JK_M, is connected to the gate of the P-channel device 30:PCH2. The second input signal, S3JK_M, is connected to the gate of the P-channel device 30:PCH1. The third input signal, EJKM, is connected to the gate of the N-channel device 30:NCH3, the gate of the N-channel device 30:NCH4, and the gate of the N-channel device 30:NCH5. The fourth input signal S2JKM, is connected to the gate of the N-channel device 30:NCH2. The fifth input signal, SIJKM, is connected to the gate of the N-channel device 30:NCH1.

The first output signal PCJKM is coupled to the voltage reference VARY through two P-channel devices connected in parallel, 30:PCH1 and 30:PCH2; and further connected to the BLR signal through the N-channel device 30:NCH3, and connected to the second output signal, NCJKM, through the N-channel device 30:NCH5. The second output signal, NCJKM, is connected to the first output signal PCJKM through the N-channel device 30:NCH5, is further connected to ground through the parallel combination of the N-channel devices 30:NCH1 and 30:NCH2, and is further connected to the signal BLR through the N-channel device 30:NCH4.

FIG. 31 illustrates the SA circuit, or the Sense Amp circuit.

Node 31:N1 is coupled to the drain terminal of two P-channel devices, MPBL1A and MPBL2A, connected in parallel to the PC input, to the gate terminal of two more P-channel devices, MPBL1A and MPBL2A, to the source terminal of the N-channel device 31:MNBLRA, to the drain terminal of two low threshold voltage N-channel devices, MNN1A and MNN4A, which are coupled to the NC signal, to the gate terminal of two low threshold voltage N-channel devices, MNN3A and MNN4A, to the drain terminal of the low threshold voltage N-channel device 31:MNBL2A, and to the drain terminal of the N-channel device 31:MNN1B which is coupled to the LIOI signal. 31:N2 is also connected to the drain of MNBL1A and the drain of MNEQ1.

Node 31:N2 is coupled to the drain terminal of the low threshold voltage N-channel device 31:MNBL1_A, to the drain terminal of two P-channel devices 31:MPBL4A, and 31:MPBL3A, which are further coupled to the PC signal; node 31:N2 is further coupled to the gate terminal of two P-channel devices, 31:MPBL1A and 31:MPBL2A; Node 31:N2 is also coupled to the source terminal of the low threshold voltage N-channel device 31:MNEQ1, to the source terminal of the N-channel device 31:MNBLRB, to the gate terminal of two low threshold voltagé N-channel devices, 31:MNN1A and 31:MNN2A; node 31:N2 is also coupled to the drain terminal of two low threshold voltage N-channel devices, 31:MNN3A, and 31MNN4A, which are further coupled to the NC signal, node 31:N2 is further coupled to the N-channel device 31:MNN2B which is further coupled to LIO_I signal, node 31:N2 is further coupled to the low threshold voltage N-channel device 31:MNBL2_A.

The VARY signal is coupled to the substrate terminal of the four P-channel devices: 31:MPBL1A, 31:MPBL2A, 31:MPBL3A, and 31:MPBL4A. The E signal is coupled to the gate terminals of the following devices: the N-channel device 31:MNBLRB, the low threshold voltage N-channel devices 31:MNEQ1, and the N-channel device 31:MNBLRA. The BLR signal is coupled to the drain terminal of the N-channel devices 31:MNBLRA and 31:MNBLRB. The YSEL signal is coupled to the gate terminal of the N-channel devices 31:MNN1B and 31:MNN2B. The STR signal is coupled to the gate terminal of the low threshold voltage N-channel devices 31:MNBL2A and 31:MNBL2_A.

The STL signal is coupled to the gate terminals of two low threshold voltage N-channel devices, 31:MNBLIA and 31:MNBL1_A. The Bit Line signal BL1_ is coupled to the source terminal of the low threshold voltage N-channel device 31:MNBL1A. The Bit Line signal BL1 is coupled to the source terminal of the low threshold voltage N-channel device 31:MNBL1_A. The Bit Line signal BL2 is coupled to the source terminal of the low threshold voltage N-channel device 31:MNBL2A. The Bit Line signal BL2_ is coupled to the source terminal of the low threshold voltage N-channel device 31:MNBL2_A.

FIG. 32 illustrates the SA_END circuit, or the Sense Amp End circuit.

Node 32:N1 is connected to the drain terminal of the low threshold voltage N-channel device 32:MNBLA, the drain terminal of the P-channel devices 32:MPBL1A and 32:MPBL2A, the gate terminal of the P-channel devices 32:MPBL3A and 32MPBL4A, the source terminal of the low threshold voltage N-channel device 32:MNEQ1, the source terminal of the N-channel device 32:MNBLRA, the drain terminals of the low threshold voltage N-channel devices 32:MNN1A and 32:MNN2A, the gate terminals of the low threshold voltage N-channel devices 32:MNN3A and 32:MNN4A, and the drain terminal of the N-channel device 32:MNN1B.

Node 32:N2 is connected to the drain terminal of the low threshold voltage N-channel device 32:MNBL_A, the drain terminals of the P-channel devices 32:MPBL4A and 32:MPBL3A, the gate terminals of the P-channel devices 32:MPBL1A and 32:MPBL2A, the drain terminal of the low threshold voltage N-channel device 32:MNEQ1, the source terminal of the N-channel device 32:MNBLRB, the drain terminals of the low threshold voltage N-channel devices 32:MNN3A and 32:MNN4A, the gate terminal of the low threshold voltage N-channel devices 32:MNN1A and 32:MNN2A, the drain terminal of the N-channel device 32:MNN2B. The gate terminal of the N-channel device 32:MNN1B is connected to the signal YSEL, which is further connected to the gate terminal of the N-channel device 32:MNN2B. The LIOI signal is connected to the source terminal of the 32:MNN1B device. The LIO_I signal is connected to the source terminal of the N-channel device 32:MNN2B. The NC signal is connected to the source terminals of four low threshold voltage N-channel devices: 32:MNN1A, 32:MNN2A, 32:MNN3A, and 32:MNN4A. The BLR signal is connected to the drain of the N-channel device 32:MNBLRB, and further connected to the drain of the N-channel device 32:MNBLRA. The E signal is connected to the gate terminals of the N-channel devices 32:MNBLRB, 32:MNBLRA and 32:MNEQ1. The VARY input is connected to the substrate terminal of four P-channel devices: 32:MPBL1A, 32:MPBL2A, 32:MPBL3A, and 32:MPBL4A. The PC signal is connected to the source terminal of four P-channel devices: 32:MPBL1A, 32:MPBL2A, 32:MPBL3A, and 32:MPBL4A. The ST signal is connected to the gate terminals of two low-threshold voltage N-channel devices; 32:MNBLA and 32:MNBL_A. The Bit Line or BL signal is connected to the source terminal of the low threshold voltage N-channel device 32:MNBLA. The BL_ signal is connected to the source terminal of the low threshold voltage N-channel device 32:MNBL_A.

FIG. 33 illustrates the Column Address Buffer circuit, CABUF01. The Column Address Buffer circuit has a single input and two output signals.

The input signal, CAP_X, is connected to the input of the inverter 33:IV1 and further connected to the input of the inverter 33:IV2. The output of the inverter 33:IV1 is connected to the first output signal CAX. The output of the inverter 33:IV2 is connected to the output signal CA_X through the inverter 33:IV3.

FIG. 34 illustrates the Column Address Buffer 29 circuit, CABUF29. The Column Address Buffer 29 circuit has a single input signal and two output signals. The input signal, CAP_X, is connected to the input of the inverter 34:IV1 and further connected to the input of the inverter 34:IV2. The output of the inverter 34:IV1 is connected to the output signal CAX. The output of the inverter 34:IV2 is connected to the output signal CA_X through the inverter 34:IV3.

FIG. 35 illustrates the Column Logic Enable circuit, or CLEN circuit. The Column Logic Enable circuit has two input signals and three output signals. The first input signal, STPL_, is connected to the A terminal of the SWITCH 35:XSW1_1, the A terminal of SWITCH 35:XSW2_1, and the input terminal of the delay element 35:XDL2_1.

The output of the delay element 35:XDL2_1, node 35:N11, is connected to the C input terminal of the SWITCH 35:XSW1_1, and the B input terminal of the SWITCH 35:XSW2_1. The common terminal of the SWITCH 35:XSW2_1 is connected to the B terminal of the SWITCH 35:XSW1_1 through the delay element 35:XDL1_1. The common terminal of the SWITCH 35:XSW1_1, node 35:N8, is connected to the first input of the NOR gate 35:NR1. The input of the inverter 35:IV10 is connected to the reference voltage VPERI. The output of the inverter 35:IV10 is connected to the second input of the NOR gate 35:NR1. The output of the NOR gate 35:NR1 is connected to the first input of the NAND gate 35:ND2. The gate terminal of the pull-down transistor 35:MN1 is connected to the reference voltage VPERI.

Node 35:N17, which is labeled EXTCLENEN, is coupled through the pull-down transistor 35:MN1 to ground, to the input of the inverter 35:IV2, and to the first input terminal of the NAND gate 35:ND3. The output of the inverter 35:IV2 is coupled to the second input of the NAND gate 35:ND2. The gate terminal of the pull-down transistor 35:MN2 is coupled to the reference voltage VPERI. Node 35:N18, which is labeled EXCLENCTL, is coupled thorugh the pull-down transistor 35:MN2 to ground, and further coupled to the second input of the NAND gate 35:ND3. The output of the NAND gate 35:ND2 is coupled to the first input of the NAND gate 35:ND4. The output of the NAND gate 35:ND3 is coupled to the second input of the NAND gate 35:ND4. The output of the NAND gate 35:ND4 is coupled to the input of the inverter 35:IV3 and further coupled to the first input of the NAND gate 35:ND1. The output of the inverter 35:IV3 is coupled to the first output signal CLNA_. The second input to the NAND gate 35:ND1 is coupled to the second input signal RL2. The output of the NAND gate 35:ND1 is coupled to the input of the delay element 35:XDL2_2, the A terminal of the SWITCH 35:XSW2_2, the C terminal of the SWITCH 35:XSW1_2, and the input of the inverter 35:IV8. The output of the delay element 35:XDL2_2 is coupled to the B terminal of the SWITCH 35:XSW2_2 and the A terminal of the SWITCH 35:XSW1_2. The common terminal of the SWITCH XSW2_2 is connected through the delay element XDL1_2 to the B terminal of SWITCH XSW1_2. The common terminal of the SWITCH XSW1_2 is coupled to the second output signal CLEN through three serially coupled inverters, 35:IV5, 35:IV6, and 35:IV7. The output of the inverter 35:IV8 is coupled to the output signal CLEN_ through the inverter 35:IV9.

FIG. 36 illustrates the Column Factor 07 circuit, or CF07 circuit. The Column Factor circuit has three input signals and a single output signal.

The first input signal, CAX, is connected to the first input of the NAND gate 36:ND1. The second input signal, CAW, is connected to the second input of the NAND gate 36:ND1. The third input signal, CLEN, is connected to the third input of the NAND gate 36:ND1. The output of the NAND gate 36:ND1 is coupled to the output signal CFPY through three serially connected inverters; 36:IV1, 36:IV2, and 36:IV3.

FIG. 36.1 depicts the Driver Circuit for the Column Factors, or the CF07DR circuit. The Column Factors Driver circuit has a single input signal and a single output signal.

The input signal CFPY is connected to the input of the inverter 36.1:IV1. The output of the inverter 36.1:IV1 is connected to the output signal CFJK_Y.

FIG. 36.2 illustrates the Column Factors 815 circuit, or the CF815 circuit. The CF815 circuit has 3 input signals and a single output signal. The first input signal, CAX, is connected to the first input of the NAND gate 36.2:ND1. The second input signal, CAW, is connected to the second input of the NAND gate 36.2:ND1. The third input signal, CLEN, is connected to the third input of the NAND gate 36.2:ND1.

The output of the NAND gate 36.2:ND1 is coupled to the output signal CF_Y through four serially connected inverters; 36.2:IV1, 36.2:IV2, 36.2:IV3, and 36.2:IV4.

FIG. 37 illustrates the Y Decode Circuit, or YDEC circuit. The Y Decode circuit has five input signal and two output signals.

The first input signal, CFJK_47 is coupled to the first input of the NOR gate 37:NR1, and further coupled to the first input of the NOR gate 37:NR3. The second input signal, CFJK_02, is coupled to the second input of the NOR gate 37:NR1. The third input signal CF_811 is coupled to the first input of the NOR gate 37:NR2. The fourth input signal CF_1215 is coupled to the second input of the NOR gate 37:NR2. The fifth input signal, CFJK_13, is coupled to the second input of the NOR gate 37:NR3. The output of the NOR gate 37:NR1 is coupled to the first input of the NAND gate 37:ND1. The output of the NOR gate 37:NR2 is coupled to the second input of the NAND gate 37:ND1, and further connected to the second input of the NAND gate 37:ND2.

The output of the NOR gate 37:NR3 is coupled to the first input of the NAND gate 37:ND2. The output of the NAND gate 37:ND1 is coupled to the first output signal YSELJKEY through the inverter 37:IV1. The output of the NAND gate 37:ND2 is coupled to the second output signal YSELJKOY through the inverter 37:IV2.

FIG. 37.1 illustrates the Column Redundancy Encoder Enable circuit, or the CRDECE circuit. Column Redundancy Decoder Enabler circuit has one input signal and two output signals.

The input signal, CRDSPI, is coupled to the gate terminal of the N-channel device 37.1:MN1A. Node 37.1:N1 is coupled to the drain of the N-channel device 37:MN1A, the drain of the N-channel device 37.1:MN1B, the gate gate of the N-channel device 37.1:MN2, and the gate of the P-channel device 37:MP2, and is further coupled through the fuse 37.1:F1 to the output signal CRUVP5.

The output signal CRUVP5 is further coupled to the P-channel device 37.1:MP1 and to the P-channel device 37.1:MP2. The gate terminal of the P-channel device 37.1:MP1 is coupled to ground, and the source terminal of the P-channel device 37.1:MP1 is coupled to the reference voltage VPERI. The source terminals of the N-channel devices 37.1:MN1A and 37.1:MN1B are coupled to ground. The first output signal, CRDECEUV, is coupled to the gate terminal of the N-channel device 37.1:MN1B, and drain terminal of the N-channel device 37.1:MN2, and the drain terminal of the P-channel device 37.1:MP2. The source terminal of the N-channel device 37.1:MN2 is coupled to ground.

FIG. 38 depicts the Column Redundancy Row Address circuit, or the CRRRA circuit. The CRRA circuit has three input signals and two output signals.

The first input signal, RAX, is connected to the drain terminal of a low-threshold voltage N-channel device 18:MN3A. the second input signal, RA_X is connected to the drain terminal of the low-threshold voltage device 38:MN3B. The third input signal, CRDSPI is connected to the GATE terminal of the N-channel device 38:MN1A. The source terminal of the N-channel device 38:MN1A is connected to ground. Node 38:N1 is connected to the drain terminal of the N-channel device 38:MN1A, the drain of the N-channel device 38:MN1B, the gate terminal of the low threshold voltage N-channel device 38:MN3B, the gate terminal of the P-channel device 38:MP2, and the gate terminal of the N-channel device 38:MN2.

Node 38:N2 is connected to the gate terminal of the N-channel device 38:MN1B, the drain terminal of the N-channel device 38:MN2, the drain terminal of the P-channel device 38:MP2, and the gate terminal of the low-threshold voltage of the N-channel device 38:MN3A. The source terminal of the N-channel device 38:MN1B is connected to ground. The source terminal of 38:MN2 is connected to ground. The first output signal, CRUVRAX, is connected to the source terminal of the low-threshold voltage N-channel device 38:MN3A and the source terminal of the Low-threshold voltage N-channel device 38:MN3B. The second output signal, CRUVPN is connected to the source of the P-channel device 38:MP2, the drain terminal of the P-channel Pull-up transistor 38:MP1, and through the FUSE 38:F1 to the Node 38:N1. The gate terminal of the Pull-up transistor 38:MP1 is connected to ground. The source terminal of the Pull-up transistor 38:MP1 is connected to the reference voltage VPERI.

FIG. 39 illustrates the Column Redundancy Column Address circuit, or CRCA circuit. The CRCA circuit has three input signals and two output signals.

The first input signal, CAX, is coupled to the drain terminal of the low-threshold voltage N-channel device 39:MN3A. The second input signal, CA_X, is coupled to the drain terminal of the low-threshold voltage N-channel device 39:MN3B. The third input signal, CRDSPI, is coupled to the gate terminal of the N-channel device 39:MN1A. Node 39:N1 is coupled to the drain terminal of the N-channel device 39:MN1A, the drain terminal of the N-channel device 39:MN1B, the gate terminal of the low-threshold voltage N-channel device 39:MN3B, the gate terminal of the P-channel device 39:MP2, and the gate terminal of the N-channel device 39:MN2. The source terminals of the N-channel devices 39:MN1A and 39:MN1B are coupled to ground.

Node 39:N2 is coupled to the gate terminal of the N-channel device 39:MN1B, the gate terminal of the low-threshold voltage N-channel device 39:MN3A, the drain terminal of the N-channel device 39:MN2 and the drain terminal of the P-channel device 39:MP2. The source terminal of the N-channel device 39:MN2 is coupled to ground.

The first output signal, CRUVCAX, is coupled to the source terminal of the N-channel devices 39:MN3A and 39:MN3B, both of which are low-threshold voltage devices. The second output signal, CRUVPN is coupled to the source terminal of the P-channel device 39:MP2, the drain terminal of the P-channel device 39:MP1, and through the FUSE 39:F1 to the Node 39:N1. The Pull-up transistor 39:MP1 has its gate terminal coupled to ground and its source terminal coupled to the reference voltage VPERI.

FIG. 40 depicts the Column Redundancy Decoder circuit, or the CRDEC_ circuit. The Column Redundancy Decoder circuit has thirteen input signals and a single output signal.

The first input signal, CLEN, is coupled to the first input of the NAND gate 40:ND7. The second input signal, CRDECEUV, is coupled to the first input of the NAND gate 40:ND1. The third input signal, CRUVRA10 is coupled to the second input of the NAND gate 40:ND1. The fourth input signal, CRUVCA9, is coupled to the first input of the NAND gate 40:ND2. The fifth input signal, CRUVCA8, is coupled to the second input of the NAND gate 40:ND2. The sixth input signal, CRUVCA7, is coupled to the first input of the NAND gate 40:ND3. The seventh input signal CRUVCA6, is coupled to the second input of the NAND gate 40:ND3. The eighth input signal, CRUVRA8, is coupled to the first input of the NAND gate 40:ND4. The ninth input signal, CRUVRA9, is coupled to the second input of the NAND gate 40:ND4. The tenth input signal, CRUVCA2, is coupled to the first input of the NAND gate 40:ND5. The eleventh input signal, CRUVCA3, is coupled to the second input of the NAND gate 40:ND5. The twelfth input signal, CRUVCA4, is coupled to the first input to the NAND gate 40:ND6. The thirteenth input signal, CRUVCA5, is coupled to the second input of the NAND gate 40:ND6. The output of the NAND gate 40:ND1 is coupled to the first input of the NOR gate 40:NR1.

The output of the NAND gate 40:ND2 is coupled to the second input of the NOR gate 40:NR1. The output of the NAND gate 40:ND3 is coupled to the third input of the NOR gate 40:NR1. The output of the NAND gate 40:N4 is coupled to the first input of the NOR gate 40:NR2. The output of the NAND gate 40:ND5 is coupled to the second input of the NOR gate 40:NR2. The output of the NAND gate 40:ND6 is coupled to the third input of the NOR gate 40:NR2. The output of the NOR gate 40:NR1 is coupled to the second input of the NAND gate 40:ND7. The output of the NOR gate 40:NR2 is coupled to the third input of the NAND gate 40:ND7. The output of the NAND gate 40:ND7 is coupled to the output signal CRUD_V.

FIG. 41 illustrates the Column Redundancy Y-Factor circuit, or the CRY circuit. The CRY circuit has four input signals and five output signals.

The first input signal CRUD_0 is coupled to the input of the inverter 41:IV1. The second input signal, CRUD_1, is coupled to the input of the inverter 41:IV2. The third input signal, CRUD_2, is coupled to the input of the inverter 41:IV3. The fourth input signal, CRUD_3, is coupled to the input of the inverter 41:IV4. The output of the inverter 41:IV1 is coupled to the first output signal CR0YU and further coupled to the second input of the NOR gate 41:NR1. The outut of the inverter 41:IV2 is coupled to the second output signal CR1YU and further coupled to the first input of the NOR gate 41:NR1. The output of the inverter 41:IV3 is coupled to the fourth output signal CR2YU and further coupled to the second input of the NOR gate 41:NR2. The output of the inverter 41:IV4 is coupled to the fifth output signal CR3YU and further coupled to the first input of the NOR gate 41:NR2. The output of the NOR gate 41:NR1 is coupled to the first input of the NAND gate 41:ND1. The output of the NOR gate 41:NR2 is coupled to the second input of the NAND gate 41:ND1. The output of the NAND gate 41:ND1 is coupled to the third output signal CRYU through two serially connected inverters 41:IV5 and 41:IV6.

FIG. 42 depicts the Column Redundancy Segment Select circuit, or the CRSS circuit. The CRSS circuit has thirteen input signal and two output signals.

The first input signal, CRDPC in connected to the gate terminal of twelve N-channel pull-down devices: 42:MN1, 42:MN2, 42:MN3, 42:MN4, 42:MN5, 42:MN6, 42:MN7, 42:MN8, 42:MN9, 42:MN10, 42:MN11, and 42:MN12. The source terminals of all twelve of the pull-down devices connected to the first input signal CRDPC are coupled to ground. The second input signal, CR0Y0, is coupled to the Node 42:N7 through the FUSE 42:F1; Node 42:N7 being further coupled to the first input of the NOR gate 42:NR1 and to the drain terminal of the pull-down transistor 42:MN1. The third input signal, CR1Y0 is coupled to Node 42:N8 through the FUSE 42:F2, Node 42:N8 being further connected to the second input of the NOR gate 42:NR1 and to the drain of the pull-down transistor 42:MN2. The fourth input signal, CR2Y0, is coupled to Node 42:N9 through the FUSE 42:F3; Node 42:N9 being further coupled to the third input of the NOR gate 42:NR1 and to the drain terminal of the pull-down transistor 42:MN3. The fifth input signal, CR3Y0, is coupled to Node 42:N10 through the FUSE 42:F4; Node 42:N10 being further coupled to the first input of the NOR gate 42:NR2 and to the drain terminal of the pull-down transistor 42:MN4. The sixth input signal, CR0Y1, is coupled to Node 42:N11; through the fuse 42:F5, node 42:N11 being further coupled to the second input of the NOR gate 42:NR2 and to the drain terminal of the pull-down transistor 42:MN5. The seventh input signal, CR1Y1, is coupled to Node 42:N12 through the FUSE 42:F6; Node 42:N12 being further connected to the third input of the NOR gate 42:NR2 and to the drain terminal of the pull-down transistor 42:MN6. The eighth input signal, CR2Y1, is coupled to Node 42:N13 through the FUSE 42:F7; Node 42:N13 being further coupled to the first input of the NOR gate 42NR3 and to the drain terminal of the pull-down transistor 42;MN7. The ninth input signal, CR3Y1, is coupled to Node 42:N14 thorugh the FUSE 42:F8; Node 42:N14 being further coupled to the second input of the NOR gate 42:NR3 and to the drain terminal for the pull-down transistor 42:MN8. The tenth input signal CR0Y2, is coupled to node 42:N15 through the FUSE 42:F9; the Node 42:N15 being further coupled to the third input of the NOR gate 42:NR3 and to the drain terminal of the pull-down transistor 42:MN9. The eleventh input signal, CR1Y2, is coupled to Node 42:N16 through the FUSE 42:F10; Node 42:N16 being further coupled to the first input of the NOR gate 42;NR4 and to the drain terminal of the pull-down 42:MN10. The twelfth input signal, CR2Y2, is coupled to Node 42:N17, through the FUSE 42:F11; Node 42:N17 being further connected to the second input of the NOR gate 42:NR4 and to the drain terminal of the pull-down transistor 42:MN11. The thirteenth input signal, CR3Y2, is coupled to Node 42:N18 through the FUSE 42:F12; Node 42:N18 being further connected to the third input of the NOR gate 42:NR4 and to the drain terminal for the pull-down transistor 42:MN12.

The output of the NOR gate 42:NR1 is coupled to the first input of the NAND gate 42:ND1. The output of the NOR gate 42:NR2 is coupled to the second input of the NAND gate 42:ND1. The output of the NOR gate 42:NR3 is coupled to the third input of the NAND gate 42:ND1. The output of the NOR gate 42:NR4 is coupled to the fourth input of the NAND gate 42:ND1. The output of the NAND gate 42:ND1 is coupled to the first output signal CRSS_I through the inverter 42:IV1. The output of the inverter 42:IV1 is coupled to the second output signal CRSSI through the inverter 42:IV2.

FIG. 43 illustrates the Column Redundancy Quadrant Select circuit, or the CRQS circuit. The CRQS circuit has thirteen input signals and three output signals. The first input signal, CRDPC, is connected to the gate terminal of twelve N-channel devices, which are numbered 43:MN1 to 43:MN12. The second input signal, CR0Y0, is connected to the Node 43:N7 through the FUSE 43:F1; the Node 43:N7 being further connected to the first input of the NOR gate 43:NR1 and to the drain terminal of the pull-down transistor 43:MN1. The third input signal, CR1Y0, is coupled to the Node 43:N8 through the FUSE 43:F2; the Node 43:N8 being further coupled to the second input of the NOR gate 43:NR1 and to the drain terminal of the pull-down transistor 43:MN2. The source terminal of the pull-down transistor 43:MN2 is connected to ground. The fourth input signal CR2Y0, is connected to the Node 43:N9 through the FUSE 43:F3; the Node 43:N9 being further conencted to the third input of the NOR gate 43:NR1 and to the drain terminal of the pull-down transistor 43:MN3. The source terminal of the pull-down transistor 43:MN3 is connected to ground. The fifth input signal, CR3Y0, is coupled to the node 43:N10 through the FUSE 43:F4; the Node 43:N10 being further connected to the first input of the NOR gate 43:NR2 and to the drain terminal of the pull-down transistor 43:MN4. The source terminal of the pull-down transistor 43:MN4 is connected to ground. The sixth input signal, CR0Y1 is connected to the Node 43:N11 through the fuse 43:F5; the Node 43:N11 being further coupled to the second input of the NOR gate 43:NR2 and to the drain terminal of the pull-down transistor 43:MN5. The source terminal of the pull-down transistor 43:MN5 is connected to ground. The seventh input signal, CR1Y1, is coupled to the Node 43:N12 through the FUSE 43:F6; the Node 43:N12 being further connected to the third input of the NOR gate 43:NR2 and to the drain terminal of the pull-down transistor 43:MN6. The source terminal of the transistor 43:MN6 is connected to ground. The eighth input signal, CR2Y1, is connected to Node 43:N13 through the FUSE 43:F7; Node 43:N13 being further connected to the first input of the NOR gate 43:NR3 and to the drain input of the transistor 43:MN7. The N-channel transistor 43:MN7 has its source connected to ground. The ninth input signal, CR3Y1 is coupled to the Node 43:N14 through the FUSE 43:F8; Node 43:N14 is further connected to the second input of the NOR gate 43:NR3 and to the drain terminal of the N-channel transistor 43:MN8. The source terminal of the N-channel transistor 43:MN8 is connected to ground. The tenth input signal, CR0Y2, is coupled to the Node 43:N15 through the FUSE 43:F9; Node 43:N15 is further coupled to the third input of the NOR gate 43:NR3 and to the N-channel device 43:MN9. The source terminal of the N-channel device 43:MN9 is coupled to ground. The eleventh input signal, CR1Y2, is coupled to the Node 43:N16 through the FUSE 43:F10; the node 43:N16 being further connected to the first input of the NOR gate 43:NR4 and to the N-channel device 43:MN10. The source terminal of the N-channel device 43:MN10 is connected to ground. The input, CR2Y2, is coupled to Node 43:N17; coupled through the FUSE 43:F11; Node 43:N17 is further coupled to the second input of the NOR gate 43:NR4, Node 43:N17 is also coupled to the pull-down transistor 43:MN11. Pull-down transistor 43:MN11 is also coupled to ground. The thirteenth input CR3Y2, is coupled to Node 43:N18 through the FUSE 43:F12; Node 43:N18 is further coupled to the third input of the NOR gate 43:NR4 and to the pull-down transistor 43:MN12. The pull-down transistor 43:MN12 is also coupled to ground.

The output of the NOR gate 43:NR1 is coupled to the first input of the NAND gate 43:ND1. The output of the NOR gate 43:NR2 is coupled to the second input of the NAND gate 43:ND1. The output of the NOR gate 43:NR3 is coupled to the third input of the NAND gate 43:ND1. The output of the NOR gate 43:NR4 is coupled to the fourth input of the NAND gate 43:ND1. The output of the NAND gate 43:ND1 is coupled to the first output signal CRQS_Q through the inverter 43:IV1. The output of the inverter 43:IV1 is further coupled to the second output signal CRQSQ through the inverter 43:IV2. The output of the inverter 43:IV2 is coupled to the third output signal TLCR_Q through the inverter 43:IV3.

FIG. 44 illustrates the Column Redundancy Y-Select Circuits, or the CRYS circuit. The CRYS circuit has three input signals and a single output signal.

The first input signal, CRSS_I, is coupled to the first input of the NOR gate 44:NR1. The second input signal, CRQS_Q, is coupled to the second input of the NOR gate 43:NR1. The third input, CRYU, is coupled to the second input of the NAND gate 44:ND1. The output of the NOR gate 43:NR1 is coupled to first the input of the NAND gate 44:ND1. The output of the NAND gate 44:ND1 is coupled to the output signal RYSELJKY through the inverter 43:IV1.

FIG. 45 illustrates the Column Redundancy IO Select circuit, or the CRIOS circuit. The CRIOS circuit has three input signals and two output signals.

The first input signal, CRSS0, is coupled to the first input of the NAND gate 35:ND1. The second input signal, CRSS1, is coupled to the first input of the NAND gate 45:ND2. The third input signal, CRQSQ, is coupled to the second input of the NAND gate 45:ND1 and further coupled to the second input of the NAND gate 45:ND2. The output of the NAND gate 45:ND1 is coupled to the first output signal CRIOSJK0 through the inverter 45:IV1. The output of the NAND gate 45:ND2 is coupled to the second output signal CRIOSJK1 through the inverter 45:IV2.

FIG. 46 illustrated the Column Delay Redundancy Pre-charge circuit, or the CRDPC circuit. The CRDPC circuit has two input signals and a single output signal. The first input signal, CLEN, is coupled to the first input of the NAND gate 46:ND1 through the inverter 46:IV1. The second input signal, RL1_, is coupled to the second input of NAND gate 46:ND1. The output of the NAND gate 46;ND1, Node 46:N2, is coupled to the gate terminal of the N-channel device 46;MN1, the gate terminal of the P-channel device 46:MP1 and further coupled to the gate terminal of the P-channel device 46:MP2 through the inverter 46:IV2.

The output signal, CRDPC, is coupled to the reference voltage VPERI through the P-channel devices 46:MP1 and 46:MP2, and is further coupled to the ground terminal through the serially connected elements of the N-channel device 46:MN1, the diode connected N-channel device 46:MN2, and the diode connected N-channel device 46:MN3.

FIG. 122 illlustrates the CRDSP circuit. The CRDSP circuit has a single input signal and five output signals.

The input signal, CRDST, is coupled to the input of the inverter 122:IV1. The output of the inverter 122:IV1 is coupled to the Node 122:N1; which is further coupled to the input of the inverter 122:IV2, and also to the capacitor connected P-channel device 122:MP1. The GATE terminal of the P-channel device 122:MP1 is conencted to Node 122:N1, while the other terminals are connected to the reference VPERI.

The output of the inverter 122:IV2 is coupled to the input of the inverter 122:IV3, to the B terminal of the SWITCH 122:SW2E, to the first input of the NAND gate 122:ND4, and also to the gate of N-channel device 122:MN1. The N-channel device 122:MN1 is an N-channel transistor in the N-tank; the other terminals are connected to ground. The output of the inverter 122:IV3, Node 122:N3, is coupled to the input of the inverter 122:IV4, to the B terminal of the SWITCH 122:SW2F, and to the P-channel device 122:MP2 at the gate terminal. The other terminals of the P-channel device 122:MP2 are coupled to the reference voltage VPERI. The output of the inverter 122:IV4, node 122:N4, is coupled to the A terminal for the SWITCH 122:SW2E, and to the N-channel device 122:MN2 at the gate terminal. The N-channel device 122:MN2 is an N-channel device constructed in the N-tank; the GATE terminal is connected to the Node 122:N4, the other terminals are connected to ground. The output of the inverter 122:IV5 at Node 122:N5 is coupled to the A terminal of the SWITCH 122:SW2F, to the second input of the NAND gate 122:ND3, and to the gate terminal of the P-channel device 122:MP3. The other terminals of the P-channel device 122:MP3 are coupled to the reference voltage VPERI. The output of the SWITCH 122:SW2F is coupled to the second input of the NAND gate 122:ND4. The output of the SWITCH 122:SW2E is coupled to the first input of the NAND gate 122:ND3. The output of the inverter 122:IV6 at Node 122:N6 is coupled to the A terminal of the SWITCH 122:SW2H, the input of the inverter 122:IV7, the first input of the NAND gate 122:ND2, and to the GATE terminal of the N-channel device 122:MN3. The N-channel device 122:MN3 is an N-channel device constructed in the N-tank, the gate terminal is connected to Node 122:N6, and the other terminals are conencted to ground. The output of the inverter 122:IV7, Node 122:N7, is coupled to the input of the inverter 122:IV8, the B terminal of the SWITCH 122:SW2G, and the GATE terminal of the P-channel device 122:MP4. The other terminals of the P-channel device 122:MP4 are coupled to the reference voltage VPERI. The output of the inverter 122:IV8, Node 122:N8, is coupled to the B terminal SWITCH 122:SW2H, the input of the inverter 122:IV9, and the gate terminal of the N-channel device 122:MN4. The N-channel device 122:MN4 is an N-channel device constructed in the N-tank, the gate terminal connected to the Node 122:N8, the other terminals connected to ground.

In FIG. 122, the output of Inverter 122:IV9 is connected to the second input of the NAND gate 122:ND1, the A terminal of the SWITCH 122:SW2G, the input of the inverter 122:IV10, and the gate terminal of the P-channel device 122:MP5. The other terminals of the P-channel device 122:MP5 are coupled to the reference voltage VPERI. The output of the inverter 122:IV10 drives the first output, CRDSP_PROBE. The output of the NAND gate 122:ND1 is coupled to the first output signal CRDSP0 through the inverter 122:IV11. The common terminal of the SWITCH 122:SW2G is coupled to the second input of the NAND gate 122:ND2. The output of the NAND gate 122:ND2 is coupled to the second output signal CRDSP1 through the inverter 122:IV12. The output of the NAND gate 122:ND3 is coupled to the third output signal CRDSP2 through the inverter 122:IV13. The output of the NAND gate 122:ND4 is coupled to the fourth output signal CRDSP3 through the inverter 122:IV14.

FIG. 47 depicts a column address transition detector, CATD, circuit. The circuit has an input terminal CAX and an output terminal CATDX. Input terminal CAX is connected to the gates of P-channel transistor 47:MP1B, AND N-channel transistor 47:MN2A, and is coupled through inverter 47:IV2 to the gates of N-channel transistor 47:MN6A and P-channel transistor 47:MP5B at node 47:N7. P-channel transistor 47:MP1A, P-channel transistor channel 47:MP1B, N-channel transistor 47:MN2A, and N-channel transistor 47:MN2B are connected in series and biased between VPERI connected to transistor 47:MP1A and VSS connected to transistor 47:MN2B. P-channel transistor 47:MP5A, P-channel transistor 47:MP5B, N-channel transistor 47:MN6A, and N-channel 47:MN6B are connected serially and are biased between VPERI connected to transistor 47:MP5A and VSS connected to transistor 47:MN6B. The gates of transistors 47:MN2B and 47:MP5A are connected together at node 47:N4 while the gates of transistor of 47:MP1A and transistor 47:MN6B are connected together at node 47:N3. Inverter 47:IV1 has its input connected to node 47:N4 and its output connected to node 47:N3. The series connection between transistor 47:MP1B and 47:MN2A is connected to the series connection between transistor 47:MP5B and 47:MN6A and is connected to the output terminal CATDX. The gate of P-channel transistor 47:MP5B at node 47:N7 is coupled through the feedback loop of delay stage 47:SD1, inverter 47:IV3, delay stage 47:SD2, and inverter 47:IV4, to node 47:N4.

FIG. 48 depicts a column logic summation circuit. The column logic summation circuit has input terminals CLENTD, CATD2, through CATD9 and CLEN_ and output terminals ATD0P_, STPH, and ATD1P_. Input terminals CLENDT, CATD2, and CATD3 are connected to 3 input NAND gate 48:ND1. Input terminals CATD4, CATD5, and CATD6 are connected to 3 input NAND gate 48:ND2. Input terminal CATD7, CATD8 and CATD9 are connected to 3 input NAND gate 48:ND3. The output of NAND gates 48: ND1, 48:ND2 and 48:ND3 are input to 3 input NOR gate 48:NR1. The output of NOR gate 48:NR1 is connected to node 48:N4 and is coupled through inverter 48:IV5 delay stage 48:SD5, and inverter 47:IV6 to the second input of a three input NAND gate 48:ND4. Delay stage 48:SD5 is laid out as two normal delay stages with the exception of a logic NOR in the second stage, such that the delay is programmable to about four nanoseconds. The first input of NAND gate 48:ND4 is directly connected to node 47:N4. Input terminal CLEN_ is coupled through delay stage 48:SD2, delay stage 48:SD3, and inverter 48:IV1 to the third input of three input NAND gate 48:ND4 and to the second input of NAND gate 48:ND7. The output of NAND gate 48:ND4 is coupled through inverter 48:IV4 to output terminal ATD1P_. The output of NOR gate 48:NR1 at node 47:N4 is further coupled through inverter 48:IV2 and inverter 48:IV3 to output terminal ATD0P_.

In FIG. 48, input terminal CLENTD is connected to the first input of NAND gate 48:ND5 and is coupled through inverter 48:IV9 and a four nanosecond delay stage 48:SD1 to the second input of NAND gate 48:ND5. The output of NAND gate 48:ND5 is the first input to NAND gate 48:ND6. The output of NAND gate 48:ND6 is the first input to the NAND 48:ND7. The output of NAND gate 48:ND7 at node 47:N20 is the second input to NAND gate 48:ND6. The output of NAND gate 48:ND7 is coupled through two nanosecond delay stage 48:SD4, and series connected inverters 48:IV10, 48:IV7 and 48:IV8 to output terminal STPH.

FIG. 49 depicts a column logic driver circuit, CLSUMDR. Circuit CLSUMDR has two input terminals, ATD0P_, and ATD1P_ and it has eight output terminals, ATD00 through ATD03 and ATD10 through ATD13. Input terminal ATD0P_ is connected to the input of inverters 49:IV1 through 49:IV4. The output of inverters 49:IV1 through 49:IV4 are respectively connected to output terminals ATD00 through ATD03. Input terminal ATD1P_ is connected to the input of inverters of 49:IV5 through 49:IV8. The output of inverters 49:IV5 through 49:IV8 are respectively connected to output terminals ATD10 to ATD13.

Quadrant select circuit QDDEC_ is depicted in FIG. 50. Input terminal WMBQ is coupled through inverter 50:IV1 to one input of NOR gate 50:NR1. Input terminal TL16 is coupled through inverter 50:IV5 to one input of NAND gate 50:ND2. Input terminal TL32_ is coupled to the other input of 50:ND2. The output of NAND gate 50:ND2 at node 50:N2 is connected to the other input or NOR gate 50:NR1, and to the input of inverter 50:IV3. NOR gate 50:NR2 has its inputs connected to terminals CA10B and CA11B. The output of NOR gate 50:NR2 is connected to the input terminal of CMOS pass gate logic 50:CPGL1, the output of 50:CPGL1 is connected to 50:N6. Input terminal CLX4 is connected to the gate of the P-channel transistor of 50:CPGL1 and is coupled through inverter 50:IV7 to the gate of the N-channel transistor of 50 CPGL1 at Node 50:N10, also it is connected to one input of NAND gate 50:ND1. Input terminal TWOKREF is connected to the other input of NAND gate 50:ND1. The output of NAND gate 50:ND1 is directly connected to output terminal FOURKADQ and is coupled through inverter 50:IV6 to output terminal TWOKADQ.

Still referring to FIG. 50, node 50:N10 is connected to the gate of P-channel pull-up transistor 50:MP1 that has its drain connected to node 50:N6, and its source connected to VPERI. Node 50:N6 is also connected to the input of CMOS pass gate logic 50:CPGL2. The output of NOR gate 50:NR1 at node 50:4 drives the gate of the N channel transistor of 50:CPGL2, and the input of inverter 50:IV2. Node 50:N3 is connected to the gate of the P-channel transistor of 50:CPGL2. The output of 50:CPGL2 is connected to node 50:N7. Node 50:N7 is coupled through inverter 50:IV4 to output terminal QDDEC_Q. P-channel transistor 50:MP2, N-channel transistor 50:MN1, and N-channel transistor MN2 are serially connected and biased between VPERI and VSS. The gate of N-channel transistor 50:MN2 is connected to node 50:N3 while the gates of P-channel transistor 50: MP2 and N-channel transistor 50:MN1 are connected together and connected to the output of inverter 50:IV3. The series connection between transistors 50:MP2 AND 50:MN1 is connected to node 50:N7.

Global Amplifier Select End Circuit, GASELE, is depicted in FIG. 51. Three input exclusive NOR gate 51:XNOR1 receives input terminals RA8, CA0 and CA_0. Three input NAND gate 51:ND2 receives input terminals RA8, RA9, and RA10. Input terminal RA11C is connected to the input of CMOS pass gate logic 51:CPGL5. Input terminal CA10C is connected to the input of CMOS pass gate logic 51:CPGL6. Input terminal RA11B is connected to the input terminal CMOS pass gate logic 51:CPGL7. Input terminal CA10B is connected to the input of 51:CPGL8. Input terminal FOURKADQ is connected to P-channel gates of 51:CPGL8 and 51:CPGL6. It is also connected to the N-channel gates of 51:CPGL5 and 51:CPGL7. Input terminal TWOKADQ is connected to the N-channel gates of CPGL8 and CPGL6. It is also connected to the P-channel gates of CPGL7 and CPGL5.

Still referring to FIG. 51, the output of 3 input NAND gate 50:ND2 at node 7 is connected to the P-channel gate of 51: CPGL1, the N-channel gate of 51:CPGL2 and is coupled through inverter 51:IV1 to the N-channel gate 51:CPGL1 and the P-channel gate of 51:CPGL2. The outputs of 51:CPGL5 and 51:CPGL6 are connected together and are connected to the input of 51:CPGL1. The outputs of 51:CPGL7 and 51:CPGL8 and connected together and are connected to the input of 51:CPGL2. The outputs of CMOS pass gate logic devices 51:CPGL1 and 51:CPGL2 are connected together at node 51:N8.

In FIG. 51, the output of exlusive NOR gate 51:XNOR1 is input to CMOS pass gate logic 51:CPGL3. Input terminal TL16 is directly connected to the P-gate of 51:CPGL3 and is coupled through inverter 51:IV2 to the N gate of 51:CPGL3. The output of 51:CPGL3 at node 51:N13 is connected to the input of 51:CPGL4. P-channel pull-up transistor 51:MP1 is connected to node 51:N13. Its gate is connected to node 51:N12, and its source is connected to reference supply voltage VPERI. The output of 51:CPGL1 and 51:CPGL2 connected together at node 51:N8 are connected to the N-channel gate of 51:CPGL4, (through inverter 51:IV3), the P-channel gate of 51:CPGL4, and to the gate of N-channel pull-down transistor 51:MN1 that is connected to the output of 51:CPGL4 at node 51:N3. P-channel transistor 51:MP2 and N-channel transistor 51:MN2 are connected in series. Their gates are connected to node 51:N3. Transistor 51:MP2 is connected to VPERI and transistor 51:MN2 is connected to NODE 51:N6. N-channel transistors 51:MP3 and 51:MP4 are connected in series. Transistor 51:MP3 is connected to VPERI and transistor 51:MP4 is connected to the series connection of transistors 51:MP2 and 51:MN2. The gate of P-channel transistor 51:MP3 is connected to input terminal CA1B. The gate of P-channel transistor 51:MP4 in connected to terminal to TL16.

Still referring to FIG. 51, N-channel transistors 51:MN3 and 51:MN4 are connected in parallel to the source of N-channel transistor 51:MN2. 51:MN3 and 51:MN4 are also connected to VSS. The gate of N-channel transistor 51:MN3 is connected to input terminal TL16. The gate of N-channel transistor 51:MN4 is connected to input terminals CA1B. The gate P-channel transistor 51:MP5 is also connected to node 51:N4. Transistor 51:MP5 is connected to VPERI and is in series with P-channel transistor 51:MP7. The gate of P-channel transistor 51:MP7 is connected to input terminal QDDEC_Q. Internal transistor MP6 is connected to VPERI. It is in a series connection with N-channel transistor 51:MN5. The gates of transistors 51:MP6 and 51:MN5 are connected to input terminal TL32_. N-channel transistor 51:MP7 is connected to the series connection of transistors 51:MP6 and 51:MN5. N-channel transistors 51:MN6 and 51:MN7 are connected in parallel between the source of N-channel transistor 51:MN5, and VSS. The gate of transistor MN6 is connected to node 51:N4 and the gate of transistor 51:MN7 is connected to input terminal QDDEC_Q. The output terminal IOGSJKN of global amplifier select end circuit GASELE is connected to the series connection between P-channel transistor 51:MP6 and N-channel transistor 51:MN5.

FIG. 52 depicts Global Amplifier Select Circuit GASEL. The inputs of 3 input exclusive NOR gate 52:XNOR1 are connected to input terminals RA8, CA_0, and CA0. The input of CMOS pass-gate logic device 51:CPGL3 is connected to input terminal RA11B. The input of CMOS pass-gate logic device 52:CPGL4 is connected to input terminal CA10B. Input terminal FOURKADQ is connected to the gate of the N-channel transistor of 52:CPGL3 and is connected to the gate of the P-channel transistor 52:CPGL4. Input terminal TWOKADQ is connected to the gate of the P-channel transistor of 51: CPGL3 and the gate of the N-channel transistor of 52:CPGL4. The output of 52:CPGL3 and 51:CPGL4 are connected together at node 52:N6.

In FIG. 52, the output of exclusive NOR gate 52:XNOR1 is connected to the input of 52:CPGL1. Input terminal TL16 is connected to the P-channel transistor of 52:CPGL1 and is coupled through inverter 52:IV2 to the gate of P-channel Pull-up transistor 52:MP4 and the N-channel transistor of CMOS pass gate logic device 52:CPGL1. P-channel pull-up transistor 52:MP4 is connected to node 52:N4 and is biased by the voltage VPERI. The output of 52:CPGL1, 52:N4, is connected to the input of 52:CPGL2. Node 52:N6 is connected to the P-channel transistor of CMOS pass gate logic device 52:CPGL2 and is coupled to the gate of the N-channel transistor of 52:CPGL2 through inverter 52:IV3. The output of 52:CPGL2 is connected to node 52:N3. N-channel pull-down transistor 52:MN4 is connected to node 52.N3. Its gate is connected to 52:N6, and its source is connected to VSS.

Still referring to the Global Amplifier Select Circuit of FIG. 52, the gates of P-channel transistor 52:MP1 and N-channel transistor 52:MN1 are connected to node 52:N3. Transistor 52:MP1 couples VPERI to node 52:N9. Transistor 52:MN1 couples node 52:N9 to VSS through the parallel connected N-channel transistors 52:MN2 and 52:MN3. The gate of N-channel transistor 52:MN2 is connected input terminal TL16. The gate of N-channel 52:MN3 is connected to input terminal CA1B. P-channel transistor 52:MP2 couples VPERI to node 52:N10. The gate of P-channel transistor 52:MP2 is coupled to input terminal CA1B. Internal transistor 52:MP3 couples node 52:N10 to node 52:N9. The gate of P-channel transistor 52:MP3 is connected to input terminal TL16. P-channel transistor 52:MP5 couples VPERI to node 52:N13. P-channel transistor 52:MP7 couples node 52:N13 to the output terminal IOGJSKN. The gate of transistor 52:MP5 is connected to node 52:N9 and the gate of transistor 52:MP7 is connected to input terminal QDDEC_Q. P-channel transistor 52:MP6 couples VPERI to the output terminal IOGSJKN. The gate of P-channel transistor 52:MP6 is connected to input terminal TL32_. N-channel transistor 52:MN5 couples the output terminal IOGSJKN to VSS through the parallel connected N-channel transistors 52:MN6 and 52:MN7. The gate of N-channel transistor 52: MN5 is connected to the gate of P-channel transistor 52:MP6. The gate of N-channel transistor 52:MN6 is conencted to the gate of P-channel transistor 52:MP5. The gate of N-channel transistor 52:MN7 is connected to the gate of P-channel transistor 52:MP7.

FIG. 53 illustrates the Date Write Enable Bar Circuit, DWE_. The inputs of NAND gate 53:ND1 are connected to input terminals WLMX and IOGSJKN.

The output of NAND gate 53:ND1 is BUFFERED by INVERTER 53:IV1 and 53:IV2 and is connected to output terminal DWEJK_N. The code for the Date Write Enable Bar Circuit of FIG. 53 is contained in Appendix 21.

FIG. 54 illustrates Input-Output Clamp Circuit IOCLMP. Input terminal ATD0Q is connected to one input of NAND gate 54:ND2 and is coupled through inverter 54:IV6 to one input of three-input NAND gates 54:ND3 and 54:ND4. Input terminal BNKSLJKM is connected to the other input of NAND gate 54:ND2 and it is also connected to another input of three-input NAND gates 54:ND3 and 54:ND4. The output of NAND gate 54:ND2 is coupled through inverter 54:IV5 to node 54:N6. Input terminal CRIOSJK1 is connected to the third input of three input NAND gate 54:ND4 and is coupled through inverter 54:IV7 to the third input of three-input NAND gate 54:ND3. The output of NAND gate 54:ND3 is connected to node 54:N4 and the output of NAND gate 54:ND4 is connected to node 54:N3. The input terminal BNKSLJKM is also coupled through inverter 54:IV4 to node 54:N7.

In FIG. 54, N-channel transistors 54:MN15 through 54:MN25 are low threshold voltage transistors. Transistors 54:MN5 is connected between input terminals LIJMKI and LIJMK_I. Its gate is connected to node 54:N7. Transistors 54:MN16 and 54:MN17 are connected in series between input terminals LIJMKI and LIJMK_I. Their gates are connected to node 54:N7. Input terminal BLR is connected to their series connection. Transistor 54:MN18 is connected between input terminals LIJMKI and LIJMK_I. Its gate is connected to node 54:N6. Transistors 54:MN19 and 54:MN20 are connected in series between input terminals LIJMKI and LIJMK_I. Their gates are connected to node 54:N6. VPERI is connected to their series connection.

Still referring to input-output clamp circuit IOCLMP of FIG. 54, transistors 54:MN21 and 54:MN23 are connected in series between input terminal LIJMKI and output terminal RIJMKI. Transistors 54:MN22 and 54:MN24 are connected in series between input terminal LIJMK_I and output terminal RIJMK_I. The gates of transistors 54:MN21 and 54:MN22 are connected to node 54:N3, while the gates of transistors 54:MN23 and 54:MN24 are connected to node 54:N4. Transistor 54:MN25 is connected between RIJMKI and RIJMK_I. Its gate is connected to node 54:N6. Output terminal IOCJKMI is connected to the series connection transistors 54:MN21 and 54:MN23. Output terminal IOCJKM_I is connected to the series connection between transistors 54:MN22 and 54:MN24.

FIG. 55 depicts Local Input-Output Amplifier LIAMP. The circuit has input terminals DWEJK_N, ATD1Q, BNKSLJKM, IOCJMKI and IOCJMK_I and output terminal GIOJKN.

Input terminal DWEJK_N is connected to NAND gate 55:ND1 and to one input of 3 input NOR gate 55:NR1. Input terminal ATD1Q is connected to another input of 3 input NOR gate 55:NR1 and to one input of NOR gate 55:NR2. Input terminal BNKSLJKM is connected to the other input of NAND gate 55:ND1 and is coupled through inverter 55:IV4 to the third input of 3 input NAND gate 55:NR1. The output of NAND gate 55:ND1 is connected to the other input of NOR gate 55:NR2. The output of NOR gate 55:NR1 is connected to node 55:N5 and the output of NOR gate 55:NR2 is connected to node 55:N7.

In Local Input-Output Amplifier LIAMP, node 55:N7 is coupled through inverter 55:IV2 to the gate of P-channel pull-up transistor 55:MP1, that is connected between VPERI and node 55:N1. Node 55:N7 is also connected to the of gate N-channel pull-down transistor 55:MN3 that is connected between VSS and node 55:N0. N-channel transistor 55:MP2 is connected between node 55:N1 and input terminal IOCJMKI. Its gate is connected to input terminal IOCJMK_I. P-channel transistor 55:MP3 is connected between node 55:N1 and input terminal IOCJMK_I. Its gate is connected to input terminal IOCJMKI. Low threshold voltage N-channel transistor 55:MN1 is connected between the input terminal IOCJMKI and node 55:N0. Its gate is connected to input terminal IOCJMK_I. Low threshold voltage transistor 55:MN2 is connected between input terminal IOCJMK_I and node 55:N0. Its gate is connected to input terminal IOCJMKI.

Still referrring to Local Input-Output Amplifier LIAMP, FIG. 55, P-channel transistors 55:MP10 and 55:MP4 are conencted in series between nodes 55:N1 and 55:N2. The gate of transistor of 55:MP10 is connected to node 55:N5 while the gate of transistor 55:MP4 is connected to input terminal IOCJMK_I. Parallel connected N-channel transistors 55:MN4 and 55:MN4A couple node 55:N2 to VSS. The gate of 55:MN4 is connected to input terminal IOCJMK_I and the gate of 55:MN4A is connected to node 55:N5. P-channel transistors 55:MP11 and 55:MP5 are connected in series between nodes 55:N1 and 55:N3. The gate P-channel transistor 55:MP11 is connected to node 55:N5 and the gate transistor 55:MP5 is connected input terminal IOCJMKI. Parallel connected N-channel transistors 55:MN5 and 55:MN5A couple node 55:N3 to VSS. The gate of transistor 55:MN5 is connected to input terminal IOCJMKI while the gate of 55:MN5A is connected to node 55:N5. P-channel transistor 55:MP6 and N_channel transistor 55:MN6 are connected in series between VPERI and VSS. Node 55:N2 is coupled to the gate of P-channel transistor 55:MP6 through inverter 55:IV1. Node 55:N3 is connected to the gate of N-channel transistor 55:MN6. Output terminal GIOJKN is connected to the series connection of transistors 55:MP6 and 55:MN6.

Still referring to FIG. 55, low threshold voltage N-channel transistor 55:MN7 couples input terminal IOCJMKI and output terminal GIOJKN. Its gate is connected to node 55:N5. Output terminal GIOJKM is also connected to one input of NOR gate 55:NR3 and to the input of CMOS pass gate logic 55:CPGL1. Node 55:N5 is connected to the gate of the N-channel transistor of 55:CPGL1 and is coupled through inverter 55:IV3 to the gate of the P-channel transistor of 55:CPGL1. The inverter 55:IV3 also couples node 55:N5 to the other input of NOR gate 55:NR3. The output of SS:NR3 is coupled to node 55:N8. The output of CMOS pass gate logic device 55:CPGL1 is connected to node 55:N9. Low threshold voltage N-channel transistor 55:MN8 and N-channel transistor 55:MN9 are connected in series between VPERI and VSS. The gate of low threshold voltage transistor 55:MN8 is connected to node 55:N8. The gate of N-channel transistor 55:MN9 is connected to node 55:N9. Input terminal IOCJMK_I is connected to the series connection of transistors 55:MN8 and 55:MN9. N-channel transistor 55:MN10 couples Node 55:N9 to VSS. Its gate is driven by the output of inverter 55:IV3.

FIG. 56 depicts Global Input-Output Amplifier GIAMP. Input terminals TL32_ and IOGSJKN are connected to the first two input terminals of 3 input NAND gate 56:ND1. Input terminal TL16 is BUFFERED by inverter 56:IV1 to the third input of 3 input NAND gate 56:ND1. The output of NAND gate 56:ND1 is one input to NOR gate 56:NR1. The other input of NOR gate 56:NR1 is input terminal CLRMX_. The output of 56:NR1 at node 56:N2 is connected to one input of NAND gate 56:ND2 and is complemented by inverter 56:IV2 to one input of NOR gate 56:NR2. Input terminal GIOJKN is connected to the other input of NAND gate 56:ND2 and to the other input of NOR gate 56:NR2. P-channel transistor 56:MP1 and N-channel transistor 56:MN1 are connected in series between VPERI and VSS. The output of NAND gate 56:ND2 drives the gate of P-channel transistor 56:MP1 while the output of the NOR gate 56:NR2 drives the gate of N-channel transistor 56:MN1. Output terminal DLQ is connected to the series connection of transistors 56:MP1 and 56:MN1.

In global Input-Output Amplifier, GIAMP of FIG. 56, input terminal GIOJKN is connected to the input of inverter 56:IV4 and to the output of inverter 56:IV5. The output of inverter 56:IV4 is connected to the input of inverter 56:IV5. Input terminal DWEJK_N is connected of NOR gate 56:NR3 and is coupled to one end of NAND gate 56:ND3 through inverter 56:IV3. Terminals GIOJK0 through GIOJK7 are logically wired-or together and connected to output terminal DLQ and to the other inputs of NAND gates 56:ND3 and NOR gate 56:NR3. P-channel transistor 56:MP2 and N-channel transistor 56:MN2 are connected in series between VPERI and VSS. The output of NAND gate 56:ND3 drives the gate of 56:MP2 while the output of NOR gate 56:NR3 drives the gate of 56:MN2. Input terminal GIOJKN is connected to the series connection of transistor 56:NP2 and 56:NM2.

FIG. 57 depicts Input-Output Multiplexor, IOMUX. The circuit has input terminals DLQ, WLMX, TLPT, CLX4, CA10B, CA11B and DIN3. It has output terminal DQIN3. Input terminals TLPT and CLX4 are connected to NOR gate 57:NR3. The output of NOR gate 57:NR3 is complemented by inverter 57:IV5 and connected to one input of NAND gate 57:ND1. Input terminal CLX4 is complemented by inverter 57:IV3 and connected to the other input of NAND gate 57:ND1 and to the first input of 3 input NAND gate 57:ND3. Input terminal CA10B and CA11B are the other inputs of 3 input NAND gate 57:ND3. The 3 inputs to NAND gate 57:ND2 are the output of NAND gate 57:ND1, VPERI, and the output of 3 input NAND gate 57:ND3. The output of NAND gate 57:ND2 is connected to 57:ND4.

In Input-Output Multiplexor IOMUX, of FIG. 57, NAND gate 57:ND4 has inputs from input terminal DIN3, node 57:N5, and input terminal WLMX. NOR gate 57:NR2 is connected to input terminal DIN3, the output of inverter 57:IV2 (whose input is connected to node 57:N5), and input terminal WLMX (coupled through inverter 57:IV1). P-channel transistor 57:MP1 and N-channel transistor 57:MN1 are connected in series between VPERI and VSS. The gate of P-channel transistor 57:MP1 is driven by the output of NAND gate 57:ND4. The gate of N-channel transistor 57:MN1 is driven by the output of NOR gate 57:NR2. Input terminal DLQ is connected to the series connection of transistors 57:MP1 and 57:MN1.

In FIG. 57, input terminal WLMX is connected to the first input of 3 input NOR GATE 57:NR1. The output of inverter 57:IV5 is connected to the second input. The output of inverter 57:IV2 is connected to the third input of NOR gate 57:NR1. The output of 3 input NOR gate 57:NR1 is connected to the N-Channel gate and is coupled by inverter 57:IV4 to the P-channel gate of CMOS pass gate logic device 57:CPGL1. The input to CMOS pass gate logic device 57:CPGL1 is input terminal DLQ and the output of 57:CPGL1 is connected to output terminal DQIN3.

FIG. 58 illustrates Input-Output Multiplexor 3, IOMUX3 circuit. IOMUX3 has input terminals DL3, WLMX, TLPT, CLX4, CA10, CA11 and DIN3. It has output terminal DQIN3.

Input terminal TLPT is connected to one input of NAND gate 58:ND1, and input terminal CLX4 is coupled to the other input of NAND gate 58:ND1 through inverter 58:IV2. Three input NAND gate 58:ND2 has its first input connected to VPERI and its other inputs connected to input terminal CA10 and CA11. The output of NAND gate 58:ND1 is connected to the first input of 3 input NAND gate 58:ND3. Inverter 58:IV2 couples input terminal CLX4 to another input of 3 input NAND gate 58:ND3. The output of NAND gate 58:ND2 is input to NAND gate 58:ND3. The output and of NAND gate 58:ND3 is connected to Node 58:N7.

FIG. 58, the three inputs to 3 input NAND gate 58:ND5 are input terminal DIN3, the output of NAND gate 58:ND3, and input terminal WLMX. The inputs to 3 input NOR gate 58:NR2 are input terminal DIN3, the coupled output of NAND gate 58:ND3 (coupled by inverter 58:IV3), and the coupled input terminal WLMX (coupled by inverter 58:IV1). P-channel transistor 58:MP2 and N-channel transistor 58:MN2 are respectively connected in series between VPERI and VSS. Input DL3 is connected between the series connection of the transistors. The output of NAND gate 58:ND5 drives the gate of the P-channel transistor 58:MP2 while the output of NOR gate 58:NR2 drives the gate N-channel transistor 58:MN2.

In Input-Output Multiplexor Circuit 3 of FIG. 58, connected to 3 input NOR gate 58:NR3 are input terminal WIMX, input terminal TLPT, and the coupled output of NAND gate 58:ND3 (coupled through inverter 58:IV3). The output of NOR gate 58:NR3 is connected to the N-channel gate of CMOS pass gate logic device 58:CPGL2 and is coupled through inverter 58:IV4 to the P-channel gate of 58:CPGL2. Input terminal DL3 is connected the input of 58:CPGL2 and output terminal DQIN3 is connected to the output of 58:CPGL2. Also connected to the output of 58:CPGL2 is the input of inverter 58IV5 and the output of inverter 58:IV6. The output of inverter 58:IV5 is connected to the input of inverter 58:IV6.

FIG. 59 depicts Pre Output Buffer, POUTBUF. The circuit has input terminals CLRMXQ, TLDTQ, DLQ, DENTX4, and DETMX4. It has output terminal DTRUEQ. The first input of NAND gate 59:ND1 is connected to input terminal CLRM XQ and the other input of NAND gate 59:ND1 is connected to input terminal DENTX4. The first input of NAND gate 59:ND2 is connected to input terminal CLRMXQ and the other input of NAND gate 59:ND2 is connected to DETMX4. The output of NAND gate 59:ND1 is connected to the P-channel gate of the CMOS pass gate logic device 59:CPGL2 and is coupled through inverter 59:IV1 to the N-channel gate of 59:CPGL2. The output of NAND gate 59:ND2 is connected to the P-channel gate of the CMOS pass gate device 59:CPGL1 and is coupled through inverter 59:IV2 to the N-channel gate of 59:CPGL1. Input terminal TLDTQ is connected to the input of 59:CPGL1 and the output of 59:CPGL1 is connected to output terminal DTRUEQ. The input terminal terminal DLQ is connected to the input of 59:CPGL2 and the output of 59:CPGL2 is connected to output terminal DTRUEQ. The input of inverter 59:IV5 and the output of inverter 59:IV4 is connected to input terminal DLQ. The output of inverter 59:IV5 is connected to the input of inverter 59:IV4.

FIG. 59.1 illustrates Pre Output Buffer Circuit 3, POUTBUF3. NAND gate 59.1:ND1 is connected to input terminals CLRMX3 and TLDE_. NAND gate 59.1:ND2 is connected to input terminals CLRMX3 and TLDE. The output of NAND gate 59.1:ND1 is connected to the P-channel gate of CMOS pass gate logic device 59.1:CPGL2 and is coupled to the N-channel gate of 59.1CPGL2 through inverter 59.1:IV1. The output of NAND GATE 59.1:ND2 is connected to the P-channel gate of the CMOS pass gate logic device 59.1:CPGL1 and is coupled to the N-channel gate of 59.1:CPGL1 through inverter 59.1:IV2. The input of 59.1:CPGL1 is connected to input terminal TLDT3 and the input of 59.1:CPGL2 is connected input terminal DQIN3. The outputs of 59.1:CPGL1 and 59.1:CPGL2 are connected together and connected to output terminal DTRUE3.

FIG. 60 Depicts Output Buffer Circuit OUTBUF. The circuit has input terminals PBOSC, CLRMX_, DTRUEQ, CLRMXQ, CLOE and CLX4. Its output terminal is DQQ. Input terminal DTRUEQ is coupled through inverters 60:IV6 and 60:IV10 to input of CMOS pass gate logic device 60:CPGL6. The N-gate of 60:CPGL6 is connected to input terminal CLRMX_. Input terminal CLRMX_ is coupled through inverter 60:IV5 to the P-gate of 60:CPGL6. Input terminal CLRMXQ is also connected to the P-gate of 60:CPGL6. The input terminal DTRUEQ is connected to the output of 60:CPGL6 and is the first input to 3 input NAND gate 60:ND2. Input terminals CLOE and CLX4 are the other inputs to 3 input NAND gates 60:ND2. NAND gate 60:ND2 is coupled to Node 60:N13 through inverter 60:IV7. Node 60:N13 is coupled through inverters 60:IV8 and 60:IV9 to node 60:N17. Node 60:N13 is connected to one input of NOR gate 60:NR1 and node 60:N17 is connected to other input of NOR gate 60:NR1. The output of NOR gate 60:NR1 is the first input to 3 input NAND gate 60:ND3. The other two inputs to NAND gate 60:ND3 are input terminal CLX4 and coupled input terminal DTRUEQ (coupled through inverter 60:IV6). The output of NAND gate 60:ND3 is coupled to inverter 60:IV11 to one input of NAND gate 60:ND4. The other input of NAND gate 60:ND4 is connected to input terminal CLOE. The output of NAND gate 60:ND4 is connected to the gate of a P-channel transistor 60:MP1 and to the gate and N-channel transistor 60:MN13. P-channel transistor 60:MP1 and N_channel transistor 60:MN13 are connected in series respectively between VPERI and VSS. The series connection between transistors 60:MP1 and 60:MN13 is connected to node 60:N27.

In the Output Buffer Circuit of FIG. 60, SWITCH 60:BOOT1 is in the "A" position. The input of inverter 60:IV1 is connected to the common terminal of SWITCH 60:BOOT1. Node 60:N13 is connected to the A terminal of SWITCH 60:BOOT1. The output of inverter 60:IV1 is coupled through delay stage 60:SDEL4, and inverters 60:IV2 and 60:IV3 to node 60:N6. Node 60:N6 is coupled through inverter 60:IV4 to node 60:N7. Both the source and drain of N-channel transistor 60:MN9 is connected to node 60:N13. N-channel transistors 60:MN5 and 60:MN6 are connected is series respectively between VPERI and 60:N15. The gate of 60:MN5 is connected to the series connection between 60:MN5 and 60:MN6. The gates of 60:MN9 and 60:MN6 are both connected to node 60:N15. Node 60:N6 is coupled to node 60:N15 through N-channel transistor 60:MN7. The gate of transistor 60:MN7 is connected to VPERI.

In Output Buffer Circuit OUTBUF of FIG. 60, SWITCH 60:BOOT2 couples node 60:N17 to node 60:N18 when SWITCH 60:BOOT2 is in the "A" position. N-channel transistor 60:MN10 couples node 60:N18 to node 60:N10. The gate of transistor 60:MN10 is connected to node 60:N15. Node 60:N7 is connected to the source and drain of internal transistor 60:MN8. The gate of transistor 60:MN8 connected to node 60:N10. Node 60:N7 is connected to one input of NAND gate 60:ND1. The other input of NAND gate 60:ND1 is connected to input terminal PBOSC. The output of NAND gate 60:ND1 is connected to the source and drain of N-channel transistor 60:MN14. The gate of transistor of 60:MN14 is connected to node 60:N8. Node 60:N7 is coupled to node 60:N8 through the N-channel transistor 60:MN1. The gate of transistor 60:MN1 is connected to VPERI. The gate of N-channel transistor 60:MN15 is connected to Node 60:N8. Transistor 60:MN15 couples node 60:N8 to node 60:N10. The N-channel transistor 60:MN2, 60:MN3 and 60:MN4 are connected is series respectively between VPERI and node 60:N10. The gate of 60:MN2 is connected to the series connection of 60:MN2 and 60:MN3. The gate of 60:MN3 is connected to the series connection of 60:MN3 and 60:MN4. The gate of 60:MN4 is connected to node 60:N10.

In FIG. 60, node 60:N10, the booted node, is connected to the first terminal of SWITCH 60:BOOT3. Node 60:N17, the non-booted node, is connected to the second terminal of SWITCH 60:BOOT3. The common terminal of 60:BOOT3 is connected to Node 60:N19. N-channel transistors 60:MN11 and 60:MN12 are connected in series respectively between V-external and VSSOD. The gate of transistor 60:MN11 is connected to node 60:N19. The gate of transistor 60:MN12 is connected to node 60:N27. Output terminal DQQ is connected to the series connection between 60:MN11 and 60:MN12. One terminal of the N-channel transistor 60:MN16 is connected to node 60:N19. The other terminal is connected to the common terminal of SWITCH 60:SW1. The gate of transistor 60: MN16 is connected to VSS. The "B" terminal of 60:SW1 is connected to the series connection of transistors 60:MN11 and 60:MN12. The "A" terminal of SWITCH 60:SW1 is connected to VSS.

FIG. 60.2 illustrates Output Buffer 3 Circuit OUTBUF3. The configuration of OUTBUF3 is the same as OUTBUF except that instead of one input of 3 input NAND gates 60.2:ND2 and 60.2:ND3 being connected to input terminal CLX4, as in FIG. 60, they are connected to VPERI.

The PGSIG circuit is illustrated in FIG. 60.3. Input terminal RID is coupled to the gate of the P-channel transistor 60.3:MP1 through inverter 60.3:IV1. One terminal of P-channel transistor 60.3:MP1 is connected to VPERI and the other terminal is connected to the input of inverter 60.3:IV2. P-channel transistor 60.3:MP2 has one terminal connected to VPERI and the other terminal to the input of inverter 60.3:IV2. The gate of transistor 60.3:MP2 is connected to the output of inverter 60.3:IV2. The input of inverter 60.3:IV2 is also connected to the x1BONDPAD of 60.3:X1BDPD. The output of inverter 60.3:IV2 is coupled to output terminal CLX4 through inverter 60.3:IV3. This circuit acts as a control for the X1 or X4 mode of operation. The Write/Bit mask option circuit is also illustrated in 60.3. The terminal WPB is connected to VPERI. The terminal STD is connected to VSS. The common terminal indicates the write mask option.

The Input Buffer Circuit INBUF is depicted in FIG. 61. Input terminal DQQ is connected to the input of circuit 61:XTTLDATA1_1. Input terminal DEN_ is connected to this circuit and input terminal CLX4 is coupled to this circuit through inverter 61:IV1. This circuit is biased between the voltages VPR and VSSAB. The output of 61:XTTLDATA1_1 is connected to the input of pass gate 61:PG1. Input terminals DLAT and CLX4 are connected to NAND gate 61:ND3. The output of NAND gate 61:ND3 is connected to the N-channel gate of pass gate 61:PG1 and to the P-channel gate of pass gate 61:PG2. The output of NAND gate 61:ND3 is coupled through inverter 61:IV6 to the P-channel gate of 61:PG1 to the N-channel gate of 61:PG2. The output of 61:PG1 is connected to the output of 61:PG2. The output of 61:PG1 is connected to the input of inverter 61:IV4. The output of inverter 61:IV4 is connected to Node 61:N8. The node 61:N8 is connected to the input of inverter 61:IV5. The output of inverter 61:IV5 is connected to the input of pass gate 61:Pg2 and is connected to the input of inverter 61:IV7. The output of inverter 61:IV7 is connected to the second input of NAND gate 61:ND2 and to the first input of NOR gate 61:NR1.

In FIG. 61, the input terminals DLAT, WLMX, and CLX4 are connected to 3 input NAND gate 61:ND1. The output of NAND gate 61:ND1 is connected to the second input of NOR gate 61:NR1 and is coupled through inverter 61:IV13 to the first input of NAND gate 61:ND2. P-Channel transistor 61:MP1 and N-channel transistor 61:MN1 are connected is series respectively between VPERI and VSS. The output of NAND gate 61:ND2 is connected to the gate of P-channel 61:MP1. The output of NOR gate 61:NR1 is connected to the gate of N-channel transistor 612:MN1. Output terminal DLQ is connected to the series connection of transistors 61:NP1 and 61:MP1.

In the Input Buffer Circuit INBUF FIG. 61, input terminal DSTX4 is connected to the P-channel gate of pass gate device 61:PG4 and to the N-channel gate of pass gate device 61:PG3. Input terminal DSTX4 is coupled through inverter 61;IV3 to the N-channel gate of 61:PG4 and to the P-channel gate of 61:PG3. The input of 61:PG3 is connected to node 61:N8. The output of 61:PG3 is connected to the output of 61:PG4 and is coupled through inverters 61:IV10 and 61:IV12 to output terminal EXDAQ. Output terminal EXDAQ is connected to input of pass gate device 61:PG4.

In FIG. 61, input terminal WBRP is connected to the N-channel gate of pass gate device 61:PG5 and to the P-channel gate of pass gate device 61:PG6. Input terminal WBRP is coupled through inverter 61:IV2 to the P-channel gate of 61:PG5 and to the N_channel gate of 61:PG6. The input of 61:PG5 is connected to node 61:N8. The output of 61:PG5 is coupled through inverters 61:IV8 and 61:IV9 to output terminal WMBQ. Output terminal WMBQ is connected to the input of 61:PG6. P-channel transistor 61:MP2 couples VPERI to the output of 61:PG5 and to the output of 61:PG6. The gate of 61:MP2 is connected to the input of RBWP_.

FIG. 62 illustrates Input Buffer Circuit 3, INBUF3. Input terminal DX1 is connected to the input TTL to CMOS converter 61:XTTLDATA1_1. Input terminal CLX4 and DEN_ are connected to this circuit. This circuit is biased between the voltages VPR and VSSAB. The output of 62:XTTLDATA1_1 is connected to the input of pass gate devite 62:PG1. Input terminals CLX4 and DLAT are connected to NOR gate 62:NR2. The output of NOR gate 62:NR2 is connected to the N-channel gate of 62:PG1 and is coupled through inverter 62:IV7 to the P-channel gate of 62:PG1. The output of pass gate device PG1 is connected to node 62:N5.

In FIG. 62, input terminal DQ3 is connected to the input of TTL to CMOS converter 62:XTTLDATA1_2. Input DEN_ is connected to this circuit and input terminal CLX4 is coupled to this circuit through inverter 62:IV1. This circuit is biased between the voltages VPR and VSSAB. Refer to FIG. 139.0 for details of the TTL to CMOS converters. The output of this circuit is connected to the input of pass gate device 62:PG2. Input terminal DLAT is connected to NOR gate 62:NR1 and input terminal CLX4 is connected to NOR gate 62:NR1 through inverter 62:IV1. The output of 62:NR1 is connected to the N-channel gate of pass gate device 62:PG2 and is coupled to the P-channel gate of 62:PG2 through inverter 62:IV3. The output of 62:PG2 is connected to node 62:N5.

Still referring to FIG. 62, node 62:N5 is connected to the output of pass gate device 62:PG3. Input terminal DLAT is connected to the N-channel gate of 62:PG3 and is couple through inverter 62:IV9 to the P-channel gate of 62:PG3. Node 62:N5 is coupled through the 3 series connected inverters 62:IV5 , 62:IV8, and 62:IV10 to the output terminal DIN3. Node 62:N18, taken between inverters 62:IV8 and 62:IV10, is connected to the input of pass gate device 62:PG3. Node 62:N9 is taken between inverters 62IV5 and 62:IV8.

In FIG. 62, input terminal DST3 is connected to the N-channel gate of pass gate device 62:PG4 and to the P-channel gate of pass gate device 62:PG5. Input terminal of DST3 is coupled through inverter 62:IV4 to the P-channel gate of 62:PG4 and to the N-channel gate of 62:PG5. Node 62:N9 is connected to the input of 62:PG4. The output of 62:PG4 is connected to the output of 62:PG5 and is coupled through inverters 62:IV13 and 62:IV12 to output terminal EXDA3. Output terminal EXDA3 is connected to the input of 62:PG5.

In INBUF3 of FIG. 62, input terminal WBRP is connected to the N-channel gate of pass gate device 62:PG6 and to the P-channel gate of pass gate device 62:PG7. It is coupled through inverter 62:IV2 to the P-channel gate of 62:PG6 and to the N-channel gate of 62:PG7. The input of 62:PG6 is connected to node 9. The output of 62:PG6 is connected to the output of 62:PG7 and is coupled through inverters 62:IV14 and 62:IV15 to output terminal WMB3. Output terminal WMB3 is connected to the input of 62:PG7. P-channel transistor 62:MP1 couples VPERI to the output of 62:PG6. Its gate is connected to input terminal RBWP_.

Input Output Control Logic, IOCTL is depicted in FIG. 63. Input terminal W2_ is coupled through inverter 63:IV2 to the first input of NOR gate 63:NR1. Input terminal DEN_ is coupled through delay circuit 63:XSDEL1_1 to the other input of NOR gate of 62:NR1. The output of NOR gate 63:NR1 is connected to the first input of NAND gate 63:ND1. Input terminal WBR is connected to the first input of Nor gate 63:NR2. Input terminal CLX4 is connected to the other input of NOR gate 63:NR2 through inverter 63:IV1. The output of NOR gate 63:NR2 is connected to another input of the 3 input NAND gate 63:ND1. Input terminal TLEDC is connected to the third input of 63:ND1. The output of 63:ND1 is coupled through inverter 63:IV6 to output terminal 63:DSTX4.

In the Input Output Control Logic IOCTL of FIG. 63, input terminal CLX4 is connected to NAND gate 63:ND2. Input terminal TLDE is connected to NAND gate 63:ND2. The output of NAND gate 63:ND2 is coupled through inverter 63:IV3 to output terminal DETMX4. Input terminal CLX4 is also connected to the input of NAND 63:ND3. Input terminal TLDE is coupled through inverter 63:IV4 to the first input of NAND gate 63:ND3. The output of NAND gate 63:ND3 is coupled through inverter 63:IV5 to output terminal DENTX4.

FIG. 64 depicts Input Output Control Logic 3, IOCTL3. Input terminal W2_ is coupled through inverter 64:IV4 to the first input of NOR gate 64:NR1. Input terminal DEN_ is coupled through delay circuit 64:XSDEL1_1 to the other input of NOR gate 64:NR1. The output of NOR gate 64:NR1 is connected to the first input of 3 input NAND gate 64:ND1. The other inputs to NAND gate 64:ND1 are coupled input terminal WBR (coupled to inverter 64:IV1) and input terminal TLEDC. The output of NAND gate 64:ND1 is coupled through inverter 64:IV3 to output terminal DST3. Input terminal TLDE is coupled through inverter 64:IV2 to output terminal TLDE_.

Write Clock 1, circuit W1 is illustrated in FIG. 65. Input terminal W_ is connected to the input of TTL CMOS converter circuit 65:XTTLCLK. Input terminals EXREF and RL1_ are connected to 65:XTTLCLK. 65:XTTLCLK is also connected to the voltages VPR and VSSAB. The output of TTL to CMOS converter 65:XTTLCLK is coupled through inverter 65:IV1 to output terminal W1. W1 is also connected to one input of 3 input NAND gate 65:ND2. The other inputs to NAND gate 65:ND2 are input terminal RWLEN and coupled input terminal CL1_, coupled through inverter 65:IV3. The output of NAND gate 65:ND2 is connected to output terminal W2_.

Write before RAS circuit WBR is depicted in FIG. 66. RL1_Is connected to input of delay stage 66:XSDEL4_1. The output of delay stage 66:XSDEL-4_1 is connected to node 66:N6 through SWITCH 66:SW1, illustrated as closed. It can be coupled to node 66:N6 through delay stage 66:XSDEL4_2 and SWITCH 66:SW2. SWITCH 66:SW2 is illustrated in the open position. Node 66:N6 is connected to the input of delay stage 66:XSDEL4_3. The output of delay stage 66:XSDEL4_3 is connected to node 66:N5 through SWITCH 66:SW3. It may also be connected to node 66:N5 through delay stage 66:XSDEL4_4 and SWITCH 66:SW4. SWITCH 66:SW4 in indicated in the open position.

In FIG. 66, Node 66:N6 is connected to the sample inputs of sample and hold circuits 66:XSAMHLD_1 and 66:XSAMHLD_2. Node 66:N5 is coupled to the hold inputs of sample and hold circuits 66:XSAMHLD_1 and 66:XSAMHLD-2, through inverter 66:IV1. Input terminal W1 is connected to the input of 66:XSAMHLD_1 and is coupled through inverter 66:IV2 to the input of 66:XSAMHLD_2. The output of 66:XSAMHLD_1 is coupled through inverters 66:IV3 and 66:IV4 to ouput terminal RBW. The output of 66: XSAMHLD_2 is coupled through inverters 66:IV5 and 66:IV6 to output terminal WBR. Output _ WBR is connected between the inverter 66:IV5 and 66:IV6.

FIG. 67 illustrates the Read Before Write Pulse circuit of RBWP_. Input terminal RBW is connected to the first input of NAND gate 67:ND1. It is coupled through the series connections of the inverter 66:IV2 and delay stages 67:XSDEL4_1, 67:XSDEL4_2, and 67:XSDEL2_1 to the other input of NAND gate 67:ND1. The output of NAND gate 67:ND1 is connected to an input NAND gate 67:ND2. Input terminal WM0 is connected to the first input of NAND gate 67:ND2. The output of NAND gate 67:ND2 is connected to the first input of NOR gate 67:NR1. Input terminal RID is connected to the other input of NOR gate 67:NR1. The output of NOR gate 67:NR1 is coupled through inverter 67:IV5 and 67:IV6 to output terminal RBWP_.

FIG. 68 depicts Write Before Ras Pulse circuit WBRP. Three input NOR gate 68:NR1 receives DEN_, TLEDC, and coupled CL1_ (that is coupled through inverter 68:IV1). The output of 68:NR1 is coupled through the series connected inverters 68:IV3 and 68:IV5 to output terminal WBRP.

FIG. 69 illustrates Read Write Logic Enable circuit, RWLEN. Input CBR is connected through serially connected inverter 69:IV3, delay stage 69:XSDEL2_3, delay stage 69:XSDEL2_4, and inverter 69:IV6 to the first input of 3 input NAND gate 69:ND1. Input terminal CL1_ is connected to the second input of NAND gate 69:ND1 through the serially connected delay stages XSDEL2_1 and 69:XSDEL2_2. Input terminal CL1_ is coupled through inverter 69:IV2 to third input of 69:ND1. The output of 69:ND1 is input to NAND gate 69:ND2. RBC is coupled through inverter 69:IV1 to the other input of NAND gate 69:ND2. The output of NAND gate 69:ND2 is connected to the set input of LATCH 69:XRSQ1. RL1_ is connected to the reset input of 69:XRSQ1. The output of 69:XRSQ1 is coupled through inverters 69:IV4 and 69:IV5 to output terminal RWLEN.

FIG. 70 illustrates Control Logic Read Master circuits CLRMX_. Three input NOR gate 70:NR1 receives WRT_EN, complimented RLRST_ (complimented by inverter 70:IV2), and RID. The output of inverter 70:NR1 is coupled through inverter 70:IV6 to the enable input of LATCH 70:XRSQ1. Input terminal W2_ is coupled through inverter 70:IV1 to the reset input of 70:XRSQ1. Input terminal RWLEN is connected to the set input of 70:XRSQ1. The output of 70:XRSQ1 is coupled through serially connected inverters 70:IV3, 70:IV4, and 70:IV5 to output terminal CLRMX_.

Data Enable Circuit DEN_ is n FIG. 71. Input terminal CL1_ is coupled to one input of 3 input NAND gate 71:ND1 through serially delay stages 71:XSDEL2_4 and XSDEL2_7 and is connected to another input of 3 input NAND gate 71:ND1 through inverter 71:IV4. The first input to NAND gate 71:ND1 is input terminal TMDLEN. The output of 3 input NAND gate 71:ND1 is input to NAND gate 71:ND2. Input terminal RL1_ is coupled through serially delay stages XSDEL2_6 and XSDEL2_2 to one input of 3 input NAND gate 71:ND7 and is coupled to another input of NAND 71:ND7 through inverter 71:IV5. Input terminal TLDEC is connected to the first input of NAND gate 71: ND7. The output of 71:ND7 is connected to the first input of NAND gate 71:ND2. The output of NAND gate 71:ND2 is coupled through inverter 71:IV13 to an input of NAND gate 71:ND3. Input terminal W2_ is connected to the first input of NAND gate 71:ND3.

The output of NAND gate 71:ND3 is connected to node 71:N6. Input terminal WBR_ is connected to one input of 3 input NOR gate 71:NR1 and is coupled through the serially connected delay stages 71:XSDEL2_5, 71:XSDEL2_3, and inverter 71:IV3 to a second input of NOR gate 71:NR1. Input terminal WMO is coupled through inverter 71:IV1 to the first input of NOR gate 71:NR1. The output of NOR gate 71:NR1 is connected to node 71:N13.

In Data Enable Circuit DEN_ of FIG. 71, node 71:N18 is taken between serially connected inverter 71:IV9 and 71:IV10. Node 71:N18 is coupled through the delay stages 71:XSDEL1_1 and XSDEL2_1 to the first input of NAND gate 71:ND4. The other input to NAND gate 71:ND4 is the output of NAND gate 71:ND6. The output of NAND gate 71:ND4 is the first input to NAND gate 71:ND6. The other input to NAND GATE 71:ND6 is input terminal WRT_EN. The output of NAND gate 71:ND4 is coupled through the series connected inverters 71:IV2 and 71:IV6 to output terminal DLAT. An input to NAND gate 71:ND5 is taken between serially connected inverters 71:IV2 and 71:IV6. Input terminal RID is coupled through inverter 71:IV7 to the first input of NAND gate 71:ND5.

Still referring to Data Enable circuit DEN_ of FIG. 71, the output of NAND gate 71:ND5 is one input of 3 input NOR gate 71:NR3. Another input to NOR gate 71:NR3 is the output of 3 input NOR gate 71:NR4. Input RL1_ is the first input to NOR gate 71:NR3. The output of NOR gate 71:NR3 is connected to node 71:N16. Node 71:N16 is connected to one input of 3 input NOR gate 71:NR4. Node 71:N13 is connected to the first input of NOR gate 71:NR4 and node 71:N6 is connected to the remaining input of NOR gate 71:NR4. Node 71:N16 is connected to the input of inverter 71:IV9. The output of inverter 71:IV9 is connected to node 71:N18. Node 71:N18 is coupled through the serially connected inverters 71:IV10 and 71:IV11 to output terminal DEN_.

FIG. 72 shows Test Mode Data Logic Enable circuit TMDLEN. Coupled TLEDC (through inverter 72:IV1), CL1_, and RL1_ are input to 3 terminal NOR gate 72:NR1. The output of NOR gate 72:NR1 is connected to the set input of LATCH 72:XRSQ1. RL1_ and RID are input to NOR gate 72:NR2. The output of NOR gate 72:NR2 is coupled through inverter 72:IV2 to the reset input of LATCH 72:XRSQ1. The output of LATCH 72:XRSQ1 is coupled through the serially connected inverter 72:IV3 delay stage XSDEL2_1, XSDEL2_2, and inverter 72:IV4 to output terminal TMDLEN.

FIG. 73 depicts Write Logic Master circuit WLMX. Delay stages 73:XXDEL4_1 through 73:XSDEL4_4 are connected in series. Nodes 73:N8 lies between 73:XSDEL4_1 and 3:XSDEL4_2. Node 73:N9 lies between stages 73:XSDEL4_2 and 73:XSDEL4_3. Node 73:N10 lies between delay stages 73XSDEL4_3 73:XSDEL4_4. Node 73:N11 is connected to the output of stage 73:XSDEL4_4. SWITCHES 73:SW1 through 73:SW4 respectively connect nodes 73:N8 through 73:N11 to node 73:N12. SWITCH 73:SW1 is illustrated in the closed position. Input terminal CL1_ is connected to the input of delay stage 73:XSDEL4_1. The Node 73:N12 is connected to the input of inverter 73:IV9. The output of inverter 73:IV9 is labeled as Node 73:N19.

In FIG. 73, input terminal CL1_ is connected to the first input of 3 input NOR gate 73:NR1. Input terminal RLRST_ is coupled through inverter 73:IV1 to another input. Terminal RID is connected to the remaining input of NOR gate 73:NR1. The output of 3 terminal NOR gate 73:NR1 is coupled through inverter 73:IV2 to the reset input of LATCH 73:XRSQ1. Input terminal W2_ is coupled through inverter 73:IV6 to the set input of LATCH 73:XRSQ1. The output of LATCH 73:XRSQ1 is connected to node 73:N3. Node 73:N3 is coupled through inverters 73:IV7 and 73:IV8 to output terminal WRT_EN. It is also connected to one input of 3 terminal NAND gate 73:ND1. Other inputs to NAND gate 73:ND1 are node 73:N19 and input terminal CLEN. The output of NAND gate 73:ND1 is coupled through the serially connected inverters 73:IV3, 73:IV4 and 73:IV5 to output terminal WLMX.

Input and Output Enable Clock circuit G1 is illustrated in FIG. 74. Input terminal G_ is connected to the TTL input of TTL clock circuit 74:XTTLCLK. Input terminal CL1_ is connected to the CMOSCLK input of 74:XTTLCLK. The enable input of 74:XTTLCLK is connected to VPERI. Input terminal CLX4 is coupled through inverter 74:IV1 to the G_DIS input of 74:XTTLCLK. The output of 74:XTTLCLK is connected to one input of NAND gate 74:ND1. The other input to NAND gate 74:ND1 is input terminal CLX4. The output of NAND gate 74:ND1 is coupled through inverter 74:IV5 and 74:IV6 to output terminal GI. 74:XTTLCLK is also connected to voltages VPR and VSSAB. The input terminal EXREF is alo input to the TTL clock circuit 74:XTTLCLK.

FIG. 75 depicts Early Write circuit LATWR_. Input terminal CL1_ is coupled through inverter 75:IV1 and inverter 75:IV2 to node 75:N2. Node 75:N2 is coupled through delay stage 75:XSDEL4_1 to Node 75:N3. Node 75:N3 is coupled through delay stage 75:XSDEL4_2 to node 75:N4. Node 75:N3 is connected to one terminal of SWITCH 75:SW1 and node 75:N4 is coupled to one terminal of SWITCH 75:SW2. The other terminals of SWITCHES 75:SW1 and 75:SW2 are connected to node 75:N5. In FIG. 75, SWITCH 75:SW1 is illustrated in the closed position and SWITCH 75:SW2 is illustrated in the open position. Node 75:N5 is coupled through inverter 75:IV3 to the hold input of sample and hold circuit 75:XSAMHLD. Node 2 is connected to the sample input of 75:XSAMHLD. Input terminal W1 is connected to the enable input of 75:XSAMHLD. The output of XSAMHLD is coupled through inverter 75:IV4 to output terminal LATWR_.

FIG. 76 depicts Control Logic Output Enable curcuit, CLOE. Input terminal TLSCSL is connected to one input of switch SW1. The other input of SWITCH 76:SW1 is connected to VPERI. The output of SWITCH 76:SW1 is connected to the first input of the 3 input NAND gate 76:ND2. Input terminal TLWLS_ is coupled through inverter 76:IV3 to another input of 76:ND2. Input terminal TLBID is connected to the final input of 76:ND2. The output of 76:ND2 is connected to an input of 3 input NAND gate 76:ND1. Input terminal RWLEN is connected to the first input of 76:ND1. Input terminal SDS4 is coupled through inverter 76:IV1, delay stages 76:SD1 through 76:SD4, and inverter 76:IV2 to the final input of in 3 input NAND gate 76:ND1. The output of 76:ND1 is connected to the first input of 3 input NOR gate 76:NR1. The other two inputs to 3 input NOR gate 76:NR1 are input terminals LATWR_ and RID. The output of 76:NR1 is connected to the first input of input NAND gate 76:ND3. Input terminals CLX4 and WRT_EN are connected to the inputs of NAND gate 76:ND4. The output of NAND gate 76:ND4 is connected to another input of 3 input NAND gate 76:ND3. Input terminal G1 is connected to the final input of NAND gate 76:ND3. The output of NAND gate 76:ND is coupled through inverter 76:IV4 to output terminal CLOE.

FIG. 77 illustrates the Voltage Band Gap Reference Generator circuit, VBNDREF.

N-channel transistor 77:MP1 has one terminal connected to VDDREF. The other terminal of transistor 77:MP1 is connected in series with P-channel transistor 77:MP4, resistor 77:R4, N-channel transistor 77:MN3, and N-channel transistor 77:MN1. Transistor 77:MN1 is connected to the emitter of parasitic bipolar transistor 77:Q1. The collector of transistor 77:Q1 is connected to VBB. P-channel transistor 77:MP2 has one terminal connected to VDDREF. The other terminal of transistor 77:MP2 is connected in series with the series connected P-channel transistors 77:MP5, resistor 77:R3, N-channel transistor 77:MN4 and one terminal of N-channel transistor 77:MN2. The other terminal of N-channel transistor 77:MN2 is connected to the series connected resistors 77:R1 and 77:R6. One terminal of resistor 77:R6 is connected to the emitter of parasitic bipolar transistor 77:Q2. The collector of transistor 77:Q2 is connected to VBB. The gates of P-channel transistors 77:MP1 and 77:MP2 are connected together at node 77:BIAS1. The gates of P-channel transistors 77:MP4 and 77:MP5 are connected together at Node 77:BIAS2. The gates of N-channel transistors 77:MN3 and 77:MN4 are connected together at Node 77:N13. The gates of N-channel transistors 77:MN1 and 77:MN2 are connected together at Node 77:N10. Node 77:BIAS 1 is connected between the series connection of P-channel transistor 77:MP5 and resistor 77:R3. Node 77:BIAS2 is connected between the series connection of resistors 77:R3 and transistor 77:MN4. Node 77:N13 is connected to the series connection of P-channel transistor 77:MP4 and resistor 77:R4. Node 77:N10 is connected to the series connection of resistors 77:R4 and transistor 77:MN3.

In voltage Band Gap Reference Generator VBNDREF of FIG. 77, P-channel transistors 77:MP17, 77:MP18, and 77:MP110 are connected in series and biased between VDDREF on one terminal of transistor 77:MP17 and VSSRG on one terminal of transistor 77:MP110. The gate of P-channel transistor 77:MP17 is connected to Node 77:BIAS1. The gate of transistor of 77:MP18 is connected to Node 77:BIAS2. The gate of P-channel transistor 77:MP110 is connected to the C terminal of SWITCH 77:X2. The B terminal of SWITCH 77:X2 is connected to the voltage VSSRG. The A terminal of SWITCH 77:X2 is connected to Node 77:N13. P-channel transistor 77:MP19 couples Node 77:N13 to the VDDREF. The gate of P-channel transistor 77:MP19 is connected to the series connection of P-channel transistors 77:MP18 and 77:MP110, Node 77:N117. Transistor 77:XMN16, having its source and drain connected to VSSRG, is connected to one terminal of SWITCH 77:X3. The other terminal of SWITCH 77:X3 is connected to Node 77:N117. SWITCH 77:X3 is illustrated in the closed position.

Still referring to FIG. 77, P-channel transistor 77:MP15, P-channel transistor 77:MP8 and N-channel transistor 77:MN5 are connected in series respectively between VDDREF and VSSRG. The gate of transistor 77:MP15; connected to the series connection of transistors 77:MP15 and 77:MP8. The substrate of transistor 77:MP8 is connected to VDD. The gate of transistor 77:MP8 and 77:MN5 are connected together and connected to VSSRG. The substrate of transistor 77:MP18 is connected to node 77:N116. The substrate of transistor 77:MP4 is conneced to node 77:N2. The substrate of transistor 77:MP5 is connected to node 77:N8. The substrate of transistor 77:MP6 is connected to node 77:N14. P-channel transistor 77:MP7 has one terminal connected to VDD and the other terminal connected to Node 77:N15. Node 77:N15 is connected to the series connection of P-channel transistor 77:MP8 and N-channel transistor 77:MN5. Node 77:N15 is connected to the gate of N-channel transistor 77:XC1. The source and drain of transistor 77:XC1 are connected together and connected to VSSRG. P-channel transistor 77:MP10 and N-channel transistor 77:MN6 are connected in series and respectively biased between VDDREF and VSSRG. The gates of both P-channel transistor 77:MP10 and N-channel transistor 77:MN6 are connected to node 77:N15. The gate of P-channel transistor 77:MP7 and the series connection of transistors 77:MP10 and 77:MN6 are connected together at Node 77:N16. The gate of P-channel transistor 77:MP14 is connected to Node 77:N16. The source and drain of transistor 77:MP14 are connected together and connected to VDDREF. Node 77:N16 is also connected to the gate of N-channel transistor 77:MN8. One terminal of transistor 77:MN8 is connected to VSSRG. The other terminal is coupled through SWITCH 77:X1 to Node 77:BIAS1. SWITCH 77:X1 is illustrated in the closed position.

Still referring to the Voltage Band Gap Reference Generator circuit VBNDREF of FIG. 77, P-channel transistors 77:MP3 and 77:MP6 are connected in series. One terminal of transistor 77:MP3 is connected to VDDREF. One terminal of transistor 77:MP6 is connected to the gate of N-channel transistor 77:XMN7. The source and drain of transistor 77:XMN7 are connected together and connected to VSSRG. The gate of transistor 77:MP3 is connected to Node 77:BIAS1. The Gate of P-channel transistor 77:MP6 is connected to Node 77:BIAS2. Node 77:BIAS1 is connected to output terminal BIAS1. Node 77:BIAS2 is connected to output terminal BIAS2. The gate of transistor 77:XMN7 is connected to output terminal VREF. Also illustrated in FIG. 77 being connected to output terminal VREF, is the parallel SWITCH and series resistor network of SWITCHES 77:XR0 through 77:XR9 and resistors 77:R211 through 77:R220. One terminal of resistor 77:R211 is connected to resistor 77:R2L. The other terminal of resistor 77:R2L is connected to the emitter of the parasitic bipolar transistor 77:Q3. The base of 77:Q3 is connected to the base of 77:Q2 and to the base of 77:Q1. The base connection of 77:Q3 is connected to VSSRG. The collector of 77:Q3 is connected to VBB.

FIG. 78 depicts the Voltage Multiplier circuit, VMULT.

Low threshold voltage N-channel transistor 78:M3 is connected between Node 78:N1 and 78:N3. The gate of transistor 78:M3 is connected to VREF. P-channel transistor 78:M1 is connected between VDDREF and Node 78:N1. The gate of transistor 78:M1 is connected to Node 78:N2. P-channel transistor 78:M2 is connected between VDDREF and Node 78:N2. The gate of transistor 78:M2 is also connected to Node 78:N2. Low threshold voltage N-channel transistor 78:M4 is connected between Node 78:N2 and Node 78:N3. The gate of transistor 78:M4 is connected to Node 78:VREF0. Node 78:VREF0 is coupled to VSSR through capacitor 78:C1.

In FIG. 78, LOOP circuit 78:1 is connected to Node 78:N3. Only one loop circuit 78:1 is illustrated in FIG. 78. There are eight such looped circuits 78:1 connected to Node 78:N3 in the preferred embodiment. The voltage BIAS is connected to the gate of Low-threshold voltage N-channel transistor 78:MN5. The other terminal on the loop circuit is connected to VSSRG.

P-channel transistor 78:MPB1, P-channel 78:MPB2, and N-channel transistor 78:MNB are connected in series and biased between VDDREF and VSSRG. Input terminal BIAS1 is connected to the gate of P-channel transistor 78:MPB1. Input terminal BIAS2 is connected to the gate of P-Channel transistor 78:MPB2. The gate of transistor 78:MNB, that is a low threshold voltage transistor, is connected to the series connection of transistors 78:MPB2 and 78:MNB. The voltage BIAS is taken from the gate/series connection of low threshold voltage transistor 78:MNB. The substrate of P-channel transistor 78:MPB2 is connected to the series connection between 78:MPB1 and 78:MPB2.

In the Voltage Multiplier circuit VMULT of FIG. 78, the gate of P-channel transistor 78:M11 is connected to Node 78:N1. One terminal of transistor 78:M11 is connected to VDDREF. The other terminal is connected to Node 78:N14. The gate of N-channel transistor 78:CM is connected to Node 1. The source and drain of transistor 78:CM are connected to Node 78:M14. Input terminal TLSCSLH is connected to the gate of P-channel transistor 78:M13 and the gate of N-channel transistor 78:M14. One terminal of transistor 78:M13 is connected to Node 78:N14 the other terminal is connected to Node 78:N20. The substrate of transistor 78:M13 is connected to VDDREF. One terminal of N-channel transistor 78:M14 is connected to VSSRG. The other terminal is connected to Node 78:N20.

In FIG. 78, Node 78:N20 is coupled to VSSRG through capacitor 78:C3. Node 78:N20 is connected to one side of resistor SWITCH network 78:RS. The other side of resistor SWITCH network 78:RS is connected to Node 78:N15. Resistor 78:R3 couples Node 78:N15 to Node 78:N21. Node 78:N21 is connected to output terminal VLA and to one terminal of SWITCH 78:X1. The other terminal of SWITCH 78:X1 is connected to Node 78:N20 that is connected to output terminal 78:VLP. Node 78:N21 is connected to one side of resistor SWITCH network 78:RS1. The other side of resistor SWITCH network 78:RS1 is connected to Node 78:N4. Node 78:N21 is also coupled to VSSRG through capacitor 78:C2. Resistor 78:R2 couples Node 78:N4 to Node 78:VREF0. Node 78:VREF0 is also coupled through resistor 78:R1 to VSSRG.

FIG. 79 depicts Voltage Burn In circuit, VBIN.

P-channel transistors 79:MP1 and 79:MP2 are respectively connected in series between VDD and node 79:N2. The gate of transistor 79:MP1 is connected to the series connection of 79:MP1 and 79:MP2 and Node 79:N1. The gate 79:MP2 is connected to Node 79:N2. The SWITCH 79:X1 is connected between Nodes 79:N1 and 79:N2. The substrate 79:MP2 is connected to Node 79:N1. Series connected P-channel transistors 79:MP4 and 79:MP5 couple Node 79:N2 to Node 79:N5. The substrate of transistor 79:MP4 is connected to Node 79:N2. The substrate of transistor 79:MP5 and the gate of transistor 79:MP4 are connected to the series connection of 79:MP4 and 79:MP5. Low-threshold voltage N-channel transistor 79:MNX couples the series connection between transistor 79:MP4 and 79:MP5 to VSSRG. The gate of transistor 79:MNX is connected to VREF. The gate of P-channel transistor 79:MP5 is connected to the common input of SWITCH 79:X2. The A terminal of SWITCH 79:X2 is connected to VDD. The B terminal of SWITCH 79:X2 is connected to VLA. Node 79:N5 is coupled to VSSRG through low threshold voltage N-channel transistor 79:MN2. The gate of transistor 79:MN2 is connected to VREF. In FIG. 79, P-channel transistor 79:MP6 and N-channel transistor 79:MN1 are connected in series respectively between VDD and VSSRG. Their gates are connected together and are connected to Node 79:N5. Low-threshold voltage transistor 79:MNY and N-channel transistor 79:MNZ couple Node 79:N5 to VSSRG. The gate of transistor 79:MNY is connected to VREF. The gate of transistor 79:MNZ is connected to the A terminal of SWITCH 79:XS2. The B terminal SWITCH 79:XS2 is connected to VDD. The common terminal of SWITCH 79:XS2 is connected to BINEN_. The series connection of transistor 79:MP6 and 79:MN1 is one input to three-input NOR gate XNOR2. TLSCSLH is another input to NOR gate 79:XNOR2. BIHO is connected to the first input of 79:XNOR2. 79:XNOR2 is biased by VDD.

In Voltage Burn-In circuit VBIN of FIG. 79, the output of 79:XNOR2 is connected to Node 79:N7. Node 79:N7 is connected to the gate of P-channel transistor 79:MP7 and N-channel transistor 79:MN3. Transistor 79:MP7 and 79:MN3 are connected in series respectively between VDD and VSSRG. Their series connection is connected to Node 79:N8. Node 79:N8 is connected to the gate of P-channel transistor 79:MP8 and to the gate of N-channel transistor 79:MN4. Transistor 79:MP8 and transistor 79:MN4 are connected in series respectively between VDD and VSSRG. Their series connection is connected to Node 79:N20. Node 79:N20 is connected to the gate of P-channel transistor 79:MP9 and to the gate of N-channel transistor 79:MN5. Transistor 79:MP9 and transistor 79:MN5 are connected in series between VDD and VSSRG. Their series connection is connected to the A terminal of SWITCH 79:XS2. Node 79:N20 is connected to the A terminal of SWITCH 79:XS1. The B terminal of SWITCH 79:XS1 is connected to VSSRG. The common terminal of SWITCH 79:XS1 is connected to BINEN.

In FIG. 79, VREF is connected to the gate of low threshold voltage N-channel transistor 79:MN29. Transistor 79:MN29 couples VLBIN to VSSRG. P-channel series connected transistors 79:MP25, 79:MP11, 79:MP22 and 79:MP27 couple VDD to VLBIN. The gate of 79:MP25 is connected to the series connection between 79:MP25 and 79:MP11 at Node 79:N11. The substrate of 79:MP11 is connected to NODE 79:N1. The gate of transistor 79:MP11 is connected to the series connection of 79:MP11 and 79:MP22 and to the substrate of 79:MP22 at Node 79:N12. The gate of transistor 79:MP22 is connected to the series connection between 79:MP22 and 79:MP27 and is connected to the substrate of 79:MP27 at node 79:N13. The gate of 79:MP27 is connected to VLBIN. One terminal of SWITCH 79:X4 is connected to VDD. The other terminal of SWITCH 79:X4 is connected to Node 79:N11 and is connected to one terminal of SWITCH 79:X5.

The other terminal of 79:X5 is connected to Node 79:N12 and is connected to one terminal of SWITCH 79:X6. The other terminal of SWITCH 79:X6 is connected to Node 79:N13 and to one terminal of SWITCH 79:X7. The other terminal of SWITCH 79:X7 is connected to VLBIN. Switches 79:X5, 79:X6 and 79:X7 are shown in the closed position.

FIG. 80 depicts VDD clamp circuit, VDDCLAMP. The circuit receives the inputs BIHO, VLP, and VREF and generates the outputs VCMPEN and VCMPEN_. P-channel transistors 80:MP1 through 80:MP5 are connected in series respectively between VDD and Node 80:N5. VLP is connected to the A terminal of SWITCH 80:X3. VDD is connected to the B terminal of SWITCH 80:X3. The common terminal of SWITCH 80:X3 is connected to the gate of transistor 80:MP5. The substrate of transistor 80:MP5 is connected to the gate of transistor 80:MP4 at the series connection between transistors 80:MP4 and 80:MP5. The substrate of 80:MP4 is connected to the gate of 80:MP3 at the series connection between 80:MP3 and 80:MP4 at Node 80:N3. The substrate of 80:MP3 is connected to the gate of 80:MP2 at the series connection between 80:MP2 and 80:MP3 at Node 80:N2. The substrate of 80:MP2 is connected to the gate of 80:MP1 at the series connection between 80:MP1 and 80:MP2 at Node 80:N1. The gate of 80:MP1X is connected to one terminal of SWITCH 80:X5. The other terminal of SWITCH 80:X5 is connected to the series connection between 80:MP1 and 80:MP1X at Node 80:N12. The substrate of transistor 80:MP1X is connected to Node 80:N12. One terminal of SWITCH 80:X4 is connected to Node 80 N1. The other terminal of SWITCH 80:X4 is connected to Node 80:N2.

In FIG. 80, P-channel transistor 80:MP10 couples Node 80:N2 to Node 80:N3. The substrate of P-channel transistor 80:MP10 is connected to Node 80:N2. The gate of 80:MP10 is connected to Node 80:N8. Transistor 80:MN2 couples Node 80:N5 to VSSRG. Transistor 80:MN2 is a low threshold voltage N-channel transistor whose gate is connected to VREF. Node 80:N5 is connected to the gates of P-channel transistor 80:MP6 and N-channel transistor 80:MN1. Transistors 80:MP6 and 80MN1 are connected in series respectively between VDD and VSSRG. The series connection between 80:MP6 and 80:MN1 at Node 80:N6 is one input to NOR gate 80:XNOR1. The first input to NOR gate 80:XNOR1 is BIHO. NOR gate 80:XNOR1 is biased by VDD.

In VDD clamp circuit VDDCLAMP of FIG. 80, the output of NOR gate 80:XNOR1 is connected to the gates of P-channel transistor 80:MP7 and N-channel transistor 80:MN3. 80:MP7 and 80:MN3 are respectively biased between VDD and VSSRG. Their series connection is connected to the gates of P-channel transistor 80:MP8 and N-channel transistor 80:MN4. Their series connection is also connected to Node 80:N8. Transistors 80:MP8 and 80MN4 are connected in series and biased respectively between VDD and VSSRG. Their series connection at Node 80:N9 is connected to the gates of P-channel transistor 80:MP9 and N-channel transistor 80:MN5. Transistors 80:MP9 and 80:MN5 are respectively connected between VDD and VSSRG. Their series connection at Node 80:N10 is connected to the B terminal of SWITCH 80:X2. The A terminal of SWITCH 80:X2 is connected to VDD. The common terminal of SWITCH 80:X2 is connected to VCMPEN_. Node 80:N9 is also connected to the B terminal of SWITCH 80:X1. The A terminal of SWITCH 80:X1 is connected to VSSRG. The common terminal of SWITCH 80:X1 is connected to VCMPEN.

Voltage Clamp circuit VLCMP is depicted in FIG. 80.1. P-channel transistor 80.1:M6 is connected in series with N-channel transistor 80.1:M8. Transistor 80.1:M6 is connected to VDD and transistor 80.1:M8 is connected to Node 80.1:N8. P-channel transistor 80.1:M7 and N-channel transistor 80.1:M9 are connected in series. P-channel transistor 80.1:M7 is connected to VDD and N-channel transistor 80.1:M9 is connected to Node 80.1:N8. The gates of transistors 80.1:M6 and 80.1:M7 are connected together and are connected to the series connection between 80.1:M6 and 80.1:M8. N-channel series connected transistors 80.1:M10 and 80.1MNB couple Node 80.1:N8 to VSSRG. The gate of 80.1:M10 is connected to VPER1 and the gate of 80.1MNB is connected to VCMPEN. The gate of 80.1:M8 is connected to Node 80.1.N10. The gate of 80.1:M7 is connected to node 80:1:N7. The gate of 80.1:M9 is connected to VLP.

In the Voltage Clamp circuit of FIG. 80.1, P-channel transistors 80.1:M16 and 80.1:M17 are connected in series respectively between VDD and VCLMP. The gate of 80.1:M16 is connected to Node 80.1:N7. The gate of 80.1:M17 is connected to VCMPEN_. N-channel transistor 80.1:M18 couples VPER1 to VCLMP. The gate of N-channel transistor 80.1M18 is connected to VCMPEN_. VCLMP is coupled to VSSRG through capacitor 80.1:CP.

In FIG. 80.1, P-channel transistor 80.1:M19 is connected to VCLMP. Transistor 80.1:M19 is connected in series with P-channel transistors 80.1:M20 through 80.1:M24. Transistor 80.1:M24 is connected to VSSRG. The gate of 80.1:M19 is connected to the series connection between 80.1:M19 and 80.1:M20. The gate of 80.1:M20 is connected to the series connection between 80.1:M20 and 80.1:M21. The gate of 80.1:M21 is connected to Node 80.1:N10 and to the series connection between 80.1:M21 and 80.1:M22. The gate of 80.1:M22 is connected to the series connection between 80.1:M22 and 80.1:M23. The gate of 80.1:M23 is connected to the series connection between 80.1:M23 and 80.1:M24. The gate of 80.1:M24 is connected to VSSRG. The substrate terminal of each P-channel transistor 80.1:M17 thru 80.1:M24 is connected to the source of that transistor.

FIG. 81 illustrates the Voltage Level Multiplexor circuit, VLMUX. P-channel transistors 81:MP1 through 81:MP4 are connected in series. Their substrates are biased by VDD. VLA is connected to one terminal of 81:MP1 while VLP is connected to one terminal of 81:MP4. BINEN is connected to the gate of 81:MP1 and to the gate of 81:MP4. BINEN_ is connected to the gate of 81:MP2 and to the gate of 81:MP3. VLBIN is connected to the series connection between 81:MP2 and 81:MP3. The series connection between 81:MP1 and 81:MP2 is connected to Node 81:VARPP. The serial connection between 81:MP3 and 81:MP4 is connected to Node 81:VPRPP.

In the Voltage Clamp circuit of FIG. 81, P-channel transistors 81:MP5 and 81:MP6 are connected to series. Their substrates are biased by VDD. Transistor 81:MP5 is connected to Node 81:VARPP. Transistor 81:MP6 is connected to VCLMP. VCMPEN_ drives the gate of P-channel transistor 81:MP5. VCMPEN drives the gate of P-channel transistor 81:MP6. The series connection between 81:MP5 and 81:MP6 is connected to VARP.

In FIG. 81, P-channel transistors 81:MP7 and 81:MP8 are connected in series. Transistor 81:MP7 is connected to VPRPP. Transistor 81:MP8 is connected to VCLMP. Their substrates are connected to VDD. The gate of 81:MP7 is connected to VCMPEN. The gate of 81:MP8 is connected to VCMPEN_. Their series connection is connected to VPRP.

FIG. 82 depicts the Voltage Array Buffer circuit, VARYBUF. P-channel transistor 82:M17, P-channel transistor 82:M18, and N-channel transistor 82:M19 are connected in series respectively between VDDREF and VSSRG. The gate of 82:M17 is connected to BIAS1. The gate of 82:M18 is connected to BIAS2. The gate of 82:M19 is connected to Node 82:N5. Node 82:N5 is the series connection between 82:M18 and 82:M19. P-channel transistor 82:MP20 and P-channel transistor 82:MN20 are connected in series and respectively biased between VDD and VSSRG. The gate of transistor 82:MP20 is connected to the series connection of 82:MP20 and 82:MN20. The gate of 82:MN20 is connected to the series connection of transistors 82:M18 and 82:M19. The series connection between transistors 82:MP20 and 82:MN20 is connected to BIAS3.

In FIG. 82, P-channel transistor 81:M1 and N-channel transistor 82:M3 and connected in series respectively between VDD and Node 82:N3. P-channel transistor 82:M2 and N-channel transistor 82:M4 are connected in series respectively between VDD and Node 82:N3. The gates of P-channel transistor 82:M1 and 82:M2 are connected together and are connected to the series connection between 82:M1 and 82:M3. The gate of 82:M3 is connected to VAR. The gate of 82:M4 is connected to VARP. N-channel transistor 82:M5 couples Node 82:N3 to VSSRG. The gate of 82:M5 is connected to Node 82:N5.

In the Voltage Array Buffer Circuit VARYBUF illustrated in FIG. 82, N-channel transistors 82:M16, 82:M20, and 82:M15 are connected respectively between VDD and VSSRG. The gate of 82:M16 is connected to VARP. The gate of 82:M20 is connected to the series connection between 82:M16 and 82:M20. The gate of 82:M20 is also connected to one terminal of SWITCH 82:X1. The other terminal of SWITCH 82:X1 is connected to the series connection between transistors 82:M20 and 82:M15. The gate of 82:M15 is connected to Node 82:N5. N-channel transistors 82:M13, 82:M21, and 82:M14 are also connected in series and respectively biased between VDD and VSSRG. The gate of 82:M13 is connected to VAR. The gate of 82:M21 is connected to the series connection between 82:M13 and 82:M21. The gate of 82:M21 is also connected to one terminal of SWITCH 82:X2. The other terminal of SWITCH 82:X2 is connected to Node 82:N8 that is connected to the series connection between transistors 82:M21 and 82:M14.

The gate of transistor 82:M14 is connected to Node 82:N5. Still referring to FIG. 82, N-channel transistor 82:M7 and P-channel transistor 82:M8 are connected in series respectively between VSSRG and Node 82:N9. N-channel transistor 82:M6 and P-channel transistor 82:M11 are connected in series respectively between VSSRG and Node 82:N9. The gates of N-channel transistors 82:M7 and 82:M6 are connected together and are connected to the series connection between transistors 82:M7 and 82:M8. The gate of 82:M8 is connected to Node 82:N8. The gate of 82:M11 is connected to the series connection between 82:M20 and 82:M15. P-channel transistor 82:M12 couples Node 82:N9 to external VDD. The gate of P-channel transistor 82:M12 is connected to the series connection between 82:MP20 and 82:MN20.

In FIG. 82, P-channel transistor 82:M9 and N-channel transistor 82:M10 are connected in series and respectively biased between VDD and VSSRG. The gate of P-channel transistor 82:M9 is connected to the series connection between P-channel transistor 82:M2 and N-channel transistor 82:M4. The gate of N-channel transistor 82:M10 is connected to the series connection between P-channel transistor 82:M11 and N-channel transistor 82:M6. The series connection between transistors 82:M9 and 82:M10 is connected to the output VAR. Capacitor 82:CC has one terminal connected to the gate of N-channel transistor 82:M3 (connected to VAR) and the other connected to VSSRG. The substrate connections of P-channel transistors 82:M8 and 82:M11 are coupled to node 82:N9.

FIG. 83 depicts the Voltage Periphery Buffer circuit, VPERBUF. P-channel transistor 83:M17, P-channel transistor 83:M18, and N-channel transistor 83:M19 are connected in series respectively between VDDREF and VSSRG. The gate of 83:M17 is connected to BIAS1. The gate of 83:M18 is connected to BIAS2. The gate of 83:M19 is connected to Node 83:N5. Node 83:N5 is the series connection between 83:M18 and 83:M19. P-channel transistor 83:MP20 and N-channel transistor 83:MN20 are connected in series and respectively biased between VDD and VSSRG. The gate of transistor 83:MP20 is connected to the series connection of 83:MP20 and 83:MN20. The gate of 83:MN20 is connected to the series connection of transistors 83:M18 and 83:M19.

In FIG. 83, P-channel transistor 83:M1 and N-channel transistor 83:M3 and connected in series respectively between VDD and Node 83:N3. P-channel transistor 83:M2 and N-channel transistor 83:M4 are connected in series respectively between VDD and Node 83:N3. The gates of P-channel transistor 83:M1 and 83:M2 are connected together and are connected to the series connection between 83:M1 and 83:M3. The gate of 83:M3 is connected to VPR. The gate of 83:M4 is connected to VPRP. N-channel transistor 83:M5 couples Node 83:N3 to VSSRG. The gate of 83:M5 is connected to Node 83:N5.

In the Voltage Array Periphery circuit VPERBUF illustrated in FIG. 83, N-channel transistors 83:M16, 83:M20, and 83:M15 are connected respectively between VDD and VSSRG. The gate of 83:M16 is connected to VPRP. The gate of 83:M20 is connected to the series connection between 83:M16 and 83:M20. The gate of 83:M20 is also connected to one terminal of SWITCH 83:X1. The other terminal of SWITCH 83:X1 is connected to the series connection between transistors 83:M20 and 83:M15. The gate of 83:M15 is connected to Node 83:N5. N-channel transistors 83:M13, 83:M21, and 83:M14 are also connected in series and respectively biased between VDD and VSSRG. The gate of 83:M13 is connected to VPR. The gate of 83:M21 is connected to the series connection between 83:M13 and 83:M21. The gate of 83:M21 is also connected to one terminal of SWITCH 83:X2. The other terminal of SWITCH 83:X2 is connected to Node 83:N8 that is connected to the series connection between transistors 83:M21 and 83:M14. The gate of transistor 83:M14 is connected to Node 83:N5.

Still referring to FIG. 83, N-channel transistor 83:M7 and P-channel transistor 83:M8 are connected in series respectively between VSSRG and Node 83:N9. N-channel transistor 83:M6 and P-channel transistor 83:M11 are connected in series respectively between VSSRG and Node 83:N9. The gates of N-channel transistors 83:M7 and 83:M6 are connected together and are connected to the series connection between transistors 83:M7 and 83:M8. The gate of 83:M8 is connected to Node 83:N8. The gate of 83:M11 is connected to the series connection between 83:M20 and 83:M15. P-channel transistor 83:M12 couples Node 83:N9 to VDD. The gate of P-channel transistor 83:M12 is connected to the series connection between 83:MP20 and 83:MN20. The substrate of P-channel transistor 83:M17 is connected to VDDREF. The substrate of P-channel transistor 83:M18 is connected to node 83:N4.

In FIG. 83, P-channel transistor 83:M9 and N-channel transistor 83:M10 are connected in series and respectively biased between VDD and VSSRG. The gate of P-channel transistor 83:M9 is connected to the series connection between P-channel transistor 83:M2 and N-channel transistor 83:M4. The gate of N-channel transistor 83:M10 is connected to the series connection between P-channel transistor 83:M11 and N-channel transistor 83:M6. The series connection between transistors 83:M9 and 83:M10 is connected to the output VPR. Capacitor 83:CC has one terminal connected to the gate of N-channel transistor 83:M3 (connected to VPR) and the other connected to VSSRG. The substrate terminals of P-channel transistors 83:M8 and 83:M11 are connected to node 83:N9.

FIG. 84 illustrates the Voltage Array Driver circuit, VARYDRV. P-channel transistor 84:M1 and N-channel transistor 84:M3 are connected in series respectively between VDD and Node B4:N3. P-channel transistor 84:M2 and N-channel transistor 84:M4 are connected in series respectively between VDD and Node 84:N3. The gates of P-channel transistors 84:M1 and 84:M2 are connected together and are connected to the series connection between 84:M1 and 84:M3. The gate of 84:M3 is connected to Node 84:VARY0. The gate of 84:M4 is connected to VAR. N-channel transistors 84:M5 and 84:M5B are connected in parallel between Node 84:N3 and VSSRG. The gate 84:M5 is connected to VRCTLAO. The gate of 84:M5B is connected to the common terminal of SWITCH 84:X2. The A terminal of SWITCH 84:X2 is connected to VSSRG. The B terminal of SWITCH 84:X2 is connected to VRCTLAO.

In the Voltage Array Driver circuit of FIG. 84, P-channel transistor 84:M6, P-channel transistor 84:M7, and N-channel transistor 84:M8 are connected in series respectively between VDD and VSSRG. The gate of transistor 84:M6 is connected to VRCTLA0. The gate of 84:M7 and 84:M8 are connected together and connected to TLSCSLH. The series connection between 84:M7 and 84:M8 is connected to the series connection between 84:M2 and 84:M4 at Node 84:N6.

In FIG. 84, VDD is connected to the B terminal of SWITCH 84:X4. The A terminal of SWITCH 84:X4 is connected to Node 84:N6. The common terminal of SWITCH X4 is connected to the gate of P-channel transistor 84:M9B. Transistor 84:M9B is connected between VDD and the output VARY. The B terminal of SWITCH 84:X3 is connected to VDD. The A terminal of SWITCH 84:X3 is connected to Node 84:N6. The common terminal of SWITCH 84:X3 is connected to the gate of P-channel transistor 84:M9C. Transistor 84:M9C is connected between VDD and the output VARY. P-channel transistor 84:M9 and N-channel transistor 84:M10 are connected in series respectively between VDD and VSSRG. The gate of transistor 84:M9 is connected to Node 84:N6. The gate of N-channel transistor 84:M10 is connected to VRCTLA0. The series connection between S4:M9 and 84:M10 is connected to the output VARY.

In the Voltage Array Driver circuit, VARYDRV of FIG. 84, P-channel transistor 84:M11 couples the output VARY to Node VARY0. The gate of P-channel transistor 84:M11 is connected to VSSRG. SWITCH 84:X1 is connected to the source and drain of transistor 84:M11. One terminal of the resistor 84:VARYRES is connected to the output VARY. The other terminal of resistor 84:VARYRES is connected to one terminal of capacitor 84:C1. The other terminal of capacitor 84:C1 is connected to VSS. All P-channel substrate connections are tied to VDD, in FIG. 84.

FIG. 85 illustrates the Voltage Periphery Driver circuit, VPERDRV. P-channel transistor 85:M1 and N-channel transistor 85:M3 are connected in series respectively between VDD and Node 85:N3. P-channel transistor 85:M2 and N-channel transistor 85:M4 are connected in series respectively between VDD and Node 85:N3. The gates of P-channel transistors 85:M1 and 85:M2 are connected together and are connected to the series connection between 85:M1 and 85:M3. The gate of 85:M3 is connected to Node 85:VPER10. The gate of 85:M4 is connected to VPR. N-channel transistors 85:M5 and 85:M5B are connected in parallel between Node 85:N3 and VSSRG. The gate of 85:M5 is connected to VRCTLP. The gate of 85:M5B is connected to the common terminal of SWITCH 85:X2. The A terminal of SWITCH 85:X2 is connected to VSSRG. The B terminal of SWITCH 85:X2 is connected to VRCTLP.

In the Voltage Periphery Driver circuit of FIG. 85, P-channel transistor 85:M6, P-channel transistor 85:M7, and N-channel transistor 85:M8 are connected in series respectively between VDD and VSSRG. The gate of transistor 85:M6 is connected to VRCTLP. The gates of 85:M7 and 85:M8 are connected together and connected to TLSCSLH. The series connection between 85:M7 and 85:M8 is connected to the series connection between 85:M2 and 85:M4 at Node 85:N6.

In FIG. 85, VDD is connected to the B terminal of SWITCH 85:X4. The A terminal of SWITCH 85:X4 is connected to Node 85:N6. The common terminal of SWITCH 85:X4 is connected to the gate of P-channel transistor 85:M9B. Transistor 85:M9B is connected between VDD and the output VPERI. The B terminal of SWITCH 85:X3 is connected to VDD. The A terminal of SWITCH 85:X3 is connected to Node 85:N6. The common terminal of SWITCH 85:X3 is connected to the gate of P-channel transistor 85:M9C. Transistor 85:M9C is connected between external VDD and the output VPERI. P-channel transistor B5:M9 and N-channel transistor 85:M10 are connected in series respectively between VDD and VSSRG. The gate of transistor 85:M9 is connected to Node 85:N6. The gate of N-channel transistor 84:M10 is connected to VRCTLP. The series connection between 85:M9 and 85:M10 is connected to output VPERI.

In the Voltage Array Periphery circuit, VPERDRV of FIG. 85, P-channel transistor 85:M11 couples the output VPERI to Node VPERI0. The gate of P-channel transistor 85:M11 is connected to VSSRG. SWITCH 85:X1 is connected to the source and drain of transistor 85:M11. One terminal of the resistor 85:VPERRES is connected to the output VPERI. The other terminal of resistor 85:VPERRES is connected to one terminal of capacitor 85:C1. The other terminal of capacitor 85:C1 is connected to VSS. All the P-channel substrate connections in FIG. 85 are tied to VDD.

FIG. 86 illustrates the Voltage Array Standby Circuit, VARYDRVS. P-channel transistor 86:M1 and N-channel transistor 86:M3 are connected in series respectively between VDD and Node 86:N3. P-channel transistor 86:M2 and N-channel transistor 86:M4 are connected in series respectively between VDD and Node 86:N3. The gates of P-channel transistors 86:M1 and 86:M2 are connected together and connected to the series connection between 86:M1 and 86:M3. The gate of 86:M3 is connected to Node 86:VARYS. The gate of 86:M4 is connected to VAR. Node 86:N3 is coupled to VSSRG through parallel connected N-channel transistors 86:M5 and 86:M5B. The gate of 86:M5 is connected to VRCTLS. The gate of 86:M5B is connected to the common terminal of SWITCH 86:X3. The A terminal of 86:X3 is connected to VSSRG. The B terminal of 86:X3 is connected to VRCTLS.

In FIG. 86, P-channel transistor 86:M6 is connected between external VDD and the series connection between transistors 86:M2 and 86:M4 at Node 86:N6. The gate of transistor 86:M6 is connected to VRCTLS. P-channel transistor 86:M9 and N-channel transistor 86:M10 are connected in series respectively between VDD and VSSRG. The gate of transistor 86:M9 is connected to Node 86:N6. The gate of transistor 86:M10 is connected to VRCTLS. The series connection between transistors 86:M9 and 86:M10 is connected to the output VARY and to one terminal of SWITCH 86:X1. The other terminal of SWITCH 86:X1 is connected to Node 86:VARYS. The B terminal of SWITCH 86:X2 is connected to Node 86:N6. The A terminal of 86:X2 is connected to VDD. The common terminal of SWITCH 86:X2 is connected to the gate of P-channel transistor 86:M9B. Transistor 86:M9B couples VDD to the output VARY.

FIG. 87 illustrates the Voltage Periphery Driver Standby Circuit, VPERDRVS. P-channel transistor 87:M1 and N-channel transistor 87:M3 are connected in series respectively between VDD and Node 87:N3. P-channel transistor 87:M2 and N-channel transistor 87:M4 are connected in series respectively between VDD and Node 87:N3. The gates of P-channel transistors 87:M1 and 87:M2 are connected together and connected to the series connection between 87:M1 and 87:M3. The gate of 87:M3 is connected to Node 87:VPERIS. The gate of 87:M4 is connected to VPR. Node 87:N3 is coupled to VSSRG through parallel connected N-channel transistors 87:M5 and 87:M5B. The gate of 87:M5 is connected to VRCTLS. The gate of 87:M5B is connected to the common terminal of SWITCH 87:X3. The A terminal of 87:X3 is connected to VSSRG. The B terminal of 87:X3 is connected to VRCTLS.

In FIG. 87, P-channel transistor 87:M6 is connected between VDD and the series connection between transistors 87:M2 and 87:M4 at Node 87:N6. The gate of transistor 87:M6 is connected to VRCTLS. P-channel transistor 87:M9 and N-channel transistor 87:M10 are connected in series respectively between VDD and VSSRG. The gate of transistor 87:M9 is connected to Node 87:N6. The gate of transistor 87:M10 is connected to VRCTLS. The series connection between transistors 87:M9 and 87:M10 is connected to the output VPERI and to one terminal of SWITCH 87:X1. The other terminal of SWITCH 87:X1 is connected to Node 87:VPERIS. The B terminal of SWITCH 87:X2 is connected to Node 87:N6. The A terminal of 87:X2 is connected to VDD. The common terminal of SWITCH 87:X2 is connected to the gate of P-channel transistor 87:M9B. Transistor 87:M9B couples VDD to the output VPERI.

FIG. 88 depicts the Voltage Regulator Control Logic For Standby circuit, VRCTLS. Input PUD is connected to the A terminal of SWITCH 88:X2. The B terminal of SWITCH 88:X2 is connected to VPERI. The common terminal of SWITCH 88:X2 is connected to the gate of N-channel transistor 88:MN1. N-channel transistor 88:MN1 couples Node 88:N21 to VSSRG. One terminal of transistor 88:MPD is coupled to Node 88:N21. The other terminal of transistor 88:MPD is connected to the gate of 88:MPD and connected to VDD. The gate of transistor 88:MPC is connected to Node 88:N21. The source and drain of transistor 88:MPC is connected to VDD.

In the Voltage Regulator Control Logic For Standby, VRCTLS circuit of FIG. 88, P-channel transistor 88:MP couples Node 88:N21 to external VDD. The gate of transistor 88:MP is connected to Node 88:N22. Node 88:N22 is connected to one terminal of capacitor 88:CG. The other terminal of capacitor 88:CG is connected to VSS. P-channel transistor 88:MPH and low threshold voltage N-channel transistor 88:MNH are connected in series and biased respectively between VDD and VSSRG. Their gates are connected to Node 88:N21. Their series connection is connected to Node 88:N22. Node 88:N22 is connected to the input of the inverter 88:XIV3. Inverter 88:XIV3 is biased by VDD. The output of Node 88:XIV3 is connected to RIDH.

In the Voltage Regulator Control Logic For Standby circuit, VRCTLS of FIG. 80, signals TLSCSLL_ and VBBOL_ are connected to NAND gate 88:XND1. The output of NAND gate 88:XND1 is connected to an input of NOR gate 88:XNOR10 and is coupled through inverter 88:XIV27 to the first input of NOR gate 88:XNOR11. The output of NOR gate 88:XNOR10 is connected to the input of NOR gate 88:XNOR11 and the output of NOR gate 88:XNOR11 is connected to the first input of NOR gate 88:XNOR10. NOR gates 88:XNOR10 and 88:XNOR11 are biased by VDD. The output of NOR gate 88:XNOR10 is connected to the first input of NOR gate 88:XNOR1. The other input of NOR gate 88:NOR1 is the signal RIDH. The output of NOR gate 88:XNOR1 is coupled through inverter 88:XIV28 to the B terminal of the SWITCH 88:XS3. Both NOR gate 88:XNOR1 and inverter 88:XIV28 are biased by VDD. The A terminal of SWITCH 88:XS3 is connected to VDD. The C terminal of SWITCH 88:XS3 is connected to VSSRG. The common terminal of SWITCH 88:XS3 is connected to VRCTLS. P-channel transistor 88:MPVPERI has its gate connected to VDD, the transistor is coupled between node 88:N3 and voltage VSSRG. The substrate is connected to VDD. Switch 88:X1 connects node 88:N3 to voltage VPERI.

FIG. 88.1 illustrates the Voltage Regulator Control Logic For Array circuit, VRCTLA. Signals RL2 and TLRCOPY are connected to the inputs of NOR gate 88.1:XNOR1. NOR gate 88.1:XNOR1 is biased by VPERI. Its output is coupled through inverter 88.1:XIV2 to Node 88.1:N17. Inverter 88.1:XIV2 is biased by VPERI. Node 88.1:N17 is connected to the input of delay stage 88.1:X1, the B terminals of SWITCHES 88.1:XS1 through 88.1:XS4, and to the B terminal of SWITCH 88.1:XS5. The output of delay stage 88.1:X1 is connected to the A terminal of SWITCH 88.1:XS1. The common terminal of SWITCH 88.1:XS1 is connected to the input of delay stage 88.1:X2. The output of delay stage 88.1:X2 is connected to the input of SWITCH 88.1:XS2. The common terminal of SWITCH 88.1:XS2 is connected to the input of delay stage 88.1:X3. The output of delay stage 88.1:X3 is connected to the A terminal of SWITCH 88.1:XS3. The common terminal of SWITCH 88.1:XS3 is connected to the input of delay stage 88.1:X4. The output of delay stage 88.1:X4 is connected to the A terminal of SWITCH 88.1:XS4. The common terminal of SWITCH 88.1:XS4 is connected to the input of delay stage 88.1:X5. The output of delay stage 88.1:X5 is connected to the A terminal of SWITCH 88.1:XS5.

In the Voltage Regulator Control Logic Array circuit, VRCTLA of FIG. BB.1, the common terminal of SWITCH 88.1:XS5 is connected to one input of NAND gate 88.1:XND3. The other input of NAND gate 88.1:XND3 is the output of NAND gate 88.1:XND2. The output of NAND gate 88.1:NXD3 is connected to an input of NAND gate 88.1:XND2. The other input to NAND gate 88.1:ND2 is RLEN_0. The output of NAND gate 88.1:XND2 is connected to the input of three-input NAND gate 88.1:XND1. The other inputs to NAND gate 88.1:XND1 are TLSCSLL_ and VBBOL_. The output of NAND gate 88.1:XND1 is connected to one input of three-input NOR gate 88.1:XNOR9 and is coupled through inverter 88.1:XIV19 to one input of NOR gate 88.1:XNOR8. The output of NOR gate 88.1:XNOR9 is connected to the other input of NOR gate 88.1:XNOR8. The output of NOR gate 88.1:XNOR8 is connected to another input of NOR gate 88.1:XNOR9. The third input to three-input NOR gate 88.1:XNOR9 is RIDH. NOR gate 88.1:XNOR8 and 88.1:XNOR9 are biased by VDD. The output of NOR gate 88.1:XNOR8 is coupled through inverter 88.1:XIV1 to the B terminal of SWITCH 88.1:XS6. The A terminal of SWITCH 88.1:XS6 and inverter 88.1:XIV1 are connected to VDD. The C terminal of SWITCH 88.1:XS6 is connected to VSSRG. The common terminal of SWITCH 88.1:XS6 is connected to VRCTLAO.

FIG. 88.2 illustrates the Voltage Regulator Control Logic Circuit for the Periphery, VRCTLP. RL2 is connected to the B terminal of switches 88.2:XS2 through 88.2:XS5. It is connected to the A terminal of SWITCH 88.2:XS1 and to the input of delay stage 88.2:X1. The output of delay stage 88.2:X1 is connected to the B terminal of SWITCH 88.2:XS1. The common terminal of SWITCH 88.2:XS1 is connected to the input of delay stage 88.2:X2. The output of the delay stage 88.2:X2 is connected to the A terminal of SWITCH 88.2:XS2. The common terminal of SWITCH 88.2:XS2 is connected to the input of delay stage 88.2:X3. The output of delay stage 88.2:X3 is connected to the A terminal of SWITCH 88.2:XS3. The common terminal of SWITCH 88.2:XS3 is connected to the input of delay stage 88.2:X4. The output of delay stage 88.2:X4 is connected to the A terminal of SWITCH 88.2:XS4. The common terminal of SWITCH 88.2:XS4 is connected to the input of delay stage 88.2:X5. The output of delay stage 88.2:X5 is connected to the A terminal of SWITCH 88.2:XS5.

In FIG. 88.2, the common terminal of SWITCH 88.2:XS5 is connected to one input of NAND gate 88.2:XND3. The other input of NAND gate 88.2:XND3 is the output of NAND gate 88.2:XND1. The output of NAND gate 88.2 XND3 is input to NAND gate 88.2:XND1. The other input to NAND gate 88.2:XND1 is RL1_. The output of NAND gate 88.2:XND1 is one input to three-input NAND gate 88.2:XND2. The other two inputs to NAND gate 88.2:XND2 are TLSCSLL_ and VBB0L_.

In the Voltage Regulator Control Logic for Periphery circuit of FIG. 88.2, the output of NAND gate 88.2:XND2 is connected to one input of three-input NOR gate 88.2:XNOR7 and is coupled through inverter 88.2:XIV12 to one input of NOR gate 88.2:XNOR6. The other input to NOR gate 88.2:XNOR6 is the output of NOR gate 88.2:XNOR7. The output of NOR gate 88.2:XNOR6 is another input to NOR gate 88.2:XNOR7. Input signal RIDH is the first input to three input NOR gate 88.2:XNOR7. NOR gates 88.2XNOR6 and 88.2:XNOR7 are biased by VDD. The output of NOR gate 88.2:XNOR6 is also coupled through inverter 88.2:XIV1 to the B terminal of SWITCH 88.2:XS6. The A terminal of SWITCH 88.2:XS6 and the inverter 88.2:XIV1 are biased by VDD. The C terminal of SWITCH 88.2XS6 is connected to VSSRG. The common terminal of SWITCH 88.2:XS6 is connected to VRCTLP.

FIG. 88.3 shows the Voltage Regulator Control Logic for Control circuit, VRCTLC. Input EXTVEX_ is connected to the input of inverter 88.3:XIV5. The input of inverter 88.3:XIV5 is coupled to VPERI by P-channel transistor 88.3:MP1. The gate of transistor 88.3:MP1 is connected to VSSRG. The output of inverter 88.3:XIV5 is connected to an input of NOR gate 88.3:XNOR1. The other input to NOR gate 88.3:XNOR1 is TLSCSL. The output of NOR gate 88.3:XNOR1 is input to NOR gate 88.3:XNOR7. The other input of NOR gate 88.3:XNOR7 is the common terminal of SWITCH 88.3:XS1. The output of NOR gate 88.3:XNOR7 is coupled through inverter 88.3:XIV1 to the A terminal of SWITCH 88.3:XS4. The B terminal of SWITCH 88.3:XS4 is connected to VPERI. The common terminal of SWITCH 88.3:XS4 is connected to signal TLSCSLL_.

In FIG. 88.3, the output of NOR gate 88.3:XNOR7 is input to NOR gate 88.3:XNOR2 and is coupled through inverter 88.3:XIV2 to one input of three-input NOR gate 88.3:XNOR3. Another input to NOR gate 88.3:XNOR3 is the signal RIDH. The third input to NOR gate 88.3:XNOR3 is the output of NOR gate 88.3:XNOR2. The other input to NOR gate 88.3:XNOR2 is the output of NOR gate 88.3:XNOR3. Both NOR gates 88.3:XNOR2 and 88.3:XNOR3 are biased by VDD. The output of NOR gate 88.3:XNOR3 is also coupled through inverters 88.3:XIV3 and 88.3:XIV6 to the B terminal of 88.3:XS3. Inverters 88.3:XIV3 and 88.2:XIV6, and the A terminal of SWITCH 88.3:XS3 are biased by VDD. The C terminal of SWITCH 88.3:XS3 is connected to VSSRG. The common terminal of SWITCH 88.3:XS3 is connected to TLSCSLH.

In FIG. 88.3, RIDH is coupled through inverter 88.3:XIV9 to one input of NAND gate 88.3:XND1. The other input of NAND gate 88.3:XND1 is VBBO. The output of NAND gate 88.3:XND1 is connected to the A terminal of SWITCH 88.3:XS2 and is coupled through inverter 88.3:XIV7 to the A terminal of SWITCH 88.3:XS1. The B terminal of SWITCH 88.3:XS1 is connected to VSSRG. The B terminal of SWITCH 88.3:XS2 is connected to VPERI. The common terminal of SWITCH 88.3:XS2 is connected to VBBOL_.

FIG. 89 depicts the Voltage Regulator VBBO Level Detector circuit, VRBBBO. P-channel transistor 89:MP1 and N-channel transistor 89:MN1 are connected in series respectively between VPERI and VBB. The gate of P-channel transistor 89:MP1 is connected to VSSRG. The gate of N-channel transistor 89:MN1 is connected to the series connection between the transistors. P-channel 89:MP2 and low threshold voltage N-channel transistor 89:MN2 are connected in series between VPERI and VSSRG. The gate of P-channel transistor 89:MP2 and the gate of N-channel transistor 89:MN2 are connected to the series connection of transistors 89:MP1 and 89:MN1. Inverter 89:XIV1 is biased by VPERI and its input is connected to the series connection of transistors 89:MP2 and 89:MN2. The output of inverter 89:XIV1 is connected to one terminal of SWITCH 89:SW1. The other terminal of SWITCH 89:SW1 is connected to the input of inverter 89:XIV2 and is connected to one terminal of SWITCH 89:SW2. The other terminal of SWITCH 89:SW2 is connected to VSSRG. The output of inverter 89:XIV2 is connected to the input of inverter 89:XIV3. The output of inverter 89:XIV3 is connected to VBBO. Both inverters 89:XIV2 and 89:XIV3 and biased by VPERI.

FIG. 90 depicts the Voltage Bit Line Reference circuit VBLR. P-channel transistor 90:MP6 is connected between VARY and Node 90:EXTBLRDIS. The gate of transistor 90:MP6 is connected to VSSRG. The input of inverter of 90:IV1 is connected to Node 90:EXTBLRDIS. The output of inverter 90:IV1 is connected to Node 90:N2. Inverter 90:IV1 is biased by VARY. N-channel transistor 90:MN8 is connected between 90:EXTVLRDIS and VSS. The gate of transistor 90:MN8 is connected to BLRDIS. The gate of P-channel transistor 90:MP7 is connected to Node 90:EXTBLRDIS. Transistor 90:MP7 is connected between VARY and Node 90:EXTBLRREF. Transistor 90:MP1 is connected between VARY and 90:EXTBLRREF. The gate of transistor 90:MP1 is also connected to Node 90:EXTBLRREF. Transistor 90:MP2 is connected between Node 90:EXTBLRREF and VSS. The gate of transistor 90:MP2 is connected to VSSRG.

In FIG. 90, one terminal of P-channel transistor 90:MP3 is connected to VARY. Transistor 90:MP3 is connected in series with N-channel transistor 90:MN1, P-channel transistor 90:MP4, and N-channel transistor 90:MN2. The other terminal of transistor 90:MN2 is connected to VSS. The gates of P-channel transistor 90:MP3 and N-channel transistor 90:MN2 are connected to Node 90:EXTBLRREF. Node 90:EXTBLRREF is also connected to the series connection between transistor 90:MN1 and transistor 90:MP4. The gate of N-channel transistor 90:MN1 is connected to the series connection between transistors 90:MP3 and 90:MN1 at Node 90:BLRPVTN. The gate of transistor 90:MP4 is connected to Node 90:BLRMVTP. The gate of P-channel transistor 90:MP5 is connected to Node 90:EXTBLRDIS. One terminal of P-channel transistor 90:MP5 is connected to the series connection between transistor 90:MN1 and 90:MP4. The other terminal of transistor 90:MP5 is connected to the gate of transistor 90:MP4 at Node BLRMVTP. Node 90:BLRMVTP is also connected to the series connection between transistors 90:MP and 90:MN2.

In the Voltage Bit Line Reference circuit VBLR of FIG. 90, the gate of N-channel transistor 90:MN6 is connected to Node 90:BLRPVTN. The source and drain of transistor 90:MN6 are connected together and connected to VSSRG. N-channel transistor 90:MN5 is connected between Node 90:BLRPVTN and VSS. The gate of transistor 90:MN5 is connected to Node 90:N2. Node 90:BLRPVTN is also connected to the gates of the N-channel transistors of parallel loop device 90:MNBLR. Parallel loop device 90:MNBLR is connected between VARY and node 90:N1. The gate of N-channel transistor 90:MN7 is connected to Node 90:BLRMVTP. The other terminal of N-channel transistor 90:MN7 is connected to VSSRG. Node 90:BLRMVTP is also connected to the gates of P-channel transistors of parallel loop device 90:MPBLR. Parallel device 90:MPBLR is connected between Node 90:N1 and VSS. MNBLR and MPBLR are parallel devices whose transistors are repeated by a number of loop counts. In the preferred embodiment, the loop count for 90:MNBLR and 90:MPBLR is 36.

In FIG. 90, N-channel transistor 90:MN4 is connected between the output BLR and VSS. The gate of 90:MN4 is connected to TPLHO. Transistor 90:MN3 is connected between the output BLR and Node 90:N1. The gate of transistor 90:MN3 is connected to TPLHO_.

FIG. 90.1 illustrates the Bit Line Reference Switch circuit, BLRSW. In FIG. 90.1, inverter 90.1:IV1 is connected to signal PUD. The output of inverter 90.1:IV1 is connected to the set input of RS LATCH 90.1:XRS. The Q_ output of LATCH 90.1:XRS is connected to the output BLRDIS. Output BLRDIS is connected to one input of NAND gate 90.1:ND1. The other input of NAND gate 90.1:ND1 is the output of NAND gate 90.1:ND2. One input to NAND gate 90.1:ND2 is the output of the NAND gate 90.1:ND1. P-channel transistor 90.1:MP7 is connected between VPERI and the other input of NAND gate of 90.1:ND2 at Node 90.1:N7. The gate of P-channel transistor 90.1:MP7 is connected to the Q_ output of LATCH 90.1:XRS.

In the Bit Line Reference Switch circuit, BLRSW of FIG. 90.1, one input of NAND gate 90.1:ND3 is connected to Node 90.1:N6. The other input to NAND gate 90.1:ND3 is signal PBOSC. The output of NAND gate 90.1:ND3 is coupled through inverter 90.1:IV2 to the source and drain of N-channel tansistor 90.1:MC12, and, the output of NAND gate 90.1:ND3 is connected to the source and drain of N-channel transistor 90.1:MC11. The gate of transistor 90.1:MC11 is connected to Node 90.1:N11. The gate of N-channel transistor 90.1:MC12 is connected to 90.1:N12. N-channel transistor 90.1:MN11 is connected between 90.1:N6 and Node 90.1:N11. Its gate is coupled to VPERI. N-channel transistor 90.1:MN12 is connected between Node 90.1:N6 and Node 90.1:N12. Its gate is connected to VPERI. Node 90.1:N11 is connected to the gate of N-channel transistor 90.1:MBLRB. Node 90.1:N12 is connected to the gate of N-channel transistor 90.1:MBLRC. One terminal of N-channel transistors 90.1:MBLRB and 90.1:MBLRC are connected together and they are connected to one terminal of N-channel transistor 90.1:MBLRA that is connected to the input BLR. The other terminal of the N-channel transistor 90.1:MBLRB and 90.1:MBLRC are connected together, and, they are connected to the other terminal of N-channel transistor 90.1:MBLRA that is connected to the output EXTBLR.

In FIG. 90.1, N-channel transistors 90.1:MN8A and 90.1:MN8B are serially connected respectively between VPERI and VSS. The gate of 90.1:MN8A is connected to the signal BLRDIS. The gate of 90.1:MN8B is connected to the Q output of LATCH 90.1:XRS. The series connection between transistors 90.1:MN8A and 90.1:MN8B is connected to the gate of N-channel transistor 90.1:MN7. Transistor 90.1:MN7 is connected between Node 90.1:N7 and EXTBLR. The gate of N-channel transistor 90.1:MBLRA is connected to the Q output of SWITCH 90.1:XRS.

In the Bit Line Reference Switch Circuit of FIG. 90.1, N-channel transistors 90.1:MN1, 90.1:MN2, and 90.1:MN3 are connected in series between the reset input of SWITCH 90.1:XRS and EXTBLR. The gate of 90.1:MN1 is connected to the series connection of 90.1:MN1 and 90.1:MN2. The gate of 90.1:MN2 is connected to the series connection of 90.1:MN2 and 90.1:MN3. The gate of 90.1:MN3 is connected to EXTBLR. N-channel transistor 90.1:MNS is connected between the reset input of SWITCH 90.1:XRS and VSS. Its gate is connected to VPERI.

FIG. 90.2 illustrates the Voltage Top Plate circuit, VPLT. P-channel transistor 90.2:MP6 is connected between VARY and Node 90.2:EXTPLTDIS. The gate of transistor 90.2:MP6 is connected to VSSRG. The input of inverter of 90.2:IV1 is connected to Node 90.2:EXTPLTDIS. The output of inverter 90.2:IV1 is connected to Node 90.2:N2. Inverter 90.2:IV1 is biased by VARY. N-channel transistor 90.2:MN8 is connected between 90.2:EXTPLTDIS and VSS. The gate of transistor 90.2:MN8 is connected to VPLTDIS. The gate of P-channel transistor 90.2:MP7 is connected to Node 90.2:EXTPLTDIS. Transistor 90.2:MP7 is connected between VARY and Node 90.2:EXTPLTREF. Transistor 90.2:MP1 is connected between VARY and 90.2:EXTPLTREF. The gate of transistor 90.2:MP1 is also connected to Node 90.2:EXTPLTREF. Transistor 90.2:MP2 is connected between Node 90.2:EXTPLTREF and VSS. The gate of transistor 90.2:MP2 is connected to VSSRG.

In FIG. 90.2, one terminal of P-channel transistor 90.2:MP3 is connected to VARY. Transistor 90.2:MP3 is connected in series with N-channel transistor 90.2:MN1, P-channel transistor 90.2:MP4, and N-channel transistor 90.2:MN2. The other terminal of transistor 90.2:MN2 is connected to VSS. The gates of P-channel transistor 90.2:MP3 and N-channel transistor 90.2:MN2 are connected to Node 90.2:EXTPLTREF. Node 90.2:EXTPLTREF is also connected to the series connection between transistor 90.2:MN1 and transistor 90.2:MP4. The gate of N-channel transistor 90.2:MN1 is connected to the series connection between transistors 90.2:MP3 and 90..2:MN1 at Node 90.2: VPLTPVTN. The source and drain of transistor 90.2:MN6 connected together and connected to VSSRG. The gate of transistor 90.2:MN6 is connected to node 90.2:VPLTPVTN. N-channel transistor 90.2:MN5 is connected between Node 90.2:VPLTPVTN and VSS. The gate of transistor 90.2:MN5 is connected to Node 90.2:N2. Node 90.2:VPLTPVTN is also connected to the gates of the N-channel transistors of parallel device 90.2:MNPLT. Parallel device 90.2:MNPLT is connected between VARY and Node 90.2:N1. The gate of N-channel transistor 90.2:MN7 is connected to Node 90.2:VPLTMVTP. The source and drain of transistor 90.2:MN7 are connected together and connected to VSSRG. Node 90.2:VPLTMVTP is also connected to the gates of P-channel transistors of parallel device 90.2:MPPLT. Parallel device 90.2:MPPLT is connected between Node 90.2:N1 and VSS. MNPLT and MPPLT are parallel devices whose transistors are repeated by a number of loop counts. In the preferred embodiment, the loop count for 90.2:MNPLT and 90.2:MPPLT is 36.

One terminal of P-channel transistor 90.2:MP5 is connected to node 90.2:EXTPLTREF and the other terminal to node 90.2:VPLTMVTP. The gate of transistor 90.2:MP5 is connected to node 90.2:EXTPLTDIS. The gate of P-channel transistor 90.2:MP4 is connected to node 90.2:VPLTMVTP. Node 90.2:VPLTMVTP is connected to the series connection between transistors 90.2:MP4 and 90.2:MN2.

In FIG. 90.2, N-channel transistor 90.2:MN4 is connected between the output VPLT and VSS. The gate of 90.2:MN4 is connected to TPLHO. Transistor 90.2:MN3 is connected between the output VPLT and Node 90.2:N1. The gate of transistor 90.2:MN3 is connected to TPLHO_.

FIG. 90.3 illustrates the Voltage Top Plate Switch circuit, VPLTSW. NOR gate 90.3:NR2 is connected to TLTPL0 and TLTPH1. The output of NOR gate 90.3:NR2 is coupled through inverter 90.3:IV4 to Node 90.3:N16. Node 90.3:N16 is coupled through delay stage 90.3:XDL4 and inverter 90.3:IV6 to an input of NOR gate 90.3:NR3. The other input of NOR gate 90.3:NR3 is connected to node 90.3:N16. The output of NOR gate 90.3:NR3 is connected to NOR gate 90.3:NR4. The other input to NOR gate 90.3:NR4 is the signal PUD. The output of NOR gate 90.3:NR4 is coupled through inverter 90.3:IV1 to the set input of LATCH 90.3:XRS. Three-input NOR gate 90.3:NR1 is connected to input signal TLTPL0, input signal TLTPH1, and Node 90.3:N3. The output of NOR gate 90.3:NR1 is coupled through inverter 90.3:IV3 to the reset input of LATCH 90.3:XRS. The output of LATCH 90.3:XRS is connected to VPLTDIS. The Q_ output of LATCH 90.3:XRS is connected to Node 90.3:N4. Input signal TLTPH1 is coupled through inverter 90.3:IV5 to the gate of P-channel transistor 90.3:MPPLT. Input signal TLTPL0 is connected to the gate of N-channel transistor 90.3:MNPLT. Transistors 90.3:MPPLT and 90.3:MNPLT are connected in series and respectively biased between VARY and VSS. Their series connection is connected to VPLT.

In the Voltage Top Plate Switch circuit, VPLTSW of FIG. 90.3, P-channel transistor 90.3:MP7 and N-channel transistor 90.3:MN7A are connected in series and respectively biased between VPERI and VSS. The gate of 90.3:MP7 is connected to VPLTDIS. The gate of 90.3:MN7A is connected to Node 90.3:N16. Their series connection is connected to Node 90.3:N7. One input of NAND gate 90.3:ND2 is connected to Node 90.3:N7. The other input of NAND gate 90.3:ND2 is the output of NAND gate 90.3:ND1. The output of NAND gate 90.3:ND2 and node 90.3:N6 is connected to the input of NAND gate 90.3:ND1. The other input to NAND gate 90.3:ND1 is VPLTDIS. In FIG. 90.3, Node 90.3:N6 is connected to one input of NAND gate 90.3:ND3. The other input to NAND gate 90.3:ND3 is PBOSC. The output of the NAND gate 90.3:ND3 is connected to the source and drain of N-channel transistor 90.3:MC11, and, the output of NAND gate 90.3:ND3 is coupled through inverter 90.3:IV2 to the source and drain of N-channel transistor 90.3:MC12. The gate of transistor 90.3:MC11 is connected to Node 90.3:N11. The gate of transistor 90.3:MC12 is connected to Node 90.3:N12. N-channel transistor 90.3:MN11 is connected between Node 90.3:N6 and Node 90.3:N11. Its gate is connected to VPERI. N-channel transistor 90.3:MN12 is connected between Node 90.3:N6 and Node 90.3:N12. Its gate is connected to VPERI. The gate of N-channel transistor 90.3:MPLTB is connected to Node 90.3:N11. The gate of N-channel transistor 90.3:MPLTC is connected to Node 90.3:N12. One terminal of transistor 90.3:MPLTB and one terminal of transistor 90.3:MPLTC are connected together and connected to one terminal of N-channel transistor 90.3:MPLTA that is connected to VPLT. The other terminal of transistor 90.3:MPLTB and the other terminal of transistor 90.3:MPLTC are connected together and connected to the other terminal of transistor 90.3:MPLTA that is connected to the output EXTVPLT.

In FIG. 90.3, N-channel transistors 90.3:MN8A and 90.3:MN8B are connected in series and biased respectively between VPERI and VSS. The gate of 90.3:MN8A is connected to VPLTDIS. The gate of 90.3:MN8B is connected to the Q output of LATCH 90.3:XRS and to the gate of 90.3:MPLTA. The series connection of 90.3:MN8A and 90.3:MN8B is connected to the gate of N-channel transistor 90.3:MN7. Transistor 90.3:MN7 is connected between node 90.3:N7 and EXTVPLT. N-channel transistors 90.3:MN1, 90.3:MN2, and 90.3MN3 are connected in series respectively between node 90.3:N3 and EXTVPLT. The gate of 90.3:MN1 is connected to the series connection of 90.3:MN1 and 90.3:MN2. The gate of 90.3:MN2 is connected to the series connection of 90.3:MN2 and 90.3:MN3. The gate of 90.3:MN3 is connected to EXTVPLT. N-channel transistor 90.3:MNS is connected between Node 90.3:N3 and VSS. Its gate is connected to VPERI.

FIG. 90.4 illustrates the Burn In Hold Off circuit, BIHO. VLP is connected to the B terminal of SWITCH 90.4:X3. The A terminal of 90.4:X3 is connected to VSSRG. The common terminal of SWITCH 90.4:X3 is connected to the gate of N-channel transistor 90.4:MN1. N-channel transistor 90.4:MN1 couples Node 90.4:N121 to VSSRG. P-channel transistor 90.4:MPD couples Node 90.4:N121 to external VDD. The gate of transistor 90.4:MPD is connected to VDD. Node 90.4:N121 is connected to the gate of P-channel transistor 90.4:MPC. The source and drain of transistor 90.4:MPC are connected to VDD. Node 90.4:N121 is connected to one terminal of P-channel transistor 90.4:MP. The other terminal of transistor 90.4:MP is connected to VDD. The gate of transistor 90.4:MP is connected to the Node 90.4:N2. Node 90.4:N121 is also connected to the gate of P-channel transistor 90.4:MPH and low threshold voltage N-channel transistor 90.4:MNH. P-channel transistor 90.4:MPH and N-channel transistor 90.4:MNH are serially connected respectively between VDD and VSSRG. This series connection is connected to Node 90.4:N22. Node 90.4:N22 is connected to one terminal of capacitor 90.4:CG. The other terminal of capicator 90.4:CG is connected to VSSRG. Node 90.4:N22 is coupled through inverter 90.4:XIV3 to Node 90.4:VLPD. Inverter 90.4:XIV3 is biased by VDD.

In the BIHO circuit of FIG. 90.4, P-channel transistors 90.4:MP1, 90.4:MP1, and N-channel transistor 90.4:MN1 are connected in series and respectively biased between VDD and VSSRG. The gate of P-channel transistor 90.4:MP1 and N-channel transistor 90.4:MN1 are both connected to Node 90.4:VLPD. The gate of P-channel transistor 90.4:MP1 is connected to the common terminal of SWITCH 90.4:X4. The A terminal of SWITCH 90.4:X4 is connected to external VDD. The B terminal of SWITCH 90.4:X4 is connected to the input BIAS3. The series connection of 90.4:MP1 and 90.4:MP1 is connected to one terminal of N-channel transistor 90.4:MN2. The other terminal of N-channel transistor 90.4:MN2 is connected to the series connection of 90.4:MP1 and 90.4:MN1 and Node 90.4:N1. The gate of transistor 90.4:MN2 is connected to the output of inverter 90.4:XIV2. The input of inverter 90.4:XIV2 is Node 90.4:VLPD. Inverter 90.4:XIV2 is biased by VDD. Node 90.4:N1 is connected to the gate of N-channel transistor 90.4:CD. The source and drain of N-channel transistor 90.4:CD are connected to VSSRG. Node 90.4:N1 is coupled through inverter 90.4:XIV1 to Node 90.4:BIHOP. Node 90.4:BIHOP is connected to the gate of P-channel transistor 90.4:MPK. Transistor 90.4:MPK is connected between VDD and Node 90.4:N1. Node 90.3:BIHOP is connected to the B terminal of SWITCH 90.4:X8. The A terminal of SWITCH 90.4:X8 is connected to VSSRG. The common terminal of SWITCH 90.4:X8 is connected to the output BIHO.

FIG. 90.5 illustrates the Voltage Reference Initialization circuit VREFINIT. N-channel transistor 90.5:MN1 is connected between Node 90.5:N1 and the input signal RID. The gate of transistor 90.5:MN1 is connected to VPERI. P-channel transistor 90.5:MP2 is connected between external VDD and Node 90.5:N1. The gate of P-channel transistor 90.5:MP2 is connected to VDD. P-channel transistor 90.5:MP3 is connected between VDD and Node 90.5:N1. The gate of P-channel transistor 90.5:MP3 is connected to Node 90.5:N2. The gates of P-channel tansistors 90.5:MP4 and 90.5:MP5 are connected to Node 90.5:N1. The source and drain of transistor 90.5:MP4 is connected to VDD. One terminal of transistor 90.5:MP5 is connected to VDD. The other terminal is connected to Node 90.5:N2. Node 90.5:N2 is connected to the gate of N-channel transistor 90.5:C1. The source and drain of transistor 90.5:C1 are connected to VSS. Node 90.5:N1 is connected to the gate of N-channel low threshold voltage transistor 90.5:MN6. Transistor 90.5MN6 is connected between Node 90.5:N2 and VSS. Node 90.5:N2 is connected to the input of inverter 90.5:IV1. The output of the inverter 90.5:IV1 is connected to Node 90.5:N3. Inverter 90.5:IV1 is biased by VDD.

In the Voltage Reference Initialization Circuit, VREFINIT of FIG. 90.5, Node 90.5:N3 is connected to the input of inverter 90.5:IV2. Inverter 90.5:IV2 is biased by VDD. Its output is connected to the inputs of NOR gate 90.5:NR1 and 90.5:NR2. BOSC_ is connected to the input of NOR gate 90.5:NR1 and is coupled to the input of NOR gate 90.5:NR2 through inverter 90.5:IV3. Inverter 90.5:IV3 and NOR gates 90.5:NR1 and 90.5:NR2 are biased by VDD. The output of NOR gate 90.5:NR1 is connected to Node 90.5:N8. The output of Node 90.5:NR2 is connected to 90.5:N6.

In FIG. 90.5, N-channel low threshold voltage transistor 90.5:MN7 is connected between Node 90.5:N3 and Node 90.5:N9. Its gate is connected to VDD. Node 90.5:N9 is connected to the gate of N-channel transistor 90.5:MN8. It's source and drain are connected to Node 90.5:N8. N-channel low threshold voltage transistor 90.5:MN9 is connected between VDD and VDDREF. It's gate is connected to Node 980.5:N9. N-channel low threshold voltage transistor 90.5:MN10 is connected between Node 90.5:N3 and Node 90.5:N7. Its gate is connected to VDD. Node 90.5:N7 is connected to the gate of N-channel transistor 90.5:MN11. The source and drain of transistor 90.5:MN11 are connected to Node 90.5:N6. Node 90.5:N7 is also connected to the gate of N-channel low threshold voltage transistor 90.5:MN12. Transistor 90.5:MN12 is connected between VDD and VDDREF. The gate of N-channel transistor 90.5:MNC13 is connected to VDDREF. The source and drain of transistor 90.5:MNC13 ar connected to VSSRG.

FIG. 90.6 illustrates the VDD Reference circuit, VDDREF. Signal PBOSC is coupled through inverter 90.6:IV1 to Node 90.6:N1. Node 90.6:N1 is coupled through the serially connected inverter 90.6:IV2, and delay stages 90.6:XD1, 90.6:XD2, and 90.6:XD3 to an input of NAND gate 90.6:ND1. Node 90.6:N1 is directly connected to the other input of NAND gate 90.6:ND1. Node 90.6:N1 is directly connected to one input of NOR gate 90.6:NR1. It is coupled through the serially connected delay stages 90.6:XD4, 90.6:XD5, and 90.6:XD6 and inverter 90.6:IV3 to the other input of NOR gate 90.6:NR1. The output of NOR gate 90.6:NR1 is coupled through inverter 90.6:IV6 to one input of NAND gate 90.6:ND2. The other input to NAND gate 90.6:ND2 is the output of NAND gate 90.6:ND1.

In the VDD reference circuit, VDDREF of 90.6, the output of NAND gate 90.6:ND2 is coupled through inverter 90.6:IV7 to Node 90.6:N16. Node 90.6:N16 is connected to the gates of P-channel transistor 90.6:MP6 and N-channel transistor 90.6:MN7. Transistors 90.6:MP6 and 90.6:MN7 are respectively connected between Node 90.6:N22 and VSS. Low-threshold voltage N-channel transistor 90.6:MN9 is connected between VDD and Node 90.6:N22. Its gate is connected to VPERI. P-channel transistor 90.6:MP10 and N-channel transistor 90.6:MN11 are connected respectively between Node 90.6:N22 and VSS. The gates of P-channel transistor 90.6:MP10 and N-channel transistor 90.6:MN11 are connected to the series connection between transistor 90.6:MP6 and 90.6:MN7.

In FIG. 90.6, N-channel low threshold voltage transistor 90.6:MN5 and N-channel low threshold voltage transistor 90.6:MN1 are connected respectively between VDD and VDDREF. The gate of transistor 90.6:MN5 is connected to VPERI. The gate of transistor 90.6:MN1 is connected to Node 90.6:N21. The gate of N-channel transistor 90.6:MN8 is connected to the series connection of transistors 90.6:MN5 and 90.6:MN1. The source and drain of transistor 90.6:MN8 are connected to the series connection of transistors 90.6:MP10 and 90.6:MN11. Low-threshold voltage N-channel transistor 90.6:MN4 is connected between VPERI and Node 90.6:N21. The gate of transistor 90.6:MN4 is connected to VPERI. The gate of N-channel transistor 90.6:MN3 is connected to Node 90.6:N21. The source and drain of transistor 90.6:MN3 are connected together and connected to the output of inverter 90.6:IV11. Node 90.6:N16 is coupled through inverter 90.6:IV10 to the input of inverter 90.6:IV11.

FIG. 91 illustrates the TLOV circuit or the DFT Over-voltage circuit. The TLOV circuit has three input signals and one output signal. The first input signal, A10 is coupled to the B terminal of the SWITCH 91:SW1 and a BOND PAD. The second input signal, RL1_, is coupled to the first input of the NAND gate 91:ND1 and further coupled to the input of the inverter 91:IV6. The third input signal, EXTAKEN_, is coupled to the first input of the NAND gate 91:ND2 and to a probe pad. Transistor 91:MP5 couples VPERI to node 91:EXTAKEN_ and its gate is connected to VSS. The second terminal A of the SWITCH 91:SW1 is coupled to VPERI. The common terminal of the SWITCH 91:SW1 is coupled to three serially connected MOS diodes connected as N-channel devices where each device is connected in parallel with a SWITCH, such that if the SWITCH is open, the diode connected N-channel device is active. SWITCHES 2 and 3 shown open, such that device 91:MN3 and 91:MN4 are serially connected. SWITCH 4 is shown closed, such that device 91:MN5 is short-circuited. The P-channel device 91:MP4, which has its gate terminal connected to the voltage VPERI, couples the output of the SWITCH 91:SW1 through the N-channel diode connected transistors 91:MN3 and 91:MN4 to the node 91:N5. Node 91:N5 is further connected to five pairs of N-channel devices and SWITCHES. Each pair is configurable such that if the SWITCH is open, the N-channel device is part of a selectable gate-length N-channel transistor, and if the SWITCH is closed, the device is short-circuited and its not used. The gate terminals of the five devices are connected to the voltage VPERI. All five SWITCHES are shown open, such that, as illustrated, all five devices are used. The five SWITCHES in this configuration are: 91:SW5, 91:SW6, 91:SW7, 91:SW8, and 91:SW9. The N-channel devices in this configuration are: 91:NMH1, 91:NMH2, 91:NMH3, 91:NMH4, and 91:NMH5. Node 91:N5 is further connected to the input of the inverter 91:IV1, and through the transistor 91:MN2 to ground. The output of the inverter 91:IV1 is coupled to the second input of the NAND gate 91:ND2. The output of the NAND gate 91:ND2 is coupled to the output signal TLOV through the pair of serially connected inverters 91:IV2 and 91:IV3. The output of the inverter 91:IV6 is coupled to the input of the delay element 91:SDEL41. The output of the delay element 91:SDEL41 is coupled to the second input of the NAND gate 91:ND1 through the delay element 91:SDEL42. The output of the NAND gate 91:ND1 is coupled to the gate terminal of the N-channel device 91:MN2 through the inverter 91:IV7.

FIG. 92 illustrates the TLOVL circuit, or the DFT Over-voltage Latch circuit. The TLOVL circuit has four input signals, and a single output signal.

The first input signal, TLOV, is coupled to the first input of the NAND gate 92:ND1. The second input signal, CBR_DFT, is coupled to the second input of the NAND gate 92:ND1. The third input signal, WBR, is coupled to the third input NAND gate 92:ND1. The fourth input signal, TLEX, is coupled to the second input of the RS-latch 92:XRSQ1. The output of the NAND gate 92:ND1 is coupled to the first input of the RS-latch 92:XRSQ1 through the inverter 92:IV2. The output of the RS-latch is coupled to the output signal TLOVL through the serially connected pair of inverters 92:IV1 and 92:IV3.

FIG. 93 illustrates the TLIN1 circuit, or the DFT Initialized circuit. The TLIN1 circuit has four input signals and two output signals.

The first input signal, WBR, is connected to the first input of the NAND gate 93:ND1. The second input signal, CBR_DFT is connected to the second input of the NAND gate 93:ND1. The output of the NAND gate 93:ND1 is coupled to the delay element 93:XSDEL2_2 and further coupled to the first output signal, WCBR, through three serially connected inverters; 93:IV7, 93:IV8, and 93:IV9. The third input signal, TLOVL, is coupled to the second input of the NAND gate 93:ND2. The output of the delay element, 93:XSDEL2_2, is coupled to the second input to the NAND gate 93:ND2 through the inverter 93:IV1. The output of the NAND gate 93:ND2 at node 93:N8, is coupled to the input of the delay element 93:XSDEL-4_1 and to the input of the inverter 93:IV3. The output of the delay element 93:XSDEL4_1 is coupled to the input of the NOR gate 93:NR1 through the serially connected elements of: the delay element 93:XSDEL-4_2, 93:XSDEL2_1, and the inverter 93:IV2. The fourth input signal, RID, is coupled to the second input to the NOR gate 93:NR1, through the delay element 93:XSDEL2_3. The output of the NOR gate 93:NR1 is coupled to the second input of the RS-latch 93:XRSQ1 through the inverter 93:IV4. The output of the inverter 93:IV3 is coupled to the first input of the RS-latch 93:XRSQl. The output of the RS-latch 93:XRSQ1 is coupled to the second output signal TLINI through the serially connected pair of inverters 93:IV5 and 93:IV6.

FIG. 94 illustrates the TLROR circuit, or the DFT RAS-ONLY Refresh circuit. The TLROR circuit has three input signals and a single output signal.

The first input signal, RL1_, is coupled to the first input of the NAND gate 94:ND1 through the delay element XSDEL4_1, to the input of the inverter 94:IV1, and to the second input of the NAND gate 94:ND3. The second input signal, RID, is coupled to the second input of the NAND gate 94:ND2 through the inverter 94:IV2, and also to the second input of the NOR gate 94:NR1. The third input signal, CL1_, is coupled to the third input of the NAND gate 94:ND2. The output of the inverter 94:IV1, node 94:N3, is coupled to the first input of the NAND gate 94:ND2 through the delay element 94:XSDEL4_2. Node 94:N3 is further coupled to the second input of the NAND gate 94:ND1 and to the first input of the NOR gate 94:NR1. The output of the NAND gate 94:ND1 is coupled to the first input of the RS latch 94:XRSQ1 through the inverter 94:IV4. The output of the NAND gate 94:ND2 is coupled to the second input of the RS latch 94:XRSQ1. The output of the RS-latch 94:XRSQ1 is coupled to the first input of the NAND gate 94:ND3. The output of the NAND gate 94:ND3 is coupled to the first input of the RS latch 94:XRSQ2 through the inverter 94:IV3. The output of the NOR gate 94:NR1 is coupled to the second input of the RS latch 94:XRSQ2 through the inverter 94:IV7. The output of the RS latch 94:XRSQ2 is coupled to the output signal ROR through the serially connected pair of inverters 94:IV5 and 94:IV6.

FIG. 95 illustrates the TLEX circuit, or the DFT Exit circuit. The DFT Exit circuit has six input signals and a single output signal.

The first input signal, RID, is coupled to the first input of the NOR gate 95:NR1 and the first input of the NOR gate 95:NR3. The second input signal, ROR, is coupled to the second input for the NOR gate 95:NR3. The third input signal, CBR_DFT, is coupled to the first input of the RS latch 95:XRSQ1. The fourth input signal, RBC_RESET, is coupled to the second input signal of the NOR gate 95:NR1. The output of the NOR gate 95:NR1 is coupled to the second input of the RS latch 95:XRSQ1 through the inverter 95:IV2. The output of the RS latch 95:XRSQ1 is coupled to the first input of the NOR gate 95:NR2 through the inverter 95:IV3. The fifth input signal, WBR, is coupled to the second input of the NOR gate 95:NR2 through the serially connected elements of the delay elements 95:XSDEL4_1 and 95:XSDEL4_2. The sixth input signal, RL1_, is coupled to the third input of the NOR gate 95:NR2 through the inverter 95:IV1. The output of the NOR gate 95:NR2 is coupled to the third input of the NOR gate 95:NR3. The output of the NOR gate 95:NR3 is coupled to the output signal TLEX, through the serially connected inverters 95:IV4, 95:IV5 and 95:IV6.

FIG. 96 illustrates the TLJDC circuit, or the DFT Jedec Mode circuit. The TLJDC circuit has five input signals and a single output signal.

The first input signal WBR, is coupled to the first input of the NAND gate 96:ND1. The second input signal, CBR is coupled to the second input of the NAND gate 96:ND1. The output of the NAND gate 96:ND1 is coupled to the first input of the NOR gate 96:NR2 through the delay element 96:XSDEL1_1. The third input signal, TLOVL, is coupled to the second input of the NOR gate 96:NR2. The fourth input signal, TLINI, is coupled to the first input of the NOR gate 96:NR1. The fifth input signal, TLEX, is coupled to the second input of the NOR gate 96:NR1. The output of the NOR gate 96:NR2 is coupled to the set input of the RS latch 96:XRSQ1. The output of the NOR gate 96:NR1 is coupled through inverter 96:IV3 to the reset input of latch 96:XRSQ1. The output of the RS latch 96:XRSQ1 is coupled the output signal TLJDC through the serially connected pair of inverters 96:IV1 and 96:IV2. FIG. 97 illustrates the TLRAL circuit, or the DFT Row Address Latch circuit. The DFT Row Address Latch circuit has eight input signal and four output signals.

The first input signal, TLINI, is coupled to the input of the inverter 97:INV9, to the N-channel gates of pass gate devices 97:TG2, 97:TG4, 97:TG6, and 97:TG8, and to the P-channel gates of 97:TG1, 97:TG3, 97:TG5, and 97:TG7. The output of the inverter 97:INV9 is likewise coupled to the N-channel gates of pass gate devices 97:TG1, 97:TG3, 97:TG5, and 97:TG7, and to the P-channel gates of TG2, TG4, TG6, and TG8. The second input signal, TLEX, is coupled through the inverter 97:IV5 to the node 97:N1. Node 97:N1 is coupled to the second input of the NAND gates 97:ND6, 97:ND7, 97:ND8, and 97:ND9. The third input signal, RAP_0, is coupled to the first input of the NAND gate 97:ND1. The fourth input signal, TLRCOPY, is coupled to the first input of the NAND gate 97:ND2 through the inverter 97:IV1. The fifth input signal, WCBR, is coupled to the second input of the NAND gate 97:ND2 through the inverter 97:IV3. The output of the NAND gate 97:ND2 is coupled to the second input of the NAND gates 97:ND1, 97:ND3, 967:ND4, and 97:ND5. The sixth input signal, RAP_1, is coupled to the first input signal of the NAND gate 97:ND3. Likewise, the seventh input signal, RAP_2, is coupled with the first input NAND gate 97:ND4; and the eighth input signal, RAP_6, is coupled to the first input of the NAND gate 97:ND5.

In FIG. 97, the output signal of the NAND gate 97:ND1 is coupled through the transmission gate 97:TG2 to the first input of the NAND gate 97:ND6, which is labeled node 97:N2. The output of the NAND gate 97:ND6 is coupled through the inverter 97:IV2 to the first output signal TLA0, and further coupled through the transmission gate 97:TG1 back to the node 97:N2. The output of the NAND gate 97:ND3 is coupled through the transmission gate 97:TG4 to the first input of the NAND gate 97:ND7. The output of the NAND gate 97:ND7 is coupled through the inverter 97:IV4 to the second input signal TLA1, and further coupled through the transmission gate 97:TG3 back to the first input of the NAND gate 97:ND7. The output of the NAND gate 97:ND4 is coupled to the first input of the NAND gate 97:ND8 through the transmission gate 97:TG6. The output of the NAND gate 97:ND8 is coupled to the third output signal TLA2 through the inverter 97:IV6, and further coupled through the transmission gate 97:TG5 back to the first input of the NAND gate 97:ND8. The output of the NAND gate 97:ND5 is coupled to the first input of the NAND gate 97:ND9 through the transmission gate 97:TG8. The output of the NAND gate 97:ND9 is coupled to the fourth output signal TLA6 through the inverter 97:IV8, and further coupled through the transmission gate 97:TG7 back to the first input of the NAND gate 97:ND9.

FIG. 98 illustrates the DFT Address Key Decoder circuit, or the TLKEY circuit. The DFT Address Key Decoder circuit has four input signal and thirteen output signals.

The first input signal TLA0, is coupled to the first input of NAND gates 98:ND1, 98:ND3, 98:ND5, 98:ND7, 98:ND9, 98:ND11, and 98:ND13, and is further coupled through the inverter 98:IV14 to the first input of NAND gates 98:ND2, 98:ND4, 98:ND6, 98:ND8, 98:ND10, and 98:ND12. The second input signal, TLA1, is coupled to the second input of NAND gates 98:ND2, 98:ND6, 98:ND3, 98:ND8, 98:ND9, 98:ND12, 98:ND13, and is further coupled through the inverter 98:IV15 to the second input of the NAND gates 98:ND1, 98:ND4, 98:ND5, 98:ND7, 98:ND10, and 98:ND11. The third input signal, TLA2, is coupled to the third input of NAND gates 98:ND4, 98:ND5, 98:ND6, 98:ND10, 98:ND11, 98:ND12, and 98:ND13, and is further coupled through the inverter 98:IV16 to the third input of the NAND gates 98:ND1, 98:ND2, 98:ND3, 98:ND7, 98:ND8, and 98:ND9. The fourth input signal, TLA6, is coupled to the fourth input of the NAND gates 98:ND7, 98:ND8, 98:ND9, 98:ND10, 98:ND11, 98:ND12, 98:ND13, and through the inverter 98:IV17 to the fourth input of the NAND gates 98:ND1, 98:ND2, 98:ND3, 98:ND4, 98:ND5, and 98:ND6.

In FIG. 98, The output of the NAND gate 98:ND1 is coupled to the first output signal TLCLR through the inverter 98:IV1. The output of the NAND gate 98:ND2 is coupled to the second output signal TLSCS through the inverter 98:IV2. The output of the NAND gate 98:ND3 is coupled to the third output signal TLBI through the inverter 98:IV3. The output of the NAND gate 98:ND4 is coupled to the output signal TLRCS through the inverter 98:IV4. The output of the NAND gate 98:ND5 is coupled to the fifth output signal TLTPH through the inverter 98:IV5, The output of the NAND gate 98:ND6 is coupled to the sixth output signal TLTPL through the inverter 98:IV6. The output of the NAND gate 98:ND7 is coupled to the seventh output signal TL16ED through the inverter 98:IV7. The output of the NAND gate 98:ND8 is coupled to the eighth output signal TL32_ through the serially connected inverter pair 98:IV18 and 98:IV8. The output of the NAND gate 98:ND9 is coupled to the ninth output signal TLRS through the inverter 98:IV9. The output of the NAND gate 98:ND10 is coupled to the tenth output signal TLRRRC through the inverter 98:IV10. The output of the NAND gate 98:ND11 is coupled to the eleventh output signal TLCRRC to the inverter 98:IV11. The output of the NAND gate 98:ND12 is coupled to the twelfth output signal TLWLL through the inverter 98:IV12. The output of the NAND gate 98:ND13 is coupled to the thirteenth output signal TLBID through the inverter 98:IV13.

FIG. 99 illustrates the TLSCSL circuit, or the DFT Storage Cell Stress Latch. The DFT Storage Cell Stress Latch has six input signals and four output signals.

The first input signal, TLSCS, is connected to the first input of the NOR gate 99:NR1. The second input signal, TLBI, is connected to the A terminal of the SWITCH 99:SW1 and to the first input of the NOR gate 99:NR4. The B terminal of the SWITCH 99:SW1 is connected to ground. The output of the SWITCH 99:SW1 is connected to the second input of the NOR gate 99:NR1. The third input signal, TLCLR, is connected to the first input of the NOR gate 99:NR3. The fourth input signal, TLEX, is connected to the second input of the NOR gate 99:NR3; the output of the NOR gate 99:NR3 is coupled to the node 99:N3 through the inverter 99:IV1. Node 99:N3 is connected to the second input of the NOR gate 99:NR2, the second input of the NOR gate 99:NR5, the second input of the NOR gate 99:NR7, and the second input of the NOR gate 99:NR9.

The output of the NOR gate 99:NR2 is coupled to the first output signal TLSCSL and further coupled to the third input of the NOR gate 99:NR1. The output of the NOR gate 99:NR1 is coupled to the first input of the NOR gate 99:NR2. The output of the NOR gate 99:NR5 is coupled to the second output signal TLWLS_ through the inverter 99:IV2, and further to the first input of the NOR gate 99:NR4. The output of the NOR gate 99:NR4 is coupled to the first input of the NOR gate 99:NR5. The fifth input signal, TLTPH, is coupled to the first input of the NOR gate 99:NR6. The sixth input signal, TLTPL, is coupled to the first input of the NOR gate 99:NR8. The output of the NOR gate 99:NR8 is coupled to the first input of the NOR gate 99:NR9. The output of the NOR gate 99:NR9 is coupled to the second input of the NOR gate 99:NR8, the third input of the NOR gate 99:NR7, and the fourth output signal TLTPL0. The output of the NOR gate 99:NR7 is coupled to the third output signal TLTPHI, the third input of the NOR gate 99:NR9, and the second input of the NOR gate 99:NR6. The output of the NOR gate 99:NR6 is coupled to the first input of the NOR gate 99:NR7.

FIG. 101 illustrates the TLMODE circuit, or the DFT Mode circuit. The DFT Mode circuit has ten input signals, and seven output signals.

The first input signal, TLA6, is coupled to the first input of the NOR gate 101:NR1. The second input signal, TLJDC is coupled to the first input of the NOR gate 101:NR2 and further coupled to the second input of the NOR gate 101:NR1. The third input signal, TL16ED, is coupled to the first input of the NOR gate 101:NR3 and the second input of the NOR gate 101:NR2. The fourth input signal, TL32_, is coupled to the second input of the NOR gate 101:NR3 through the inverter 101:IV2, the first input of the NAND gate 101:ND2, and the second input of the NAND gate 101:ND3. The fifth input signal TLWLS_, is coupled to the second input of the NAND gate 101:ND2. The sixth input signal, TLRCS, is coupled to the third input of the NAND gate 101:ND2 through the inverter 101:IV7, the first input of the NAND gate 101:ND4 and the second input of the NOR gate 101:NR10. The seventh input signal, RL1_, is coupled to the second input of the NAND gate 101:ND1 and the third input of the NOR gate 101:NR6 through the inverter 101:IV9. The eighth input signal, RL2, is coupled to the second input of the NOR gate 101:NR4 and the first input of the NOR gate 101:NR6. The ninth input signal, RID, is coupled to the input of the inverter 101:IV15, to the third input of the NOR gate 101:NR7 and to the third input of the NOR gate 101:NR9.

The output of the NOR gate 101:NR1 is coupled to the first output signal TLDE through the inverter 101:IV4. The output of the NOR gate 101:NR2, Node 101:N2, is coupled to the first input of the NAND gate 101:ND3 and to the second output signal, TL16, through the inverter 101:IV1. The output of the NOR gate 101:NR3 is coupled to the third output signal TLEDC through the inverter 101:IV3. The output of the NAND gate 101:ND3 is coupled to the fourth output signal TLPT through the pair of serially connected inverters 101:IV5 and 101:IV6. The output of the NAND gate 101:ND2, Node 101:N7, is coupled to the first input of the NAND gate 101:ND1 and the second input of the NOR gate 101:NR6. The output of the NAND gate 101:ND1 is coupled to the first input of the NOR gate 101:NR4. The output of the NOR gate 101:NR4 is coupled to the first input of the NOR gate 101:NR5 and to the second input of the NAND gate 101:ND4. The output of the NOR gate 101:NR6, Node 101:N11, is coupled to the second input of the NOR gate 101:NR7 and the second input of the NOR gate 101:NR9. The output of the NOR gate 101:NR7 is coupled to the second input of the NAND gate 101:ND5 and the second input of the NOR gate 101:NR5. The output of the NOR gate 101:NR5 is coupled back to the first input of NOR gate 101:NR7. The output of the NAND gate 101:ND4 is coupled to the first input of the NOR gate 101:NR8 through the inverter 101:IV8. The output of the NOR gate 101:NR8 is coupled to the first input of the NOR gate 101:NR9. The output of the NOR gate 101:NR9, Node 101:N22, is coupled to the second input of the NOR gate 101:NR8, the first input of the NOR gate 101:NR10 and to the fifth output signal TLRCOPY through the serially connected inverters, 101:IV13 and 101:IV14. The output of the NOR gate 101:NR10 is coupled to the B terminal of the SWITCH 101:SW1. The A terminal of the SWITCH 101:SW1 is coupled to the reference voltage VPERI. The common terminal of the SWITCH 101:SW1 is coupled to the first input of the NAND gate 101:ND5. The output of the NAND gate 101:ND5 is coupled to the first input of the NAND gate 101:ND6. The output of the Inverter 101:IV15 is coupled to the gate terminal of the P-channel device 101:MP1. The sixth input signal, 2K4K, is connected to the 2K/4K bond pad and is coupled through the P-channel devices 101:MP1 and 101:MP2 to the reference voltage VPERI, and further coupled to the input of the inverter 101:IV16. The output of the inverter 101:IV16 is coupled to the input of the inverter 101:IV17 and to the gate terminal of the P-channel device 101:MP2. The output of the inverter 101:IV17, Node 101:N28, is coupled to the second input of the NAND gate 101:ND6 and to the sixth output signal TWOKREF through the inverter 101:IV10. The output of the NAND gate 101:ND6 is coupled to the seventh output signal, TL8BS, through the serially connected inverters 101:IV11 and 101:IV12.

FIG. 102 illustrates the TLPTDH circuit, or the DFT Parallel Test Data High circuit. The TLPTDH circuit has fourteen input signals and two output signals.

The first input signal, TL16, is coupled to the first input of the NOR gate 102:NR1. The second input signal, TL32_, is coupled to the second input of the NOR gate 102:NR1 through the inverter 102:IV1. The output of the NOR gate 102:NR1 is connected to the inverter 102:IV2, whose output is coupled to the first input of the NAND gates 102:ND1, 102:ND2, 102:ND3 and 102:ND4. The third input signal, IOGSJK0, is coupled to the second input of the NAND gate 102:ND1; the output of which is coupled to the inverter 102:IV3 and to the third input of the transmission gate latches 102:XTGL1 and 102:XTGH1. The output of the inverter 102:IV3 is coupled to the first input of the transmission gate LATCHES 102:XTGL1 and 102:XTGH1. The fourth input signal, IOGSJK2, is coupled to the second input of the NAND gate 102:ND2; whose output is coupled to the input of the inverter 102:IV4 and the third input of the LATCHES 102:XTGL2 and 102:XTGH2. The output of the inverter 102:IV4 is coupled to the first inputs of the transmission gate LATCHES 102:XTGL2 and 102:XTGH2. The fifth input signal, IOGSJK4, is coupled to the second input of the NAND gate 102:ND3; whose output is coupled to the input of the inverter 102:IV5 and to the third input of the transmission gate LATCHES 102:XTGL3 and 102:XTGH3. The output of the inverter 102:IV5 is coupled to the first inputs of the latches 102:XTGL3 and 102:XTGH3. The sixth input signal, IOGSJK6, is coupled to the second input of the NAND gate 102:ND4; whose output is coupled to the input of the Inverter 102:IV6, and further coupled to the third input of the transmission gate LATCHES 102:XTGL4 and 102:XTGH4. The output of 102:IV6 is coupled to the 1st input of 102:XTGL4 and 102:XTGH4. The seventh input signal, GIOJK0, is coupled to the first inputs of the NOR gates 102:NR2 and the first input of the NAND gate 102:ND5. The eighth input signal, GIOJKI, is coupled to the second input of the NOR gate 102:NR2 and the second input of the NAND gate 102:ND5. The ninth input signal, GIOJK2 is coupled to the first input of the NOR gate 102:NR3 and the first input of the NAND gate 102:ND6. The tenth input signal, GIOJK3, is coupled to the second input of the NOR gate 102:NR3 and the second input of the NAND gate 102:ND6. The eleventh input, GIOJK4, is coupled to the first input of the NOR gate 102:NR4 and the first input of the NAND gate 102:ND7. The twelfth input signal, GIOJK5, is coupled to the second input of the NOR gate 102:NR4 and the second input of the NAND gate 102:ND7. The thirteenth input signal, GIOJK6, is coupled to the first input of the NOR gate 102:NR5 and the first input of the NAND gate 102:ND8. The fourteenth input signal, GIOJK7, is coupled to the second input of the NOR gate 102:NR5 and the second input of the NAND gate 102:ND8.

In FIG. 102, The output of the NOR gate 102:NR2 is coupled to the second input of the transmission gate LATCH 102:XTGL1. The output of the NOR gate 102:NR3 is coupled to the second input of the transmission gate LATCH 102:XTGL2. The output of the NOR gate 102:NR4 is coupled to the second input of the transmission gate LATCH 102:XTGL3. The output of the NOR gate 102:NR5 is coupled to the second input of the transmission gate LATCH 102:XTGL4. The outputs of the transmission gate LATCHES 102:XTGL1, 102:XTGL2, 102:XTGL3, and 102:XTGL4 are inputs to the four input NAND gate 102:ND41. The output of the NAND gate 102:ND41 is coupled to the first output signal PTDL_Q through the serially connected inverters 102:IV11 and 102:IV12. The output of the NAND gate 102:ND5 is coupled to the second input of the transmission gate LATCH 102:XTGH1 through the inverter 102:IV7. The output of the NAND gate 102:ND6 is coupled to the second input of the transmission gate LATCH 102:XTGH2 through the inverter 102:IV8. The output of the NAND gate 102:ND7 is coupled to the second input of the transmission gate LATCH 102:XTGH3 through the inverter 102:IV9. The output of the NAND gate 102:ND8 is coupled to the second input of the transmission gate LATCH 102:XTGH4 through the inverter 102;IV10. The outputs of the transmission gate LATCHES 102:XTGH1, 102:XTGH2, 102:XTGH3, and 102:XTGH4 are the four input signals to the four input NAND gate 102:ND42. The output of the NAND gate 102:ND42 is connected to the second output signal PTDH_Q through the serially connected inverters 102:IV13 and 102:IV14.

FIG. 103 depicts the TLJDCMX circuit, or the DFT Jedec Multiplexor circuit. The Jedec Multiplexor circuit has eleven input signals and four output signals.

The first input signal, PTDL_0, is coupled to the first input of NAND gate 103:ND1. The second input signal, PTDH_0, is coupled to the second input of the NAND gate 103:ND1. The output of the NAND gate 103:ND1 is coupled to the gate terminal of the P-channel device 103:MP3, the gate terminal of the N-channel device 103:MN1, and the first input of the NOR gate 103:NR1. The third input signal, PTDL_1, is coupled to the first input of the NAND gate 103:ND2. The fourth input signal, PTDH_1, is coupled to the second input of the NAND gate 103:ND2. The output of the NAND gate 103:ND2 is coupled to the gate terminal of the P-channel device 103:MP7, the gate terminal of the N-channel device 103:MN5, and the first input of the NOR gate 103:NR2. The fifth and sixth input signals, PTDL_2 and PTDH_2, are inputs to the two-input NAND gate 103:ND3. The output of the NAND gate 103:ND3 is coupled to the gate terminal of the P-channel device 103:MP11, the gate terminal of the N-channel device 103:MN9, and the first input of the NOR gate 103:NR3. The seventh and eighth input signals, PTDL_3 AND PTDH_3 are inputs to the two-input NAND gate 103:ND4. The output of the NAND gate 103:ND4 is coupled to the gate terminal of the P-channel device 103:MP15, the gate terminal of the N-channel device 103:MN13 and the first input of the NOR gate 103:NR4. The ninth input signal, TLJDC, is coupled to the first input of the NAND gate 103:ND5. The tenth input signal CLX4, is coupled to the second input of the NAND gate 103:ND5. The output of the NAND gate 103:ND5, node 103:N7, is coupled to the input of the inverter 103:IV3 and to the second input of the NOR gates 103:NR1, 103:NR2, 103:NR3 and 103:NR4. The output of the inverter 103:IV3, Node 103:N8, is coupled to the gate terminals of the N-channel devices 103:MN2, 103:MN6, 103:MN10 and 103:MN14: and the gate terminals of the P-channel devices 103:MP2, 103:MP6, 103:MP10, and 103:MP14. The eleventh input signal, TLBID, is coupled to the Node 103:N10 through the inverter pair 103:IV1 and 103:IV2. Node 103:N10 is coupled to the gate terminal of the P-channel devices 103:MP1, 103:MP5, 103:MP9, and 103:MP13; and further coupled to the gate terminals of the N-channel devices 103:MN3, 103:MN7, 103:MN11, and 103:MN15. The output of the NOR gate 103:NR1 is coupled to the gate terminal of the N-channel device 103:MN4. Node 103:N11 is coupled through the P-channel device 103:MP1 to the reference voltage VPERI, through the parallel P-channel devices 103:MP2 and 103:MP3 to the node 103:N3. Node 103:N3 is coupled through the serially connected N-channel devices 103:MN1 and 103:MN2 to ground through the N-channel device 103:MN3 to ground, and to the gate terminal of the P-channel device 103:MP4.

In FIG. 103, The first output signal TLDT0 is coupled through the P-channel device 103:MP4 to the reference voltage VPERI, and further coupled through the N-channel device 103:MN4 to ground. The output of the NOR gate 103:NR2 is coupled to the gate terminal of the N-channel device 103:NM8. Node 103:N14 is coupled through the P-channel device 103:MP5 to the reference voltage VPERI, and through the parallel P-channel devices 103:MP6 and 103:MP7 to the Node 103:N13. Node 103:N13 is coupled through the serially connected N-channel devices 103:MN5 and 103:MN6 to ground, to the N-channel device 103:MN7 to ground, and to the gate terminal of the P-channel device 103:MP8. The second output signal TLDT1, is coupled through the P-channel device 103:MP8 to the reference voltage VPERI and through the N-channel device 103:MN8 to ground. The output of the NOR gate 103:NR3 is coupled to the gate terminal of the N-channel device 103:MN12. Node 103:N17 is coupled to the P-channel device 103:MP9 to the reference voltage VPERI, and through the parallel P-channel devices 103:MP10 and 103:MP11 to the Node 103:N16. Node 103:N16 is coupled to the serially connected N-channel devices 103:MN9 and 103:MN10 to ground, through the N-channel device 103:MN11 to ground, and further coupled to the gate terminal of the P-channel device 103:MP12. The third output signal TLDT2, is coupled through the P-channel device 103:MP12 to the reference voltage VPERI and further coupled through the N-channel device 103:MN12 to ground. The output of the NOR gate 103:NR4 is coupled to the gate terminal of the N-channel device 103:MN16. Node 103:N23 is coupled through the P-channel device 103:MP13 to the reference voltage VPERI, and through the parallel P-channel devices 103:MP14 and 103:MP15 to the Node 103:N22. Node 103:N22 is coupled through the serially connected N-channel devices 103:MN13 and 103:MN14 to ground, through the N-channel device 103:MN15 to ground, and to the gate terminal of the P-channel device 103:MP16. The fourth output signal, TLDT3, is coupled through the P-channel device 103:MP16 to the reference voltage VPERI and through the N-channel device 103:MN16 to ground.

FIG. 104 illustrates the DFT Parallel Test Expected Data circuit, or the TLPTED circuit. The DFT Parallel Test Expected Data circuit has fourteen input signals and four output signals.

The first input signal, EXDA0 and the second input signal PTDH_0 are inputs to the NAND gate 104:ND1. The output of the NAND gate 104:ND1 is the first input to the NAND gate 104:ND5; the third input signal, PTDL_0, is the second input to the NAND gate 104:ND5. The output of the NAND gate 104:ND5 is coupled to the transmission gate 104:TG1 through the inverter 104:IV1. The output of the transmission gate 104:TG1 is coupled to the first output signal TLDT0. The fourth and fifth input signals, EXDA1 and PTDH_1, are the inputs to the NAND gate 104:ND2. The output of the NAND gate 104:ND2 is the first input of the NAND gate 104:ND6, the sixth input signal PTDL_1 is the second input to the NAND gate 104:ND6. The output of the NAND gate 104:ND6 is coupled to the input of the transmission gate 104:TG2 through the inverter 104:IV2. The output of the transmission gate 104:TG2 is coupled to the second output signal TLDT1. The seventh and eighth input signals, EXADA2 and PTDH_2, are the inputs to the NAND gate 104:ND3. The output of the NAND gate 104:ND3 is the first input of the NAND gate 104:ND7, and the ninth input signal PTDL_2 is the second input to the NAND gate 104:ND7. The output of the NAND gate 104:ND7 is coupled to the input of the transmission gate 104:TG3 through the inverter 104: IV3. The output of the transmission gate 104:TG3 is coupled to the third output signal TLDT2. The tenth and eleventh input signals, EXDA3 AND PTDH_3, are the inputs to the NAND gate 104:ND4. The output of the NAND gate 104:ND4 is the first input to the NAND gate 104:ND8, and the input signal PTDL_3 is the second input to the NAND gate 104:ND8. The output of the NAND gate 104:ND8 is coupled to the input of the transmission gate 104:TG4 through the inverter 104:IV4. The output of the transmission gate 104:TG4 is coupled to the fourth output signal TLDT3. The thirteenth and fourteenth inputs TLEDC AND CLX4, are the inputs to the NAND gate 104:ND9. The output of the NAND gate 104:ND9, Node 104:N13, is coupled to the inverter 104:IV5, and to the gate terminals of the P-channel devices of the transmission gates 104:TG1, 104:TG2, 104:TG3, and 104:TG4. The output of the inverter 104:IV5 is coupled to the gate terminals of the N-channel devices of the transmission gates 104:TG1, 104:TG2, 104:TG3 and 104:TG4.

FIG. 105 illustrates the DFT Parallel Test Xl circuit, or the TLPTX1 circuit. The DFT Parallel Test X 1 circuit has thirteen input signals and one output signal.

The first four input signals, PTDL_0, PTDL_1, PTDL_2 and PTDL_3 are the four inputs to the NOR gate 105:NR1. The second group of four inputs, PTDH_0, PTDH_1, PTDH_2 and PTDH_3 are the four inputs to the NOR gate 105:NR2. The ninth input signal EXDA3 is the second input to the NAND gate 105:ND1. The tenth input signal, TL16ED is coupled to the first input of the NOR gate 105:NR4; and the eleventh input signal TL32_ is coupled to the second input of the NOR gate 105:NR4 through the inverter 105:IV9. The twelfth input signal, CLX4, is coupled to the input of the inverter 105:IV8; whose output is coupled to the second input of the NAND gate 105:ND3 and the first input of the NAND gate 105:ND4. The thirteenth input signal TLJDC is coupled to the second input of the NAND gate 105:ND4.

The output of the NOR gate 105:NR1 is coupled to the second input of the NOR gate 105:NR3, and further coupled to the first input of the NAND gate 105:ND2 through the inverter 105:IV1. The output of the NOR gate 105:NR2 is coupled to the first input of the NOR gate 105:NR3, and further coupled to the first input of the NAND gate 105:ND1 through the inverter 105:IV4. The output of the NAND gate 105:ND1 is coupled to the second input of the NAND gate 105:ND2. The output of the NAND gate 105:ND2 is coupled to the input of the transmission gate 105:XTG2 through the inverter 105:IV3. The output of the transmission gate 105:XTG2 is coupled to the output signal TLDT3. The output of the NOR gate 105:NR3 is coupled to the input of the transmission gate 105:XTG1 through the inverter 105:IV2. The output of the transmission gate 105:XTG1 is coupled to the output signal TLDT3. The output of the NOR gate 105:NR4 is coupled to the first input of the NAND gate 105:ND3 through the inverter 105:IV5. The output of the NAND gate 105:ND3 is coupled to the gate terminal of the P-channel device of the transmission gate 105:XTG2, and further coupled to the gate terminal of the N-channel device of the transmission gate 105:XTG2 through the inverter 105:IV6. The output of the Nand gate 105:ND4 is coupled to the gate terminal of the P-channel device of the transmission gate 105:XTG1, and further coupled to the gate terminal of the N-channel device of the transmission gate 105:XTG1 through the inverter 105:IV7.

FIG. 106 illustrates the DFT Word Line Comparator, or the TLWLC circuit. The DFT Word Line Comparator has three input signals and a single output signal.

The first input signal, RLXHOQ, is coupled to the gate terminal of the N-channel device 106:MN2 and further coupled to the N-channel device 106:MN13. The second input signal RLB, is coupled to the first input of the NAND gate 106:ND1 through the serially connected elements of the inverter 106:IV1 and the delay element 106:XSDEL4_1; the signal RLB is further coupled to the second input of the NAND gate 106:ND2. The third input signal, TLWLL, is coupled to the second input of the NAND gate 106:ND1 and the first input of the NAND gate 106:ND2. The output of the NAND gate 106:ND1 is coupled to the node 106:N8 through the inverter 106:IV3 and the low-threshold voltage device 106:MN3. The gate terminal of the low-threshold voltage N-channel device 106:MN3 is coupled to the reference voltage VPERI. The output of the inverter 106:IV3 is further coupled to the B terminal of the SWITCH 106:SW1. The A terminal of the SWITCH 106:SW1 is coupled to ground, and the common terminal of the SWITCH 106:SW1 is coupled to the common terminal of the SWITCH 106:SW2 through the N-channel device 106:MN6, which is connected as a capacitor with its source and drain tied together and the gate terminal tied to the common terminal of the SWITCH 106:SW2. The B terminal of the SWITCH 106:SW2 is connected to ground, and the A terminal of the SWITCH 106:SW2 is connected to the Node, which is labeled REF. The Node labeled REF is coupled to the first input signal RLXHOQ through the N-channel device 106:MN13, the REF node is further coupled to ground through the N-channel device 106:MN7, which is configured as a capacitor, the REF node is also coupled to the gate terminal of the N-channel device 106:MN1. Node 106:N1 is further coupled to the gate terminal of the P-channel devices 106:MP3 and 106:MP4. Transistor 106:MP3 is connected between the external voltage VDD and the Node 106:N1, P-channel device 106:MP4 is connected between the external voltage VDD and the Node labeled 106:VD0. Node 106:N5 is coupled to Node 106:N1 through the N-channel device 106:MN1, and is further coupled to Node 106:VD0 through the N-channel device 106:MN2, and is finally coupled to ground through the N-channel device 106:MN5. The output of the NAND gate 106:ND2 is coupled to the input of the inverter 106:IV4 and further coupled to the gate of the N-channel device 106:MN9 and into the input of the delay element 106:XSDEL-4_4. The output of the inverter 106:IV4 is coupled to the node 106:BIAS through the P-channel devide 106:MP2. The gate terminal of the P-channel device 106:MP2 is further coupled to the BIAS node, which is also coupled to the gate terminal of the N-channel device 106:MN8, and through the N-channel device 106:MN8 to ground. The BIAS node is also coupled through the N-channel device 106:MN9 to ground. It is connected to the gate terminal of the N-channel device 106:MN5 and to the gate terminal of the N-channel device 106:MN12. The node labeled 106:VD0 is coupled to the external voltage VDD through the P-channel device 106:MP1, and further coupled to the gate of the P-channel device 106:MP7. The output of the delay element 106:XSDEL4_4 is coupled to the input of the delay element 106:XSDEL4_5. The output of the delay element 106:XSDEL4_5 is coupled to the input of the inverter 106:IV5, to the gate terminal of the N-channel device 106:MN4, and to the Node 106:N18 through the N-channel device 106:MN10. The N-channel device 106:MN10 has its gate terminal connected to the reference voltage VPERI. Node 106:N18 is coupled to the external voltage (VDD) through the P-channel device 106:MP5, and is further coupled to the gate of the P-channel device 106:MP6. The output of the 106:IV5 is coupled to the Node 106:N20 through the N-channel device 106:MN11, which has its gate terminal connected to the reference voltage VPERI. Node 106:N20 is coupled to the ate terminal of the P-channel device 106:MP5, through the P-channel device 106:MP6 to the reference voltage VDD, and to the gate terminal of the P-channel device 106:MP1. Node 106:N2 is coupled through the P-channel device 106:MP7 to the external voltage VDD, through the N-channel device 106:MN12 to ground, to the N-channel device 106:MN4 to ground, and to the input of the inverter 106:INV1. The output of the inverter 106:INV1 is coupled to the output signal TLWLL_OQ through the inverter 106:IV2.

FIG. 106.1 illustrates the DFT Word Line Leakage OR Gate, or the TLWLOR circuit. The TLWLOR circuit has two input signals and a single output signal.

The first and second input signals, TLWLL_LQ and TLWLL_RQ are the inputs to the NAND gate 106.1:ND1. The output of the NAND gate 106.1:ND1 is coupled to the output signal TLWLF_Q through three serially connected inverters; 106.1:IV1, 106.1:IV2 and 106.1:IV3.

FIG. 107 illustrates the DFT Word Line Leakage Multiplexor circuit, or the TLWLLMX circuit. The TLWLLMX circuit has six input signals and four output signals. The first input signal TLWLF_0, is coupled to the input of the transmission gate 107:TG1 and further coupled to the first input of the NAND gate 107:ND2. The second input signal, TLWLF_1, is coupled to the input of the transmission gate 107:TG2 and further coupled to the second input of the NAND gate 107:ND2. The third input signal TLWLF_2, is coupled to the input of the transmission gate 107:TG3 and the third input signal of 107:ND2. The fourth input signal, TLWLF_3 is coupled to the input of the transmission gate 107:TG4 and further coupled to the fourth input of the NAND gate 107:ND2. The fifth input signal, CLX4, is coupled to the first input of the NAND gate 107:ND1 and further coupled to the second input of the NAND gate 107:ND3 through the inverter 107:IV1. The sixth input signal, TLWLL, is coupled to the second input of the NAND gate 107:ND1 and to the first input of the NAND gate 107:ND3. The output of the NAND gate 107:ND1 is coupled to the gate terminals of the P-channel devices of the transmission gates 107:TG1, 107:TG2, 107:TG3, and 107:TG4; and is further coupled through the inverter 107:INV to the gate terminals of the N-channel devices of the transmission gates 107:TG1, 107:TG2, 107:TG3 and 107:TG4. The output of the NAND gate 107:ND2 is coupled to the input of the transimission gate 107:TG5 through the inverter 107:IV2. The output of the NAND gate 107:ND3 is coupled to the gate terminal of the P-channel device of the transmission 107:TG5; and further coupled through the inverter 107:IV3 to the gate terminal of the N-channel device of the transmission gate 107:TG5.

The output of the transmission gate 107:TG1 is coupled to the first output signal TLDT0. The output of the transmission gate 107:TG2 is coupled to the second output signal TLDT1. The output of the transmission gate 107:TG3 is coupled to the third output signal TLDT2. The output of the fourth transmission gate 107:TG4 is coupled to the fourth output signal TLDT3; which is also coupled to the output of the transmission 107:TG5.

FIG. 108 illustrates the DFT Redundancy Signature circuit, or the TLRS circuit. The DFT Redundancy Signature circuit has a single input signal, and a single output signal.

The input signal TLRS, is coupled to the gate terminal of the N-channel device 108:MN1, and to the Gate terminal of the N-channel device of the transmission gate which drives the output signal. The input signal TLRS is further coupled to the input of the inverter 108:IV3. The output of the inverter 108:IV3 is coupled to the gate terminal of the P-channel device of the transmission gate. Node 108:N2 is coupled to the gate terminal of the N-channel device 108:MN2 the input of the inverter 108:IV2, and is driven by the inverter 108:IV1. The input to the inverter 108:IV1 is coupled through the P-channel device 108:MP1 to the FUSE 108:F1 and further coupled to the parallel N-channel transistors 108:MN1 and 108:MN2 to ground. The FUSE 108:F1 is coupled between the P-channel device 108:MP1 and the reference voltage VPERI. The gate terminal of the P-channel device 108:MP1 is coupled to ground.

The output of the inverter 108:IV2 is coupled to the output signal TLDT3 through the transmission gate.

FIG. 109 illustrates the DFT Row Redundancy Row Call circuit, or the TLRCALL circuit. The TLRCALL circuit has six input signals and four output signals.

The first input signal TLRR_0, is coupled to the input of the transmission gate 109:TG1 and to the first input of the NAND gate 109:ND2. The second input signal, TLRR_1, is coupled to the input of the transmission gate 109:TG2 and to the second input of the NAND gate 109:ND2. The third input signal, TLRR_2, is coupled to the input of the transmission gate 109:TG3 and to the third input of the NAND gate 109:ND2. The fourth input signal TLRR_3, is coupled to the input of the transmission gate 109:TG4 and to he fourth input of the NAND gate 109:ND2. The fifth input signal, CLX4, is coupled to the first input of the NAND gate 109:ND1 and to the second input of the NAND gate 109:ND3 through the inverter 109:IV1. The sixth input signal, TLRRRC, is coupled to the first input of the NAND gate 109:ND3 and to the second input of the NAND gate 109:ND1. The output of the NAND gate 109:ND1 is coupled to the gate terminal of the P-channel devices of the transmission gates 109:TG1, 109:TG2, 109:TG3, and 109:TG4; and further coupled through the inverter 109:INV to the gate terminals of the N-channel devices of the transmission gates 109:TG1, 109:TG2, 109:TG3 and 109:TG4. The output of the NAND gate 109:ND2 is coupled to the input of the transmission gate 109:TG5 through the inverter 109:IV2. The output of the NAND gate 109:ND3 is coupled to the gate terminal of the P-channel device of the transmission gate 109:TG5, and further coupled to the gate terminal of the N-channel device of the transmission gate 109:TG5 through the inverter 109:IV3. The output of the transmission gate 109:TG1 is coupled to the output signal TLDT0. The output of the transmission gate 109:TG2 is coupled to the output signal TLDT1. The output of the transmission gate 109:TG3 is coupled to the output signal TLDT2. The output of the transmission gate 109:TG4 is coupled to the output signal TLDT3 which is further coupled to the output of the transmission gate 109:TG5.

FIG. 110 illustrates the DFT Column Redundancy Roll Call circuit, or the TLCCALL circuit.

The first input signal TLCR_0, is coupled to the input of the transmission gate 110:TG1 and to the first input of the NAND gate 110:ND2. The second input signal, TLCR_1, is coupled to the input of the transmission gate 110:TG2 and to the second input of the NAND gate 110:ND2. The third input signal, TLCR_2, is coupled to the input of the transmission gate 110:TG3 and to the third input of the NAND gate 110:ND2. The fourth input signal TLCR_3, is coupled to the input of the transmission gate 110:TG4 and to the fourth input of the NAND gate 110:ND2. The fifth input signal, CLX4, is coupled to the first input of the NAND gate 110:ND1 and to the second input of the NAND gate 110:ND3 through the inverter 110:IV1. The sixth input signal, TLCRRC, is coupled to the first input of the NAND gate 110:ND3 and to the second input of the NAND gate 110:ND1. The output of the NAND gate 110:ND1 is coupled to the gate terminal of the P-channel devices of the transmission gates 110:TG1, 110:TG2, 109:TG3, and 109:TG4; and further coupled through the inverter 110:INV to the gate terminals of the N-channel devices of the transmission gates 110:TG1, 110:TG2, 110:TG3 and 110:TG4. The output of the NAND gate 110:ND2 is coupled to the input of the transmission gate 110:TG5 through the inverter 110:IV2. The output of the NAND gate 110:ND3 is coupled to the gate terminal of the P-channel device of the transmission gate 110:TG5, and further coupled to the gate terminal of the N-channel device of the transmission gate 110:TG5 through the inverter 110:IV3. The output of the transmission gate 110:TG1 is coupled to the output signal TLDT0. The output of the transmission gate 110:TG2 is coupled to the output signal TLDT1. The output of the transmission gate 110:TG3 is coupled to the output signal TLDT2. The output of the transmission gate 110:TG4 is coupled to the output signal TLDT3 which is further coupled to the output of the transmission gate 110:TG5.

FIG. 112 depicts the low power oscillator circuit LPOSC for the VBB generator. One terminal of SWITCH 112:XSW17 is connected to VPERI. The other terminal of SWITCH 112:XSW17 is connected to NODE 112:N5. NODE 112:N5 is connected to one terminal of SWITCH 112:XSW20. The other terminal of SWITCH 112:XSW20 is connected to ground. P channel transistors 112:MP8 and 112:MP13 are connected in series with N channel transistors 112:MN9 and 112:MN14. One terminal of P channel transistor 112:MP8 is connected to VPERI and one terminal of N channel transistor 112:MN14 is connected to VSS. The common terminal of SWITCH 112:XSW17 is connected to the gate of P channel transistor 112:MP8. The series connection of 112:MP8 and 112:MP13 is connected to one terminal of SWITCH 112:XSW18. The other terminal of SWITCH 112:XSW18 is connected to VPERI. The gate of P channel transistor 112:MP13 is connected to NODE 112:N5. The gate of N channel transistor 12:MN9 is connected to NODE 112:N5. The series connection of transistors 112:MN9 and 112:MN14 is connected to one terminal of SWITCH 112:XSW19. The other terminal of SWITCH XSW19 is connected to VSS.

In FIG. 112, one terminal of SWITCH 112:XSW1 is connected to VPERI. The other terminal of SWITCH 112:XSW1 is connected to the series connection between transistors 112:MP13 and 112:MN9 at NODE 112:N36. NODE 112:N36 is connected to the B terminal of SWITCH 112:XSW4. The A terminal of SWITCH 112:XSW4 is connected to VSS. P channel transistors 112:MP11 and 112:MP14 are connected in series with N channel transistors 112:MN8, 112:MN12, and 112:MN17. One terminal of P channel transitor MP11 is connected to VPERI. One terminal of transistor 112:MN17 is connected to VSS. The gate of transistor 112:MP11 is connected to the common terminal of SWITCH 112:XSW1. The series connection of transistors 112:MP11 and 112:MP14 are connected to one terminal of SWITCH 112:XSW2. The other terminal of SWITCH 112:XSW2 is connected to VPERI. The gate of P channel transistor 112:MP14 is connected to NODE 112:36. The series connection of transistors 112:MP14 and 112:MN8 is connected to NODE 112:N34. The gate of N channel transitor 112:MN8 is connected to NODE 112:N35. The gate of N channel transistor 112:MN12 is connected to NODE 112:N36. The series connection between transistors 112:MN12 and 112:MN17 is connected to one terminal of SWITCH 112:XSW3. The other terminal of SWITCH XSW3 is connected to VSS. The gate of N channel transistor 112:MN17 is connected to the common terminal of switch 112:XSW4.

In the low power oscillator circuit LPOSC of FIG. 112, probe pad EXTODS is connected to the input of inverter 112:IV3. The input of inverter 112:IV3 is connected to one terminal of transistor 112:MN7. The other terminal of transistor 112:MN7 is connected to VSS. The gate of transistor 112:MN7 is connected to VPERI. The output of transistor 112:IV3 is connected to NODE 112:N35. P channel transistor 112:MP7 is connected between VPERI and NODE 112:N34. Its gate is connected to NODE 112:N35.

In FIG. 112, the A terminal of SWITCH 112:XSW5 is connected to VPERI. The B terminal of SWITCH 112:XSW5 is connected to NODE 112:N34. NODE 112:N34 is connected to the B terminal of SWITCH 112:XSW8. The A terminal of SWITCH 112:XSWB is connected to VSS. P channel transistors 112:MP12 and 112:MP15 and N channel transistors 112:MN13 and 112:MN18 are connected in series. One terminal of P channel transistor 112:MP12 is connected to VPERI and one terminal of transistor 112:MN18 is connected to VSS. The gate of transistor 112:MP12 is connected to the common terminal of SWITCH 112:XSW5. The series connection of transistors 112:MP12 and 112:MP15 is connected to one terminal of SWITCH 112:XSW6. The other terminal of SWITCH 112:XSW6 is connected to VPERI. The gate of transistor 112:MP15 is connected to a NODE 112:N34. The series connection of transistors 112:MP15 and 112:MN13 is connected to NODE 112:N21. The gate of transistor 112:MN13 is connected to NODE 112:N34. The series connection of transistors 112:MN13 and 112:MN18 is connected to one terminal of SWITCH 112:XSW7. The other terminal of SWITCH 112:XSW7 is connected to VSS. The common terminal of SWITCH 112:XSW8 is connected to the gate of transistor 112:MN18.

In FIG. 112, the A terminal of SWITCH 112:XSW9 is connected to VPERI. The B terminal of SWITCH 112:SXW9 is connected to NODE 112:N21. Node 112:N21 is connected to the B terminal of switch 112:XSW12. The A terminal of 112:XSW12 is connected to VSS. P channel transistors 112:MP10, 112:MP16, and N channel transistors 112:MN11 and 112:MN16 are connected in series and respectively biased between VPERI and VSS. The common terminal of SWITCH 112:XSW9 is connected to the gate of transistor 112:MP10. The series connection between 112:MP10 and 112:MP16 is connected to one terminal of SWITCH 112:XSW10. The other terminal of SWITCH 112:XSW10 is connected to VPERI. The gate of transistor 112:MP16 is connected to NODE 112:N21. The series connection of transistors 112:MP16 and 112:MN11 is connected to NODE 12:N22. The gate of transistor 112:MN11 is connected to NODE 112:N21. The series connection of transistors 12:MN11 and 112:MN16 is connected to one terminal of SWITCH 112:XSW1. The other terminal of SWITCH 112:XSW1 is connected to VSS. The common terminal of SWITCH 12:XSW12 is connected to the gate of transistor 12:MN16.

In FIG. 112, the A terminal of SWITCH 112:XSW13 is connected to VPERI, and the B terminal to 112:N22. Node 12:N22 is connected to the B terminal of switch 12:XSW16. The A terminal of SWITCH 112:SW16 is connected to VSS. The common terminal of SWITCH 12:XSW13 is connected to the gate of P channel transistor 112:MP9. The common terminal of SWITCH 12:XSW16 is connected to the gate of N channel transistor 112:MN15. The gate of P channel transistor 12:MP17 and the gate of N channel transistor 112:MN10 are connected to NODE 112:N22. P channel transistors 12:MP9 and 112:MP17 are connected in series with N channel transistors 112:MN10 and 112:MN15. One terminal of transistor 112:MP9 is connected to VPERI and one terminal of N channel transistor 112:MN15 is connected to VSS. The series connection of transistors 112:MP9 and 12:MP17 is connected to one terminal of SWITCH 12:XSW14. The other terminal of 112:XSW14 is connected to VPERI. The series connection of transistors 112:MP17 and 112:MN10 is connected to NODE 112:N5. The series connection of transistors 112:MN10 and 112:MN15 is connected to one terminal of SWITCH 112:XSW15. The other terminal of SWITCH 112:XSW15 is connected to VSS.

In the low power oscillator circuit LPOSC of FIG. 112, P channel transistors 112:MP4 and 112:MP1 are connected in series with N channel transistors 112:MN4 and 112:MN1. P channel transistor 112:MP4 is biased by VPERI and N channel 112:MN1 is biased by VSS. The gate of transistor 112:MP4 is connected to VSS and the gate of N channel transistor 112:MN1 is connected to VPERI. The gate of P channel transistor 112:MP1 and the gate of N channel transistor 112:MN4 are connected to NODE 112:N5. The series connection between transistors 112:MP1 and 112:MN4 is connected to NODE 112:N8. P channel transistors 112:MP5 and 112:MP2 are connected in series with N channel transistors 112:MN5 and 112:MN2. Transistor 112:MP5 is biased by VPERI and transistor 112:MN2 is biased by VSS. The gate of transistor 112:MP5 is connected to VSS and the gate of transistor 112:MN2 is connected to VPERI. The gates of transistors 112:MP2 and 112:MN5 are connected together and connected to NODE 112:N8. The series connection of transistors 112:MP2 and 112:MN5 is connected to NODE 112:N9.

Still referring to the low power oscillator circuit LPOSC of FIG. 112, P channel transistors 112:MP6 and 112:MP3 are connected in series with N channel transistors 112:MN6 and 112:MN3. Transistor 112:MP6 is biased by VPERI and transistor 112:MN3 is biased by VSS. The gate of transistor 112:MP6 is connected to VSS and the gate of transistor 112:MN3 is connected to VPERI. The gates of transistors 112:MP3 and 112:MN6 are connected to NODE 112:N9. The series connection of transistors 112:MP3 and 112:MN6 is connected to the input of inverter 112:IV1. The output of inverter of 112:IV1 is low power oscillator signal LPOSC. The output of inverter 112:IV1 is connected to the input of inverter 112:IV2. The output of inverter 112:IV2 is signal PBOSC.

FIG. 113 illustrates the VBB low power pump VBBLPP. Signal LPOSC is connected to the input of NOR gate 113:NR1 and is coupled through inverter 113:IV1 to the input of NOR gate 113:NR2. The output of NOR gate 113:NR1 is connected to the input of delay stage 113:XDEL2A. The output of delay stage 113:XDEL2A is connected to the other input of NOR gate 113:NR2. The output of NOR gate 113:NR2 is connected to the input of delay stage 113:XDEL2B. The output of delay stage 113:XDEL2B is connected to the other input of NOR gate 113:NR1. The output of NOR gate 113:NR1 is coupled through inverter 113:IV2 to node 113:N3. The output of NOR gate 113:NR2 is coupled through inverter 113:IV3 to NODE 113:N4.

In the VBB low power pump of FIG. 113, NODE 113:N3 is connected to the source and drain of transistor 113:MP1. The gate of P channel transistor 113:MP1 is connected to NODE 113:N1. NODE 113:N3 is connected to the A terminal of SWITCH 113:XSW1. The B terminal of SWITCH 113:XSW1 is connected to VPERI. The common terminal of SWITCH 113:XSW1 is connected to NODE 113:N10. The substrate of P channel transistor 113:MP1 is connected to NODE 113:N10. P channel transistor 113:MP2 couples NODE 113:N1 to VSS. Its substrate is connected to NODE 113:N10. Its gate is connected to NODE 113:N2. P channel transistors 113:MP3 and 113:MP6 are connected in series between NODES 113:N1 and 113:N2. The gate of transistor 113:MP3 is connected to NODE 113:N1. The gate of transistor 113:MP6 is connected to NODE 113:N2. The substrate of transistor 113:MP3 is connected to NODE 113:N10. P channel transistor 113:MP8 is connected between 113:N1 and VSS. Its substrate is connected to NODE 113:N10. Its gate is connected to VSS.

In FIG. 113, NODE 4 is connected to the source and drain of P channel transistor 113:MP4. The gate of transistor 113:MP4 is connected to NODE 113:N2. Its substrate is connected to the common terminal of SWITCH 113:XSW2 at NODE 113:N11. The A terminal of SWITCH 113:XSW2 is connected to NODE 113:N4. The B terminal of SWITCH 113:XSW2 is connected to VPERI. P channel transistor MP5 is connected between NODE 113:N2 and VSS. Its substrate is connected to NODE 113:N11. Its gate is connected to NODE 113:N1. P channel transistor 113:MP7 is connected between NODE 113:N2 and VSS. Its substrate is connected to NODE 113:N11. Its gate is connected to VSS. The series connection between P channel transistors 113:MP3 and 113:MP6 is connected to VBB. The substrate of the P-channel transistor 113:MP6 is connected to node 113:N11.

FIG. 114 illustrates the high power oscillator circuit HPOSC of the VBB generator circuits. The B terminal of SWITCH 114:XSW1 is connected to VPERI. The A terminal of SWITCH XSW1 is connected to NODE 114:N28 and to the A terminal of SWITCH 114:XSW4. The B terminal of SWITCH 14:XSW4 is connected to VSS. P channel transistors 114:MP1 and 114:MP2 and N channel transistors 114:MN1, 114:MN2 and 114:MN3 are connected in series. One terminal of transistor 114:MP1 is connected to VPERI and one terminal of transistor 114:MN3 is connected to VSS. The gate of transistor 114:MP1 is connected to NODE 114:N5, and to the center node of SWITCH 114:XSW1. The gate of transistor 114:MP2 and the gate of transistor 114:MN2 is connected to NODE 114:N28. The gate of transistor 114:MN1 is connected to NODE 114:N33. The gate of transistor 114:MN3 is connected to NODE N23, and to the center node of SWITCH 114:XSW4. The series connection of transistors 114:MP1 and 114:MP2 is connected to one terminal of SWITCH 114:XSW2. The other terminal of SWITCH 114:XSW2 is connected to the substrate of transistor 114:MP2 and to the VPERI. The series connection between transistors 114:MN2 and 114:MN3 is connected to one terminal of switch 114:XSW3. The other terminal of SWITCH 114:XSW3 is connected to VSS. The series connection of transistors 114:MP2 and 114:MN1 is connected to NODE 114:N27.

In FIG. 114, P channel transistor 114:MP3 is connected between VPERI and NODE 114:N27. The gate of transistor 114:MP3 is connected to NODE 114:N33. The B terminal of SWITCH 114:XSW5 is connected to VPERI. The A terminal of SWITCH 114:XSW5 is connected to NODE 114:N27 and to the A terminal of SWITCH 114:XSW8. The B terminal of SWITCH 114:XSW8 is connected to VSS. P channel transistors 114:MP4 and 114:MP5 are connected in series with N channel transistors 114:MN4 and 114:MN5. The gate of transistor 114:MP4 is connected to the common terminal of SWITCH 114:XSW5. The gate of transistor 114:MP5 and the gate of transistor 114:MN4 are connected to NODE 114:N27. The gate of transistor 114:MN5 is connected to the common terminal of SWITCH 114XSW8. The series connection of transistors 114:MP4 and 114:MP5 is connected to one terminal of SWITCH 114:XSW6. The other terminal of SWITCH 114:XSW6 is connected to the substrate of transistor 114:MP5 and to VPERI. The series connection of transistors 114:MN4 and 114:MN5 is connected to one terminal of SWITCH 114:XSW7. The other terminal of SWITCH 114:XSW7 is connected to VSS. The series connection of transistors 114:MP5 and 114:MN4 is connected to NODE 114:N29.

In FIG. 114, the B terminal of SWITCH 114:XSW9 is connected to VPERI. The A terminal of SWITCH 114:XSW9 is connected to NODE 114:N29 and to the A terminal of SWITCH 114:XSW12. The B terminal of SWITCH 114:XSW12 is connected to VSS. The P channel transistors 114:MP6 and 114:MP7 are connected in series with the N channel transistors 114:MN6 and 114:MN7. Transistor 114:MP6 is connected to VPERI and transistor 114:MN7 is connected to VSS. The gate of transistor 114:MP6 is connected to the common terminal of SWITCH 114:XSW9 while the gate of transistor 114:MN7 is connected to the common terminal of SWITCH 114:XSW12. The gate of transistors 114:MP7 and 114:MN6 are connected to NODE 114:N29. The series connection of transistors 114:MP6 and 114:MP7 is connected to one terminal of SWITCH 114:XSW10. The other terminal of SWITCH 114:XSW10 is connected to the substrate of transistor 114:MP7 and to VPERI. The series connection of transistors 114:MN6 and 114:MN7 is connected to one terminal of switch 114:XSW11. The other terminal of SWITCH 114:XSW11 is connected to VSS. The series connection of transistors 114:MP7 and 114:MN6 is connected to NODE 114:N30.

In FIG. 114, the B terminal of SWITCH 114:XSW13 is connected to VPERI. The A terminal of SWITCH 114:XSW13 is connected to NODE 114:N30 and to the A terminal of SWITCH 114:XSW16. The B terminal of SWITCH 114:XSW16 is connected to VSS. P channel transistors 114:MP8 and 114:MP9 are in series connection with N channel transistors 114:MN8 and 114:MN9. Transistor 114:MP8 is connected to VPERI and transistor 114:MN9 is connected to VSS. The gate of transistor 114:MP8 is connected to NODE 114:N2, the common terminal of SWITCH 114:XSW13. The gate of transistors 114:MP9 and 114:MN8 are connected to NODE 114:N30. The gate of transistor 114:MN9 is connected to the common terminal of SWITCH 114:XSW16. The series connection of transistors 114:MP8 and 114:MP9 is connected to one terminal of SWITCH 114:XSW14. The other terminal of SWITCH 114:XSW14 is connected to the substrate of transistor 114:MP9 and to VPERI. The series connection of transistors 114:MN8 and 114:MN9 is connected to one terminal of SWITCH 114:XSW15. The other terminal of SWITCH 114:XSW15 is connected to VSS. The series connection between transistors 114:MP9 and 114:MN8 is connected to NODE 114:N31. Still referring to the high power oscillator circuit of FIG. 31, the B terminal of SWITCH 114:XSW17 is connected to VPERI. The A terminal of SWITCH 114:XSW17 is connected to NODE 114:N31 and to the A terminal of SWITCH 114:XSW20. The B terminal of SWITCH 114:XSW20 is connected to VSS. P channel transistors 114:MP10 and 114:MP11 are in series connection with N channel transistors 114:MN10 and 114:MN11. Transistor 114:MP10 is connected to VPERI while transistor 114:MN11 is connected to VSS. The gate of transistor 114:MP10 is connected to the common terminal of SWITCH 114:XSW17. The gate of transistor 114:MP11 and the gate of transistor 114:MN10 are connected to node 114:N31. The gate of transistor 114:MN11 is connected to the common terminal of SWITCH 114:XSW20. The series connection of transistors 114:MP10 and 114:MP11 is connected to one terminal of SWITCH 114:XSW18. The other terminal of SWITCH 114:XSW18 is connected to the substrate of transistor 114:MP11 and to VPERI. The series connection between transistors 114:MN10 and 114:MN11 is connected to one terminal of SWITCH 114:XSW19. The other terminal of SWITCH 114:XSW19 is connected to VSS. The series connection between transistors 114:MP11 and 114:MN10 is connected to NODE 114:N34.

In FIG. 114, the B terminal of SWITCH 114:XSW21 is connected to VPERI. The A terminal of SWITCH 114:XSW1 is connected to NODE 114:N34 and to the A terminal of SWITCH 114:XSW24. The B terminal of SWITCH 114:XSW24 is connected to VSS. P channel transistors 114:MP12 and 114:MP13 are in series connection with N channel transistors 114:MN12, 114:MN13, and 114:MN14. Transistor 114:MP12 is connected to VPERI and transistor 114:MN14 is connected to VSS. The gate of transistor 114:MP12 is connected to the common terminal of SWITCH 114:XSW21. The gate of transistor 114:MP13 and the gate of transistor 114:MN13 are connected to NODE 114:N34. The gate of transistor 114:MN12 is connected to NODE 114:N33. The gate of transistor 114:MN14 is connected to the common terminal of SWITCH 114:XSW24. The series connection between transistors 114:MP12 and 114:MP13 is connected to one terminal of SWITCH 114:XSW22. The other terminal of SWITCH 114:XSW22 is connected to the substrate of transistor 114:MP13 and to VPERI. The series connection between transistors 114:MN13 and 114:MN14 is connected to one terminal of SWITCH 114:XSW23. The other terminal of SWITCH 114:XSW23 is connected to VSS. The series connection between transistors 114:MP13 and 114:MN12 is connected to node 114:N32.

In the high power oscillator circuit HPOSC of FIG. 114, the B terminal of SWITCH 114:XSW25 is connected to VPERI. The A terminal of SWITCH 114:XSW25 is connected to RL1_. The common terminal of SWITCH 114:SXW25 is connected to one input of NOR gate 114:NR1. The other input of NOR gate 114:NR1 is EXTODS. The output of NOR gate 114:NR1 is connected to NODE 114:N33. P channel transistor 114:MP14 is connected between VPERI and NODE 114:N32. Its gate is connected to NODE 114:N33. NODE 114:N32 is connected to the input of inverters 114:IV1 and 114:IV2. The output of inverter 114:IV1 is connected to NODE 114:N28. The output of inverter 114:IV2 is output signal HPOSC.

FIG. 115 depicts the VBB high power pump VBBHPP. Signal HPOSC is input to NOR gate 115:NR1 and is coupled through inverter 115:IV5 to NOR gate 115:NR2. The output of NOR gate 115:NR1 is connected to the input of delay stage 115:XDEL2A. The output of delay stage 115:XDEL2A is input to NOR gate 115:NR2. The output of NOR gate 115:NR2 is input to delay stage 115:XDEL2B. The output of delay stage 115:XDEL2B is input to NOR gate 115:NR1. The output of NOR gate 115:NR1 is coupled through the serially connected inverters 115:IV1, 115:IV2, and 115:IV6 to node 115:N3. The output of inverter 115:NR2 is coupled through the serially connected inverters 115:IV3, 115:IV4, and 115:IV7 to node 115:N4.

In FIG. 115, NODE 115:N3 is connected to the source and drain of P channel transistor 115:MP5 and to the A terminal of SWITCH 115:XSW1. The B terminal of SWITCH 115:XSW1 is connected to VPERI. The gate of transistor 115:MP5 is connected to NODE 115:N1. NODE 115:N4 is connected to the source and drain of transistor 115:MP6 and is connected to the A terminal of SWITCH 115:XSW2. The B terminal of SWITCH 115:XSW2 is connected to VPERI. The gate of transistor 115:MPG is connected to NODE 115:N2. The common terminal of SWITCH 115:XSW1 is connected to NODE 115:N14. The common terminal of SWITCH 115:XSW2 is connected to NODE 115:N15. The substrate of transistor 115:MP6 is connected to NODE 115:N15. The substrate of transistor 115:MP5 is connected to node 115:N14.

In the VBB high power pump VBBHPP of FIG. 115, NODE 115:N1 is coupled to VSS by P channel transistor 115;MP2. The gate of transistor 115:MP2 is connected to NODE 115:N2. NODE 115:N2 is coupled to VSS by transistor 115:MP1. The gate of transistor 115:MP1 is connected to NODE 115:N1. One terminal of P channel transistor 115:MP8 is connected to NODE 115:N1. The other terminal and gate of transistor 115:MP8 are connected to VSS. The substrate of transistor 115:MP8 is connected to node 115:N14. One terminal of P channel transistor 115:MP7 is connected to NODE 115:N2. The other terminal and gate of transistor 115:MP7 are connected to VSS. The substrate of transistor 115:MP7 is connected to NODE 115:N15. P channel transistors 115:MP4 and 115:MP3 are connected between NODE 115:N1 and 115:N2. The gate of transistor 115:MP4 is connected to NODE 115:N1 and the gate of transistor 115:MP3 is connected to NODE 115:N2. The substrate of transistor 115:MP4 is connected to NODE 115:N14 and the substrate of transistor 115:MP3 is connected to NODE 115:N15. The output VBB is connected to the series connection between transistors 115:MP4 and 115:MP3.

FIG. 116 depicts the booster oscillator circuit BOSC. FIG. 116 illustrates the high power oscillator circuit HPOSC of the VBB generator circuits. The A terminal of SWITCH 116:XSW1 is connected to VDD. The B terminal of SWITCH XSW1 is connected to NODE 116:N28 and to the B terminal of SWITCH 116:XSW4. The A terminal of SWITCH 14:XSW4 is connected to VSS. P channel transistors 116:MP1 and 116:MP2 and N channel transistors 116:MN1, 116:MN2 and 116:MN3 are connected in series. One terminal of transistor 116:MP1 is connected to VDD and one terminal of transistor 116:MN3 is connected to VSS. The gate of transistor 116:MP1 is connected to NODE 116:N5, the center terminal of SWITCH 116:XSW1. The gate of transistor 116:MP2 and the gate of transistor 116:MN2 are connected to NODE 116:N28. The gate of transistor 116:MN1 is connected to NODE 116:N33. The gate of transistor 116:MN3 is connected to NODE N23, the center terminal of SWITCH 116:XSW4. The series connection of transistors 116:MP1 and 116:MP2 is connected to one terminal of SWITCH 116:XSW2. The other terminal of SWITCH 116:XSW2 is connected to the substrate of transistor 116:MP2 and to the VDD. The series connection between transistors 116:MN2 and 116:MN3 is connected to one terminal of switch 116:XSW3. The other terminal of SWITCH 116:XSW3 is connected to VSS. The series connection of transistors 116:MP2 and 116:MN1 is connected to NODE 116:N27.

In FIG. 116, P channel transistor 116:MP3 is connected between VDD and NODE 116:N27. The gate of transistor 116:MP3 is connected to NODE 116:N33. The A terminal of SWITCH 116:XSW5 is connected to VDD. The B terminal of SWITCH 116:XSW5 is connected to NODE 116:N27 and to the B terminal of SWITCH 116:XSW8. The A terminal of SWITCH 116:XSW8 is connected to VSS. P channel transistors 116:MP4 and 116:MP5 are connected in series with N channel transistors 116:MN4 and 116:MN5. The gate of transistor 116:MP4 is connected to the common terminal of SWITCH 116:XSW5. The gate of transistor 116:MP5 and the gate of transistor 116:MN4 is connected to NODE 116:N27. The gate of transistor 116:MN5 is connected to the common terminal of SWITCH 116:XSW8. The series connection of transistors 116:MN4 and 116:MN5 is connected to one terminal of SWITCH 116:XSW7. The other terminal of SWITCH 116:XSW7 is connected to VSS. The series connection of transistors 116:MP5 and 116:MN4 is connected to NODE 116:N29. The series connection of transistors 116:MP4 and 116:MP5 is connected to one terminal of SWITCH 116:XSW6. The other terminal of SWITCH 116:XSW6 is connected to the substrate of transistor 116:MP5 and to VDD.

In FIG. 116, the A terminal of SWITCH 116:XSW9 is connected to VDD. The B terminal of SWITCH 116:XSW9 is connected to NODE 116:N29 and to the B terminal of SWITCH 116:XSW12. The A terminal of SWITCH 116:XSW12 is connected to VSS. The P channel transistors 116:MP6 and 116:MP7 are connected in series with the N channel transistors 116:MN6 and 116:MN7. Transistor 116:MP6 is connected to VDD and transistor 116:MN7 is connected to VSS. The gate of transistor 116:MP6 is connected to the common terminal of SWITCH 116:XSW9 while the gate of transistor 116:MN7 is connected to the common terminal of SWITCH 116:XSW12. The gate of transistors 116:MP7 and 116:MN6 are connected to NODE 116:N29. The series connection of transistors 116:MP6 and 116:MP7 is connected to one terminal of SWITCH 116:XSW10. The other terminal of SWITCH XSW10 is connected to the substrate of transistor 116:MP7 and to VDD. The series connection of transistors 116:MN6 and 116:MN7 is connected to one terminal of switch 116:XSW11. The other terminal of SWITCH 116:XSW11 is connected to VSS. The series connection of transistors 116:MP7 and 116:MN6 is connected to NODE 116:N30.

In FIG. 116, the A terminal of SWITCH 116:XSW13 is connected to VDD. The B terminal of SWITCH 116:XSW13 is connected to NODE 116:N30 and to the B terminal of SWITCH 116:XSW16. The A terminal of SWITCH 116:XSW16 is connected to VSS. P channel transistors 116:MP8 and 116:MP9 are in series connection with N channel transistors 116:MN8 and 116:MN9. Transistor 116:MP8 is connected to VDD and transistor 116:MN9 is connected to VSS. The gate of transistor 116:MP8 is connected to NODE 116:N2, the common terminal of SWITCH 116:XSW13. The gate of transistors 116:MP9 and 116:MN8 is connected to NODE 116:N30. The gate of transistor 116:MN9 is connected to the common terminal of SWITCH 116:XSW16. The series connection of transistors 116:MP8 and 116:MP9 is connected to one terminal of SWITCH 116:XSW14. The common terminal of SWITCH 116:XSW14 is connected to the substrate of transistor 116:MP9 and to VDD. The series connection of transistors 116:MN8 and 116:MN9 is connected to one terminal of SWITCH 116:XSW15. The other terminal of SWITCH 116:XSW15 is connected to VSS. The series connection between transistors 116:MP9 and 116:MN8 is connected to NODE 116:N31.

Still referring to the high power oscillator circuit of FIG. 116, the A terminal of SWITCH 116:XSW17 is connected to VDD. The B terminal of SWITCH 116:XSW17 is connected to NODE 116:N31 and to the B terminal of SWITCH 116:XSW20. The A terminal of SWITCH 116:XSW20 is connected to VSS. P channel transistors 116:MP10 and 116:MP11 are in series connection with N channel transistors 116:MN10 and 116:MN11. Transistor 116:MP10 is connected to VDD while transistor 116:MN11 is connected to VSS. The gate of transistor 116:MP10 is connected to the common terminal of SWITCH 116:XSW17. The gate of transistor 116:MP11 and the gate of transistor 116:MN10 are connected to node 116:N31. The gate of transistor 116:MN11 is connected to the common terminal of SWITCH 116:XSW20. The series connection of transistors 116:MP10 and 116:MP11 is connected to one terminal of SWITCH 116:XSW18. The other terminal of SWITCH 116:XSW18 is connected to the substrate of transistor 116:MP11 and to VDD. The series connection between transistors 116:MN1O and 116:MN11 is connected to one terminal of SWITCH 116:XSW19. The other terminal of SWITCH 116:XSW19 is connected to VSS. The series connection between transistors 116:MP11 and 116:MN10 is connected to NODE 116:N34.

In FIG. 116, the A terminal of SWITCH 116:XSW21 is connected to VDD. The B terminal of SWITCH 116:XSW1 is connected to NODE 116:N34 and to the B terminal of SWITCH 116:XSW24. The A terminal of SWITCH 116:XSW24 is connected to VSS. P channel transistors 116:MP12 and 116:MP13 are in series connection with N channel transistors 116:MN12, 116:MN13, and 116:MN14. Transistor 116:MP12 is connected to VDD and transistor 116:MN14 is connected to VSS. The gate of transistor 116:MP12 is connected to the common terminal of SWITCH 116:XSW21. The gate of transistor 116:MP13 and the gate of transistor 116:MN13 are connected to NODE 116:N34. The gate of transistor 116:MN12 is connected to NODE 116:N33. The gate of transistor 116:MN14 is connected to the common terminal of SWITCH 116:XSW24. The series connection between transistors 116:MP12 and 116:MP13 is connected to one terminal of SWITCH 116:XSW22. The other terminal of SWITCH 116:XSW22 is connected to the substrate of transistor 116:MP13 and to VDD. The series connection between transistors 116:MN13 and 116:MN14 is connected to one terminal of SWITCH 116:XSW23. The other terminal of SWITCH 116:XSW23 is connected to VSS. The series connection between transistors 116:MP13 and 116:MN12 is connected to node 116:N32. One input to the NOR gate 116:NR1 is the input signal VBS_. The other input of NOR gate 116:NR1 is EXTODS. The output of NOR gate 116:NR1 is connected to NODE 116:N33. P channel transistor 116:MP14 is connected between VDD and NODE 116:N32. Its gate is connected to NODE 116:N33. NODE 116:N32 is connected to the input of inverters 116:IV1 and 116:IV2.

The output of inverter 116:IV1 is connected to NODE 116:N28. The output of inverter 116:IV2 is output signal BOSC. The output BOSC is coupled through inverter 116:IV3 to the output BOSC_. Inverters 116:IV1, 116:IV2, and 116:IV3 are all biased by VDD.

FIG. 117 illustrates the VBB booster pump circuit VBBPB. The devices in circuit VBBPB are biased by VDD. The input signal BOSC is connected to one input of NOR gate 117:NR1 and is coupled through inverter 117:IV5 to one input of NOR gate 117:NR2. The output of NOR gate 117:NR2 is connected to NODE 117:N12. The input of delay device 117:XDEL2B is connected to NODE 117:N2. The output of delay device 117:XDEL2B is connected to the other input of NOR gate 117:NR1. The output of NOR gate 117:NR1 is connected to NODE 177:N11. NODE 117:N11 is connected to the input of delay device 117:XDEL2A. The output of delay device 117:XDEL2A is connected to the other input of NOR gate 117:NR2. NODE 117:N11 is coupled thorugh inverters 117:IV1, 117:IV2, and 117:IV3 to NODE 117:N3. NODE 117:N12 is coupled through inverters 117:IV3, 117:IV4, and 117:IV7 to NODE 117:N4.

In FIG. 117, NODE 117:N3 is connected to the source and drain of P channel transistor 117:MP5 and to the A terminal of SWITCH 117:XSW1. The B terminal of SWITCH 117:XSW1 is connected to VDD. The gate of transistor 117:MP5 is connected to NODE 117:N1, and the substrate of 117:MP5 is connected to node 117:N17. NODE 117:N4 is connected to the source and drain of transistor 117:MP6 and is connected to the A terminal of SWITCH 117:XSW2. The B terminal of SWITCH 117:XSW2 is connected to VDD. The gate of transistor 117:MP6 is connected to NODE 117:N2. The common terminal of SWITCH 117:XSW1 is connected to NODE 117:N17. The common terminal of SWITCH 117:XSW2 is connected to NODE 117:N18. The substrate of transistor 117:MP6 is connected to NODE 117:N8.

In the VBB high power pump VBBHPP of FIG. 117, NODE 117:N1 is coupled to VSS by P channel transistor 117:MP2. The gate of transistor 117:MP2 is connected to NODE 117:N2. NODE 117:N2 is coupled to VSS by transistor 117:MP1. The gate of transistor 117:MP1 is connected to NODE One terminal of P channel transistor 117:MP8 is connected to NODE 117:N1. The other terminal and gate of transistor 117:MP8 are connected to VSS. The substrate of transistor 117:MP8 is connected to node 117:N17. One terminal of P channel transistor 117:MP7 is connected to NODE 117:N2. The other terminal and gate of transistor 117:MP7 are connected to VSS. The substrate of transistor 117:MP7 is connected to NODE 117:N18. P channel transistors 117:MP4 and 117:MP3 are connected between NODES 117:N1 and 117:N2. The gate of transistor 117:MP4 is connected to NODE 117:N1 and the gate of transistor 117:MP3 is connected to NODE 117:N2. The substrate of transistor 117:MP4 is connected to NODE 117:N17 and the substrate of transistor 117:MP3 is connected to NODE 117:N18. The output VBB is connected to the series connection between transistors 117:MP4 and 117:MP3.

FIG. 118 illustrates the VBB detector circuit VBBDET. P channel transistor 118:MP3 and N channel transistors 118:MN6 and 118:MN7 are connected in series and respectively biased between VDD and VSS. The gates of transistors 118:MP3 and 118:MN6 are connected together at the series connection between transistors 118:MP3 and 118:MN6 at node 118:N13. The gate of transistor 118:MN7 is connected to the series connection of 118:MN6 and 118:MN7. P channel transistors 118:MP4 and 118:MP5 are connected in series with N channel transistor 118:MN8 and are biased respectively between VDD and VSS. The gate of transistor 118:MP4 is connected to the series connection of transistors 118:MP4 and 118:MP5, together with the substrate of transistor 118:MP5. The gate of transistor 118:MP5 is connected to the series connection between 118:MP5 and 118:MN8 at node 118:N16. The gate of transistor 118:MN8 is connected to NODE 118:N13. P channel transistor 118:MP6 and N channel transistors 118:MN9 and 118:MN10 are connected in series and biased respectively between VDD and VSS. The gate of transistor 118:MP6 is connected to node 118:N16. The gate of transistor 118:MN9 is connected to the series connection between transistors 118:MP6 and 118:MN9 at the NODE 118:VGN17. The gate of transistor 118:MN10 is connected to the series connection of transistors 118:MN9 and 118:MN10 at NODE 118:VGVT. The gate of N channel transistor 118:CNW5 is connected to NODE 118:VGVT. The source and drain of transistors 118:CNW5 are connected together and connected to VSS.

In the VBB detection circuit of FIG. 118, NODE 118:VGN17 is connected to the A terminal of SWITCH 118:XSW1 and to the B terminal of SWITCH 118:XSW2. The B terminal of SWITCH 118:XSW1 and the A terminal of SWITCH 118:XSW2 are connected to VSS. The common terminal of SWITCH 118:XSW1 is connected to the gate of N channel transistor 118:MN11. The common terminal of SWITCH 118:XSW2 is connected to the gate of N channel transistor 118:MN12. P channel trnsistor 118:MP7 and N channel transistor 118:MN11 are connected in series and respectively biased between VDD and VSS. The gate of transistor 118:MP7 is connected to the series connection between transistors 118:MP7 and 118:MN11 at node 118:VN18. N channel transistor 118:MN12 is connected between NODE 118:VN18 and VSS. The gate of N channel transistor 118:CNW1 is connected to NODE 118:VN18. The source and drain of transistor 118:CNW1 are connected together and connected to VSS.

In VBB detection circuit of FIG. 118, P channel transistor 118:MP1 and P channel transistor 118:MP8 are connected in series respectively between VDD and NODE 118:N7. The gate of transistor 118:MP1 is connected to NODE 118:VN18. The gate of transistor 118:MP8 is connected to NODE 118:N7. Node 118:N7 is connected to the gate of N channel transistor 118:CNW2. The source and drain of transistors 118:CNW2 are connected together and connected to VBB. The series connection of transistors 118:MP1 and 118:MP8 is connected to NODE 118:N1. The gate of P channel transistor 118:MP12 is connected to NODE 118:N1. The source and drain of transistor 118:MP12 are connected together and connected to VDD. Node 118:N1 is connected to the substrate of transistor 118:MP8 and is connected to the B terminal of SWITCH 118:XSW5. The A terminal of SWITCH 118:XSW5 is connected to NODE 118:N7. The common terminal of SWITCH 118:XSW5 is connected to the substrate of P channel transistor 118:MP9. P channel transistors 118:MP9, 118:MP10, and 118:MP11 are connected in series respectively between NODE 118:N7 and VBB. The gate of transistor 118:MP9 is connected to the series connection of transistors 118:MP9 and 118:MP10 at NODE 118:N8. The gate of transistor 118:MP10 is connected to the series connection of 118:MP10 and 118:MP11 and is connected to the B terminal of SWITCH 118:XSW6. The A terminal of SWITCH 118:XSW6 is connected to NODE 8 and to the substrate of transistor 118:MP10. The gate of transistor 118:MP11 is connected to VBB. The substrate of transistor 118:MP11 is connected to the common terminal of SWITCH 118:XSW6. N channel transistor 118:MN13 is connected between NODE 118:N7 and NODE 118:N8. Its gate is connected to NODE 118:N6. The gate of N channel transistor 118:CNW3 is connected to NODE 118:N8. Its source and drain are connected together and connected to VBB.

In the VBB detector circuit of FIG. 118, N channel transistors 118:MN14 and 118:MN15 are connected in series respectively between VDD and NODE 118:N3. The gate of transistor 118:MN14 is connected to NODE 118:N1. The gate of transistor 118:MN15 is connected to the series connection of transistors 118:MN14 and 118:MN15. NODE 118:N3 is connected to one terminal of SWITCH 118:XSW3. The other terminal of SWITCH XSW3 is connected to one terminal of transistor 118:MN16. The other terminal of transistor 118:MN16 is connected to VSS. Its gate is connected to node 118:VGVT. P channel transistor 118:MP2 couples NODE 118:N3 to VDD. Its gate is connected to NODE 118:VN18. The gate of P channel transistor 118:MP13 is connected to NODE 118:N3. Its source, drain, and substrate are connected together and connected to VDD. One terminal of SWITCH 118:XSW4 is also connected to NODE 118:N3. N channel transistor 118:MN17 is connected between the other terminal of SWITCH 118:XSW4 and VSS. Its gate is connected to NODE 118:VGN17.

In FIG. 118, NODE 118:N3 is connected to the input of inverter 118:IV1. Inverter 118:IV1 is biased by VDD. The output of inverter 118:IV1 is connected to the gate of N channel transistor 118:MN18, the gate of P channel transistor 118:MP14, and the gate of N channel transistor 118:CNW6. The source and drain of transistor CNW6 are connected together and connected to VSS. N channel transistor 118:MN18 and P channel transistor 118:MP14 are connected in series and biased respectively between VDD and VSS. Their series connection is connected to NODE 118:N26. The substrate of transistor 118:MP14 is connected to NODE 118:N26. The gate of N channel transistor 118:CNW4 is connected to NODE 118:N26. Its source and drain are connected together and connected to VSS. P channel transistor 118:MP15 is connected between VDD and NODE 118:N26. Its gate is connected to the output of inverter 118:IV2 at NODE 118:N5. NODE 118:N26 is connected to the input of inverter 118:IV2. Inverter 118:IV2 is biased by VDD. N channel transistor 118:MN19 is connected between NODE 118:N26 and VSS. Its gate is connected to NODE 118:N5. Node 118:N5 is connected to the input of inverter 118:IV3. Inverter 118:IV3 is biased by VDD. The output of inverter 118:IV3 is connected to NODE 118:N6.

In the VBB detector circuit, VBBDET of FIG. 118, NODE 118:N6 is connected to the input of NAND gate 118:ND2 and is coupled through inverter 118:IV5 to the input of NAND gate 118:ND1. The input signal BOSC is coupled through inverter 118:IV4 to the other input of NAND gates 118:ND1 and 118:ND2. The output of NAND gate 118:ND1 is connected to the input of NAND gate 118:ND3. The output of NAND gate 118:ND2 is connected to the input of NAND gate 118:ND4. The output of NAND gate 118:ND3 is connected to the other input of NAND gate 118:ND4. The output of NAND gate 118:ND4 is connected to the other input of NAND gate 118:ND3. NAND gates 118:ND1 through 118:ND4 and inverters 118:IV4 and 118:IV5 are biased by VDD. The output of NAND gate 118:ND4 is also connected to the output signal VBS_.

FIG. 119 illustrates the level detection circuit LVLDET. Signal PBOSC is connected to inverter 119:IV1. The output of inverter 119:IV1 is connected to the input of delay stage 119:XD4. The output of delay stage 119:XD4 is connected to the input of divide by two device 119:XDB2. The output of divide by two device 119:XDB2 is connected to the input of inverter 119:IV2 at node 119:B. The output of inverter 119:IV2 is connected to NODE 119:B_.

In FIG. 119, P channel transistor 119:MP1 is connected between VPERI and NODE 119:N1. Its gate is connected to NODE 119:B. The gate of N channel transistor 119:C1 is connected to NODE 119:N1. Its source and drain are connected together and connected to VSS. N channel transistor 119:MN1 is connected between NODE 119:N1 and NODE 119:N2. Its gate is connected to NODE 119:B. N channel transistor 119:MN2 is connected between NODE 119:N2 and VSS. Its gate is connected to NODE 119:B_. The gate of N channel transistor 119:C2 is connected to NODE 119:N2. Its source and drain are connected together and connected to VSS.

In the level detection circuit of FIG. 119, the gate of N channel transistor MN3 is connected to NODE 119:N2. The transistor 119:MN3 is connected between NODE 119:N3 and VSS. Transistor 119:MN3A is also connected between NODE 119:N3 and VSS. Its gate is connected to NODE 119:N4. P channel transistor 119:MP3 is connected between VPERI and NODE 119:N3. Its gate is connected to NODE 119:B. P channel transistor 119:MP3A is also connected between VPERI and NODE 119:N3. Its gate is connected to NODE 119:N4. The gate of N channel transistor 119:C3 is connected to NODE 119:N3. Its source and substrate are connected together and connected to VSS. The gate of N channel transistors 119:MN3A and 119:C4 are connected together and connected to NODE 119:N4. The source and substrate of transistor 119:C4 are connected together and connected to VSS.

In FIG. 119, the output of inverter 119:IV1 is connected to the input of NAND gate 119:ND1. The other input to NAND gate 119:ND1 is NODE 119:B. The output of NAND gate 119:ND1 is connected to NODE 119:C_. NODE 119:C_ is connected to the input of inverter 119:IV3. The output of inverter 119:IV3 is connected to NODE 119:C. P channel transistor 119:MP4 is connected between NODE 119:B and NODE 119:N4. Its gate is connected to NODE 119:N3. N channel transistor 119:MN4 is connected between NODE 119:N4 and VSS. Its gate is connected to NODE 119:B_. NODE 119:N4 is connected to the input of pass gate device 119:PG1. The N channel gate of pass gate device 119:PG1 is connected to NODE 119:C. The P channel gate of device 119:PG1 is connected to NODE 119:C_. The output of pass gate device 119:PG1 is connected to NODE 119:N5.

In the level detection circuit of FIG. 119, NODE 119:N5 is coupled through inverter 119:IV4 to NODE 119:N6. NODE 119:N6 is coupled through inverter 119:IV6 to the input of pass gate device 119:PG2. The output of pass gate device 119:PG2 is connected to NODE 119:N5. The N channel gate of the pass gate device 119:PG2 is connected to NODE 119:C_ and the P channel gate of the pass gate device is connected to NODE 119:C. NODE 6 is coupled through inverter 119:IV5 to one terminal of SWITCH 119:XSW1. The other terminal of SWITCH 119:XSW1 is connected to the PUD terminal. SWITCH 119:XSW1 is illustrated in the open position.

FIG. 120 depicts the power of detection circuit PUD. P channel transistors 120:MP1 and 120:MP2 are connected in series between VPERI and NODE 120:N2. The gate of transistor 120:MP1 and the substrate of transistor 120:MP2 are connected to the series connection of transistors 120:MP1 and 120:MP2. The gate of transistor 120:MP2 is connected to VSS. NODE 120:N2 is connected to the B terminal of SWITCH 120:XSW1. The A terminal of SWITCH 120:XSW1 is connected to VSS. The common terminal of SWITCH 120:XSW1 is connected to one terminal of N channel low threshold voltage transistor 120:MN1. The other terminal and the gate of transistor 120:MN1 are connected to VSS. P channel transistor 120:MP4 is connected between VPERI and NODE 120:N2. Its gate is connected to NODE 120:N3. P channel transistor 120:MP3 and N channel transistors 120:MN6 and 120:MN2 are connected in series and biased respectively between VPERI and VSS. Their gates are connected to NODE 120:N2. The series connection of transistors 120:MP3 and 120:MN6 is connected to NODE 120:N3. The gate of N channel low threshold voltage transistor 120:MN7 is connected to NODE 120:N3. Transistor 120:MN7 is connected between VPERI and the series connection of transistors 120:MN6 and 120:MN2. The gate of P channel transistor 120:MP8 is connected to NODE 120:N3. Its source, drain and substrate are connected to VPERI.

In the power up detector circuit PUD of FIG. 120, NODE 120:N2 is connected to the A terminals of SWITCHES 120:XSW2 and 120:XSW3. The B terminals of SWITCHES 120:XSW2 and 120:XSW3 are connected to VSS. The common terminal of SWITCH 120:XSW2 is connected to one terminal of N channel low threshold voltage transistor 120:MN5. The other terminal of transistor 120:MN5 is connected to VSS. The gate of transistor 120:MN5 is connected to VPERI. The common terminal of SWITCH 120:XSW3 is connected to one terminal of P channel transistor 120:MP7. The substrate of transistor 120:MP7 is connected to VPERI. The other terminal of transistor 120:MP7 is connected to VSS. The gate of transistor 120:MP7 is connected to VBB. The gate of N-channel transistor 120:CNW1 is connected to node 120:N2, its source and drain are tied together and connected to VSS.

In FIG. 120, the gate of P channel transistor 120:MP5 and the gate of N channel low threshold voltage transistor 120:MN3 are connected to NODE 120:N3. Transistors 120:MP5 and 120:MN3 are connected in series and biased respectively between VPERI and VSS. Their series connection is connected to the gate of N channel transistor 120:CNW2 and is coupled through inverter 120:XIV2 to node 120:N5. The source and drain of transistor 120:CNW2 are connected together and connected to VSS. The gate of P channel transistor 120:MP9 is connected to NODE 120:N5. The source, drain and substrate of transistor 120:MP9 are connected together and connected to VPERI. The gate of P channel transistor 120:MP6 and the gate of N channel low threshold voltage transistor 120:MN4 are connected together and connected to NODE 120:N5. Transistor 120:MP6 and 120:MN4 are connected together and biased respectively between VPERI and VSS. Their series connection is connected to NODE 120:N10. The gate of N channel transistor 120:CNW3 is connected to NODE 120:N10. Its source and drain are connected together and connected to VSS. Node 10 is connected to one terminal of SWITCH 120:XSW4. The other terminal of SWITCH 120:XSW4 is connected to the output PUD. SWITCH 120:XSW4 is illustrated in the closed position.

FIG. 121 depicts the reset and initialization detector circuit PRERID. P channel transistors 121:MP7 and 121:MP8 are connected in parallel between VPERI and NODE 121:N10. The gate of transistor 121:MP7 is connected to terminal EXTODS. The gate of transistor 121:MP8 is connected to terminal PUD. N channel transistors 121:MN9 and 121:MN8 are connected in series respectively between NODE 121:N10 and VSS. The gate of transistor 121:MN9 is connected to terminal EXTODS. The gate of transistor 121:MN8 is connected to NODE 121:N12. One terminal and the gate of transistor 121:MN12 is connected to NODE 121:N12. The other terminal of transistor 121:MN12 is connected to VSS. The gate of N channel transistor 121:MN12 is connected to node 121:N12. One terminal of transistor 121:MN16 is connected to NODE 121:N12. The other terminal of N channel transistor 121:MN16 is connected to VSS. Its gate is connected to NODE 121:N6. N channel transistor 121:MN15 is connected between VPERI and NODE 121:N12. Its gate is connected to the output terminal PRERID. N channel transistor 121:MN14 is connected between NODE 121:N12 and VSS. Inverter 125:IV5 couples the input PUD to the gate of transistor 121:MN14.

In FIG. 121, N channel transistor 121:MN3 is connected between NODES 121:N2 and NODES 121:N3. Its gate is connected to VSS. NODE 121:N2 is connected to the gate of P channel transistor 121:MP11. Its source, drain, and substrate are connected to VSS. NODE 121:N2 is also connected to one terminal of SWITCH 121:SW7 and to one terminal and the gate of N channel low threshold voltage transistor 121:MN2. The other terminal of SWITCH 121:SW7 and the other terminal of transistor 121:MN2 are connected to NODE 121:N1. Node 121:N1 is connected to one terminal of SWITCH 121:SW6 and to one terminal and the gate of N channel transistor 121:MN1. The other terminal of SWITCH 121:SW6 is connected to the other terminal of transistor 121:MN1 that is connected to VBB.

In the reset and initialization detector circuit PRERID, P channel transistor 121:MP1 and N channel transistor 121:MN4 are connected in series respectively between VPERI and NODE 121:N3. Their gates are connected to PUD. NODE 121:N4 is connected to the series connection of transistors 121:MP1 and 121:MN4. The gate of N channel transistor 121:CNW3 is connected to NODE 121:N4. Its source and drain are connected together and connected to VSS. P channel transistors 121:MP2 and 121:MP4 are connected in series respectively between VPERI and VSS. The gate of transistor 121:MP2 is connected to the input PUD. The gate of transistor 121:MP4 is connected to NODE 121:N4. The substrate of transistor 121:MP4 is connected to VPERI. The series connection between transistors 121:MP2 and 121:MP4 is connected to NODE 121:N5.

In FIG. 121, N channel transistor 121:MN11 couples NODE 121:N10 to VSS. Its gate is connected to NODE 121:N11. NODE 121:N11 is connected to the gate of N channel transistor 121:CNW4. Its source and drain are connected to VSS. NODE 121:N10 is connected to the gate of P channel transistor 121:MP9 and to the gate of N channel transistor 121:MN10. The gate of P-channel transistor 121:MP10 is connected to 121:N10, while its source drain and substrate are all tied to VPERI. Transistor 121:MP9 is connected between VPERI and NODE 121:N11. Transistor 121:MN10 is connected between NODE 121:N11 and VSS. The gate of N channel transistor 121:MN7 is also connected to NODE 121:N11. Transistor 121:MN7 is connected between NODE 121:N5 and VSS. P channel transistor 121:MP6 has its gate connected to NODE 121:N5. The source, drain and substrate of transistor 121:MP6 are connected to VPERI.

In the reset and initialization detector circuit PRERID of FIG. 120, P channel transistor 121:MP5 and N channel transistor 121:MN5 are connected in series respectively between VPERI and VSS. Their series connection is connected to NODE 121:N5. Their gates are connected to NODE 121:N6. The gate of P channel transistor 121:MP3 and the gate of N channel low threshold voltage transistor 121:MN6 is connected to NODE 121:N5. Transistor 121:MP3 and transistor 121:MN6 are connected in series respectively between VPERI and VSS. Their series connection is connected to NODE 121:N6. The gate of N-channel transistor 121:CNW1 is connected to NODE 121:N6. The source and drain of 121:CNW1 are connected together and connected to VSS. NODE 121:N6 is coupled through inverter 121:IV1 to the output PRERID. FIG. 125 illustrates the Top Plate Holdoff Circuit, TPLHO. The PUD signal is connected to the input of level shifter 125:XSHF1. The output of level shifter 125:XSHF1 is coupled through inverter 125:XIV1 to one input of NOR gate 125:XNR3. The PRERID signal is connected to the input of level shifter 125:XSHF2. The output of level shifter 125:XSHF2 is connected to the other input of NOR gate 125:XNR3. The output of NOR gate 125:XNR3 is connected to inverter 125:XIV2. The output of inverter 125:XIV2 is the signal TPLHO. The output of inverter 125:XIV2 is connected to inverter 125:IV1. The output of inverter 125:IV1 is TPLHO_.

In the Top Plate Holdoff Circuit of FIG. 125, the PRERID signal is coupled through inverter 125:XIV3 to one input of NAND gate 125:XND1. The output of NAND gate 125:XND1 is coupled through inverters 125:XIV5 and 125:XIV6. The output of inverter 125:XIV6 is the RID signal. The output of NAND gate 125:XND1 is connected to one input of NAND gate 125:XND2 VBS_ is coupled through inverter 125:XIV4 to the other input of NAND gate 125:XND. The output of NAND gate 125:XND2 is connected to the other input of NAND gate 125:XND1.

FIG. 126 illustrates the TTLCLK circuit. The TTLCLK circuit has four input signals a single output signal, and two power reference inputs.

The first input signal, EXREF, is coupled to the "B" terminal of the SWITCH 126:SW1, to a PROBE PAD, and through the N-channel device 126:MN10 to ground. The gate terminal of the N-channel device 126:MN10 is coupled to the reference voltage VPERI. The second input signal, ENABLE, is coupled to the second input of the NAND gate 126:ND1, the gate terminal of the P-channel transistor 126:MP2, and the gate terminal of the N-channel transistor 126:MN11. The third input signal, CMOSCK, is coupled to the first input of the NAND gate 126:ND1, the gate terminal of the P-channel device 126:MP1, and the gate terminal of the N-channel device 126:MN5. The fourth input signal, TTL, is coupled to the gate terminals of the N-channel devices 126:MN3 and 126:MN2, and also coupled to the gate terminal of the P-channel device 126:MP3. The A terminal of the SWITCH 126:SW1 is coupled to the reference voltage VPR. The common terminal of the SWITCH 126:SW1 is coupled to the gate terminal of the low threshold voltage N-channel device 126:MN1. The signal G_DIS is coupled to the input of the inverter 126:IV1 and further coupled to the gate terminal of the N-channel device 126:MN12. The output of the inverter 126:IV1 is coupled to the node 126:N1 through the low threshold voltage N-channel device 126:MN1. Node 126:N1 is coupled through the P-channel devices in parallel, 126:MP1 and 126:MP2 to the Node 126:N2. Node 126:N2 is coupled through the P-channel device 126:MP3 to the node 126:N4. Node 126:N4 is coupled through the P-channel device 126:MP5 to the reference voltage VPERI, Node 126:N4 is further coupled through the N-channel device 126:MN2 to the Node 126:N5, the Node 126:N4 is also coupled through the N-channel device 126:MN12 to ground, and through the serially connected N-channel devices 126:MN5 and 126:MN11 to ground, Node 126:N4 is further connected to the gate terminal of the P-channel device 126:MP6 and to the gate terminal of the N-channel device 126:MN6. Node 126:N5 is coupled through the N-channel device 126:MN3 to VSSAB, and through the four P-channel devices 126:MP4_D, 126:MP4_C, 126:MP4_B and 126:MP4_A to the reference voltage VPERI. The output of the NAND gate 126:ND1 is coupled to the gate terminal of the P-channel device 126:MP8, and to the gate terminal of the N-channel device 126:MN9. The output node labeled OUT is coupled to the OUT signal and further coupled to the gate terminal of the P-channel device 126:MP5, through the P-channel device 126:MP6 to the reference voltage VPERI, through the serially connected N-channel devices 126:MN9 and 126:MN6 to ground, and to the B terminal of the SWITCHES 126:MP4_B, 126:MP4_C, 126:MP4_D, and to the A terminal of the SWITCH 126:MP4_A. The output terminal OUT is further connected to the reference voltage VPERI through the transistor 126:MP8. The common terminals of the SWITCHES 126:SW_A, 126:SW_B, 126:SW_C and 126:SW_D are coupled to the gate terminal of the P-channel devices 126:MP4_A, 126:MP4_B, 126:MP4_C, and 126:MP4_D respectively.

FIG. 127 illustrates the RSQ circuit.

The RSQ circuit has two input terminals and a single output terminal. The first input terminal, SET, is coupled to the first input of the first NOR gate 127:NR1. The second input signal, RESET, is coupled to the second input of the second NOR gate 127:NR2. NOR gates 127:NR1 and 127:NR2 are connected in a cross-coupled LATCH configuration, such that the output of the NOR gate 127:NR1 is connected to the first input of the NOR gate 127:NR2, and the output of the NOR gate 127:NR2 is connected to the second input of the NOR gate 127:NR1, the output of the NOR gate 127:NR2 being further connected to the output signal Q.

FIG. 128 illustrates the RS circuit. The RS circuit has two input signals and two output signals. The first input signal, SET, is coupled to the first input of the first NOR gate 128:NR1. The second input signal, RESET, is coupled to the second input of the second NOR gate 128:NR2. NOR gates 128:NR1 and 128:NR2 are connected in a cross-coupled LATCH configuration, such that the output of the NOR gate 128:NR2 is coupled to the second input of the NOR gate 128:NR1, and the output of the NOR gate 128:NR1 is connected to the first input of the NOR gate 128:NR2. The output of the NOR gate 128:NR1 is further connected to the output signal Q_, while the output of the NOR gate 128:NR2 is further connected to the output signal Q.

FIG. 129 illustrates the RS_3 circuit. The RS_3 circuit has three input signals and two output signals.

The first input signal, SET, is connected to the first input of the first NOR gate 129:NR1. The second input signal, RESET, is connected to the second input of the second NOR gate 129:NR2, and the third input signal, EN, is connected to the third input of the second NOR gate 129:NR2. The NOR gates 129:NR1 and 129:NR2 are connected in a cross-coupled LATCH configuration, such that the output of the NOR gate 129:NR2 is coupled to the second input of the NOR gate 129:NR1, and the output of the NOR gate 129:NR1 is connected to the first input of the NOR gate 129:NR2. The output of the NOR gate 129:NR1 is coupled to the first output signal Q_, while the output of the NOR gate 129:NR2 is coupled to the second output signal Q.

FIG. 130 illustrates the TLPTSELA circuit, which is a transparent latch circuit. The TLPTSELA circuit has three input signals and a single output signal.

The first input signal, EN, is coupled to the gate terminal of an N-channel transistor which is part of a transmission gate and further coupled to the gate terminal of the P-channel pull-up transistor. The second input signal IN is coupled to the input terminal of the transmission gate. The third input signal, EN_, is coupled to the gate terminal of the P-channel device of the transmission gate. The output signal OUT is coupled to the output of the transmission gate, and further coupled through the P-channel pull-up transistor to the reference voltage VPERI.

FIG. 131 illustrates the SMUX circuit. The SMUX circuit has three input signals and a single output signal.

The first input signal IO is coupled to the first input of the NAND gate 131:ND1. The second input signal, SEL, is coupled to the input of the inverter 131:IV1 and further coupled to the second input of the NAND gate 131:ND2. The third input signal Il is coupled to the first input of the NAND gate 131:ND2. The output of the inverter 131:IV1 is coupled to the second input of the NAND gate 131:ND1. The outputs of the NAND gates 131:ND1 and 131:ND2 are coupled to the input terminals of the NAND gate 131:ND3. The output of the NAND gate 131:ND3 is coupled to the output signal OUT.

FIG. 132 illustrates the SDEL1 circuit. The SDEL1 circuit has a single input and a single output signal. Input signal IN is coupled to the gate terminals of the serially connected P-channel devices 132:MPN1A and 132:MPN2A, and further coupled to the gate terminal of the N-channel device 132:MNN2B. The node 132:N2 is coupled through the serially connected P-channel devices 132:MPN1A and 132:MPN2A to the reference voltage VPERI, through the N-channel device 132:MNN2B to ground, and further coupled to the gate terminal of the N-channel device 132:MNN0C, and finally coupled to the gate terminal of the P-channel device 132:MPN0D. The output signal OUT is coupled through the P-channel device 132:MPN0D to the reference voltage VPERI and coupled through the N-channel device 132:MNN0C to ground.

FIG. 133 illustrates the SDEL2 circit. The SDEL2 circuit has a single input and a single output signal. The input signal, IN, is connected to the gate terminals of the four serially connected P-channel devices, 133:MPN1A, 133:MPN2A, 133:MPN3A and 133:MPN4A; and is further coupled to the gate terminal of the N-channel device 133:MNN4B. The Node 133:N4 is coupled through the serially connected P-channel devices 133:MPN1A, 133:MPN2A, 133:MPN3A, and 133:MPN4A to the reference voltage VPERI; Node 133:N4 further being connected to ground through the N-channel device 133:MNN4B, Node 133:N4 is also connected to the gate of the low-threshold voltage transistor 133:MNN4C, to the gate terminal of P-channel device 133:MPN0E, and to the gate terminal of the N-channel device 133:MNN0D. The low threshold voltage N-channel device 133:MNN4C is connected as a capacitor with its source and drain terminals connected together and further connected to ground. The output is coupled to the output signal OUT and is further connected through the P-channel device 133:MPN0E to the reference voltage VPERI and through the N-channel device 133:MNN0D to ground.

FIG. 134 illustrates the SDEL2EXT circuit. The SDEL2EXT circuit has a single input signal and a single output signal.

The input signal, IN, is coupled to the gate terminals of the serially connected P-channel devices 134:MPN1A, 134:MPN2A, 134:MPN3A, and 134:MPN4A; and is further coupled to the gate terminal of the N-channel device 134:MNN4B. Node 134:N4 is coupled through the serially connected P-channel devices 134:MPN1A, 134:MPN2A 134:MPN3A, and 134:MPN4A to the reference voltage VPERI; and is further coupled through the N-channel device 134:MNN4B to ground, to the gate of the low threshold voltage N-channel device 134:MNN4C, to the gate terminal of the P-channel device 134:MPN0E and to the gate terminal of the N-channel device 134:MNN0D. The low-threshold voltage N-channel device 134:MNN4C is configured as a capacitor, with its source and drain terminals connected together and further coupled to ground; its gate terminal is connected to Node 134:N4. The output terminal is coupled to the output signal OUT, and is further coupled through the P-channel device 134:MPN0E to the reference voltage VPERI, and through the N-channel device 134:MNN0D to ground.

FIG. 135 illustrates the SDEL4 circuit. The SDEL4 circuit has a single input signal and a single output signal.

The input signal, IN, is connected to the gate terminals of the four serially connected P-channel devices 135:MPN1A, 135:MPN2A, 135:MPN3A and 135:MPN4A; and is further connected to the N-channel device at the gate terminal 135:MNN4B. Node 135:N4 is coupled through the four serially connected P-channel devices 135:MPN1A, 135:MPN2A, 135:MPN3A and 135:MPN4A to the reference voltage VPERI; Node 135:N4 is further coupled through the N-channel device 135:MNN4B to ground, Node 135:N4 is also coupled to the gate terminal of the N-channel device 135:MNN4C, the gate terminal of the N-channel device 135:MNN0D and the gate terminal of the P-channel device 135:MPN0E. The N-channel device 135:MNN4C is a low threshold voltage N-channel transistor configured as a capacitor, with its source and drain terminals coupled together and further coupled to ground. The output signal OUT is coupled through the P-channel device 135:MPN0E to the reference voltage VPERI and further coupled through the N-channel device 135:MNN0D to ground.

FIG. 136 illustrates the XNOR circuit. The XNOR circuit has three input signals and a single output signal.

The first input signal B, is coupled to the input of the inverter 136:IV1 and is further coupled to the gate terminal of the N-channel device of the Pass gate 136:CPGL1, and to the gate terminal of the P-channel device of the pass gate 136:CPGL2. The second input signal, A, is coupled to the input of the pass gate 136:CPGL1. The third input signal, A_, is coupled to the input of the pass gate 136:CPGL2. The output of the inverter 136:IV1 is coupled to the gate terminal of the P-channel device of the pass gate 136:CPGL1 and further coupled to the gate terminal of the N-channel device of the pass gate 136:CPGL2. The output terminals of the pass gates 136:CPGL1 and 136:CPGL2 are coupled together and further coupled to output signal AXNORB.

FIG. 137 illustrates the LVLSHF circuit, or the Level Shift circuit. The Level Shift circuit has a single input signal and a single output signal.

Input signal IN is coupled to the gate terminal of the N-channel transistor 137:MN1, the gate terminal of the N-channel transistor 137:CNW2, and the input of the inverter 137:IV1. The N-channel transistor 137:CNW2 is hooked up as a capacitor with its source and drain connected to the ground voltage VSS. The output of the inverter 137:IV1 is connected to the gate terminal of the N-channel device 137:MN3. IV1 is biased by VPERI. Node 137:N1 is coupled through the off connected P-channel transistor 137:MP3 to the voltage VDD, through the P-channel device 137:MP1 to the voltage VDD, through the N-channel device 137:MN1 to ground, to the gate terminal of the low threshold voltage N-channel device 137:MN2, to the gate terminal of the P-channel device 137:MP2 and to the gate terminal of the P-channel capacitor 137:MP4. The P-channel device 137:MP4 is connected in a capacitor configuration with the source drain and substrate terminals coupled to the external voltage VDD. The output signal, OUT, is coupled through the parallel N-channel devices 137:MN2 and 137:MN3 to ground, to the gate terminal of the P-channel device 137:MP1, through the drain terminal of the P-channel device 137:MP2 to the external voltage VDD, and to the gate terminal of the N-channel capacitor 137:CNW1. The N-channel device 137:CNW1 is hooked up in a capacitor configuration with its source and drain terminals connected to ground.

FIG. 138 illustrates the TTLADD circuit, or the TTL Address Buffer circuit. The TTL Address Buffer circuit has a single input signal, a single output signal, and two reference voltage signals. The input signal, TTLIN, is coupled to the gate terminals of the P-channel transistor 138:MP2 and the N-channel transistor 138:MN2. The reference signal CMOS is coupled to the gate terminal of the P-channel transistor 138:MP1, the N-channel transistor 138:MN3, and further coupled to the input of the inverter 138:IV1. The output of the inverter 138:IV1 is coupled to the gate terminal of the N-channel transistor 138:MN1. The reference voltage VPR is coupled to the gate terminal of the N-channel transistor 138:MN5. The output signal OUT is coupled through the serially connected elements of the P-channel transistors 138:MP1, 138:MP2 and the N-channel transistor 138:MN5 to the reference voltage VPERI, through the series combination of N-channel transistors 138:MN2 and 138:MN1 to the voltage VSSAB, through the P-channel transistor 138:MP4 to the reference voltage VPERI, and through the serially connected N-channel transistors 138:MN4 and 138:MN3 to ground, and finally, connected to the input of the inverter 138:IV2. The output of the inverter 138:IV2 is connected to the gate terminal of the P-channel transistor 138:MP4 and further, to the gate terminal of the N-channel transistor 138:MN4.

FIG. 139 illustrates the TTLDATA circuit, or the TTL Data Buffer. The TTL Data Buffer has a single input signal, a single output signal, and three control or reference signals.

The input signal, TTLIN, is coupled to the gate terminals of the P-channel device 139:MP2 and the N-channel device 139:MN2. The signal CLX4_ is coupled to the gate terminal of the N-channel device 139:MN5, and to the input of the inverter 139:IV3. The output of the inverter 139:IV3 is coupled to the drain of N-channel device 139:MN6. The reference voltage VPR is coupled to the gate terminal of the N-channel device 139:MN6. The reference voltage CMOS2 is coupled to the gate terminal of the P-channel device 139:MP1, the gate terminal of the N-channel device 139:MN3, and further coupled to the gate terminal of the N-channel device 139:MN1 through the inverter 139:IV1. The output signal OUT is coupled through the series combination of the P-channel transistors 139:MP1 and 139:MP2 and the N-channel transistor 139:MN6 to the output of the inverter 139:IV3; through the series combination of the N-channel transistors 139:MN1 and 139:MN2 to the voltage VSSAB, through the N-channel transistor 139:MN5 to ground, through the P-channel transistor 139:MP4 to the reference voltage VPERI, through the series combination of the N-channel transistors 139:MN4 and 139:MN3 to ground, and finally to the input of the inverter 139:IV2. The output of the inverter 139:IV2 is coupled to the gate terminal of the P-channel device 139:MP4 and further coupled to the gate terminal of the N-channel device 139:MN4.

FIG. 140 illustrates the SAMHLD circuit or the Sample and Hold circuit. The Sample and Hold circuit has three inputs and a single output.

The first input signal, HOLD, is coupled to the gate terminal of the P-channel device 140:MP2, the gate terminal of the N-channel device 140:MN5, and further coupled to the gate terminal of the N-channel device 140:MN2 and the gate terminal of the P-channel device 140:MP4 through the inverter 140:IV1. The second input signal, SAMPLE_, is coupled to the gate terminal of the P-channel device 140:MP1 and the gate terminal of the N-channel device 140:MN3. The third input signal, IN, is coupled to the gate terminal of the P-channel device 140:MP3 and the gate terminal of the N-channel device 140:MN1. The output signal OUT is coupled through the series combination of the P-channel devices 140:MP1, 140:MP2, and 140:MP3 to the reference voltage VPERI; through the series combination of the N-channel devices 140:MN1 and 140:MN2 to ground through the N-channel device 140:MN3 to ground, to the input of the inverter 140:IV2, through the series combination of the P-channel devices 140:MP4 and 140:MP5 to the voltage VPERI, and finally through the N-channel devices 140:MN4 and 140:MN5 to ground.

The output of the inverter 140:IV2 is coupled to the gate terminal of the P-channel device 140:MP5 and further to the gate terminal of the N-channel device 140:MN4.

FIG. 141 illustrates the NAND4 circuit, a 4-input NAND gate. Each of the four input signals is coupled to the gate terminal of a P-channel device and the gate terminal of an N-channel device. There are therefore four P-channel devices and four N-channel devices. Each of the P-channel devices is coupled between the output node and the voltage VPERI, such that the P-channel devices are hooked up in parallel. The N-channel devices are hooked up in series between the output Node OUT and the ground terminal VSS.

FIG. 142 illustrates the NAND3 circuit, a three-input NAND gate circuit. Each of the three input signals is coupled to the gate terminal of a P-channel device and the gate terminal of an N-channel device. There are therefore three P-channel devices and three N-channel devices. Each of the three P-channel devices is hooked up between the output terminal and the voltage VPERI, the three devices being hooked up in parallel. The three N-channel devices are hooked up in series between the output terminal and ground.

FIG. 143 illustrates the NAND2 circuit, a two-input NAND gate. Each of the two inputs is connected to the gate terminal of a P-channel device and an N-channel device. The P-channel devices are connected between the output terminal and the reference voltage VPERI, such that the devices are hooked up in parallel. The N-channel devices are hooked up in series between the output terminal and the ground.

FIG. 144 illustrates the NOR3 circuit, a three-input NOR gate. Each of the three inputs is coupled to the gate terminal of a P-channel device and an N-channel device. The three P-channel devices are hooked up in series between the output terminal and the voltage VPERI while the three N-channel devices are hooked up in parallel between the output terminal and ground.

FIG. 145 illustrates the NOR2 circuit, a two-input NOR gate. Each input signal is hooked to the gate terminal of a P-channel device and the gate terminal of an N-channel device. The two P-channel devices are hooked up in series between the output terminal and the voltage VPERI; while the two N-channel devices are hooked up in parallel between the output terminal and the voltage VSS, or ground.

FIG. 146 illustrates the basic inverter or INV circuit. The INV circuit has a single input and a single output. The input is connected to the gate terminal of a P-channel device and the gate terminal of an N-channel device. The P-channel device is connected between the output signal and the voltage VPERI, and the N-channel device is connected between the output signal and the voltage VSS, or ground.

FIG. 147 illustrates the INVL circuit. The INVL circuit is an inverter with a single input and a single output. The input signal is coupled to the gate terminal of the P-channel device 147:MP0A and further coupled to the gate terminal of the N-channel device 147:MN0A. The output terminal is coupled between the P-channel device and the N-channel device, such that the P-channel device couples the output to the reference voltage VPERI and the N-channel device couples the output to the reference voltage VSS, or ground.

FIG. 148 illustrates the ESD circuit. The ESD circuit has a single input signal. The input signal is coupled to the PNP bipolar transistor configured as a diode, such that its emitter and base are coupled together to the input circuit, and its collector is coupled to the substrate VBB. The input signal is further coupled to the drain terminal of an N-channel device whose gate and source terminals are connected to ground.

FIG. 149 illustrates the ESD_VEXT circuit. The ESD_VEXT circuit has a single input signal. The input signal is coupled to the emitter and the base of the PNP transistor Q1, and further coupled to the base terminal of the PNP transistor 149:Q2. The PNP transistors 149:Q1 and 149:Q2 have their collector terminals connected together and further coupled to the substrate VBB. The emitter of the PNP transistor 149:Q2 is coupled to VSS.

The functional description for the circuits of the DRAM described above is next given. In the following description, the prefix "X:" is not typed before the device element reference characters of each figure. The device elements described are those shown on the FIGS.; the prefix "X:" not being used. The figures are separately grouped and described according to their function. For instance, the circuits are grouped into Row circuits, Column circuits, DFT circuits, etc.

ROW SCHEME OVERVIEW

The 16 megbit array is divided into 4 quadrants, Q0 through Q3 of 4 meg each. Every quadrant has 16 segments of array which consist of 256 physical wordlines each. This comes out to 4096 physical wordlines per quadrant and 16,384 physical wordlines in the whole array. During an access to any physical wordline, 3 wordlines from each of the other three quadrants are active. Thus 4 physical wordlines make a logical wordline.

For decoding, every segment has 64 decoders. Every two adjacent segments, e.g. 0/1 or 2/3 or 4/5, etc. are paired and share the same 4 predecoders. First 4 pairs, 0/1, 2/3, 4/5 & 6/7, share the same MASTER WORDLINE DRIVER, RLXHLQ, and the next 4 pairs share RLXHRQ.

In any cycle, the combination of block select and row factors select 1 to 1024 decoders, thus selecting 4 row predecoders in each quadrant. The row decoders, upon getting sensing that it is not a redundant row, activates 2 of the predecoders. One of these predecoders uses RLXHLQ and the other uses RLXHRQ. In wordline booting, only 1 of the 2 RLXH signals is booted. Thus, there is only one active predecoder in every quadrant and in every quadrant, a physical wordline is selected.

In DFT mode additional parallel rows are activated by disabling various stages of decoding. When the MASTER WORDLINE DRIVER select is disabled, every quadrant is divided into 2 octants of 8 segments of array 0 through 7 and 8 through 15 therefore allowing 2 rows to be accessed at every instant. This is done in DFT modes X32 PARALLEL TEST, ROW COPY, WORD LINE STRESS, and the 2K REFRESH mode.

In the DFT WORD LINE STRESS, besides the above, the address RA0 is disabled in the predecoders. By doing so, 2 physical wordlines are active per octant, for a total of 4 wordlines accessed in a quadrant.

FIG. 150 illustrates the memory cell addressing sequence.

ROW CLOCKS

The row clock chain of clock signals are activated when RAS_ goes low. This is the start of any active cycle to the device. The chain of activities includes latching of row addresses, decoding of row addresses, deciding if it is a refresh cycle and activating the column decoders.

RCL

ROW CLOCK LOGIC schematic FIG. 1.0

RCL generates the main RAS_ clocks for the chip. This is accomplished by using a TTL buffer to convert the RAS_ TTL input level to CMOS logic levels for internal use.

RID serves as a control signal for the buffer. It prevents the buffer from drawing current while the chip is in the power-up sequence. It also disables the row clocks during power up. The output of the TTL stage is buffered with a series of inverters to generate the signals RL1 and RL1_. RL1 is a special low-load signal which is used to enable the CAS_ TTL input buffer. The load is kept to a minimum on this signal so as to activate the CAS_ input buffer as quickly as possible once RAS_ falls. RCL also generates a delayed RAS_ signal, RL2. This signal is similar to RL1 except that it is gated with RAN. This enables RL2 to remain high into the RAS_ precharge period. This is to ensure proper operation of the address buffers.

CL1

COLUMN LOGIC schematic FIG. 2.0

This is a CBR detector. Besides checking for CBR status, it converts the external TTL_CAS signal logic level to CMOS logic levels and generates the internal CAS clock, CL1_.

The first part of the schematic is the TTL to CMOS convertor, XTTLCLK. It is controlled by the internal RAS clock, RL1_. Conversion of signal starts only when RL1_ becomes asserted high. The feedback of the internal CAS clock, CL1_ enables the XTTLCLK to stay active even when RL1 changes state from active high to low. This configuration enables the device to operate in the 'EXTENDED CAS' mode, i.e. when CAS_ remains active low after RAS_ goes high. But the feedback loop of CL1_ is gated with the power up signal RID before going into the convertor. This is to avoid unnecessary switching on the convertor during power up.

The second part of this schematic does the sampling of the CAS_ signal at the moment when RL1 goes high. If CAS_ is low at that time, meaning CAS_ bell before RAS_, CBR_EN_ goes to active low indicating a CBR cycle RBC_EN_ remains high. But if CAS_ is high, the reverse logic level will be at the output, indicating a normal RBC cycle. There is no latching done here and the sampling continues as long as RL1 is asserted high. If the CAS_ signal changes state within this cycle, the output CBR_EN_ and RBC_EN_ change along with it. But these subsequent outputs are 'DON'T CARES': a latch of the initial outputs are done in the RBC circuit where a programmable delay is used to control the start of this sampling.

RBC

RAS BEFORE CAS

RBC_RESET

RAS BEFORE CAS RESET schematics FIG. 3.0 & 4.0

As discussed in the CL1 schematic, only the initial output of CBR_EN_ and RBC_EN_ reflects the type of cycle the device is operating, either RAS BEFORE CAS, or CAS BEFORE RAS. Hence, the initial output needs to be latched throughout the operating cycle. This latching is done in the RBC circuit. The RBC_RESET circuit resets the latch at the end of a cycle to prepare the device for the next cycle. Besides latching the CBR_EN_ and RBC_EN_, RBC generates the RAN signal for the gating of the row addresses.

Latching of the RBC_EN_ and CBR_EN_ signals is done through 2 interlocking latches, XRS1 & XRS_3. During precharge state, one of the two latches is activated through an active low signal from either RBC_EN_ or CBR_EN_. The activated latch then locks the second latch from being activated. The lock is deactivated at the end of RAS_ active cycle when goes low and a pulse, RBC_RESET is generated to reset the latch and lock (FIG. 4). RLRST_ is a precharge signal that is generated at the rising edge of RL1_ after a certain delay.

In normal operation, either the output RBC for RAS BEFORE CAS cycle, or CBR, for CAS BEFORE RAS cycle is asserted high. Although the CBR_DFT signal follows the CBR logic, it is not used in the normal operation. A similar signal, but with delayed falling edge from CBR is generated. This is the CBRD signal. CBRD is used as incremental clock signal for CAS BEFORE RAS internal counter. The falling edge of this signal does the incrementation. Thus, by delaying the internal counter, it provides the device enough time to switch off its ROW ADDRESS BUFFER before changing the internal counter address.

If device is in DFT ROW COPY mode, the XRS_3 latch performs as an inverter for node N2 to output CBR_, and CBR is disabled to a low logic level. This is true as long as both node N2 and RBC_RESET are not at logic high at the same instant. Note that this state will not happen in the sequence of activities. With this setup, RBC will still be latched and locked off the CBR_EN_ signal, but in the CAS BEFORE RAS operation, CBR_EN_ needs to remain active throughout the cycle to have the output CBR_DFT. To achieve this, CAS_ remains low as long as RAS_ is low. Both CBR and CBRD are disabled high in this test mode. They are disabled to avoid the internal CBR counter to be used as row address when a CAS BEFORE RAS cycle is performed in this test mode.

Reset in this test mode is done by RBC_RESET in normal RAS BEFORE CAS cycle at the end of an active cycle. In the CAS BEFORE RAS cycle, at the end of the active cycle, logic high at CBR_EN_ does the reset.

The other part of the circuitry generates the ROW ADDRESS ENABLE signals, RAN & RAN_. These signals are generated through any active cycle. For a typical RBC type cycle, these signals need to be generated as quickly as possible. To accomplish this, the falling edge of RBC_EN_ is used to trigger the transitions on the RAN signals. To keep RAN signal active into the RAS_ precharge period, RBC_ signal is used to hold the RAN signals active. For CAS-BEFORE-RAS operation, it is necessary to delay the execution of the RAN signals to ensure that the address buffers function properly.

In this two circuits, the power up signal RID is used to preset the initial condition of the latches.

The delay state, XSDEL1_1, delays the assertion of RAN from CBR_ and allows enough time for the CBR internal address to reach the ROW ADDRESS BUFFER before enabling the buffer with RAN. Thus, false data is not drive out of the ROW ADDRESSEE BUFFER. RAN_ is also used to reset RBC_RESET.

PADABUF

PAD ADDRESS BUFFER schematic FIG. 6.0

PADABUF multiplexes the data from the address pin and latches them as row address RAP_X and column address CAP_X accordingly.

In the first stage of the circuitry, the TTL signal for the address is converted to a CMOS level when the internal RAS signal RL1_ goes low. The delayed RAS signal, RL2 then latches in the row address. There is also a delay in the delatch of the address by RL2. This is to allow time for device to disable through precharge before address disable. The address RAP_X logic when disabled is always a '1' with RL1_ inactive high.

At the mean time, CLNA_ is asserted low to allow the address to propagate as CAP_X, thus enabling the availability of column address even before CL1_ goes low. This enables the device to operate in 'ENHANCE PAGE MODE' AS CL1_ goes low, it latches the column address at CAP_X.

Lastly, during the precharge cycle when RL1_ goes high, the XTTLADD converter, is inhibited and thus not influence by externally changing addresses. However, the output CAP_X is maintained.

RADR

ROW ADDRESS DRIVER schematic FIG. 7.0

This is driver for the row address. Control signal, RAN starts the driving of the address signal. Besides being just a driver, it multiplexes the external latched row address and the CBR internal counter address before the driving.

BITCOUNT

CBR INTERNAL ADDRESS, BITCOUNT schematic FIG. 8.0

There are 12 sets of this circuit connected in series in the device. It serves as a 12 bit internal address used during a CBR cycle. The circuit is a flip-flop that activates on the falling edge of its input signal. For the lowest significant set, the input is the CRBD signal and the output is the LSB of the CBR row address and it is also the input to the next set of BITCOUNT circuit. This continues in series until it makes 12 CBR address lines. Such a circuit does an incremental binary count based on the pulse on CBRD.

RF & RF CODE

ROW FACTOR schematic FIG. 9.0

The row factors encode the row addresses into a form which is better utilized by later row circuits. ROW addresses 2 through 7, and their complements, are encoded through an 'AND' operation to generate 12 row factors.

RLEN_

ROW LOGIC ENABLE schematic FIG. 10.0

The purpose of the RLEN_ signal is to time the rising edge of RLXH, i.e. the MASTER WORDLINE DRIVER, with respect to the row factors. Besides this, RLEN_ circuit generates signal RLRST_ to signal for precharge, and SEDIS to signal for BL to BL_ equalization process.

RLEN_ is sometimes referred to as the ROW FACTOR DETECTOR. It uses row factors RF4 through RF7 to detect the completion of row factors encoding. Sensing the completion of the encoding, it enables 'NAND' gates ND1 and ND2 to propagate the address RA11 and RA.11 for the generation of RLEN_R and RLEN_L respectively. These are signals to activate the MASTER WORDLINE DRIVERS, RLXH_R or RLXH_L. Only one of the 2 drivers is active in a quadrant during normal operation. However, in DFT mode, which needs to access all 8 octants of the array at the same time, TL8BS will be in active high. This causes both RLEN_R and RLEN_L to be active at the same. Thus, both MASTER WORDLINE DRIVERS, RLXH_R and RLXH_L are active.

Upon completion of row factor encoding, the RLRST_ state resets from logic low to high. On the other hand, at the end of an active cycle, rising edge of RL1_ causes RLRST_ high logic to go low after a programmable delay. Thus it signals the start of another precharge cycle.

The last component of the circuit is the SENSING EQUALIZATION DISABLE, SEDIS. As in RLRST_, it is used to signal the stop and start of the BL to BL_ equalization process. But it only uses the row factor encoding to trigger the stop of BL and BL_ equalization process. Here, this process is stop 4 ns after the completion of row factors encoding. Then as RLRST_ goes active low to start the precharge cycle, it resets the SEDIS signal to logic '0' with a delay of 4 ns. Thus, it enables the equalization process to start.

If the device is in the ROW COPY DFT mode, in the first cycle SEDIS changes state from logic low to high as in any normal cycle. But when the active cycle completes, RLRST_ goes low, SEDIS remains inhibited high throughout the inactive cycle and following cycles. This is due to the active TLRCOPY which disables the reset signal from RLRST_. Without the equalization process, the voltages of the BL and BL_ remain split, thus enabling the data on the BL or BL_ to be dumped into another row in the DB row copy operation.

RLXH

ROW LOGIC X(word) HIGH schematic FIG. 11.0

The output RLXH is the row logic's booted line which drives the wordlines and the redundancy wordlines. RLXH is also called the MASTER WORDLINE DRIVERS.

The circuit performs as follows:

A. AT PRECHARGE node N4 idles at (Vperi−Vt) through the inactive logic of RL1_ and RLB.

Booting capacitor, MN11 charges to (Vperi−Vt) through MN7 and MN8.

Node N3 of capacitor MN13 pulled to ground level.

Wordline driver RLXH pulled low through transistor MN5 as RLEN_0 is at logic high.

B. START OF AN ACTIVE CYCLE, RL1_ goes low enables 'NAND' gate ND1 to prepare circuitry to respond to RLB, ROW LOGIC BOOT signal.

C. COMPLETION OF FACTORS ENCODING, RLEN_0 goes active low

Node N4 is booted up to (Vperi+Vperi−Vt) through the high stray capacitance in N-channel transistor MN4 from node N1 to N4. N1 goes from logic low to high as RLEN_0 goes to low logic.

With N4 booted up, node N5 of capacitor MN11 charges to full Vperi.

Node N3 of capacitor MN13 charges to Vperi through MN9.

Wordline driver goes to Vperi as does node N1 with transistor MN6 and MN4 turn on. MN5 and MN10 switch off.

D. START OF DRIVER BOOTING, RLB goes active high

Transistor MN4 shuts off, isolating the RLXH from node N1, thus protecting the CMOS device at node N1 when RLXH is booted up fully. MN9 also shuts off for the booting of node N3.

Node N12 goes to logic 1, as RLB turns active. This boots node N5 to (Vperi+Vperi−Vt). Node N3 is being booted at the same time with node N20 going to logic 1.

Booted node N3 caused full transfer of booted voltage at capacitor MN11 to the wordline driver, RLXH. Thus, wordline driver is booted and drives the addressed row.

E. END ACTIVE CYCLE, RL1_ and RLEN_ become inactive (logic high level)

Booted signals discharged through MN10 and MN5.

Sets nodes back to precharge state, as in point (A.).

Besides the normal operation as in point (A.) through (E.), signal PBOSC from an oscillator is activated during a LONG RAS cycle. This is to compensate for the leakage at the wordline by constantly booting RLHX through capacitor MN16.

In the 2 DFT modes, WORDLINE STRESS and WORDLINE LEAKAGE, the booting of the wordline driver is being disabled through 'NOR' gates NR3 and NR4. Transistor MN19 is turned on in the WORDLINE STRESS mode. Thus, with the booting disabled, it allows external voltage to be applied to the driver.

As for WORDLINE LEAKAGE mode, booting is disabled, so that the leakage test will just be a test on the wordline leakage and not the booting capacitor. Only disadvantage here is that it will not be a true check on the leakage, i.e. without the high voltage wordline. Wordline is at (Vperi−Vt) level.

Oscillating signal from PBOSC is also disabled through 'NOR' gate NR5 during either one of these 2 DFT modes. This avoids recharging of word line through another source.

RDDR

ROW DECODER DRIVER schematic FIG. 12.0

RDDR is the row predecoder of the device. It is used for initial address decoding. Each predecoder gates the RLXH signal and selects 1 of every 4 rows for 2 256k array blocks in every quadrant.

The predecoder scheme is composed of a 5 input 'NOR' gate. Inputs used for predecoding are RA0, RA1, RA9 & RA10. The last input is the RRQSQ, which is used to disable the predecoder if that row is a programmed redundancy. At precharge, BNKPC_Q is used to charge the node N3. Inverter IV1 and transistor MP3 are used to sustain the high level at node N3 when selected, letting RLXH be driven to the word line decoder.

But if the device is operating in DFT WORDLINE STRESS mode, active low TLWLS_ signal disables the address decoding based on RA0. By doing so, it enables 2 adjacent rows to be selected.

BNKPC_

BANK SELECT PRECHARGE CLOCK GENERATOR schematic FIG. 12.2

BNKPC_ is the BANK SELECT PRECHARGE CLOCK GENERATOR CIRCUIT. It is clocked off the reset pulse RID and RLT2. Its output signal, BNKPC_Q, activates the precharge decoders of the row decoder driver, RDDR, the bank select circuit BNKSL, and the left and bank select circuit and the right end bank select circuit, FIGS. 27 & 28.

XDECM

ROW DECODER schematic FIG. 13.0

The purpose of the row decoding is to do the final decoding of the address, thus allowing the only correct wordline to be selected.

Row decoder used a 3 input 'NAND' gate. The inputs are the row factors, RF47, RF811 and RF1216. This does the selection of 1 of 64 set of rows in every block of 256k array. The source of the 'NAND' gates transistor is connected to the block selects signal, BSSJK_M. BSSJK_M is decoded from RA8 through RA11. With this setup, only one of two active 256K array blocks with a set of 4 word lines is selected. The set of 4 word lines are XWJMK0, XWJMK1, XWMJK2 & XWJMK3. Note that, only one of these is active as it has already predecoded in RDDR circuit.

Signal BSSJKM is used to precharge N1 to a '1' whereas the inverter IV2 and transistor MP2 are used to sustain the signal when selected.

ROW REDUNDANCY SCHEME OVERVIEW

The purpose of the row redundancy is to allow faulty wordlines to be replaced in order to repair the die to a sellable status.

There are 16 blocks of 256K array in a quadrant of 16 meg. Each of these blocks has 4 physical redundant wordlines. All 4 redundancy rows are located on the right side of a 256K array block. Each of these redundant wordlines is capable of replacing any of the faulty rows within the same block. Note that there is no dummy wordline to limit the type of row replaceable by a redundant row, i.e. BL or BL_ rows.

In programming the redundancy, a quadrant is divided into 2 octants of 8 blocks each. Any redundant row programmed in a bock of an octant, a similar redundancy needs to be programmed into the image block of the other octant. This scheme is adopted due to the following reasons: p0 A. Circuit minimization In various special operating modes such as DFT X32 parallel, and Row Copy, where an array block is operating in 2 octants, a complicated decoding scheme is needed to identify the octant with the redundant row and the one without. To avoid this, both octants are programmed to be symmetrical, thus the extra decoding scheme can be omitted.

B. Higher access speed

By not decoding the RA11 address line, the access time of the redundant row is much faster.

There are 12 row redundancy decoders, RRDEC in a device. This allows for a total of 12 logical wordlines to be replaced in a die. Each logical row redundant line is comprised of a pair of physical rows in a quadrant, one in each octant. But note that the maximum replaceable rows in a 256K array block is only 4 rows, as there are only 4 physical redundant rows in each 256K array block.

Note that a total of 12 repairs can be made over the entire device, and there is no restriction on the location of the repairs. For example, all of the repairs could be made in one quadrant.

RRA

ROW REDUNDANCY ADDRESS schematic FIG. 14.0

RRA generates the redundancy address for the redundancy decoders. In a device there are 120 RRA circuits. They are divided in 12 groups of 10 RRA circuits each. Row address RA0/RA_0 through RA9/-RA_9 are used as inputs to each of these groups. Each group represents a logical redundant row address.

For redundancy programming, the fuse, F1 is blown if the address line is required to be a logic '1' to select the redundant row. Else, F1 is left intact. During an active cycle, this fuse programming causes the RRA output, RRUVAX, to be a logic '0' if the input address during the active cycle matches the redundant address. If the input address does not match the redundant address, RRUVAX gives a logic '1' output.

The way the circuit works is as follows:

at power up, the RRDSPU input pulse signal is asserted high.

the pulse latches in the redundant address, i.e.

Due to layout constraints, 2 RRA circuits share the transistor MP1, of the size (w/l=20/0.8); whereas in the schematic the size of MP1 is (w/l=10/0.8). Thus RRUVPN is just a common node between 2 RRA circuits.

RRDEC

ROW REDUNDANCY DECODER schematic FIG. 15.0

This circuit decodes the redundancy addresses generated by the RRA circuits. A set of 10 RRA outputs forms the inputs of the 'NOR' structure decoder. The 10 RRA outputs are generated from row addresses RA0/-RA0_ through RA9/RA9_. Besides this, RA10 and RA10_ are also connected as 'NOR' inputs through 2 fuses. The fuses serve as a circuit enable switch. At least one of them has to be blown to activate the circuit. If the programmed redundant RA10 is to be a logic '1', the fuse connected to the input RA10 is to be blown. Else, the other fuse is blown if it is to be programmed logic '0'. But if neither one of these fuses are blown, RRDEC stays inactive low during any active cycle. However if both fuses are blown, it enables the device to ignore address R10/R10_ and selects 2 rows in an octant simultaneously.

During precharge, the output is precharged high

| PROGRAMMED RED ADDRESS | BLOWN FUSE 1 | INTACT FUSE 0 |
|---|---|---|
| OUTPUT, (RRUVAX) | RA_X, - NODE N1. DISCHARGED. - MN3A ON. - MN3B OFF. note; - RA_X = 0 if input addr is '1'. ( selected ) - RA_X = 1 if input addr is '0'. ( not selected ) | RAX, - NODE N1 REMAINS HIGH. - MN3A OFF. - MN3B ON. note; - RAX = 1 if input addr is '0'. (not selected) - RAX = 0 if input addr is '1'. ( selected ) |

For example, lets take the row A72H to be programmed as a redundant row. Here a set of 10 RRA circuits use the addresses RA0/RA0_ through RA9/-RA9_ for programming.

REDUNDANT PROGRAMMING

| RRA CIRCUIT WITH INPUTS | FUSE PROGRAMME | RED. ROW (binary) |
|---|---|---|
| RA9 & RA9_ | BLOWN | 1 |
| RA8 & RA8_ | INTACT | 0 |
| RA8 & RA7_ | INTACT | 0 |
| RA6 & RA6_ | BLOWN | 1 |
| RA5 & RA5_ | BLOWN | 1 |
| RA4 & RA4_ | BLOWN | 1 |
| RA3 & RA3_ | INTACT | 0 |
| RA2 & RA2_ | INTACT | 0 |
| RA1 & RA1_ | BLOWN | 1 |
| RA0 & RA0_ | INTACT | 0 |

Note that address RA11 & RA10 have not been used here. RA11 is ignored since the selection of an octant in each quadrant is not needed. The RA10 is decoded in the RRDEC circuit.

Lastly, we have the node RRUVPN. This node serves as the power line for the inverter with MP2 and MN2. This is to prevent the voltage on N1 from going too low during power up if the fuse is left intact. If this occurred, MP1 might have difficulty in pulling up N1 since MP1 is mainly a current limiter.

with RRL2 switching 'on' the transistor MP1. All the inputs are in inactive low logic thus avoiding high current flow.

In an active cycle, when the addresses RA0 through RA10 match the programmed redundancy address, the output stays high signalling the selection of a redundant row has been detected.

Unlike the typical redundancy decoding scheme, where a single stage 'NOR' decoder is used, this uses a 2 staged decoding system. RRA is a predecoded and RRDEC is used for the final decoding.

The advantages of this scheme are:

Reduces the number of fuses needed on the chip. Conventional methods have both the true and complement address going into the decoder. Each of these needs a fuse.

Speeds up the decoding, with less capacitance on the decoding node N2.

RRXE

ROW REDUNDANCY X FACTOR schematic FIG. 16.0

There are 4 of these circuits in the DRAM. Each of these gates 3 of the 1 RRDEC outputs and at the same time selects in parallel 1 to 4 redundant rows in every 256K block. The output signals are channelled to RRQS, the ROW REDUNDANCY QUADRANT SELECT circuit.

RRXE signal enables the 3 'NAND' gates. Here it is critical that RRXE start the enables only after the redundancy decoding has completed, i.e. after the unselected RRUDV signals have gone low. If the RRXE signal comes too early, the interval between the rising edge of RRXE and falling edge of the unselected RRUDV signals causes a high pulse at the outputs RR0XU, RR1XU, or RR2XU. A high pulse on these outputs will discharge the RRQSQ signal, and the determination of which quadrant is using redundancy cannot then be accurately made.

Another important point in the RRXE timing for gating is that, it needs to switch off the gating as early as possible after an active cycle. This is to disable the 'NOR' gate RRQS decoders so that in precharge there will not be a high current flow.

RRXE

ROW REDUNDANCY X FACTOR EMULATOR schematic FIG. 17.0

To achieve the correct timing as mentioned in RRX schematic section, RRXE circuit is designed as a mock ROW REDUNDANCY DECODER, RRDEC. By doing this, it enables the proper sequence of the RRXE signal to enable the gating in RRX circuit.

In RRXE, RA0 and RA0_ are used to simulate the redundancy addresses in RRDEC. P-channel transistor MP1 which is used to precharge the circuit is sized much larger than the one in RRDEC circuit. It is to provide a slow switching off, thus delaying the start of RRXE. Further delay is provided by the inverter, IV2. The bigger transistor also provides a fast pull up of node N2 to disable the inputs of RRQS 'NOR' gates, thus avoiding high current draw. The 2 passgates MN2 and MN3 are used to match the passgates in RRA.

RL1_ and RL2 signals are gates together to provide the precharge signal at the gate of MP1. This enables early switching off of precharge with the falling edge of RL1_ and late turning on of the precharge with the falling edge of RL2. The gated RL1_ and RL2 signal is finally gated with the delayed RRXE signal to generate the precharge signal for the row redundancy circuits, i.e. RRL2. The reason for doing so, is to provide an interlock such that, the RRXE circuit is to be in precharge cycle before other row redundancy circuits to in to precharge. Thus, in precharging the RRXE circuit, it disables the various decoders input, before the active RRL2 starts the precharge of these decoders. Hence, there will not be be an overlap where there is decoder with active inputs and is in precharge cycle. If this occurs, high current is drawn in the decoder.

Note that, by blowing the two fuses here, we can disable the row redundancy scheme for the entire device.

RRQS

ROW REDUNDANCY QUADRANT SELECT schematic FIG. 18.0

Up to now, the previous circuits have decoded and identified row addresses which are used in redundancy. RRQS, the QUADRANT SELECT, does a further decoding to identify which quadrant the redundant row belongs to. There are 4 RRQS circuits in a device. Each of these selects a quadrant of the array.

The RRQS circuit is designed as a 12 input 'NOR' gate. In programming this circuit, if a redundant address does not belong to the repaired quadrant the corresponding fuse of the RRQS is to be blown. Fuses are left intact for a repaired row in its quadrant. By doing so, whenever a redundant row is addressed, and if it belongs to that quadrant, node N2 is pulled low, thus generating active output RRQS signals, i.e. TLRR_Q and RRQSQ. Node N2 remains high if the redundant row does not belong to that quadrant or if the addressed row is not a redundant row.

Signal RRL2 is used to turn on MP1 during precharge and charge N2 high. MP2 with the inverter are used to sustain the precharge level at node N2 if not selected.

Note that, the design enables a redundant address to select any number of quadrants to be active. This is done by not blowing the fuse corresponding to the selected address in the RRQS circuit relating to the quadrant with the repaired row.

RXDEC

REDUNDANCY X(word) DECODER schematic FIG. 19.0

RXDEC serves as the final decoding of a redundant row. Upon decoding, it propagates the booted voltage level from the wordline driver to the redundant row. Each physical redundant row is generated by an RXDEC circuit.

The redundancy decoding is done with a 3 input 'NAND' gates. With a given redundancy address, RRQSQ identifies the quadrant and RRXU decodes 1 of 4 redundant rows in every 256K array blocks. Finally, with the normal row decoding done, the block signal, BSSJK_M selects one of 16 array blocks, thus completing the row redundancy decoding.

RRDSP

ROW REDUNDANCY DECODER SET PULSE schematic FIG. 123.0

The purpose of this circuit is to generate pulses to the RRA and CRRA circuits for redundancy address generation during power up.

This circuit is a series of inverters and capacitors concatenated together. Input and output stages of those inverters are gates with 'NAND' gates to provide the pulses.

The circuit is activated upon power up, using the RID signal as an input. Here 4 output pulses are generated at different times to the 120 RRA circuits instead of just a single pulse to all the RRA circuits.

This is to avoid activating all the RRA circuits at the same time which will cause high peak current.

Besides this, metal mask changes on SW2A and SW2B and SW2C and SW2D, combines the pulse width of RRDSP0 with RRDSP1, and RRDSP2 with RRDSP3, respectively, thus generating 2 sets of pulses instead of 4 sets of pulses.

Upon completion of the pulse generation, output CRDST is activated. This is to start the columns redundancy address latching pulse in the CRDSP circuit.

RRATST schematic FIG. 124.0

The objective of the circuit is to check if the pulse generated by RRDSP is enough to latch the RRA addresses. This is only to be used for internal probing.

RRATST is similar to RRA circuit except the fuse used in RRA is replaced with a capacitor, MP1. Instead of using normal inputs, a probe pad for external signal is placed on RA_X. As for RAX input, it is grounded. Extra probe pad is connected in parallel to the RRDSPU signal. This allows alternate signal to do the latching. Capacitor MN5 is to pull node N2 low at the moment of power up.

The way this circuit works is that it checks if the RRDSPU pulse width is enough to discharge none N1 of capacitor MP1. The status is monitored from probe pads at node N1 and N3.

SENSE CLOCKS

Sense clocks are the chain of activities that do the sequencing of the data sensing in the device. These activities are activated upon the completion of row address decoding in any active cycle. It involves the generation of various clocks to switch on the selected sense amplifier.

Before going into the individual sense clocks schematic, lets take a look at the 16 meg sense amplifier scheme (refer to FIGS. 151, 152, and 153). Firstly, a quadrant is divided into 16 blocks of 256K memory array, i.e. BLK0 through BLK15. 17 banks of sense amplifiers are located in a quadrant. These sense amplifier banks are laid out from the END01 to the END02 side of the quadrant. There is a sense amplifier bank separating each 256K block from the neighbour block. The banks are labeled as S0 through S16, with S0 on the END01 side of array BLK0 and S16 on the END02 side of array BLK15.

To minimize the area usage, 16 meg is designed with shared sense amplifier. In the shared sense amplifier scheme, every sense amplifier bank is shared by 2 array blocks, i.e. one on the END01 side and the other on the END02 side of the bank with the exception of the end banks S0 and S16. Note that these 2 banks have an array block only on 1 side of them. Every sense amplifier bank has 512 sense amplifiers, thus a bank supports 512 columns of array from the block at its END01 side and another 512 column of array from the block at its END02 side.

For array symmetry reasons, the columns supported on the END01 side of a bank is always the odd addressed column, whereas those on the END02 side is always the even addressed column. As for S0, it only supports the odd column of array BLK0, and for S15, it is the even column of array BLK15. Thus in every array blocks, 512 (even address) columns go to the sense amplifier bank on the END01 side and the other 512 (odd addressed) columns) go to the sense amplifier bank on the END02 side.

Point to take note on this scheme is that the 2 columns that share a same sense amplifier do not have the same Y-address, as one is an odd address and the other is an even address. Another point is that an access to a row in an array block activates 2 sense amplifier banks, one on the END01 side and the other on the END02 side of the array block.

SDXWD

SENSE CLOCK W-WORD DETECT schematic FIG. 20.0

This circuit times the sense clocks with respect to the activation of wordline. In previous DRAM generation, voltage level at the mock wordline had been used to trigger this circuit. But in 16 meg, the mock wordline has been omitted.

Instead of using the mock wordline, a delay of 4 ns is being used. Upon the completion of row factor encoding, i.e. when one of the RLEN signals goes active low, a high signal is generated at the output, SDXWD after the delay. This signal is channeled to the MASTER SENSE CLOCK, SDS1 to activate the sensing activities.

Besides this, SDXWD circuit times the booting of wordline, with the RLB signal. In normal cycle, the sense clock SDS4 is used to activate the wordline booting. But if in DFT ROW COPY mode, the sense clocks are inhibited after the first cycle. In the subsequent cycle, the RLB is activated along with the RLEN signals after a delay.

SDS1

MASTER SENSE CLOCK schematic FIG. 21.0

SDS1 is the MASTER SENSE CLOCK. It controls and generates other sense clocks needed for sensing operation.

During an active cycle, upon receiving the delayed SDXWD signal it generates SDS1 signal. But if device is operating in DFT ROW COPY mode, the circuit is inhibited during the 2nd active cycle. Thus in the 2nd cycle, when the based row is identified, the row data is sensed and kept inhibited in the BL & BL_ with the MASTER SENSE CLOCK active high.

There are 2 probe pads that allows SDS1 signal to be controlled by externally injected signals. These 2 probe pads are normally held low through 2 N-channel transistors. By injecting a logic '1' voltage to probe pad EXTS1EN, the circuit is forced to select the signal from probe pad EXTS1CTL, while locking out the SDXWD signal.

SDS2

SENSE CLOCK-2

SDS3

SENSE CLOCK-3

SDS4

SENSE CLOCK-4 schematic FIGS. 22.0 to 24.0

These 3 sense signals are the chain of clocks generated by SDS1 signal with programmable delays. These 3 signals and the SDS1 are clocks that control the switching of the sense amplifier through the PC (P-channel) and NC (N-channel) transistors.

The structure of these 3 circuits are basically the same. They use SDS1 for the circuit enable signal. At the same time, except for SDS4 circuit, they propagate the SDS1 signal through a programmable delay stage to generate the respective sense clocks. For SDS4 circuit, instead of using SDS1 signal, SDS3 signal is used to propagate through the delay stage for the generation on SDS4 signal. This is provide interlocking of the SDS4 signal with the SDS3 signal.

Like the SDS1 circuit, these 3 circuits have 2 input probe pads for internal testing. These probe pads allow external signals to control the timing of the sense clock generation.

In SDS2 circuit, an extra signal is generated, i.e. the STPL_ signal. It is a signal of the same timing as SDS2 but of different polarity. This signal is used to time the start BL/BL_ isolation from the sense amplifier.

SENSE AMPLIFIER BANK

As previously mentioned, the sense amplifier bank that is located between 2 array blocks is different from those located at the END01 side of array BLK0 and those at the END02 side of array BLK15. Hence, the sense amps that are located at the ends of a quadrant are controlled by separate select circuits, and the sense amp banks S1 through S15 are controlled by a repeated bank select circuit.

BNKSL, the BANK SELECT, these are used to select the banks which are shared by 2 array blocks.

LENDBNKSL, the LEFT END BANK SELECT, used to select the bank at the END01 side of array BLK0.

RENDBNKSL, the RIGHT END BANK SELECT, used to select the bank at the END02 side of array BLK15.

The purpose of the BANK SELECT circuits is to decode the row addresses and select the sense amplifier banks for the desired array blocks. Besides this, they do a partial row decoding, i.e. the block select decoding to provide BSSJK_M signal to the row decoders for array block identification. Every sense amplifier bank has its own BANK SELECT circuit.

The address decoding scheme for each these banks can be found in APPENDIX A9. Besides the addresses, APPENDIX A9 depicts all the corresponding clock names for all sense amp banks.

BNKSL

BANK SELECT schematic FIG. 25.0

Every BNKSL supports 2 array blocks. Hence, it needs to decode for 2 sets of addresses. The address lines used are RA8 or RA8_ through RA11 or RA11_.

In the 1st portion of the circuit, 2 sets of similar decoding logic with different address line combinations are used to decode the sense amplifier bank selection. The output of these 2 decoders are combined in the 'NAND' gate ND1 for the generation of BNKSL signal. Selection of any of the 2 decoders causes BNKSL signal to be active, thus indicating the selection of that bank. Besides the address lines, TL8BS signal is used as input in the decoder logic. This signal is 'OR'ed with RA11/RA11_. Output of this serves as inputs to both of the NAND gate decoders. With this setup, it allows address RA11 to be ignored in 2K refresh selection, i.e. with TL8BS tied to LOGIC '1'. Thus, in a quadrant without RA11, 2 sense amplifier banks are always selected.

The 2nd portion of the circuit generates the STL/STR pulse for the BL & BL_ isolation from the sense amplifier for sensing enhancement. It includes 2 interlocking logic circuits. As this is a shared sense amplifier scheme, the sense amplifiers are connected to 2 sets of BL & BL_. But in active cycle, only 1 set of these needs to be activated. To achieve this, the logic circuit uses the 2 decoder outputs to identify the set of BL/BL_ which needs to be activated. The unselected set of BL/BL_ will have its STR or STL signal kept low through out the operating cycle. As for the selected set, a high pulse is generated at its STR or STL output. The start of the high pulse is times by STPL_ whereas as the stop is timed by STPH signal.

Lastly, the output from the NAND decoder that decodes the array on the END02 side of the bank (RIGHT SIDE), also generates the BSSJKM signal. This is used in row decoding as BLOCK SELECT signal. Note that the the other NAND decoder is not used for block select. This is because to select any row in an array block, 2 sense amplifier banks are activated. For row decoding, only the right side of the BNKSL decoding scheme is used to generate the BLOCK SELECT signal.

LENDBNKSL

LEFT END BANK SELECT

RENDBNKSL

RIGHT END BANK SELECT schematic FIGS. 27.0 & 28.0

The structure of these 2 circuits are basically the same as the one in BNKSL, except instead of having 2 sets of decoders and BL/BL_ isolation logic, they only have 1 set. This is because the bank to be selected is identified with a single unique address.

As in BNKSL, address RA8/RA8_ through RA11/RA11_ and TL8BS are used in the address decoding. STPL_ and STPH are used to time the BL/BL_ isolation upon selection.

In RENDBNKSL, there is no BSSJKM signal output as the BLOCK SELECT has already been provided from the other bank associated with the a block.

BSS_DR schematic FIG. 26.0

This serves as a buffer for the BSSJKM signal. It provides the correct polarity signals to the row decoder for selecting a block of row decoders and precharging the circuit. Note that if the row decoder is not selected, the decoder circuit is always in precharge mode.

S1234

SENSE CLOCK 1234 schematic FIG. 29.0

The purpose of this circuit is to allow the propagation of all the sense clocks through to the selected sense amplifier banks, and filters out the clocks signal if the sense amp banks are not selected.

In the S1234 circuit, the clocks SDS1 through SDS4 and the SENSE EQUALIZATION DISABLE, SEDIS, signals are combined with the BANK SELECT signal. Thus only the selected banks will have these signals asserted high. The proper polarity of the clocks are set here: for PC clocks, it is active low; whereas for NC clocks, it is active high.

PCNC

P Channel and N Channel schematic FIG. 30.0

This is the circuit that does the pull up and pull down for the voltage differential at the BL and BL_ pair during the sensing. The S1JKM and S2JKM that are connected to the 2N-channel transistors, do not pull down of the low side bitline, whereas S3JK_M and S4JK_M which are connected to the P-channel transistors do the pull up of the high side bitline.

BLR signal is also connected to equalize both the node PCJKM and NCJKM during the precharge cycle. This supports and speeds up the BL and BL_ equalization process.

SA

SENSE AMPLIFIER

SA_END

SENSE AMPLIFIER END schematics FIGS. 31.0 & 32.0

These are the sense amplifiers schematic. SA is the shared sense amplifier and SA_END is the sense amplifier located at the end banks in a quadrant. The BL and BL_ are connected to the sense amplifier through a pair of low Vt n-channel transistors. In the SA circuit, these transistors serve 2 purposes. Their 1st purpose is to isolate the non-selected BL/BL_ pair from the sense amplifier. The 2nd purpose is to provide an isolation pulse to the selected BL/BL_ pair for sensing enhancement reasons. As for SA_END circuit, the 2 transistors are needed only for sensing enhancement reasons.

During precharge, the signals E and BLR are used to equalize the BL and BL_. In active cycle the signal E is inactive allowing the sense amplifier to split the voltage level between BL and BL_ as NC and PC do the pull down and pull up. Upon completion of sensing, the data from BL and BL_ can be transferred into the LOCAL I/O, LIOI and LIO_I lines if the YSEL signal is asserted high.

COLUMN CLOCKS

The column clocks are a short series of activities that selects sense amplifiers data to be propagated into the LOCAL I/O lines. The activities involves the generation of column factors to the selection of sense amplifiers. In supporting the ENHANCE page mode, these activities are triggered off by the ROW CLOCKS and SENSE CLOCKS instead of the Column Address Select (CAS) clock.

COLUMN CLOCKS DECODING SCHEME

The column decoding that is done here is just a partial column decoding. It uses CA2/CA2_ through CA9/CA9_. Column decoding with CA0, CA1, CA10 and CA11 and the address complements are done in the I/O circuits.

First, lets take a look at the memory array as whole. It is divided into 4 quadrants. Each quadrant is identified with the address CA10 and CA11. Hence, these 2 column address lines do the quadrant selection only and not the physical column selection. For a X4 device, CA10/CA10_ and CA11/CA11_ will remain high. Anyway this portion is part of the I/O circuits.

Next, in a quadrant, there are 1024 columns. These columns are decoded with addresses CA0 through CA9 and their complements. They are grouped into 4 columns of the common CA2 through CA9. Each of these groups is identified with a single YSEL signal. Thus, 4 sets of data from 4 adjacent columns are propagated into the LOCAL I/O lines and this completes the COLUMN CLOCKS DECODING SCHEME. Selection of the final addressed column is done in the I/O circuits.

CABUF01

COLUMN ADDRESS BUFFER 01

CABUF29

COLUMN ADDRESS BUFFER 29 schematics FIGS. 33.0 & 34.0

These 2 circuits act as buffers to the column addresses. They generate the true and complement addresses that will be used for decoding purposes in subsequent circuits.

CABUF29 is for column address CA2 through CA9 and CABUF01 is for CA0, CA1, CA10 and CA11. Even though these circuits are presently the same, they are grouped as 2 schematics to identify the various stages these address lines are used in decoding and as such, have different loading requirements. With 2 schematics, the output deriver sizes can be easily changed within the 2 separate blocks.

CABUF29 buffers are address lines used for column factors generation whereas CABUF01 are address lines used in the I/O decoding.

CLEN

COLUMN LOGIC ENABLE schematic FIG. 35.0

CLEN enables the propagation of the column factor generation and activates one ADDRESS TRANSITION DETECTOR circuit.

CLNA_ a delayed STPL_ signal, enables the external address to propagate as a column address. By doing so, it is actually using the start of sense amplifier sensing, (i.e. the moment when BL & BL_ is isolated from the sense amplifier), to multiplex the external address to be a column address. Note that, by doing so it supports the 'ENHANCED PAGE' mode operation, i.e. the column address is propagated to the decoders even before the CAS_ signal is activated.

The STPL_ signal is also propagated through a series of inverters and then combined with RL2 signals to generate CLEN and CLEN_. These are signals that start the column factors generation and activate an Address Transition Detector, respectively.

Probe pads EXTCLENEN and EXTCLENCTL can be used to disable the circuits normal operation and use the externally supplied signal to generate the outputs.

CF07

COLUMN FACTOR 0,7

CF07DR

COLUMN FACTOR 0,7 driver

CF815

COLUMN FACTOR 8,15

CF_CODE

COLUMN FACTOR CODE schematic FIGS. 36.0 through 36.2

The column factors are encoded here for better column decoding scheme. They are encoded with a 'NAND' function. The series of inverters is to enhance the driving capability of these factors.

YDEC

Y DECODERS schematic FIG. 37.0

YDEC decodes the input address through the column factors and when asserted high will turn on the transfer gates of the selected sense amps and connect the LOCAL I/O lines to the bit lines. The circuit is basically a 2 'NOR' gate decoder with 4 inputs each. The 4 inputs come from the combination of the 4 sets of column factors. The reasons for not merely designing 'NOR' gates with 4 inputs, but a combination of 'NOR' gates, 'AND' gates and inverters are:

layout constraints.

high capacitive loading for 4 input 'NOR' gates.

COLUMN REDUNDANCY SCHEME

As in Row redundancy, its purpose is to replace the faulty columns to make a fully operational die.

A memory array in a die is divided into 4 quadrants. Each quadrant has 16 array blocks of 1024 columns. In every array block, there are 12 redundant columns, These redundant columns are located at the side facing the centre of the die. A redundant column comprises of a pair of bitlines (BL & BL_) and a sense amplifier.

Unlike the row redundancy scheme, where a redundant row can replace any faulty row, column redundancy repair is governed by the data path of the faulty columns. Every array block is supported by 2 sense amplifier banks. Each of these banks has 2 days paths to 2 different GLOBAL I/O lines. Hence for a repair, only the redundant column with the same GLOBAL I/O line is usable.

The redundant column array has the same topology as the block array topology. The redundant sense amplifier banks are a continuation of the regular sense amplifier banks. There are 6 redundant sense amplifiers in each of these banks. The first 3 of these sense amplifiers are connected to the even GLOBAL I/O while the other 3 sense amplifiers are connected to the odd GLOBAL I/O. For a redundancy repair, first we need to know which sense amplifier the faulty column is connected to. Once the faulty column and rejected sense amplifier is identified, it is replaced with a redundant column whose sense amplifier has the same GLOBAL I/O.

In redundancy programming, for every faulty column in an array block, 2 adjacent columns need to be replaced. The 2 columns have the common column address CA11 through CA1. At the same time 2 other columns of the same address with in a block in the next octant will be replaced. Reasons for doing 2 octant repairs simultaneously are the same as in the row redundancy scheme.

Besides repairing 2 columns at one time, there is an option to replace adjacent 4 columns of common CA11 through CA2 with the same redundancy decoder. There is also an optional of how many quadrants are to be replaced with the same redundancy decoder.

The limitations on how many columns are replaceable are:

- 12 redundancy decoders, thus only 12 logical column replaceable.
- 12 physical redundant columns per array block but each repair uses at least 2 columns. Thus in each array block, there is only 6 repairable locations.
- 6 redundant sense amplifiers per bank. 3 of these are connected to the even GLOBAL I/Os and the other 3 to the odd GLOBAL I/Os. This limits the maximum of columns replaceable with the same GLOBAL I/O to 3.
- Repairs for columns of same address but from different blocks need to have independent redundancy decoders if they do not share the same RA8 through RA9 address.

COLUMN REDUNDANT DECODE ENABLE CIRCUIT

CRDECE

FIG. 37.1

The column redundancy decode enable circuit CRDECE is an enabler circuit for the column redundancy decoders. There are 12 CRDECE circuits on the chip. When the fuse F1 is blown, the corresponding column redundancy decoder is enabled.

CRRA

COLUMN REDUNDANCY ROW ADDRESS

CRCA

COLUMN REDUNDANCY COLUMN ADDRESS schematic FIGS. 38.0 & 39.0

These circuits are the same as the RRA circuit of ROW REDUNDANCY. CRRA and CRCA are used to program the column redundancy address, where CRCA is to program the column CA2 through CA9, while CRRA is used to program the RA8 through RA10 for array block identification.

The redundancy programming is done by blowing the fuses in the circuit. Refer to row redundancy RRA schematic for programming explanation.

These redundancy addresses are latched during the power up sequence when a pulse CRDSPI is propagated into the circuits. The latched address determines the value of the address output signals output to the redundancy decoders.

CRDEC_

COLUMN REDUNDANCY DECODER

CRDECE

COLUMN REDUNDANCY DECODER ENABLE schematics FIGS. 40.0 & 37.1

There are 12 CRDEC_ circuits in a device. CREDC_ decodes the address generated from CRCA and CRRA to determine if the input address is the redundant column address. Each of these decoders is associated with one CRDECE circuit.

To enable the CRDEC_, its corresponding CRDECE fuse is blown. The CRDECE circuit works in the same manner as the CRRA, CRCA and RRA circuits. During power up, node N1 is pulled to low. If its fuse is blown, N1 remains at low level. Else, MP1 pulls it back to high. With this, the output, CRDECEUV will be a logic '1' if the fuse is blown and logic '0' otherwise. Logic '1' signifies that its corresponding decoder is enabled.

CRDECEUV, together with the output from respective CRRA and CRCA, form the inputs of the redundant decoder, CRDEC_. These signals are initially combined with 'NAND' gates and then followed by 'NOR' gates. Finally, they are combined with a control signal, CLEN.

CLEN serves as a control signal that activates the decoding upon the completion of row decoding. Also, it forces the decoder output to always be inactive high during the precharge cycle.

CRY

COLUMN REDUNDANCY Y FACTOR schematic FIG. 41.0

CRY circuit serves 2 purposes. First it groups the redundancy decoders and identifies them with the available physical redundant columns. Secondly, it buffers the decoder outputs as these outputs have low driving capability.

The 4 redundancy decoder outputs are combined to generate the CRYU signal. As long as any 1 of the 4 decoders is active, the output CRYU is asserted high. As there are 12 decoders, 3 CRYU signals are generated from 3 CRY circuits. Each CRYU signal identifies a pair of redundant sense amplifiers from every bank of the 4 quadrants: 1 of the sense amplifiers is to the even GLOBAL I/O and the other is to the odd GLOBAL I/O lines of the sense amplifier bank. Thus CRY does a partial selection of the physical redundant column.

The decoder outputs are buffered through the inverters to enhance driving capabilities.

CRSS

COLUMN REDUNDANCY SEGMENT SELECT schematic FIG. 42.0

There are 2 CRSS circuits in a device. As mentioned earlier, in every sense amplifier bank, there are 2 data paths, i.e. one to the even GLOBAL I/O and the other to the odd GLOBAL I/O lines. During normal column addressing, a selected sense amplifier bank has 2 sets of data propagating to the GLOBAL I/O lines, both the even and the odd. These 2 sets of data from 2 columns are selected by CA11 through CA2 and CA0. CRSS enables the selection in replacing any one of these two columns. It also allows these 2 columns of the same sense amplifier bank to be replaced simultaneously.

CRSS is a 12 input 'NOR' structure of gates. Its inputs come from the CRY circuits. In column redundancy programming, if a column address CA9 through CA2 selects the column with even GLOBAL I/O, its corresponding fuse for that decoder address in CRSS0 is left intact. Thus, upon selection, the active column redundancy decoder will have its node N5 pulled high, generating active CRSS0_ and CRSS0 outputs.

At the same time, it is not desired to indicate that the other column with odd GLOBAL I/O is a redundant column. To do this, the fuse for the corresponding decoder signal in CRSS1 is blown.

If only the column with odd GLOBAL I/O is to be selected, the fuse in CRSS1 is left intact while the fuse in CRSS0 is blown. But if we want both columns to be redundant columns, both corresponding fuses for these 2 circuits are left intact.

The pull down transistors on all the inputs of the 'NOR' gates are controlled by the CRDPC signal. In a precharge cycle, it grounds all the inputs. But in an active cycle, CRDPC is biased to the region of 1.5-1.6 V. This is to keep the input that has its fuse blown to the precharged low level. Selected biasing here is with the consideration that is does not ground a high input at an unblown fuse.

CRQS

COLUMN REDUNDANCY QUADRANT SELECT schematic FIG. 43.0

The purpose of CRQS is to identify the quadrant the redundant column belongs to. There are 4 CRQS circuits in a device. Each CRQS represents a quadrant. Programming in the CRQS circuits is independent of each other, which thus allows a same column address to be programmed in more than a single quadrant with a single redundancy decoder.

CRQS structure is basically the same as CRSS structure. It has a 12 input 'NOR' gate with CRDPC as the precharge signal. CRPPC and the pull down transistors serve the same purpose as in CRSS. The inputs to the 'NOR' gates are the buffered outputs from CRY. In precharge, it has the same problem of high current flow as in CRSS, and it uses the same remedy as in CRSS.

In redundancy programming, the fuse corresponding to the output of the required address is left intact to indicate that the redundant column belongs to a quadrant. To indicate the redundant column does not belong to the specific quadrant, the fuse for the decoder output is blown for that CRQS.

Besides the normal quadrant select signals, CRQS_Q and CRQSQ, another signal TLCR_Q is generated. This is used for DFT COLUMN REDUNDANCY ROW CALL.

CRYS

COLUMN REDUNDANCY Y SELECT schematic FIG. 44.0

This circuit does the final decoding of the redundancy address and activates the redundancy sense amplifiers transfer gate to propagate its data onto the GLOBAL I/O lines. The output signal is equivalent to the YSEL signal from YDEC circuit, except this signal activates 2 sense amplifiers in an array block instead of 4 sense amplifiers.

CRIOS

COLUMN REDUNDANCY I/O SELECT schematic FIG. 45.0

As mentioned earlier, there are the odd and even GLOBAL I/O lines for every sense amplifier bank. The activation of either even or odd redundant sense amplifiers depends on the programming on the CRSS0 and CRSS1 circuits. But note that this programming merely activates the redundant sense amplifiers for data propagation into their respective GLOBAL I/O lines. The normal sense amplifiers operation in the array block is not interrupted; data will propagate from the normal sense amplifier banks to the GLOBAL I/O lines.

CRIOS does the selection of which sets of data are actually being passed into the GLOBAL I/O lines. There are 4 CRIOS circuits. Each controls a quadrant of the array. CRIOS takes the CRSS0 and CRSS1 signals and combines them with CRQSQ to generate the multiplexing signals CRIOSJK0 and CRIOSJK1.

CRIOSJK0 is used to select the even GLOBAL I/O lines while CRJOSJK1 is used for the odd GLOBAL I/O lines.

CRDPC

COLUMN DELAY REDUNDANCY PRECHARGE schematic FIG. 46.0

CRDDPC generates a constant 1.5-1.6 V output. This output is used to regulate the pull down transistors in CRSS and CRQS. To minimize current flow, the constant voltage level is only generated during active cycle, i.e. either active CLEN or active RL1_. RL1_ provides the early setting of the output to the regulated level, whereas CLEN sustains it for a certain delay after RL1_ goes to its inactive state.

CRDSP

COLUMN REDUNDANCY DECODER SET PULSE schematic FIG. 122.0

This schematic is basically the same as the row redundancy, RRDSP schematic. 4 pulses are generated in the circuit. They are used for the column address latching in the CRRA and CRCA circuits. The pulses are triggered by CRDST signal from RRDSP, i.e. after all the row redundancy address have been latched.

INPUT/OUTPUT CIRCUITS

CATD

COLUMN ADDRESS TRANSITION DETECTOR schematic FIG. 47.0

As the name suggests, this circuit detects changes in the column addresses. There are 9 of these circuits. They detect the changes in address CA2 through CA9 and CLEN_ signal. The purpose of the CATDs is to signal the device to do the appropriate initialization whenever there is a new set of data to be dumped onto the I/O lines. This also enables the device to operate in 'ENHANCED PAGE' mode, i.e. when the column address changes, I/O lines are preset to the idle state before the new set of data is propagated.

Note that only CA2 through CA9 are used. CA10, CA11, CA1 and CA0 are not needed as they are address lines used for quadrant and I/O line selection. CA2 through CA9 are the addresse that determines the column factors and activate the Y-select. Thus, they select the sets of columns which will have their data propagated into the I/O lines.

As for CLEN_, this signal times the propagation of external address as column address. Thus, the activation of this signal starts the acceptance of a column address and propagation of column data onto the I/O lines. Hence, the transition of CLEN_ needs to be detected to do the proper presetting.

In a 'PAGE' mode operation, propagation of active data on the I/O lines starts with the detection of a CLEN_ transition. Next sets of data can then be PAGED whenever the column address changes.

For the CATD circuit, it consists of 2 special complex gates. The special gates are the totem pole of 2 p-ch gates and 2 n-ch gates. The top p-ch of the complex gate is connected to the bottom n-ch of the other complex gate. Gates of the p-ch are connected through an inverter.

Note that the delay generators SD1 and SD2 are delays for high to low transition only.

CLSUM

COLUMN LOGIC SUMMATION schematic FIG. 48.0

CLSUM combines all the CATD outputs together to provide a single set of signals to be used by the device, i.e. for the preset and initialization conditions mentioned in the CATD section.

The first signal that is generated is the ATD0P_. This is merely the combination of all the CATD outputs and it has the same polarity as CATD.

The ATD0P signal is inverted and buffered into 4 separate ATDP signals in the CLSUMDR circuit. The ATD0 pulse is used to initialize the LOCAL I/O lines in the IOCLMP circuit.

The ATD1P_ signal is generated from the combination of all the CATD signals and CLEN_. The ATD1P signal is then inverted and buffered into 4 separate signals in the CLSUMDR circuit.

The ATD1 signals are at a logic '1' level during the precharge cycle, and will flip to a low level on the falling edge of the ATD0 pulse. During PAGE mode, a transition in any of the column addresses, CA2 through CA9, will generate another ATD0 pulse. This results in the generation of an ATD1 pulse that is 2 ns longer than the ATD0 pulse. The ATD1 signals control the amplification of data through the LOCAL I/O AMP circuit.

The last signal that is generated is the STPH signal. The gated CATD signal triggers STPH from logic '0' to logic 1 at the trailing edge of its pulse. Once STPH is triggered, it is latched until it it reseted in the precharge. By doing so, it serves as an interlock of activities where the stop of the 'T' signal will only occur after the completion of I/O lines initialization. This is to avoid the I/O initialization from disrupting the sensing operation. Besides this, it isolates the sense amplifiers when there is new data to be dumped onto the I/O path during 'PAGE' mode.

CLRSUMDR

COLUMN LOGIC DRIVER schematic FIG. 49.0

The CLSUMDR circuit takes the ATD0P_ and the ATD2P_ signals and inverts and buffers from each into four separate ATD0 and ATD2 signals. The 4 outputs from each signal go to the 4 array quadrants, and are located in close proximity to the quadrant it serves. The purpose of these signals are described in the CLSUM paragraph.

QDDEC

QUADRANT SELECT

QDDEC_CODE

QUADRANT SELECT CODE schematic FIG. 50.0

QDDEC does the decoding for selection of an active quadrant. QDDEC_CODE shows the decoding scheme. In a device there are 4 DATA LINES, where each of the data lines represents a quadrant.

Addresses CA10 and CA11 are used in the decoding. In the X1 device, only 1 of the 4 DATA LINES is active. Whereas for the X4 devices, all 4 DATA LINES are active with valid data. In X4 operation the CLX4 signal disables the passgate CPGL2, thus masking off the address decoding. CLX4 enables all 4 QDDEC by pulling up node N6 through MP1.

If the device is in DFT X16 or X32 mode, all 4 DATA LINES are activated regardless of device type. The DFT signals TL16 and TL32_ shut passgate CPGL2 and pull up node N7 through MP2.

For the X4 device, there is the 'WRITE PER BIT' operation. This operation allows the user the option of selecting the quadrant to be masked off, i.e. data is not written into that quadrant during a write cycle. In this operation, the signal WMBQ is a logic '0' if that quadrant is to be masked, else, it is a logic '1'. This logic '0' shuts off passgate CPGL2 and disables the output by pulling node N7 low through MN2 and MN1. Note that by having MN1, controlled by the DFT signals, it serves as an interlock, i.e. the 'WRITE PER BIT' only operates in non DFT mode.

Besides the main operation of decoding the active quadrant, QDDEC generates 2 other signals which are needed for I/O line decoding in a 2K REFRESH, X4 device. The 2 signals are TWOKADQ and FOURKADQ. These signals are generated by combining CLX4 and the TWOKREF signal.

An active TWOKADQ signal represents a X4 device operating in 2K refresh mode. An active FOURKADQ represents all X1 devices or just a X4 device with 4K refresh.

GASELE

GLOBAL AMPLIFIER SELECT END

GASEL

GLOBAL AMPLIFIER SELECT schematic FIGS. 51.0, 52.0

In a quadrant, there are 8 GLOBAL I/O lines. In normal read operation, only 1 of the 8 data lines is selected to allow propagation of data to the quadrant DATA LINE. In a normal write cycle, the write data on the quadrant DATA LINE is propagated to a single GLOBAL I/O line. This selection is done by GASEL and GASELE. There are 4 GASELE and 4 GASEL circuits in a quadrant. Each of these is used to select 1 of 8 GLOBAL I/O line to be activated. Besides merely doing the 1 in 8 selection, these circuits use the QDDEC_ signal to activate the active quadrant's GLOBAL I/O lines only.

The way the GLOBAL I/O lines are grouped into GASEL and GASELE is as follows:

GASELE

GLOBAL I/O# 0, 1, 4 & 5, i.e. the End I/O lines.

GASEL

GLOBAL I/O# 2, 3, 6 & 7, i.e. the Normal I/O lines.

2 types of decoding, as shown above is needed because end GLOBAL I/O lines (#0, 1, 4 & 5) need a more complicated decoding compared to the other 4 GLOBAL I/O lines. Note that for decoding of the normal GLOBAL I/O lines, the address RA11 is either logic high or a logic low. But for the end GLOBAL I/O lines, the decoding scheme requires both the logic high (RA11) and the logic low (RA_11) addresses for the global I/O selection.

GASEL and GASELE DECODING

In the 1st stage of decoding, we identify whether the addressed Global I/O line is a Normal or an End line. This is done by checking whether the GLOBAL I/O line is connected to the right or left sense amplifier bank of the active array block. The address line which does the selection of the right or left side is column address CA0. The Least Significant Bit in array block selection is RA8. RA8 determines whether it is an even or an odd array block where array blocks are labeled 0 through 15, in each quadrant.

| | | For GLOBAL I/O decoding. | | |
|---|---|---|---|---|
| | | DECODING OUTPUT STATUS | | |
| RA8 | CAO | NORMAL | END | REMARKS |
| 0 | 0 | 0 | 1 | - I/O lines connected to the left side of the even array blocks. - it is an address of End Global I/O and not Normal Global I/O. |
| 0 | 1 | 1 | 0 | - I/O lines connected to the right side of the even array blocks. - it is an address of Normal Global I/O and not End Global I/O. |
| 1 | 0 | 1 | 0 | - I/O lines connected to the left side of the odd array blocks. - it is an address of Normal Global I/O and not End Global I/O. |
| 1 | 1 | 0 | 1 | - I/O lines connected to the right side of the odd array blocks. - it is an address of End Global I/O and not Normal Global I/O. |

To achieve the above output in decoding, GASEL, which decodes for the normal GLOBAL I/O lines, uses the block XNOR1. The XNOR1 performs an 'EXCLUSIVE OR' operation of RA8 and CA0. GASELE also uses block XNOR1, but with the CA0 and CA0_ signals located in the opposite ports from those used by GASEL. This change in CA0 and CA0_ location causes XNOR1 to perform an 'EXCLUSIVE NOR' operation of RA8 and CA0.

In the 2nd stage of decoding, the circuit determines which octant of array is being addressed. At this 2nd stage, we are to decode which 2 GLOBAL I/O lines are to be selected because in the 1st stage, 4 GLOBAL I/O lines are identified, i.e. the End or Normal GLOBAL I/O lines. Selection of octant is done by the voltage level present at node N8 in GASELE and N6 in GASEL.

If 1st stage selection is the Normal GLOBAL I/O lines.

| OCTANT | STATUS IN GASEL DECODING |
|---|---|
| Left | - GLOBAL I/O selected are 2 and 3. |
| Right | - GLOBAL I/O selected are 6 and 7. |

If 1st stage selection is the End GLOBAL I/O lines.

| OCTANT | STATUS IN GASELE DECODING |
|---|---|
| left | - GLOBAL I/O selected are 0 & 1, if it is not array block 7, ie RA8=1, Ra9=1 & RA10=1. - If it is array block 15, GLOBAL I/O selected are 4 & 5. |
| Right | - GLOBAL I/O selected are 4 & 5, if it is not array block 15, ie RA8=1, RA9=1 & RA10=1. - If it is array block 15, GLOBBAL I/O selected are 0 & 1. |

To realize the above decoding scheme, the octant select address, i.e. RA11 or CA10 is used. As for why we multiplex the RA11 and CA10 for the octant selection, it will be explained in the later section.

In the Normal Global I/O, GASEL used the octant selection signal at node N6. If the Global I/O is not selected, node N3 is pulled low by N6 through MN4. At the same time it shuts off the passgate CPGL2. Node N3 is active high if selected in the 1st stage.

In the End Global I/O, GASELE has to modify its octant select signal at node N8. Address RA8, RA9 and RA10 are use to multiplex the octant select address RA11 or CA10. This is to accommodate the addressing in array block 7 & 15. Node N8 performs as N6 in GASEL circuits.

Therefore, initially every quadrant had 8 I/O lines which were divided into the Normal and the End Global I/O lines. In the 1st stage, we decoded whether it is the Normal or the End Global I/O, thus only selecting either the GASEL or GASELE which identifies 4 I/O lines. Next, by doing the octant selection in the 2nd stage, we identify 2 of the 4 I/O lines. Now in the 3rd stage of decoding, we select 1 of the 2 I/O lines. Note that the selected 2 I/O lines comprise an even numbered and an odd numbered Global I/O line. Decoding of the odd and even lines is done through the CA1 address signal.

The, CA1 signal after 'OR'ing with the DFT signal, TL16, is 'NAND'ed with the decoded output from the 2nd stage. This third stage decoding includes the complex gate structure with MP1 through MP3, MN1 through MN3 in GASEL, and MP2 through MP4 and MN2 through MN4 in GASELE.

For the last stage of decoding, (4th stage), the QDDEC_Q signal is used to select which quadrant's Global I/O lines is to be active. The decoding is done through an 'OR' structure between the output from the 3rd stage and QDDEC_Q signal. An inactive high signal from the QDDEC_Q, disables the decoder output. Note that, the Global I/O selection has not yet completed. The final decoding is done with the parallel DFT signal.

GASEL and GASELE DECODING with DFT

The DFT signals used in the decoding are TL16 and TL32_. These signals correspond to devices operating in X16 or X32 parallel tests. In DFT mode, these signals decode the selection of an active GLOBAL I/O line for the write cycle.

Note that in any read cycle, the GLOBAL I/O lines will contain valid data as long as their sense amplifiers are activated. GASEL and GASELE decoding merely selects which data goes onto the DATA LINE. In a DFT read cycle, output data comes from the DFT TEST DATA path and not the GLOBAL I/O path. Thus, even though decoding occurs, it is meaningless as;

data is dumped onto GLOBAL I/O lines depending on state of sense amplifier and not on GASEL & GASELE decoding.

GLOBAL I/O line data is masked off and the DFT TEST DATA is used instead.

The DFT decoding incorporated in GASEL and GASELE is used for the write cycle only. In the write cycle, data comes in from the DATA LINE. From there, it s fanned out to the GLOBAL I/O lines. In non DFT operation, only 1 GLOBAL I/O line is being fanned to. But in DFT X16 or X32 operation, the data is fanned out to 4, (X16) or 8, (x32)

GLOBAL I/O LINE

In the X16 parallel DFT test, the TL16 signal masks off the decoding output from the 1st stage of the decoding mentioned above and replaces it with an active output; thus selecting both the Normal and End Global I/O lines. The 2nd stage of decoding which selects a pair of GLOBAL I/O to be active in the Normal mode and a pair in the End I/O lines is left as it is. Next, TL16 inhibits the decoding in the 3rd stage, by masking address CA1 in the 'OR' structure. By doing so, both the odd and even GLOBAL I/O lines are selected. Now we have 4 selected Global I/O lines in each quadrant, i.e. 2 from the Normal I/O and 2 from the End I/O. With all the quadrants selected, the device operates in X16 mode. Note that the 4 Global I/O lines go into a single array block.

The TL32_ signal is gated with the output from the 4th stage of the decoding. If the device is not operating in X32 mode, the output status from the 4th stage represents the final output. But if it is operating in X32 mode, the TL32_ signals masks off all the 4th stage outputs and enables all 8 GLOBAL I/O lines, thus forcing the device to be in X32 test mode.

OCTANT SELECTION ADDRESS

As mentioned earlier, address RA11 and CA10 are multiplex for octant selection in the 2nd stage of decoding. Multiplexing is needed because;

X1 devices use RA11 as octant selection for both 2K and 4K refresh schemes.

X4 devices use CA10 as octant selection for the 2K refresh scheme, whereas for the 4K refresh scheme, RA11 is used.

The reasons why the X4 devices use 2 different addresses are as follows:

X4, 2K refresh, logical addressing needed is RA0 through RA10, and CA0 through CA10. External pin A11 is removed, and the internal octant select, RA11, is replaced by CA10.

X4, 4K refresh, logical address needed is RA0 through RA11, and CA0 through CA9. External pin A11 cannot be removed due to a functionality reason. In 4K refresh scheme, we need to address both rows in both octants independently for refresh. Thus if A11 is removed, and CA10 is used in place of RA11 for octant selection, RAS_ONLY_REFRESH, which uses row addresses will only refresh a single octant and not the whole quadrant. Hence, RA11 is kept in this device for octant addressing.

As for X4, 2K refresh, addressing rows from one octant causes rows from the other octant to be activated and thus refreshed. Hence, pin A11 is removed.

DWE_

DATA WRITE ENABLE SIGNAL schematic FIG. 53.0

The purpose of the DWE_ circuit is to provide the signal to identify the

GLOBAL I/O lines during the write cycle. With the GLOBAL I/O line correctly identified, it allows the propagation of data onto the GLOBAL I/O lines and then to the I/O CLAMP lines and LOCAL I/O lines connected to it.

This circuit gates the GLOBAL AMPLIFIER SELECT signal with WLMX, which is a write enable signal. The output DWEJK_N is the GLOBAL I/O control signal in the write cycle. Each GLOBAL I/O line has a unique DWEJK_N signal.

IOCLMP

I/O CLAMP schematic FIG. 54.0

There are 2 IOCLMPs per sense amplifier banks. Each IOCLMP is dedicated for a set of LOCAL I/O lines. IOCLMP serves 2 purposes; to Multiplexes between the LOCAL I/O and the REDUNDANCY I/O from the redundant column.

Initializes the LOCAL I/O and REDUNDANCY I/O lines before loading a new set of data onto the I/O lines.

First, in the precharge cycle, the LOCAL I/O lines are at BLR voltage level. BLR level is selected for the precharge cycle as it is the same voltage level as the inactive bitlines. This is to avoid current flows between the bitline and LOCAL I/O lines during the precharge cycle. They remain at this level if they are not selected by the BANK SELECT signal.

The assertion of the BANK SELECT signal enables the propagation of the ATDOQ pulse, and at the same time, it shuts off the BLR level from the LOCAL I/O lines. The ATDOQ pulse shorts the pair of true and complement LOCAL I/O and REDUNDANCY I/O lines together, and initializes the I/O lines to (Vperi−Vt). This was found to be the optimum voltage level for the I/O lines to start off with. By doing this in 'PAGE' mode, it clears off the previous I/O lines data before receiving new data from the sense amplifier. New data from sense amplifier is propagated to the LOCAL I/O and REDUNDANCY I/O lines after the completion of ATDOQ pulse duration.

The CRIOS signal controls the multiplexing of the I/O lines. Redundant I/O lines are selected if the addressed column is a redundant column. The selected I/O lines propagate their data to the I/O CLAMP lines.

LIAMP

LOCAL I/O AMPLIFIER schematic FIG. 55.0

LIAMP performs 2 functions. First, it changes the double ended I/O CLAMP lines, into a single ended I/O line, i.e. the GLOBAL I/O line. Second, during read cycle it amplifies the I/O data using the difference between the double ended I/O CLAMP lines before propagating it to the GLOBAL I/O line.

During a read cycle, the write path is shut off. Pass gate MN7, CPGL1 and 'NOR' gate NR3 are turned off with the inactive DWEJK_N. At the start of a read cycle, ATD1Q switches off the amplifier to occur with the transistors MP1 & MN3. This allows the initialization cycle in the IOCLMP circuitry and waits for the valid data to be at the I/O CLAMP lines before amplifying it. The 2 pieces of data are then propagated through a series of pull up and pull down transistors before the true data is generated at the output, GLOBAL I/O line.

In the write cycle, the amplifier is switched off by the DWEJK_N signal. Transistor MP1 and MN3 are turned off. The output from the read path is tri-stated. ATD1Q again times the enabling of the GLOBAL I/O data to be propagated through as it waits for the completion of initialization in the I/O CLAMP lines, then the GLOBAL I/O data passesed through to the I/O CLAMP lines. True data passes through MN7 to the true I/O CLAMP line. The complement data is generated through transistors MN8 & MN9 before being propagated.

As there is one LIAMP circuit for a set of I/O CLAMP lines, the BANK SELECT signal is used to enable the addressed LIAMP only.

Extra points to take note of are:

Transistor MN8 is a pull up transistor, but instead an n-channel is used. This is to achieve the same Vt drop on logic '1' for the complement I/O CLAMP line as the Vt drop for the true I/O CLAMP line through MN7.

In the series of pull up and pull down transistors, the 'Source' of the pull up transistors MP10 & MP11 are not connected to Vperi but node N1 of the amplifier. This is to avoid current flow in the transistors when they are in idle state. For example, lets take a look at MP10, MP4 & MN4. During precharge, the I/O CLAMP line is at BLR.

If the 'source' was connected to Vperi with MP2 'ON', i.e. node N5 is low, BLR level turns on MN4 as BLR is more than a Vt above 'GND' level. It also turns on MP4 as the 'Source' of MP4 has the level Vperi with MP2 'ON', thus, creating a path for current to flow from Vperi to 'GND'.

The above case is avoided, by connecting the 'Source' of MP10 to node N1. Node N1 is a floating node in the precharge cycle thus there will not be current flow. In active In active read cycle, N1 has the voltage level of Vperi when MP1 turns 'ON'.

GIAMP

GLOBAL I/O AMPLIFIER schematic FIG. 56.0

Each GLOBAL I/O line has a GIAMP connected to it. In a quadrant, the outputs from the 8 GIAMP circuits are wire 'OR'ed and become the DATA LINE. What the GIAMP does is that, by using the GASEL/-GASELE decoded output signals, IOGSJKL and DWEJK_L it selects a single GLOBAL I/O line to dump data into a DATA LINE during a read cycle, whereas during a write cycle, it selects a group or just a single GLOBAL I/O to receive the data from a DATA LINE.

In a read cycle, DWEJK_N is inactive and disables the write path, by turning off transistors MP2 and MN2. The selected GLOBAL I/O amplifier will have its IOGSJKN active. This allows the GLOBAL I/O data, i.e. GIOJKN to reach the pull up and pull down transistor MP1 and MN1. It will either pull up or pull down the output. Note that in a quadrant, out of 8 GLOBAL I/O lines, only 1 will be selected. The others are in tri-state output. However, if the device is in either DFT X32 or X16 mode, selection of the GLOBAL I/O line is disabled. Output from all the GIAMPs is then tri-stated.

In the write cycle, CLRMX_ disables the read path by turning off the output pull up and pull down transistors. Input data from the DATA LINE, DLQ is propagated to the selected GLOBAL I/O line. Write selected GLOBAL I/O lines have an active DWEJK_N signal.

Inverters IV4 and IV5 serve as a keeper for the GLOBAL I/O lines.

IOMUX

I/O MULTIPLEXER

IOMUX3

I/O MULTIPLEXER 3 schematic FIGS. 57.0 & 58.0

There are 3 IOMUX circuits and 1 IOMUX3 circuit. Each IOMUX circuit represents 1 of 3 quadrants, 0, 1 or 2. As for IOMUX3 it represents quadrant 3. These multiplexers are only used in the X1 device. Since there are 4 quadrants, there are 4 DATA LINES, but there is only a single input and output pad. Controls in the IOMUX and IOMUX3 circuits select data from 1 of the 4 DATA LINE's to be propagated to the output pad.

If it is a X4 device, active CLX4 disables the CA10 and CA11 decoding and shuts off the write and read path of the IOMUX. As for IOMUX3, CLX4 merely masks off the CA10 and CA11 decoding while at the same time enabling IOMUX3, thus allowing it to operate either the write or read path. The final selection of read or write is done by the WLMX signal in IOMUX3.

But if the device is a X1, an inactive CLX4 signal enables the CA10 & CA11 decoding to select 1 of the 4 multipliers to be activated. The read or write path of the active multiplexer, IOMUX or IOMUX3 is chosen depending on the write control signal WLMX. In the write operation, data propagates from DIN3 to MP1 & MN1 in IOMUX and MP2 & MN2 in IOMUX3. These transistors act as a buffer to the signal and channel the signal to the DATA LINE, DLQ. For read cycle, data comes from DLQ and passes through to DQIN3 as the active multiplexer has its passgate CPGL1/CPGL2 turned on. But note that if the device is in a DFT mode that needs test data output, the read path is always shut off. The write path for all the 4 multiplexers is enabled regardless of the address CA10 & CA11. This is done with a active low signal at N3 (IOMUX) or N6 (IOMUX3) which masks off the decoding and enables propagation of data at ND4 & NR2, (IOMUX) or ND5 & NR2, (IOMUX3).

Also note that the read output, DQIN3 of all the 4 multiplexers are wired 'OR'd and goes to the PRE OUTPUT BUFFER 3. For the write input, DIN3, all the multiplexers have the same signal from INPUT BUFFER 3.

POUTBUF

PRE OUTPUT BUFFER

POUTBUF3

PRE OUTPUT BUFFER 3 schematic FIGS. 59.0 & 59.1

PRE OUTPUT BUFFER circuits serve as multiplexers between the DFT test data and the normal array read data. The DFT signals DENTX4/DETMX4 or TLDE_/TLDE serve as control signals for the multiplexing.

The 3 POUTBUF circuits get the array read data from their respective DATA line, while POUTBUF3 gets its read data from the IOMUX/IOMUX3 outputs.

The DFT test data comes from the DFT circuitry.

OUTBUF

OUTPUT BUFFER

OUTBUF3

OUTPUT BUFFER 3 schematic FIGS. 60.0 & 60.2

There are three OUTBUF and one OUTBUF3 circuits. Each of the OUTBUFs is dedicated to one quadrant of the array, 0 through 2, and OUTBUF3 is dedicated to quadrant 3. These 2 circuits are exactly the same except OUTBUF circuits are disabled in the X1 devices with the inactive CLX4 signal, whereas the OUTBUF3 is enabled in both X1 and X4 devices.

There are 2 large n-channel transistors, MN11 & MN12 to provide the sourcing and sinking of current for the external load during the reading out of data. CLOE times the propagation of data to the external output. During a read cycle, if the output data, DTRUEQ is high, it turns on MN11 and turns off MN12, thus pulling the DQQ output to high. If DTRUEQ is low, it turns off MN11 and turns on MN12, thus pulling the output DQQ to low.

Points to take note on these output buffers are:

When the output changes from a high to a low, pull up transistor MN11 is turned off before turning on the pull down transistor MN12.

when the output changes from a low to a high, the pull down transistor MN12 is turned off before the pull up transistor MN11 is turned on.

The reason for the above is to avoid high current flow which would occur for an instant when both the pull up and down transistors were on simultaneously. To prevent high current flow, the timing of the pull down transistor is controlled by 2 signal propagation paths of the DTRUEQ. The 1st path is a direct path where DTRUE goes to inverter IV6 and gated at 'NAND' gate ND3. This path gives a fast turn off of MN12 with respect to the turning on of MN11. Note that turning on MN11, DTRUE needs to propagate through a series of inverters and a booting sequence. As for a high to a low output switch, the turning on of MN12 needs to wait for DTRUE data to propagate through the MN11 control path, i.e. to node N22, before looping back to the MN12 control path, i.e. from 'NAND' gate ND3 to transistor MN12.

As the pull up transistor used is a n-channel transistor, booting is needed for a logic '1' data to be propagated to the output.

The booting is activated with the CLOE signal. If the data is a logic '1', as CLOE goes high, N13 goes high and boots node N15 of capacitor MN9 up. This fully turns on MN10 to allow signal from DTRUE to propagate from N17 to N19. Also as the node N13 goes high, with CLOE active, its signal propagates through a series of inverters and a delay, SDEL4. This delayed signal gives N19 a second booting, thus fully switching on transistor MN11 to provide a logic '1' output.

PBOSC maintains the output during long cycle by continuously booting node N10.

CLRMX_ serves as control signal which activates the keeper, IV5 & IV10 when the device is in write mode.

Transistors MN2, MN3, MN4, MN5 & MN6 are used to clamp the booting of their respective node to a certain Vt above Vperi.

Transistor MN11 has a protection transistor for Vbb collapse if the output has a negative external voltage. If negative external voltage is applied, transistor MN11 is turned on when there is a voltage of greater than a Vt across its 'Gate' and 'Source'. When there is high current flow across the 'Drain' and 'Source', high current is injected to the substrate. This might cause the Vbb to collapse. To avoid this, an alternate current path is created, i.e. the path in through transistor MN16. MN16 transistor is turned on and reduces the voltage level on the 'Gate' of MN11, thus avoiding a full turn on of MN11.

INBUF

INPUT BUFFER

INBUF3

INPUT BUFFER 3 schematic FIGS. 61.0 & 62.0

These are input buffers for the 4 DQs in X4 devices where INBUF3 is specifically for DQ3 and there are 3 INBUFs for the other DQs. For X1 devices, INBUFs are not used. INBUF3 is used for the D pin.

In the INBUF circuit the main control signal is CLX4. This tells the circuit if the device is a X4. If it is not, then all 3 INBUFs are disabled with an inactive CLX4. In an active cycle, DEN_ and the TTL to CMOS converter, TTLDATA converter the external data upon sensing a write cycle when DEN_ goes to active low. DLAT then latches the data onto node N8. Once the data is latched, it waits for the WLMX signal to allow the data to propagate onto its respective DATA LINES.

Besides merely propagating the external data, the input buffers identify if the external data is the 'WRITE PER BIT' mask or DFT 'EXPECTED DATA'. If the external data is one of two mentioned types of data, INBUF will not propagate the data to the DATA LINE as WLMX will not be activated. Instead the input buffer latches the write per bit of DFT expected data accordingly.

If operating in DFT mode with expected data, a DSTX4 pulse is generated at the beginning of an active read cycle. This latches in the external data that is propagated to node N8. The new latched data is used as the output for EXDAQ, i.e. the EXPECTED DATA for DFT test.

And if the device operates in Write Per Bit Mode, N8 is taken as the MASK data if W_ clock is low when RAS_ falls. This generates the WBRP pulse which latches in the N8 data to WMBQ as the MASK data. The actual write data is written into the unmasked quadrant. During a later stage of the same cycle when W_ is brought low again it generates a WLMX signal. Note that the MASK is cleared whenever a new normal cycle is activated, i.e. RAS_ falls while W_ remains high. This generates a RBWP_ low pulse which clears the mask. Hence, the MASK needs to be loaded on every cycle to use the write per bit mode.

INBUF3 is basically the same as INBUF. The only difference is INBUF3 takes input from 2 external bond pads to accommodate both X1 and X4 operation. In X4 mode, the input comes from DQ3. In X1 mode, it is from D, which is equivalent to the DQ0 pad in X4. In write cycle, these 2 inputs are converted from TTL level to CMOS level. But only one of them is propagated onto node N5. This is controlled by CLX4 signal. DLAT, depending on device type, latches in the data from node N5 onto DIN3 output. The N5 output can also be latched as EXPECTED DATA in DFT, or as the MASK in WRITE PER BIT. Note that the propagation of DQ3 data into the DATA LINE occurs only after the IOMUX circuitries for INBUF3. It is in the I/O MULTIPLEXERS, that WLMX latches the data onto the DATA LINE.

IOCTL

I/O CONTROL LOGIC

IOCTL3

I/O CONTROL LOGIC 3 schematic FIGS. 63.0 & 64.0

IOCTL and IOCTL3 generate the control signal that multiplexes the DFT TEST DATA and the normal array data. Besides this, they generate the latching pulse to latch in the EXPECTED DATA in certain DFT parallel tests.

There are 3 IOCTL circuits which are dedicated to quadrants 0, 1 & 2 in the X4 device. In the X1 device, these circuits are disabled. IOCLT3 performs as normal for both X1 & X4 devices. The multiplexing signal, DETMX4/DENTX4 are generated by the TLDE signal.

FIG. 155 is a partial block diagram illustrating ROW addressing.

FIG. 156 is a partial block diagram illustrating column addressing.

PGSIG

FIG. 60.3

PGSIG provides buffering off the bond pad to determine the enabled X1 or X4 mode of operation. When the bond pad is not bonded to VSS, the connection between the bond pad and the first inverter is pulled to a logical one through the p-channel transistor 60.3; MP1, that is bias by the internal voltage source Vperi. The output CLX4 is thus high, signaling that the device will operate in the X4 mode of operation. When the bond pad is bonded to VSS, the output CLX4 will be a logical 0, indicating that the chip operates in the X1 mode of operation. The bond pad is thus programmable to configure the mode of operation of the DRAM. When it is bonded to the voltage source VSS, the DRAM operates in the X1 mode of operation. When the bond pad is not bonded to VSS, it is connected to Vperi and the device operates in the X4 mode of operation.

The other half of the figure illustrates the bond pad option for the right MASK option. The standard mode of operation occurs when the bond pad is bonded to VSS and WMO is pulled to a logical zero. The write/bit option occurs when the bond pad is bonded to Vperi and WMO is pulled to a logical high. The bond pad is illustrated as a switch in the right MASK option circuit.

READ/WRITE CIRCUITS

This is a set of circuits that does the read and write controls. They start with TTL to CMOS conversion of the external write signal, W_ and external output enable signal, G_ (X4 only). These signals determine if it is a write cycle or a read cycle. If it is a write cycle, the proper write clocks, data enable and latch signals are generated. Else, if it is a read cycle, read clocks and output enable signals are generated.

Besides deciding if it is a read or write cycle, they determine if the device is in 'WRITE PER BIT' operation and also if the device is doing a late or early write cycle.

W1_

WRITE CLOCK 1 schematic FIG. 65.0

W1_ circuit generates the main internal CMOS level write signals, W1 and W2_. The TTL to CMOS converter XTTLCLK_1 is used to convert the external write signal, W_ into CMOS level signals.

The conversion starts upon the active RAS_ cycle, i.e. with RL1_ active low. Output from the conversion is buffered through to be the W1 signal. W1 serves as a main internal write clock that has minimal delay from the external write clock.

The next signal that is generated here is W2_. This signal signifies the write cycle as it is generated when there are active W1_, CL1_ and Read Write Logic Enable, RWLEN signals.

WBR

WRITE BEFORE RAD

SAMHLD

SAMPLE and HOLD schematic FIG. 66.0

As the internal write clocks are generated, the device has to decide if it is operating in 'WRITE-BEFORE-RAS', WBR, or 'RAS-BEFORE-WRITE', RBW, cycle. This is done by sampling the internal write clock, W1_, with the master RAS_ clock, RL1_.

First, to do this sampling, RL1_ is propagated through a series of delays that generates the XSAMHLD_1 and XSAMHLD_2, SAMPLE and EN signals. EN signal is a delayed RL1_ signal at node N6. It enables two SAMHLD circuits. This occurs about 5ns before the generation of the SAMPLE signal at node N12. Within this 5ns, the internal write clock, W1 and its compliment signal at N13 are inverted at output N14 and N15. Later, when SAMPLE comes in, it samples and holds these data levels through active RL1_. If W1 is inactive at the time of sampling, the active cycle is signaled to be RAS-BEFORE-CAS, cycle with WBR_ signal going active high and WBR inactive low. Otherwise, WBR_ will be inactive low while WBR be active high. Note that, in active cycle, these two signals will always have complimenting signal. In the inactive cycle, these two signals are automatically reset to inactive low.

RBWP_

READ BEFORE WRITE PULSE schematic FIG. 67.0

In the input buffers, the 'WRITE PER BIT' mask is latched at the beginning of 'WRITE PER BIT' cycle. This mask is reset at the next active cycle, i.e. to disable the mask so that normal operation can be performed.

The reset is done by the RBWP_. Upon sensing cycles which are RBW operations a pulse of about 10ns is generated. This is the RBWP_ pulse.

WBRP

WRITE BEFORE RAS PULSE schematic FIG. 68.0

The output WBRP is a pulse that samples the external data and determines if it a Write Per Bit Mask. This pulse is generated when there is active DATA ENABLE, DEN_ signal while TLDEC and CL1_ are still inactive.

Note that active DEN_ will only be generated before active CL1_ in Write Per Bit operation and the DFT mode with expected data latching. Thus with inactive CL1_, and if it is not in DFT parallel test with Expected Data, the active DEN_ signifies a Write Per Bit operation.

So by merely gating the three signals together the WBRP pulse is generated.

RWLEN

READ WRITE LOGIC ENABLE schematic FIG. 69.0

The active output from this circuit, RWLEN indicates to the device that it is ready to perform either a read or a write cycle. It uses the internal CAS_ clock, CL1_, to determine the start of a write cycle or read cycle.

Upon sensing an active RBC signal, i.e. device performing a normal RAS_BEFORE_CAS operation, it latches the output RWLEN to be active. It remains active as long as RL1_ is active low. Within the active time duration of RWLEN, the device is enabled to perform either a normal read or write cycle.

But is the device is not in RBC operation, i.e. it is operating in CBR operation, RWLEN can also be activated. To activate it, CL1_ has to be brought high and then low again. The high to low transition of CL1_ sets the latching of RWLEN. This is actually the Refresh Counter Test, where the CBR counter is being used as internal row address in the read or write operation.

The above latched RWLEN is reset when RL1_ goes high per precharge.

CLRMX_

CONTROL LOGIC READ MASTER schematic FIG. 70.0

CLRMX_ signal controls the read data propagation in the I/O circuitry. An active CLRMX_ enables the read data to propagate through the GLOBAL I/O AMPLIFIERS to the DATA LINES and also the propagation of read data in the PRE OUTPUT BUFFERS to the OUTPUT BUFFERS. Inactive CLRMX_ disables the above 2 propagations.

This signal is generated by latching the active RWLEN signal. This output is latched even before knowing if it is going to be a write operation, i.e. before W_ signal goes active. Thus by default, a cycle is set to be read operation upon receiving the RWLEN signal. But along the active time duration, when W_ goes active, the W2_ signal resets CLRMX_ to inactive high.

There are three signals that keep CLRMX_ from being set. They are the ROW LOGIC RESET signal, RLRST_, and the power up signal, RID, and the write enable signal, WRT_EN. RLRST_ makes sure that the CLRMX_ is only set after the proper row logic initialization has completed where as RID inhibits the active read cycle during power up.

DEN_

DATA ENABLE schematic FIG. 71.0

In the input buffers, we need to determine when the external data is to be sampled and when it is to be latched. This circuit provides the control for these operations. The output signal, DEN_ enables the input buffers to sample the external data. Following this, the output signal, DLAT does the latching of the data as 'Write Data'.

DEN_ can be activated with three types of operation. They are:

normal write, when W_ going active low in during active RAS_ and CAS_.

Write Per Bit operation, when RAS_ going low while W_ is already at active low.

DFT expected data setting.

Whenever DEN_ is activated, it propagates and sets the DLAT signal, thus enabling the external data to be latched internally. As DLAT is being set, DLAT is fed back to the DEN_ path and resets the active DEN_ signal. Hence, DEN_ will always be an active pulse whenever one of the above three operation is being performed.

In the normal write operation, when W_ goes low during RAS_ and CAS_ low, the generated W2_ sets DEN_ to be active. This allows the external data to be sampled. But as DEN_ is active, it sets the DLAT signal. Thus with active DLAT, the external data is latched as 'Write Data' into the device. Also, as DLAT is fed back to DEN_, it resets DEN_ back to inactive high.

For the Write Per Bit, when a WRITE BEFORE RAS cycle is sensed, and if the device is bonded to have this option, the signal WBR_ and WMO will set the DEN_ with a pulse of about 4ns. This enables the external data to be samples as Write Per Bit Mask.

As for the DFT expected data setting, there are two paths that the DEN_ is latched. The first is whenever the device is operating with DFT modes that need expected data. When the internal RAS_ clock, RL1_ falls, a pulse of about 4ns is generated to set the DEN_. Next, if RL1 remains low, but the internal CAS_ signal, CL1_, toggles, the second and subsequent active CL1_ cycles generate the active DEN_ signal. This is to enable the expected data latching during 'PAGE' mode. The TMDLEN signal is used to hold the first falling edge of CL1_ from setting the DEN_ signal. TMDLEN is only latched to active high after a certain delay from the first CL1_ falling edge.

Note that for both the Write Per Bit and DFT with expected data, DLAT is not set as the inactive WRT_EN disables this latching. Thus, the sampled external data is not latched as 'Write Data'. Anyway, in both of these operations, the external data is latched by their respective signals.

The circuit is disabled during power up and when RL1_ is high.

TMDLEN

TEST MODE DATA LOGIC ENABLE schematic FIG. 72

This circuit prevents the device from using CL1_ to do the DFT expected data latching in the first active cycle. Thus, it allows the earlier latched data from RL1_ to remain as expected data, and in subsequent cycles, CL1_'s falling edge is used to do this latching.

In subsequent cycles, TMDLEN is latched active only after a delay from CL1_ falling edge, Hence, during this CL1_ falling edge, (the first CL1_ falling edge), TMDLEN is inactive, and it is disabled from falsely latching an expected data.

TMDLEN is reset when RL1_ goes high. During power up, it is preset to inactive low.

WLMX

WRITE LOGIC MASTER schematic FIG. 73.0

This is the master write clock. It initiates and times the writing operation in I/O circuitries.

Signals that are used to set WLMX to be active high are:

CLEN, this signal determines when a write operation can start. A write can only be activated internally after the proper row operation has completed.

CL1_ and W2_, these signals indicate that a device is operating a write cycle. Note that CL1_ is delayed through a series of delays before it is used to activate the WLMX. This is to ensure that during a Read Modify Write cycle, the active WLMX does not come in too early and disable the read operation.

The active WLMX is reset by CL1_ going inactive high or during power up sequence, i.e. with high RID signal. In 'EXTENDED CAS' operation, as RAS_ goes inactive but CAS_ remains active, WLMX is reset after a delay by RLRST_, thus inhibiting the writing operation. RLRST_ also serves as interlock to ensure write operation is only activated when the row logic resets has completed.

The write enable signal, WRT_EN is also generated here. It is a latched signal of W2_ and it is reset the same way as WLMX.

G1

(INTERNAL OUTPUT ENABLE CLOCK 1)

schematic FIG. 74.0

This circuit does the TTL to CMOS conversion for the external G_ signal for X4 devices. In the X1 devices, the conversion is disabled all the time through the inactive CLX4 signal.

The signal conversion starts when CL1_ goes active low. It continues as long as CL1_ is active. But as CL1_ goes to its inactive state, the conversion stops. The internal OUTPUT ENABLE CLOCK, G1 goes to inactive low, regardless of the external G_ signal.

During precharge, the converter generates inactive low output at G1. RID ensures the conversion will only continue after CL1_ goes high if the supply voltage is sufficient.

LATWR_

EARLY WRITE schematic FIG. 75.0

LATWR_ checks the timing of activation for internal CAS_ and W_ clocks. By checking on this, it determines if it is an early write cycle.

This circuit is very similar to the WBR circuit, except instead of using RL1_ to do the sample and latching, the internal CAS_ clock, CL1_ is used. If W1_ is active when sampled, LATWR_ is activated to logic '0' to indicate an Early Write cycle. Else, LATWR_ is a logic '0'.

CLOE

CONTROL LOGIC OUTPUT ENABLES schematic FIG. 76.0

CLOE is the signal that controls the output transistors in the output buffers. These transistors are turned on if CLOE is inactive thus tri-starting the output.

CLOE is activated when the following three conditions are met:

- active RWLEN, i.e., either the device senses a normal RBC cycle or it is executing the Refresh Counter Test.
- active LATWR_. Since LATWR_ is asserted from CL1_ signal, we can ensure the availability of valid data at the output from the compensation in column address decoding to ensure the availability of valid data at output for the compensation in column address decoding.
- active Output Enable, G1 signal in X4 device, else, in X1, this condition is ignored.

Next, the output is disabled to tristate by deactivating CLOE to inactive low. This can be done in for one of the 4 following conditions:

- inactive G1 signal in X4 device. In X1 device, this condition is ignored.
- inactive LATWR_.
- during power up, with active RID.
- DFT Burn In detect cycle showing the device is operating with DFT Wordline Stress mode. In this mode, tristated output serves as an indication to this DFT mode.

FIGS. 166-177 generally illustrates various timing diagrams of the DRAM operation.

READ OPERATION DATA PATH

FIG. 178 is a partial block diagram illustrating the read operation data path.

During read cycles, in every quadrant, a Y-select activates 4 sense amplifiers from an array block. Thus 4 pairs of LOCAL I/Os are activated. Data from each of these LOCAL I/Os goes into an I/O CLAMP. Here the array data is multiplexed with the redundant column data. Depending upon whether it is redundant column or not, the data pair (the true and complement) is selected from either the LOCAL I/Os or the REDUNDANT I/Os.

The 4 selected pairs of data lines propagate to the LOCAL I/O AMPLIFIERS. Each data pair is amplified and reduced to a single true data line. This true data goes to the GLOBAL I/O LINES. Thus, out of the 8 GLOBAL I/O lines, 4 of them have valid data.

Up to now, each quadrant has 4 GLOBAL I/O lines which are active and have the true data. Each of these GLOBAL I/O lines is connected to a GLOBAL I/O AMPLIFIER. In a quadrant, outputs from all the GLOBAL AMPLIFIERS are wired 'OR' together. But in any read cycle, only one of these outputs is activated, the others are in tri-state. This is done by the GLOBAL AMPLIFIER SELECT circuitry. The wire 'OR'd output represents the DATA LINE of a quadrant.

In X4 devices, the DATA LINES from quadrant 0, 1 and 2 go directly to the PREOUTPUT BUFFER. The quadrant 3 DATA LINE goes to the I/O MULTIPLEXER which merely acts as a buffer, before going into the PREOUTPUT BUFFER. Each of these data lines is then propagated to its respective OUTPUT BUFFER and external output pins.

For X1 devices, the DATA LINES from quadrant 0, 1 and 2 go to their respective I/O MULTIPLEXERS. Again, the outputs from the 4 multiplexers are wire 'OR'd. Only 1 of the 4 multiplexers is selected to provide output, the others are tri-stated. The selected signal goes to the PREOUTPUT BUFFER and OUTPUT BUFFER of quadrant 3 before going to the quadrant 3 output pin. This output pin acts as the 'Q' pin of the device. Note that, in X1 operation, only 1 or the 4 DATA LINES coming out of the GLOBAL I/O AMPLIFIERS has valid data. The other 3 are in tri-state. This is because the GLOBAL AMPLIFIERS SELECT circuitry also does a quadrant selection. Thus it makes off the unselected data before it reaches the multiplexers.

If the device is operating in X16 or X32 DFT mode, all the GLOBAL I/O amplifiers are inhibited and outputs are tri-stated. Thus, the normal read data path is blocked at this stage. At the next stage, PREOUTPUT BUFFER, the DFT data instead of the normal data is propagated to the OUTPUT BUFFER. The mode, X1 or X4 determines which POUTBUFs and OUTPUT BUFFERs will receive the DFT data.

FIG. 179 is a partial block diagram illustrating the write operation data path.

In the X4 mode write cycle, input data comes from the I/O pad and goes into its respective INPUT BUFFER. For the X1 devices, data comes in the 'D' pin in X1. The data goes to INPUT BUFFER 3 only.

For X4 devices, each output from an INPUT BUFFER goes to a set of 8 GLOBAL I/O AMPLIFIERS. Each of these amplifiers represents a GLOBAL I/O line. Data from the INPUT BUFFER of quadrant 3 is buffered through its I/O multiplexer before going into the amplifier.

As for X1 devices, output from INPUT BUFFER 3 is propagated to all 4 I/O multiplexers. Each multiplexer represents a quadrant. In the multiplexer, only one quadrant is selected, thus allowing data to go into a set of 8 GLOBAL I/O AMPLIFIERS associated with that quadrant.

From a set of GLOBAL I/O AMPLIFIERS, only 1 GLOBAL I/O line will be selected to propagate the data. This data goes to various LOCAL I/O AMPLIFIERS. But only 1 of these amplifiers is activated for the write data. Amplifier activation depends on the sense amplifier BANK SELECTION, as each LOCAL I/O AMPLIFIER corresponds to one sense amplifier bank. The active LOCAL I/O AMPLIFIER generates both the TRUE and FALSE logic of the input data.

This newly generated pair of data lines go to the I/O CLAMP where it decides if it is redundant column data. Multiplexing between the propagation of data to LOCAL I/O's and REDUNDANCY I/O is done here. With the TRUE and FALSE data available in the LOCAL I/O or the REDUNDANT I/O and Y-select to identify the sense amplifier to be active, the TRUE and FALSE data is dumped into the BL and BL_ of a column. Data is then written into the accessed row, i.e. the cell which has its passgate activated and is located on either the BL or BL_ of the sense amplifier.

For a X1 device, DFT X16 or X32 mode, at the I/O MULTIPLEXER stage, all 4 multiplexers are activated. Thus data is written into 4 quadrants as in X4 devices. From here, each quadrant channels this data to either 4 or all 8 GLOBAL I/O lines depending on the operation mode. With 4 or 8 sets of data on these GLOBAL I/Os and then the LOCAL I/Os, the data is written into various storage cells which are selected by the Y-select signal and the row decoding signal.

INTERNAL VOLTAGE SUPPLIES

Unlike previous DRAM generations, the 16 meg regulates its internal voltage supplies. This is with the consideration for device power dissipation, memory cell signal charge, device reliability and user preference of maintaining external voltage of 5 V nominal.

There are 3 regulated voltage levels within the 16 meg DRAM. First, the periphery voltage, VPREI. This is a 4 V level that goes to the power line for majority of the periphery circuitry. Next, the array voltage, VARY. VARY is the storage cell and the sense amplifier operating voltage. This is regulated to 3.3 V. The last regulated voltage level is the bitline reference, VBLR and the top plate voltage, VPLT. These 2 voltage levels are half of the array voltage, about 1.65 V. They are generated in the following manner.

First, a reference voltage level, VREF is generated with the Backgap Reference generator. This is a 1.2 V level. From there, it is multiplied to 3.3 V, VARP and 4.0 V VPRP. But these levels do not have high driving capabilitY. Furthermore, to prevent having large metal busses on the chip to carry these supplies to on chip circuitry, drivers are located strategically near the required circuitry. Thus, to resolve this, VARP and VPRP are buffered to get VAR and VPR respectively. These two voltage levels are then channelled to the drivers which are located near their circuitries. The drivers output are the VPERI and VARY. Lastly, VBLR and VPLT are generated by dividing the VARY into half.

There are 2 types of drivers in the chip, i.e. the main drivers and the standby drivers. During standby mode, only the standby drivers are active. These provide the leakage current. In active cycle, both the standby and main drivers are active.

VBNDREF

VOLTAGE BANDGAP REFERENCE GENERATOR schematic FIG. 77.0

VOLTAGE REGULATION

This circuit generates a reference voltage. Besides providing a stable voltage, it is designed to have immunity towards changes in temperature. A standard BANDGAP REFERENCED BIASING circuit is improved to achieve this.

The Bandgap Referenced Biasing circuit is comprised of transistors, MP1 through MP6, MN1 through MN4 and Q1 through Q3. Constant current that flows along the 3 electrical path is governed by the equation:

$$i = \frac{VT * \ln(\text{emitter area } Q2/\text{emitter area } Q1)}{\text{Resistance, } R1}$$

where

VT is the thermal voltage;

the 3 paths mentioned are:

MP1 to Q1.

MP2 to Q2.

MP3 to Q3.

With this constant current, the output voltage, VREF is obtained by the summation of potential drops across resistor R2 and across emitter-base of Q3.

$$\begin{aligned} VREF &= (i * R2) + Vbe \\ &= (VT * \ln 8 * R2/R1) + Vbe \end{aligned}$$

where ratio of emitter area of Q2 to Q1 is 8.

Here, a regulated voltage is achieved, i.e. VREF does not depend on the external voltage. But note that the parameters that generate VREF are temperature dependent parameters. Thus, VREF changes with temperature.

Knowing that Vbe has negative temperature coefficient while Vt and R2 & R1 have positive temperature coefficient, simulationsn were made to obtain R1 & R2 such that the resultant change in VREF due to temperature is zero. R1 is first determined by fixing the constant current to the region of 0.5 uA. Through simulation, the operation of Vref is to be 1.2 V and R1 and R2 are to be 5.4 Kohms and 51.3 Kohms respectively.

To achieve a wider operating range, another modification was made on the standard circuit. The new circuit is designed to start its voltage regulation of a Vt lower than the standard circuit.

Note that, for a transistor to operate in its saturation region, the following condition needs to be satisfied:

$$|Vds| \text{ greater or equal to } |Vgs - Vt|$$

In the standard circuit, the gates of a p-ch and n-ch transistors are tied to the drain, thus forcing the device into its saturation region, (here $|Vds| > |Vgs - Vt|$), when Vds reaches active Vgs level. But for the device to be in saturation, Vds needs only to be at at a lower value, i.e. $|Vds| = |Vgs - Vt|$.

So instead of tying the gate to the drain, the gate is tied to a point of magnitude that is about one Vt potential above the drain potential. Hence the device is activated into its saturation region as Vgs is activated with Vds is one Vt below Vgs. Thus, the device is operational at a lower voltage level.

That is the reason that in the Bandgap Referenced Biasing circuit, gate of MP1/MP2 is tied to drain of MP5, gate of MN1/MN2 is tied to drain of MN3, gate of MN4/MN5 tied to drain of MP4 with R4 to provide to potential drops, and gate of MP4/MP5 tied to drain of MN4 with R3 to provide the potential drops.

If the external voltage is too low, the transistors in the Bandgap Referenced Biasing are inactive. Thus there will not be any output voltage at VREF. But we would like to have some small signal level at the output and required it to increase gradually as the external voltage increases. To achieve this, two low voltage starter circuits are incorporated into the design.

The first low voltage starter drives current into R4 and then the drain of MN3 at low external voltage. This circuit is comprised of MP17, MP18, MP19, MP110 & MN16. At low external voltage, with MP17 & MP18 off, current is driven into node N13 through MP19 with MN16 keeping node N117 low. MP110 is used to discharge capacitor MN16 when the external supply goes too low. But when the external voltage is sufficient to turn on the Bandgap Referenced Biasing transistors, MP17 and MP18 are turn on, thus charging up MN16 and turning off MP19. This allows the normal biasing mode to operate.

The second low voltage starter sinks current from the drain of MP5. At low voltage startup, C1 keeps N15 low, thus turning on MP10 and MN8. This helps to switch on MP5 and MP2. By doing so, it forces current to flow in them.

With the current generated by the above two circuits, the current mirror effect takes place and generates current into R2. This provides the voltage at VREF. Note, that this is not a regulated voltage.

Besides generating the VREF, two other signals are routed for use to on other circuits. They are the BIAS1 and BIAS2 signals. They are used to generate a similar current flow in other circuits through the current mirror effect.

Capacitor MN7 serves as a stabilizer for VREF.

VMULT

VOLTAGE MULTIPLIER schematic FIG. 78.0

From VBDNREF, we have a regulated voltage of 1.2 V. To get the required voltage level of 3.3 V and 4 V, VMULTR uses the concept of a potential divider to multiple VREF to the required voltage levels.

By using BIAS1 and BIAS2, a constant current source is generated at node N3 of the source coupled pair, M3 & M4. The gate of M3 is connected to VREF, and the gate of M4 is connected to node VREF0 of a series of resistors. This source couple pair compares the voltage VREF and VREF0. Differential voltages cause different current flows in M3 and M4, thus varying the potential at node N1. For example, as VREF goes higher, current at node N1 increases. As the current increases, the voltage at N1 drops lower. Node N1 is used as feedback to correct the potential at VREF0. As potential N1 drops, potential at VREF0 increases with a lower N1 signal at M11. Besides this feedback mechanism, there is this current mirror configuration on the drain of M3 and M4. With this current mirror, it will try to maintain the same current flowing through M3 and M4, thus maintaining the same current, The current maintains VREF0 to equal to VREF.

With VREF0 maintained at VREF, and current through R1, R2 and R3 the same, we have a voltage multiplier circuit, where the output voltages are:

$$Vla = \{(R1 + R2)/R1\} * VREFO$$
$$\& \ Vlp = \{(R1 + R2 + R3)/R1\} * VREFO$$

R2 & R3 are trimable resistors in order to achieve the required levels of 3.3 V and 4 V. Capacitor CM is to provide damping to the feedback node N1.

If the device is operating in DFT CELL STRESS mode, active TLSCSLH shuts off the supply line for the voltage multiplier and grounds it. Thus both outputs VPRP and VARP will be at GND level.

VBIN

VOLTAGE BURN IN schematic FIG. 79.0

Up to now, we have generated two regulated voltage levels, i.e. the VLA and VLP. These two levels will maintain their regulated levels even if the external supply goes beyond 6 V. However, for reliability checking, we would like to be able to stress the device with higher voltages. This is the Burn In process where unreliable devices are weeded out with high voltage acceleration.

Thus an alternate voltage supply is required. So to accommodate the general burn in voltage (external) of 8 V and to achieve a certain level of stress on the device based on the device oxide thickness, the internal voltage during burn in is designed to be 2 Vtp below the external burn in voltage (8 Volts).

Furthermore, the device is required to regulate its internal supplies up to about 6.5 V external.

Thus to realize the above requirements, VBIN circuit is used. The 1st part of the circuit is comprised of M25, M27 and M29 which provides a voltage supply that tracks the external voltage supply. But it is always 2 Vtp below the external voltage supply. The 2nd part of the circuit comprises of a source follower pair, a series of inverters a voltage detector (totem pole of p-ch transistors). The source follower pair compares VLA, (3.3 V) with voltage at node N5. Note that voltage at node N5, is 3 Vtp drops below the external voltage. As long as VLA is at higher potential then N5, output from the source follower pair generates inactive BINEN and BINEN.. But if the external voltage goes higher than 6.5 V, N5 will be higher than 3.3 v. So the output from the source follower pair flips its status and generates active BINEN and BINEN..

So, the first part of VBIN provides the required voltage level for burn in. The second part tells the device when to multiplex from the internal regulated voltage to the burn in voltage.

VDDCLAMP

VDD CLAMP

VCLMP

VOLTAGE CLAMP schematic FIG. 80.0 & 80.1

As the device is operating with external voltage above 6.5 V, the internal voltage supplies track the external level with a define offset. But this has one disadvantage, i.e., if the external supply goes too high, it will kill the device by breaking the oxide insulation. To have a protection to this, a voltage clamp is introduced. Here it was decided to clamp the internal voltage at about 7.3 V if the device external voltage, VEXT higher than 9.5 V, (7.3 V+2 Vtp).

This operation is done with two circuits. The VDDCLAMP circuit senses the external voltage level. It uses the regulated VLP (4 V) as its reference voltage and compares it with the external voltage level through a series of p-ch transistors. Here node N5 will only be at logic '1' if the (VEXT−5 Vtp) is higher than VLP. If this happens, i.e. VEXT is higher than 9.5 V, active VCMPEN and VCMPEN. are generated. These are signals to indicate the internal voltage supply needs to be clamped. Note that the is a feedback loop, node N8 shunting a p-ch transistor when active outputs are generated. This is to provide a hysterisis to prevent switching on and off at the boundary.

The 2nd circuit generates the clamp voltage for the device. What the device will do is that, when it reaches the clamp region, it multiplexes from its current internal supply to the new clamp supply. VCLMP uses VLP as reference to generate a similar voltage level at node N10. This circuit has the same structure as the VMULT. From N10 it is multiplied to the required clamp voltage through the two resistors, R1 & R3. VCMPEN & VCMPEN_ serve as the multiplier enable signals.

VLMUX

VOLTAGE LEVEL MULTIPLEXER schematic FIG. 81.0

Let's recap what we have gone through. First, we generated two regulated voltage levels, VLA & VLP. Next, a burn in voltage is generated. This is a voltage level 2 Vtp below the external voltage level. Finally, the clamp voltage of about 7.3 V is generated. Thus we have 3 sets of voltage level, but the device only operates one set.

VLMUX does the selection of the set of voltage to be used in the device. In the device, when the external voltage is below 6.5 V, the regulated levels, VLA & VLP serve as the internal supply level. But as it goes above 6.5 V, active BINEN & BINEN_ multiplex the the internal level to be the burn in level. Note that both the array and periphery are at the same voltage level during the burn in region. During switching from the regulated voltage level to the burn in voltage level, there will be a sudden jump in the voltage level for both the array and periphery voltage.

Next, as the external voltage goes beyond 9.5 V, another switching of the voltage level occurs. Here, active VCMPEN & VCMPEN_ activates the switch from the burn in voltage level to the clamp level. As the clamp level is designed to be the same as the burn in level at the switch point, the transfer of internal voltage supply should be a smooth transfer. But if there is any mismatch between the clamping voltage level and the burn in voltage level, during the transfer, a small voltage jump may be observed.

From here the output, VARY & VPRP goes to the next stage, i.e. the VARYBUF & VPERBUF and drivers before supplying the circuit.

VARYBUF

VOLTAGE ARRAY BUFFER

VPERBUF

VOLTAGE PERIPHERY BUFFER schematic FIG. 82.0 and 83.0

These two circuits serve as an intermediate stage between the regulated voltage from VMULT and the actual drivers that provide current to the circuits. These buffers are located near VMULT and provide just enough power to drive the drivers.

VARYBUF and VPERBUF circuits are exactly the same circuit except for the setting in the level shifter. They are unity gain amplifiers. The amplifier is a two stage CMOS operational amplifier with a class B output stage. Transistors at the output stage are controlled by two sets of complimentary source follower pairs. The constant current sources at the two source follower pairs are generated through transistor M5 and M12 with the signal BIAS1 and BIAS2 controlling them.

To get a unity gain, the output VAR or VPR is feedback to the 'Inverting Terminals' of the amplifier. The inverting terminals are gates of M3 and M8. Note that the 'Noninverting terminals' are gates of M4 and M11. The noninverting terminals of the amplifier are connected with the output from VMULT, i.e. VARP or VPRP.

For the source coupled pair, M6, M7, M8 & M11 note that inputs to the differential gates are shifted to a lower value before applying them. In VARYBUF, input voltages are shifted lower by a Vtn through M16 and M13. As for VPERBUF, they are shifted by 2 Vtn through M16/M20 and M13/M21. The reason for this level shifting are as follow:

with active M8 & M11, node N9, source of the 2 transistors is a Vtp above the gates level.

thus, without level shifting, N9 of VARYBUF will be (3.3 V+Vt), about 4.4 V and N9 of VPERBUF will be (4 V+Vt), about 5.1 V.

for M12 to be in saturation region, in order to operate as current source, it has to satisfy the following condition:

$$|VDS| \text{ greater or equal to } |Vgs-Vt|$$

i.e., the potential drops from external voltage to N9 must be greater than or equal to the magnitude of potential difference between M12 Vgs and its Vtp.

So for VARYBUF and VPERBUF to work, the external voltage has to be atleast higher than 4.4 V and 5.1 V respectively, which is not acceptable. To resolve this, the level shifters are used to lower N9 operating potential.

As for the other set of source follower pair, the p-ch transistors do not face this problem. Hence, level shifter is not used here.

Capacitor, CC is used as oscillation damper.

VARYDRV

VOLTAGE ARRAY DRIVER

VPERDRV

VILTAGE PERPHERY DRIVER schematic FIG. 84.0 & 85.0

These are the main drivers for the device. There are 4 VARYDRVs. They provide the array voltage of 3.3 V to the array sense amplifiers. Two of them support quadrants Q0 & Q1, and the other 2 support Q2 & Q3. Each of these drivers drive supplies to either the left or right octant of twoquadrants. As for, VPERDRV, there are two of them. They are for the various periphery circuits.

These drivers are constructed with CMOS differential amplifier with class A stage driver. The circuit is connected as a comparator in unity gain second, with a feedback from its output to its input terminal.

The variation of this circuit from the conventional circuit is that instead of using M5 and M10 merely as current source at the source couple pair and the output stage, they serve as control to enable or disable the drivers. The signal that is used to do this control is VRCTLA0 for VARYDRV and VRCTLP for VPERDRV. Thus, with this control, only the necessary drivers are activated. Note that, if the drivers are left active, continuous current will flow to GND due to the class A output stage, which would increase standby current.

Under DFT, STORAGE CELL STRESS mode, active TLSCLSH signal isolates the 1st stage of the comparator, source couple pair, from its 2nd stage, output stage. At the same time, it fully switches on M9, thus forcing the driver output, VARY or VPERI to be the external voltage.

During the comparator analysis, the metal level, CUT POINT can be cut. By doing so, it open the feedback loop for AC signals. Thus allowing open loop analysis of the AC characteristic (bandwidth & gain) of the comparator.

R1 & C1 serve as damper for the output, VARY or VPERI.

VARYDRVS

VOLTAGE ARRAY DRIVER STANDBY

VPERDRVS

VOLTAGE PERIPHERY DRIVER STANDBY schematic FIG. 86.0 & 87.0

These circuits are the same as the main drivers except for the smaller transistor sizing and all the control is done at the current source transistors M5 & M10. It does not have an independent circuit for DFT, TLSCSLH signal to control the output stage. This DFT control is incorporated into the M5 & M10 switching. In this DFT mode, (Storage Cell Stress), the drivers are disabled. Hence only the main drivers are used to supply the external voltage to the device.

As in the main drivers, the feedback loop can be cut. This allows both open loop gain and open loop bandwidth to be determined.

There is one of each of these circuits on the device. They are used to supply leakage current to the device.

VRCTLS

VOLTAGE REGULATOR CONTROL LOGIC for STANDBY schematic FIG. 88.0

VRCTLS is the signal that controls the operation of both standby drivers. The standby drivers are active all the time except for DFT, Storage Cell stress operation and during latchup, i.e., when VBB goes to OV.

At powerup, node N22 of capacitor CG remains low while node N21 with capacitor MPC tracks the external voltage. Thus RIDH is set to logic '2' and it tracks the external voltage even after N21 goes high and N22 goes low, with CG being charged up. As RIDH tracks the external voltage, it enables the standby drivers with active VRCTLS. This logic '1' RIDH signal also disables the output of 'Vbb ZERO LEVEL DETECTOR' to be used at latchup signal, during power up, while the VBB level is still at 0 zero volts.

But, as the external voltage reaches about 2 V, PUD goes to logic '1', thus returning RIDH to logic '0'. This passes the control of VRCTLS to the status of TLSCSLL. and VBBOL.. These are status of DFT, Storage Cell Stress test and latchup. Normally, VRCTLS stays active unless either TLSCSLL or VBBOL is active. Besides, with RIDH at logic '0', it allows the output of VBB ZERO LEVEL DETECTOR to be the indicator of latchup.

VRCTLA

VOLTAGE REGULATOR CONTROL LOGIC for ARRAY schematic FIG. 88.1

As mentioned earlier, there are 4 main array drivers, VARYDRV. Two are dedicated to the left octants with the other two dedicated to the right octants. For the device to operate, only the active octants need to be supplied with the array voltage. This control is done by the output of VRCTLA circuits.

There are two VRCTLA circuits, one for the left octant drivers and the other for the right octant drivers. Upon completion of row factor decoding, RLEN.O will activate one or both the VRCTLA circuits to get active outputs. The output signal goes to inactive low during a precharge cycle after a certain delay from the point when RLRST. goes low.

If the device is operating in DFT, Storage Cell Stress mode or experience latchup, active TLSCSLL. or VBBOL. forces the output to be inactive low. Thus not allowing activation of the amplifier circuit in the drivers.

RIDH is to initialize the output of XNOR9. By doing so, it allows the output to be controlled by the inputs, TLSCSLL., VBBOL. RLEN.O and RLRST. and not the ambiguity at N5 during power up. Note that the four inputs mentioned are initialized to inactive state in their respective circuits.

VRCTLP

VOLTAGE REGULATOR CONTROL LOGIC for PERIPHERY schematic FIG. 88.2

There is only 1 VRCTLP circuit. It controls the two VPERDRV circuits simultaneously. This circuit is the same circuit as the VRCTLA circuit. But instead of using RLEN.O to trigger the start of active output, active low RL1. is used. This is because the periphery circuits need the extra supply earlier in an active cycle, i.e. when RAS. goes low. RIDH is used for initialization as in VRCTLA.

VRCTLC

VOTLAGE REGULATOR CONTROL LOGIC for CONTROL schematic FIG. 88.3

VRCTLC provides the latchup signal, VBBOL. and the DFT, Storage Cell Stress signals, TLSCSLH & TLSCSLL. for the other control circuits and the driver circuits.

The latchup signal is generated through gating the output of VBB ZERO LEVEL DETECTOR with RIDH. By doing so, it disable the false sensing of latchup during powerup with RIDH at logic '1'.

Next, the DFT signals. They are generated through gating the DFT TLSCSL signal with the latchup signal. Thus, if latchup occurs, eventhough the device is in DFT Storage Cell Stress, both the output DFT indicators, TLSCSLH & TLSCSLL. are disabled to their inactive state. So, besides disabling the drivers, the external signal is also forbidden from supplying voltage to the circuits.

There is also a bond option that allows an external signal EXTVEX. to force the device to have active TLSCSLH and TLSCSLL.. Thus, both the periphery and array circuit will operate with the external voltage instead of the regulated voltage.

RIDH is also used as initialization signal here.

VRVBBO

VOLTAGE REGULATOR VBB ZERO LEVEL DETECTOR schematic FIG. 89.0

By checking the VBB level, latchup is being monitor. Here it is assume that when latchup occurs, VBB level goes to approximately zero.

This circuit has a weak p-ch transistor, MP1 and a large n-ch transistor, MN1. In normal operation, current flow is limited by the small MP1. Node N1 will be at 1 Vt above VBB level. It is considered as logic '0' input to the next stage inverter, MP2 & MN2 since N1 is at a lower potential than 1 Vt of MN2 transistor. But as VBB goes to zero level voltage, N1 will have the potential of 1 Vt of MN1. This turns on MN2 which has a lower Vt. As the result, we will have an active VBBO to indicate a latchup.

But, note that, once the above occurs, it also switches off the power to VRVBBO, i.e., VPERI. Thus, even if VBB could be forced to −2 V, VPERI remains cut off since the control signals generated by VBBO at VRCTLC remain enabled in the presence of an applied external voltage.

There is a metal option for selection of this latchup detector. When not selected, VBBO is always inactive low. Currently, this option is used.

VBLR

VOLTAGE BITLINE REFERENCE

VPLT

VOLTAGE CELL TOP PLATE schematic FIG. 90.0 & 90.2

These identical circuits generate the last regulated voltage level of the device. This level is half of the array voltage, VARY. These voltage levels, known as BLR and VPLT are used to precharge the bitline and bias the storage cell top plate.

This half voltage is generated by two identical transistors, MP1 & MP2 which act as diodes to divide the VARY voltage into half at node EXTBLRREF. Intermidiate voltage levels, BLRPVTN/VPLTPVTN and BLRMVTP/VPLTMVTP are then generated. These are level that are 1 Vtn above and 1 Vtp below the half VARY level. They are levels to activate the final buffer, MNBLR/MNPLT and MPBLR/MPPLT. The final output will be back to half VARY, which are the required BLR and VPLT levels.

BLR and VPLT can be disabled by applying a low signal at probe pad EXTBLRDIS/EXTPLTDIS or if BLRDIS/VPLTDIS is active. This tri-states the final buffers, MNBLR/MNPLT and MPBLR/MPPLT. By deactivating the circuit, an external level can be used for the BLR or VPLT. This external level may be supplied by the BLRSW/VPLTSW circuits.

In previous DRAM generations, normally the storage cell top plate is grounded. But in 16 Meg, it is biased to half VARY level. This is due to the reduced thickness in the cell oxide. When the top plate is biased to half VARY, regardless of the polarity of stored data in the cell, the potential difference between the two cell plates will only of VARY. But the top plate is grounded, and a high levele is stored, the cell experiences a potential of full VARY across its oxide. Thus with this high potential across a thin gate oxide, there is more chance having oxide breakdown, creating reliability problems. But with a biased top plate, care has to be taken in isolating adjacent cells since the biased top plate can act as transfer gate that provides a leakage path between the cells.

BLRSW

BITLINE REFERENCE SWITCH

VPLTSW

VOLTAGE TOP PLATE SWITCH schematic FIG. 90.1 & 90.3

BLRSW and VPLTSW are circuits that enable analysis of device with externally applied BLR or VPLT level. The circuits operate as follow:

A. At powerup, PUD is low.
  Resets XRS, thus it presets BLRDIS/VPLTDIS to inactive low. This allows the BLR and VPLT circuits to operate as normal.
  N6 sets to logic '0', disabling the propagation of the oscilator signal, PBOSC.

B. After powerup, PUD at high level.
  All the previous states remain unchanged, and BLR/VPLT circuits operate as normal with inactive BLRDIS/VPLTDIS.

C. Initiation of BLR/VPLT disabling cycle.
  This initiation is carried out by injecting high voltage at EXTBLR/EXTVPLT (6 V and above).
  High voltage sets XRS, thus causing BLRDIS/VPLTDIS to be active. The active BLR/VPLTDIS disables the BLR/VPLT circuit. It also isolates BLR/VPLT from the high external voltage for protection purposes by switching off MBLRA/MPLTA.
  MN7 switches on allowing the EXTBLR/EXTVPLT to maintain N6 at logic '0'.

D. Completion of BLR/VPLT disabling cycle.
  This is done by bringing EXTBLR EXTVPLT to lower than 2 V.
  With MN7 switch on, this low external signal sets N6 to logic '1' through ND2.
  This enables the propagation of PBOSC signal. This is used as booting through MC11 & MC12 to enable full transfer of external voltage level from EXTBLR/EXTVPLT to BLR/VPLT.

E. External voltage as BLR/VPLT
  With the completion of steps (C) and (D), external supply can be injected through EXTBLR/EXTVPLT and be used as BLR/VPLT levels.
  Note that once the cycle with step (C) & (D) is performed, the device stays with its internal BLR or VPLT circuit disabled until repower up is done.

As for the VPLTSW, there are two other signals that control its operation. They are TLTPLO and TLPLTPHI, which represents the DFT TOP PLATE LOW and DFT TOP PLATE HIGH modes. In these modes, the circuit VPLT is disabled. Besides this, the top plate voltage is either pull low, (gnd potential) or high, (VARY potential).

FIG. 180 is a flow chart illustrating generally the initial power up sequence of the device. FIG. 181 is a flow chart illustrating generally the power up sequence of the device with established Vbb.

DESIGN FOR TEST MODE SELECTION

| ADDRESS KEYS 6543210 | hex | SIGNAL NAME | FUNCTION |
|---|---|---|---|
| 0***000 | 00H | — | - No test, internally reserved. |
| 0***001 | 01H | TLCLR | - Clear DFT mode without over voltage reset. |
| 0***010 | 02H | TLSCS | - Storage Cell Stess , concurrent mode. |
| 0***011 | 03H | TLWLS | - Word Line Stress. |
| **100 | 04H | TLRCOPY | - Row Copy. |
| 1***001 | 41H | TL16ED | - X16 Parallel test with expected data. |
| 1***010 | 42H | TL32 | - X32 Parallel test with expected data. |
| 1***011 | 43H | TLRS | - Redundancy Signature. |
| 1***100 | 44H | TLRRRC | - Row Redundancy Row Call. |
| 1***101 | 45H | TLCRRC | - Column Redundancy Row Call. |
| 1***110 | 46H | TLWLL | - Word Line Leakage test. |
| 1***111 | 47H | — | - Reserved for future use. |
| ******* | *** | TLJDC | - X16 JEDEC Parallel Test |

Note that address key 04H, the address key jumps to 41H. The reason for doing this is to accomodate simple decoding of 'WITH OUTPUT' and 'WITHOUT OUTPUT' DFT modes. Test from 41H onwards are test which requires output. For decoding, address pin A6 is being used.

1. ENTERING DFT MODE

A DFT mode is initiated by performing a WCBR (write low with CAS. before RAS.) cycle. The W. signal must be low to differentiate this cycle from a normal CBR refresh cycle. The WCBR cycle is used to enter either the industry standard 16 bit JEDEC parallel test mode or one of the internal test modes that is decoded from the appropriate address keys shown below. All internal type test modes are entered with a WCBR cycle with the proper overvoltage condition met and an address key valid on address pins A6,A2,A1, and A0 (see table below) during the falling edge of RAS.. See Timing Diagram of FIG. 177.

If the appropriate overvoltage condition is NOT met the device will enter the JEDEC parallel test mode and treat the address keys as don't cares.

The overvoltage condition needed to enter an internal DFT mode is met if either of the following two conditions are satisified:

1) The voltage level on address pin A10 at the time of the WCBR cycle is greater than about 8 volts (Vdd at 4 volts).

2) The status of the internal overvoltage latch (TLOVL) is set indicating that an overvoltage condition is still in effect.

This latching scheme means that the A10 overvoltage is only needed on those initial internal DFT modes that follow power up or a refresh cycle. This methodology releaves the burden, and the associated time delay, of the test system having to provide an overvoltage each time a new or concurrent test mode is selected. Once the overvoltage latch is set the test system can switch between modes using an address key and minimum WCBR timing.

The required timings for CAS. and W. relative to RAS. are the same as the required timings for CAS. in the normal CBR cycle. Address key timing is the same as the x-address timing in a normal access cycle.

During the internal test mode entry all addresses other than A10,A6,A2,A1 and A0 are dont't cares.

2. TEST MODE SELECTION

All internal test modes are selected with a unique address key as shown below. The test functions are commonly referenced by their signal names, which with the DFT signals will begin with 'TL' for Test Logic followed by an acronym describing the test function.

| ADDRESS KEY DECODING 6543210 | hex | SIGNAL NAME | FUNCTION |
|---|---|---|---|
| 0***000 | 00H | — | - No test, internally reserved. |
| 0***001 | 01H | TLCLR | - Clear DFT mode without over voltage reset. |
| 0***010 | 02H | TLSCS | - Storage Cell Stress (concurrent) |
| 0***011 | 03H | TLBI | - Word Line Stress with the option of also entering Storage Cell Stress if switch SW1 in block TLSCSL (pg. 99) is in position A. (concurrent) |
| 0***100 | 04H | TLRCS | - Row Copy. |
| 0***101 | 05H | TLTPH | - Top Plate High clamp (concurrent) |
| 0***110 | 06H | TLTPL | - Top Plate Low clamp (concurrent) |
| 0***111 | 07H | — | - for future use |
| | | — test below will send | test information to output pin(s) — |
| 1***001 | 41H | TL16ED | - X16 Parallel test with expected data. |
| 1***010 | 42H | TL32_ | - X32 Parallel test with expected data. |
| 1***011 | 43H | TLRS | - Redundancy Signature. |
| 1***100 | 44H | TLRRRC | - Row Redundancy Row Call. |
| 1***101 | 45H | TLCRRC | - Column Redundancy Row Call. |
| 1***110 | 46H | TLWLL | - Word Line Leakage test. |
| 1***111 | 47H | TLBID | - Reserved for future use. |
| ******* | *** | TLJDC | - X16 JEDEC Parallel Test |

Note: The above DFT modes are grouped such that those tests requiring specific test data at the outputs will assert A6 logically high, thus simplifing the decoding for the output driver by eliminating the need to decode all address key lines to select test data verses cell data at the output drivers. The TLDE (Test Logic Data Enable) signal is the logical OR of A6 and TLJDC and used control the data flow in the output blocks.

Concurrent test modes allow the possibility of executing two of more DFT modes simultaneously. The concurrent test mode(s) is/(are) entered first, followed by the selected non-concurrent modes. Concurrent test modes can be cleared while in the internal test mode by activating a TLCLR (01H) cycle. To clear the non-concurrent modes without effecting the concurrent mode(s) a DFT test OOH can be asserted. A TLCLR mode will clear the non.concurrent modes as well, thus placing the chip in a DFT mode standby condition with the internal overvoltage latch remaining set.

3. EXITING DFT MODE

All DFT modes are exited by asserting a CBR or ROR; (Ras only refresh) cycle. This will always place the chip in a normal operating mode.

A normal CBR (CAS. before RAS. with W. high on RAS.) cycle will exit any active DFT mode in addition to performing the CBR refresh, with the exception of Row Copy mode. In the Row Copy mode the internal refresh will be inhibited, the internal refresh counter will not be incremented, and the external row address will be the destination of the final Row copy.

Ras-only refresh also exits any active DFT cycle and performs a normal refresh, again with the exception of the Row copy mode. Instead of doing a Ras-only refresh, the addressed row data is overwritten with the Row Transfer Data. Note that due to the Ras-only refresh, CAS. must go low at least once during any Ras. low cycle otherwise that cycle will be interpreted as a RAS on refresh.

A WCBR cycle while in the internal DFT test mode (overvoltage latch set) will clear the previous non-concurrent test mode and assert the new decoded test key mode. This allows the test engineer to switch between modes using normal WCBR timing. Concurrent test modes are not cleared by a WCBR cycle and address key, but instead the new test mode will be entered simultaneously with the concurrent test mode. The exception to this is the TLCLR (01H) mode that will clear all concurrent and non-concurrent test modes while not effecting the overvoltage latch. Multiple concurrent test modes can be envolked simultaneously along with one of the non-concurrent test modes, but the important point here is that the non-concurrent mode be issued last. There is no stipulation against running multiple concurrent modes together, but there is a lockout feature that prevents the top plate from being forced high with test 05H and low with 06H, here the last one asserted is in effect.

The internal DFT test TLCLR (01H) is the CLEAR test mode. This mode will clear all of the internal test modes and allow normal chip access. This mode will not reset the overvoltage latch thus allowing a new internal DFT mode to be entered with an address key and WCBR cycle. This mode was designed to allowing resetting of the concurrent test modes without reseting the overvoltage latch as would be the case if we used a refresh cycle to clear the concurrent modes. This mode can be thought of as suspending the internal DFT testmodes to allow normal read and write cycles.

The last exit method is executing a WCBR cycle with address keys on 00H. This mode can be used to clear the non-concurrent DFT modes without effecting the status of the activated concurrent DFT modes.

INITIALIZATION ON POWER-UP

During the device power up or if VDD falls below an operating voltage and rise again (Vdd dip), all Dft circuits are initialized by PUP signal. All DFT functions are exited.

DFT MODES

STORAGE CELLS STRESS, Test 02H

This is a concurrent test mode. In this mode, all periphery circuitry are being tied to external Vdd instead of being regulated to Vperi. During this mode, all normal DRAM operation can be performed with the exception of refresh. Data can be written or read as usual.

Furthermore, in the concurrent mode, another DFT mode can be initiated. By doing this two DFT modes are active at the same time. Note that by performing a WCBR to enter another DFT mode will not cause the device to exit from the concurrent DFT mode as in the non concurrent modes.

As the name suggested, this mode can be used to stress the storage cell with the periphery circuitry voltage the same as the external voltage instead of being regulated.

The advantage of this test over the standard stress test is that it allows the user to define precisely the voltage applied to the cells. In this way, the acceleration factors for cells can be obtained. This test also allows Vdd margins to be determined as internal regulation is disabled.

WORD LINE STRESS, Test 03H

Word line drivers are being clamped to external voltages in this mode. In this mode, any access cycle activates 4 rows are selected in a quadrant. This is done by disabling the 1 to 4 predecoders and enables decoding based on 2 of 4 predecoders in and an octant. In an octant, the selected 2 rows have their storage cells located on the same side of bitline.

Note that, if a read cycle is performed, the addressed bitline data will be the output. But be aware that this data does not represent the addressed storage cell initial data.

ROW COPY, Test 04H

Row Copy is a test mode where a fast background write on the device can be performed. Once this mode is activated, the first cycle is to be a read cycle. Upon completion of the read cycle, a row of sense amplifiers S/A (512 S/A) from each octant will remain active. Hence any subsequent access to other rows will cause the active S/A data on the Bl or BL_ to be dumped into the corresponding cell. As a result, a transfer of 8 rows of data is performed, i.e. 2 rows per quadrant.

Note that a transfer of data from a 256 K array block to another cannot be done as the row of S/A is only common within a single array block. Another thing that need to be aware is that, within this test, if a WCBR cycle is performed, the device will not be initiated into another DFT mode according to the address. Instead the supplied address is used as the last row address where the transfer occurs. This is one of the few exceptions in the normal DFT operation.

PARALLEL TEST with EXPECTED DATA (X16 and X32), Test 41H & 42H

When activated, data is read and written at several bits in parallel. In the X16 test, the bits are 4 adjacent columns of a row in a quadrant. Whereas for the X32 test, they are 4 adjacent columns of a row of an octant, giving a total of 8 bits per quadrant.

During write, these bits are written with the data on the D pin for a X1 device. As for the X4 device, data is written with all the 4 DQs. This enables the 4 quadrants to have different data in the bits. But the data on the 4 bits of the adjacent columns will have the same data. As the result of this setup, the writing of column stripe or checker board pattern during parallel DFt is not possible. Hence only pattern with the repetition of a group of 4 columns can be done.

Expected Data (ED) is latched on the falling edge of RAS_ from input pins, (D for X1 device, DQ0–DQ3 for X4 device). During read, each EDs is compared with the respective quadrants data for X4 device. On the X1 device, the ED is compared with all the data from all the quadrant.

For X4 device, if all the read bits in a quadrant have the same data as the ED, the DQ of the quadrant outputs ED logic as output. Else the complements of ED will be the output. All bits in all quadrants need to be the same for the X1 device to output ED logic on the Q pin.

REDUNDANCY SIGNATURE, Test 43H

This test enables user to find out if the device has been repaired with redundancy. Logic 0 on output during any read cycle, indicates redundancy has been done. X4 device, only DQ3 is used. The purpose of have this mode on top of ROW & COLUMN REDUNDANCY ROW CALL is that this mode allows fast information on device redundancy status.

If no row or column has been repaired, output of a logic 1 is seen.

ROW REDUNDANCY ROW CALL & COLUMN REDUNDANCY ROW CALL, Test 44H & 45H

Performing a normal read cycle, this mode is able to tell if the addressed row in test 44H or address column in test 45H is a redundancy repaired row/column. Output of logic 0 if the row/column is a repaired row/column and logic 1 if it is not. As for X4 device, the 4 output represent the individual quadrants.

WORD LINE LEAKAGE, Test 46H

A normal long RAS. test for word lines leakage is simulated in this mode. Here, 8 word lines voltage are being compared continuously with a reference voltage. This is to check if the word lines voltage leaks below the reference voltage.

In doing this, during any RAS. low cycle, a word line from each octant is connected to a comparator. Voltage on the word line is compared with a reference voltage as long as RAS. is active low. This reference voltage [A is generated by sampling the word line voltage prior to the active comparing period. Output from the comparator is a low as long as the [word line voltage is above the reference voltage. The 2 comparators output from a same quadrant are 'OR' to provide the status of the quadrant for the X4 device. As for the X1 device, all the comparator outputs are combined in 2 stages as the output status of the device.

The DQs or Q output of logic 0 represents the word lines voltage leak below the reference voltage. Logic 1 represents word line voltage is above the reference level.

JEDEC X16 PARALLEL TEST

As in the earlier parallel test, the 16 bits are read and written simultaneously. The differences from the earlier parallel test is in read cycle.

In the read cycle, there is no ED needed. The bits data are compared and if all the bits have the same logic, a logic of 1 will be the output. Else the output will be a logic 0.

TOP PLATE HIGH AND LOW CLAMPS

Test 05H and 06H

These two tests were incorporated to override the internal regulation of the storage plate voltage (top plate). This mode allows controlled stressing and better characterization of the leakage mechanisms involving the storage cell.

By asserting the TLTPH test (05H) the top plate is driven to the array voltage level. This will allow additional stressing of the storage cell for a stored '0' value. The opposite conditions holds for TLTPL where we clamp the top plate to ground potential which can be used to stress the stored '2' case.

These modes are both concurrent test modes that can be active simultaneously with other test modes. An additional lockout feature eliminates the possibility of asserting both of these test simultaneously.

Control circuitry in block VPLTSW (FIG. 90.3) provides the pull-up and pull-down control using MPPLT and MNPLT transistors respectfully. If the clamps signals are not asserted the VPLTSW block will regulate the plate potential as explained in that section.

DFT BURN IN DETECTION TEST

This test mode when activated will indicate the device has remained in burnin DFT mode by asserting a high impedance state on the DQ outputs. If the device failed to remain in DFT burn in mode the DQ outputs will be clamped to a logic 1 state. This method allows numerous DUTs (devices under test) to be ganged (wire ORed) together without data contention. The logic high output complements the single unit test systems output pull down capability to produce TTL level pass/fail information, 1=fail and 0=pass (hi-z without pulldowns).

The burnin detection test is entered with DFT address key 47 that asserts the signal TLBID (FIG. 98.0). This signal goes to the CLOE block (FIG. 76.0) to force a high impedance state on the outputs if the unit was still in DFT burnin mode. This pass condition will check to see if the wordline stress mode (TLWLS.=O) and the storage cell stress mode (TLSCSL=1) are asserted. Switch SW1 in CLOE is used to eliminate the storage cell stress verification (position B). If all goes well and the unit remains in the burnin mode then the output will be forced to the high-z state from signal CLOE being forced low disabling the output drivers in the OUTBUF blocks (FIGS. 60 & 60.2).

If the unit fails the burnin detection test the outputs will be clamped high from the test data generated in block TLJDCMX (Test Logic JeDcC MuX, FIG. 103). This block is also used for the JEDEC parallel test mode, but includes the DFT burnin detection circuitry also. In the burn in detection mode the outputs will always be clamped high with the logic 1 fail data only reaching the output drivers if CLOE is not disabled as described above. Here, as with other test modes, when address pin A6 is high the output buffers are driven by test data as opposed to memory data.

DESIGN FOR TEST CIRCUIT DESCRIPTION

BURN IN HOLD OFF CIRCUIT

BIHO

FIG. 90.4

The BURN IN HOLD OFF CIRCUIT, BIHO, is a circuit to disable the burn in mode during power up. During power up, the voltage VLP may not be present. If VLP is not present, the device could go into burnin. This circuit prohibits this. Once VLP comes up, the BIHO circuit is disabled. The circuit thus functions once during power up conditions to present the device from initially going into burnin.

VOLTAGE REFERENCE INITIALIZATION CIRCUIT

FIGS. 90.5 & 90.6

Referring to FIG. 90.6, PBOSC is a signal that comes form the oscillator used to generate the substrate bias voltage. This signal has a typical period of oscillation of approximately 1 us with approximately 50% duty cycle. The circuitry comprised of IV1, IV2, IV3, IV6, XD1-SD6, NR1 and ND1-ND2 is used to generate a positive pulse of approximately 12 ns duration at N15 on each transistion of PBOSC. The remainder of the circuit in FIG. 1 forms a charge pump to supply charge to the reference voltage generator and capacitor MNC13 in FIG. 90.5 is used to smooth the voltage ripple seen by this generator.

During the period of time that N15 is positive, capacitor MN8 is charged to Vperi−Vt. By using Vperi to limit the voltage that this capacitor can charge to, the dependence on the external Vdd is eliminated. When N15 returns low, N19 & N21 ae bootstapped, thus pumping charge onto VDDREF, the supply to the reference voltage generator. Devices MN5 & MN9 have their drains connected to external Vdd to reduce the load on Vperi and further stabilize the on-chip regulated supply.

In FIG. 90.5, BOSC. is an oscillator input that is generated only during initial power up or whenever the substrate bias voltage becomes too positive. This circuit is intended to only initialize VDDREF so that Vperi can initially be generated. RID is a control signal that powers up high and remains high until the internal supplies are stabilized. Once this occurs RID goes low and remains low for as long as the chip is powered up. NR1-NR2 are gates that allow BOSC. to charge smoothing capacitor MNC13 to Vdd during initial power up. Once RID goes low, these gates prevent BOSC. from reactivating charging to Vdd. Circuitry consisting of MN1, MP2, MP3, MP4, MP5, MP6 and C1 is designed to cause N2 to power up low prior to RID being established at its initial high state. MN9 & MN12 are bootstrapped, each on alternate states of BOSC., such that VDDREF is charged to Vdd during the period of time that RID is high.

The circuit that generates the supply to the reference voltage generator is shown in FIGS. 90.6 & 90.5. The circuit in FIG. 90.6 opeates once the on-chip regulated supply has powered up and provides the isolation to the reference voltage generation from external voltage slews. The circuit in FIG. 90.5 operates only during initial power up and is turned off once the chip has reached stable operation. Since the circuit in FIG. 90.6 depends on the on-chip regulated supply, some initial source of power is needed for the reference voltage generator so the on-chip regulated supply can be established.

The solution to this problem is found in designing a filtered supply for the reference voltage generator that draws its power from the on-chip regulated supply, in such a way that the two will not collapse together should the on-chip regulated supply vary somewhat. This way, since the on-chip regulated supply does not vary with external voltage slew, the supply to the reference voltage generator will not vary with the external slew. By setting the voltage of the supply to the reference voltage generators sufficiently above the on-chip regulated supply level and insuring that the response time of this supply is greater than that of the on-chip regulated supply, even though the on-chip regulated supply may drop momentarily in value.

TLOV

DFT OVERVOLTAGE schematic FIG. 91.0

TLOV provides a high pulse from the moment overvoltage is detected on A10 to end of a cycle when Ras. falls from high to low. This serves as an overvoltage detector on pin A10. This overvoltage detector comprised of a string of p-channel devices to provide Vt drops above Vdd.

When the voltage on A10 exceeds a certain level, the n-channel string turns on and pulls up the internal node (N5), signalling that an overvoltage is applied.

As long as A10 is within the spec sheet range, the long channel pulldown (MN1) keeps the internal node(N5) discharge, i.e. no overvoltage is applied. In addition, a safety pulldown is added to discharge this N5 at the end of all active Ras. cycle during the rising edge of RAS..

A probe pad is added to allow the TLOV signal to be triggered without supplying an external overvoltage on the A10 pad. If this pad is forced low by an injector probe, the TLOV signal will go high to indicate an overvoltage condition.

A metal option is included to allow the TLOV circuit to be disconnected from the A10 pad and tied to Vdd. This would disable the overvoltage function and remove the load from the A10 pin.

A point need to be taken note of here is that in testing, whenever RAS. rises, for delay of about 8 ns, there will be higher current sinking into as transistor MN2 is activated. Also note that MN1 is always switched 'ON', thus allowing constant current sinking into device if A10 is at high state.

TLOVL

DFT OVERVOLTAGE LATCH schematic FIG. 92.0

The Overvoltage Latch, latches the overvoltage signal from TLOV whenever the overvoltage operation is performed in a WCBR condition.

With the overvoltage latched, it allows device to change its DFT modes without another overvoltage operation. Reseting of the overvoltage latch is done with the TLEX pulse which is generated in any DFT exit cycle.

TLINI

DFT INITIALISE schematic FIG. 93.0

TLINI is a high pulse of about 10 ns whenever an entry cycle of a non-JEDEC DFT mode is been performed. The pulse signal is used later to initialise other circuits into DFT mode.

On a DFT entry cycle, the decoded logic WBR and CBR.DFT which represents the WCBR cycle along with the TLOVL latches TLINI. Thus creating a high logic output. A 10 ns delay parallel path is attached to the reset of the output latch. With this a 10 ns pulse is created during an entry cycle. This scheme allows DFT exit and entry to another DFT mode by merely performing a WCBR cycle as the TLOVL is a latched signal.

The gated output from gating WBR and CBD.DFT with ND1 is being channeled out as WCBR signal. This indicates an entry into a DFT mode is being executed.

On power-up, signal RID is used to reset the output latch for inhibiting the inadvertent initialion of a DFT mode.

TLROR

DFT RAS-ONLY REFRESH schematic FIG. 94.0

During any active Ras. cycle, this circuit checks if there is active Cas. low signal or Cas. high to low transition. Without any of those conditions, the output signal will be a high to indicate a Ras-only refresh operation occurs.

TLROR upon detecting the RAS. falling edge through RL1. signal, starts the gating in of the Cas. signal through CL1.. An active Cas. low signal during this, causes the TLROR circuit to reset. Else upon RL1. rising edge, a high logic is latched on the output.

RID resets the TLROR circuit to avoid initiation during power-up.

TLEX

DFT EXIT schematic FIG. 95.0

TLEX detects a refresh cycle to signal the exit from all the DFT modes. It goes high after a Ras-only refresh cycle or on a CBR cycle with W. high on the falling edge of Ras..

There are three operations which activate this circuit. The 1st is the Ras-only refresh operation. This latches in the ROR signal into the circuit.

The 2nd is the CBR cycle with W. high during Ras. falling edge. Here the CBR. signal is propagated through a delay for signal stabilization and NORed with the WBR. A high logic output indicates a WCBR cycle.

The last operation is the power-up. This serves as a reset out of any DFT modes during power up.

The outputs from the three operations are NORed and propagates through two parallel paths. One with the signal inverted and the other with a 10 ns delay. The signal from the two path are ANDED to provide a 10 ns pulse to signal a DFT exit operation.

TLJDC

DFT JEDEC MODE schematic FIG. 96.0

As in TLINI, it detects the entering of a DFT mode, i.e. the JEDEC X16 parallel test. Output is a latched logic high signal to indicate device is at JEDEC DFT mode. It resets when there is an initiation to other non-JEDEC DFT mode of if an exit cycle is been performed.

TLRAL

DFT ROW ADDRESS LATCH

TLKEY

DFT ADDRESS KEY DECODER schematic FIG. 97.0 & 98.0

During the initiation into a non-JEDEC DFT mode, ADDRESS KEY is needed to decode the type of DFT mode selected.

Here, upon receiving the TLINI pulse during initiation cycle, address line, A6,A2,A1 & A0 are latched in TLRAL circuits. These latched address are channeled to the decoder, TLKEY for selection of DFT mode.

The latched signal can be modified either be doing a reset through performing an exit or relatch with new address key by re-doing an initiation cycle.

In the TLRAL circuit, note that if within ROW COPY mode, if WCBR cycle is perform, the address keys are forced to be OOH. By doing so, none of the DFT mode will be selected and the device exits from the DFT ROW COPY mode without getting out of the overvoltage latch.

TLSCL

DFT STORAGE CELL STRESS LATCH schematic FIG. 99.0

DFT STORAGE CELL STRESS is been designed to be a concurrent test. To achieve this, TLSCL latches in the actively decoded TLSCS signal. By doing so, it allows latching in of new address key into TLRAL and decodes them at TLKEY. This enable entering into another DFT mode without exiting the STORAGE CELL STRESS mode.

This is latched within the initiation cycle itself. Reset is done through exit cycle or a 'CLEAR DFT' mode is performed.

TLMODE

DFT MODE schematic FIG. 101.0

After decoding the DFT mode in TLKEY, it is further decoded in TLMODE circuit based on the type of operation needed. Below is a summary on the type of operation and the various possible input.

TLMODE contains some of the control logic for the test mode logic. It also contains the 2 K/4 K bond pad that is programmable for the 2 K of 4 K refresh cycles. When the bond pad is bonded to VSS, the 2 K refresh cycle option occurs. The output signal TWOKREF will be high and the output signal TL8BS will also be high. When the bond pad is not bonded to VSS, the 4 K refresh cycle option occurs. The input to inverter 101:IV106 will be pulled high by transistor 101:MP1 during RID. The output TWOKREF and the output TL8BS will be a logical zero. The 2 K/4 K refresh option is thus bond programmable.

| OPERATION | SELECTION INPUT | |
|---|---|---|
| TL16 | - BY 16 parallel testing needed | - DFT JEDEC MODE (TLJDC)<br>- DFT X16 PARALLEL (TL16ED) |
| TL32 | - BY 32 parallel testing needed | - DFT X32 PARALLEL (TL32) |
| TLEDC | - Expected data needed | - DFT X16 PARALLEL (TL16ED)<br>- DFT X32 PARALLEL (TL32) |
| TLDE | -Output data needed | - DFT JEDEC MODE (TLJDC)<br>- HIGH LOGIC AT ADDRESS KEY A6 (TLA6) |
| TL8BS | - 8 blocks selection in array needed | - DFT X32 PARALLEL (TL32)<br>-DFT WORD LINE STESS (TLWLS)<br>- DFT ROW COPY (TLRCOPY)<br>-2K REFRESH MODE |

TLPTDH

DFT PARALLEL TEST DATA HIGH schematic FIG. 102.0

TLPTDH is used in any of the parallel test mode. It compares and indicates the status of the parallel bits.

The compare is done in 2 stages. The initial compare circuit comprises of a set of 4 'NOR' gates and a set of 4 'AND' gates. Data from GLOBAL I/Os of the same sense amplifier bank are paired together and compared at the logic circuit. NOR gates are used for logic '0' compare and the 'AND' gates for the logic '1' compare.

Output from these gates passes through a set of pass-gate, TLPTSELA. Here it weeds off 4 sets of GLOBAL I/Os which are not used when it is in the X16 parallel testing. Else all the compared data are passed through for final compare operation. Control is done with the GLOBAL I/Os SELECT (IOGSJKn) lines Final compare is done with a set of 2 'NAND' gates. Following table shows output conditions with data status.

| OUTPUT | | |
|---|---|---|
| PTDH_ | PTDL_ | DATA STATUS |
| 0 | 0 | - not test. |
| 0 | 1 | - data all '1's |
| 1 | 0 | - data all '0's |
| 1 | 1 | - a mix of '1's and '0', test fail |

TJDCMX

DFT JEDEC MULTIPLEX schematic FIG. 103

TLJDCMX serves as an intermediate point for a X4 device in the JEDEC mode where the outputs from the TLPTH are being passed through to the individual quadrants DQs. In the X1 device, this circuit is disabled through CLX4 signal.

TLPTED

DFT PARALLEL TEST EXPECTED DATA

TLPTX1

DFT PARALLEL TEST X1 schematic FIGS. 104 and 105

Both these schematic are basically having the same function where TLPTED is for a X4 device and TLPTX1 is for a X1 device. They use the TLPTDH output status and compared with the expected data to decide if the parallel bits have the same data as the output data.

The TRUTH TABLE for its operation is as follows:

| INPUTS | | | OUT- | |
|---|---|---|---|---|
| EXDA-Z | PTDH_Z | PTD1_Z | PUT | CONDITIONS |
| 0 | 0 | 0 | X | - No Test, don't care |
| 0 | 0 | 1 | 1 | - Fail, bits = 1, ED = 0 |
| 0 | 1 | 0 | 0 | - Pass, bits = 0, ED = 0 |
| 0 | 1 | 1 | 1 | - Fail, bits = 0 & 1 |
| 1 | 0 | 0 | X | - No Test, don't care |
| 1 | 0 | 1 | 1 | - Pass, bits = 1, ED = 1 |
| 1 | 1 | 0 | 0 | - Fair, bits = 0, ED = 1 |
| 1 | 1 | 1 | 0 | - Fail, bits = 0 & 1 |

Note that if the test pass, the output is ED, else the output is ED..

for X4, Z=0,1,2,3 representing each quadrants DQs for X1, Z=3 for the expected data, EXDA-Z & for the PTDH & PTDL, it is the resultant of the 'NOR'ed of 4 PTDH and 4 PTDL.

In TLPTX1, X1 device JEDEC output is also decoded here. This done by multiplexing the 'NOR'ed result of the PTDH and PTDL as the output without the expected data used as a compared.

TLWLC

DFT WORD LINE COMPARATOR schematic FIG. 106.0

TIWLC is a comparator scheme for the word line leakage test. In precharge cycle, the two input of the source couple pair are shorted through MN5, i.e. gate of MN1 and MN2. During this duration, the output is pulled low.

But as the device enters its active cycle, and the wordline is booted, this booted signal charges up capacitor MN7. MN5 is still on due to delays along RLB path. Output goes to logic '1' at the moment as the two terminal of the source couple pairs have the same potential.

As active RLB reaches the gate of MN5, it turns isolates the two input terminals of the source couple pairs. Thus the source couple pair together with the class 'A' output stage, they act as differential amplifier for the two input terminals.

If the wordline voltage, RLXH drops below the reference voltage in capacitor, MN5, the output TLWLL.OQ will be flip to logic '0'. This indicates wordline is leaky, thus fail the compare test. Else the output remain at logic '1'.

TLWLOR

DFT WORDLIN LEAKAGE 'OR' GATE schematic FIG. 106.1

In a WORDLINE LEAKAGE test, 2 wordline voltage in a quadrant is being checked simultaneously. A fail is indicated as long as any of the 2 wordline fails. To achieve this, the 2 outputs from the 2 comparators are gated in this circuit to provide output status of that quadrant.

TLWLLMX

DFT WORDLINE LEAKAGE MULTIPLEX schematic FIG. 107.0

TLWLLMX multiplexes the fail status from TLWOR depending on whether it is a X4 or X1 device before the final output at the output pin.

TLRS

DFT REDUNDANCY SIGNATURE schematic FIG. 108.0

If any of the redundancy rows or columns are programmed, the redundancy signature fuse should also be programed indicating that the chip uses redundancy. Activating this REDUNDANCY SIGNATURE test mode, it enables the status of the redundancy signature fuse propagates to the output buffer.

TLRCALL

DFT ROW REDUNDANCY ROW CALL

TLCCALL

DFT COLUMN REDUNDANCY ROW CALL schematic FIG. 109.0 & 110.0

Both these circuits are similar. They serve as output multiplexer between a X1 or X4 devices for TLRR.Q and TLCR.Q signals. These are signals on redundancy status of the accessed address.

SUBSTRATE BIAS (VBB)

As in previous DRAM generation, 16 Meg is built on p-type substrate. For performance enhancement, the substrate needs in addition be biased to a negative level. By doing so, it prevents forward biasing of junctions, thus avoids the flow of minority carriers, and it reduces the junction capacitance of the p-substrate transistors. But it cannot be biased to be too negative as it also increases the threshold voltage of the transistors. The optimum selected bias level is −2 Volts.

In biasing the substrate, 16 Meg uses three sets of oscillators and pumps. They are:

a. Low power oscillator and pump, LPOSC & VBBLPP.

b. High power oscillator and pump, HPOSC & VBBHPP.

c. Booster oscillator and pump, BOSC & VBBPB.

These oscillators and pumps are activated differently. First LPOSC and VBBLPP. This low power set serves as substrate bias supply in standby mode. Hence, it is activated upon power up and remains active throughout until the power of the device is switched off.

Next, HPOSC and VBBHPP. These are also known as the activity oscillator and activity pump. As the name suggests, they are activated only when there is an activity, i.e. when RAS. goes to active low, such as during a page mode. This is to support the first pump, VBBLPP to maintain the VBB level during the active cycle.

Last, BOSC and VBBPB. This provides a fast charging of VBB to the required level upon power up. In addition, it also acts as an emergency pump as it is activated whenever the VBB level is more positive than −1 bvlt. Under normal operating conditions BOSC and VBBPB are off.

During device power up VBB is being pumped down to its −0.2 volt level; during this time, as VPERI is established, RID goes high and resets all the R/S latches in the control logic. This establishes a known starting point for the control logic. Also, as VBB is pumped down it is monitored by the VBBDET circuit and upon reaching its required level, a signal generated by the VBBDET circuit, VBS. resets RID. This releases the control latches and completes the basic power up sequence, enabling the device t start any of its normal memory cycles.

In the VBB circuits, there is a probe pad, EXTODS. By forcing this pad to a logic '1', it disables all three oscillators. Thus, indirectly, it disables the VBB pumps. In doing so, it also mean that the substrate voltage will never go down to the required level. Hence the device will always be in the preset state. In order to avoid this, an active logic '1' EXTODS also forces the device out of its preset state with a time constant delay or approximately 2-5 usec.

FIG. 182 is a general flow and timing diagram of VBB generation.

FIG. 111 is a block diagram of the VBB generator system.

LPOSC

LOW POWER OSCILLATOR schematic FIG. 112.0

This oscillator generates a square wave signal which drives the low power or the standby VBB pump. A loop of five inverters is used to provide a signal of about 1 usec cycle time, 1 MHz. These inverters are designed with programmable sizing of the p-ch and n-ch transistors. This enables adjustment of oscillator frequency when needed, achieving the required cycle time by controlling the W/L ratio of the inverters. The resulting waveform has a slow rise and fall time. To convert this signal into a square waveform, a set of 3 modified inverters is connected to the output of the loop, i.e. node N5. These inverters amplify the signal, increasing the rise and fall times until a square wave is generated.

The oscillating signal can be inhibited by injecting a high level signal at probe pad EXTODS. This breaks the loop of inverters and forces node N5 to a low potential. Thus, the output LPOSC is forced low and becomes a static output.

There are two outputs, LPOSC and PBOSC. LPOSC is used for the VBB pump and PBOSC is used as booting signal for various parts of the device.

Finally, note that the transistors MN11 and MN16 are sized differently from the other inverters. This is to avoid the a situation where the output is locked at an intermediate level at power up. This is accommplished by changing the D.C. transfer curve of one inverter in the loop of five inverters.

VBBLPP

VBB LOW POWER PUMP a schematic FIG. 113.0

This is the VBB standby pump. It has two p-ch capacitors, MP1 & MP4, two p-ch transistors, MP3 & MP6 connected in the form of diodes and two pull down p-ch transistors, MP2 & MP5. The operation is achieved by generating two 2 clocks of different phase (180 degrees) at nodes N3 and N4.

The above two clocks, are generated from the low power oscillator output, LPOSC by gating it with the delayed signals from XDEL2A & XDEL2B.

In the first phase of pumping, starting with N3 high and Ny low, and assuming zero potential, the P-channel capacitor MP1 is charted slightly thru MP8, a startup transistor. N1 rises momentarily and then settles back to the Vtp of the MP8 transistor. This places a charge of Ompl=Cmpil (VPERI−2 |Vtp|) into the P-channel capacitor MP1. As N3 falls and N4 rises, N1 is driven negative bringing the gate and drain of MP3 down with it. This turns on the pump diode MP3, since Vbb is assumed to be zero at this time, and pumps positive charge out of the substrate. This forces the substrate to a negative voltage level. While N3 is low, N4 is charging the P-channel capacitor MP4 in the same manner as N3 charged MP1; except that MP4 is charged thru MP7 instead of MP8. As the voltage on the nodes of the pump are established N1 and N2 begin to swing between VSS and a negative level of about −(VPERI−|Vtp|). When N1 goes negative it turns on MP5, which clamps N2 to Vss. This allows more charge to build up in MP4 such that Omp4=(-VPERI−|Vtp|). A similar action occurs when N2 goes negative and turns on MP2, allowing a charge of Omp1=(VPERI−|Vtp|) to build up in MP1. Eventually the capacitors are charged through MP2 and MP5 instead of MP7 and MP8. It should be noted that the substrate voltage VBB will reach an approximate level of −(VPERI−2 |Vtp|) or −(VPERI−|Vtmp1|−|Vtmp3|). Thus for VPERI=4 v and Vtp=−1.0 v, VBB would be −2.0 volts. As VBB reaches this value the pump diodes MP3 and MP6 will shut off and the pumping charge will cease to flow.

HPOSC

HIGH POWER OSCILLATOR

BOSC

BOOSTER OSCILLATOR schematic FIG. 114.0 & 116.0

These two oscillators are designed the same. The difference is HPOSC uses VPERI as supply whereas BOSC uses external voltage VDD (VEXT) as supply. These oscillator provide square waveforms of 3 MHz.

Both circuits are designed with seven inverters connected in feedback loop to produce a ring oscillator. One stage having a different transfer ratio so the oscillator can start up automatically when power is applied. Each stage having programmable transistor sizes to allow some adjustment in the frequency of oscillation.

HPOSC is gated by RL1., hence it is only activated during RAS. low time, cycling once on short memory cycles, and multiple times on a page mode cycle where RAS. is held low for extended periods of time.

BOSC is gated on and off by VBS. which is controlled by VBBDET, the VBB detector circuit. Thus, when VBB is insufficient, VBS. will be low and BOSC will be activated. BOSC drives the booster pump VBBPB which generates the substrate bias during power up.

As in the case of LPOSC, an externally applied signal EXTODS, can be used to disable the oscillators, HPOSC and BOSC, and indirectly their pumps if substrate bias is to be applied externally.

VBBHPP

VBB HIGH POWER PUMP

VBBPB

VBB BOOSTER PUMP schematic FIG. 115.0 & 117.0

VBBHPP is the pump that is activated only when there is an active cycle, i.e. RL1. is low. The booster pump VBBPB, is activated when the VBB level is insufficient. Both pumps are controlled by the activation of their oscillators HPOSC and BOSC.

These two pumps works exactly the same as LPOSC, where they need two out of phase clocks at node N3 and N4. These clocks control the two phase pumping action.

Note that, even though both pumps are the same, they are supplied by different voltage levels. VBBHPP is supplied by VPERI which is regulated to 4.0 V, whereas VBBPB is supplied directly from external VDD, VEXT, which is 5.0 V nominal. Thus the driving capability of the two pumps are different.

MAX posible VBB level to be driven by VBBHPP is: =Vss−(VPERI−2 Vt)=OV−(4 V−2(1.0)); taking Vt of MP3, MP4, MP5 & MP6 to be 1.0 V. =−2 V; VPERI regulated to 4 V.

MAX possible VBB level to be driven by VBBPB is: =Vss−(VEXT−2 Vt)=0 V−(5 V−2(1.0)); taking Vt of MP3, MP4, MP5 & MP6 to be 1.0 V. =−3 V; nominal external voltage to be 5 V.

Thus under normal conditions, with an external supply of 5 V, VBBPB has a higher driving capability compared to VBBHPP.

VBBDET

VBB DETECTOR schematic FIG. 118.0

VBBDET is used to detect the VBB level and then signals the booster oscillator when to switch on and off. This circuit has a series of transistors, MP3 thru MP7 and MN6 thru MN12, to regulate the gate potential of MP1. This potential generates an almost constant current through MP1 and by doing so node N1 is always 4 Vts above the substrate voltage. The 4 Vts are associated with transistors MP8 thru MP11. The voltage regulation on the gate of MP1 is effective over a wide range of supply voltage and temperature changes.

On power up, node N1 and N3 track the external voltage. This is achieved through transistors MP1, MP2 and P-channel capacitors MP12 and MP13. As the supply voltage goes up, the voltage regulator transistors, MP3 thru MP7 and MN6 thru MN12, begin to turn on, supplying a gate voltage to MN16. This allows MN14 and MN15 to become an active source follower, with N3 being 2 Vts down from N1. As MN16 turns on, N3 begins to drop until it comes back under the control nf N1. With Vbb still at zero, N1 will be 5.0 volts and N3 will be near 3.0 volts. This is enough voltage to force node N4, the output of the high ratio inverter IV1, to zero. A logic '0' on node N4 is equivalent to signaling BOSC to continue oscillating during power up. The output of IV1, N4 goes into a complementary source follower, MP14 and MN18, that drives a regenerative detector composed of IV2 and MP15 and MN19. The complementary source follower is to buffer the low drive capability of IV1 into the latch detector. The output of the latch detector drives nodes N6 and N27. These nodes are gated by the falling edge of BOSC, i.e. when N21 rises, into a edge trigger latch, ND3 and ND4 so that VBS. sets in a desive manner to turn BOSC on and off.

Returning to N1 and N3, as VBB is pumped down it will eventually reach −2.0 volts. At this point N1 will be 4 Vts higher or about +4.0 volts higher than VBB. Thus N1 will be around +2.0 volts and N3 will be about 0.0 volts. A logic '0' on N3 will cause a logic '1' on node N4, which translates into a high state on VBS., signaling BOSC to turn off. In response to N4 going high, the regenerative latch detector trips, driving N26 high and node N5 low. Node N5 flips N6 to a logic '1' which turns on MN13, this shorts out one P-channel transistor in the detector stack, pulling N1 down about 1.0 volt further. This causes VBB to have to rise an extra volt, from −2.0 v to −1.0 v in order to turn BOSC back on. Thus switching MN13 in and out produces the hysteresis in the VBB detection.

PUD

POWER UP DETECTOR schematic FIG. 120.0

FIG. 120 is the preferred embodiment of the power up detection circuit.

The PUD output remains low during power up until VPERI reaches the range of about 2.0 v to 2.5 v. Pud then goes and presets the BLRSW/VLPTSW circuits and enables the PRERID circuit, and passes control of the TPLHO signal over to PRERID.

The way the circuit works is as follows:

A. At power up, PUD is kept low by,
   - capacitors at node N4 & N10, keeping the nodes at ground potential.
   - capacitors MP8 and MP9, keep nodes N3 & N5 at high potential.
   - low Vt n-ch transistor, MN5 is turned on to ground node N2. C1 is also there to ensure that N2 is at a low potential upon power up.
   - low Vt n-ch transistor, MN7 is kept on to ensure a high potential at N9. This high potential then keeps MN6 from turning on and also prevents N3 from being discharged through MN6.
   - MP3. With N2 low, N3 is high.

B. As VPERI goes higher than 2.0/2.5 V,
   - with the voltage at this level, it overcomes the threshold voltage of MP1 and MP2.
   - this causes node N2 to be at logic '1' and tracks the external voltage level.
   - with this, it forces MN2 and MN6 to turn on. By doing so, it grounds N3.
   - grounding N3, switches on MP4. This, in turn ensure N2 tracks the external voltage level.
   - thus, PUD goes to logic '1' and stays there. This completes the power up sequence for PUD.

C. MP7 ensures that N2 returns completely to ground during a fast power down, power up sequence.

PRERID

RESET & INITIALIZATION DETECTOR schematic FIG. 121.0

PRERID is a power up signal. It is initially at logic '1' upon power up. This signal is used to release TPLHO, and to set RID to a logic '1' state. RID is then used to reset the latches in the control logic.

There are two ways that PRERID can be terminated. NATURAL POWER UP CYCLE and THROUGH APPLIED 'EXTODS'.

NATURAL POWER UP CYCLE

In the natural power up cycle, the sequence of events are:

At power up, PUD is low. This charges up node N4 and N5, by turning on transistors MP1 and MP2. PRERID output tracks VPERI, since N6 power up as a logic '0'.

As the external voltage reaches about 2.5 volts, PUD changes its state from logic '0' to logic '1'. This shuts off MP1 and MP4 and simultaneously provides a leakage path for N4 through MN1, 2, 3, and 4.

As the potential of N4 drops, the voltage at N5 will also drop. MP4 is connected as a P-channel source follower. This begins to turn on MP3 which pulls N6 to a logic '1' state. This in turn causes PRERID to flip to its low state. Thus, PRERID will return to zero when VBB drops to about −1.6 volts. This completes the natural power up cycle for PRERID.

PRERID GENERATION THROUGH APPLIED 'EXTODS'

PRERID may be generated even if VBB is maintained at 0.0 volts. This may occur in certain testing situations where the test engineer wants to examine functionality at zero substrate bias. Zero substrate bias will not allow N4 and N5 to be discharged. However, if zero substrate bias is to be used then the substrate pumps are not needed, and may be turned off. If TXTODS is set high then all of the oscillators are inhibited and a parallel delay path is enabled in the PRERID circuit. PRERID is reset after a delay of about 4 usecs relative to when EXTODS goes high. Even though PRERID is reset after the delay, RID is not. To reset RID, it is necessary to force VBB below −2.0 volts, where the VBBDET circuit can generate a VBS_ high signal. The VBB may then be returned to 0.00 volts for testing.

A description of the operation of the parallel delay path, enabled by EXTODS is given below:

Initially the signal PRERID is set high and PUD is low when VPERI first powers up. This charges N4 and N5 to the supply level. It also charges N10 to the supply level. With N10 at a high level N11 is low and MN7 cannot discharge N5.

PUD goes high, turns off MP1, MP2, and MP8, and turns on IV5 setting N13 to logic '0' allowing N12 to rise to slightly above Vtn. This is accomplished by designing MN15 to have a weak current flow while MN12, which is connected as a MOSSS diode, has a relative high conductance. With the voltage on N12 slightly above Vtn, MN8 will have a very low conductance.

EXTODS goes high, turning on transistor MN9 and turning off transistor MP7. Hence node N10 will begin to discharge thru MN9 and MN8. The discharge time for node N10 is approximately 4 usecs. When N10 reaches the threshold of MN10, node N11 will go high and turn on MN7, which discharges N5, and resets the latch, MP3/MN6 and MP5/MN5. The latch then resets the output PRERID.

LVLDET

LATCHING VOLTAGE LEVEL DETECTOR schematic FIG. 119.0

FIG. 119 is an alternative embodiment of the PUD circuit.

LVLDET has a same function as PUD circuit, But LVLDET uses a different method in achieving the PUD output.

LVLDET uses PBOSC to sample the periphery voltage level. This voltage sampling is based on equalizing the voltage at node N2 and N1. To understand on how it works, lets take a look on the 'square' waveforms generated from PBOSC. These are illustrated in FIG. 183.

Two sets of main control waveforms are generated by PBOSC signal. They are waveform 'B'/'B_' and 'C'. These two sets of signal control the sampling of the periphery voltage. Note that XDB2 is a frequency divider circuit. It generates signal 'B' which has the frequency value of half PBOSC. As for XD4 it is a delay that causes the falling edge of 'B' to be about 4 ns later than its input falling edge.

Initially, when 'B' is low, node N1 of capacitor C1 is charged up to the current periphery voltage. At the same time, it also charges up N3 and discharges N4 to low. Next, as 'B' goes high, it turns on MN1. This enables the charge sharing process to occur between N1 and N2. The equalibrium voltage at N2 & N1 will be Veq, where:

$$Veq=\{C1/(C1+C2)\} * Vperi$$

If Veq is greater than the threshold voltage of MN3, node N3 will be discharged to ground with MN3 switched on. There is also a regenerative action that enhances this switching event. As the potential of N3 is pulled down, it turns on MP4. Thus with the high 'B' signal, it propagates to N4 and turns on MN3A to help the discharging of N3. But, if Veq is less than the threshold voltage, N3 remains high while N4 remains low. The VPERI needed to set Veq above this threshold can be preset be adjusting the capacitance C1 and C2.

Then as 'C' goes up, it allows the signal at node N4 to propagates to the output. If VPERI is not high enough, Veq will not be able to trip MN3. N4 is low and is the output. But if VPERI is high enough and Veq trips MN3, the output will be a logic '1'.

When 'C' signal drops low, the output is latched until next cycle. Signal 'B' goes down 8 ns after 'C' goes down to create a proper latching action.

To summarize, LVLDET samples the periphery voltages to determine if it has reached the required level before triggering the output to a logic '1'. Sampling is based on PBOSC frequency. It samples every two cycles of PBOSC, i.e. in the first cycle, VPERI is sampled and in the second cycle, the sampled status is sent to output.

TPLHO

TOP PLATE HOLD OFF CIRCUIT schematic FIG. 125.0

FIG. 125 is the preferred embodiment of the top plate hold off circuit. This circuit is part of the power up circuits.

During power up the substrate pump must establish VBB by chargin some capacitance wit negative charge in order to establish the −2.0 volts of the substrate bias. The capacitance that has to be charged in mainly the top plate capacitance an the P/N junction capacitance of the bitlines. However, during the initial phases of power up, the voltages supplies to the top plate and the bit lines are not activated and present essentially an open circuit to one side of these capacitors, while the substrate pump is active. With one side of the top plate capacitance open, the substrate bias, VBB, would rapidly drop to −2.0 volts. This would prematurely cause the VBB detector to signal RID to terminate, indicating that the circuit was ready to be tested, then the top plate supply and the bitline reference supply would turn on and begin to pull their capacitors to +1.6 volts. This would result in VBB being pulled above −1.0 volts and would again turn on the booster oscillator and pump.

To prevent this from occuring, the top plate capacitance and the bit line capacitance are held to ground while the booster pump is active. The booster pump is active from the start, when the initial 5.0 volts is applied to VDD. Thus the signals TPLHO and TPLHO_ must be generated when external VDD is applied. The LSLSHF circuits are designed to, not only shift the level of an input signal, i.e. change a 4 v signal to a 5 v signal, but also to power up with its output a zero level when the 5.0 v VDD is applied. This can easily be turned into an initial '1' level, by using an inverter, supplied by the external VDD. Thus, control signals established by the 5.0 v external supply can be controlled by signals that are later established by the regulated supplies, such as VPERI.

The TPLHO circuit also contains the RID latch.

A short description of the TPLHO BLOCK is as follows:

As the external VDD rises the output of the LVLSHF circuit powers up in the low state. The top plate hold off logic becomes active. I.E. logic gates XIV1, XNR3, XIV2, and the TPLHO.INV become active.

The low level of PUDSHF is translated into a high level at the output of XIV1, which sets N1 to a logic '0' and TPLHO to a logic '1' state. This signal then turns on the MN4 transistor in both the VPLT and VBLR generators, grounding the top plate capacitor and the bit line capacitor.

When PRERID goes high, PRIDSHF holds the NOR gate XNR3 on and its output N1 low so that TPLHO remains high.

PUD and PUDSHF go high shortly after PRERID goes high, and N2 goes to logic '0', leaving PRIDSHF the only signal to maintain TPLHO active.

When VBB reaches about −1.6 volts the PRERID signal returns to zero, releasing the TPLHO signal as PRIDSHF also goes off.

For the RID latch, PRERID acts to set N8 of the latch and also RID. The signal VBS. acts to reset the latch.

TPLHO is further illustrated in the block diagram of FIG. 180.

FIG. 184 depicts an illustrative computer system containing a 16 MB DRAM such as disclosed in FIG. 0.1. Computer system 72 includes a microcomputer 74, such as an 80386, DRAM 0.1, ROM, 76 Digital Signal Processor board 78, modem 80, graphics board 82, Local Local Area Network board 84, monitor 86, and keyboard 88 connected to PC bus 89. PC bus 89 typically contains the address, data, and control signals. A printer is also typically included in the computer system. Of course a smaller computer system can be built by deleting some of the illustrated components, such as the LAN board and the DSP board, for instance. In the typical computer system, microcomputer 74, DRAM 0.1, and ROM 76 are all on a motherboard. The other boards typically plug into the motherboard. Of course, there can be more than one DRAM 0.1 in microcomputer system 72.

The disclosed input buffer circuit, PADABUF, has a single stage circuit portion for receiving a multiplexed row address bit and a multiplexed column address bit. Circuitry is connected to the single stage circuit portion for separately holding the received multiplexed row address bit and the received multiplexed column address bit. The single stage circuit portion may include a tri-state inverter having an tri-state control input coupled to an input buffer control signal and a latch to hold the output of the tri-state inverter when it is tri-stated by the input buffer control signal. The first circuit portion may be of the CMOS type. Such a circuit is useful in the memory support circuitry of an integrated circuit memory of the dynamic random access memory type.

The circuit advantageously reduces the loading seen by the device supplying the multiplexed address signals and effectively couples the multiplexed address signals to the row address circuitry and the column address circuitry of the semiconductor memory device.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modification or embodiments as fall within the true scope of the invention.

What is claimed is:

1. An input buffer circuit for a semiconductor memory device, comprising:

a single stage circuit portion for receiving a multiplexed row address bit and a multiplexed column address bit;

circuitry connected to the single stage circuit portion for separately holding the received multiplexed row address bit and the received multiplexed column address bit and wherein the single stage circuit portion includes:

a tri-state invertor having an input terminal, an output terminal, and a control terminal, the input terminal for receiving the multiplexed row address bit and the multiplexed column address bit, and the control terminal coupled to a tri-state control signal; and a latch connected to the output of the tri-state invertor to hold the output of the tri-state invertor when the tri-state control signal causes the tri-state invertor to go into tri-state mode.

2. The input buffer circuit of claim 1 wherein the circuitry for holding includes:

a row address latch coupled to the output of the tri-state inverter and coupled to a row address latch control signal; and a column address latch coupled to the output of the tri-state inverter and coupled to a column address latch control signal.

3. The input buffer circuit of claim 1 wherein the single stage portion is a CMOS single stage portion.

4. An integrated circuit memory device, comprising:

a memory array having memory cells arranged in rows and columns so that memory cells are addressable through row address signals formed of row address bits and through column address signals formed of column address bits;

support circuitry for addressing the memory cells in response to receiving multiplexed row address signals and column address signals;

wherein the support circuitry includes an input buffer having one input for receiving a pair of multiplexed row address bits and column address bits, and having separate outputs for the row address bits and separate outputs for the column address bits, the input buffer comprising:

a tri-state invertor having a single input that receives the multiplexed pair of row address bits and column address bits, having an output, and operable to go into a tri-state mode;

a latch connected to the output of the tri-state invertor to hold the output of the tri-state invertor when the tri-state invertor goes into the tri-state mode;

a row address latch connected to the output of the tri-state invertor to hold the received row address bit; and a column address latch connected to the output of the tri-state invertor to hold the received column address bit.

5. The integrated circuit memory device of claim 4 wherein the device is a dynamic random access memory and the input buffer is a CMOS input buffer.

6. A dynamic random access memory chip, comprising:

a memory array;

periphery circuits connected to the memory array so that information can be read from the memory array and written to the memory array, and the memory array can be refreshed;

a plurality of bond pads for receiving externally generated multiplexed column address bits and row address bits;

a plurality of input buffers connected to the plurality of bond pads, for latching the multiplexed column address bits and row address bits; and wherein the plurality of input buffers each have a tri-state latch connected to the bond pad, the output of the tri-state latch being connected to a row address bit latch to hold the row address bit in response to receiving a row address latch control signal and being connected to a column address bit latch to hold the column address bit in response to receiving a column address latch control signal.

* * * * *